US011950508B2

(12) United States Patent
Kim et al.

(10) Patent No.: US 11,950,508 B2
(45) Date of Patent: Apr. 2, 2024

(54) LIGHT EMITTING DEVICE

(71) Applicant: Samsung Display Co., Ltd., Yongin-si (KR)

(72) Inventors: Taeil Kim, Hwaseong-si (KR); Junha Park, Gwacheon-si (KR); Sun Young Pak, Suwon-si (KR); Jang Yeol Baek, Yongin-si (KR); Kyoung Sunwoo, Hwaseong-si (KR); Mun-Ki Sim, Seoul (KR); Chanseok Oh, Seoul (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 424 days.

(21) Appl. No.: 17/443,429

(22) Filed: Jul. 26, 2021

(65) Prior Publication Data

US 2022/0149292 A1 May 12, 2022

(30) Foreign Application Priority Data

Nov. 11, 2020 (KR) ........................ 10-2020-0150493

(51) Int. Cl.
*H01L 51/50* (2006.01)
*H10K 85/60* (2023.01)
(Continued)

(52) U.S. Cl.
CPC ....... *H10K 85/6572* (2023.02); *H10K 85/626* (2023.02); *H10K 85/633* (2023.02);
(Continued)

(58) Field of Classification Search
CPC . H10K 85/6572; H10K 85/626; H10K 85/633
See application file for complete search history.

(56) References Cited

U.S. PATENT DOCUMENTS

| | | | |
|---|---|---|---|
| 10,374,166 | B2 | 8/2019 | Hatakeyama et al. |
| 2020/0190115 | A1 | 6/2020 | Hatakeyama et al. |
| 2020/0207787 | A1 | 7/2020 | Hatakeyama et al. |

FOREIGN PATENT DOCUMENTS

| | | | |
|---|---|---|---|
| KR | 10-2016-0119683 | A | 10/2016 |
| KR | 10-2019-0051867 | A | 5/2019 |

(Continued)

OTHER PUBLICATIONS

Anton Pershin et al., "Highly emissive excitons with reduced exchange energy in thermally activated delayed fluorescent molecules", Article, Nature Communications, vol. 10, No. 597, 2019, pp. 1-5.

(Continued)

*Primary Examiner* — Anthony Ho
(74) *Attorney, Agent, or Firm* — Lewis Roca Rothgerber Christie LLP

(57) ABSTRACT

A light emitting device includes a first electrode, a second electrode, and at least one emission layer between the first electrode and the second electrode and includes at least one polycyclic compound represented by Formula 1 below, thereby exhibiting long service life characteristics. In Formula 1, the substituents are the same as defined in the detailed description.

(Continued)

Formula 1

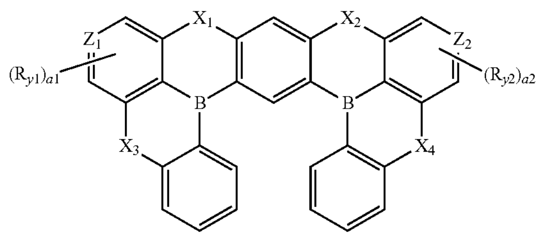

21 Claims, 6 Drawing Sheets

(51) Int. Cl.
*H10K 50/11* (2023.01)
*H10K 101/10* (2023.01)

(52) U.S. Cl.
CPC ....... *H10K 85/636* (2023.02); *H10K 85/6574* (2023.02); *H10K 50/11* (2023.02); *H10K 2101/10* (2023.02)

(56) References Cited

FOREIGN PATENT DOCUMENTS

| | | | |
|---|---|---|---|
| KR | 10-2020-0006965 | A | 1/2020 |
| KR | 10-2020-0062329 | A | 6/2020 |
| KR | 10-2020-0081269 | A | 7/2020 |
| WO | WO 2018/212169 | A1 | 11/2018 |

OTHER PUBLICATIONS

Yasuhiro Kondo et al., “Narrowband deep-blue organic light-emitting diode featuring an organoboron-based emitter”, Letters, Nature Photonics, Jul. 15, 2019, 6 Pages, Springer Nature Limited.

LIGHT EMITTING DEVICE

CROSS-REFERENCE TO RELATED APPLICATION

This application claims priority to and the benefit of Korean Patent Application No. 10-2020-0150493, filed on Nov. 11, 2020, in the Korean Intellectual Property Office, the entire content of which is hereby incorporated by reference.

BACKGROUND

1. Field

The present disclosure herein relates to a light emitting device.

2. Description of the Related Art

Recently, the development of an organic electroluminescence display as an image display apparatus is being actively conducted. Unlike liquid crystal display apparatuses and/or the like, the organic electroluminescence display is a so-called self-luminescent display apparatus in which holes and electrons injected from a first electrode and a second electrode recombine in an emission layer, and thus a luminescent material including an organic compound in the emission layer emits light to implement display (e.g., to display an image).

In the application of a light emitting device to a display apparatus, there is a desire (e.g., a demand) for a light emitting device to have a low driving voltage, a high luminous efficiency, and a long service life, and the development of materials for a light emitting device capable of stably attaining such characteristics is being continuously conducted.

SUMMARY

An aspect according to embodiments of the present disclosure is directed toward a light emitting device having a long service life.

According to an embodiment of the present disclosure, a light emitting device includes: a first electrode; a second electrode on the first electrode; and an emission layer between the first electrode and the second electrode and including a polycyclic compound represented by Formula 1, wherein the first electrode and the second electrode each independently include at least one selected from among Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, or an oxide thereof.

Formula 1

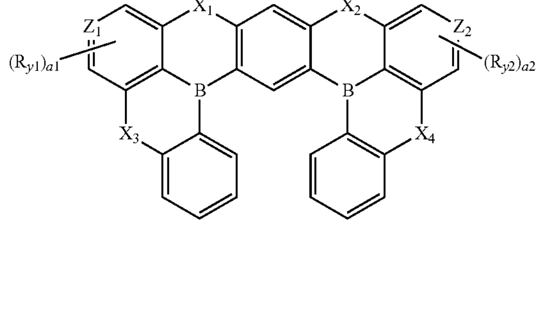

In Formula 1, $X_1$ to $X_4$ are each independently O, S, Se, or $NR_1$, $Z_1$ and $Z_2$ are each independently $CR_2$, a1 and a2 are each independently an integer of 0 to 2, and $R_{y1}$ and $R_{y2}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkenyl group having 2 to 20 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms.

$R_1$ and $R_2$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkenyl group having 2 to 20 carbon atoms, a substituted or unsubstituted oxy group, a substituted or unsubstituted aryl group having 6 to 30 ring-forming carbon atoms, a substituted or unsubstituted heteroaryl group having 2 to 30 ring-forming carbon atoms, a substituted or unsubstituted thio group, or a moiety represented by Formula A, and/or are bonded to an adjacent group to form a ring, and at least one selected from among $X_1$ to $X_4$, $Z_1$ and $Z_2$ includes the moiety represented by Formula A:

Formula A

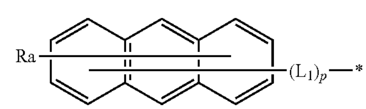

In Formula A, Ra is a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, $L_1$ is a substituted or unsubstituted arylene group having 6 to 30 ring-forming carbon atoms, a substituted or unsubstituted heteroarylene group having 2 to 30 ring-forming carbon atoms, or a substituted or unsubstituted divalent amine group, and p may be 0 or 1.

In an embodiment, the moiety represented by Formula A may be represented by any one selected from among Formula A-1 to Formula A-4:

Formula A-1

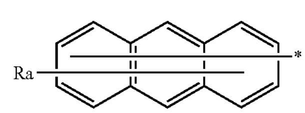

-continued

Formula A-2

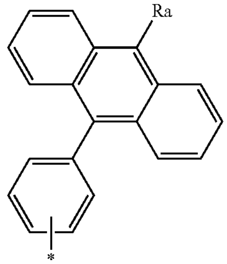

Formula A-3

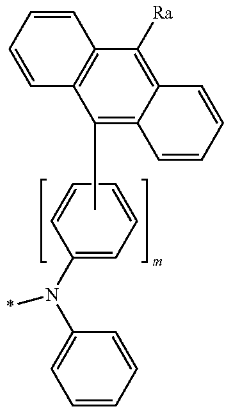

Formula A-4

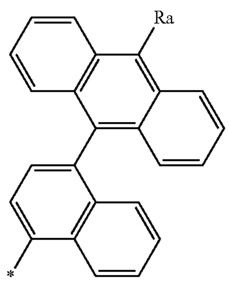

In Formula A-3, m is 0 or 1, and in Formula A-1 to Formula A-4, Ra is the same as defined in connection with Formula A.

In an embodiment, the moiety represented by Formula A-1 may be represented by Formula AA-1 or Formula AA-2:

Formula AA-1

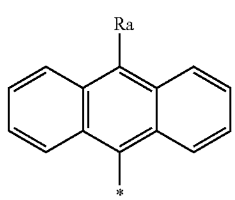

Formula AA-2

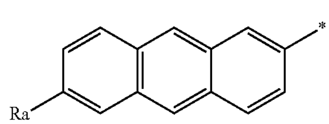

In Formula AA-1 and Formula AA-2, Ra is the same as defined in connection with Formula 1.

In an embodiment, the moiety represented by Formula A-2 may be represented by any one selected from among Formula B-1 to Formula B-3:

Formula B-1

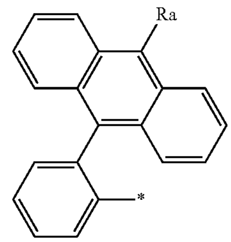

Formula B-2

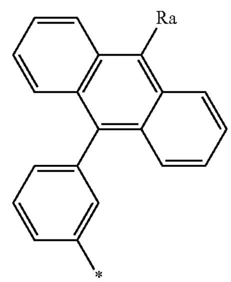

Formula B-3

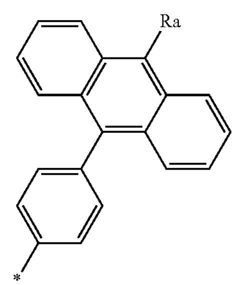

In Formula B-1 to Formula B-3, Ra is the same as defined in connection with Formula A.

The moiety represented by Formula A-3 may be represented by Formula C-1 or Formula C-2:

Formula C-1

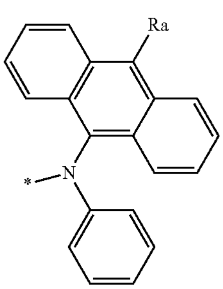

-continued

Formula C-2

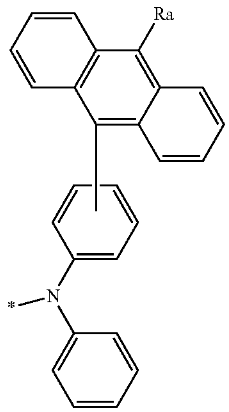

In Formula C-1 and Formula C-2, Ra is the same as defined in connection with Formula A.

In an embodiment, Ra may be an unsubstituted phenyl group or an unsubstituted naphthyl group.

In an embodiment, a lowest triplet excitation energy of the polycyclic compound may be about 1.8 eV or less.

In an embodiment, the emission layer may include a dopant and a host, and the dopant may include the polycyclic compound represented by Formula 1.

In an embodiment, the light emitting device may further include a capping layer on the second electrode, wherein the capping layer may have a refractive index of about 1.6 or more.

In an embodiment, the polycyclic compound represented by Formula 1 may emit thermally activated delayed fluorescence.

In an embodiment, the emission layer may emit blue light.

In an embodiment, the emission layer may include at least one compound represented by Compound Group 1:

Compound Group 1

1

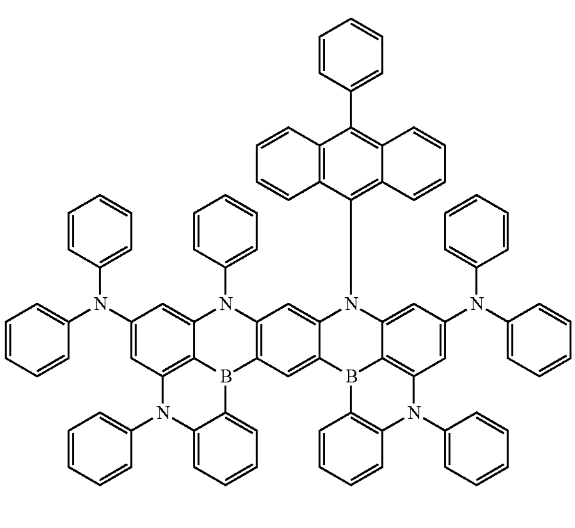

2

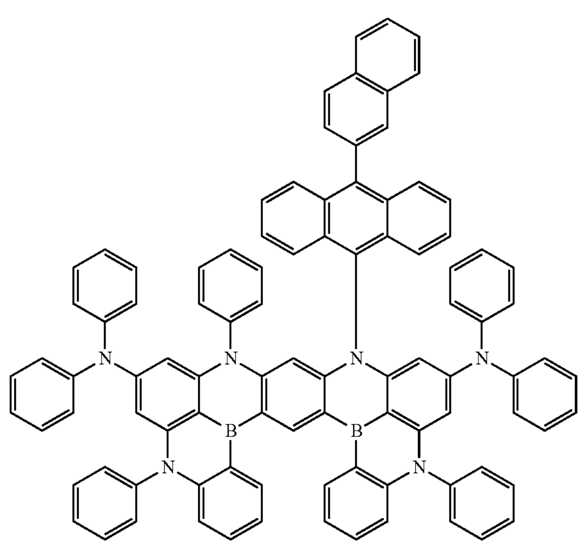

-continued
3
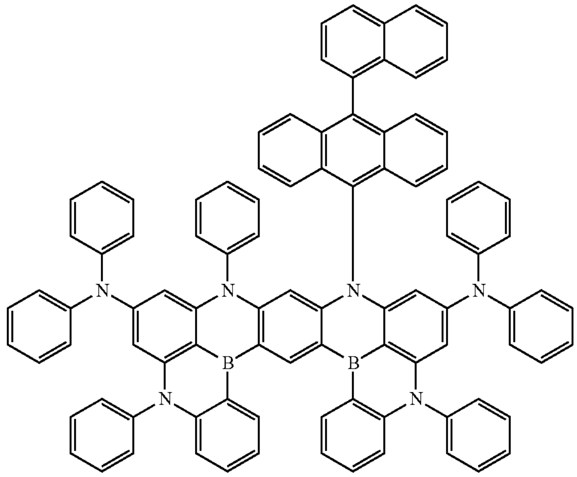
4
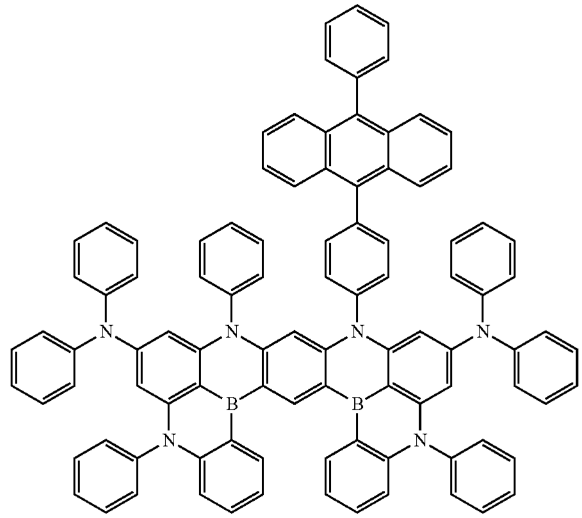
5
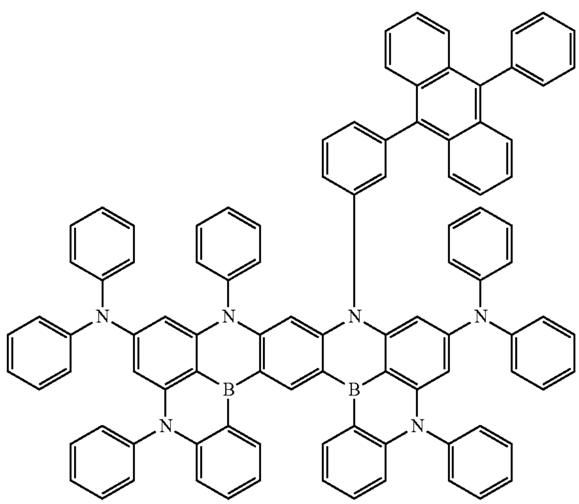
6
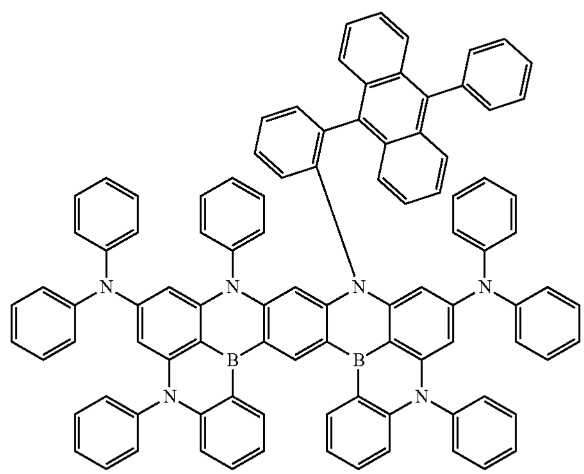
7
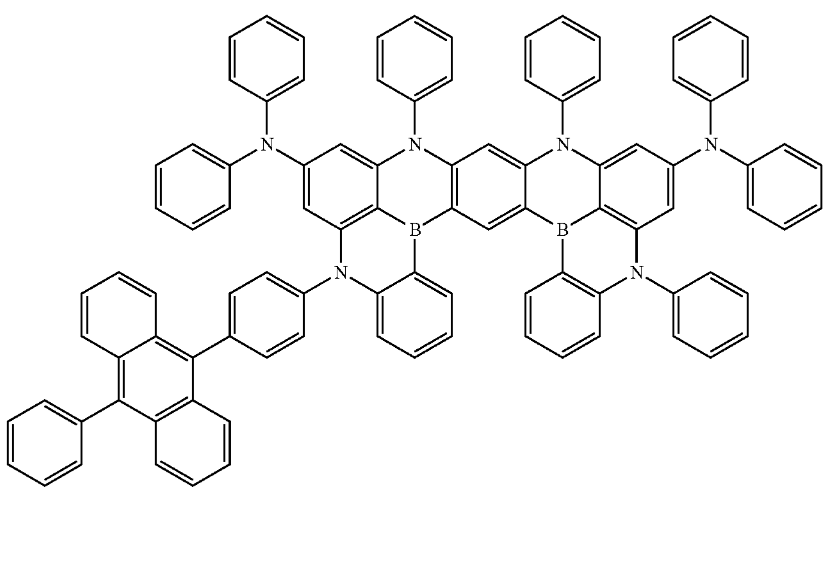

-continued
8
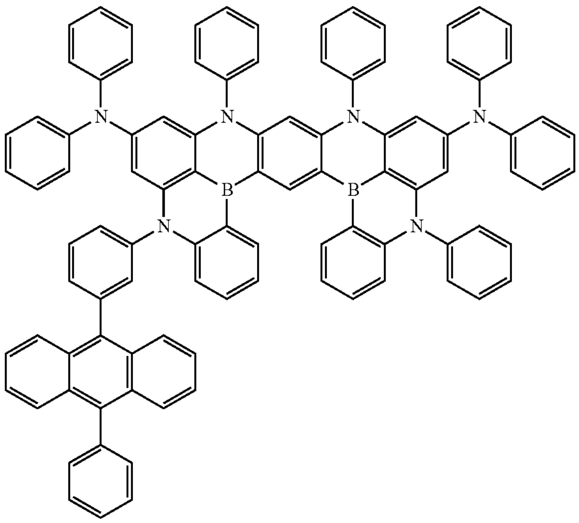
9
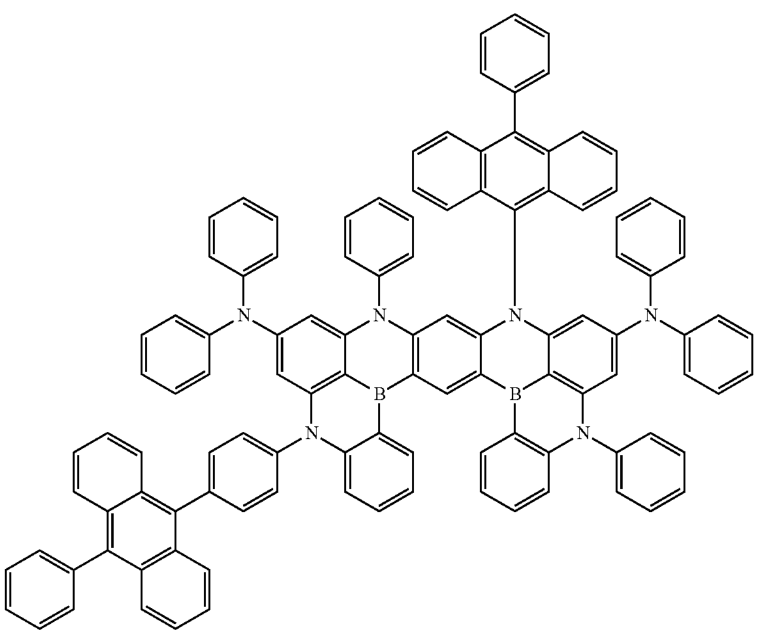

-continued
10
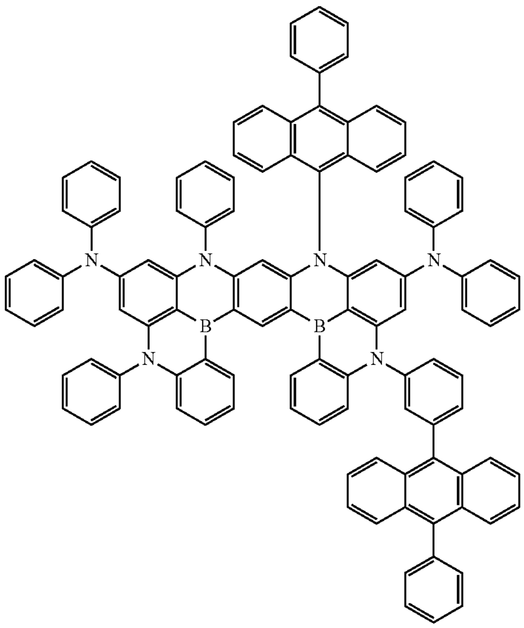
11
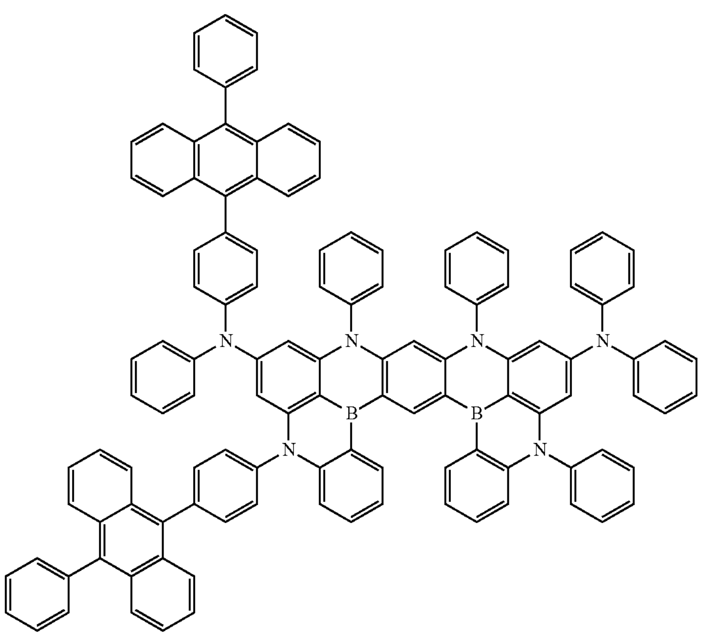

-continued
12
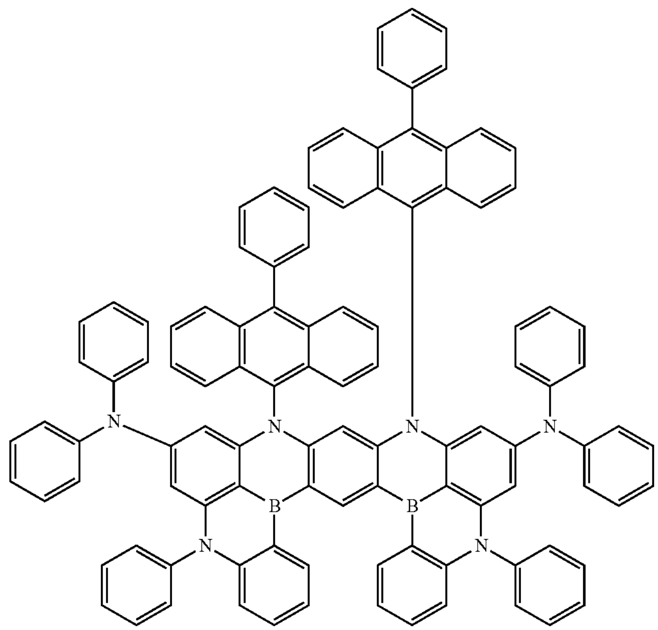
13
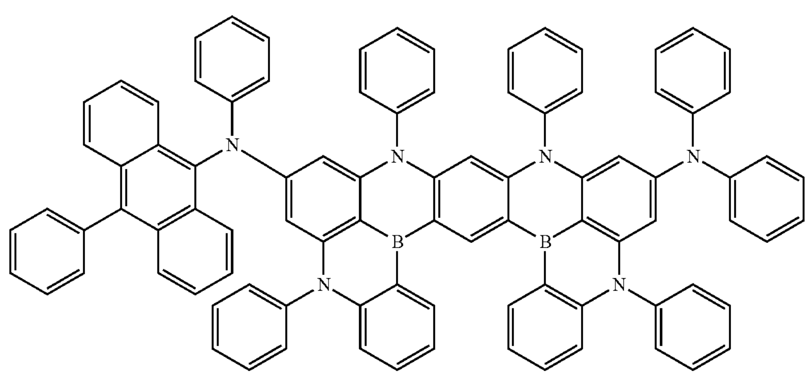
14
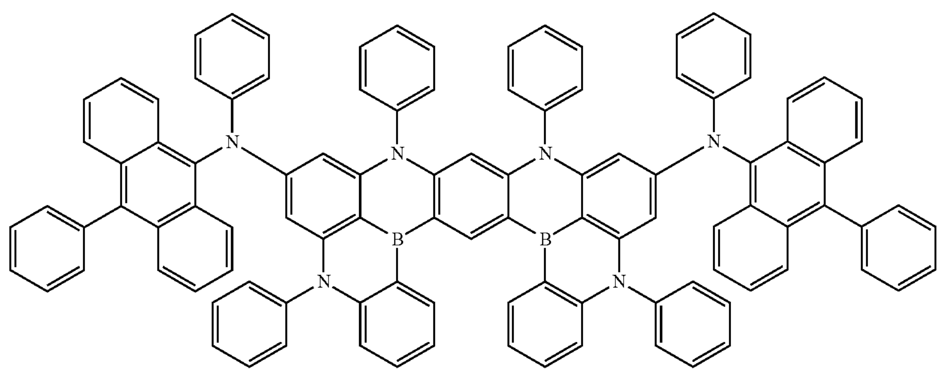

-continued
15
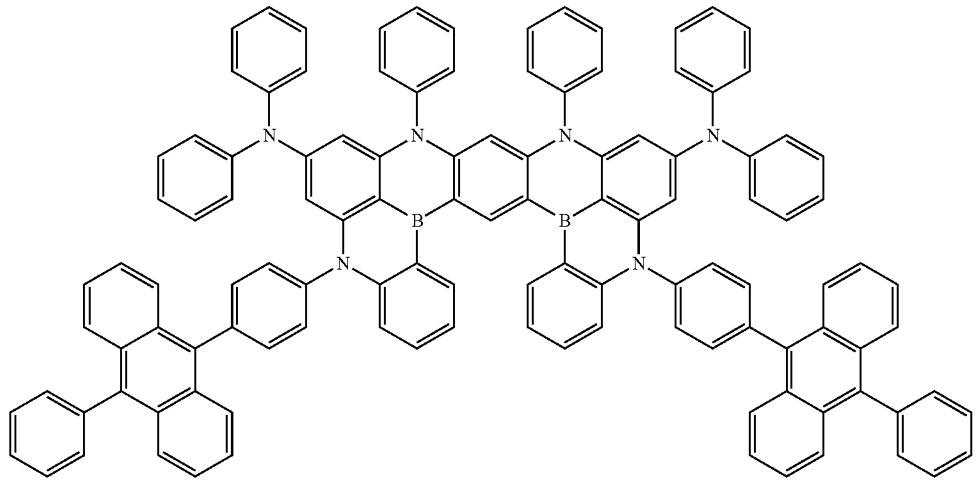
16
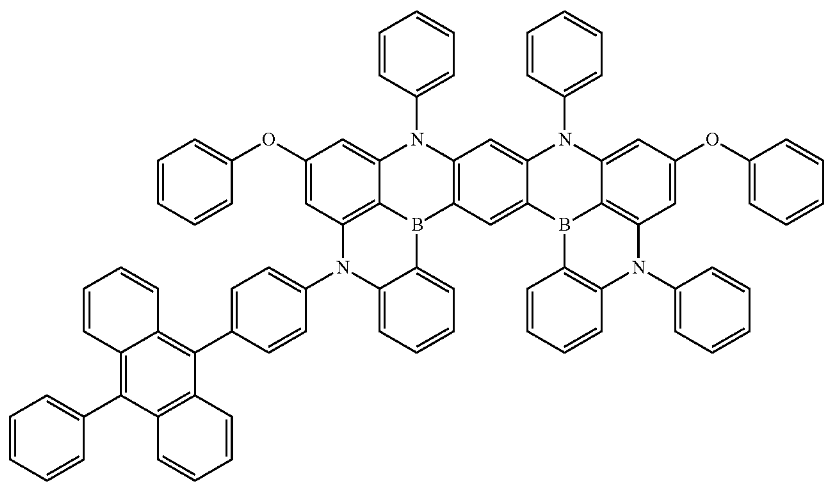
17
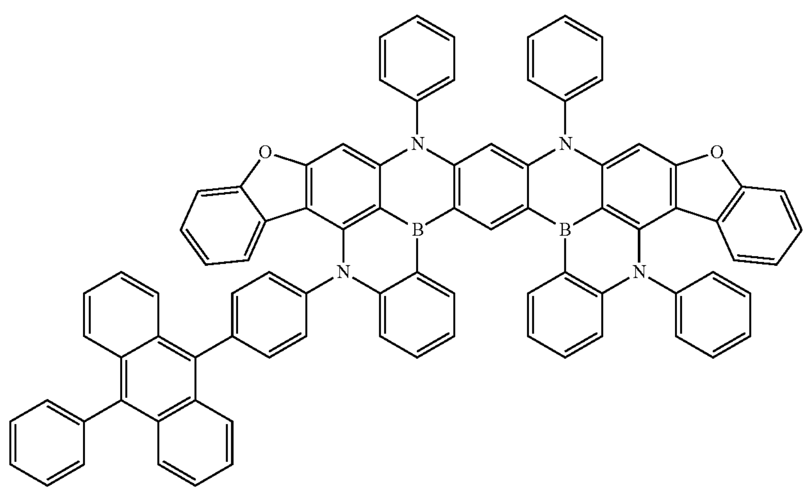

-continued
18
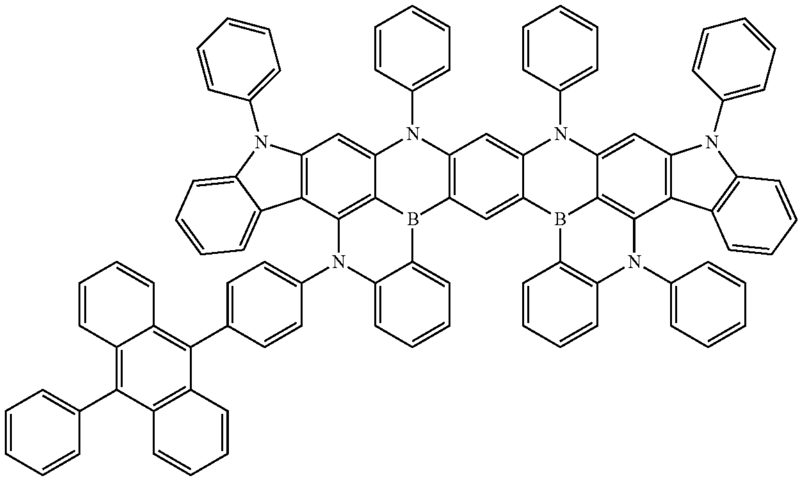
19
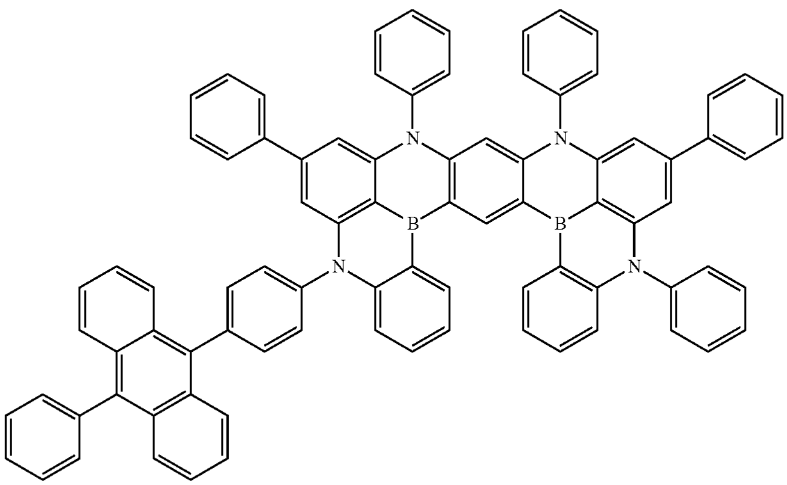
20
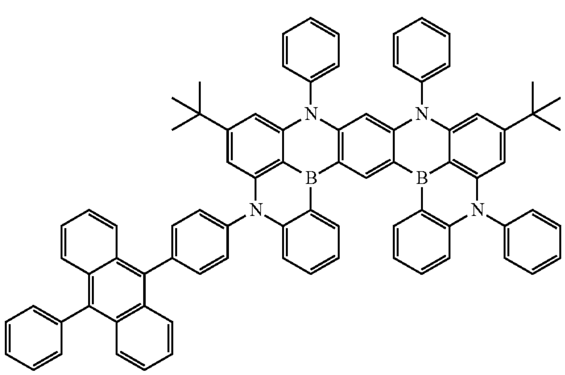
21
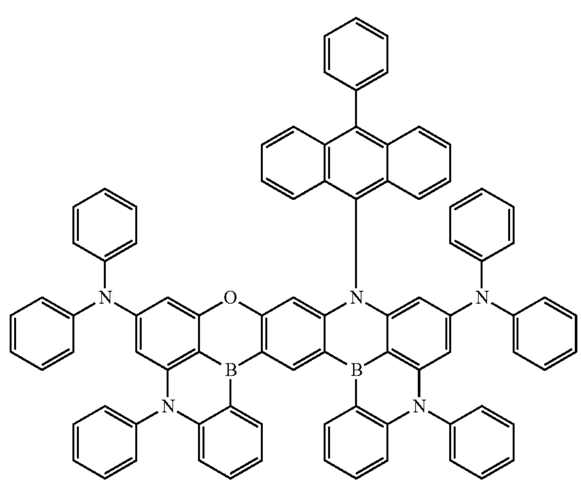

-continued
22
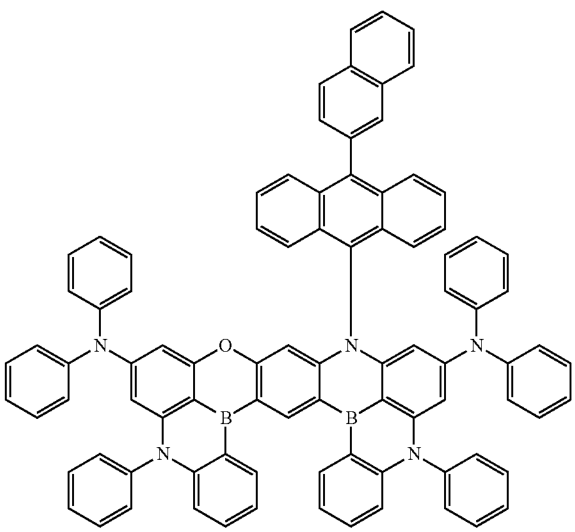
23
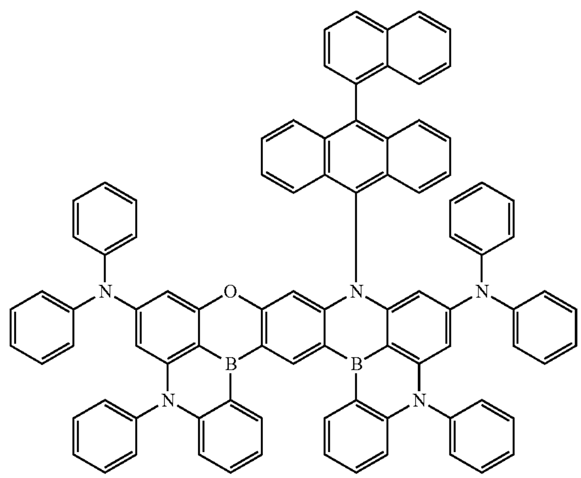
24
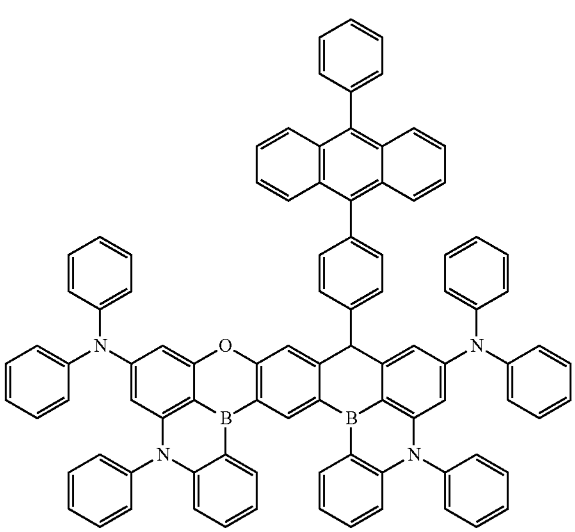
25
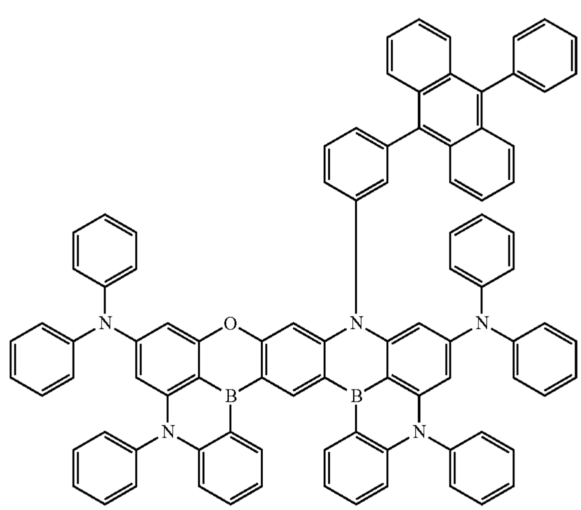
26
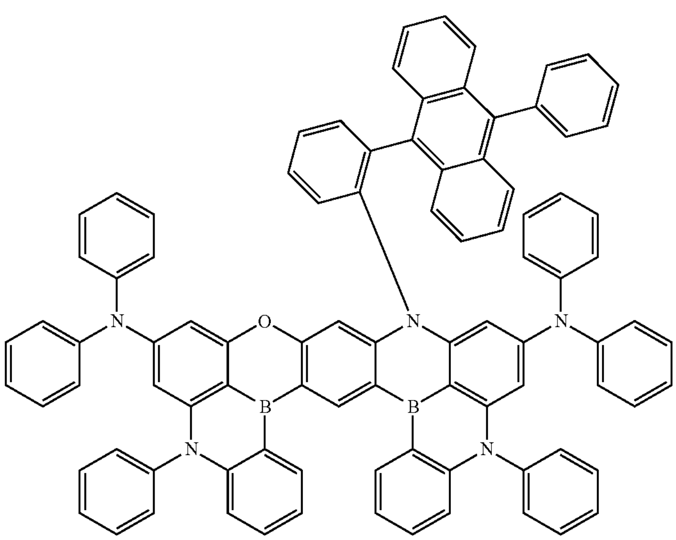

-continued
27
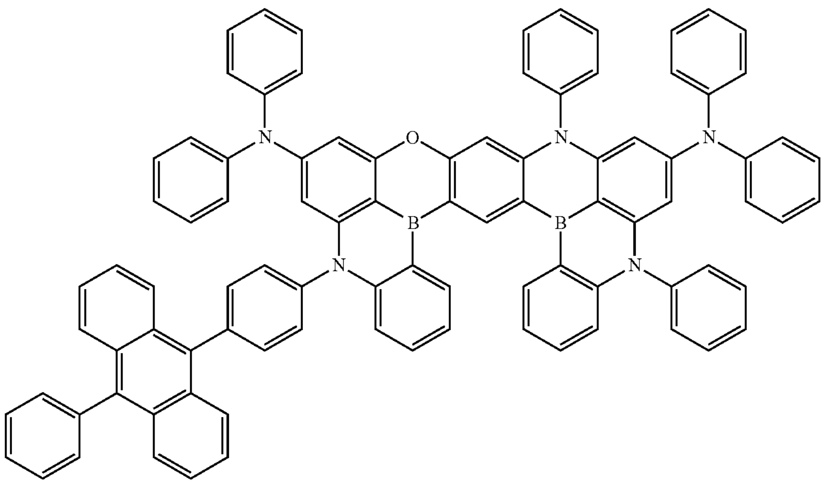
28
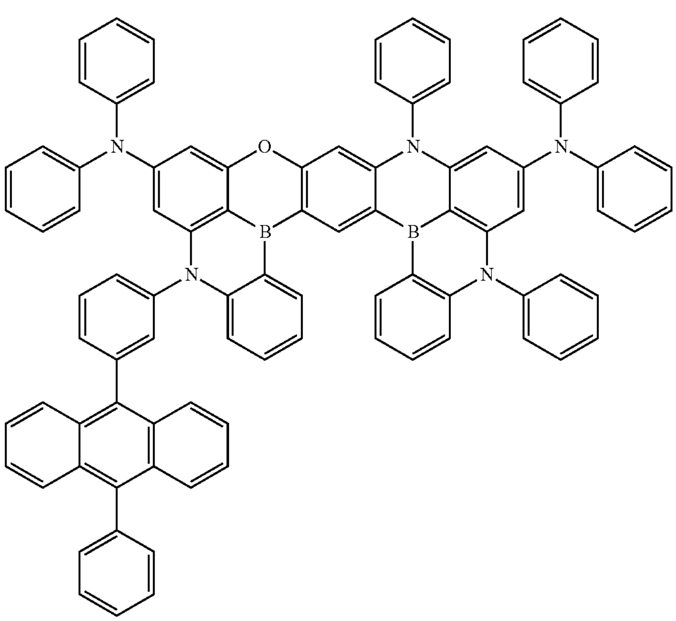

-continued
29
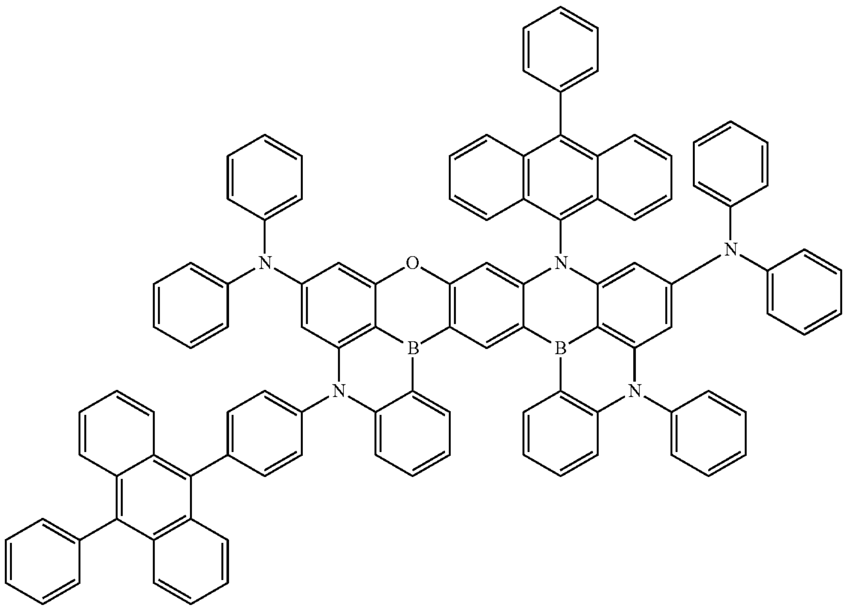
30
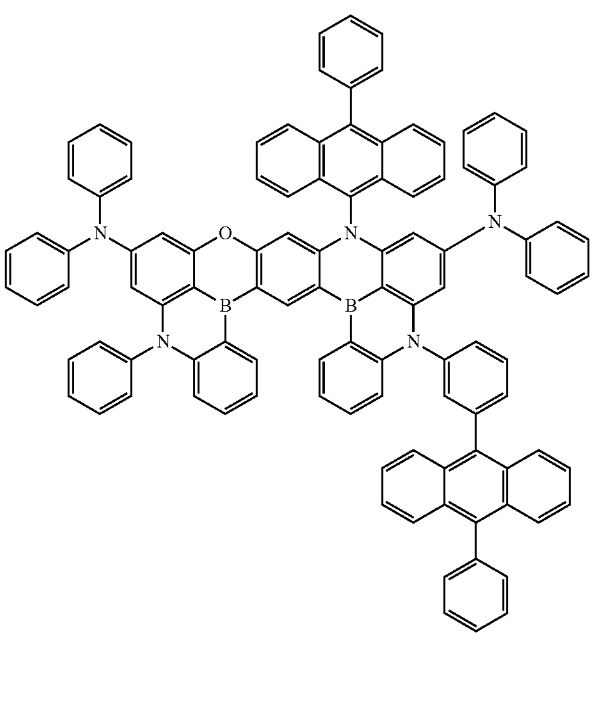

-continued
31
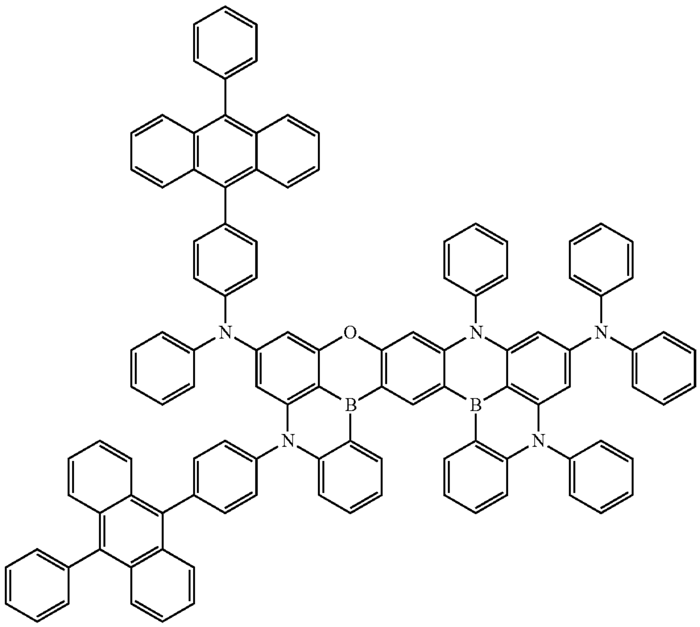
32
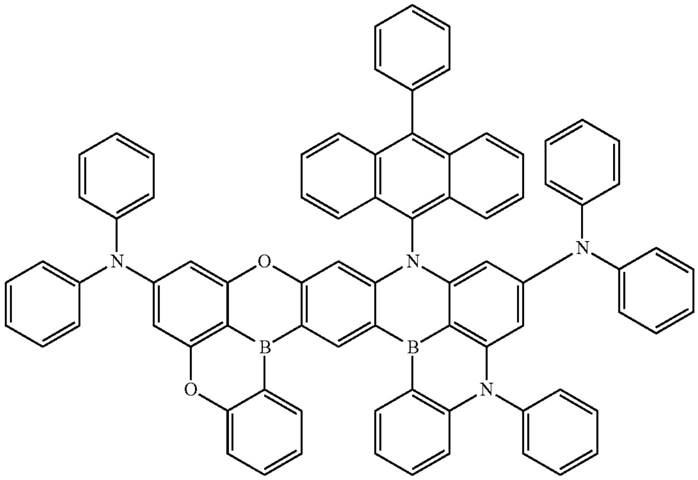
33
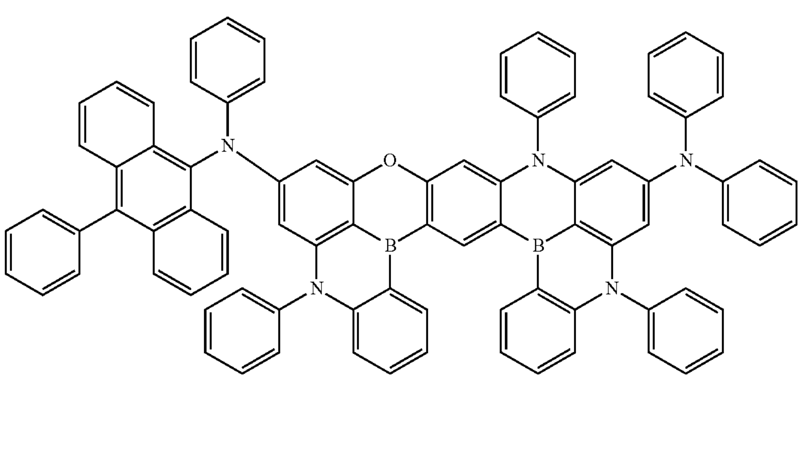

-continued
34
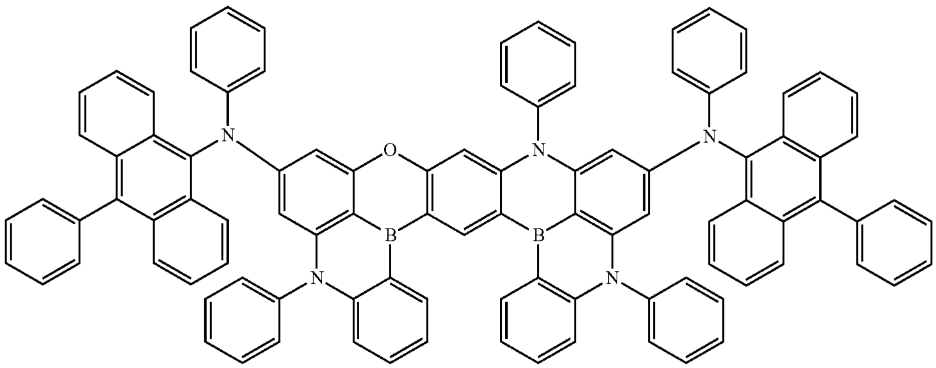
35
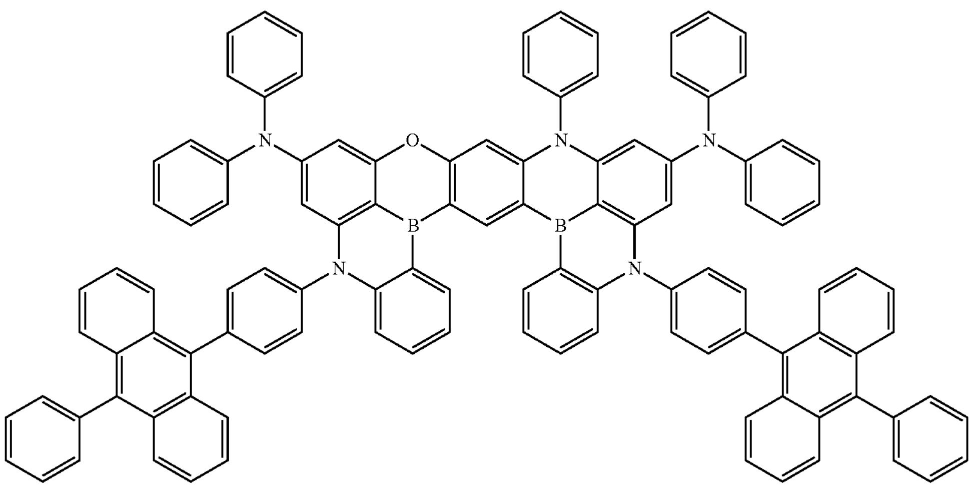
36
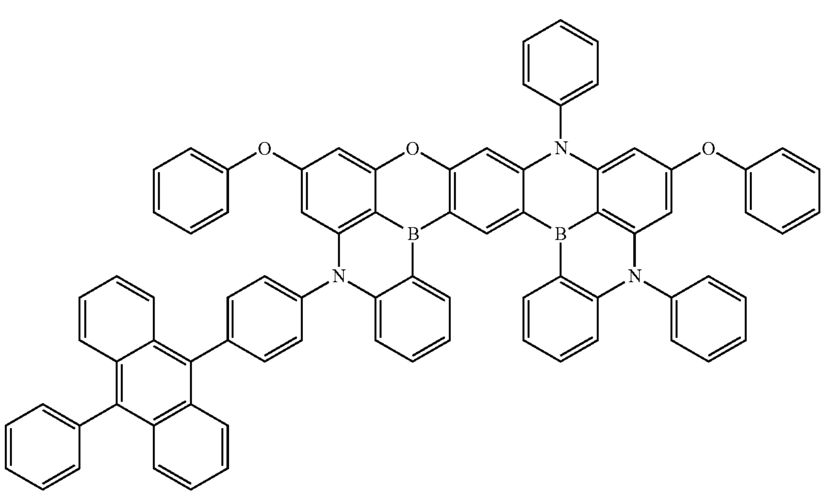

-continued
37
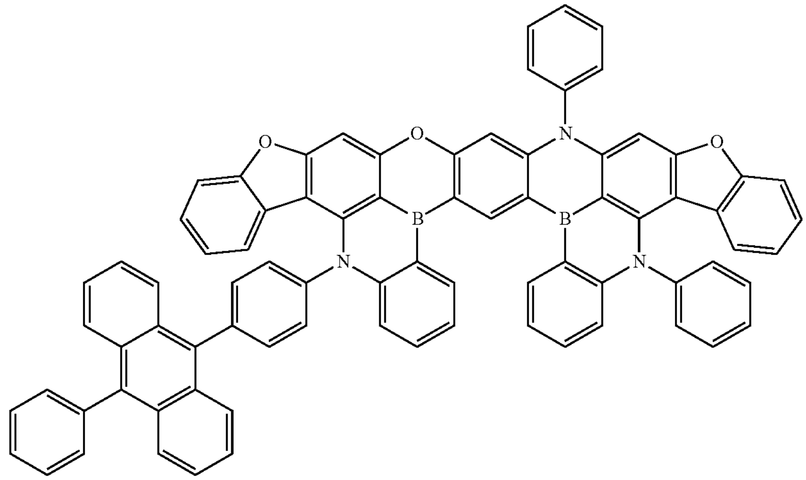
38
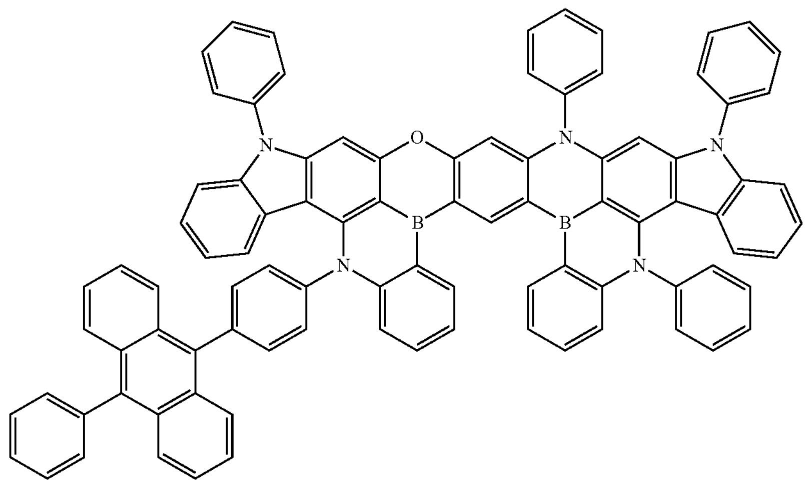
39
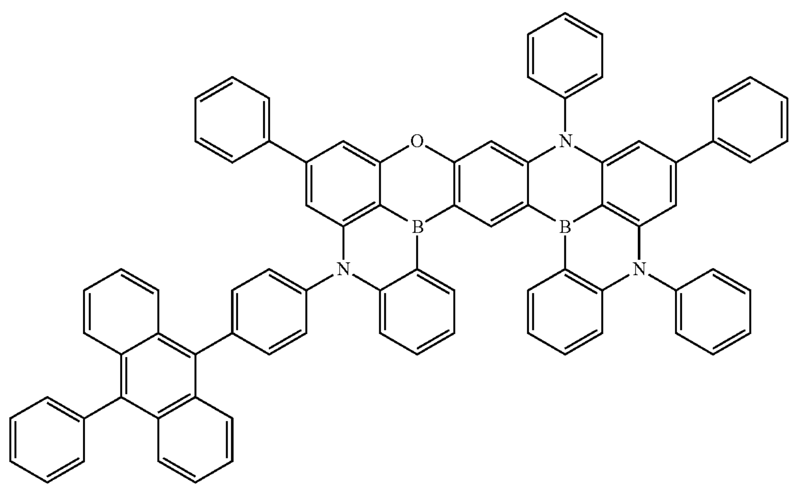

-continued
40
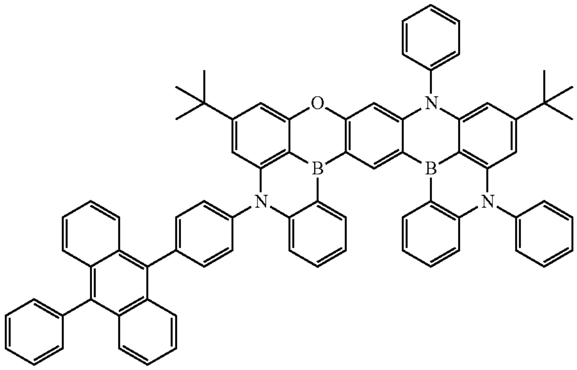
41
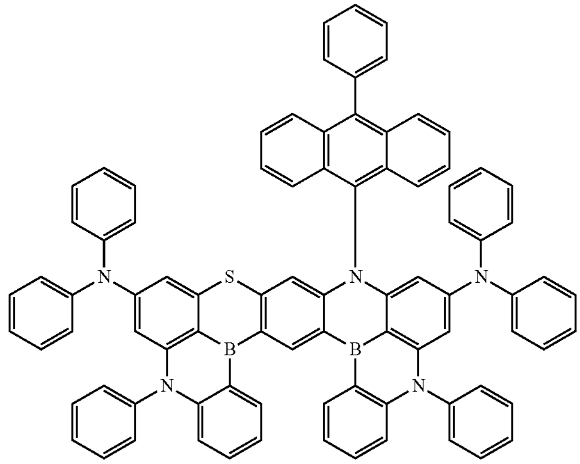
42
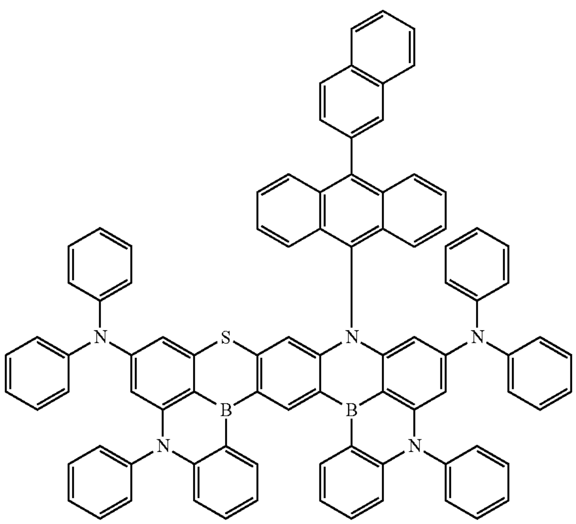
43
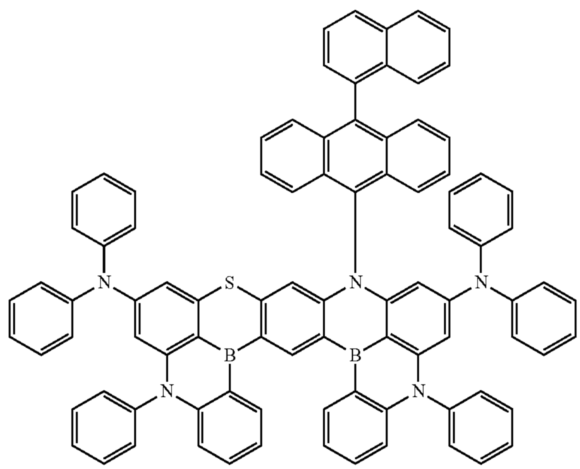
44
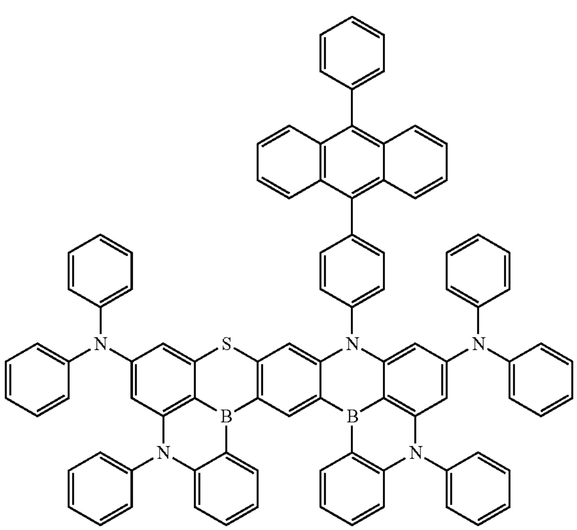
45
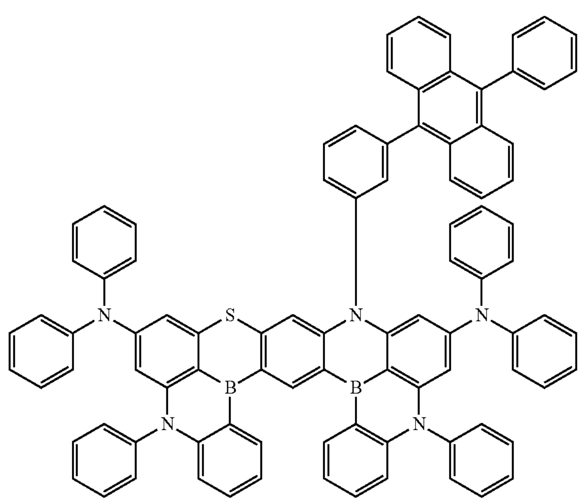

-continued
46
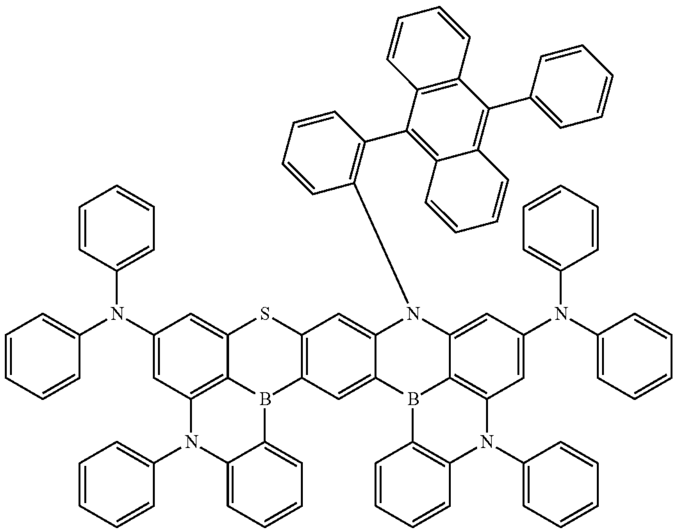
47
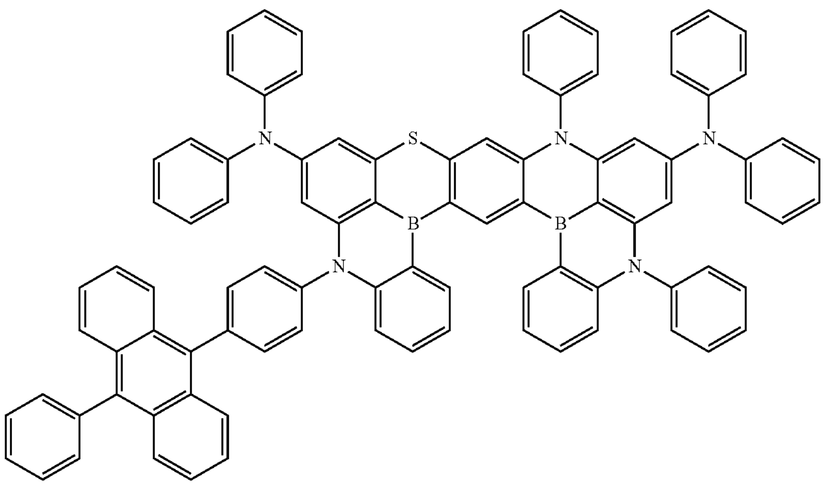
48
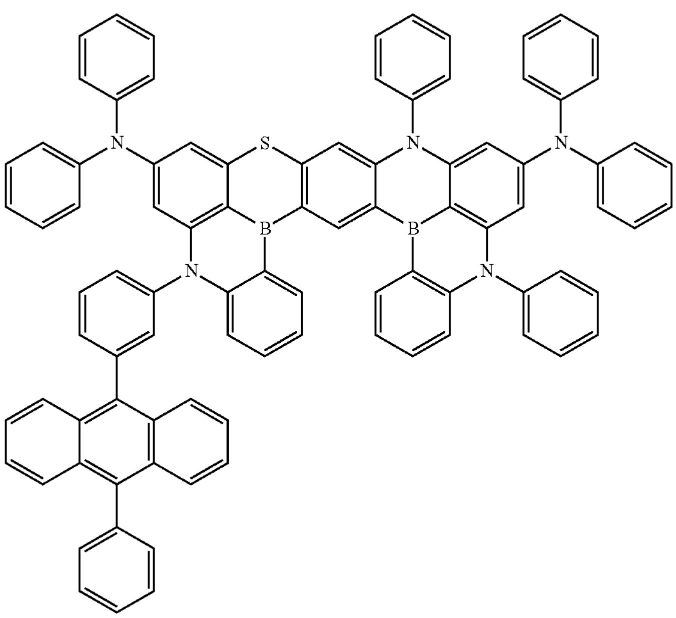

-continued
49
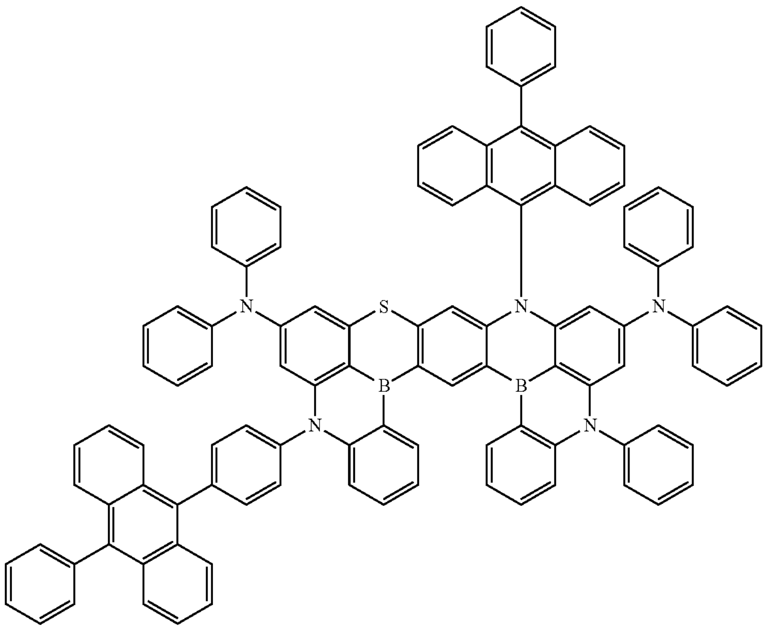
50
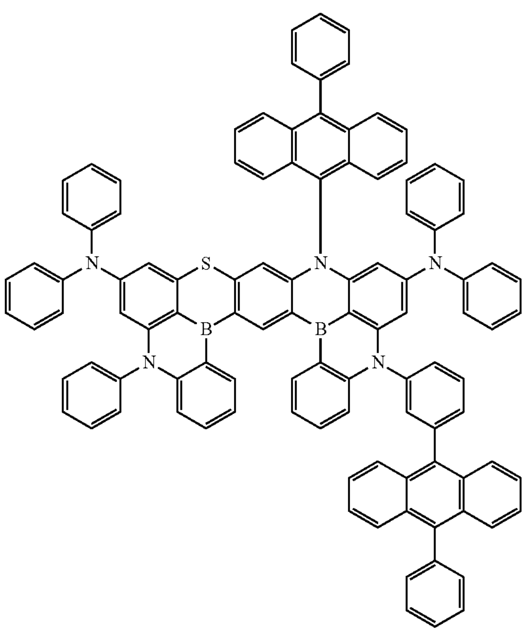

-continued
51
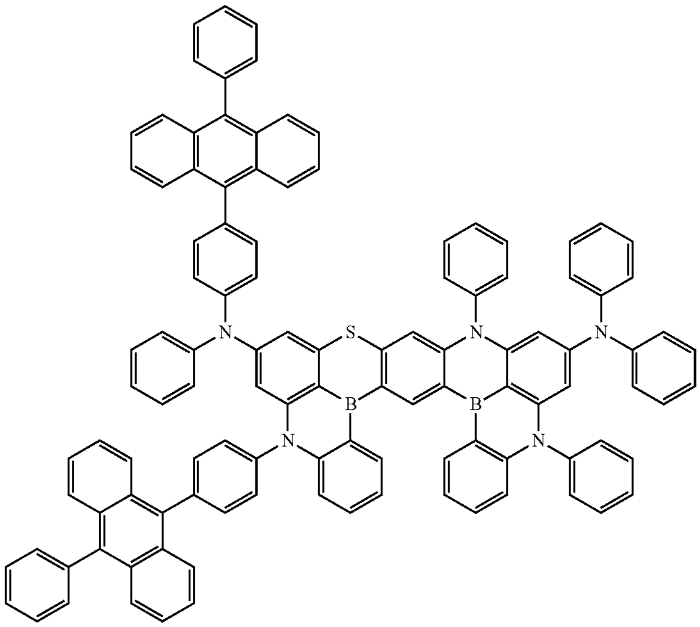
52
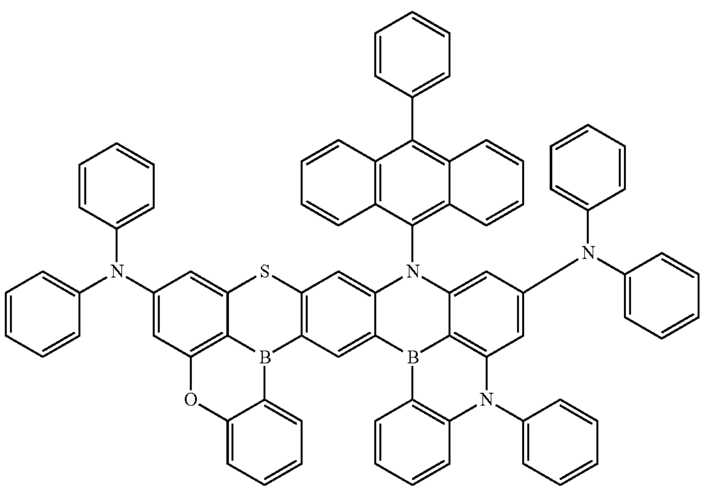
53
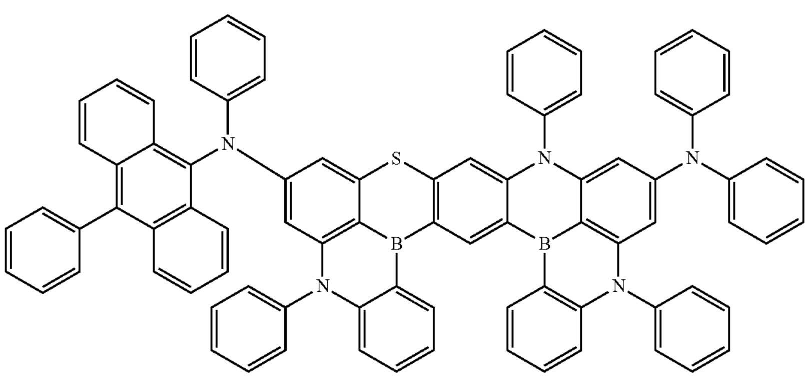

-continued
54
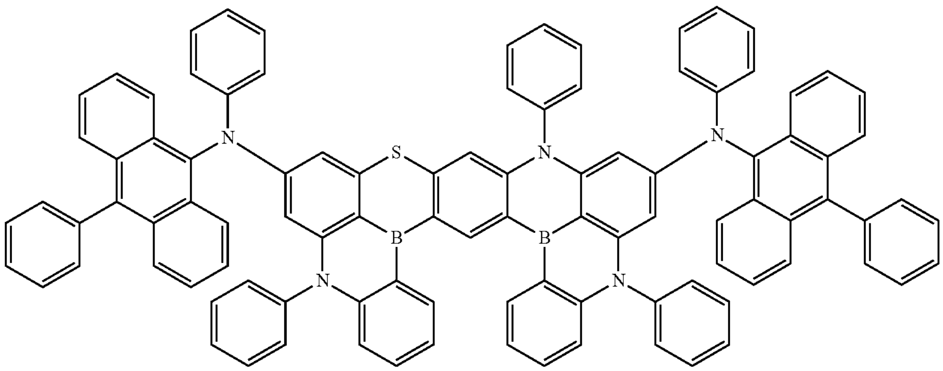
55
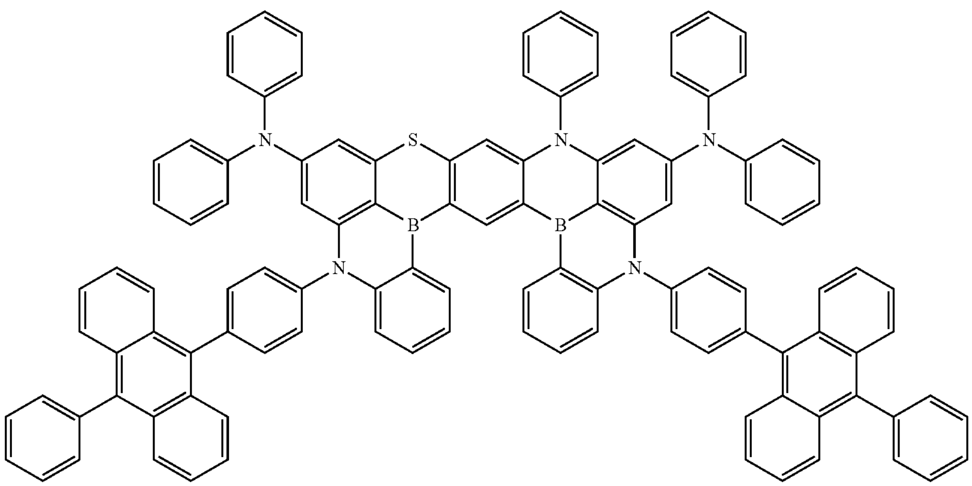
56
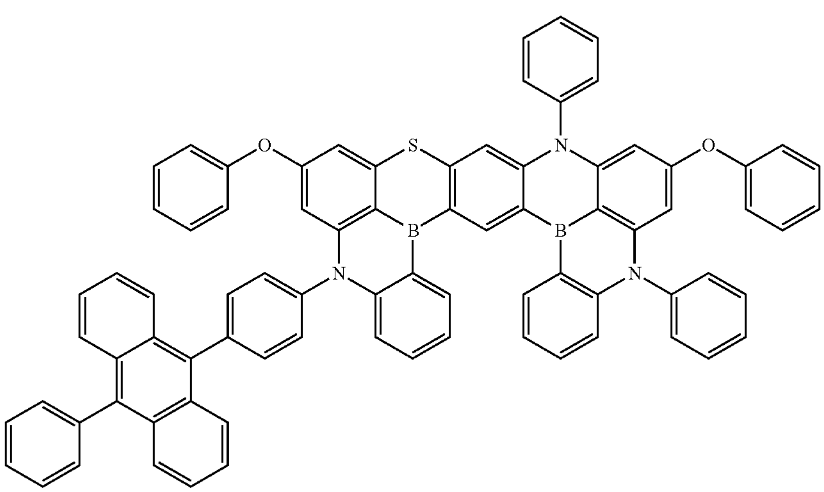

-continued
57
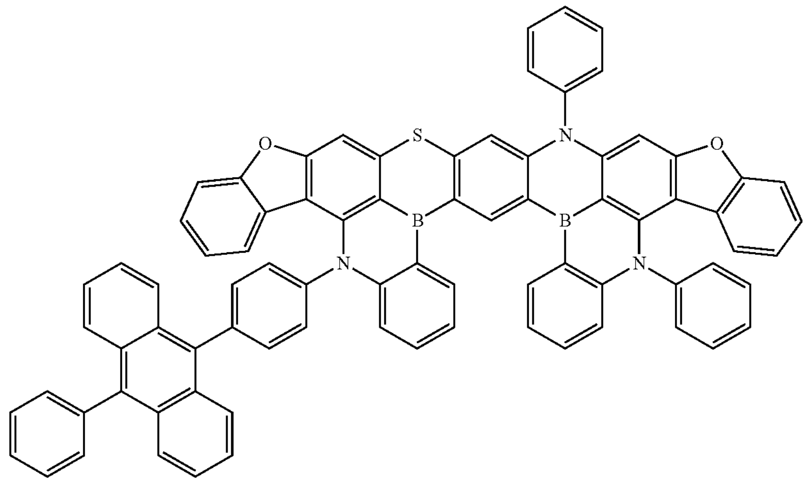
58
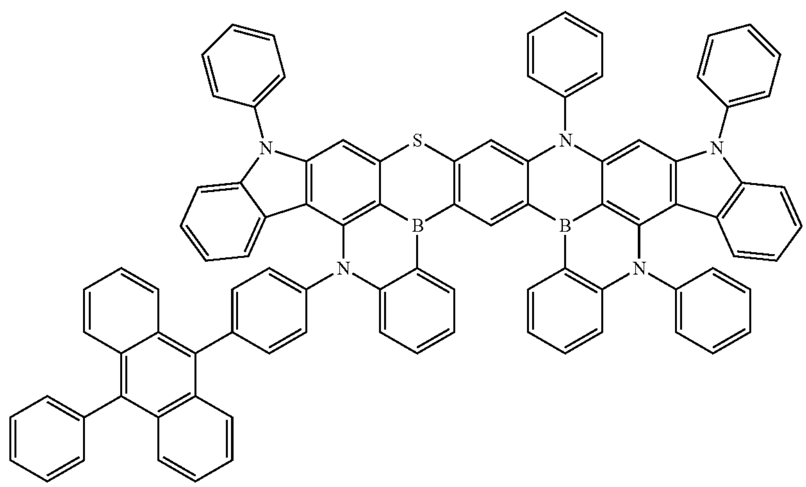
59
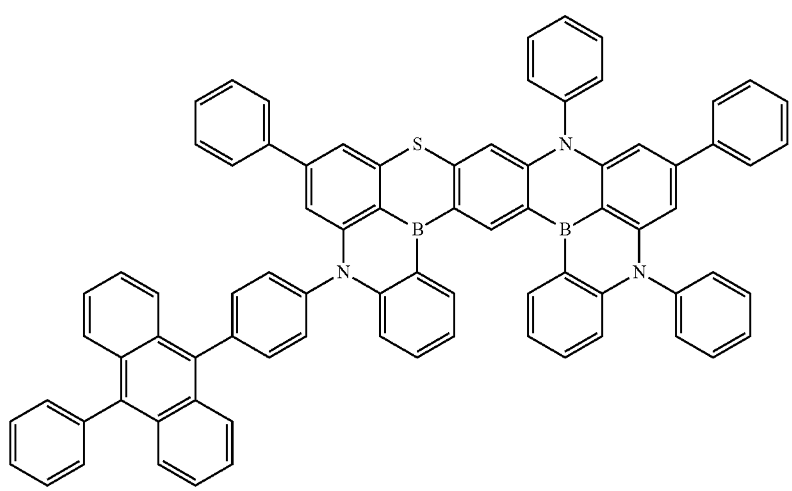

-continued
60
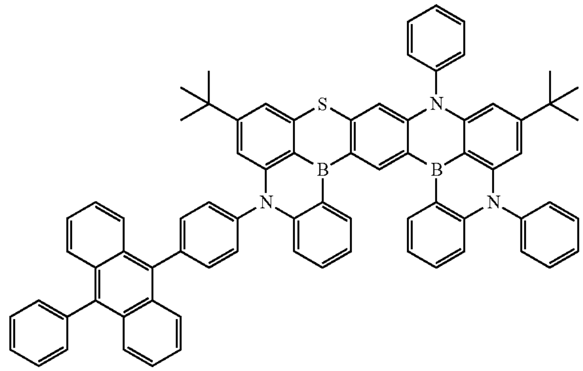
61
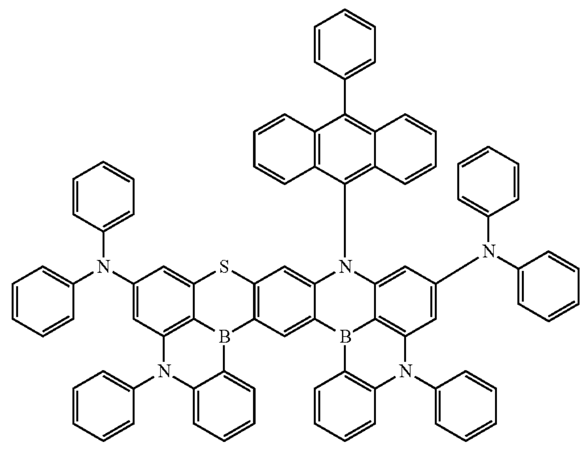
62
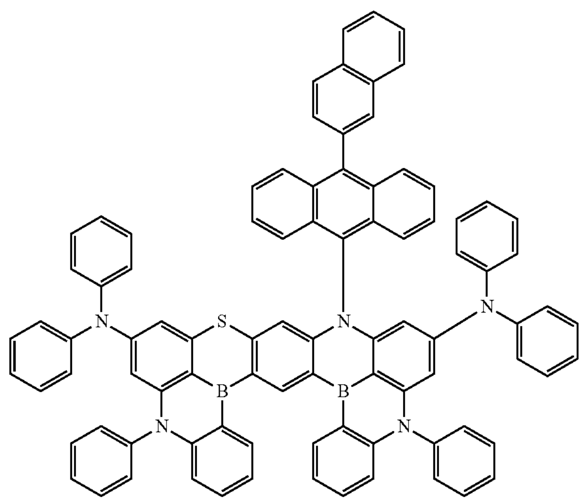
63
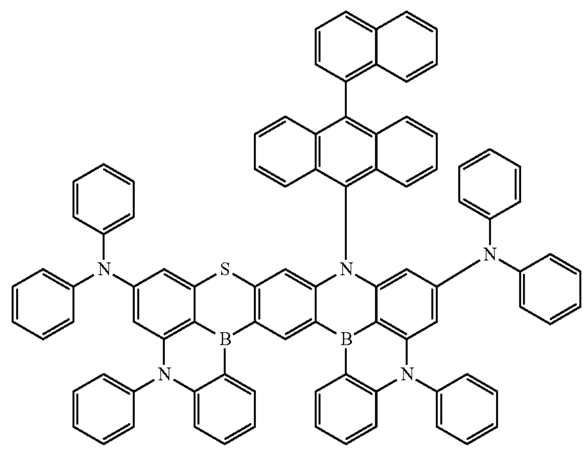
64
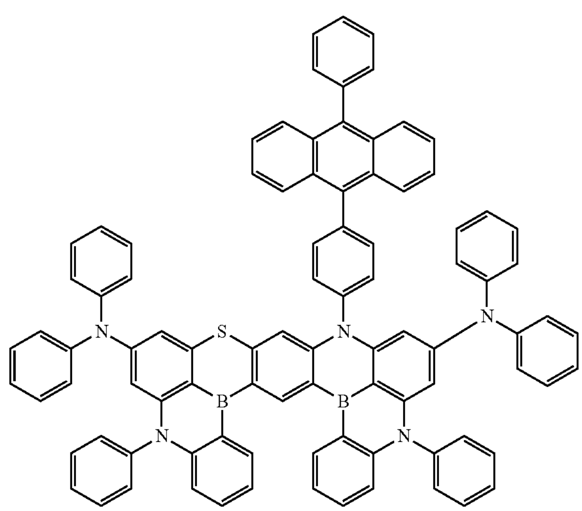
65
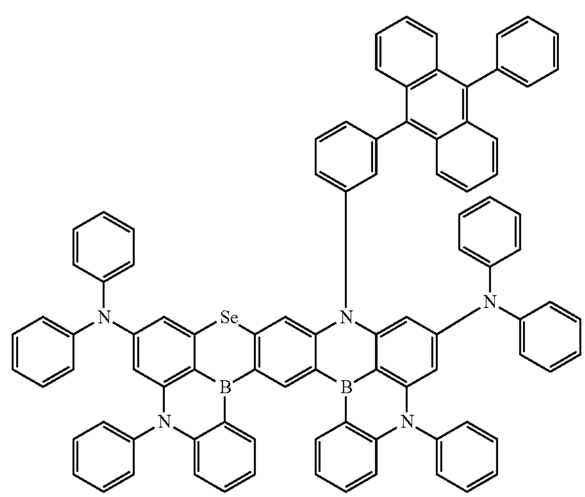

-continued
66
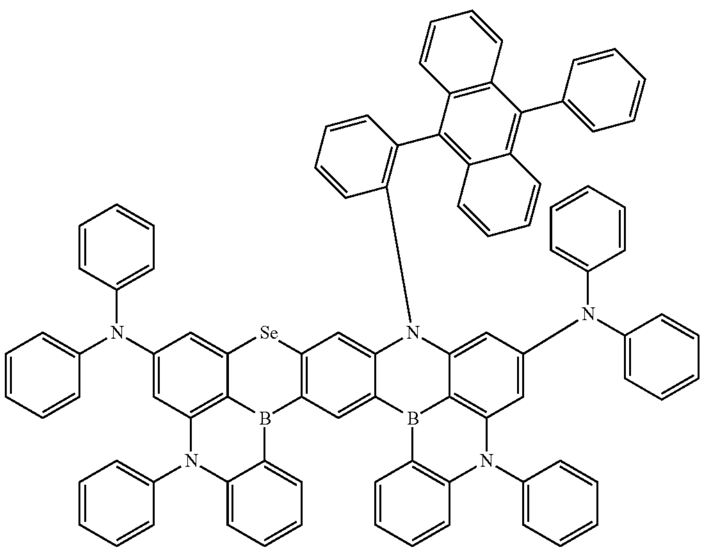
67
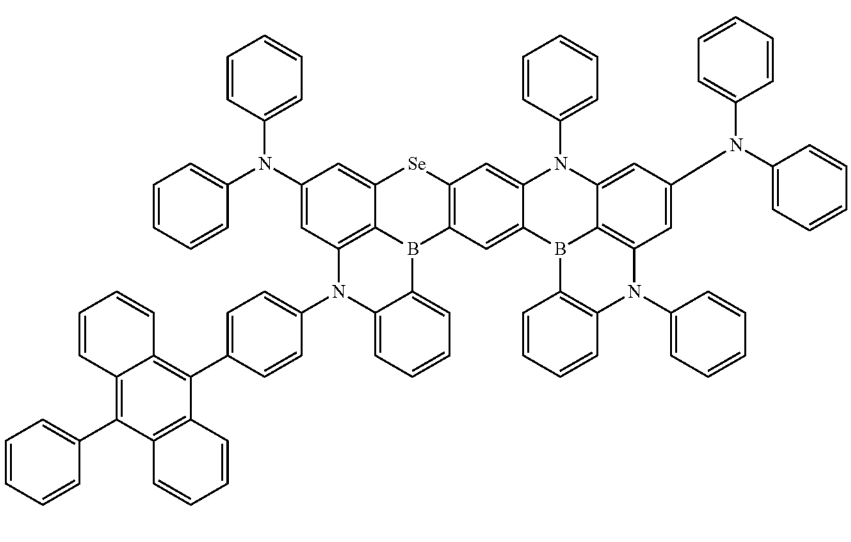

-continued
68
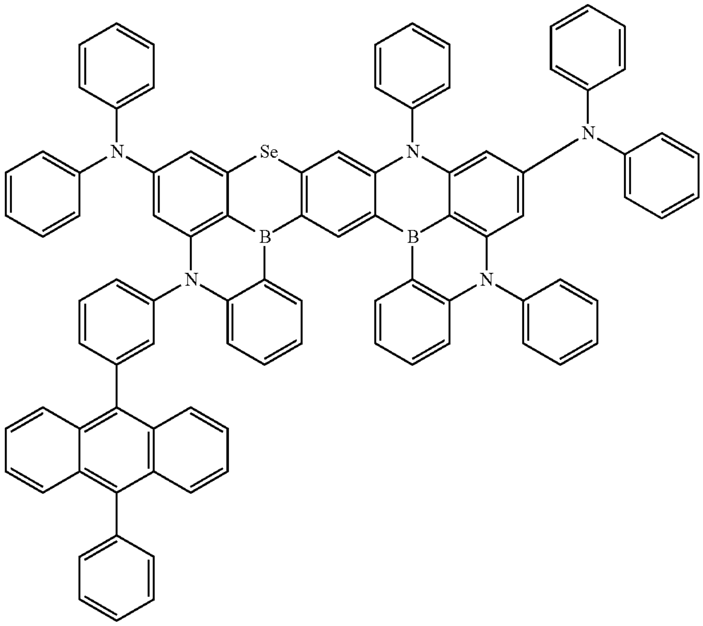
69
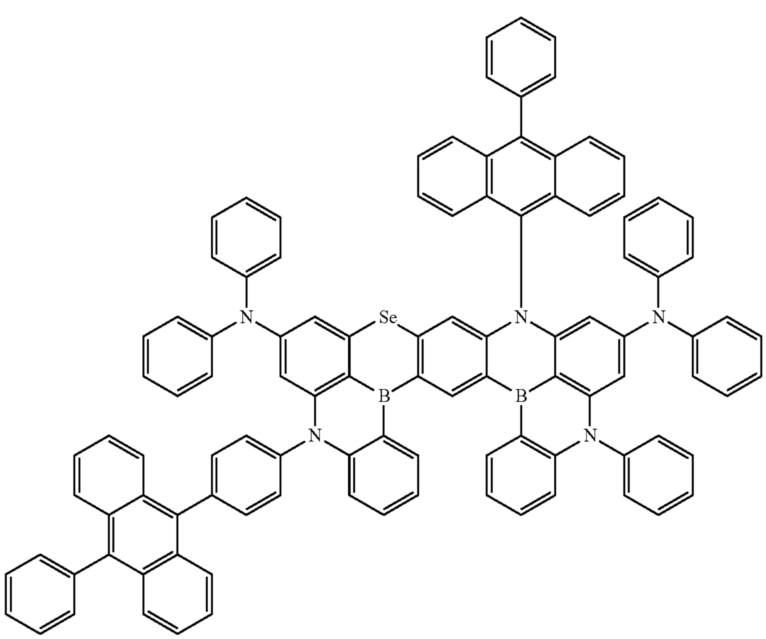

-continued
70
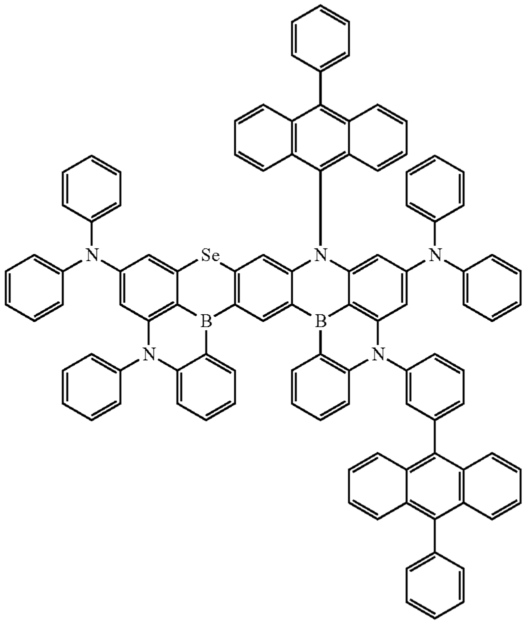
71
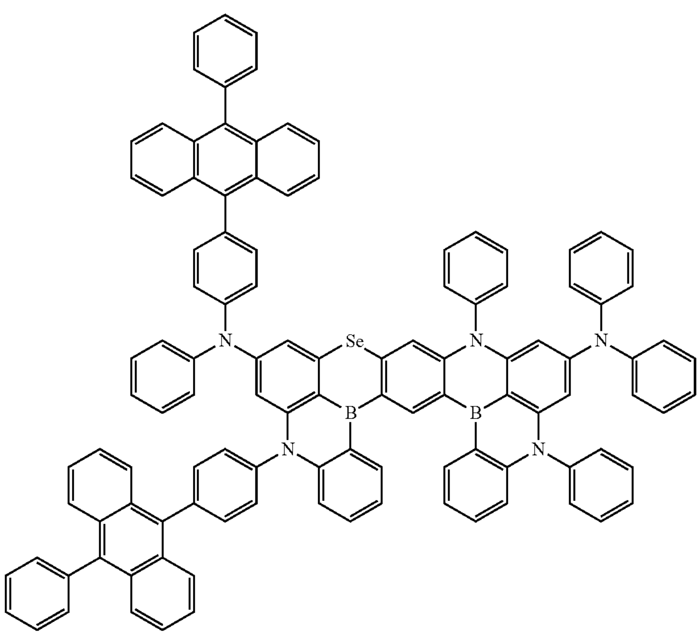

-continued
72
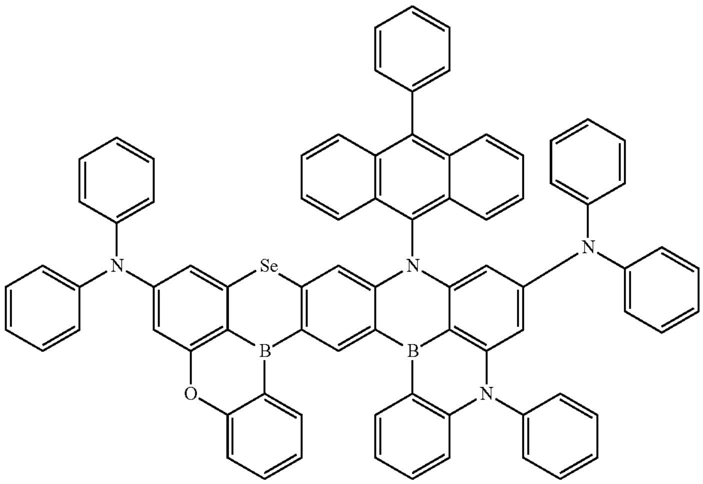
73
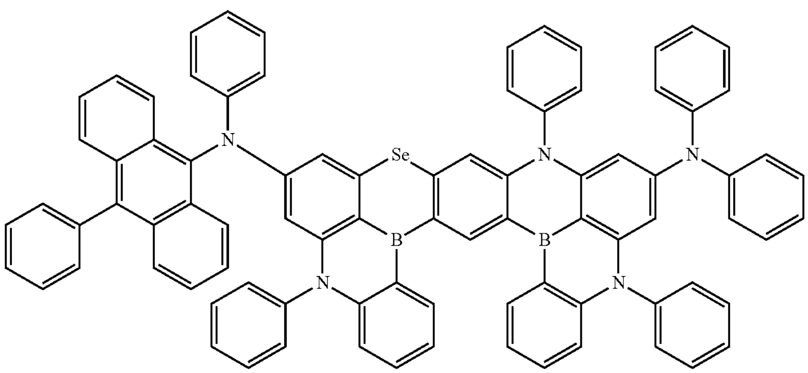
74
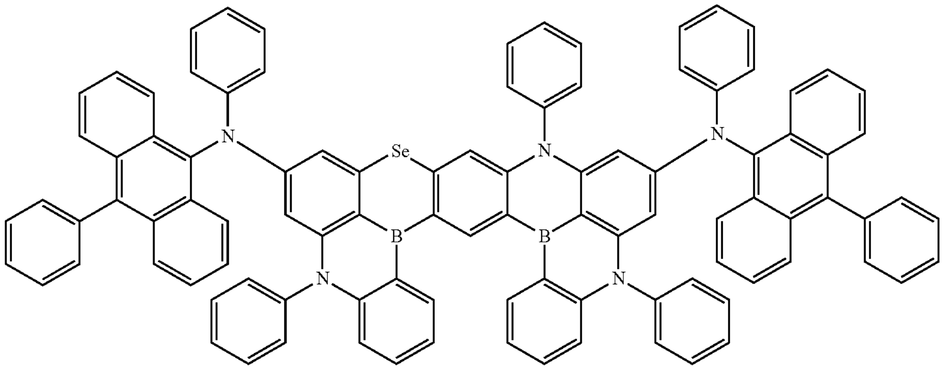

-continued
75
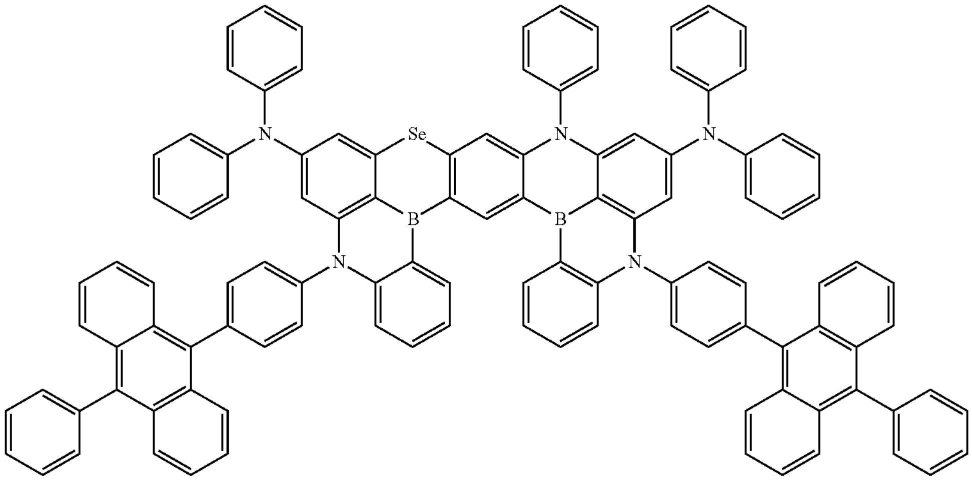
76
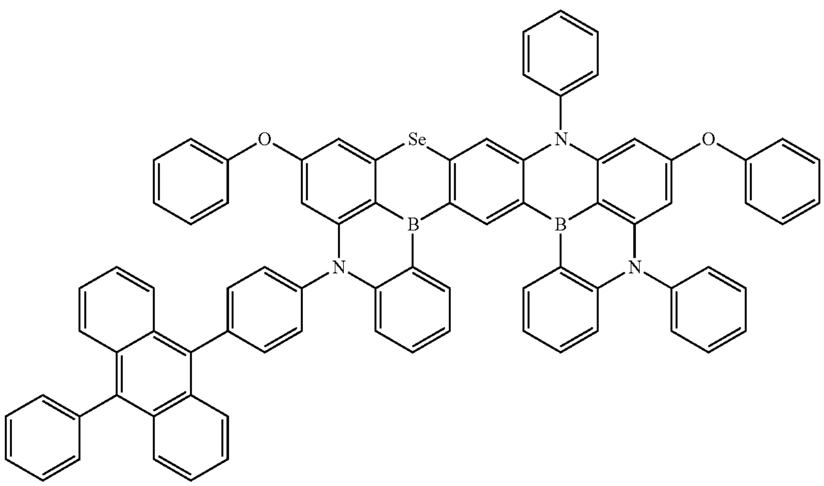
77
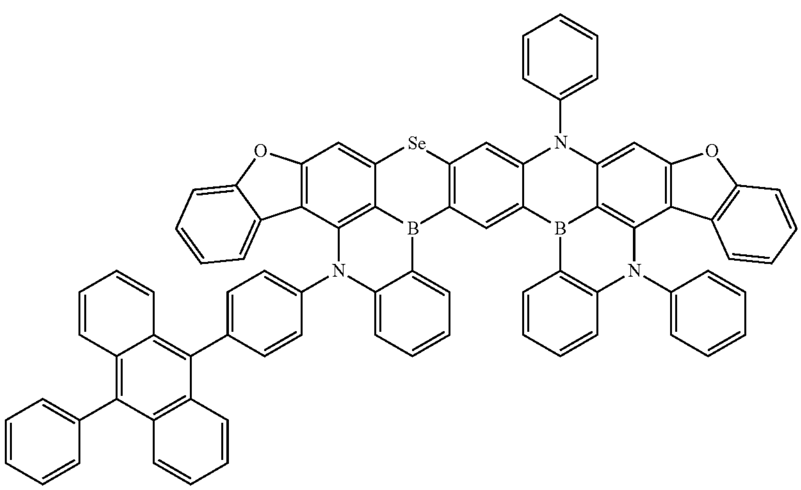

-continued
78
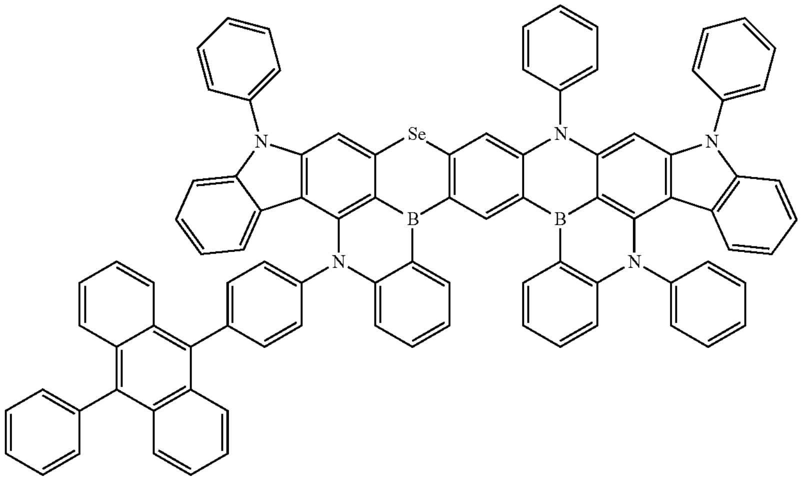
79
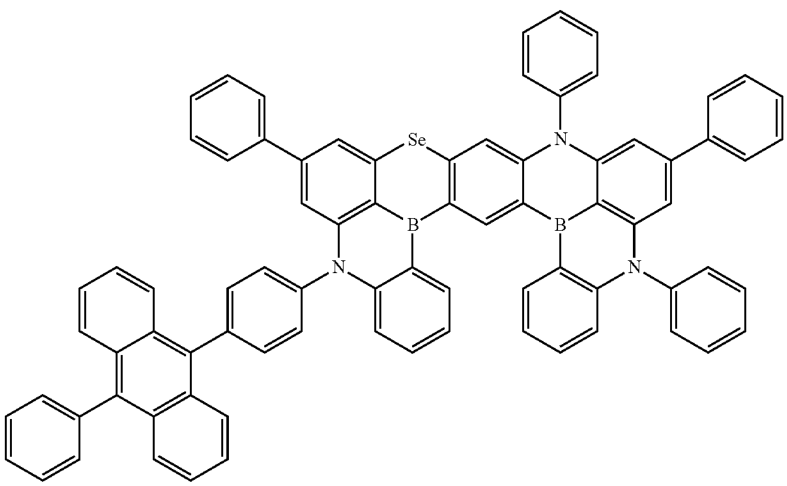
80
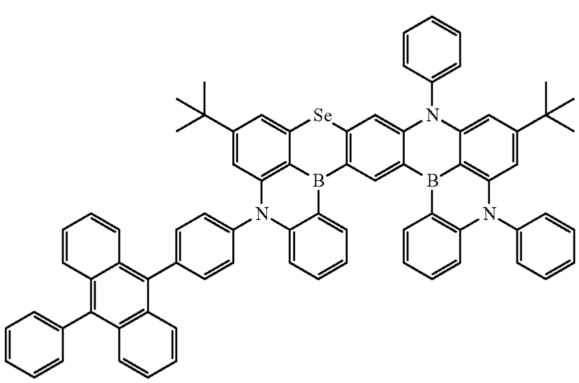
81
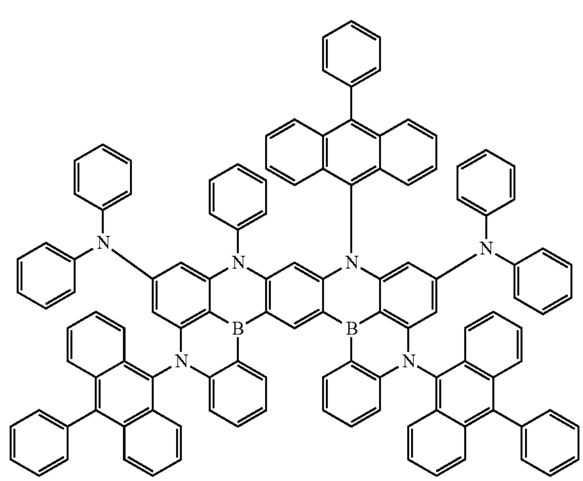

-continued
82
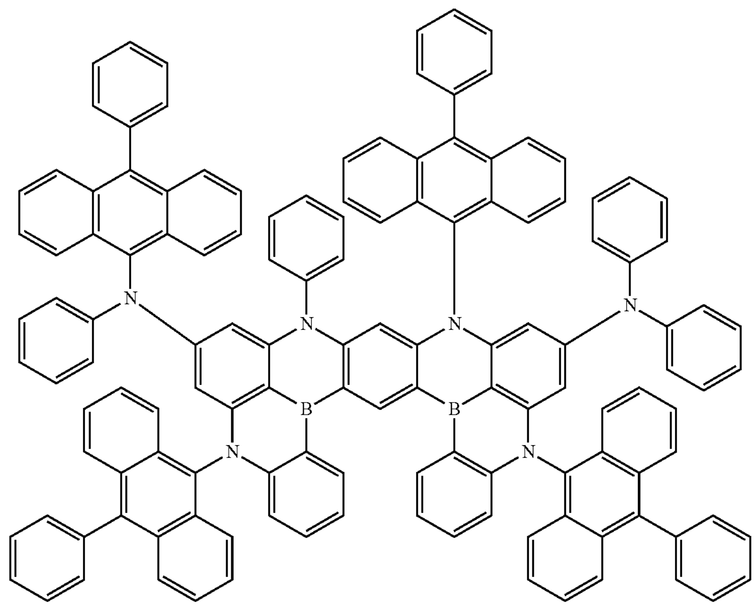
83
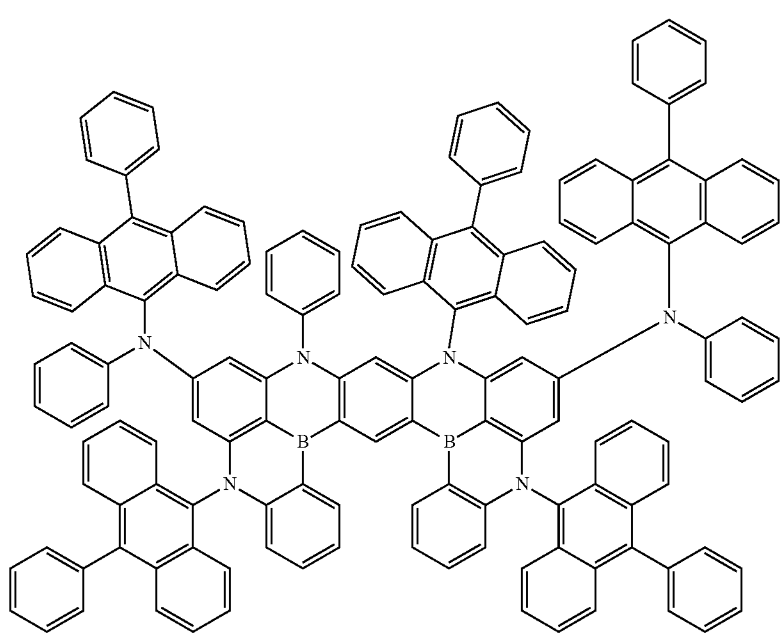

-continued
84
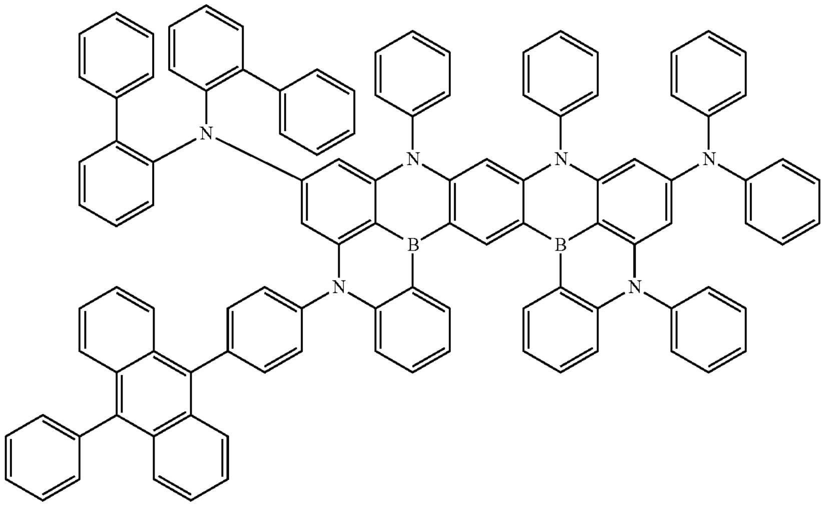
85
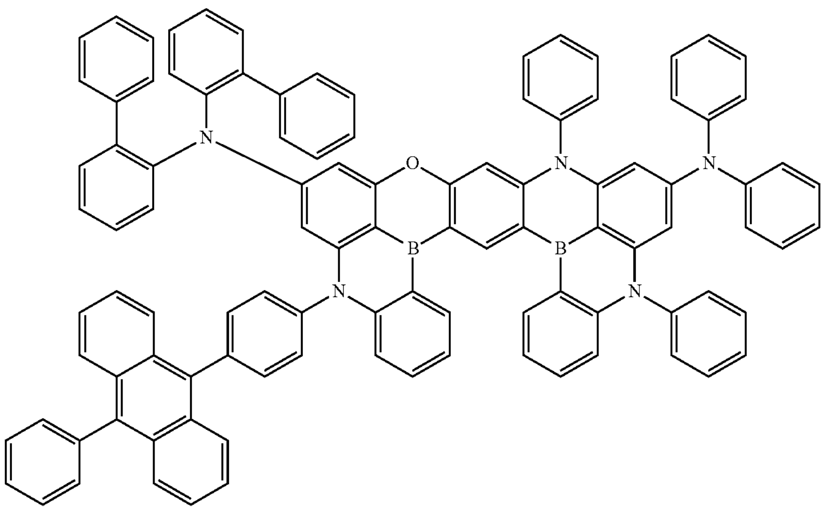
86
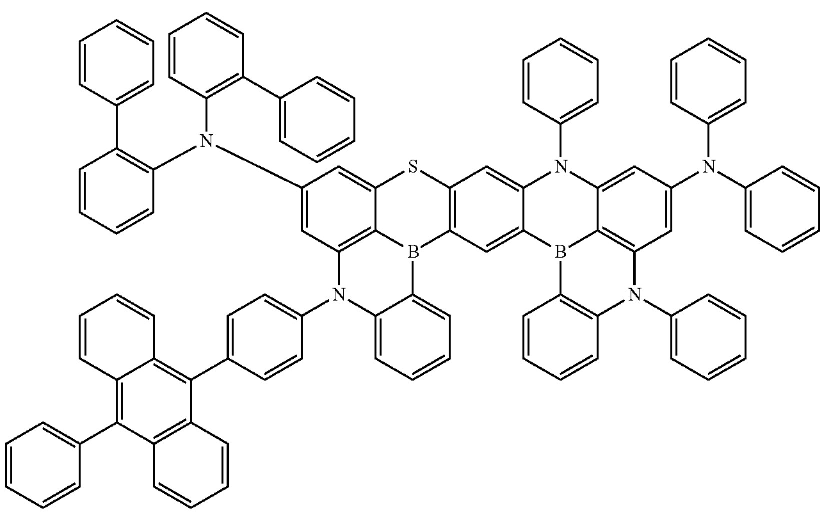

-continued
87
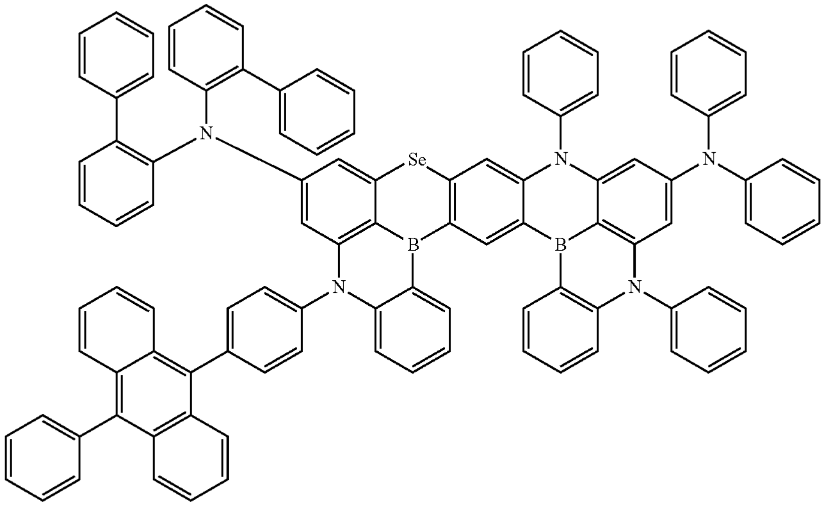
88
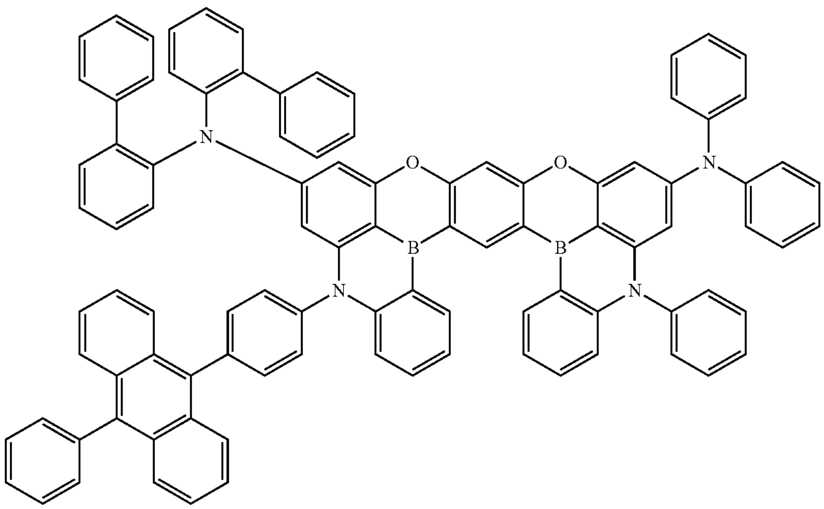
89
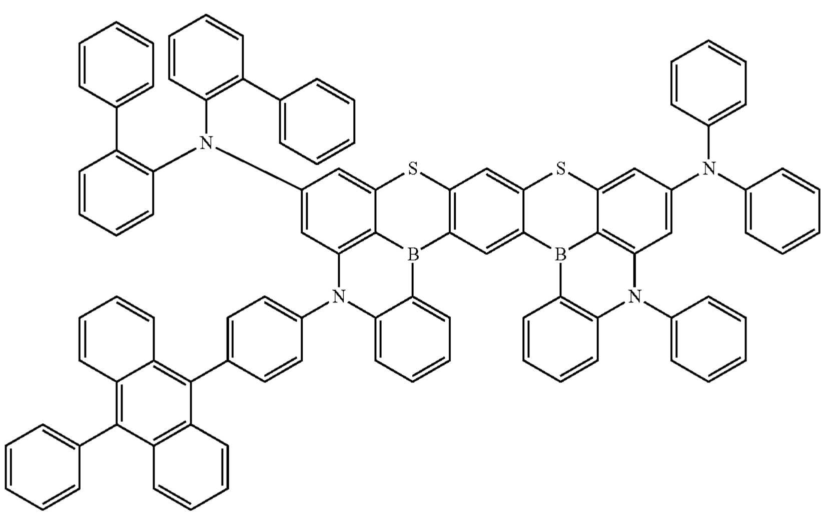

-continued
90
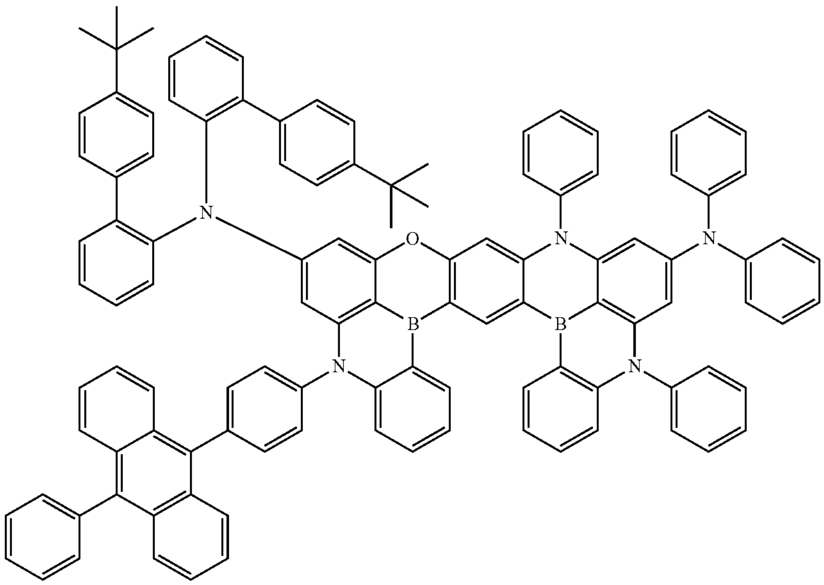
91
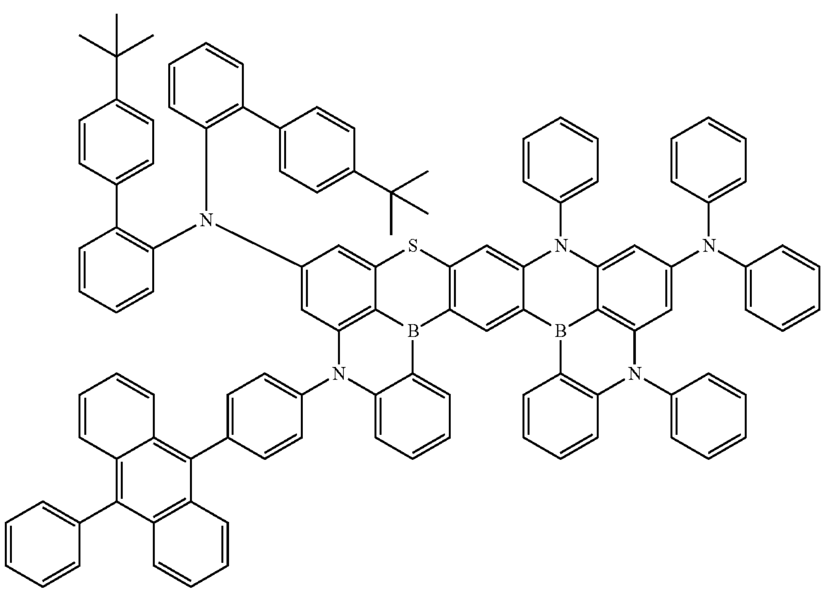

-continued
92
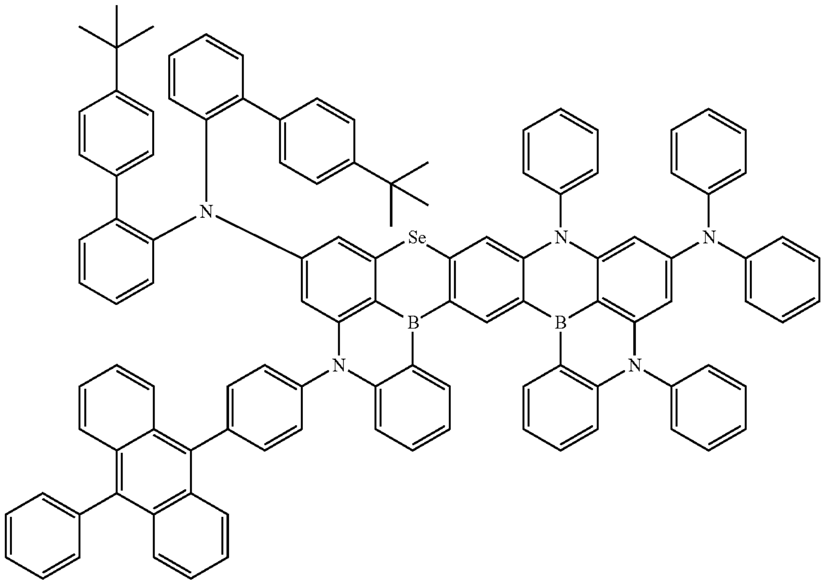
93
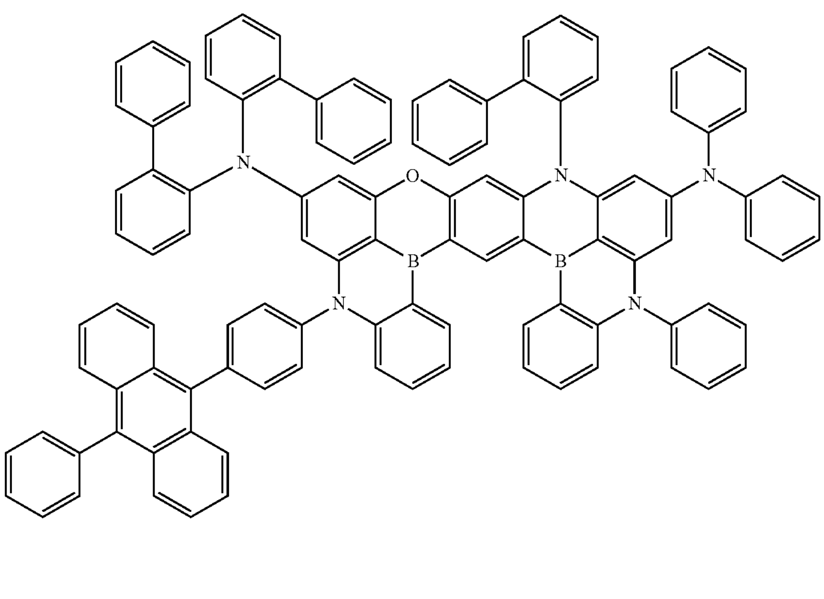

-continued
94
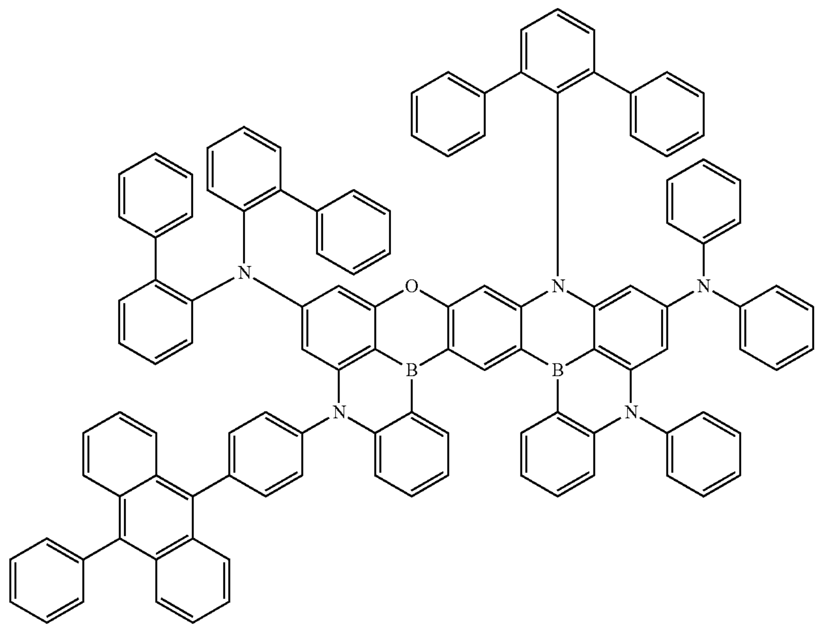
95
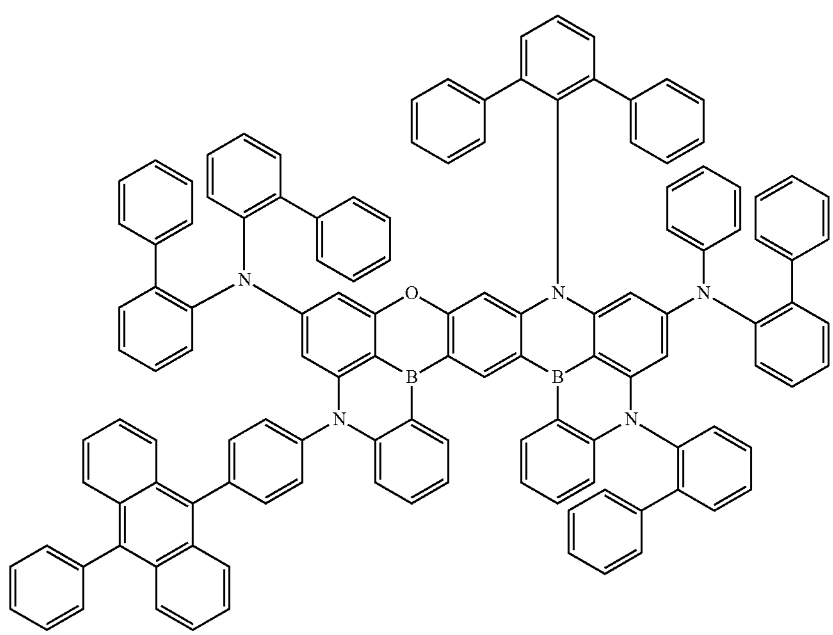

-continued
96
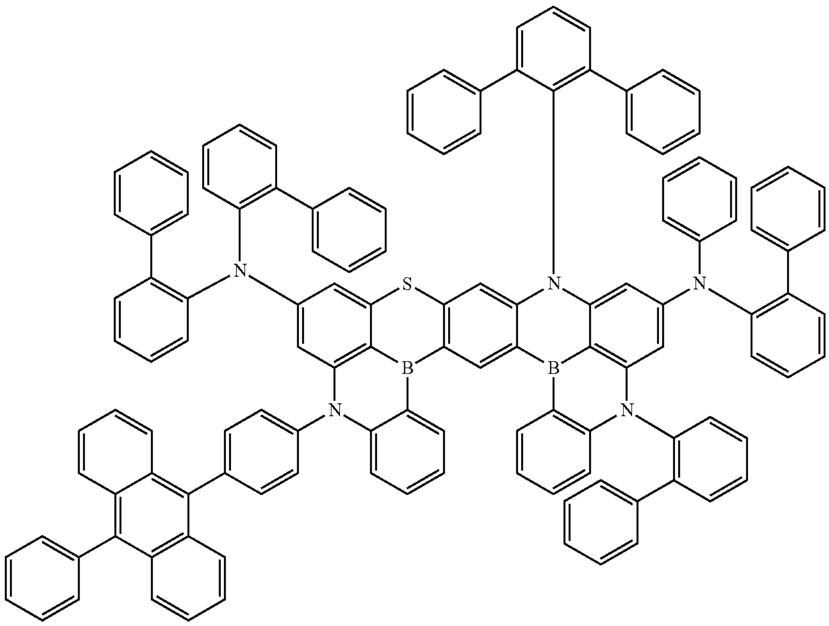
97
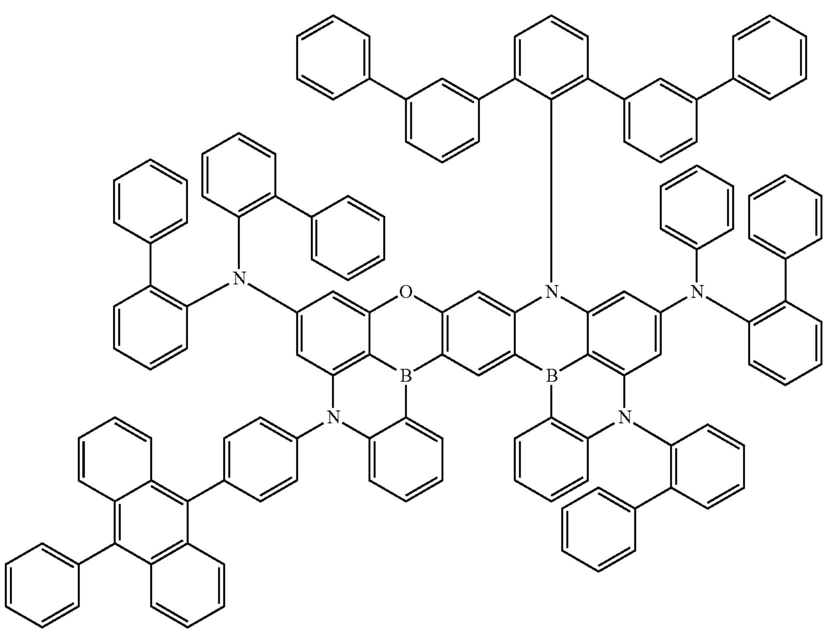

-continued
98
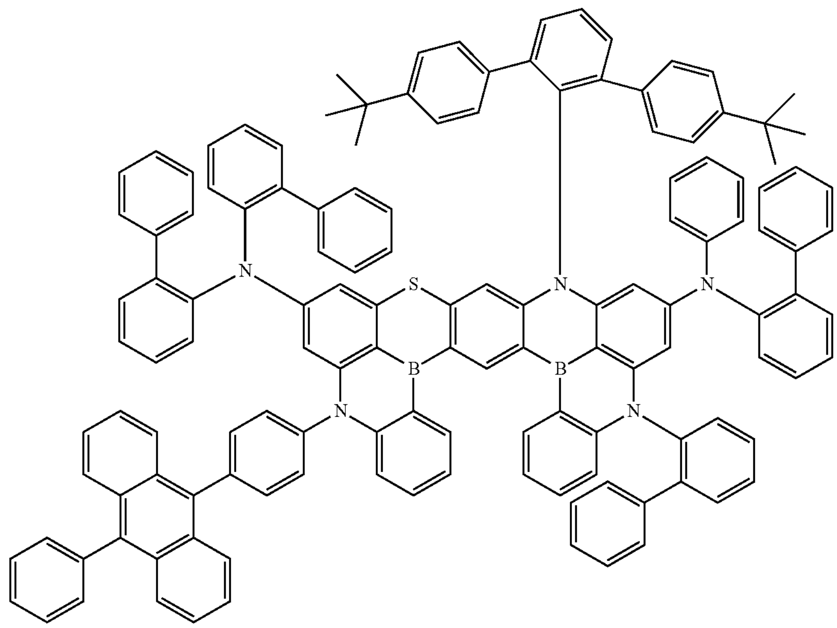
99
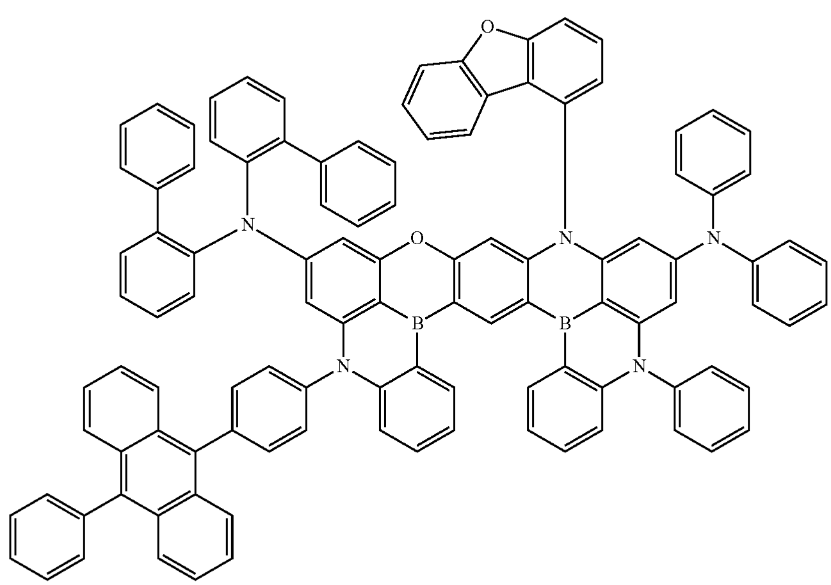

-continued
100
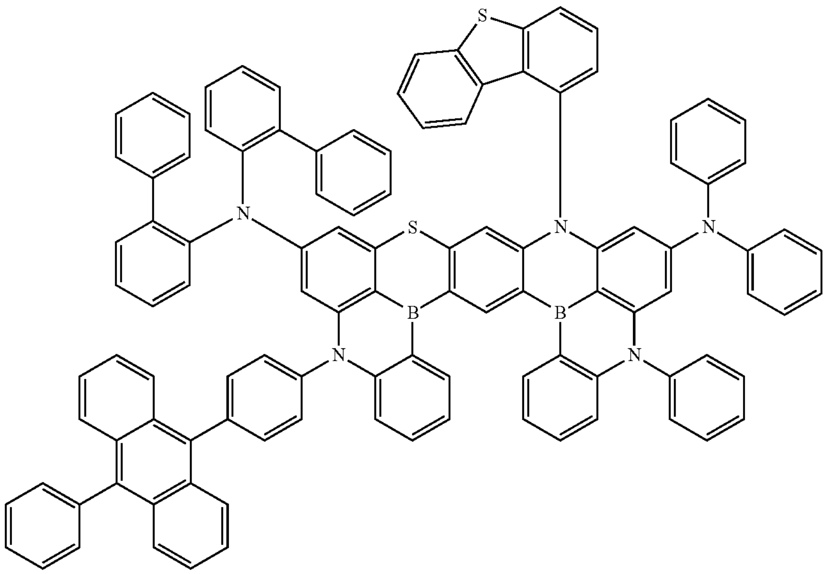
101
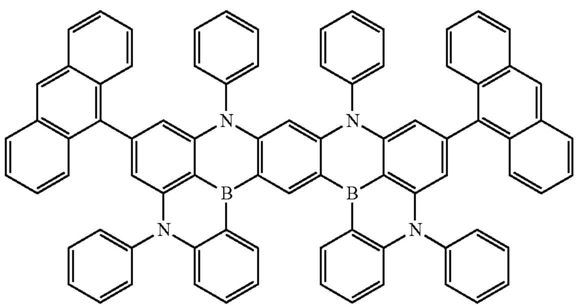
102
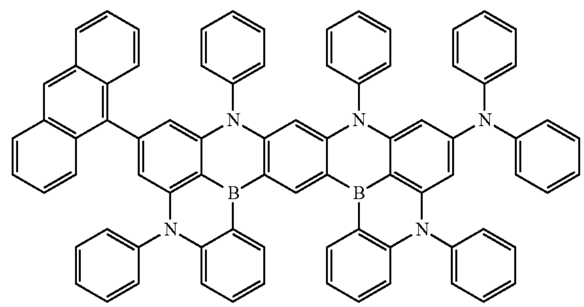
103
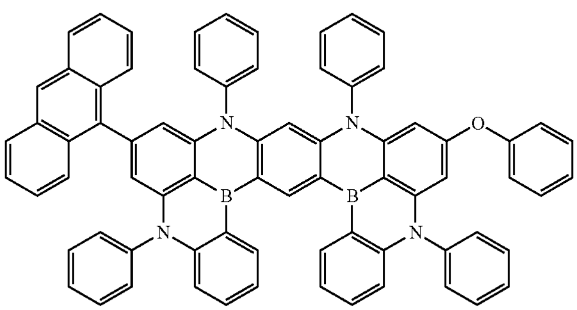
104
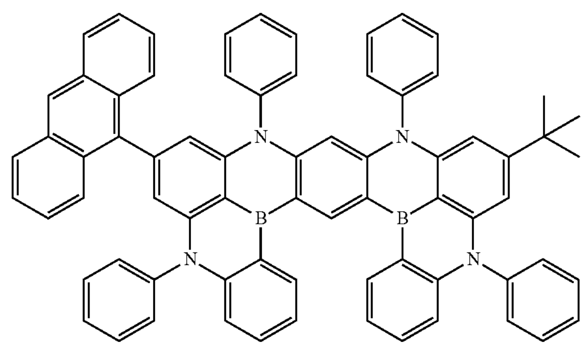
105
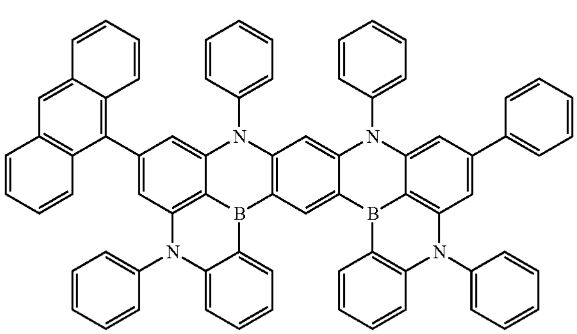
106
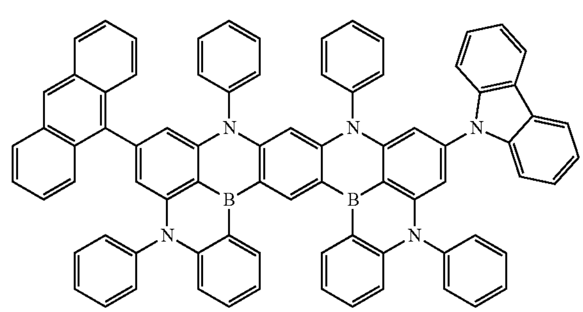

-continued
107
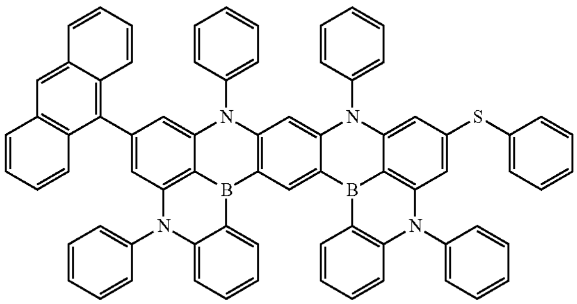
108
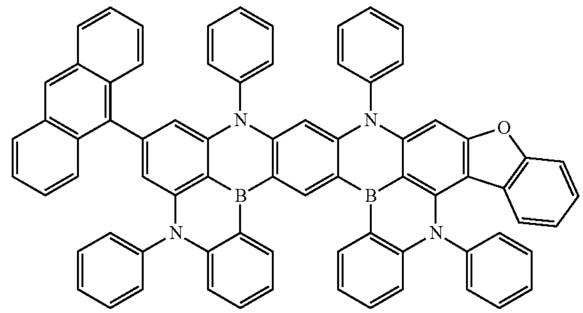
109
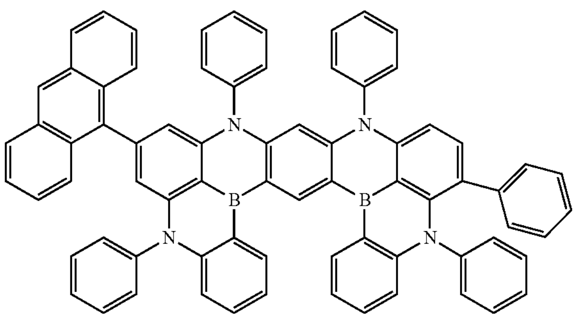
110
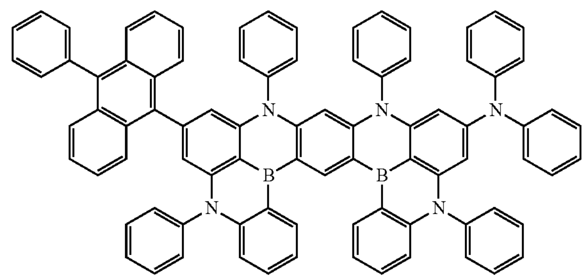
111
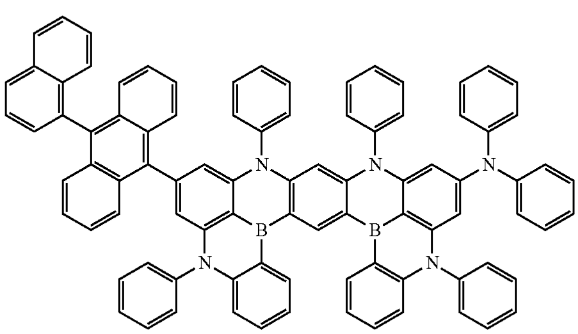
112
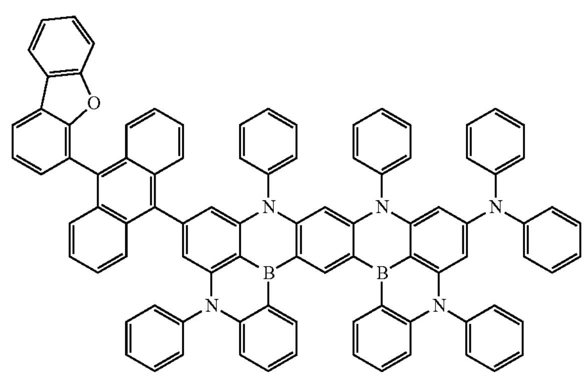
113
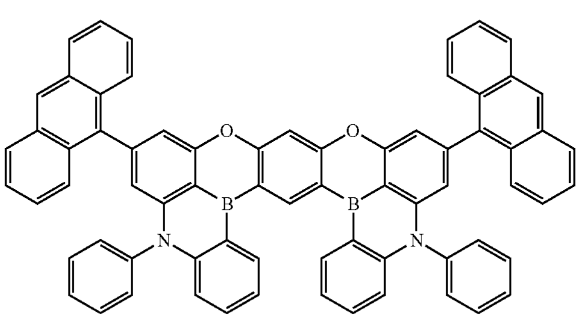
114
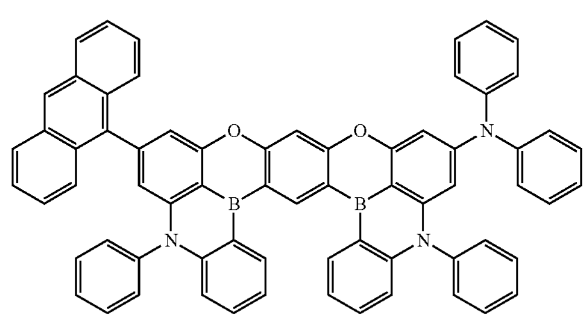

-continued
115
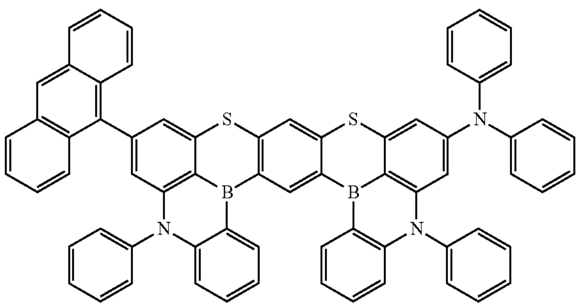
116
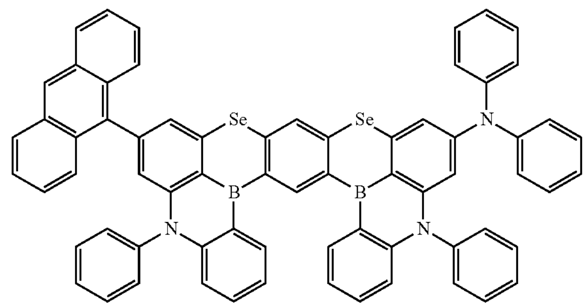
117
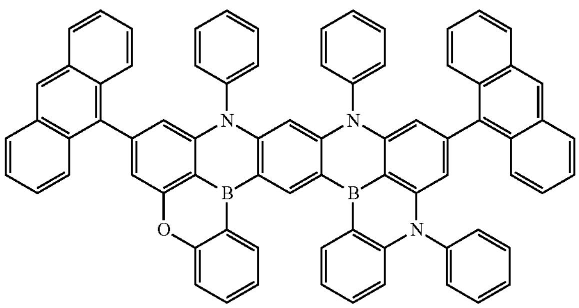
118
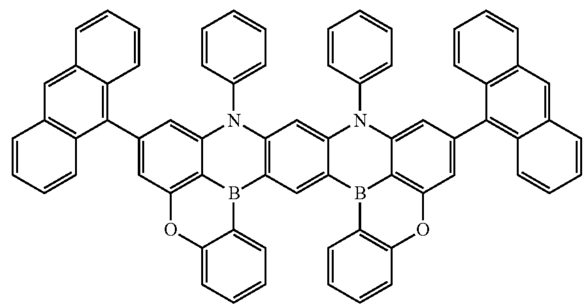
119
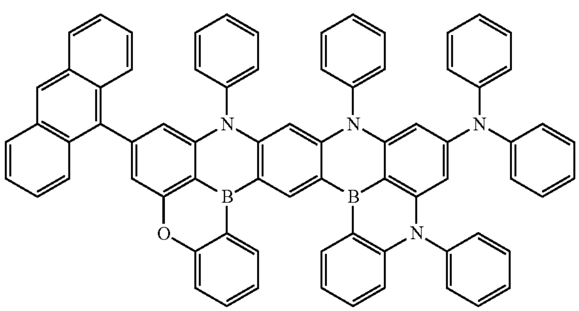
120
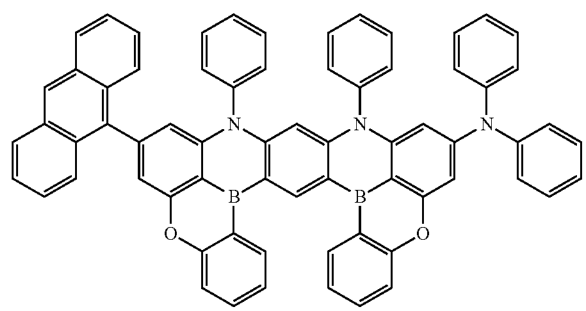
121
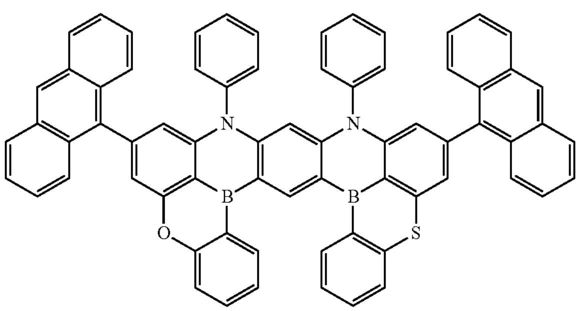
122
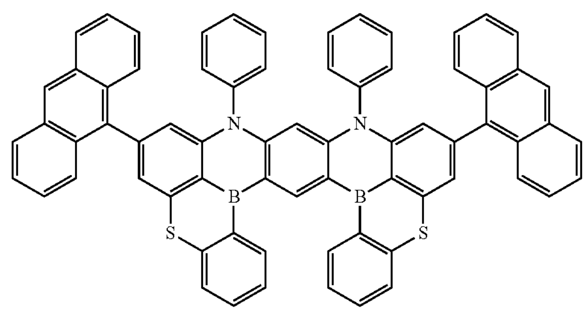
123
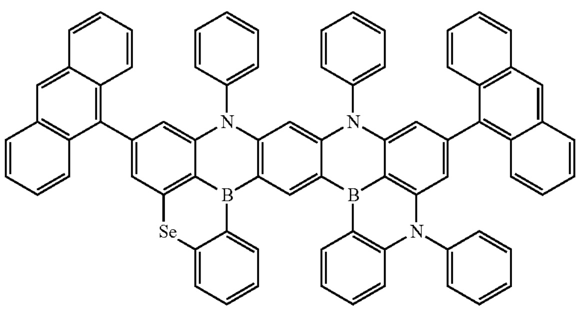
124
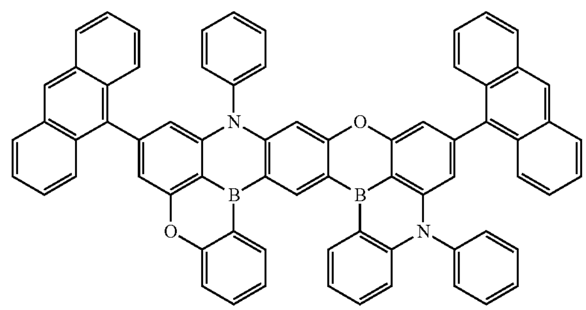

-continued
125
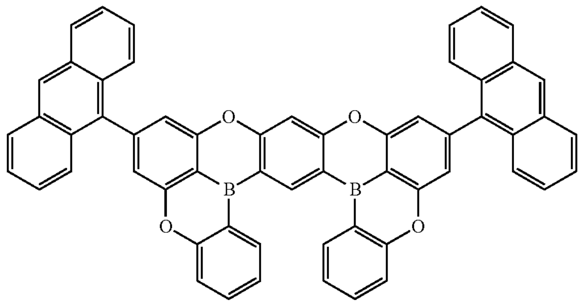
126
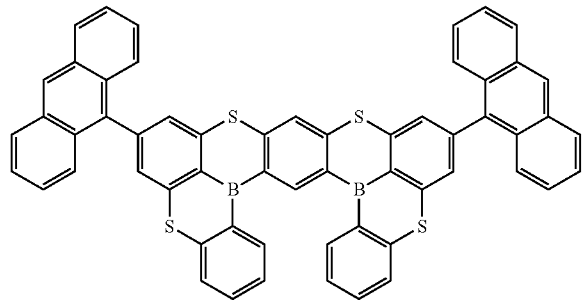
127
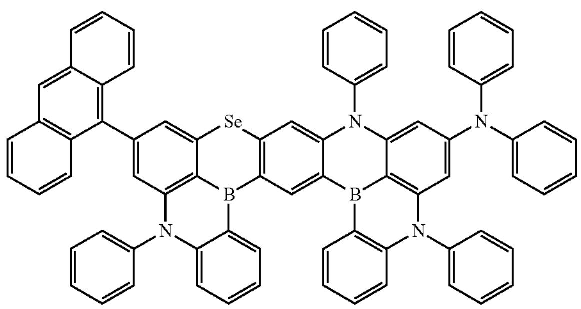
128
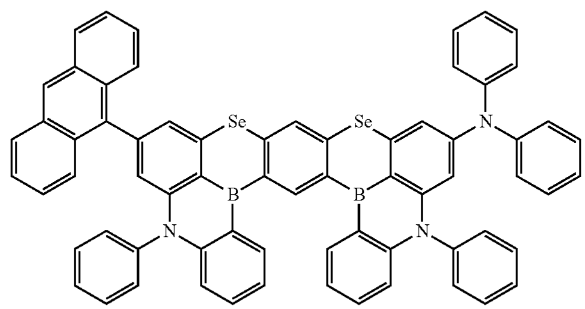
129
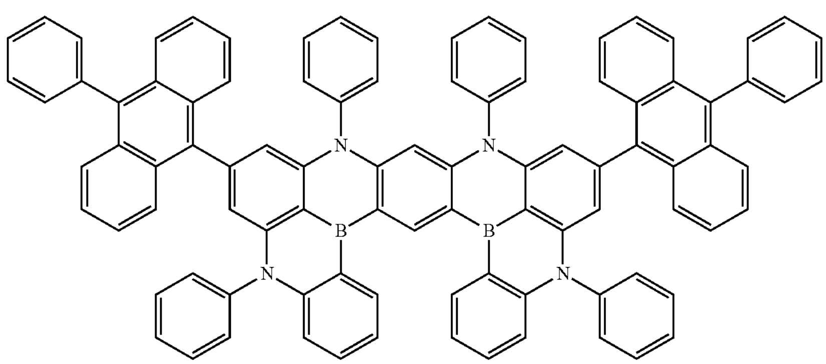
130
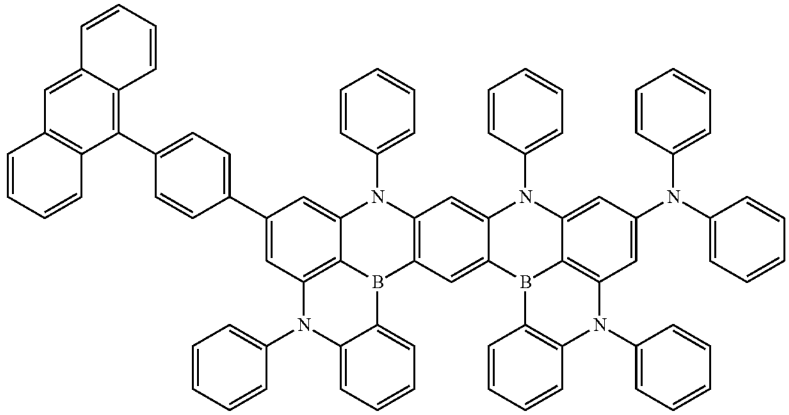

-continued
131
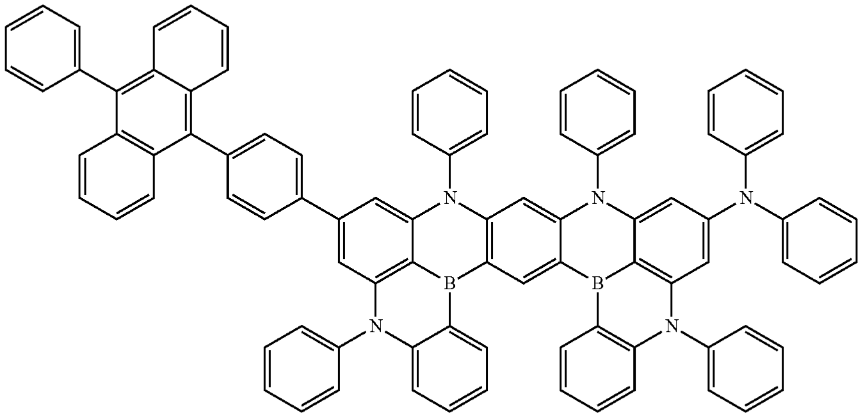
132
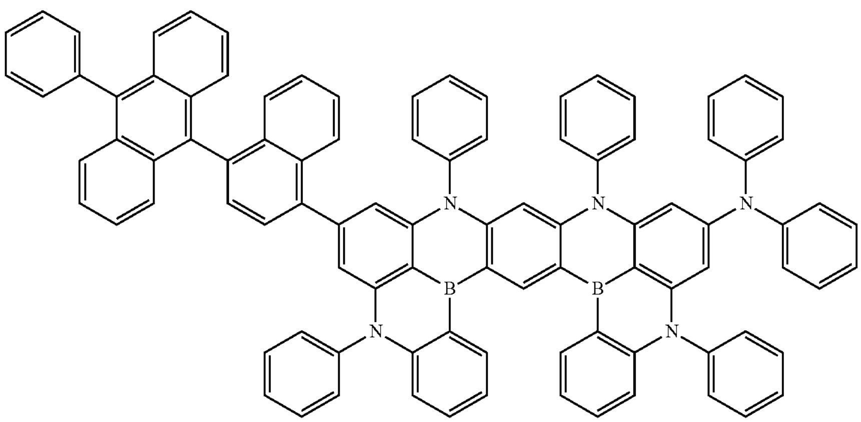
133
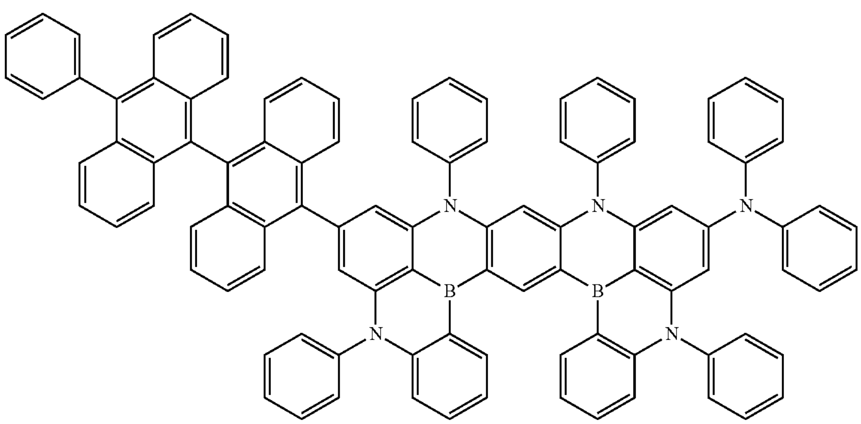
134
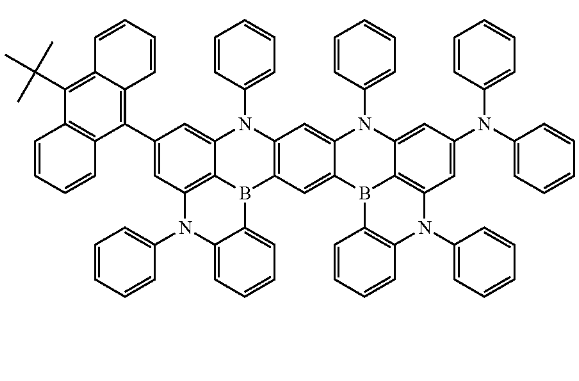
135
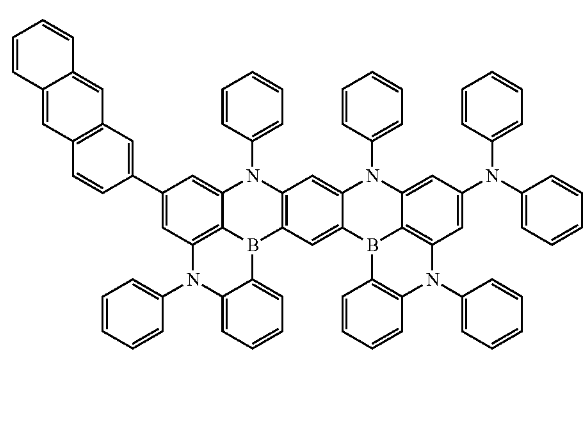

-continued
136
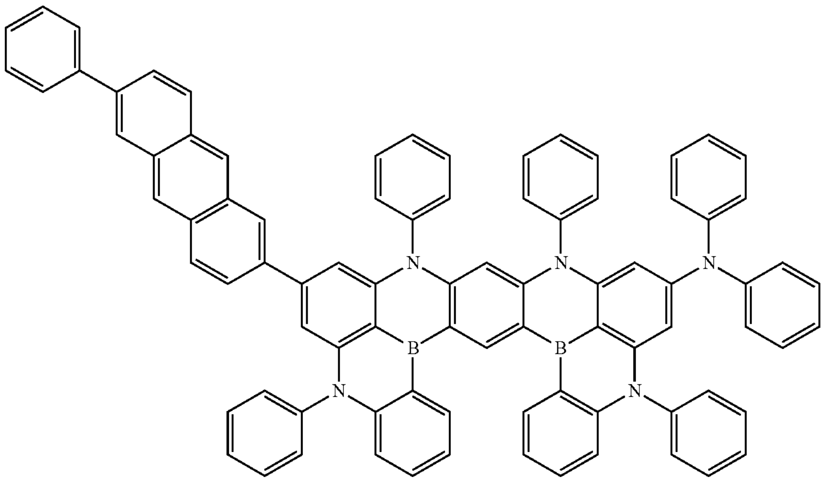
137
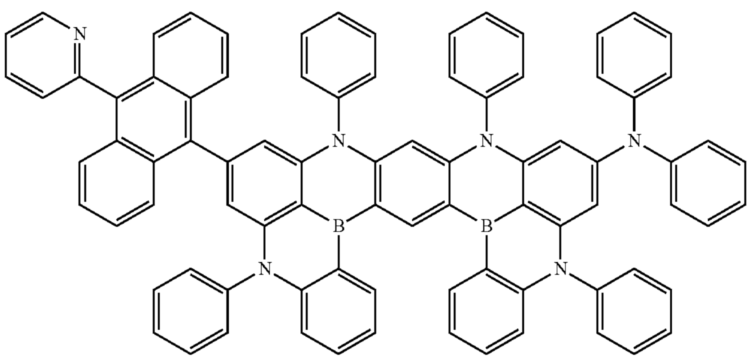
138
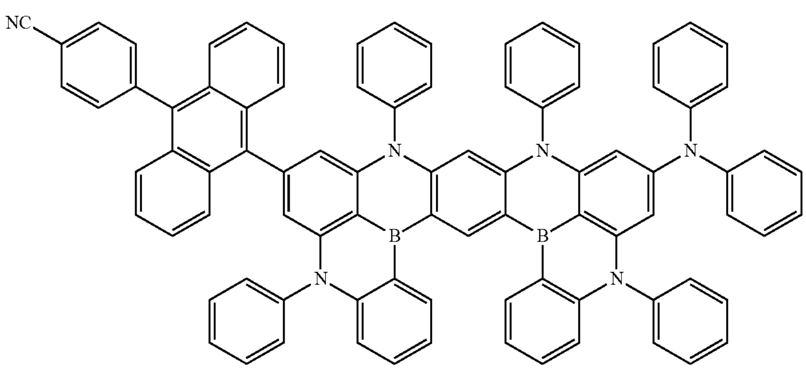
139
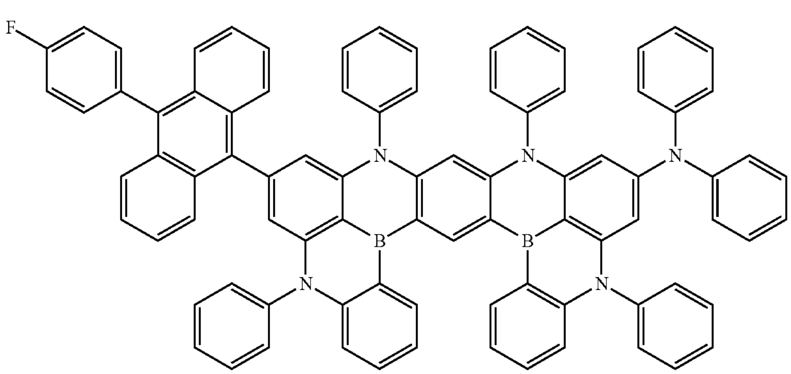

-continued

140

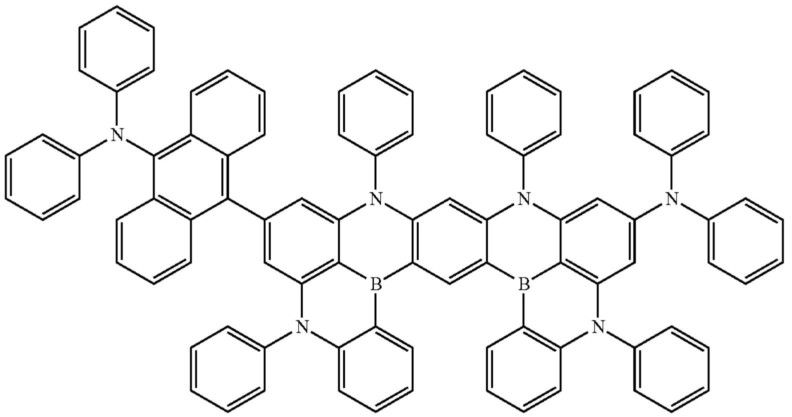

In an embodiment of the present disclosure, a light emitting device includes: a first electrode; a second electrode on the first electrode; and an emission layer between the first electrode and the second electrode and including a polycyclic compound represented by Formula 2, wherein the first electrode and the second electrode each independently include at least one selected from among Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, or an oxide thereof.

Formula 2

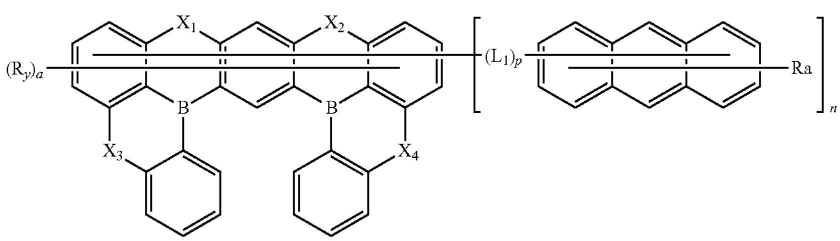

In Formula 2, $X_1$ to $X_4$ are each independently O, S, Se, or $NR_1$, $R_1$ is

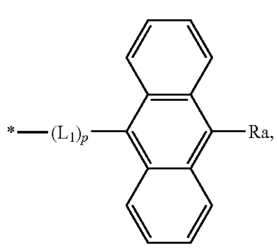

a hydrogen atom, a deuterium atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and n is an integer of 0 to 8, and when $R_1$ is

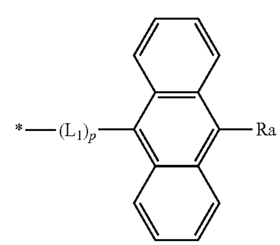

not in $NR_1$, n is an integer of 1 to 8, and when n is 0, at least one selected from among $X_1$ to $X_4$ is $NR_1$ in which $R_1$ is

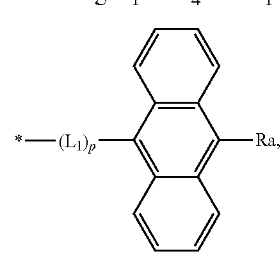

and a is an integer of 0 to 8-n, p is 0 or 1, $L_1$ is a substituted or unsubstituted arylene group having 6 to 30 ring-forming carbon atoms, a substituted or unsubstituted heteroarylene group having 2 to 30 ring-forming carbon atoms, or a substituted or unsubstituted divalent amine group, and $R_y$ and $R_a$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkenyl group having 2 to 20 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring.

In an embodiment, the moiety represented by Formula 2 may be represented by any one selected from among Formula 3 to Formula 5:

Formula 3

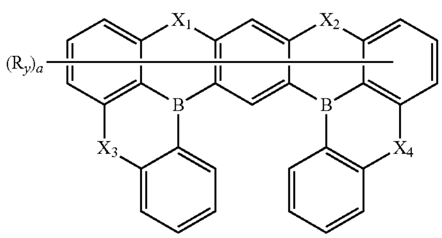

Formula 4

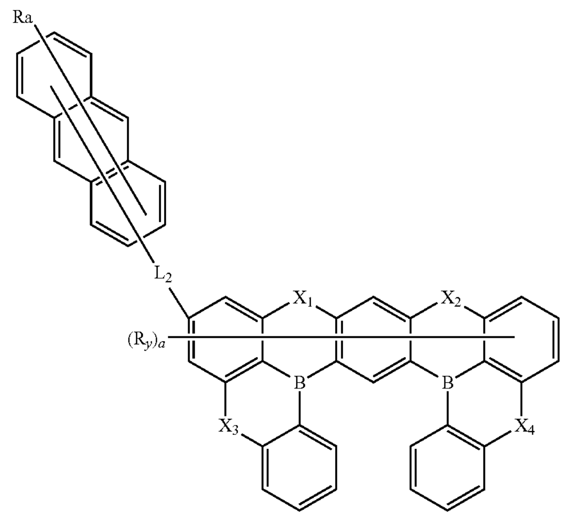

Formula 5

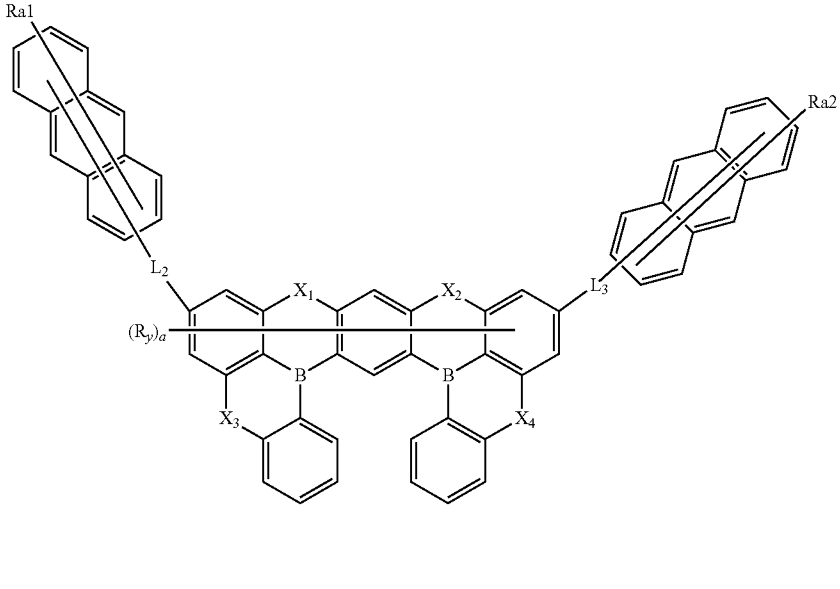

In Formula 4 and Formula 5, $L_2$ and $L_3$ may be each independently a substituted or unsubstituted arylene group having 6 to 30 ring-forming carbon atoms, a substituted or unsubstituted heteroarylene group having 2 to 30 ring-forming carbon atoms, or a substituted or unsubstituted divalent amine group, in formula 5 Ra1 and Ra2 may be each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, in Formulae 3 to 5, a, $R_y$, and $X_1$ to $X_4$ are the same as defined in connection with Formula 2, and in Formula 4 Ra is the same as defined in connection with Formula 2.

In an embodiment, in Formula 2,

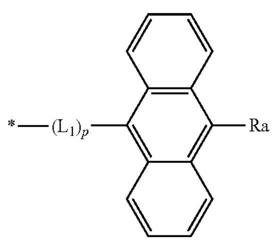

may be represented by any one selected from among Formula 6 to Formula 9:

Formula 6

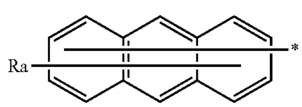

Formula 7

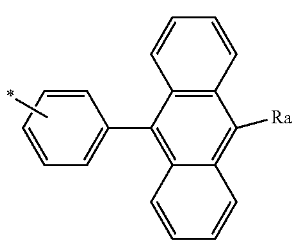

Formula 8

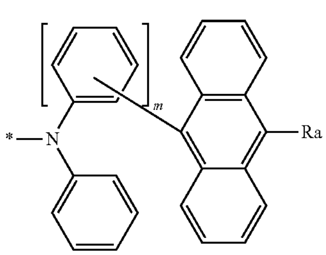

-continued

Formula 9

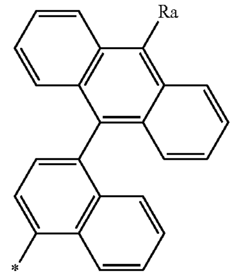

In Formula 8, m is 0 or 1, and in Formulae 6 to 9, $R_a$ is the same as defined in connection with Formula 2.

In an embodiment, the moiety represented by Formula 6 may be represented by any one of Formula 6-1 or Formula 6-2:

Formula 6-1

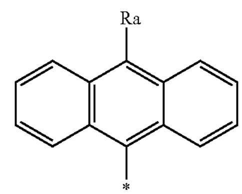

Formula 6-2

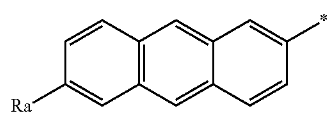

In Formula 6-1 and Formula 6-2, Ra is the same as defined in connection with Formula 1.

In an embodiment, the moiety represented by Formula 7 may be represented by any one selected from among Formula 7-1 to Formula 7-3:

Formula 7-1

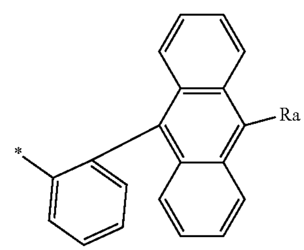

Formula 7-2

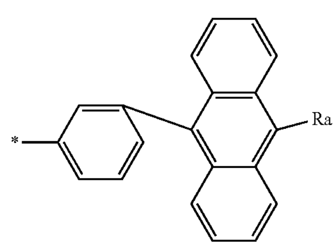

-continued

Formula 7-3

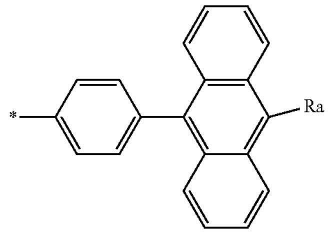

In Formula 7-1 to Formula 7-3, $R_a$ is the same as defined in connection with Formula 2.

In an embodiment, the moiety represented by Formula 8 may be represented by Formula 8-1 or Formula 8-2:

Formula 8-1

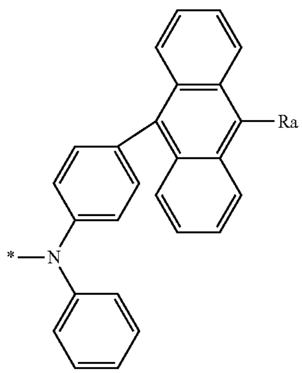

-continued

Formula 8-2

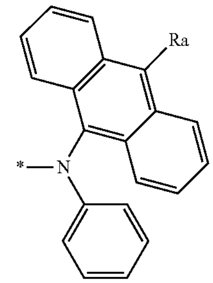

In Formula 8-1 and Formula 8-2, Ra is the same as defined in connection with Formula 2.

In an embodiment, in Formula 2, Ra may be an unsubstituted phenyl group or an unsubstituted naphthyl group.

In an embodiment, a lowest triplet excitation energy of the polycyclic compound may be about 1.8 eV or less.

In an embodiment, the emission layer may include at least one compound represented by Compound Group 1:

Compound Group 1

1

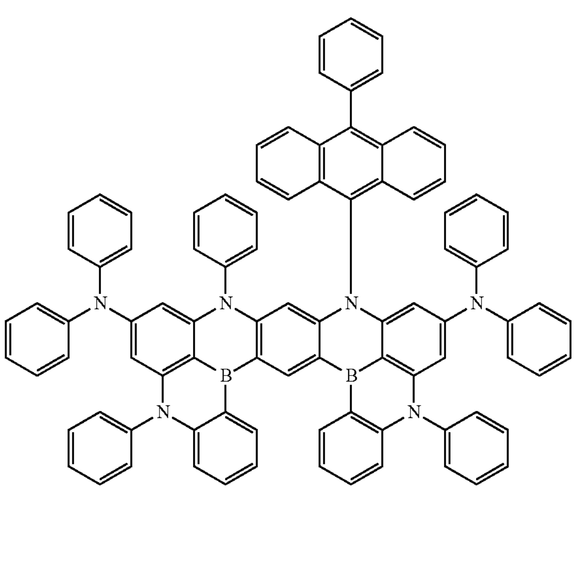

2

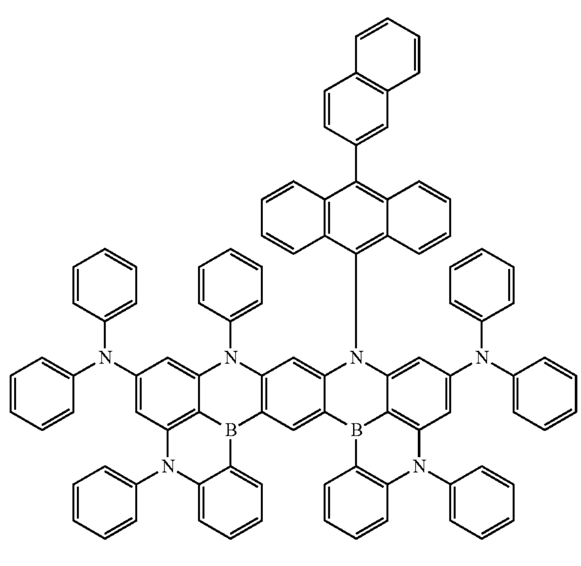

-continued
3
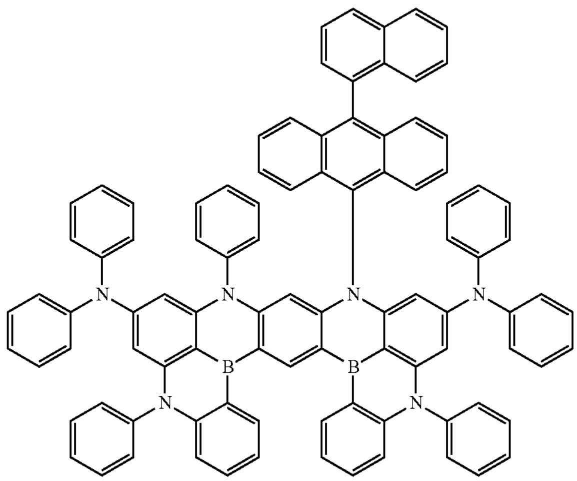
4
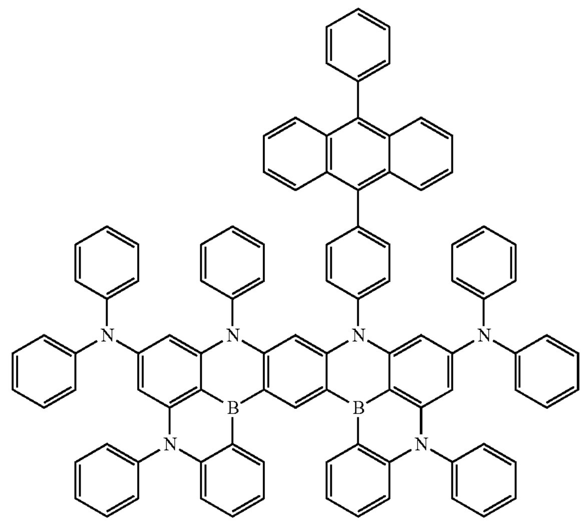
5
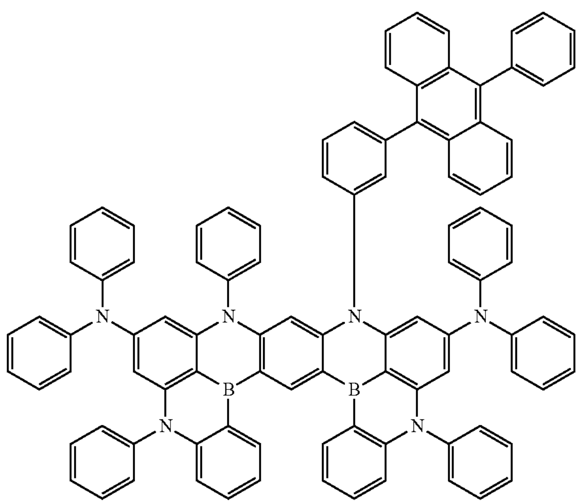
6
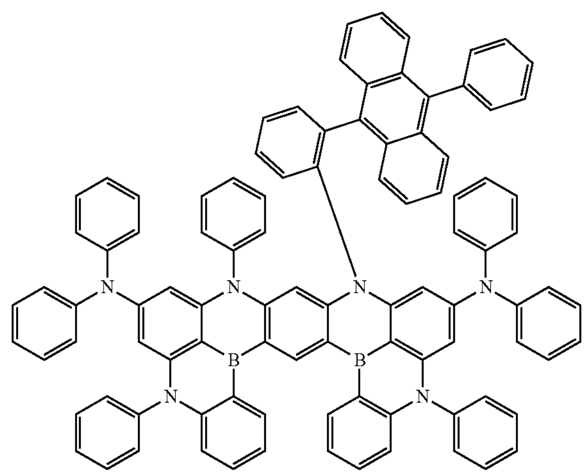
7
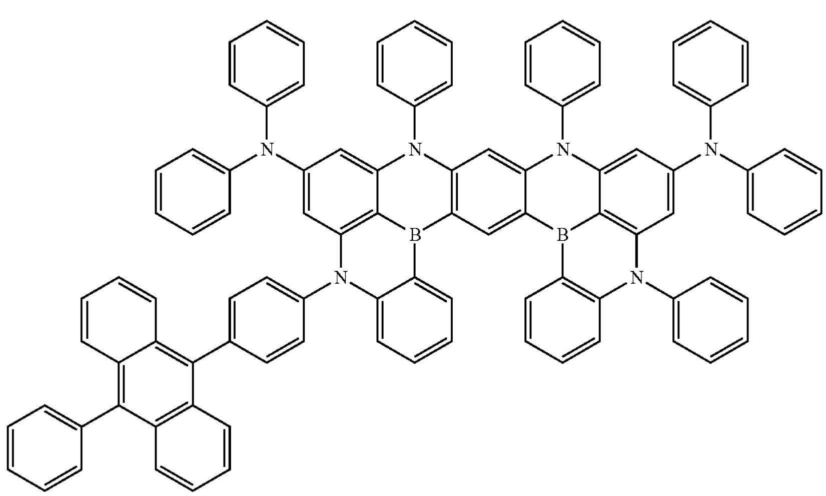

-continued
8
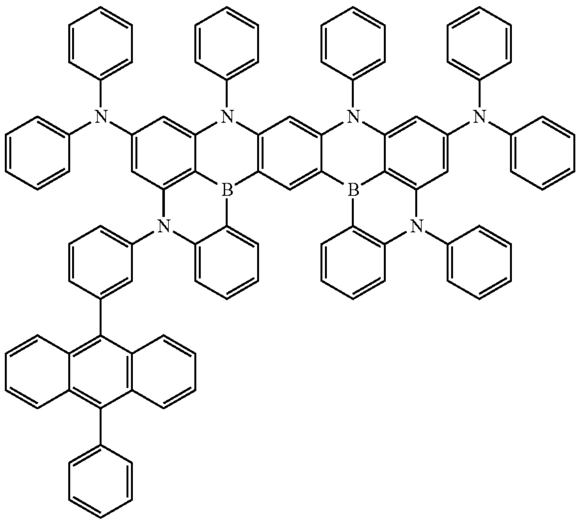
9
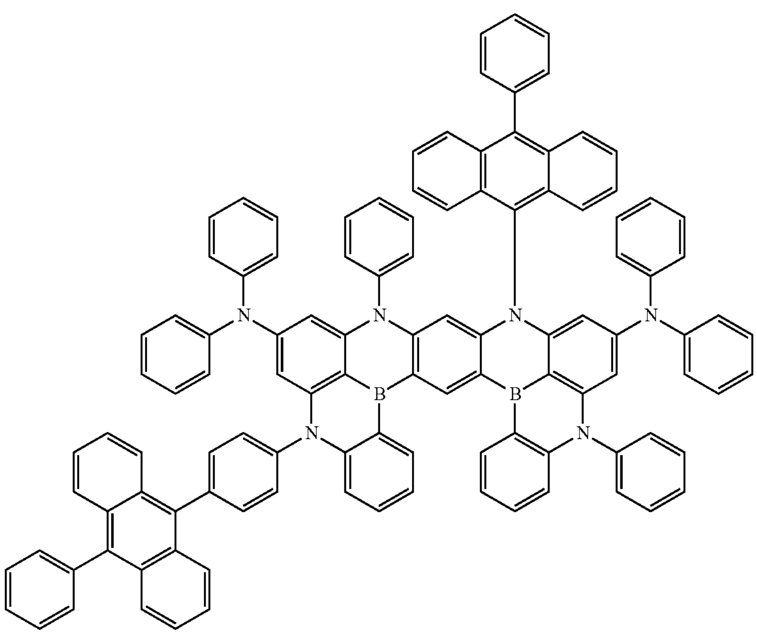

-continued
10
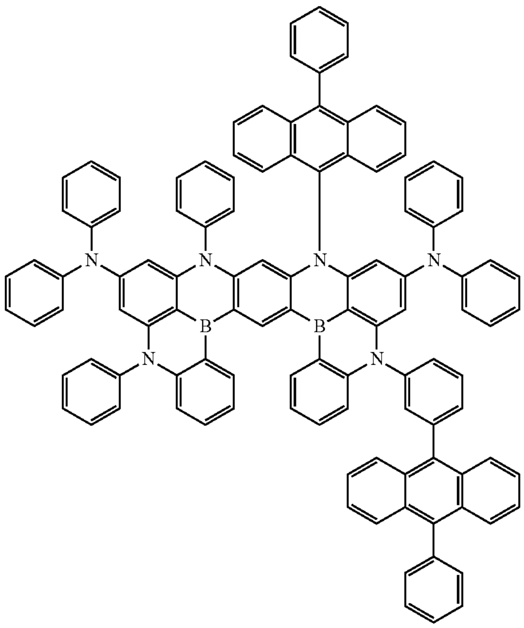
11
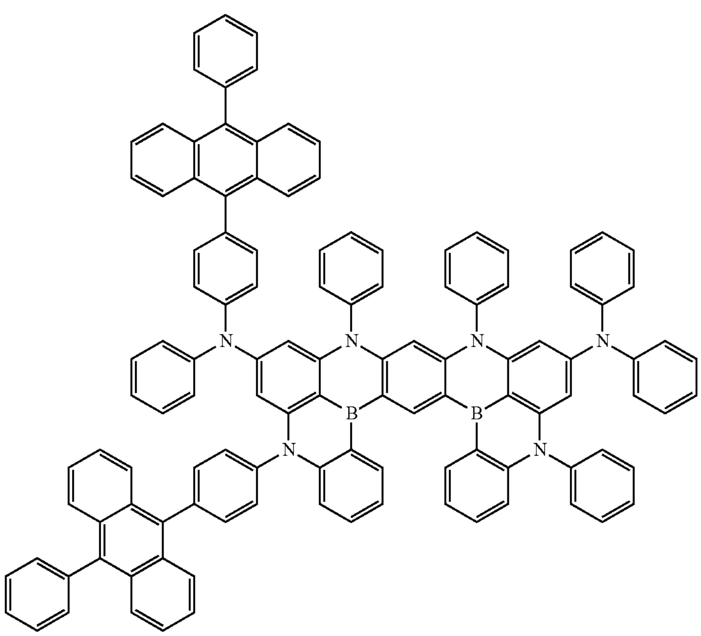

-continued
12
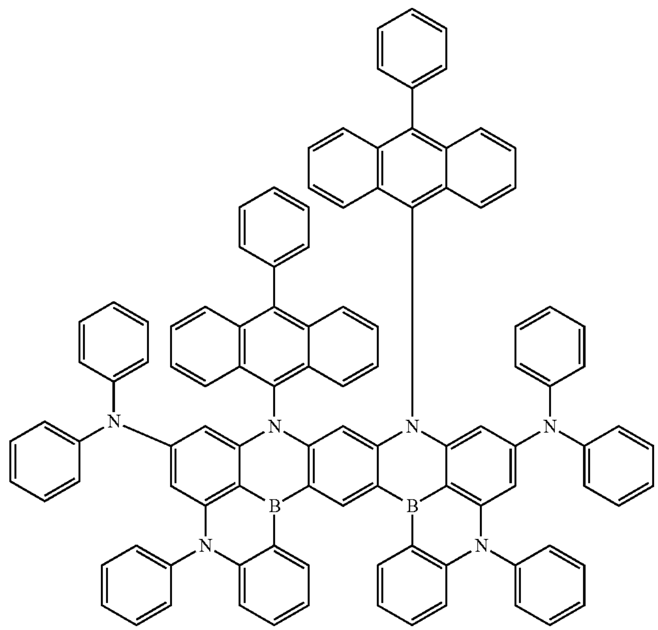
13
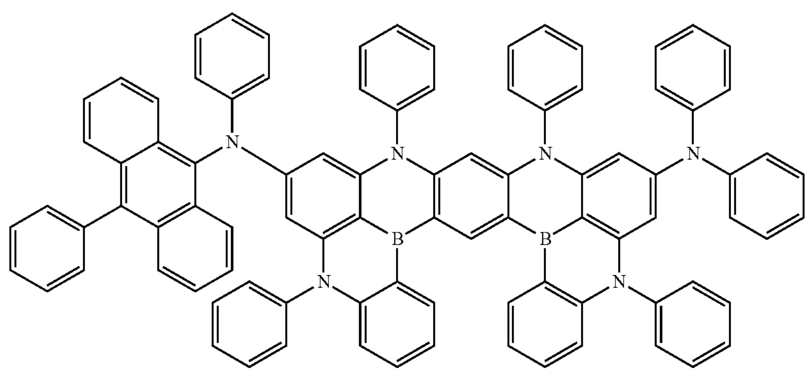
14
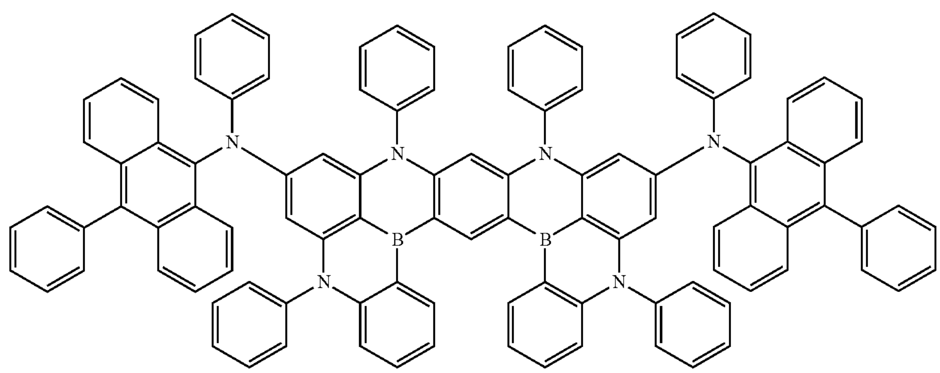

-continued
15
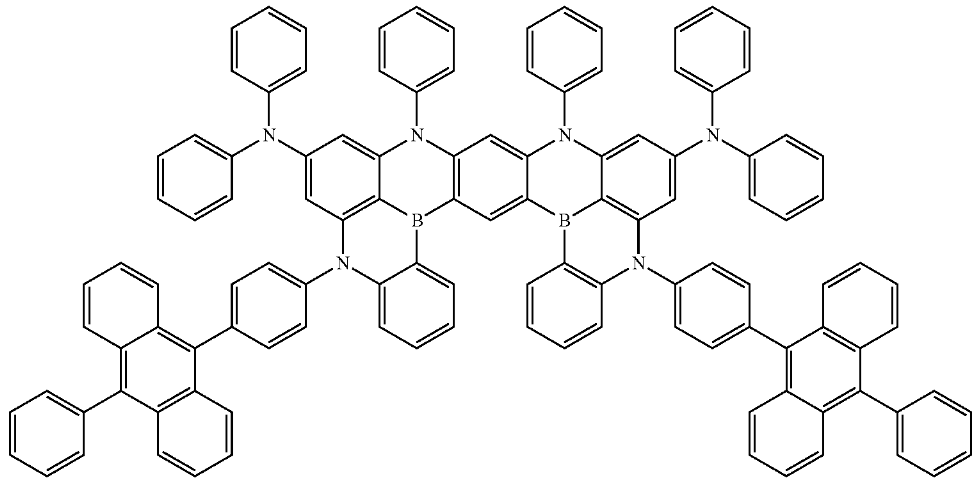
16
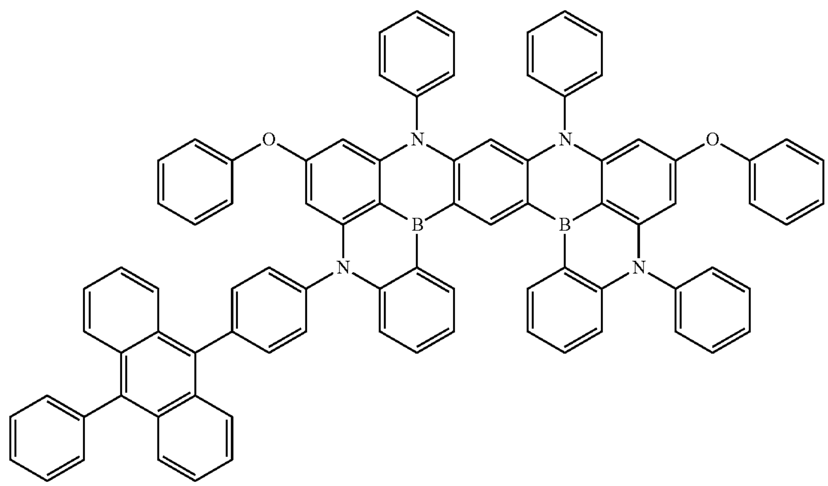
17
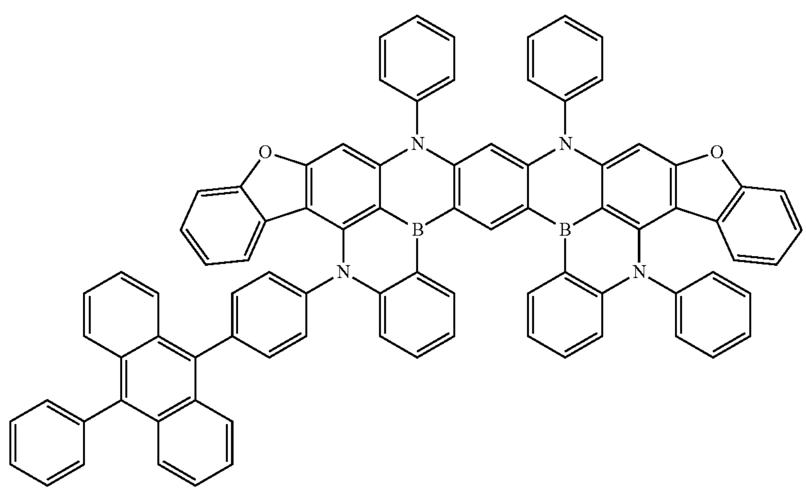

-continued
18
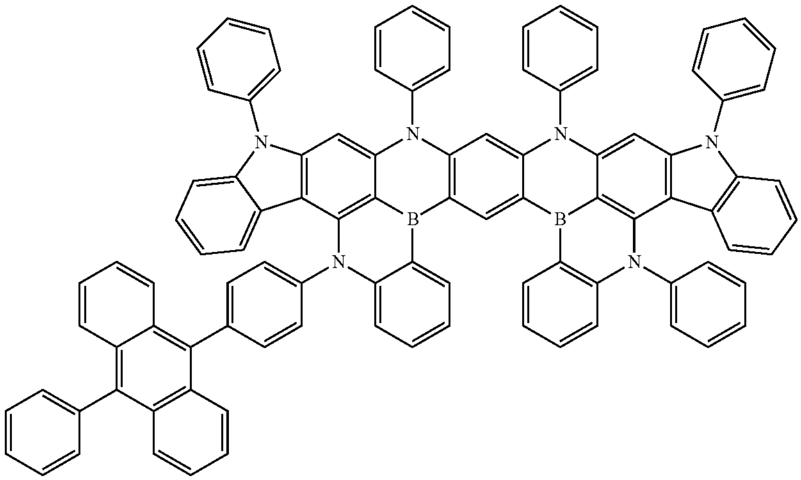
19
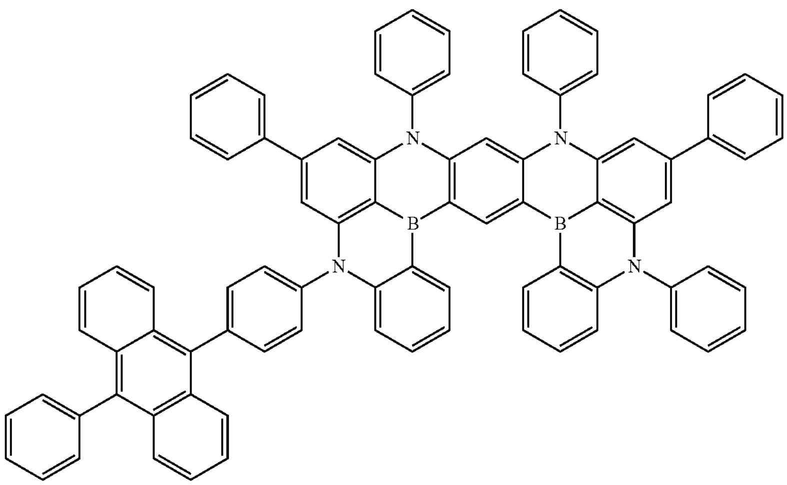
20
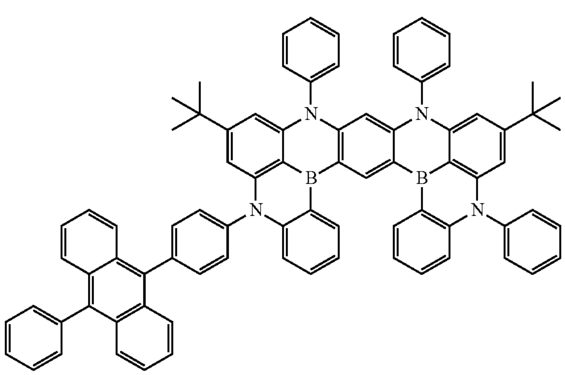
21
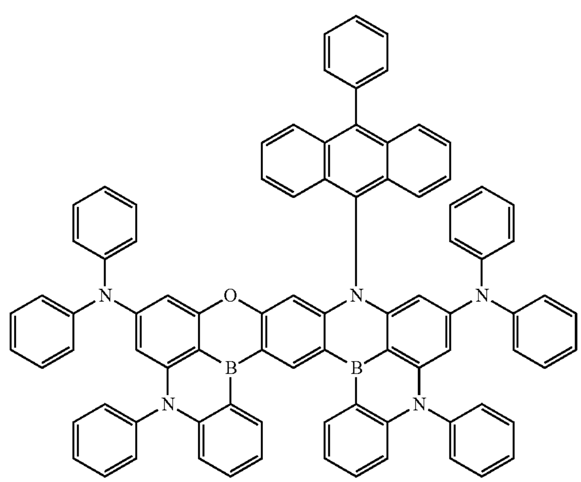

-continued
22
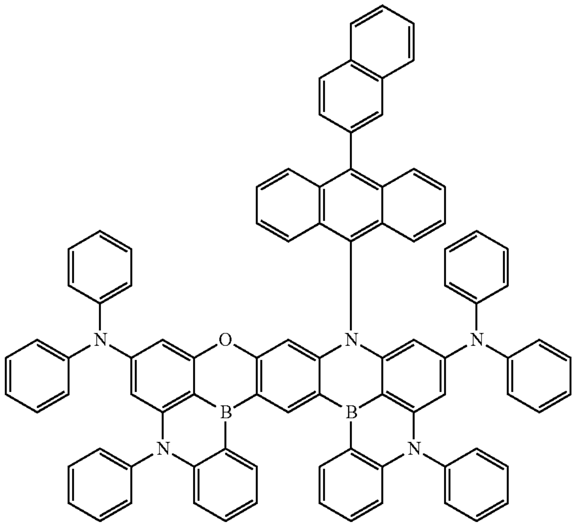
23
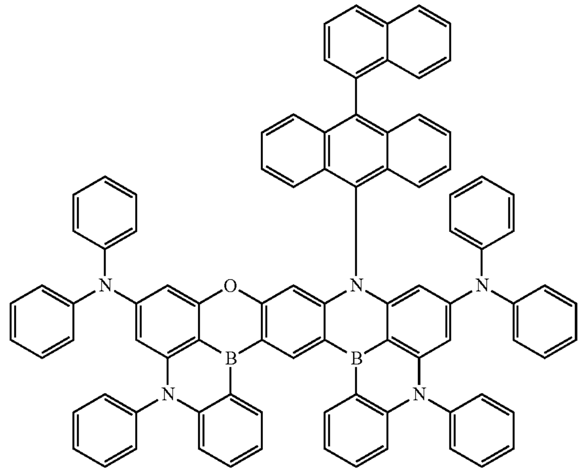
24
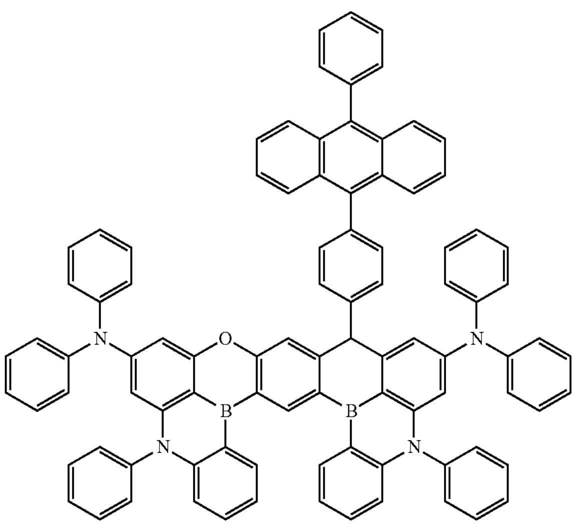
25
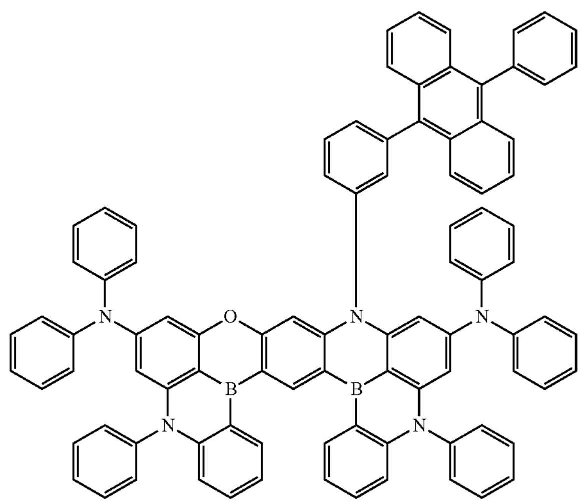
26
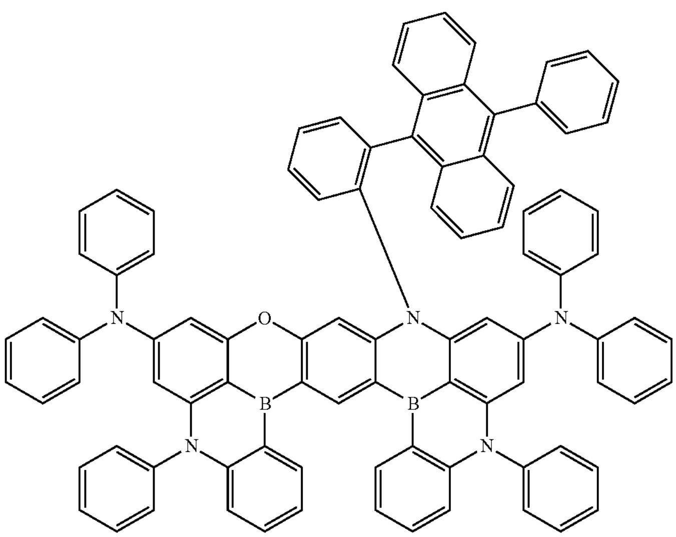

-continued
27
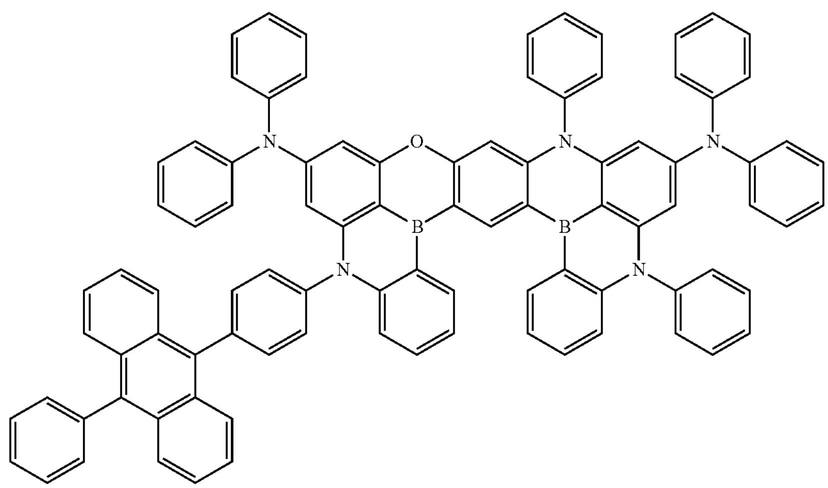
28
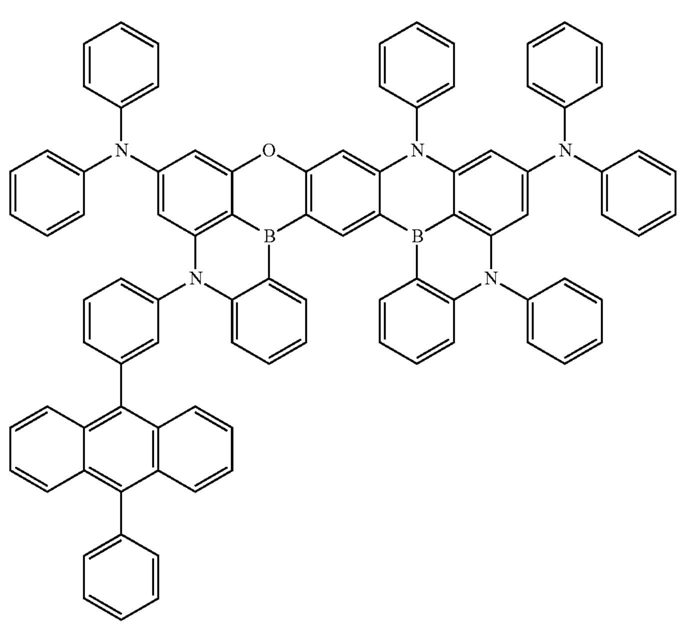

-continued
29
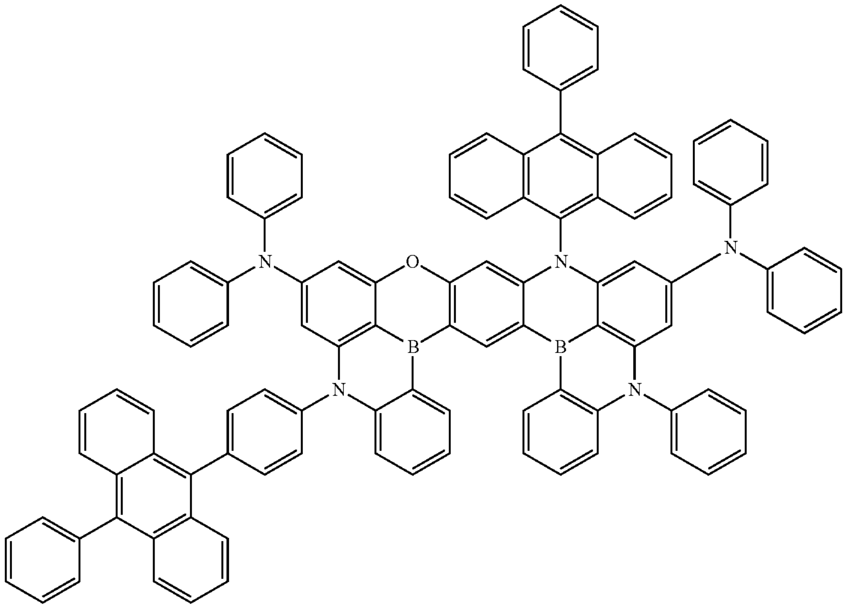
30
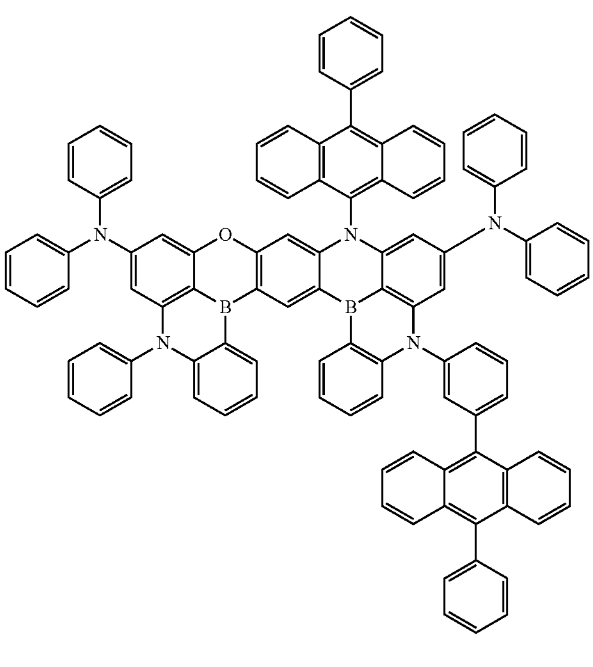

-continued
31
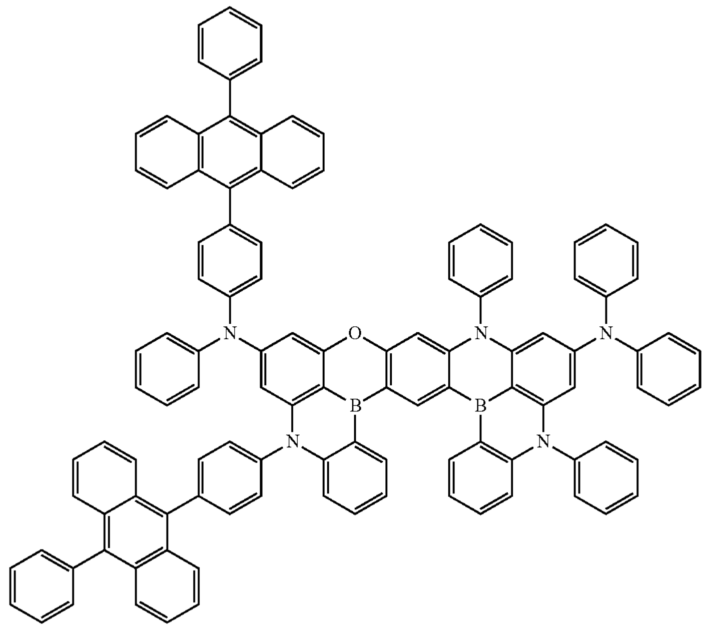
32
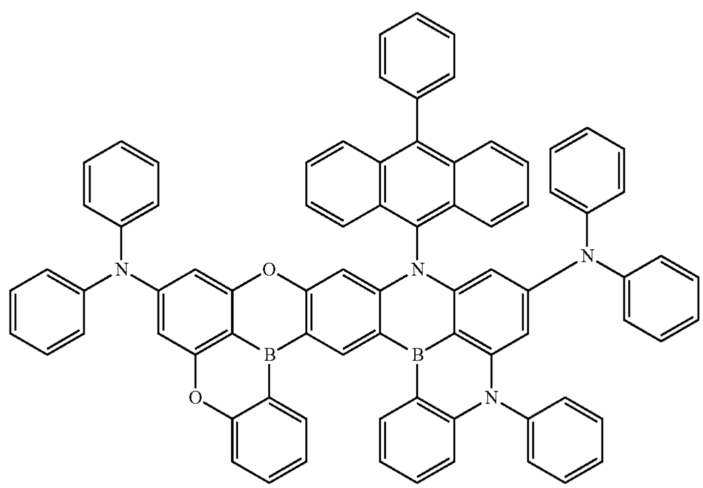
33
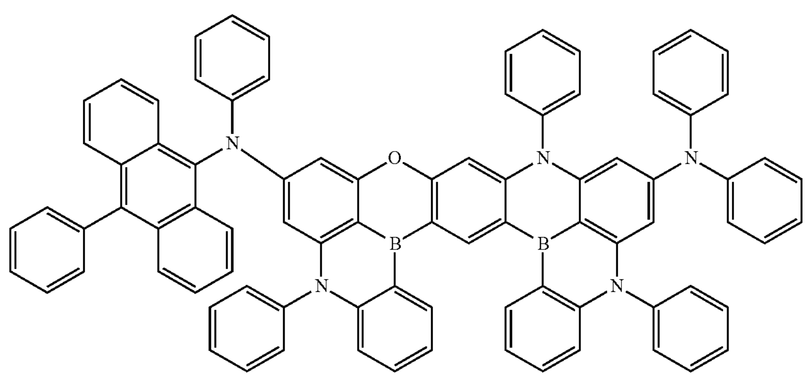

-continued
34
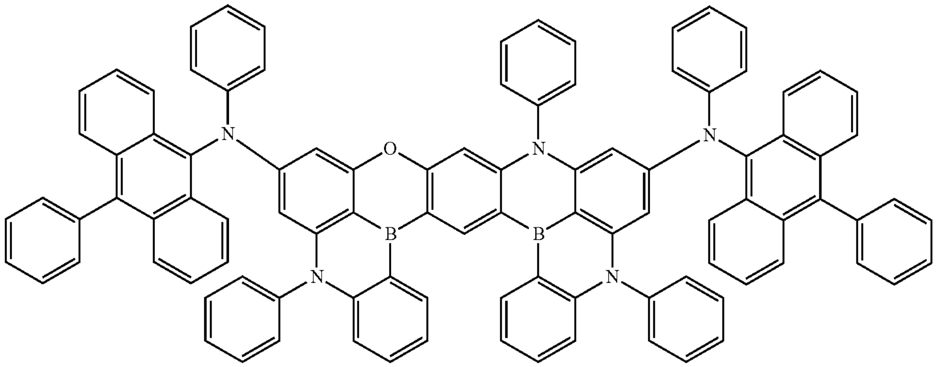
35
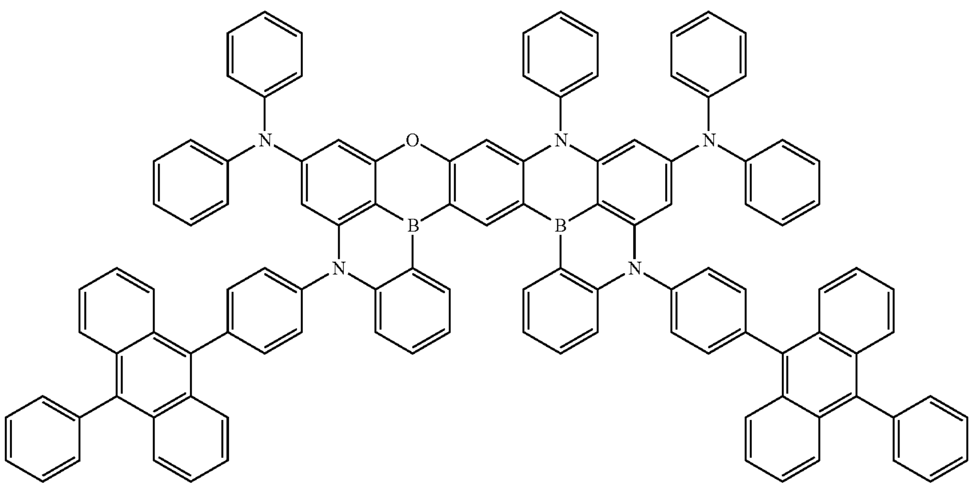
36
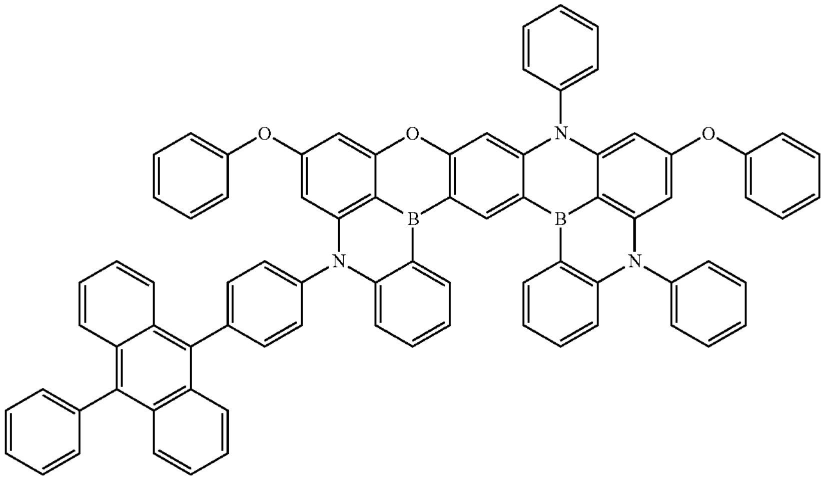

-continued
37
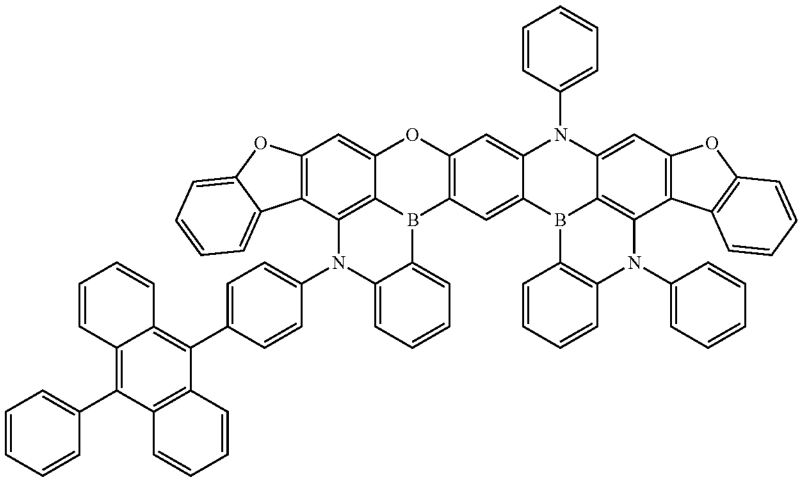
38
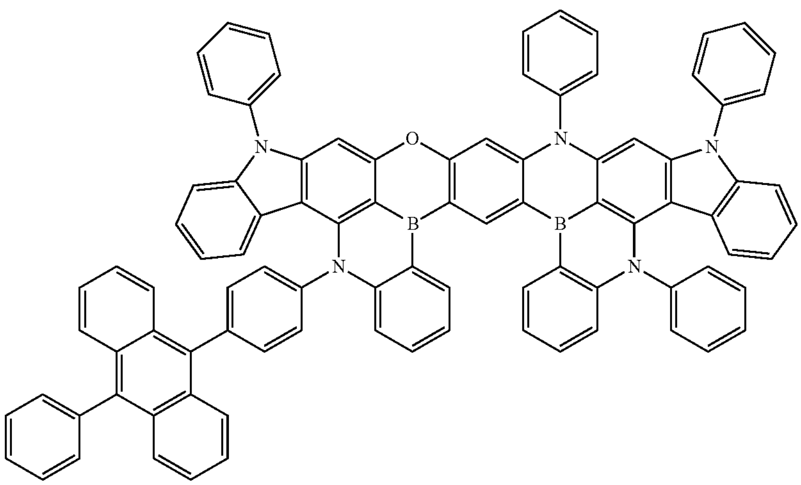
39
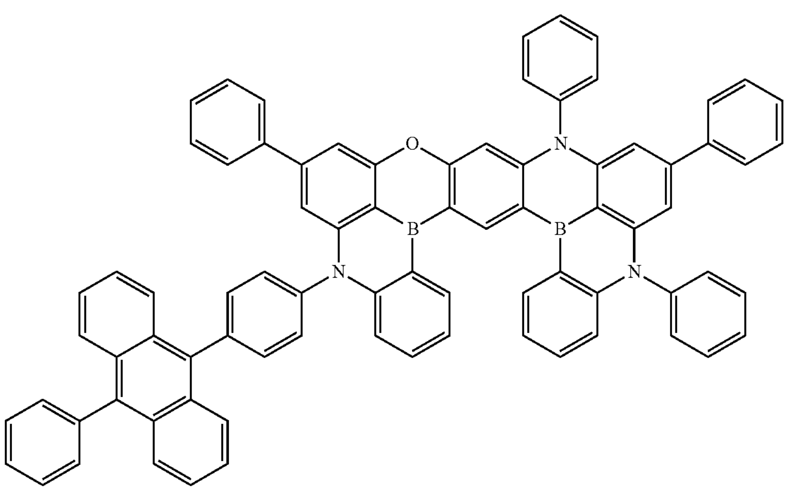

-continued
40
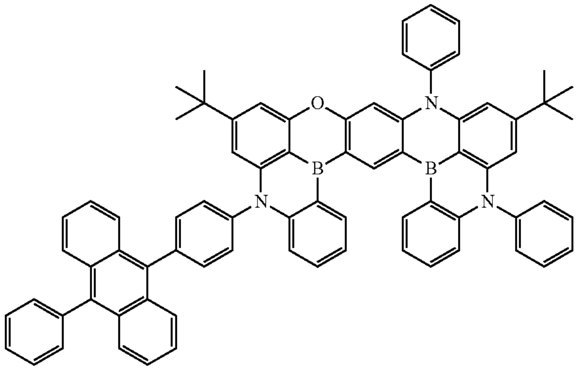
41
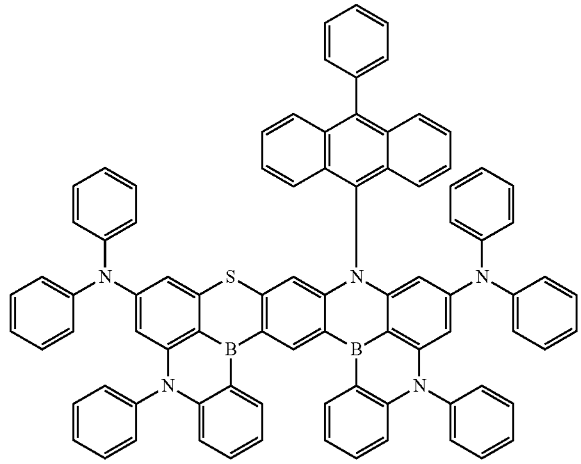
42
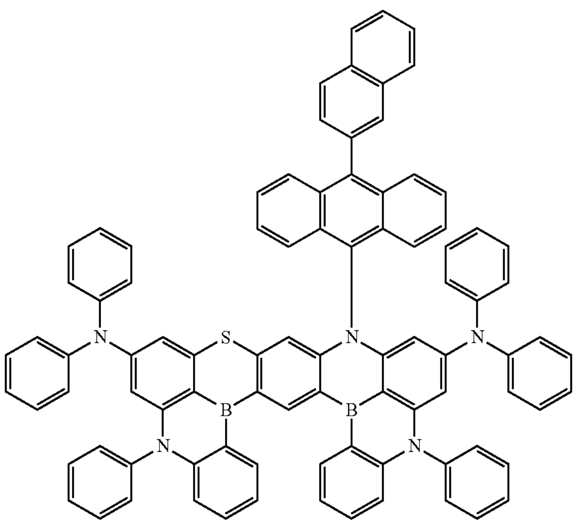
43
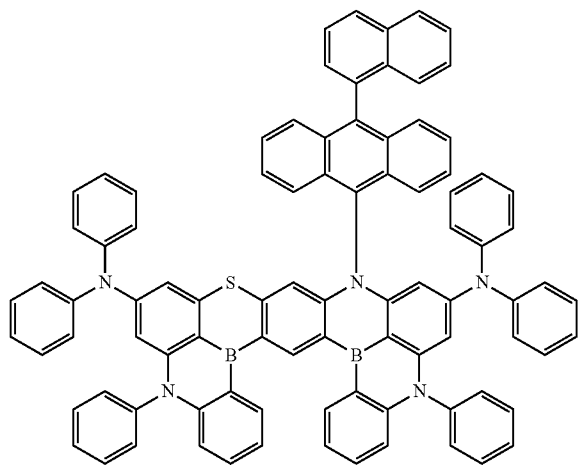
44
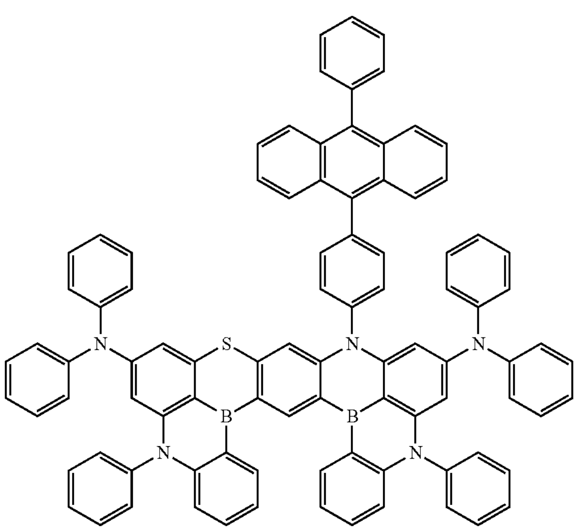
45
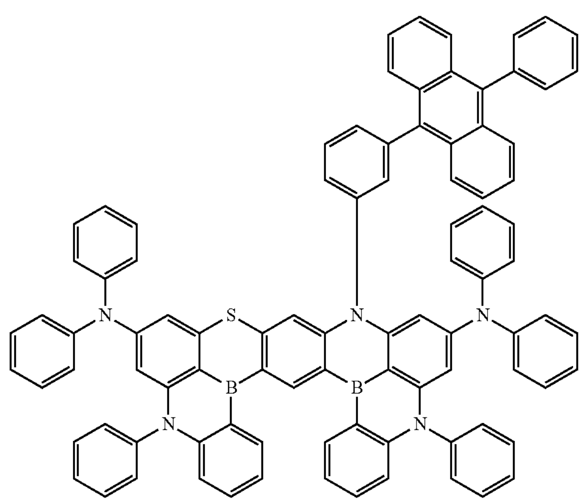

-continued
46
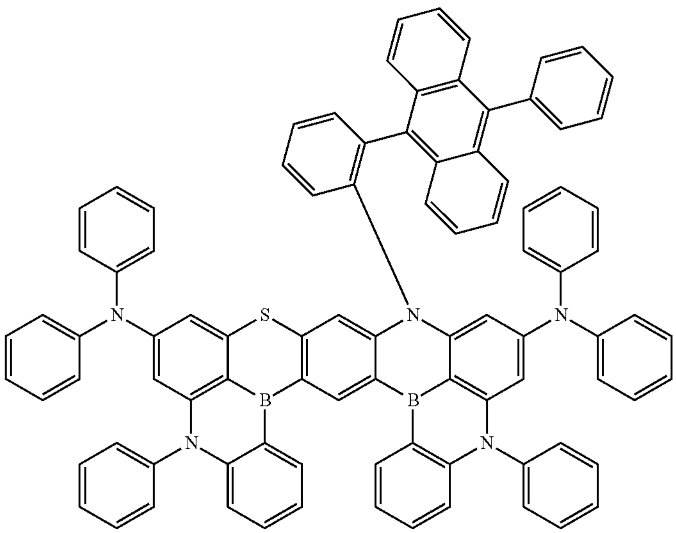
47
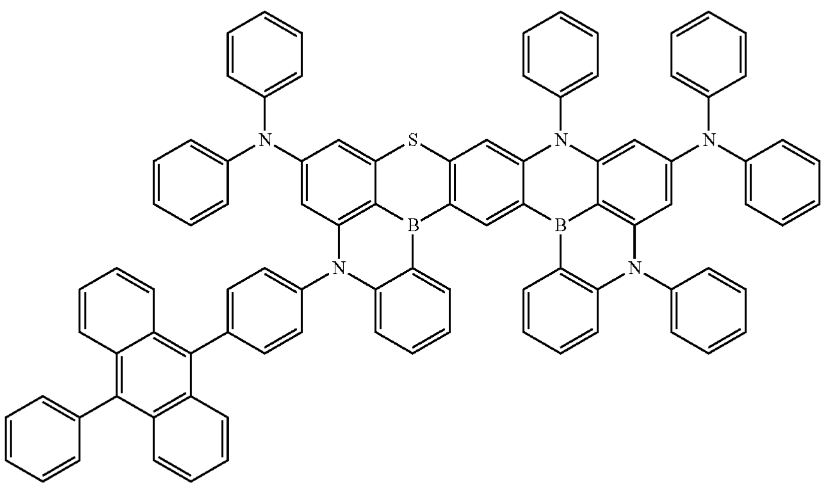
48
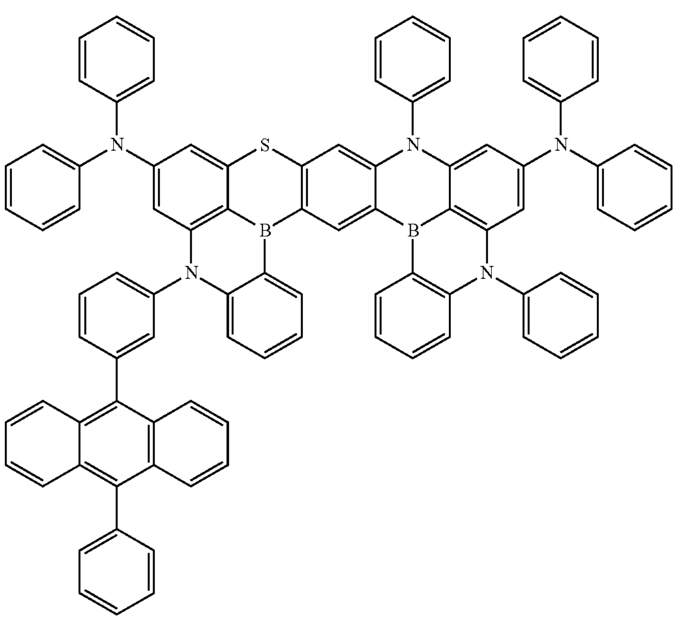

-continued
49
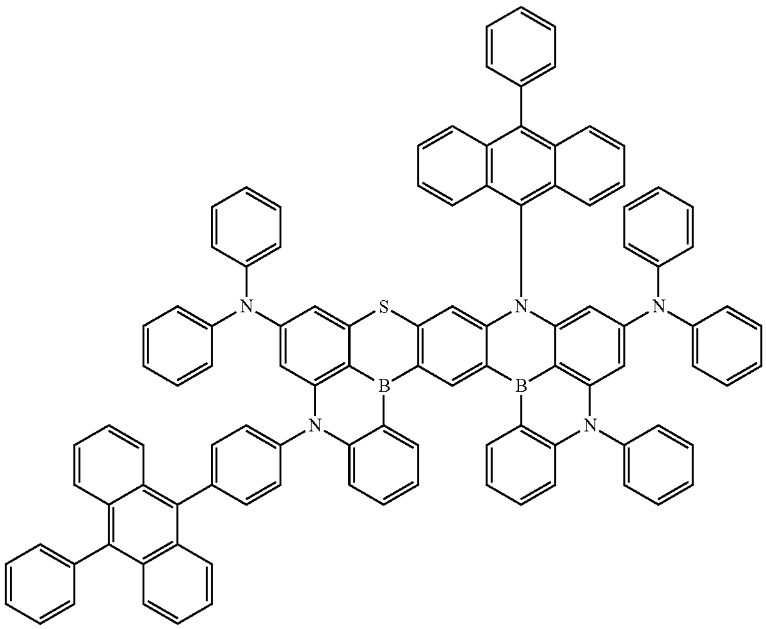
50
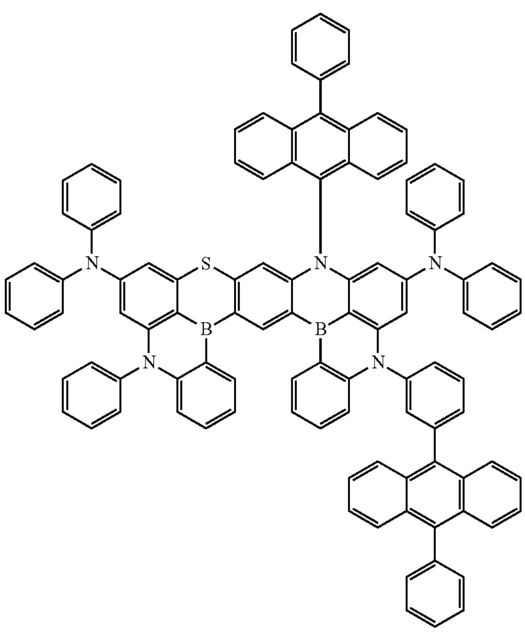

-continued
51
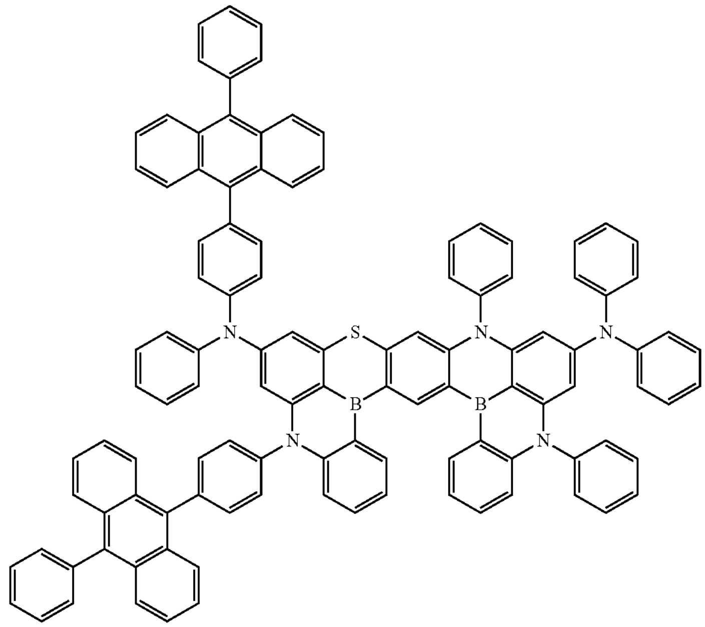
52
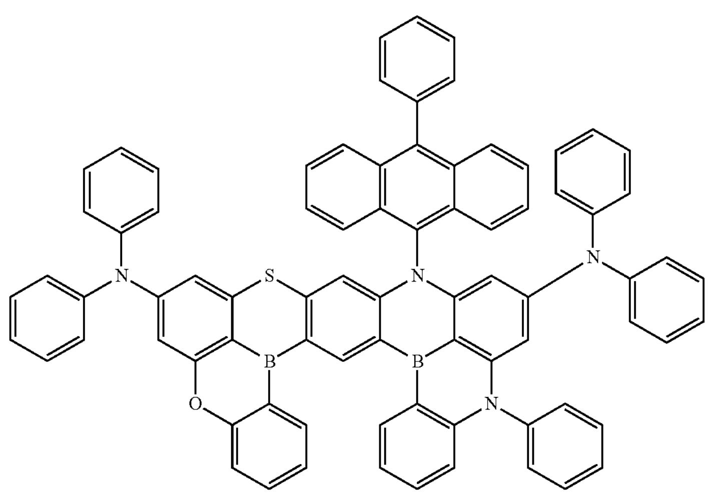
53
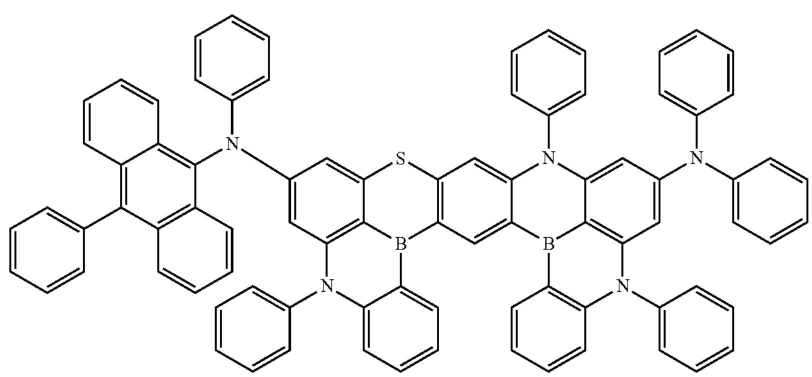

-continued
54
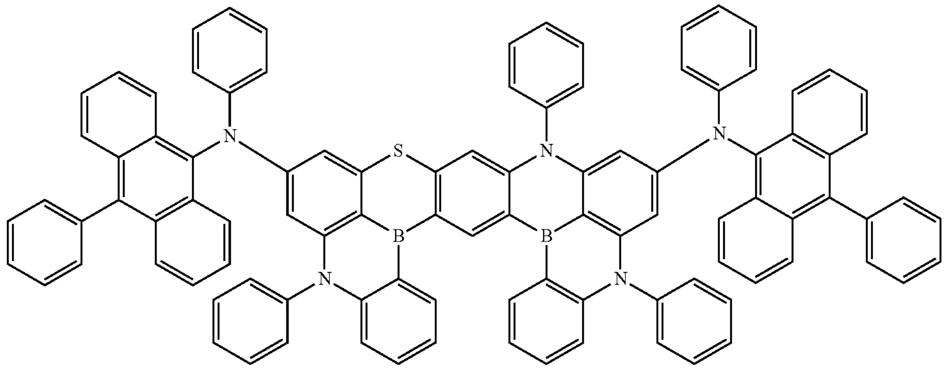
55
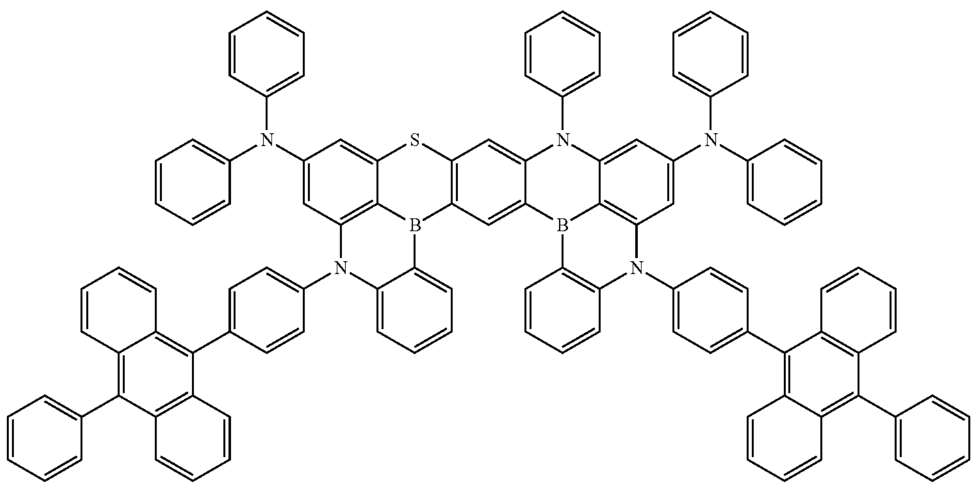
56
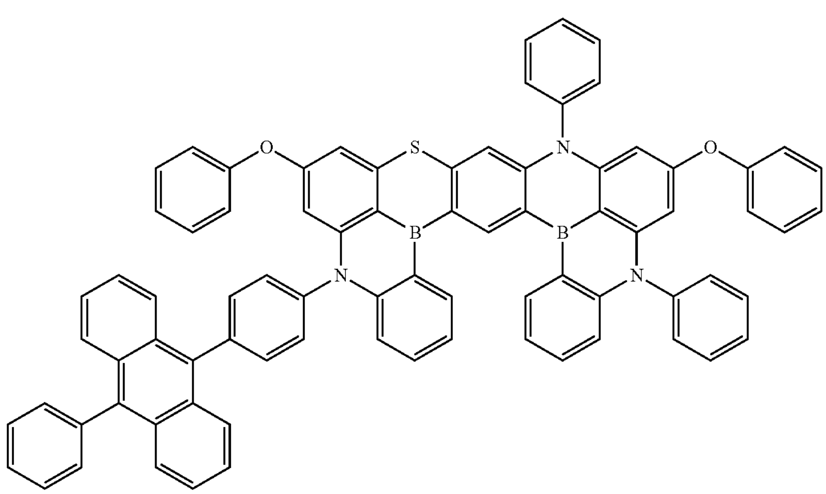

-continued
57
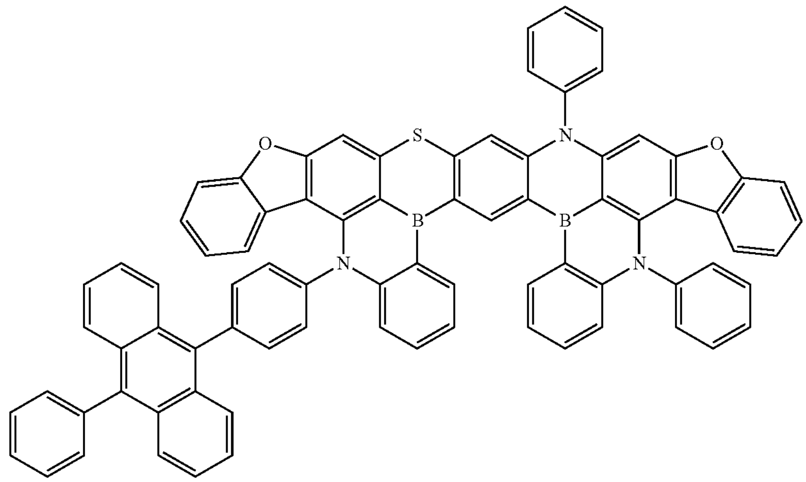
58
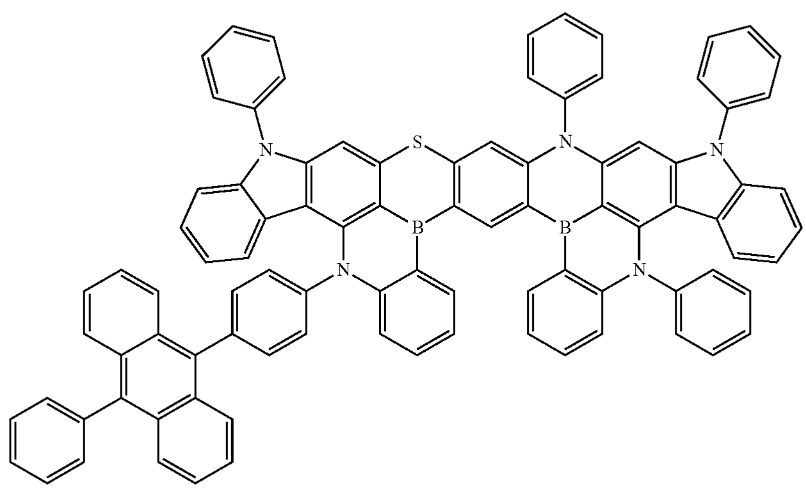
59
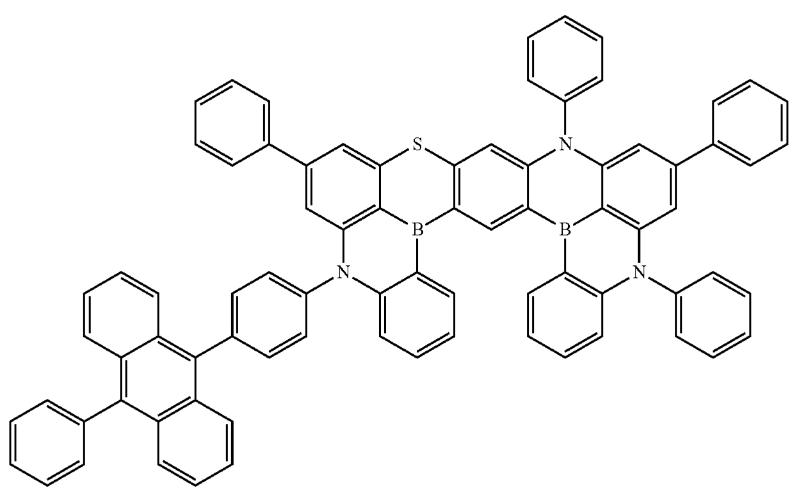

-continued
60
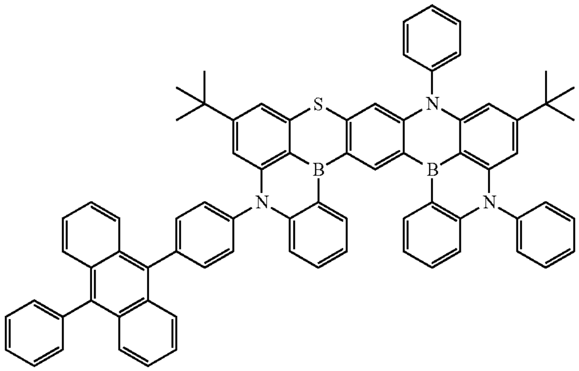
61
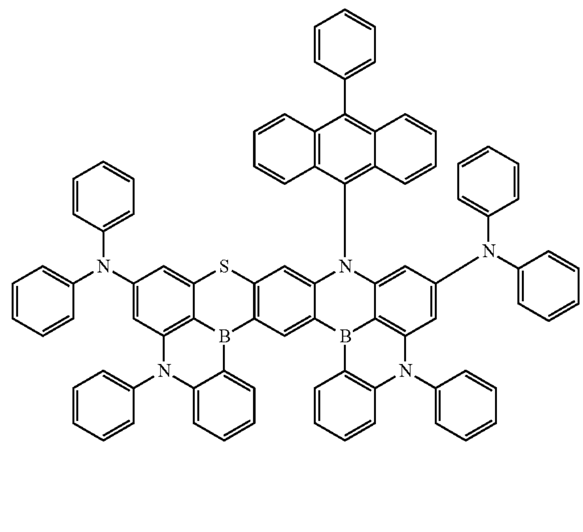
62
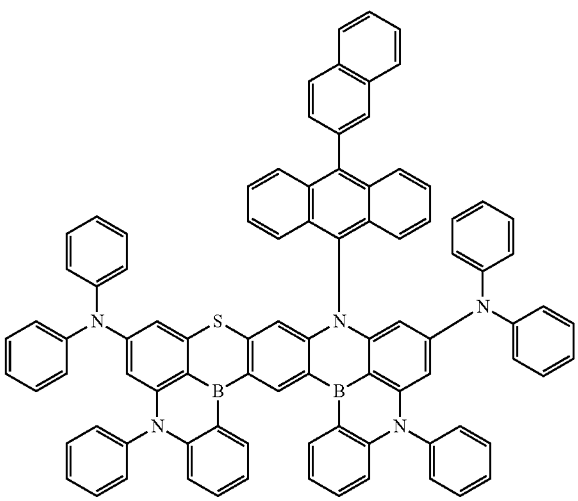
63
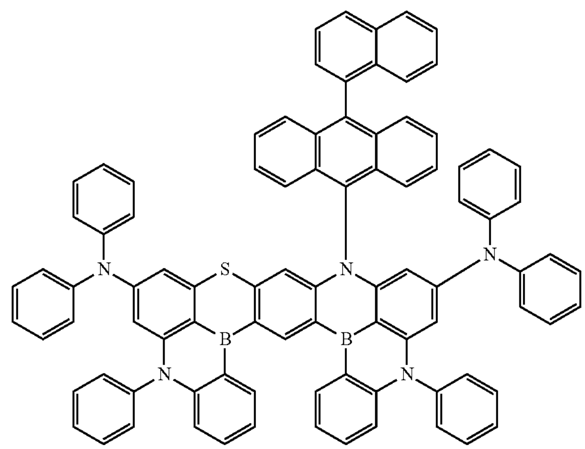
64
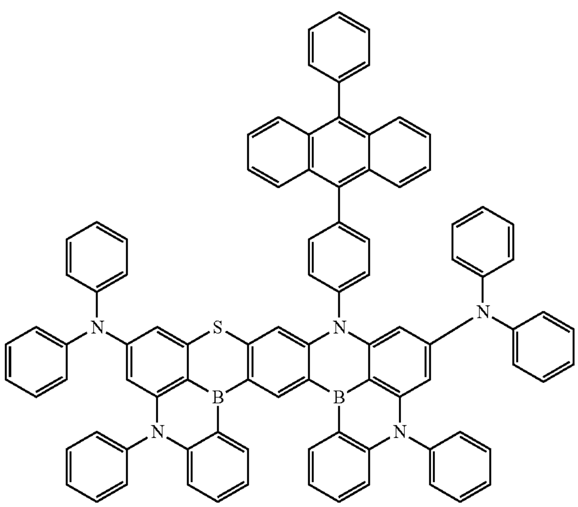
65
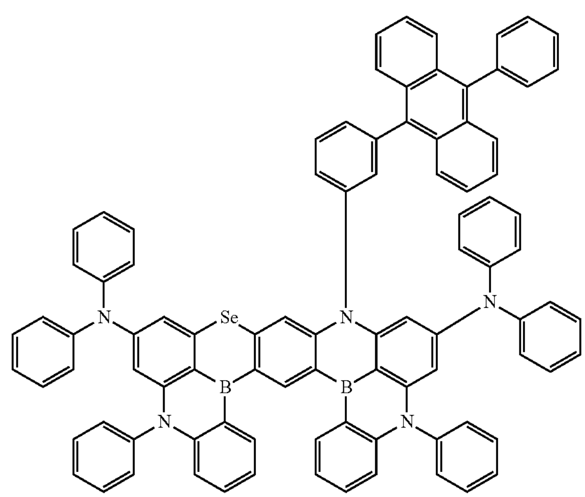

-continued
66
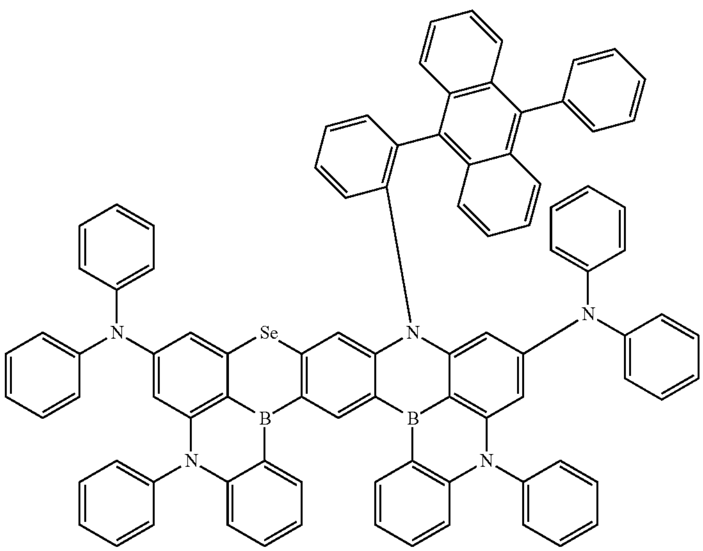
67
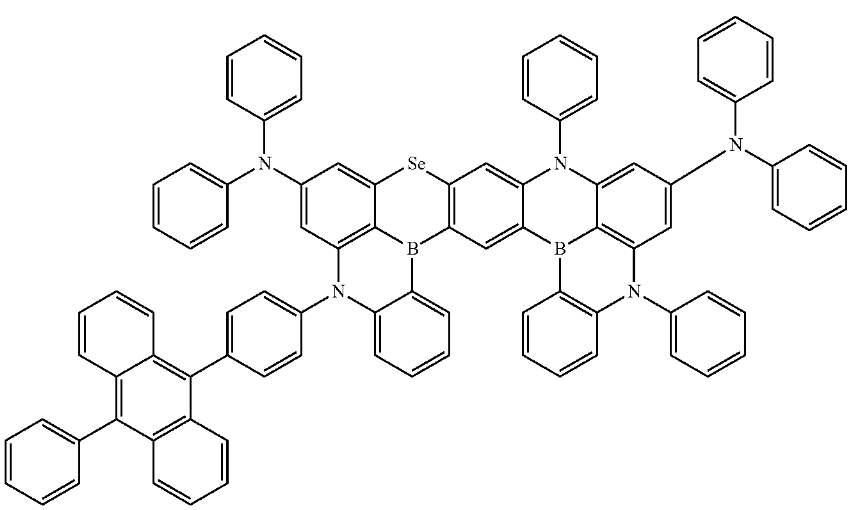

-continued
68
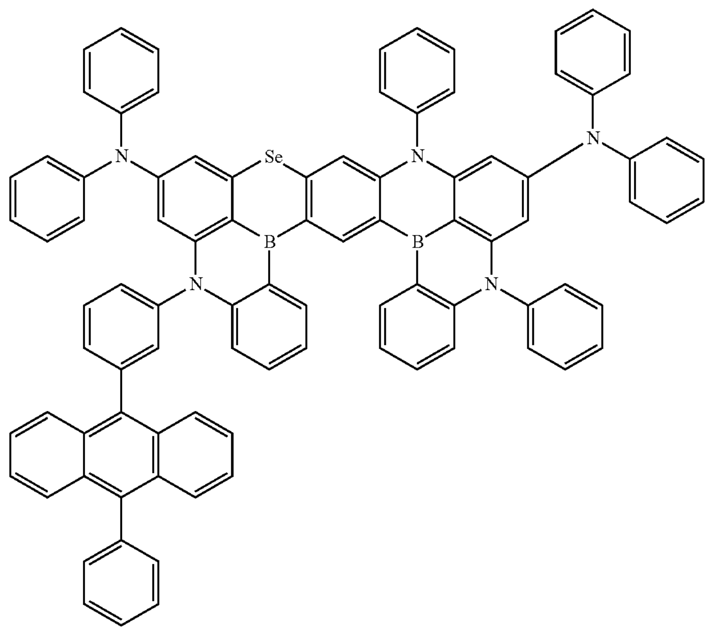
69
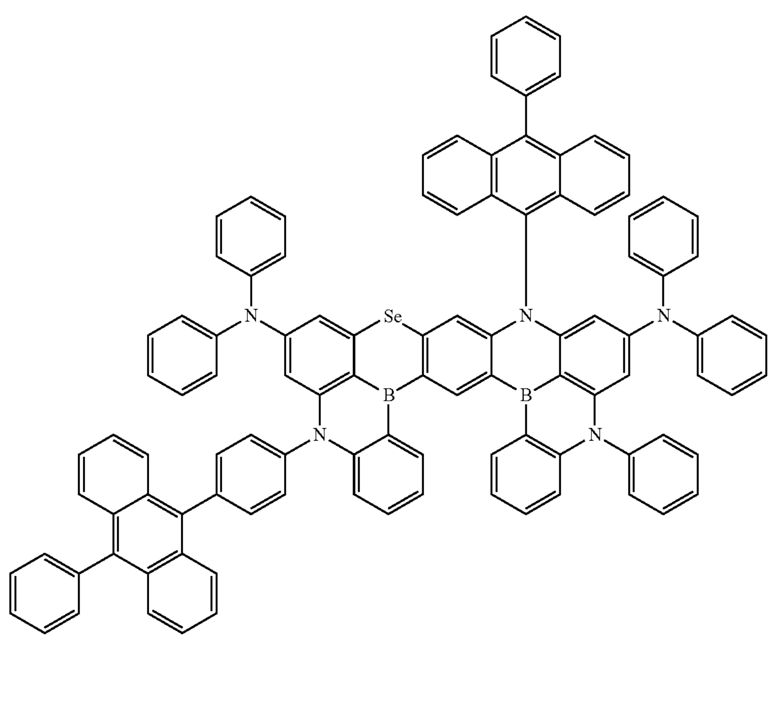

-continued
70
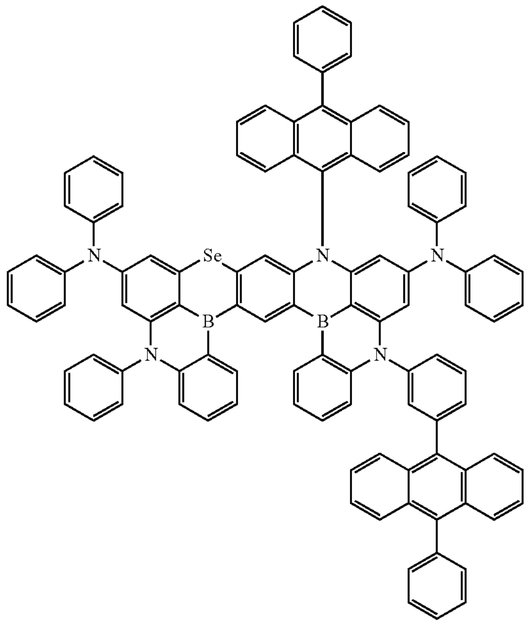
71
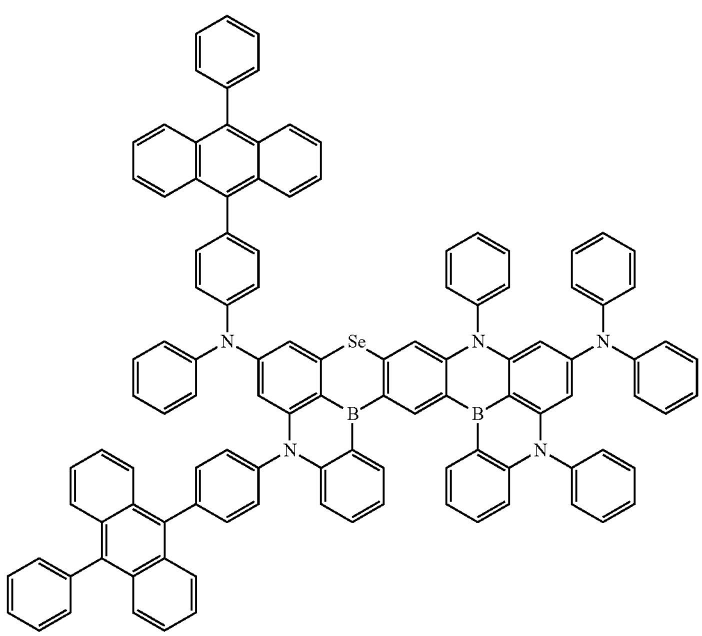

-continued
72
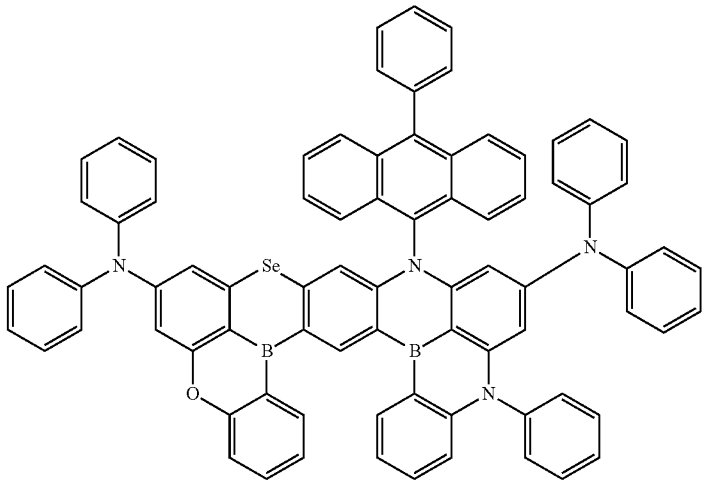
73
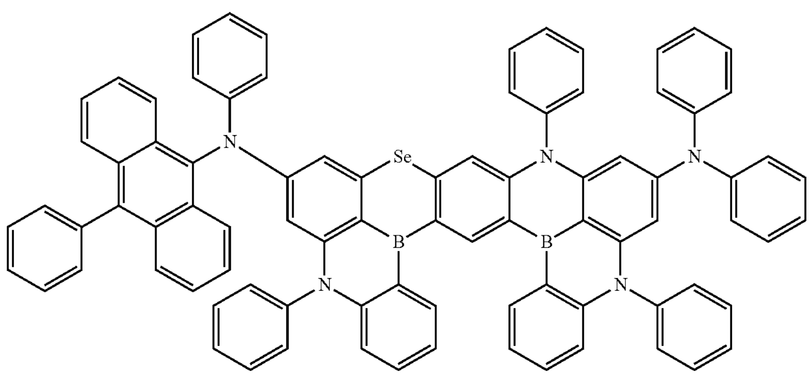
74
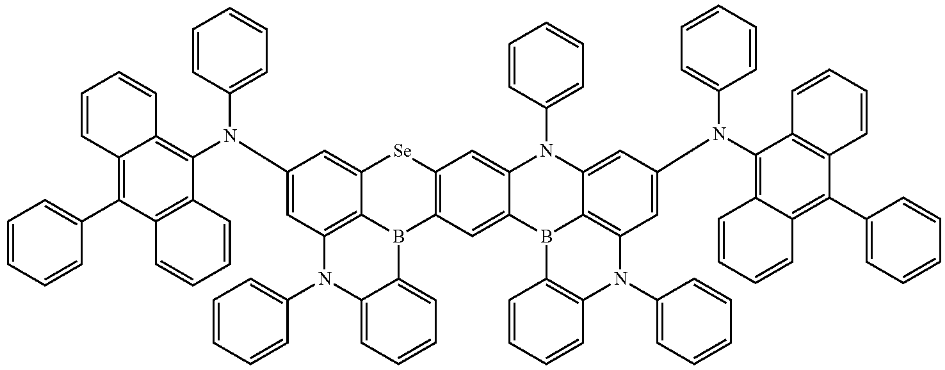

-continued
75
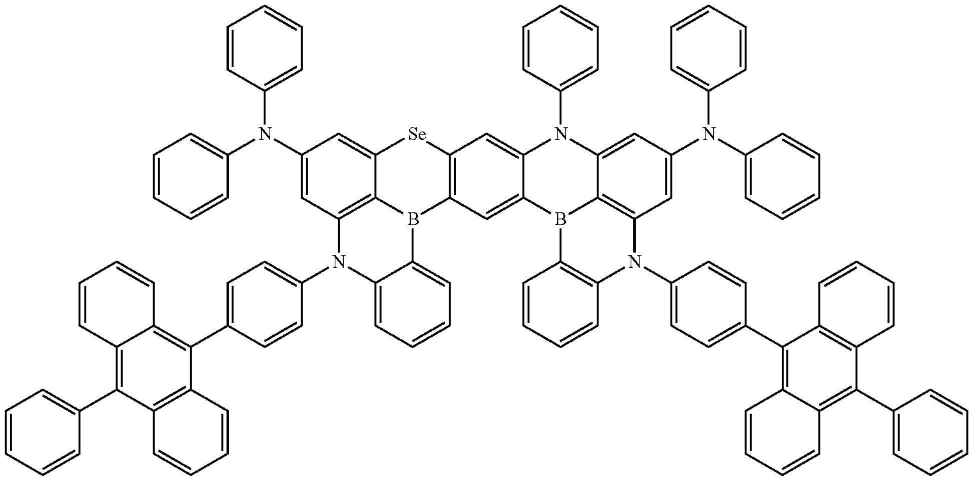
76
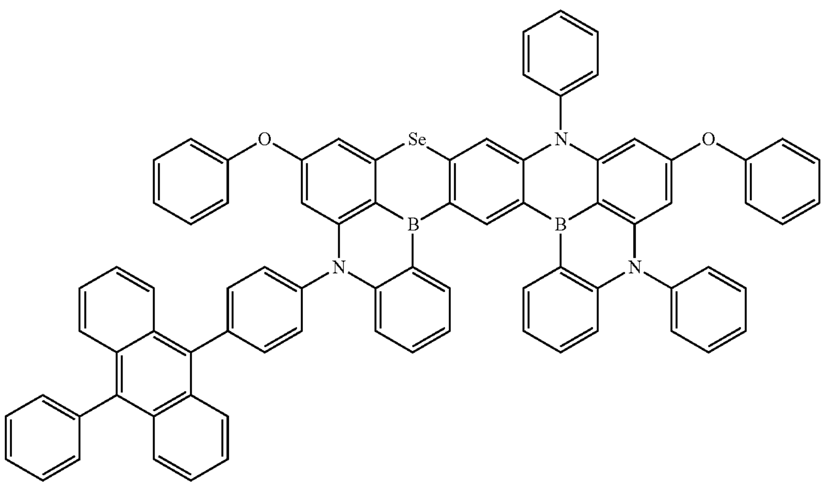
77
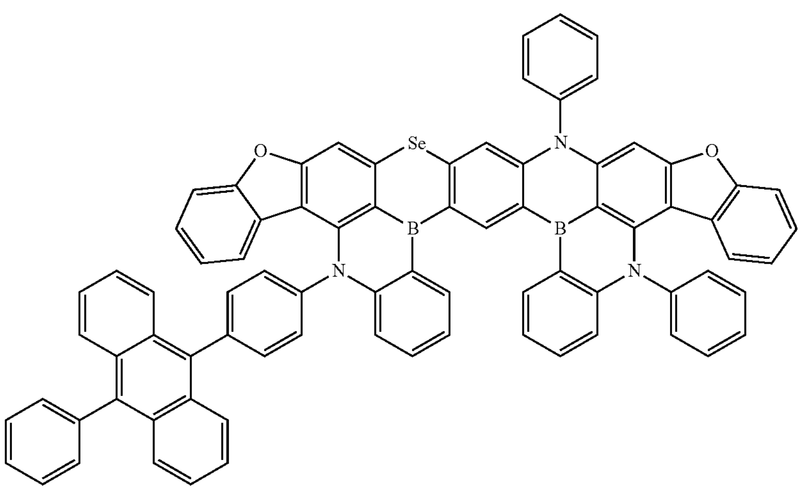

-continued
78
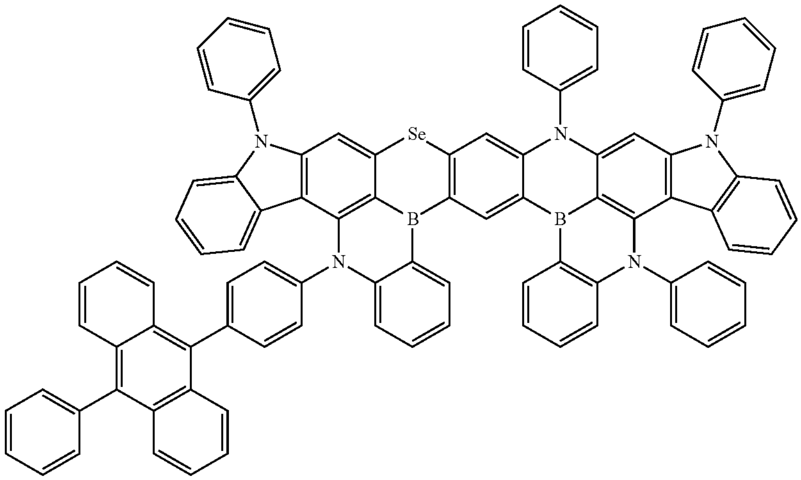
79
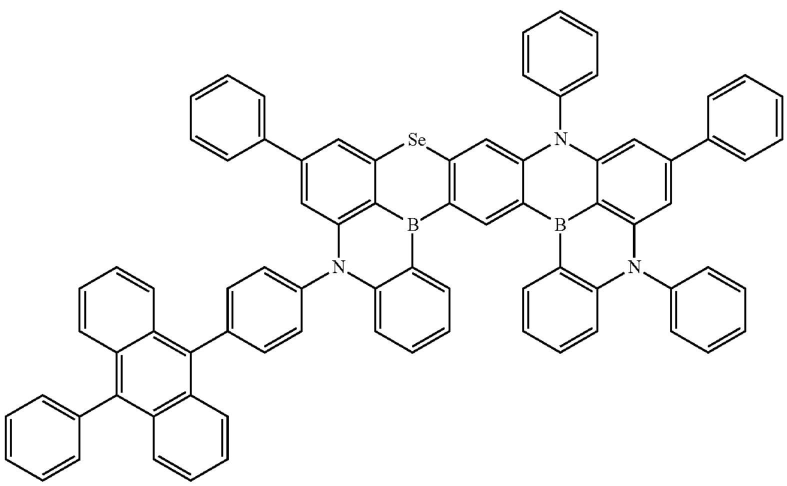
80
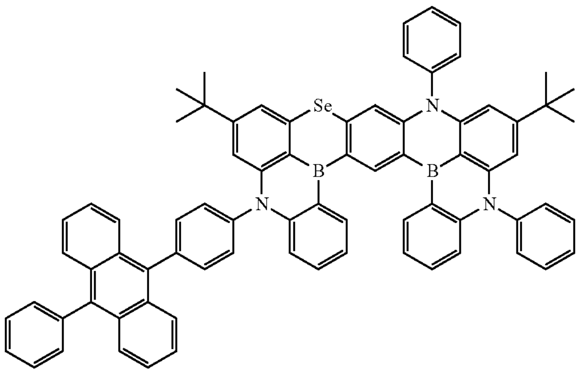
81
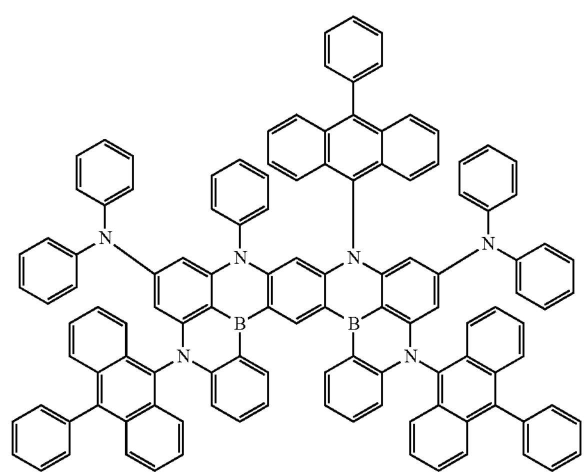

-continued
82
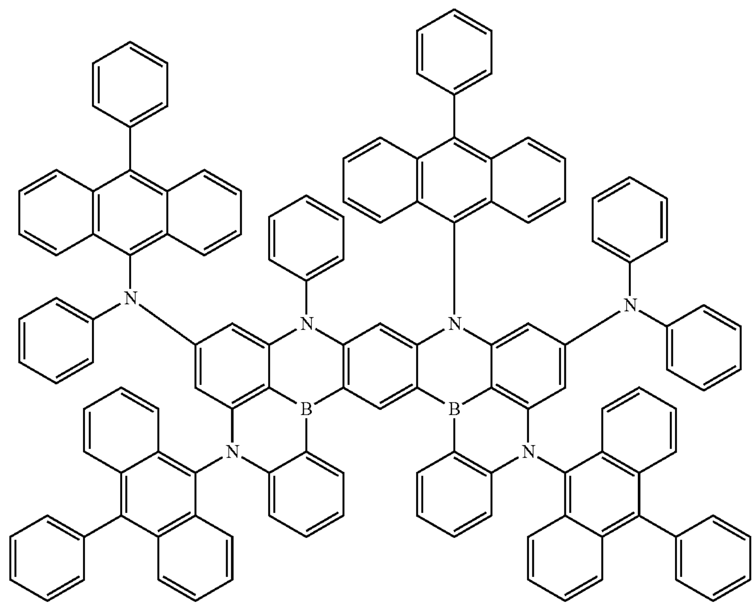
83
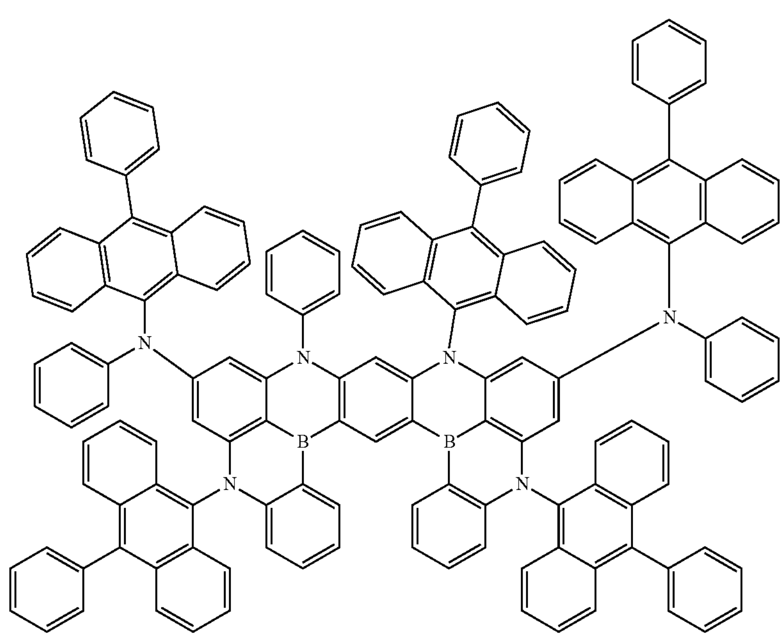

-continued
84
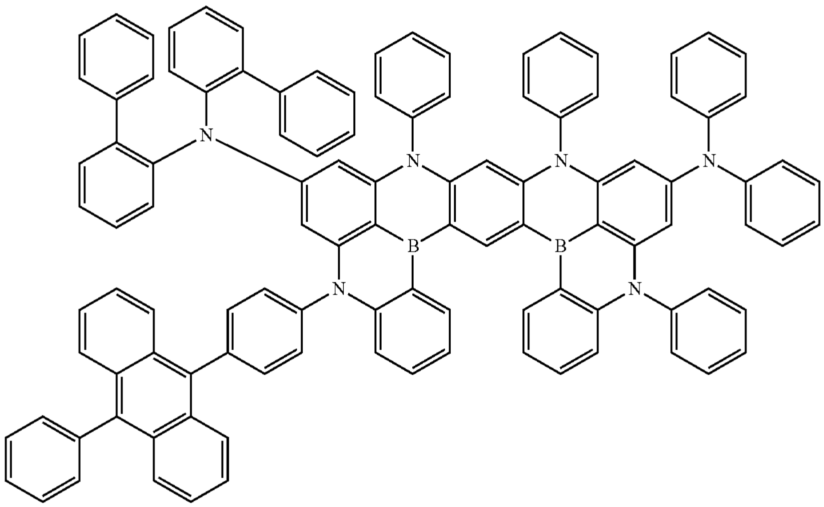
85
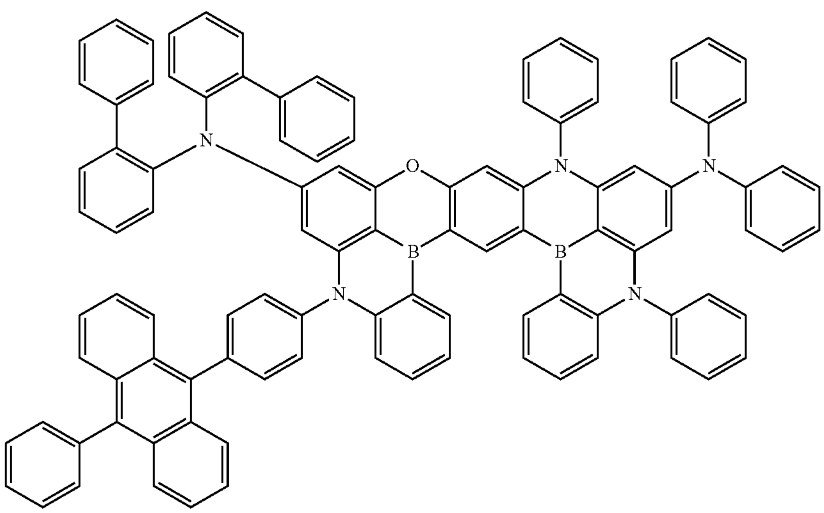
86
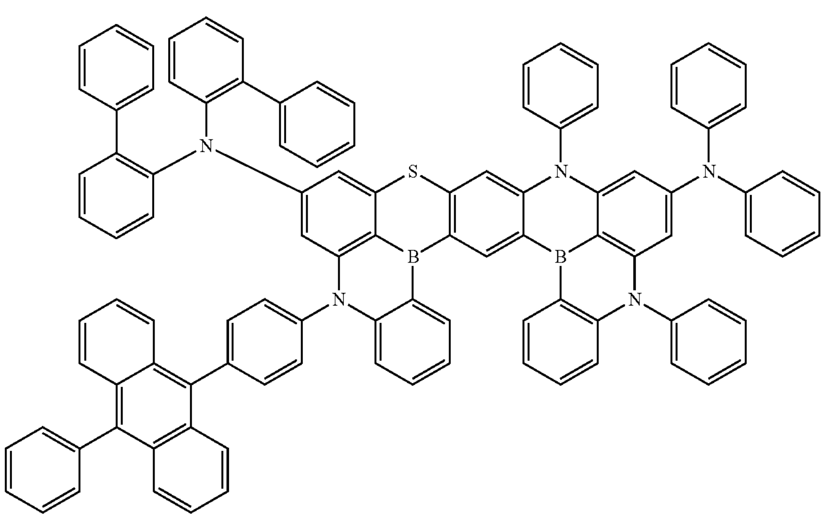

-continued
87
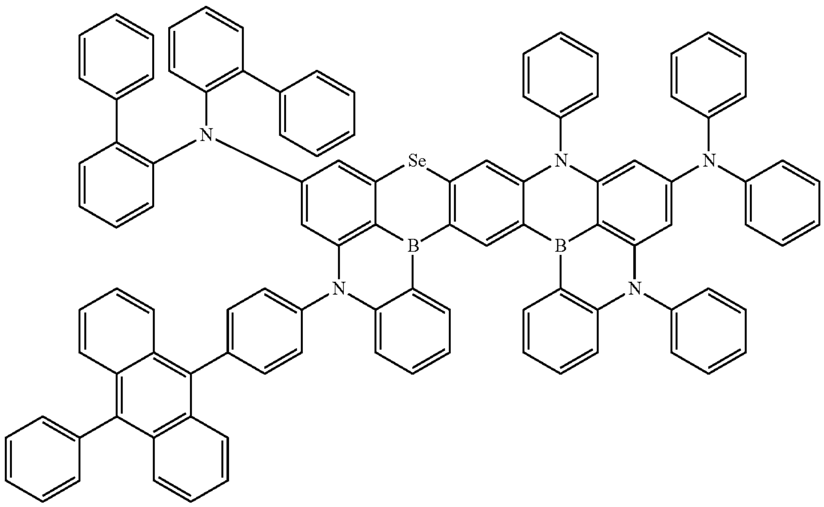
88
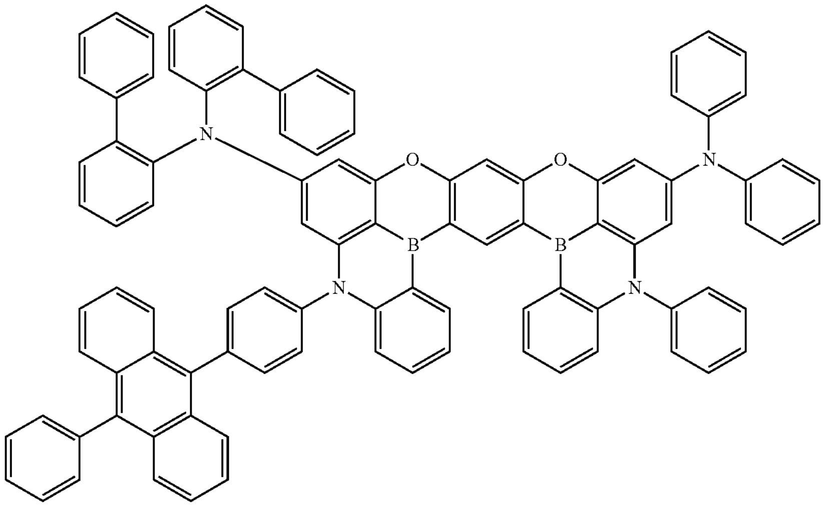
89
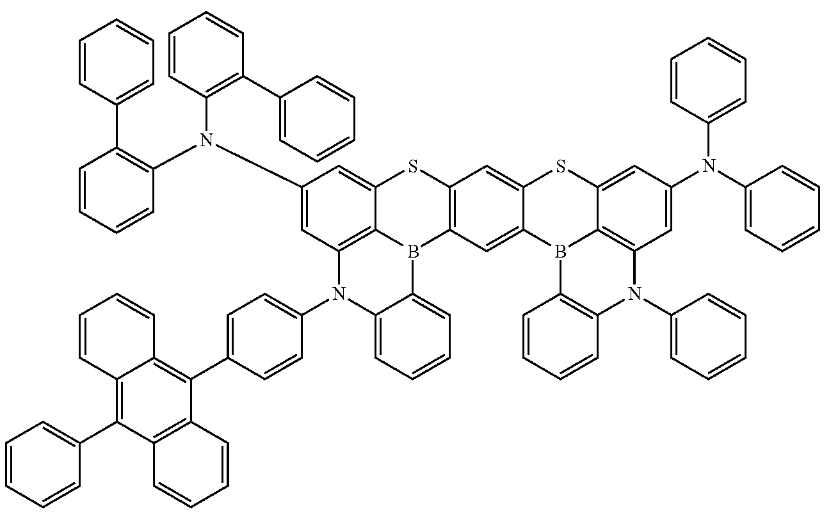

-continued
90
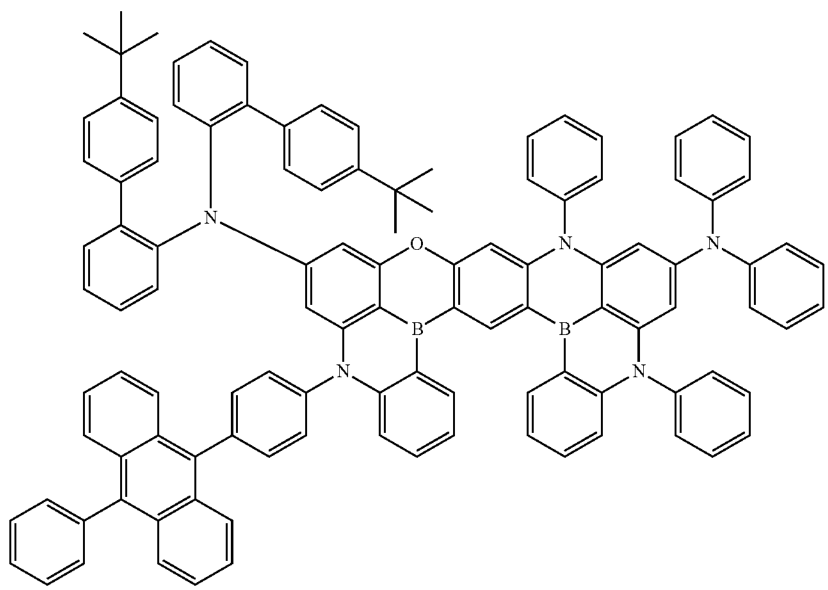
91
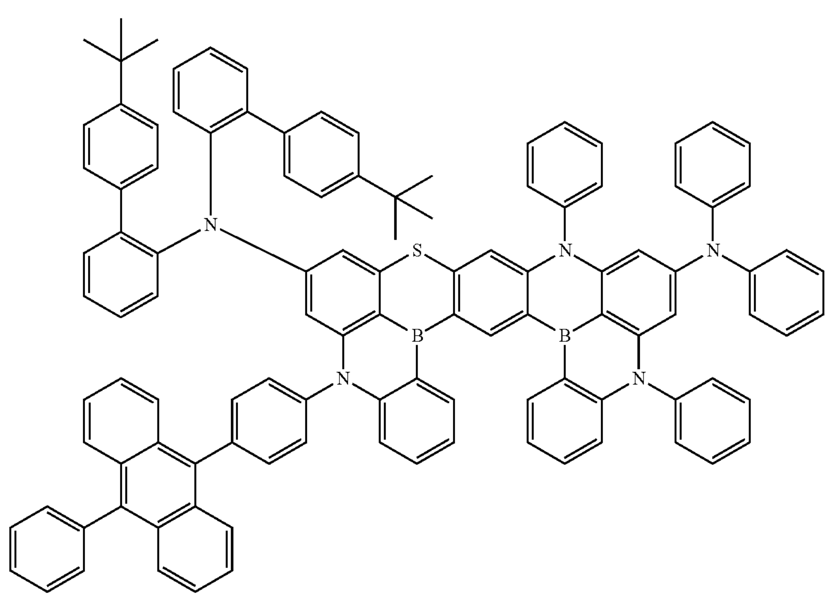

-continued
92
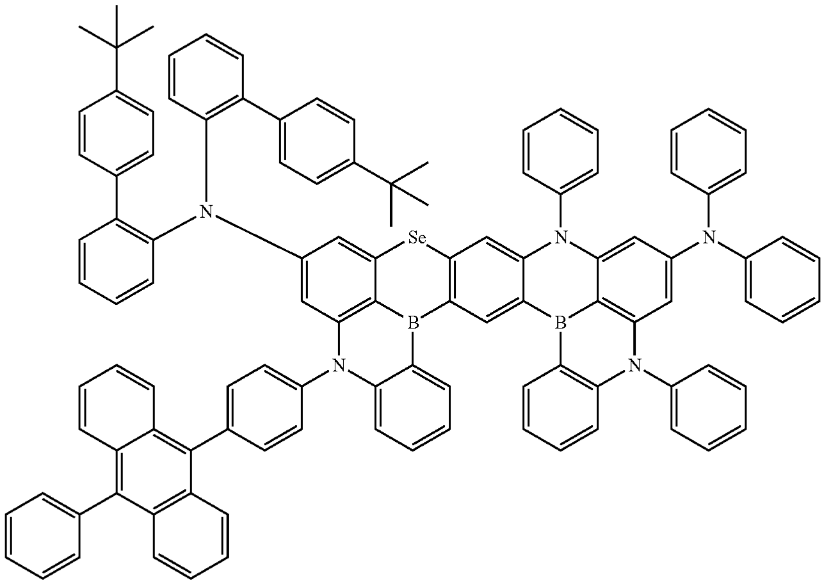
93
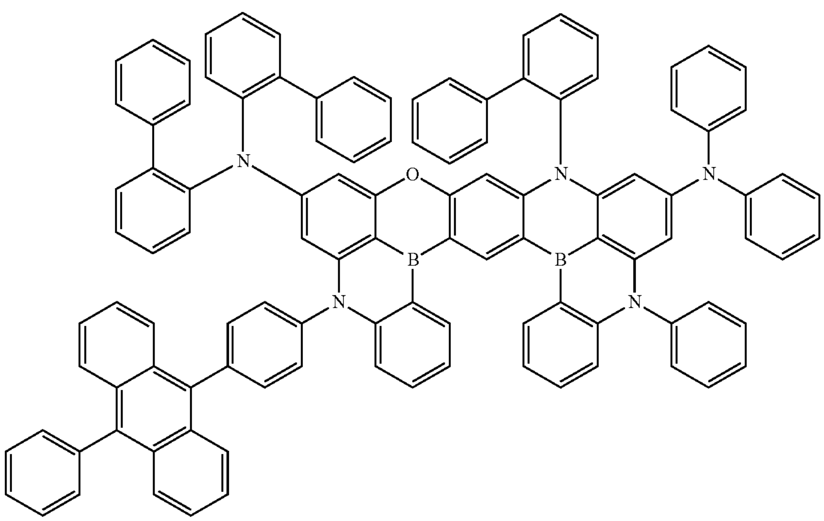

-continued
94
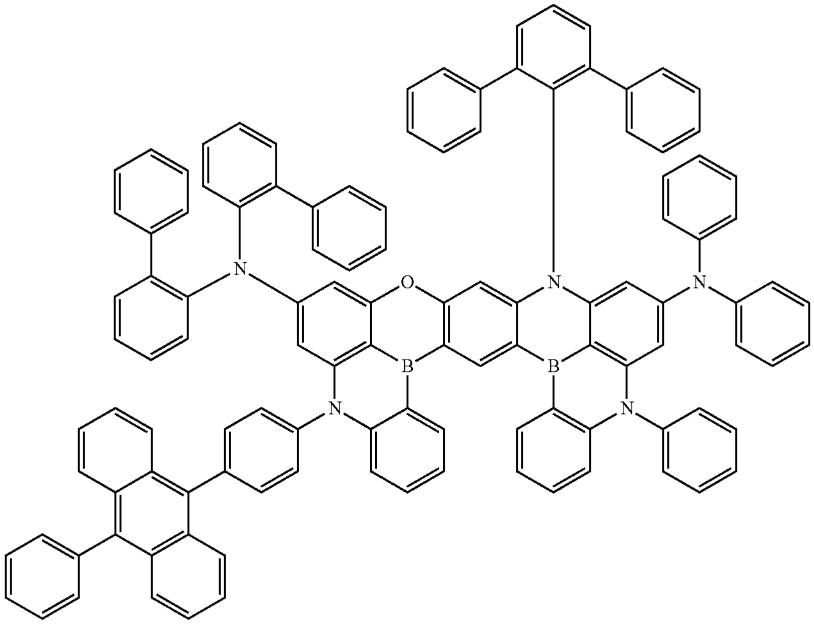
95
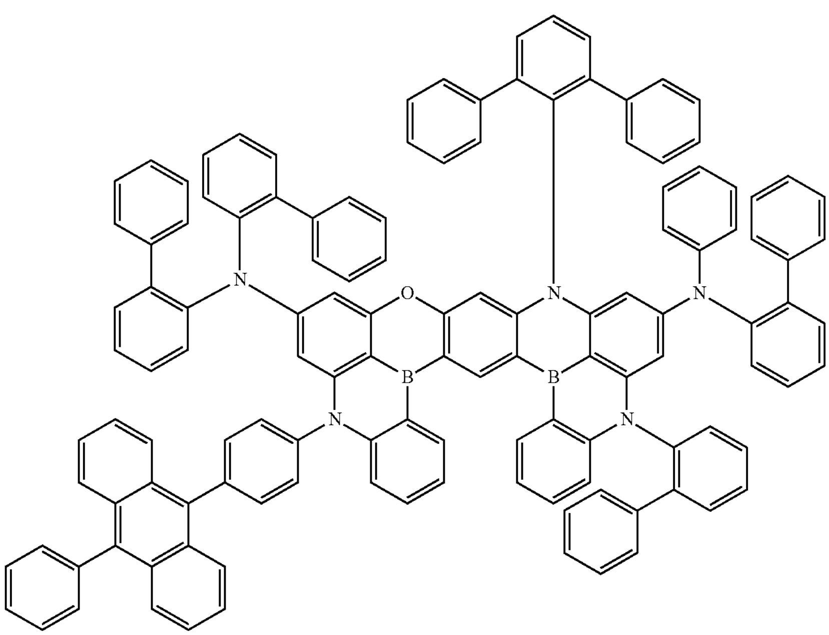

-continued
96
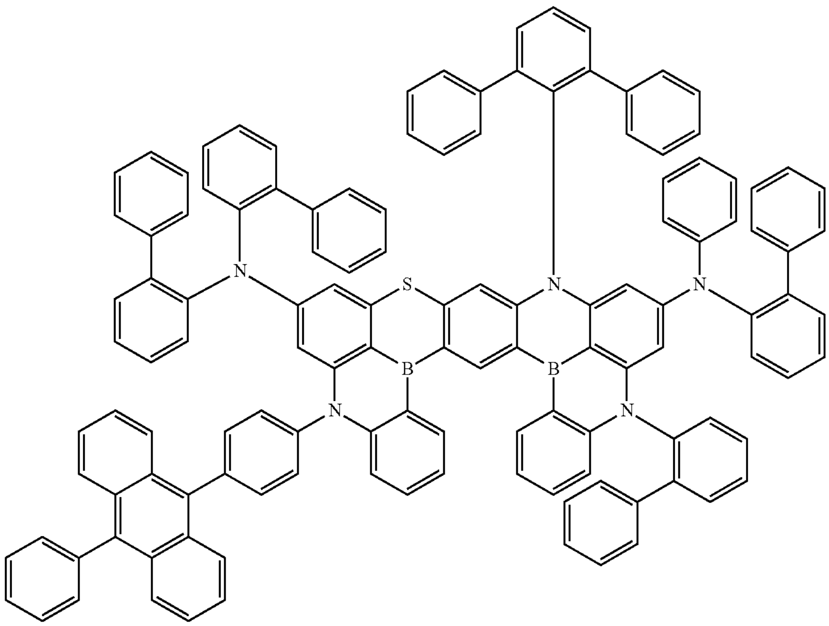
97
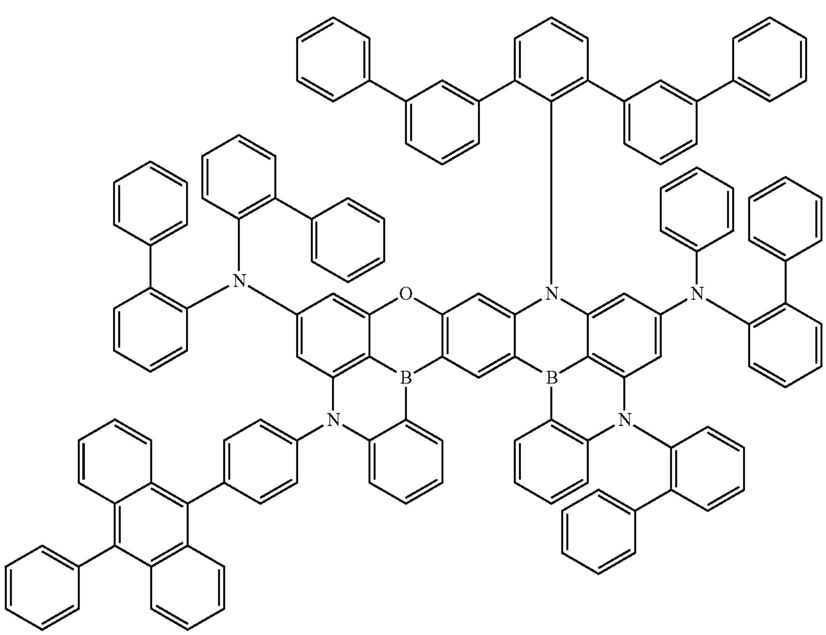

-continued
98
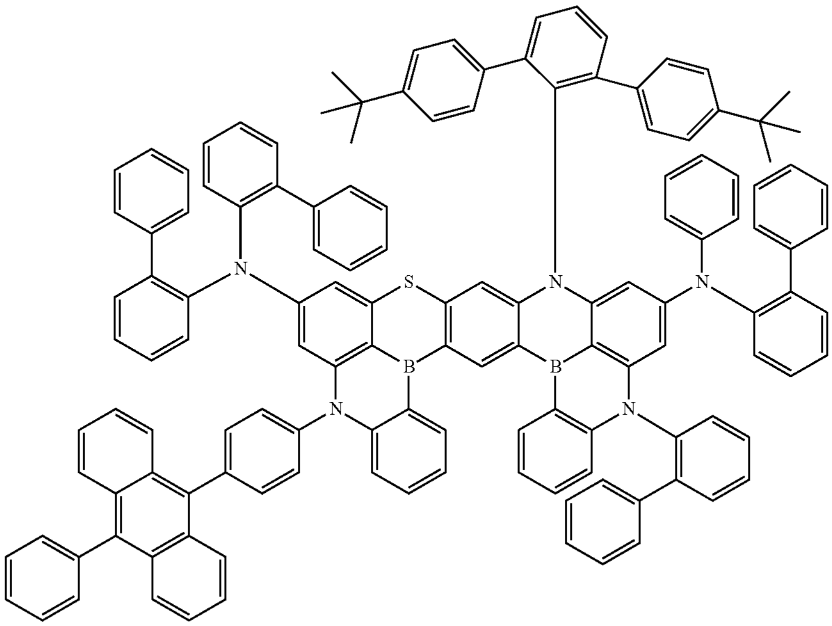
99
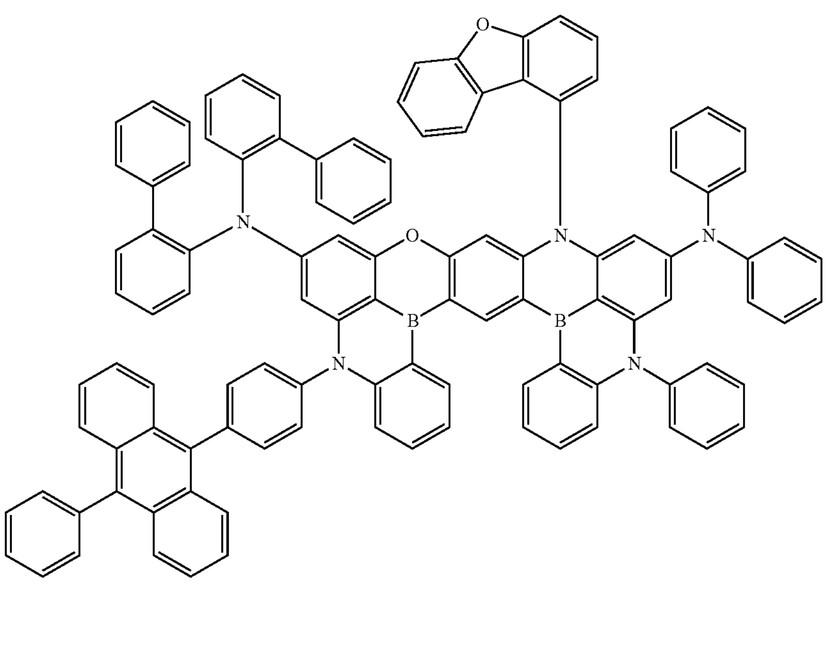

-continued
100
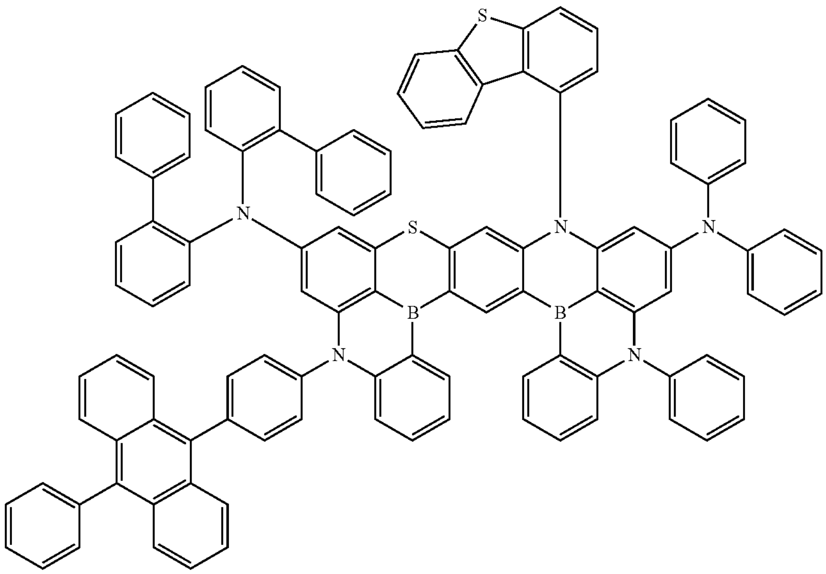
101
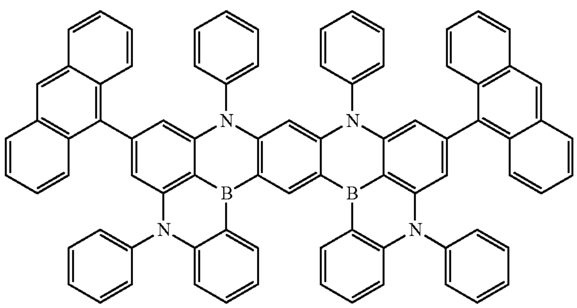
102
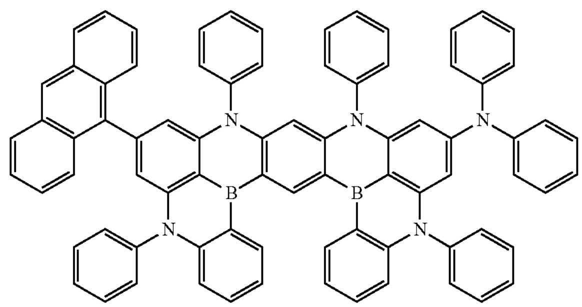
103
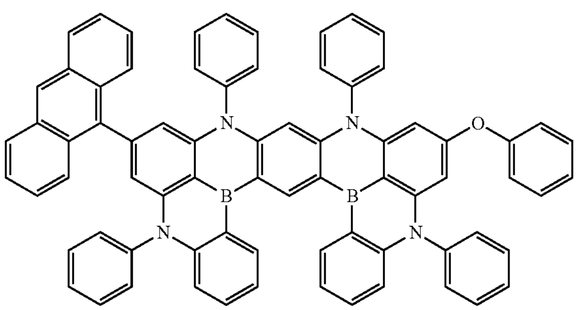
104
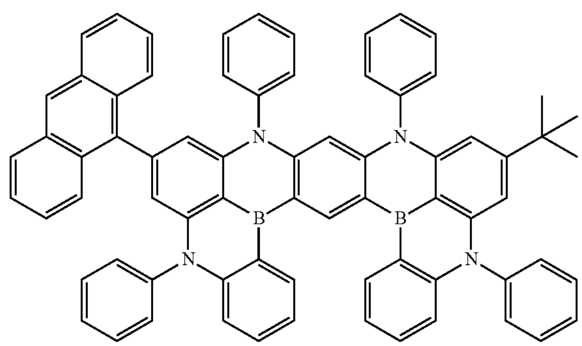
105
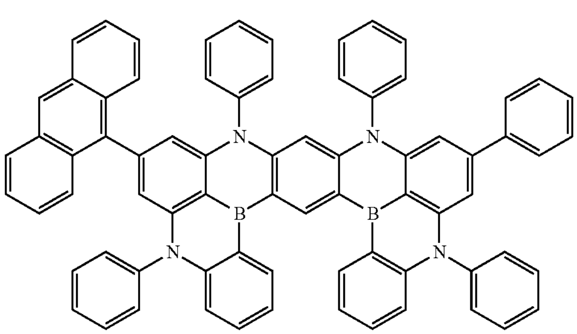
106
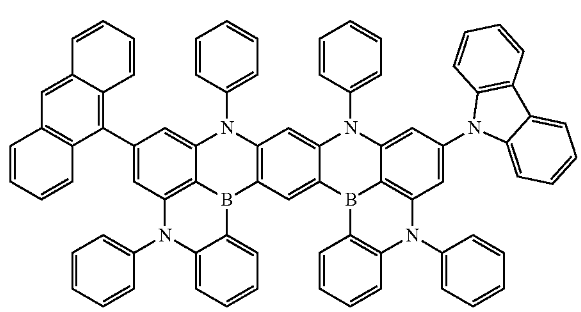

-continued
107
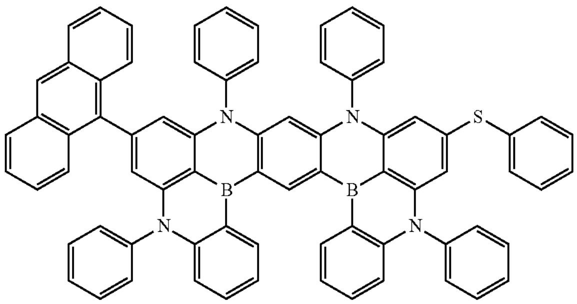
108
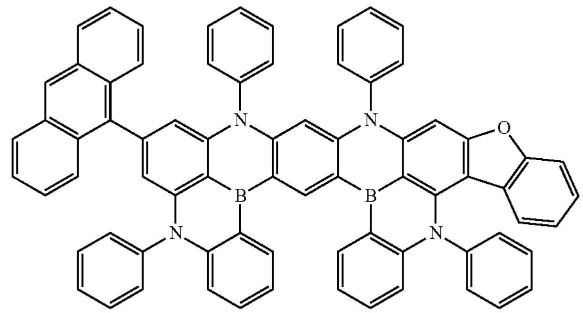
109
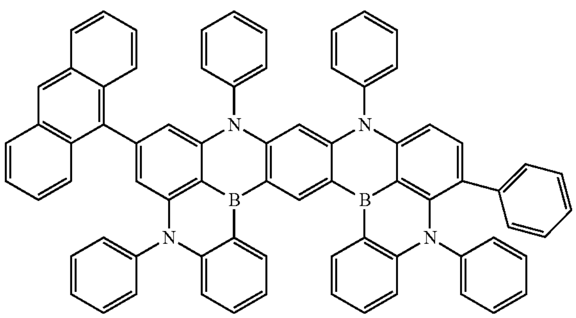
110
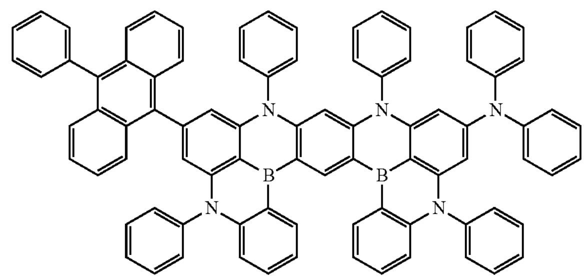
111
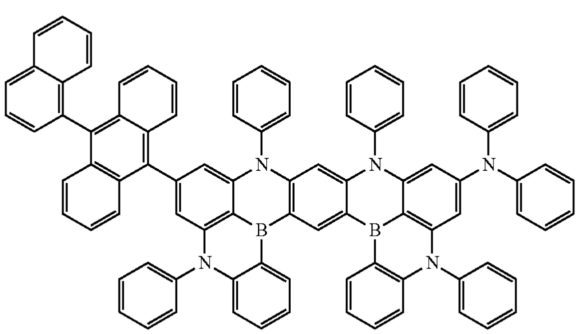
112
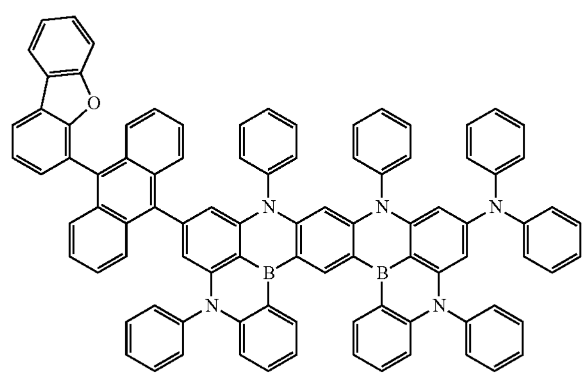
113
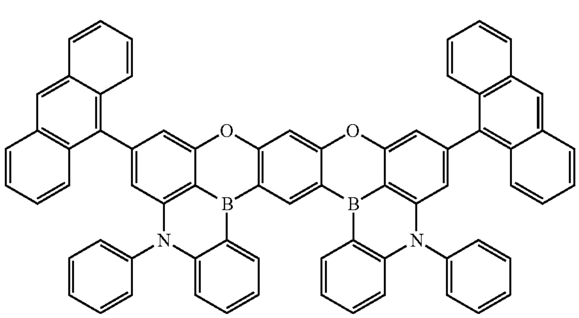
114
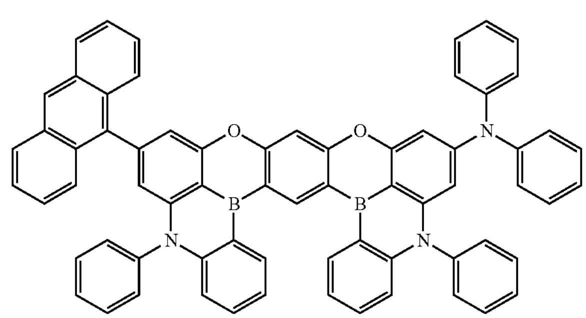

-continued
115
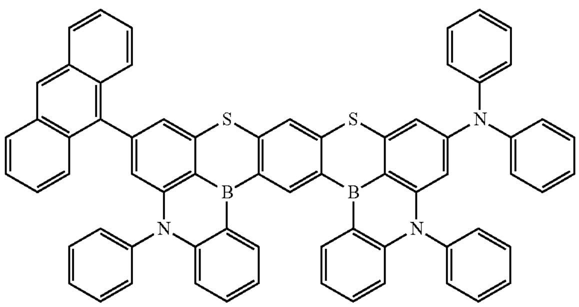
116
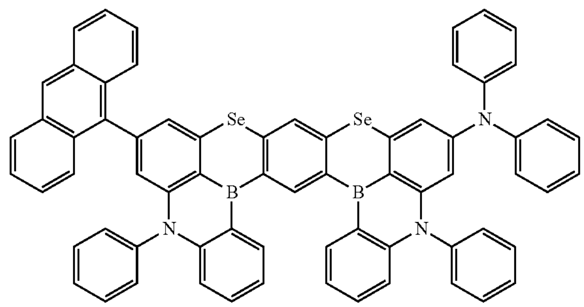
117
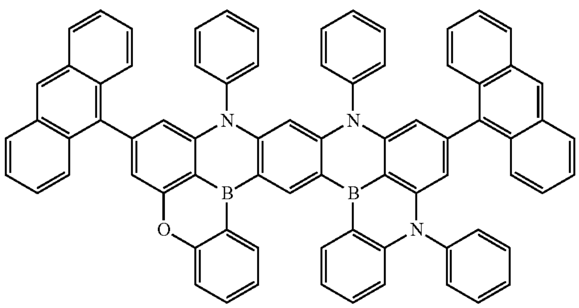
118
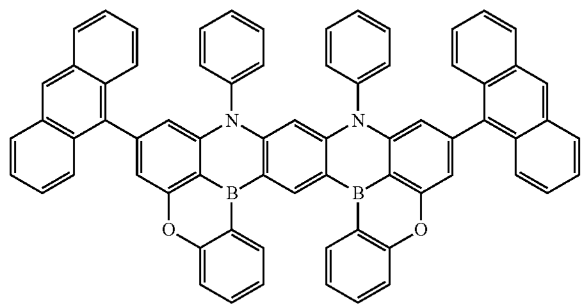
119
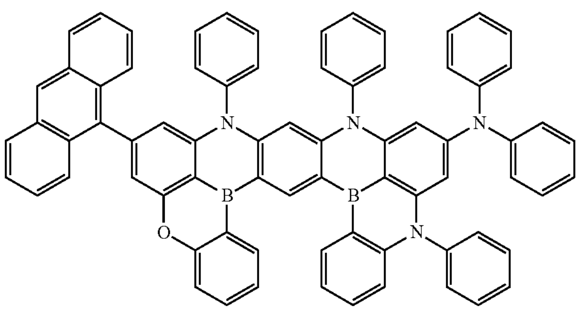
120
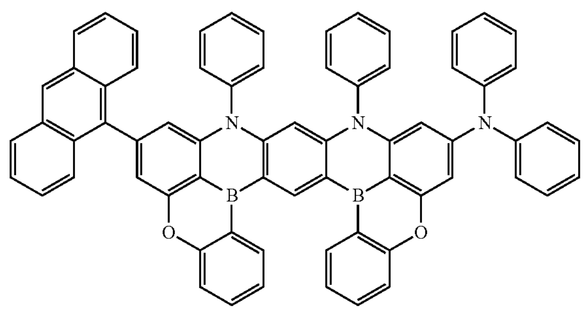
121
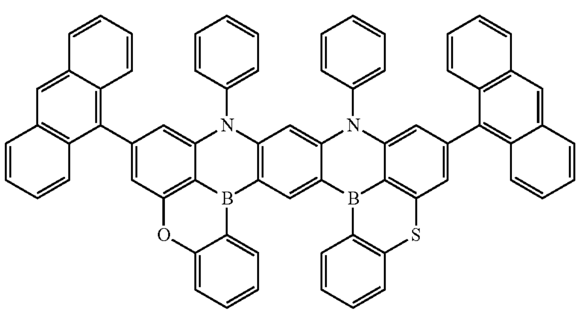
122
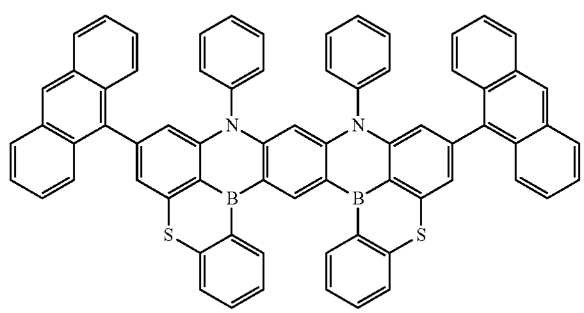
123
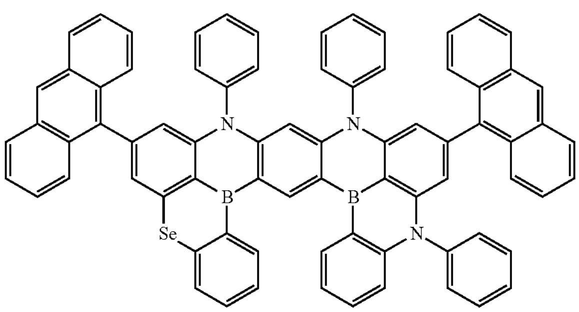
124
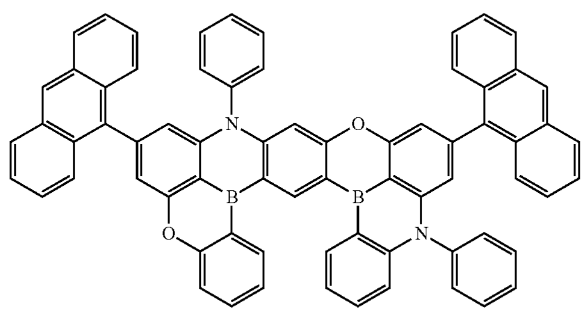

-continued
125
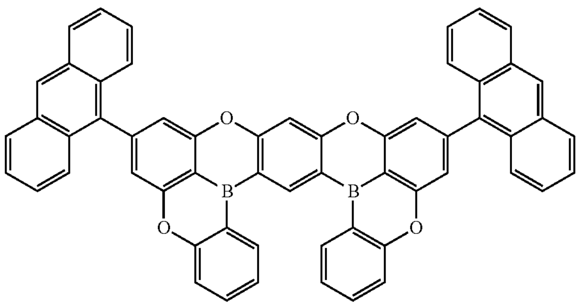
126
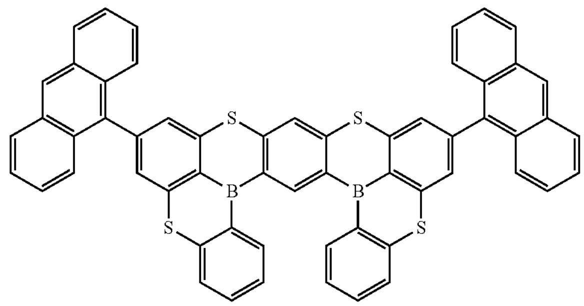
127
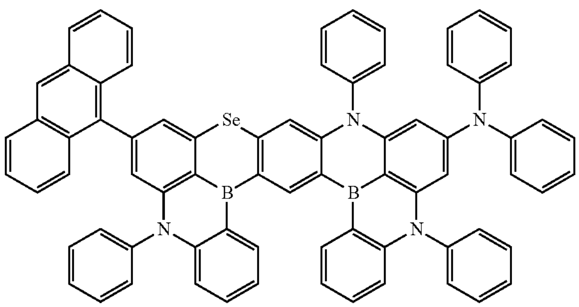
128
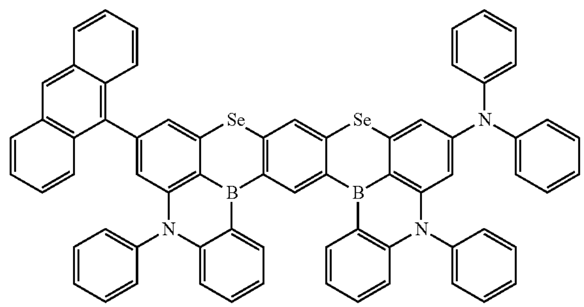
129
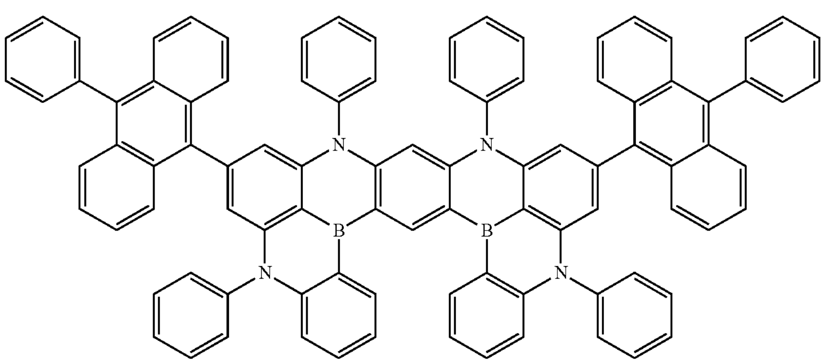
130
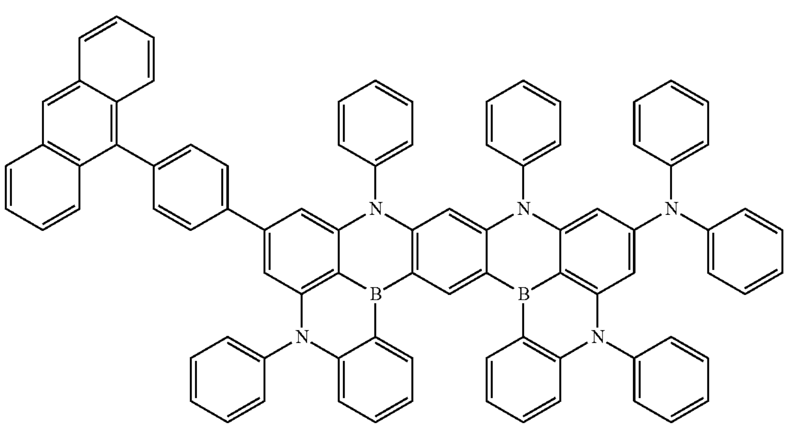

-continued
131
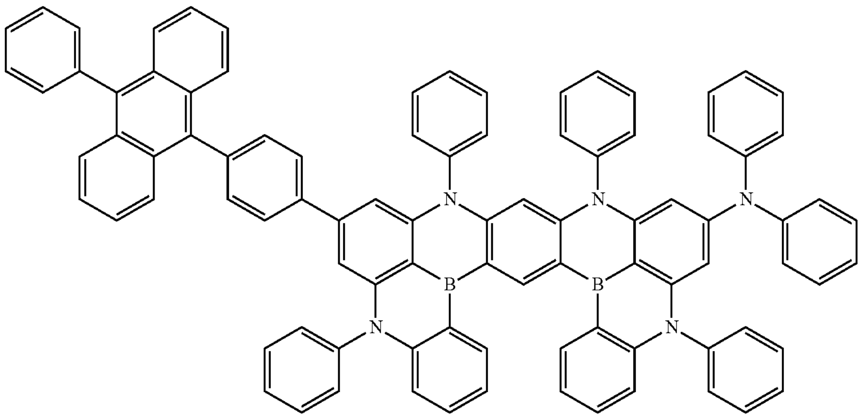
132
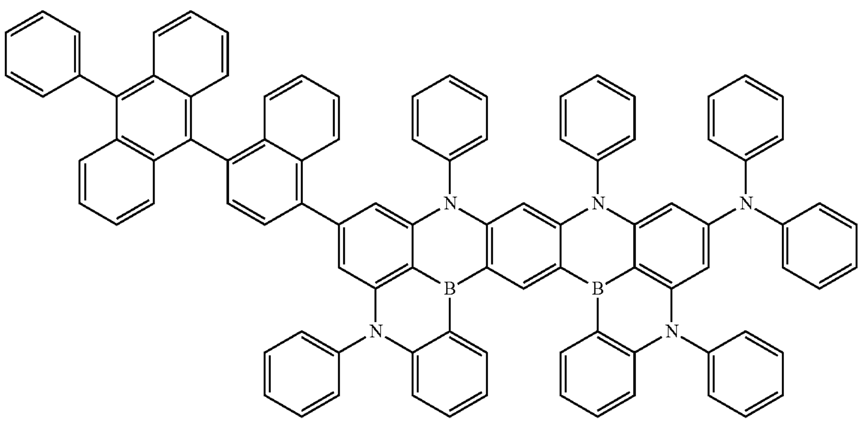
133
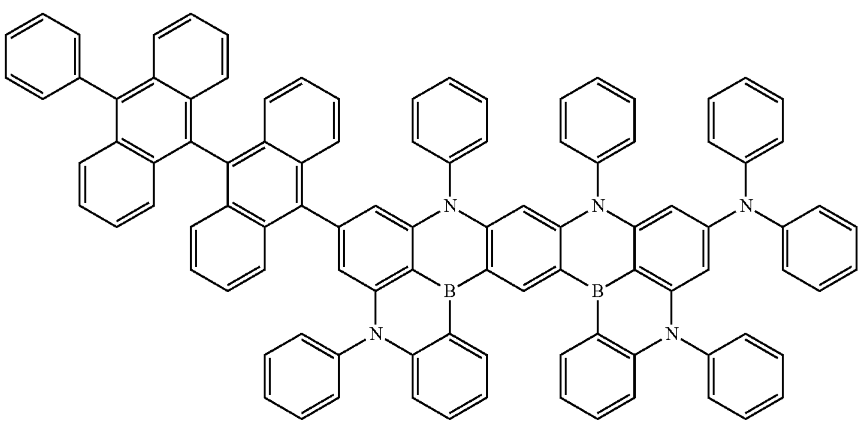
134
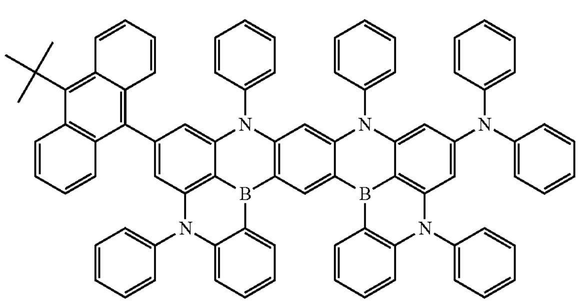
135
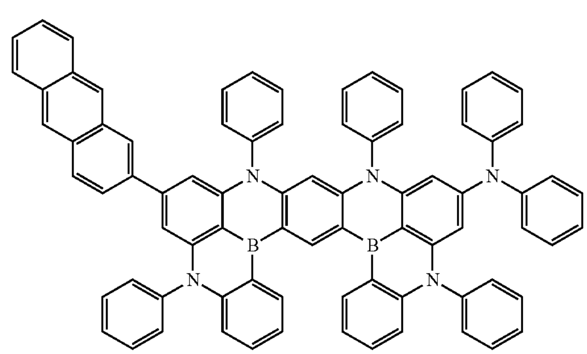

-continued
136
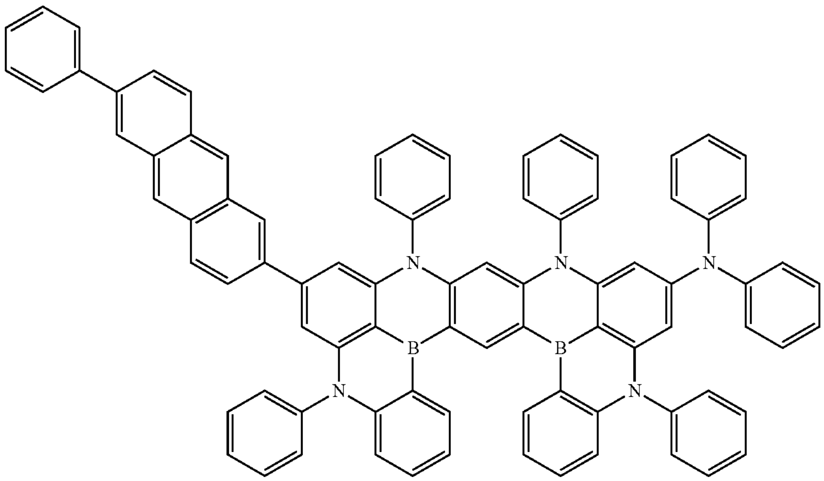
137
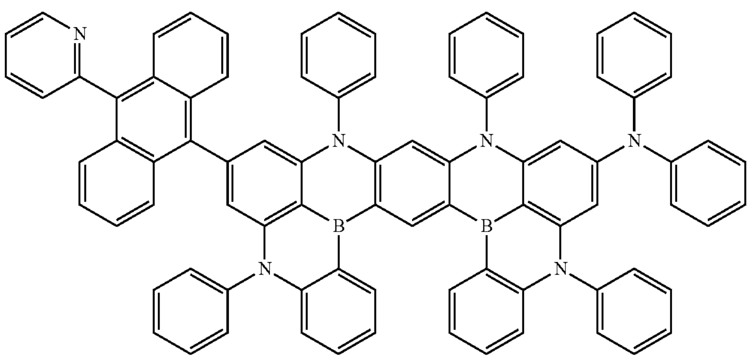
138
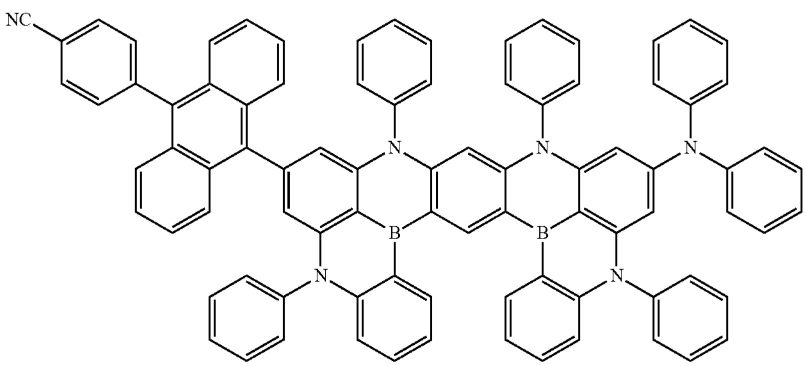
139
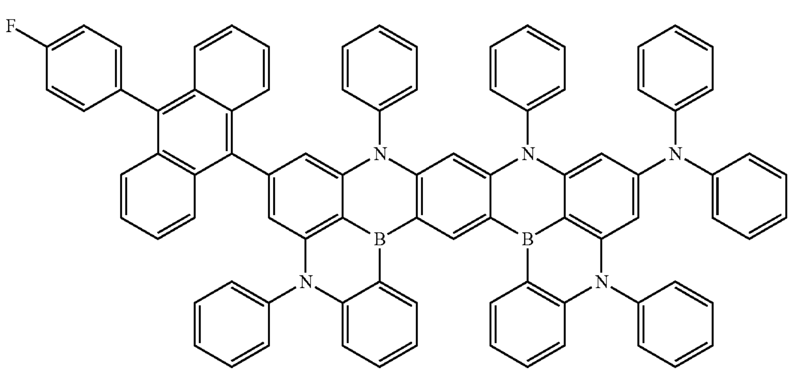

-continued

140

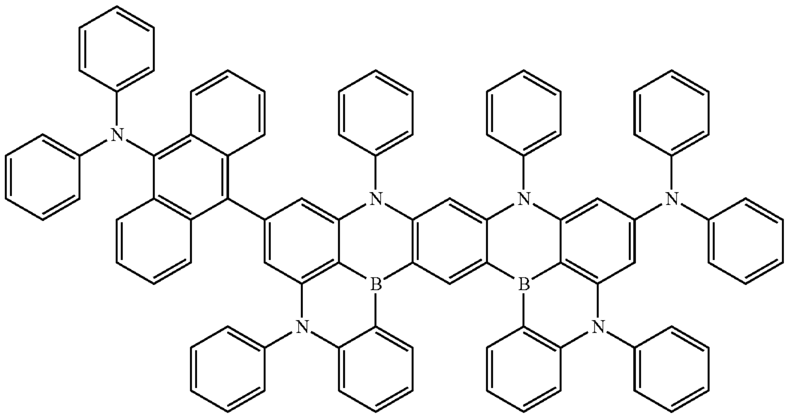

BRIEF DESCRIPTION OF THE DRAWINGS

The accompanying drawings are included to provide a further understanding of the subject matter of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
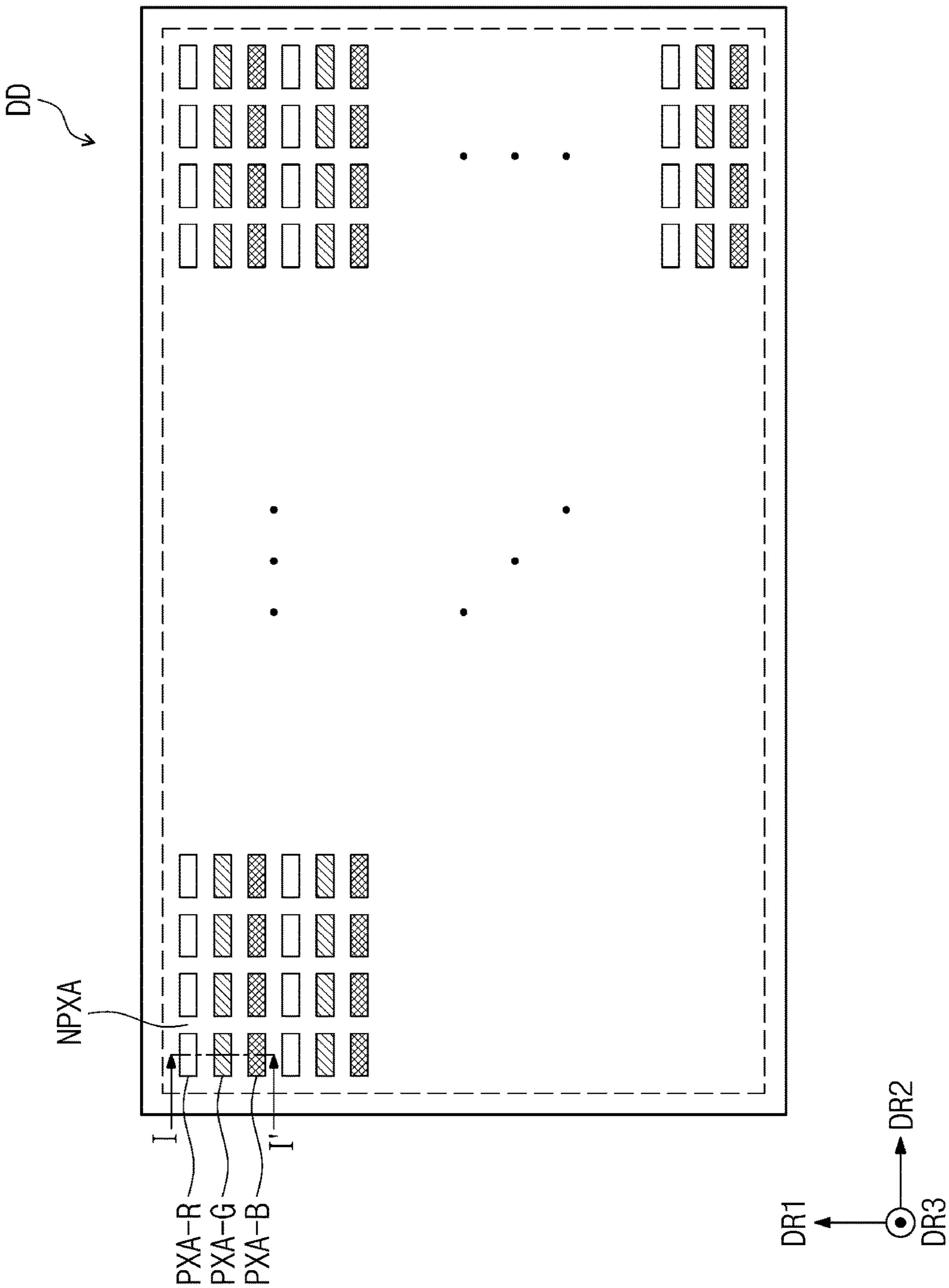
FIG. 1 is a plan view illustrating a display apparatus according to an embodiment of the present disclosure.

The subject matter of the present disclosure may be modified in many alternate forms, and thus specific embodiments will be shown in the drawings and described in more detail. It should be understood, however, that it is not intended to limit the present disclosure to the particular forms disclosed, but rather, is intended to cover all modifications, equivalents, and alternatives falling within the spirit and scope of the invention.

When explaining each of the drawings, like reference numbers are used for referring to like elements. In the accompanying drawings, the dimensions of each structure may be exaggeratingly illustrated for clarity of the present disclosure. It will be understood that, although the terms "first," "second," etc. may be used herein to describe various elements, these elements should not be limited by these terms. These terms are only used to distinguish one element from another. For example, a first element may be referred to as a second element, and, similarly, the second element may be referred to as the first element, without departing from the scope of the present disclosure. The terms of a singular form may include plural forms unless the context clearly indicates otherwise.

In the present application, it will be understood that the terms such as "comprise" or "have" specifies the presence of a feature, a fixed number, a step, a process, an element, a component, or a combination thereof disclosed in the specification, but does not exclude the possibility of presence or addition of one or more other features, fixed numbers, steps, processes, elements, components, or combination thereof.

In the present application, when a layer, a film, a region, or a plate is referred to as being "above" or "in an upper portion" of another layer, film, region, or plate, it can be not only directly on the layer, film, region, or plate, but intervening layers, films, regions, or plates may also be present. On the contrary to this, when a layer, a film, a region, or a plate is referred to as being "below," "in a lower portion of" another layer, film, region, or plate, it can be not only directly under the layer, film, region, or plate, but intervening layers, films, regions, or plates may also be present. In addition, it will be understood that when a layer, a film, a region, or a plate is referred to as being "on" another layer, film, region, or plate, it can be not only located on the layer, film, region, or plate, but also located under the layer, film, region, or plate.

In the specification, the term "substituted or unsubstituted" may refer to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents described may be substituted or unsubstituted. For example, a biphenyl group may be interpreted as an aryl group or a phenyl group substituted with a phenyl group.

In the specification, the phrase "bonded to an adjacent group to form a ring" may indicate that the group is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed through adjacent groups being bonded to each other may be connected to another ring to form a spiro structure.

In the specification, the term "adjacent group" may refer to a substituent substituted at an atom which is directly bonded to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. In addition, two methyl groups in 4,5-dimethylphenanthrene may be interpreted as "adjacent groups" to each other.

In the specification, examples of the halogen atom may include a fluorine atom, a chlorine atom, a bromine atom, or an iodine atom.

In the specification, the alkyl group may be a linear, branched or cyclic type (e.g., a linear alkyl group, a branched alkyl group, or a cyclic alkyl group). The number of carbon atoms in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the embodiment of the present disclosure is not limited thereto.

The term "hydrocarbon ring group" as used herein may refer to any functional group or substituent derived from an aliphatic hydrocarbon ring. The hydrocarbon ring group may be a saturated hydrocarbon ring group having 5 to 20 ring-forming carbon atoms.

The term "aryl group" as used herein may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but the embodiment of the present disclosure is not limited thereto.

In the specification, the fluorenyl group may be substituted, and two substituents may be bonded to each other to form a spiro structure. Examples of cases where the fluorenyl group is substituted are as follows. However, the embodiment of the present disclosure is not limited thereto

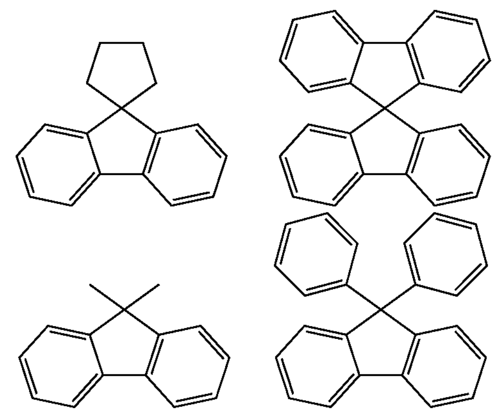

The term "heterocyclic group" as used herein may refer to any functional group or substituent derived from a ring including at least one of B, O, N, P, Si, or Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the specification, the heterocyclic group may include at least one of B, O, N, P, Si or S as a heteroatom. If the heterocyclic group includes two or more heteroatoms, the two or more heteroatoms may be the same as or different from each other. The heterocyclic group may be a monocyclic heterocyclic group or a polycyclic heterocyclic group and has the concept including a heteroaryl group. The ring-forming carbon number of the heterocyclic group may be 2 to 30, 2 to 20, or 2 to 10.

In the specification, the aliphatic heterocyclic group may include one or more selected from among B, O, N, P, Si, and S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but the embodiment of the present disclosure is not limited thereto.

The term "heteroaryl group" as used herein may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the embodiment of the present disclosure is not limited thereto.

In the specification, the description with respect to the aryl group may be applied to an arylene group except that the arylene group is a divalent group. The explanation on the aforementioned heteroaryl group may be applied to the heteroarylene group except that the heteroarylene group is a divalent group.

In the specification, the silyl group includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, an embodiment of the present disclosure is not limited thereto.

In the specification, the number of carbon atoms in the amino group is not specifically limited, but may be 1 to 30. The amino group may include an alkyl amino group, an aryl amino group, or a heteroaryl amino group. Examples of the amino group include a methylamino group, a dimethylamino group, a phenylamino group, a diphenylamino group, a naphthylamino group, a 9-methyl-anthracenylamino group, a triphenylamino group, etc., but embodiments of the present disclosure are not limited thereto.

In the specification, the number of ring-forming carbon atoms in the carbonyl group may be 1 to 40, 1 to 30, or 1 to 20. For example, the carbonyl group may have the following structures, but the embodiment of the present disclosure is not limited thereto.

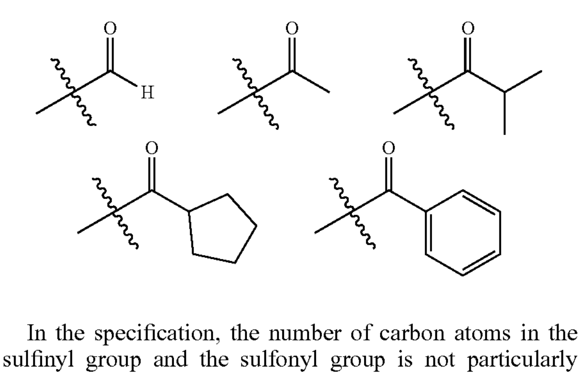

In the specification, the number of carbon atoms in the sulfinyl group and the sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the specification, a thiol group may include an alkylthio group and an arylthio group. The thiol group may refer to that a sulfur atom is bonded to the alkyl group or the aryl group as defined above. Examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but the embodiment of the present disclosure is not limited thereto.

The term "oxy group" as used herein may refer to that an oxygen atom is bonded to the alkyl group or the aryl group as defined above. The oxy group may include an alkoxy group and an aryloxy group. The alkoxy group may be a linear chain, a branched chain or a ring chain. The number of carbon atoms in the alkoxy group is not specifically limited, but may be, for example, 1 to 20 or 1 to 10. Examples of an oxy group include methoxy, ethoxy, n-propoxy, isopropoxy, butoxy, pentyloxy, hexyloxy, octyloxy, nonyloxy, decyloxy, benzyloxy, etc., but the embodiment of the present disclosure is not limited thereto.

The term "boron group" as used herein may refer to that a boron atom is bonded to the alkyl group or the aryl group as defined above. The boron group may include an alkyl boron group and an aryl boron group. Examples of the boron group may include a trimethylboron group, a triethylboron group, a t-butyldimethylboron group, a triphenylboron group, a diphenylboron group, a phenylboron group, etc., but the embodiment of the present disclosure is not limited thereto.

In the specification, the alkenyl group may be linear or branched. The number of carbon atoms in the alkenyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., but the embodiment of the present disclosure is not limited thereto.

In the specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but the embodiment of the present disclosure is not limited thereto.

In the specification, the alkyl group in the alkylthio group, the alkylsulfoxy group, the alkylaryl group, the alkylamino group, the alkyl boron group, the alkyl silyl group, and the alkyl amine group is the same as the examples of the alkyl group described above.

In the specification, the aryl group in the aryloxy group, the arylthio group, the arylsulfoxy group, the arylamino group, the arylboron group, the arylsilyl group, and the arylamine group is the same as the examples of the aryl group described above.

The term "a direct linkage" as used herein may refer to a single bond (e.g., a single covalent bond).

In the specification, "⌇" and "—*" as used herein each represent a position to be connected.

Hereinafter, embodiments of the present disclosure will be described with reference to the accompanying drawings.

Figure 2:
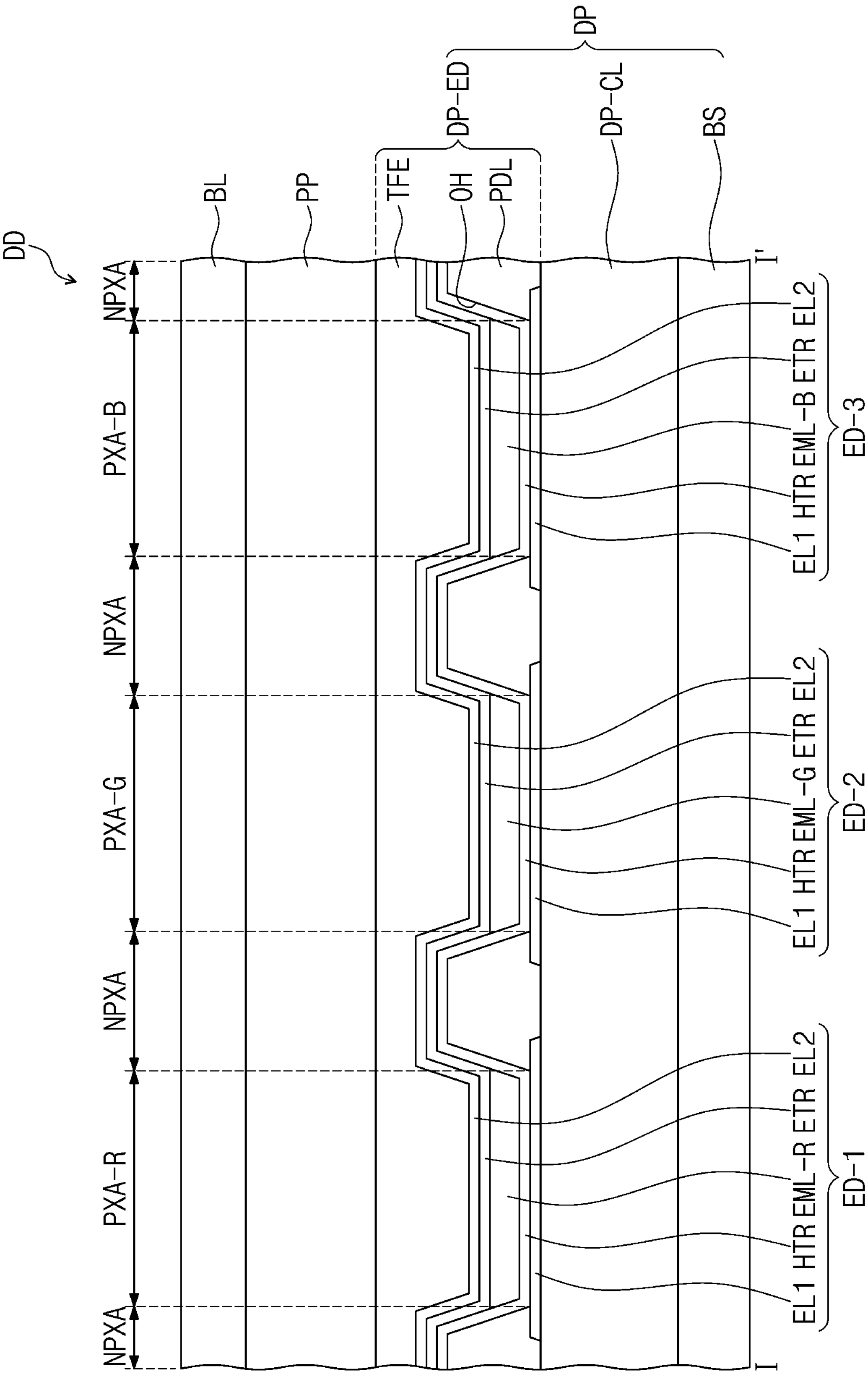
FIG. 2 is a cross-sectional view of a display apparatus according to an embodiment of the present disclosure.

FIG. 1 is a plan view illustrating an embodiment of a display apparatus DD. FIG. 2 is a cross-sectional view of the display apparatus DD of the embodiment. FIG. 2 is a cross-sectional view illustrating a part taken along the line I-I' of FIG. 1.

The display apparatus DD may include a display panel DP and an optical layer PP on the display panel DP. The display panel DP includes luminescence devices (e.g., light emitting devices) ED-1, ED-2, and ED-3. The display apparatus DD may include a plurality of luminescence devices ED-1, ED-2, and ED-3. The optical layer PP may be on the display panel DP and control reflected light in the display panel DP due to external light. The optical layer PP may include, for example, a polarization layer and/or a color filter layer. In one or more embodiments, unlike the view illustrated in the drawing, the optical layer PP may be omitted from the display apparatus DD.

A base substrate BL may be on the optical layer PP. The base substrate BL may be a member which provides a base surface on which the optical layer PP is disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer (e.g., a composite material layer including an inorganic material and an organic material). Also, unlike shown, in an embodiment, the base substrate BL may be omitted.

The display apparatus DD according to an embodiment may further include a filling layer. The filling layer may be between a display device layer DP-ED and the base substrate BL. The filling layer may be an organic material layer. The filling layer may include at least one of an acrylic-based resin, a silicone-based resin, or an epoxy-based resin.

The display panel DP may include a base layer BS, a circuit layer DP-CL provided on the base layer BS, and a display device layer DP-ED. The display device layer DP-ED may include a pixel defining film PDL, the light emitting devices ED-1, ED-2, and ED-3 between portions of the pixel defining film PDL, and an encapsulation layer TFE on the light emitting devices ED-1, ED-2, and ED-3.

The base layer BS may be a member which provides a base surface on which the display device layer DP-ED is disposed. The base layer BS may be a glass substrate, a metal substrate, a plastic substrate, etc. However, the embodiment of the present disclosure is not limited thereto, and the base layer BS may be an inorganic layer, an organic layer, or a composite material layer.

In an embodiment, the circuit layer DP-CL is on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be described in more detail later. Each of the light emitting devices ED-1, ED-2 and ED-3 may include a first electrode EL1, a hole transport region HTR, emission layers EML-R, EML-G and EML-B, an electron transport region ETR, and a second electrode EL2.

FIG. 2 illustrates an embodiment in which the emission layers EML-R, EML-G, and EML-B of the light emitting devices ED-1, ED-2, and ED-3 are in the openings OH defined in the pixel defining film PDL, and the hole transport region HTR, the electron transport region ETR, and the second electrode EL2 are provided as a common layer in the entire light emitting devices ED-1, ED-2, and ED-3. However, the embodiment of the present disclosure is not limited thereto, and unlike the feature illustrated in FIG. 2, the hole transport region HTR and the electron transport region ETR in an embodiment may be provided by being patterned inside the opening hole OH defined in the pixel defining film PDL. For example, the hole transport region HTR, the emission layers EML-R, EML-G, and EML-B, and the electron transport region ETR of the light emitting devices ED-1, ED-2, and ED-3 in an embodiment may be patterned (e.g., provided into one or more patterns) utilizing in an inkjet printing method.

The encapsulation layer TFE may cover the light emitting devices ED-1, ED-2 and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects the display device layer DP-ED from moisture/oxygen, and the encapsulation-organic film protects the display device layer DP-ED from foreign substances such as dust particles. The encapsulation-inorganic film may include silicon nitride, silicon oxynitride, silicon oxide, titanium oxide, aluminum oxide, and/or the like, but the embodiment of the present disclosure is not particularly limited thereto. The encapsulation-organic film may include an acrylic-based compound, an epoxy-based compound, and/or the like. The encapsulation-organic film may include a photopolymerizable organic material, but the embodiment of the present disclosure is not particularly limited thereto.

The encapsulation layer TFE may be on the second electrode EL2 and may fill the opening hole OH.

Referring to FIGS. 1 and 2, the display apparatus DD may include a non-light emitting region NPXA and light emitting regions PXA-R, PXA-G and PXA-B. The light emitting regions PXA-R, PXA-G and PXA-B each may be a region which emits light generated from the light emitting devices ED-1, ED-2 and ED-3, respectively. The light emitting regions PXA-R, PXA-G, and PXA-B may be spaced apart from each other in a plan view (e.g., on a plane).

Each of the light emitting regions PXA-R, PXA-G, and PXA-B may be a region divided by pixel defining film PDL. The non-light emitting regions NPXA may be regions between the adjacent light emitting regions PXA-R, PXA-G, and PXA-B, which correspond to portions of the pixel defining film PDL. In one or more embodiments, in the specification, each of the light emitting regions PXA-R, PXA-G, and PXA-B may correspond to a pixel. The pixel defining film PDL may separate the light emitting devices ED-1, ED-2, and ED-3. The emission layers EML-R, EML-G and EML-B of the light emitting devices ED-1, ED-2 and ED-3 may be in openings OH defined by the pixel defining film PDL and separated from each other.

The light emitting regions PXA-R, PXA-G and PXA-B may be divided into a plurality of groups according to the color of light generated from the plurality of light emitting devices ED-1, ED-2 and ED-3. In the display apparatus DD of an embodiment shown in FIGS. 1 and 2, three light emitting regions PXA-R, PXA-G, and PXA-B which emit red light, green light, and blue light, respectively, are illustrated as examples. For example, the display apparatus DD of an embodiment may include the red light emitting region PXA-R, the green light emitting region PXA-G, and the blue light emitting region PXA-B, which are different from one another.

In the display apparatus DD according to an embodiment, the plurality of light emitting devices ED-1, ED-2 and ED-3 may emit light in different wavelength regions. For example, in an embodiment, the display apparatus DD may include the first light emitting device ED-1 that emits red light, the second light emitting device ED-2 that emits green light, and the third light emitting device ED-3 that emits blue light. That is, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, the embodiment of the present disclosure is not limited thereto, and the first to the third light emitting devices ED-1, ED-2, and ED-3 may emit light in the same wavelength range or at least one light emitting device may emit light in a wavelength range different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the plurality of red light emitting regions PXA-R may be arranged with each other along a second directional axis DR2, the plurality of green light emitting regions PXA-G may be arranged with each other along the second directional axis DR2, and the plurality of blue light emitting regions PXA-B may be arranged with each other along a second directional axis DR2. In addition, a red light emitting region PXA-R, a green light emitting region PXA-G, and a blue light emitting region PXA-B may be alternately arranged in this order along a first directional axis DR1.

FIGS. 1 and 2 illustrate that all the light emitting regions PXA-R, PXA-G, and PXA-B have similar area, but the embodiment of the present disclosure is not limited thereto, and the light emitting regions PXA-R, PXA-G, and PXA-B may have different areas from each other according to a wavelength range of the emitted light. In one or more embodiments, the areas of the light emitting regions PXA-R, PXA-G, and PXA-B may refer to areas in a plan view (e.g., when viewed in or on a plane defined by the first directional axis DR1 and the second directional axis DR2).

In one or more embodiments, the arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously suitably combined and provided according to characteristics of a display quality required in the display apparatus DD. For example, the arrangement form of the light emitting regions PXA-R, PXA-G, and PXA-B may be a PENTILE® arrangement form (e.g., an RGBG matrix, RGBG structure, or RGBG matrix structure) or a diamond arrangement form. PENTILE® is a duly registered trademark of Samsung Display Co., Ltd.

In addition, the areas of the light emitting regions PXA-R, PXA-G, and PXA-B may be different from each other. For example, in an embodiment, the area of the green light emitting region PXA-G may be smaller than that of the blue light emitting region PXA-B, but the embodiment of the present disclosure is not limited thereto.

Hereinafter, FIGS. 3 to 6 are cross-sectional views schematically illustrating luminescence devices (light emitting devices) according to an embodiment. The light emitting devices ED according to embodiments may each include a first electrode EL1, a hole transport region HTR, an emission layer EML, an electron transport region ETR, and a second electrode EL2 that are sequentially stacked.

Figure 3:
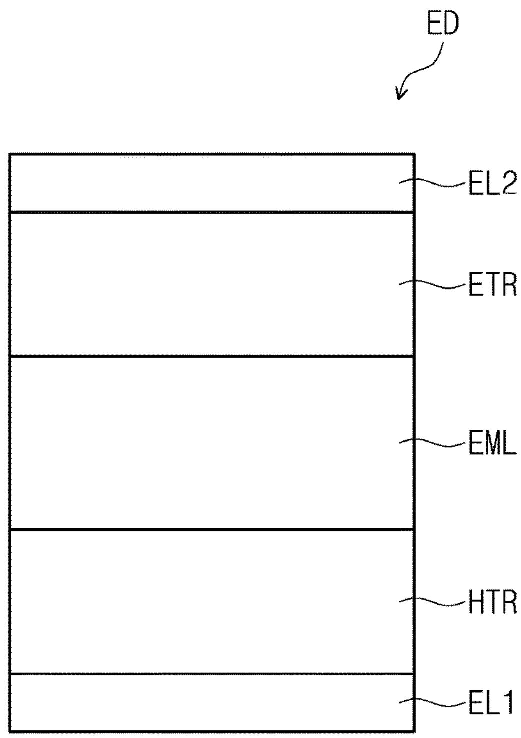
FIG. 3 is a cross-sectional view schematically illustrating a light emitting device according to an embodiment of the present disclosure.
Figure 4:
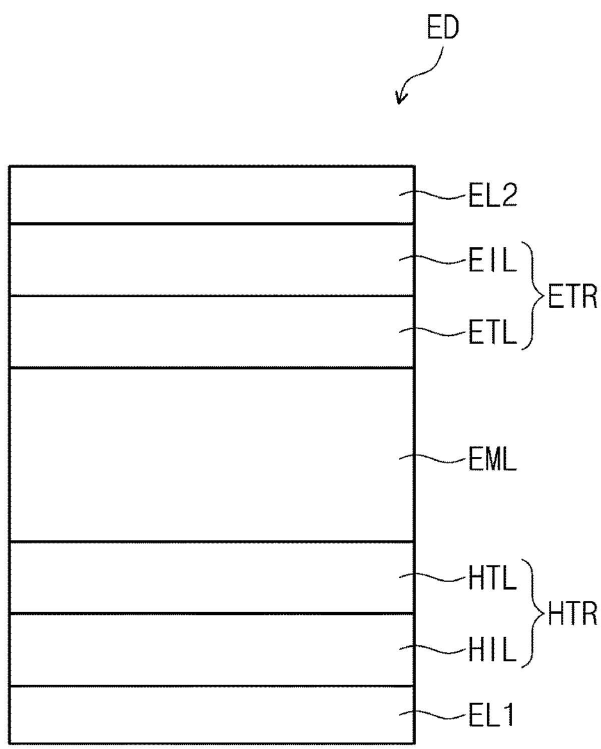
FIG. 4 is a cross-sectional view schematically illustrating a light emitting device according to an embodiment of the present disclosure.
Figure 5:
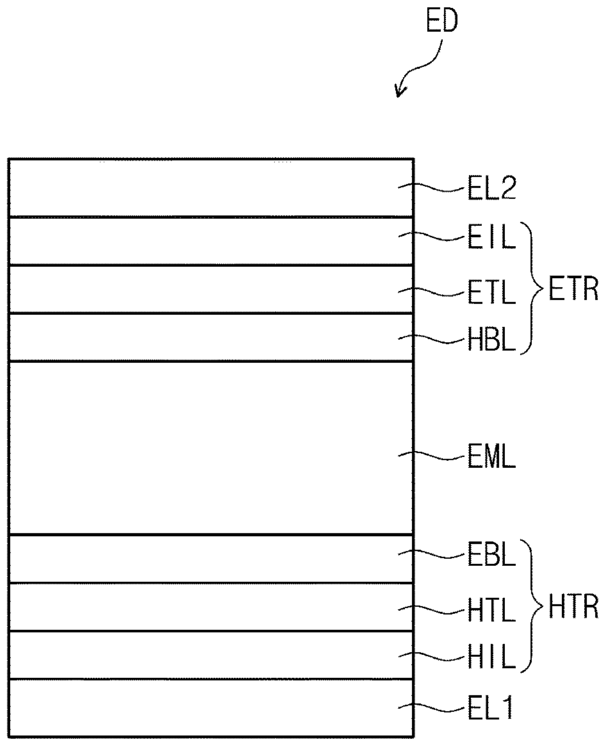
FIG. 5 is a cross-sectional view schematically illustrating a light emitting device according to an embodiment of the present disclosure.
Figure 6:
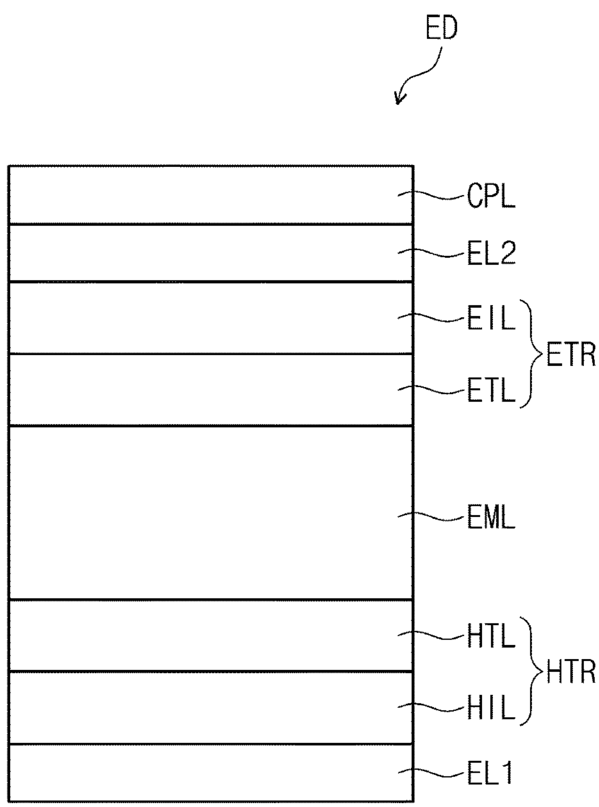
FIG. 6 is a cross-sectional view schematically illustrating a light emitting device according to an embodiment of the present disclosure.

Compared to FIG. 3, FIG. 4 illustrates a cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. In addition, compared to FIG. 3, FIG. 5 illustrates a cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of a light emitting device ED of an embodiment including a capping layer CPL on a second electrode EL2.

The first electrode EL1 has conductivity (e.g., electrical conductivity). The first electrode EL1 may be formed of a metal material, a metal alloy, and/or a conductive compound. The first electrode EL1 may be an anode or a cathode. However, the embodiment of the present disclosure is not limited thereto. In addition, the first electrode EL1 may be a pixel electrode. The first electrode EL1 may be a transmissive electrode, a transflective electrode, or a reflective electrode. If the first electrode EU is the transmissive electrode, the first electrode EL1 may be formed utilizing a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EU may include Ag, Mg, Cu, Al, Pt, Pd, Au, Ni, Nd, Ir, Cr, Li, Ca, LiF/Ca, LiF/Al, Mo, Ti, W, In, Sn, Zn, a compound thereof, or a mixture thereof (e.g., a mixture of Ag and Mg). In one or more embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but the embodiment of the present disclosure is not limited thereto. In addition, the embodiment of the present disclosure is not limited thereto, and the first electrode EL1 may include the above-described metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer, an emission-auxiliary layer, or an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, and may have a single layer structure formed of a hole injection material and a hole transport material. In addition, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but the embodiment of the present disclosure is not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below:

Formula H-1

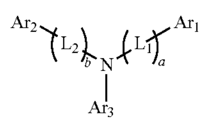

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. In one or more embodiments, when a or b is an integer of 2 or greater, a plurality of $L_1$'s and $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 may be a monoamine compound. In one or more embodiments, the compound represented by Formula H-1 may be a diamine compound in which at least one selected from among $Ar_1$ to $Ar_3$ includes the amine group as a substituent. In addition, the compound represented by Formula H-1 may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any compound of Compound Group H below. However, the compounds listed in Compound Group H below are examples, and the compounds represented by Formula H-1 are not limited to those represented by Compound Group H below:

Compound Group H

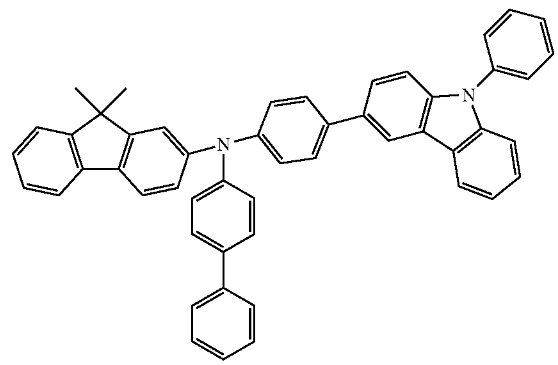

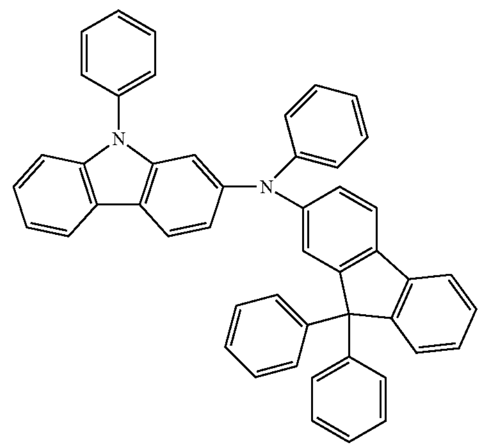

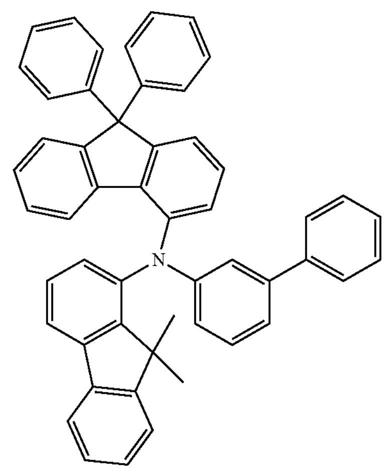

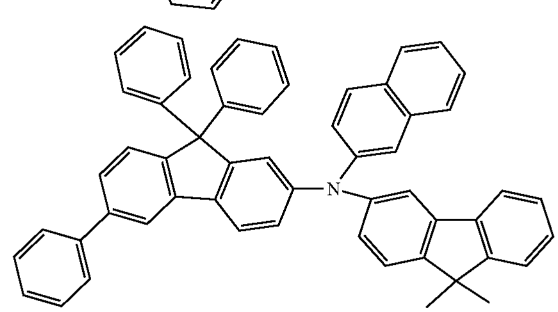

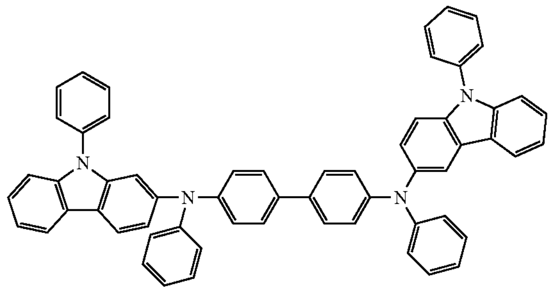
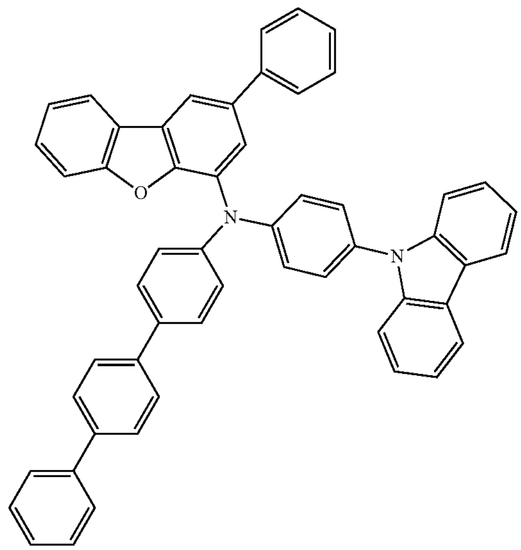
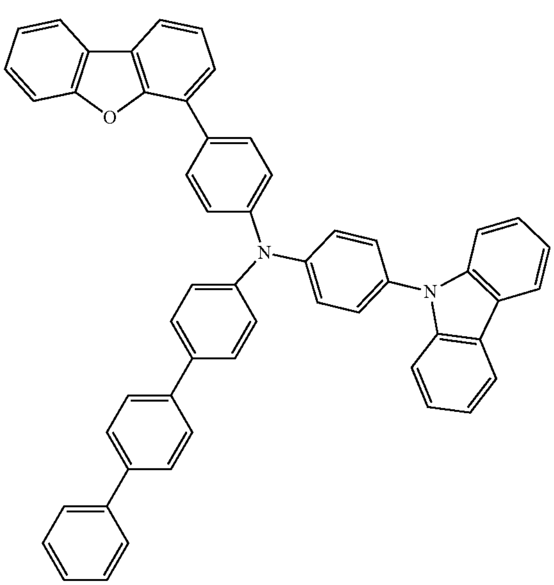
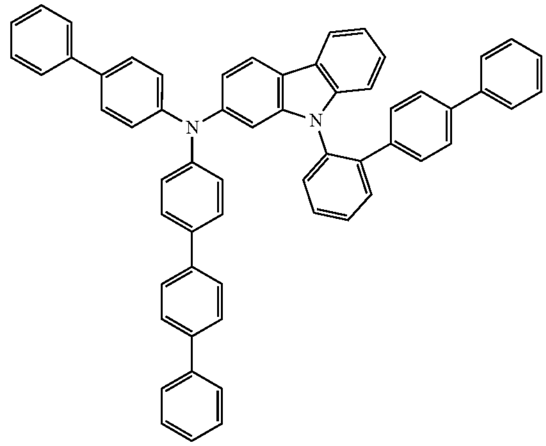
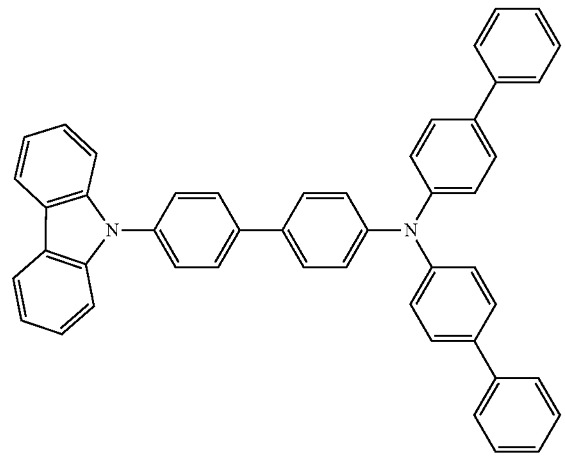
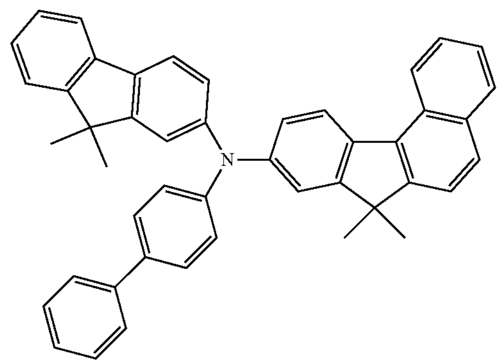
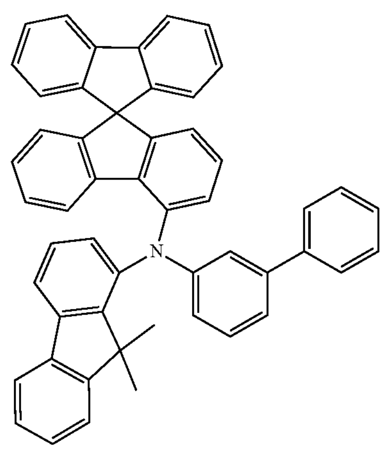

-continued

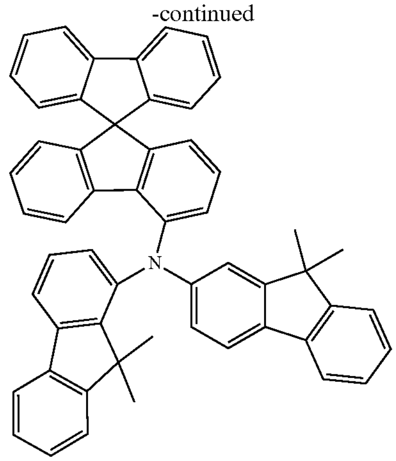

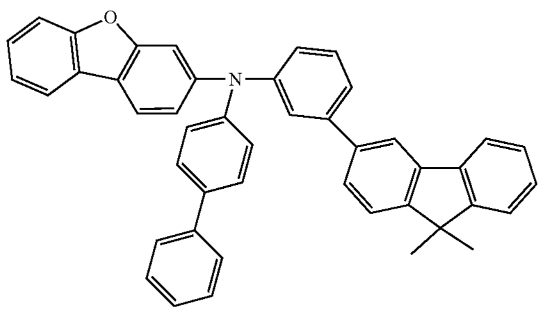

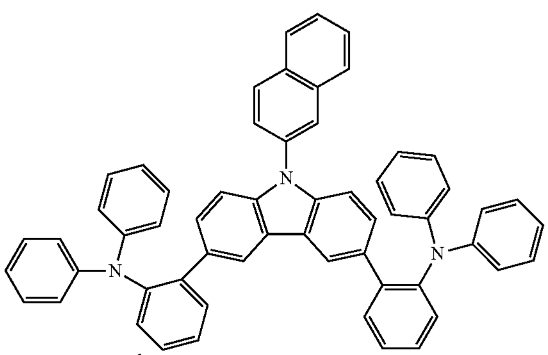

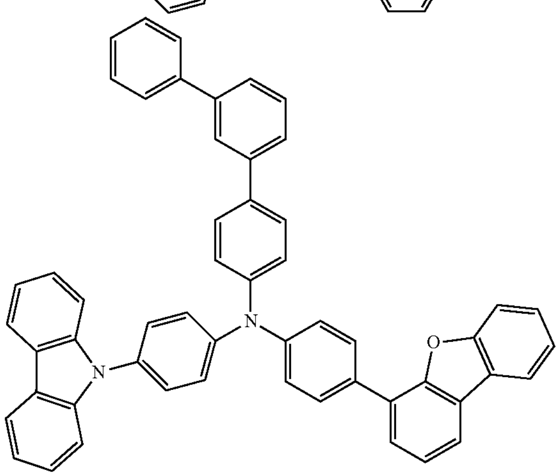

-continued

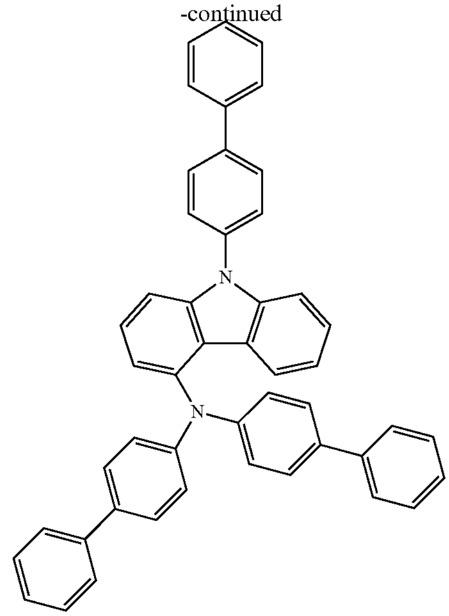

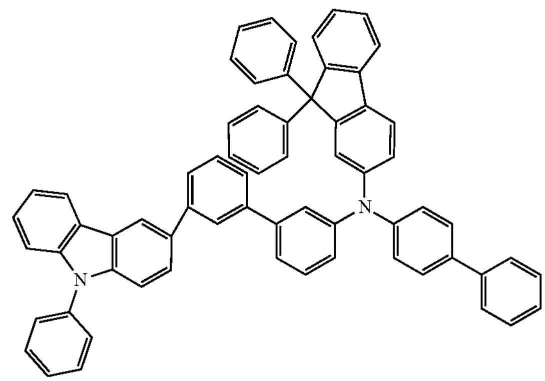

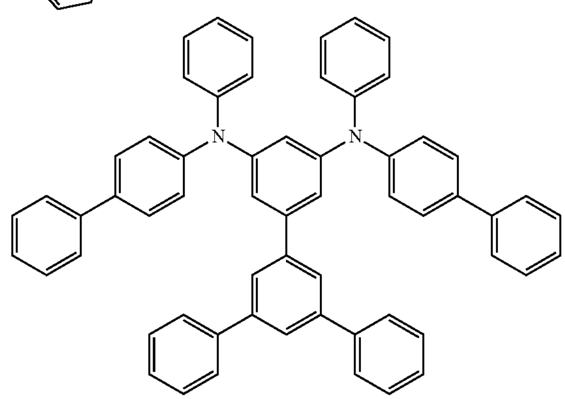

The hole transport region HTR may include a phthalocyanine compound (such as copper phthalocyanine), $N^1$,$N^1$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl) triphenylamine (TCTA)), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N-(3-tolyl)amino]-3,3'-dimethylbiphenyl (HMTPD), 1,3-bis (N-carbazolyl)benzene (mCP), etc.

In addition, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compound of the hole transport region in at least one of a hole injection layer HIL, a hole transport layer HTL, or an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. If the thicknesses of the hole transport region HTR, the hole injection layer HIL, the hole transport layer HTL and the electron blocking layer EBL satisfy the above-described ranges, satisfactory hole transport characteristics may be achieved without a substantial increase in a driving voltage.

The hole transport region HTR may further include a charge generating material in addition to the above-described materials to increase conductivity (e.g., electrical conductivity). The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but the embodiment of the present disclosure is not limited thereto. For example, the p-dopant may include metal halides (such as CuI and/or RbI), quinone derivatives (such as tetracyanoquinodimethane (TCNQ) and/or 2,3,5,6-tetrafluoro-7,7',8,8'-tetracyanoquinodimethane (F4-TCNQ)), metal oxides (such as tungsten oxide and/or molybdenum oxide), dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cya nomethyl]-2,3,5,6-tetrafluorobenzonitrile, etc., but the embodiment of the present disclosure is not limited thereto.

As described above, the hole transport region HTR may further include at least one of the buffer layer or the electron blocking layer EBL in addition to the hole injection layer HIL and the hole transport layer HTL. The buffer layer may compensate a resonance distance according to the wavelength of light emitted from the emission layer EML and may thus increase light emission efficiency. Materials which may be included in the hole transport region HTR may be utilized as materials to be included in the buffer layer. The electron blocking layer EBL is a layer that serves to prevent or reduce injection of electrons from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML in the light emitting device ED of an embodiment may include a polycyclic compound represented by Formula 1 below:

Formula 1

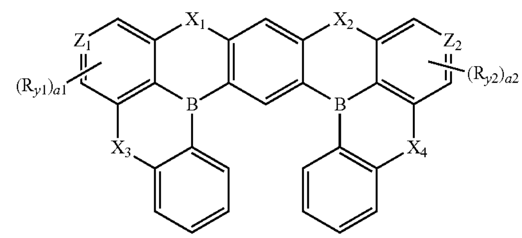

The compound represented by Formula 1 may be include at least one anthracene derivative represented by Formula A below:

Formula A

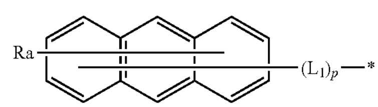

In Formula A, Ra may be a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms. For example, in an embodiment, Ra may be an unsubstituted phenyl group or an unsubstituted anthracenyl group, but the embodiment of the present disclosure is not limited thereto.

$L_1$ may be a substituted or unsubstituted arylene group having 6 to 30 ring-forming carbon atoms, a substituted or unsubstituted heteroarylene group having 2 to 30 ring-forming carbon atoms, or a substituted or unsubstituted amine group. p may be 0 or 1. When p is 0, the anthracene derivative may be directly bonded to a scaffold, and when p is 1, the anthracene derivative may be bonded to the scaffold via $L_1$.

In an embodiment, Formula A may be represented by any one selected from among Formula A-1 to Formula A-4 below:

Formula A-1

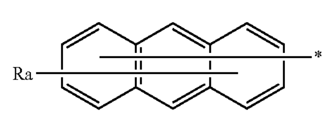

-continued

Formula A-2

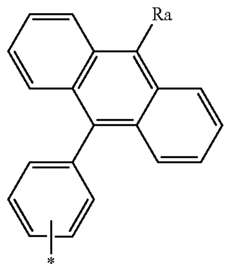

Formula A-3

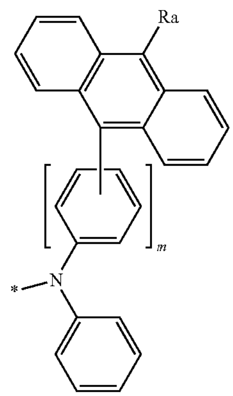

Formula A-4

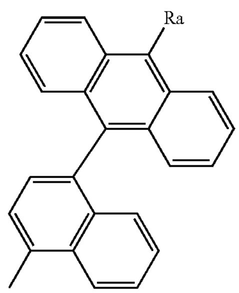

Formula A-1 is the case where p is 0. Formula A-2 is the case where p is 1 and $L_1$ is a phenylene group. Formula A-3 is the case where p is 1 and $L_1$ is

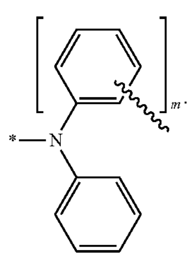

Formula A-4 is the case where p is 1 and $L_1$ is

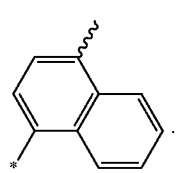

In Formula A-3, m is 0 or 1, and  is a position at which the anthracene derivative is substituted.

Formula A-1 may be represented by Formula AA-1 or Formula AA-2 below:

Formula AA-1

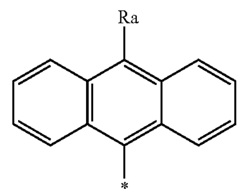

Formula AA-2

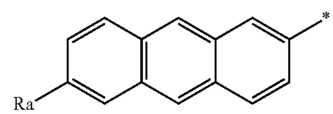

Formula AA-1 is the case where in Formula A-1, the position at which the anthracene is bonded to a scaffold is a benzene ring present at the intermediate position of the anthracene and the position at which Ra is substituted is the benzene ring present at the intermediate position of the anthracene. Formula AA-2 is the case where in Formula A-1, the position at which the anthracene is bonded to a scaffold is a benzene ring present at the one side position of the anthracene and the position at which Ra is substituted is the benzene ring present at the other side position of the anthracene. In Formula AA-1 and Formula AA-2, Ra is the same as defined in connection with Formula 1 above.

Formula A-2 may be represented by any one selected from among Formula B-1 to Formula B-3 below.

Formula B-1

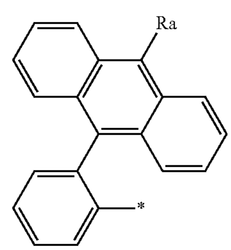

Formula B-2

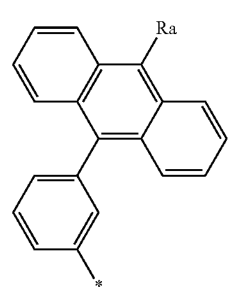

-continued

Formula B-3

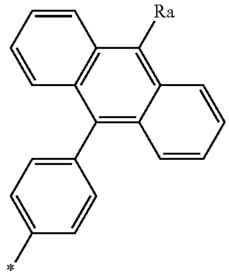

Formula B-1 is the case where in Formula A-2,

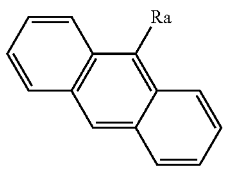

substituted at the phenylene group is present at the ortho-position with respect to the scaffold. Formula B-2 is the case where in Formula A-2,

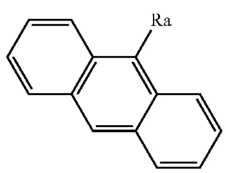

substituted at the phenylene group is present at the meta-position with respect to the scaffold. Formula B-3 is the case where in Formula A-2,

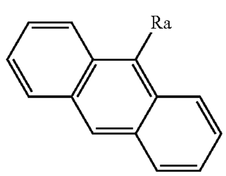

substituted at the phenylene group is present at the para-position with respect to the scaffold.

Formula A-3 may be represented by Formula C-1 or Formula C-2 below:

Formula C-1

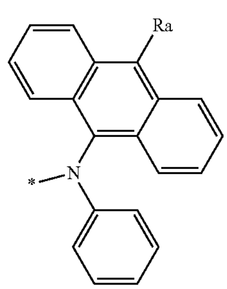

-continued

Formula C-2

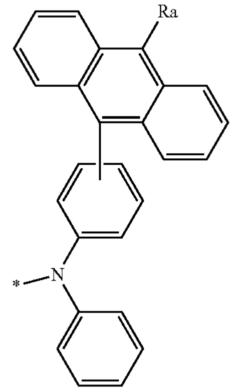

Formula C-1 is the case where in Formula A-3, m is 0 and

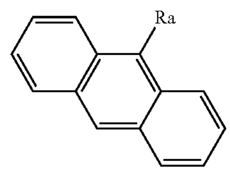

is directly bonded to the nitrogen atom of the amine. Formula C-2 is the case where in Formula A-3, m is 1 and

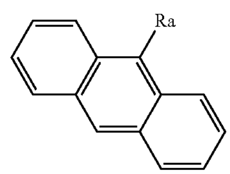

is bonded to the phenylene group which is bonded to the nitrogen atom of the amine.

In Formula 1, $X_1$ to $X_4$ may be each independently O, S, Se, or $NR_1$, and $Z_1$ and $Z_2$ may be each independently $CR_2$. $R_1$ and $R_2$ may be each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkenyl group having 2 to 20 carbon atoms, a substituted or unsubstituted oxy group, a substituted or unsubstituted aryl group having 6 to 30 ring-forming carbon atoms, a substituted or unsubstituted heteroaryl group having 2 to 30 ring-forming carbon atoms, a substituted or unsubstituted thio group, or the moiety represented by Formula A, and/or may be bonded to an adjacent group to form a ring, wherein at least one selected from among $X_1$ to $X_4$, $Z_1$ and $Z_2$ includes the moiety represented by Formula A.

a1 and a2 may be each independently an integer of 0 to 2, and $R_{y1}$ and $R_{y2}$ may be each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkenyl group having 2 to 20 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms.

When a1 is 0, $R_{y1}$ is unsubstituted at the benzene ring containing $Z_1$, and when a2 is 0, $R_{y2}$ is unsubstituted at the benzene ring containing $Z_2$. When a1 is 1, one $R_{y1}$ may be substituted at the benzene ring containing $Z_1$, and may be bonded to $R_2$ of adjacent $CR_2$ to form a ring. When a2 is 1, one $R_{y2}$ may be substituted at the benzene ring containing $Z_2$, and may be bonded to $R_2$ of adjacent $CR_2$ to form a ring. When a1 is 2, two $R_{y1}$'s may be substituted at the benzene ring containing $Z_1$, and two $R_{y1}$'s may be bonded to form a ring. When a2 is 2, two $R_{y2}$'s may be substituted at the benzene ring containing $Z_2$, and two $R_{y2}$'s may be bonded to form a ring. However, this is merely an example, but the embodiment of the present disclosure is not limited thereto, and $R_{y1}$ and $R_{y2}$ may be bonded in various suitable ways to form a ring.

The polycyclic compound represented by Formula 1 in an embodiment includes the anthracene group having a low lowest triplet excitation energy, and thus may have a lowest triplet excitation energy ($T_1$) of about 1.8 eV or less. By including the polycyclic compound having a low lowest triplet excitation energy, a service life of the light emitting device may be improved. In an embodiment, the polycyclic compound represented by Formula 1 may emit blue light.

The emission layer EML in the light emitting device ED of an embodiment may include a polycyclic compound represented by Formula 2 below:

In Formula 2 above, n may be an integer of 0 to 8. That is, the polycyclic compound represented by Formula 2 may include at least one

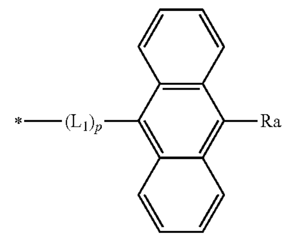

as a substituent, and may include at most eight

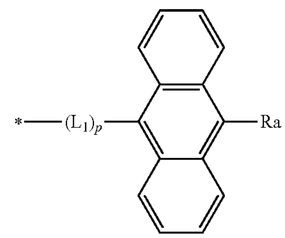

as substituents.

Formula 2

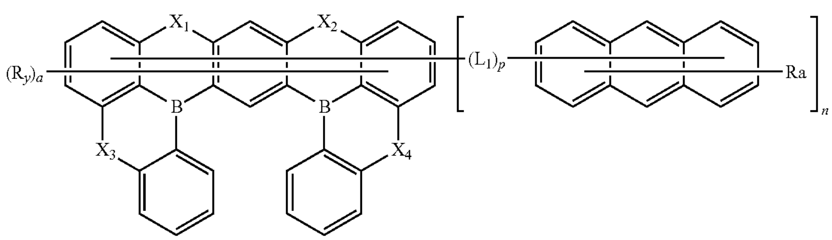

$X_1$ to $X_4$ may be each independently O, S, Se, or $NR_1$, and $R_1$ may be

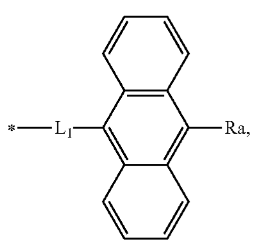

a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms.

When n is 0, at least one selected from among $X_1$ to $X_4$ may be $NR_1$ in which $R_1$ is

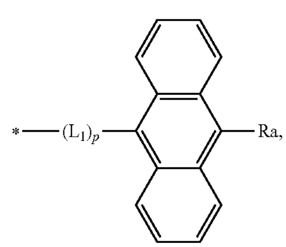

and when in $NR_1$, $R_1$ is not

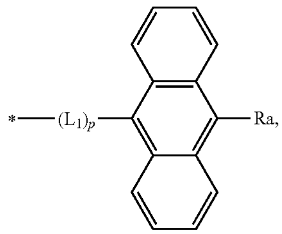

may be an integer of 1 to 8. That is, in one embodiment, n is 0, and at least one selected from among $X_1$ to $X_4$ may be $NR_1$ in which $R_1$ is

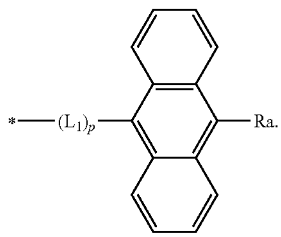

In another embodiment, in $NR_1$, $R_1$ is not

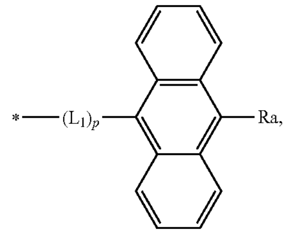

and n may be an integer of 1 to 8.

In Formula 2, $L_1$ may be a substituted or unsubstituted arylene group having 6 to 30 ring-forming carbon atoms, a substituted or unsubstituted heteroarylene group having 2 to 30 ring-forming carbon atoms, or a substituted or unsubstituted divalent amine group. In Formula 2, p may be 0 or 1. When p is 0, the anthracene derivative may be directly bonded to a scaffold, and when p is 1 or more, the anthracene derivative may be bonded to the scaffold with $L_1$ therebetween.

Formula 2 may be represented by any one selected from among Formula 3 to Formula 5 below:

Formula 3

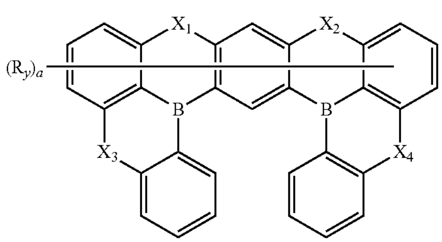

Formula 4

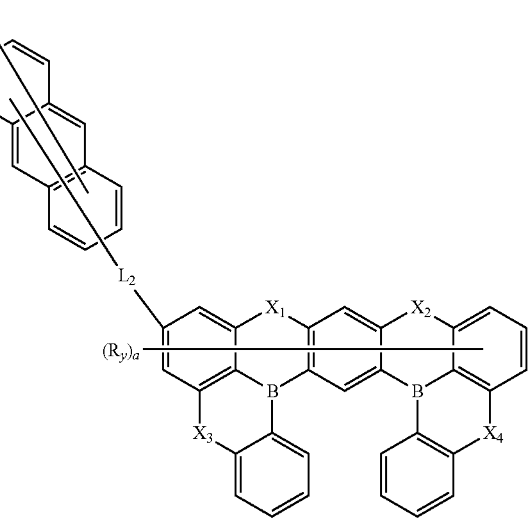

Formula 5

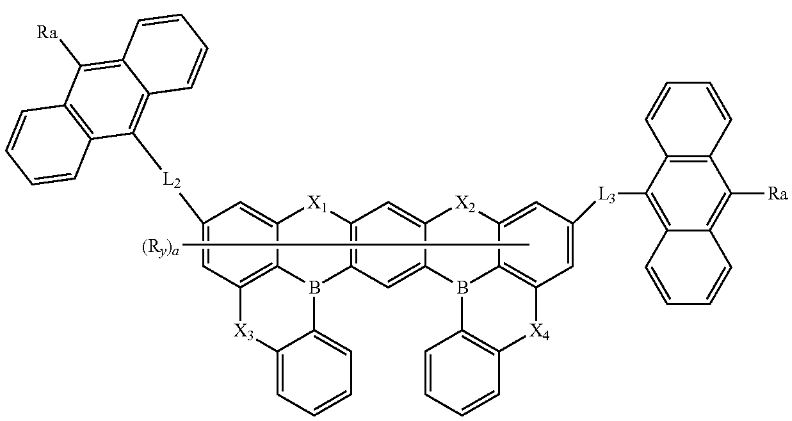

-continued

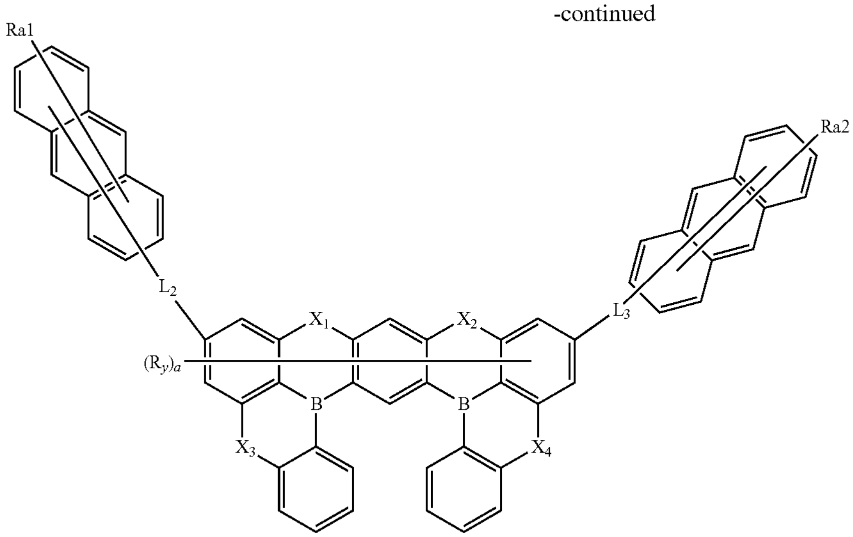

Formula 3 is the case where n is 0 in Formula 2. Formula 4 is the case where n is 1 and p is 1. Formula 5 is the case where n is 2 and p is 1.

In Formula 3, at least one selected from among $X_1$ to $X_4$ may be $NR_1$ in which $R_1$ is

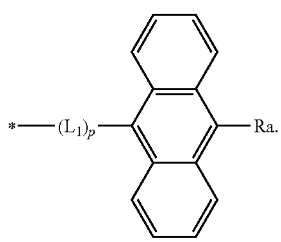

In Formula 4, $L_2$ may be a substituted or unsubstituted arylene group having 6 to 30 ring-forming carbon atoms, a substituted or unsubstituted heteroarylene group having 2 to 30 ring-forming carbon atoms, or a substituted or unsubstituted divalent amine group.

In Formula 5, $L_2$ and $L_3$ may be each independently a substituted or unsubstituted arylene group having 6 to 30 ring-forming carbon atoms, a substituted or unsubstituted heteroarylene group having 2 to 30 ring-forming carbon atoms, or a substituted or unsubstituted divalent amine group.

In Formula 2,

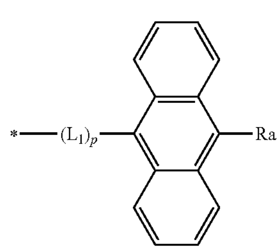

may be represented by one of Formulae 6 to 9 below:

Formula 6

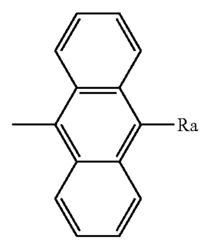

Formula 7

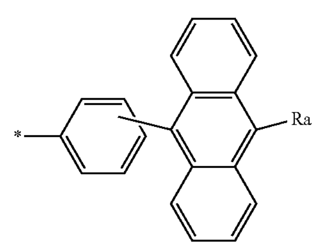

Formula 8

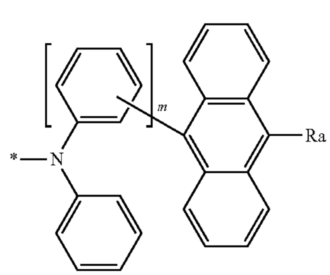

-continued

Formula 9

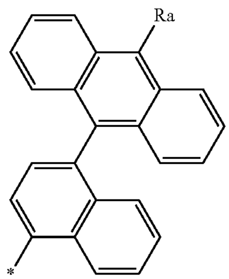

Formula 6 is the case where in

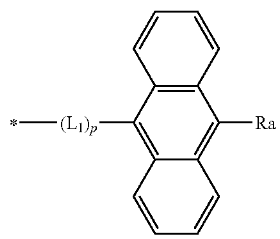

of Formula 2, p is 0, Formula 7 is the case where in

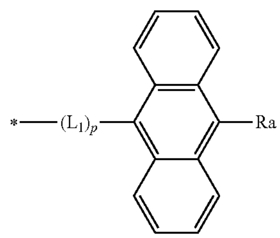

of Formula 2, p is 1 and $L_1$ is a phenylene group, and Formula 8 is the case where in

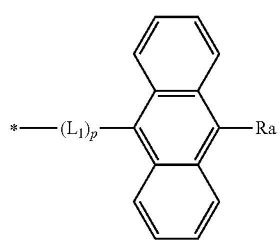

of Formula 2, p is 1 and $L_1$ is

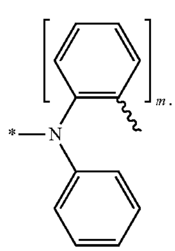

 is a position at which an anthracenyl group is substituted. Formula 9 is the case where p is 1 and $L_1$ is a phenanthrene group. Formula 6 may be represented by Formula 6-1 or Formula 6-2 below:

Formula 6-1

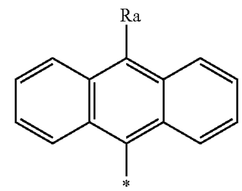

Formula 6-2

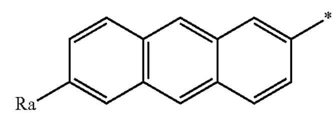

Formula 6-1 is the case where in Formula 6, the benzene ring present at the intermediate position of the anthracene is substituted at the scaffold, and Ra is substituted at the benzene ring present at the intermediate position of the anthracene. Formula 6-2 is the case where in Formula 6, the benzene ring present at the one side position of the anthracene is substituted at the scaffold, and Ra is substituted at the benzene ring present at the other side position of the anthracene. In Formula 6-1 and Formula 6-2, Ra is the same as defined in connection with Formula 1 above.

Formula 7 may be represented by any one selected from among Formula 7-1 to Formula 7-3 below:

Formula 7-1

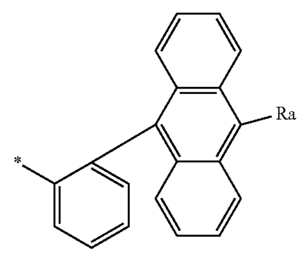

Formula 7-2

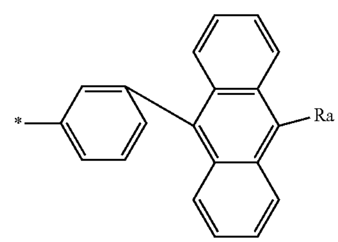

Formula 7-3

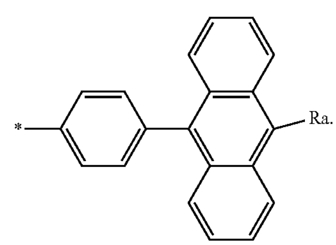

Formula 7-1 is the case where in Formula 7,

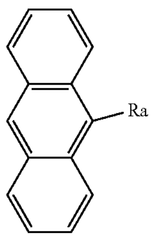

substituted at the phenylene group is present at the ortho-position with respect to the scaffold. Formula 7-2 is the case where in Formula 7,

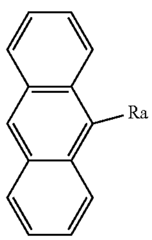

substituted at the phenylene group is present at the meta-position with respect to the scaffold. Formula 7-3 is the case where in Formula 7,

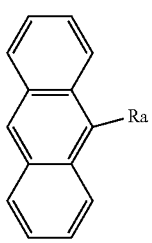

substituted at the phenylene group is present at the para-position with respect to the scaffold.

Formula 8 may be represented by Formula 8-1 or Formula 8-2 below:

Formula 8-1

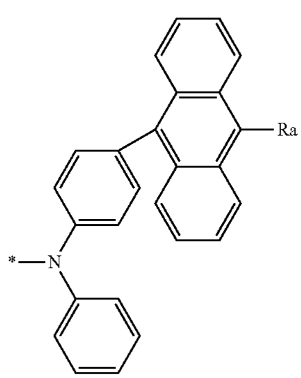

-continued

Formula 8-2

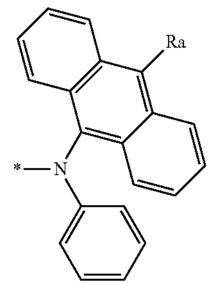

Formula 8-1 is the case where in Formula 8, m is 0 and

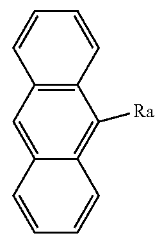

is directly bonded to the nitrogen atom of the amine. Formula 8-2 is the case where in Formula 8, m is 1 and

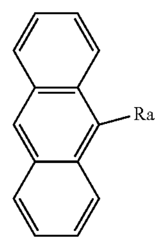

is bonded to the phenylene group which is bonded to the nitrogen atom of the amine.

In Formula 2, $R_y$ and $R_a$ may be each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkenyl group having 2 to 20 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. For example, Ra may be an unsubstituted phenyl group or an unsubstituted naphthyl group, but the embodiment of the present disclosure is not limited thereto. a may be an integer of 0 to 8-n.

The polycyclic compound represented by Formula 2 in an embodiment includes the anthracene having a low lowest triplet excitation energy, and thus may have a lowest triplet excitation energy ($T_1$) of about 1.8 eV or less. By including the polycyclic compound having a low lowest triplet excitation energy, a service life of the light emitting device may be improved.

In an embodiment, the emission layer may include at least one selected from among the compounds represented by Compound Group 1.

Compound Group 1
1
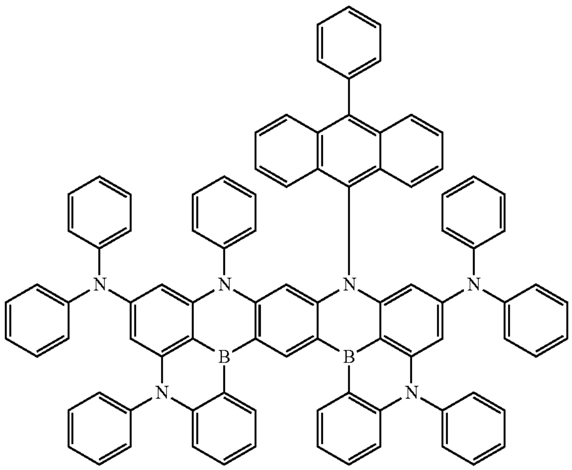
2
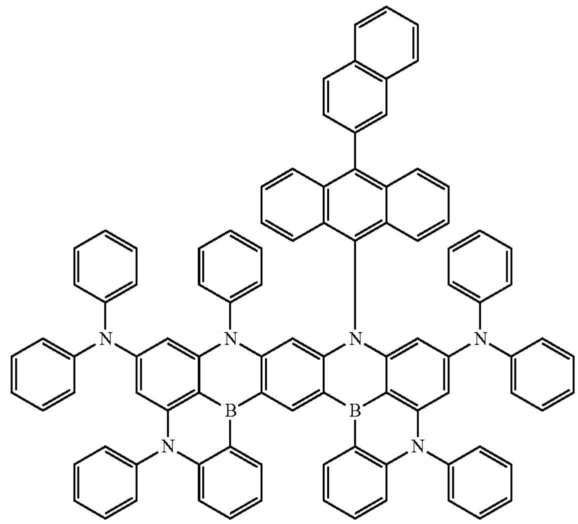
3
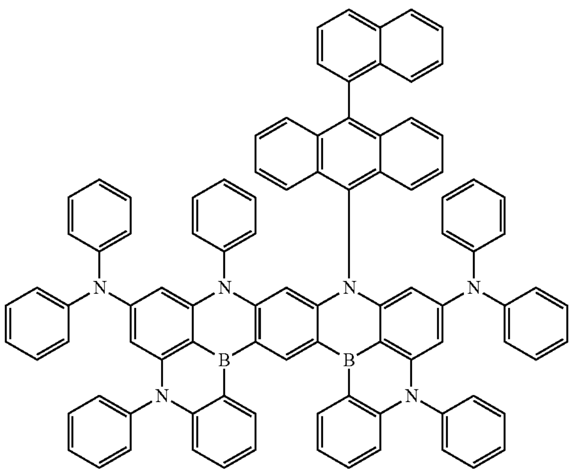
4
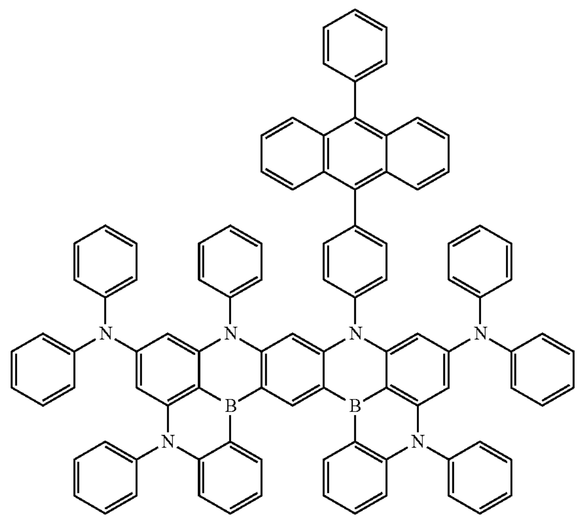
5
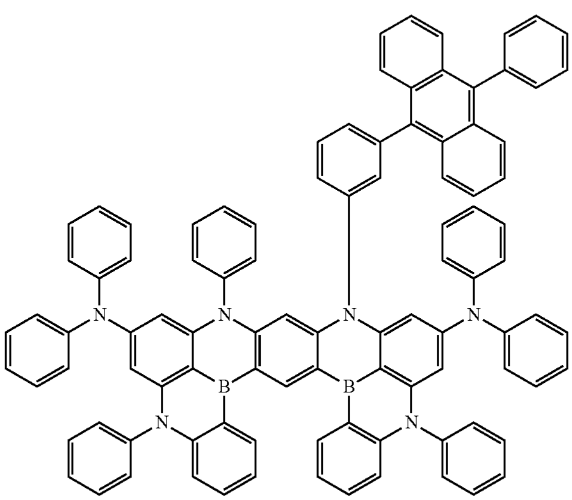
6
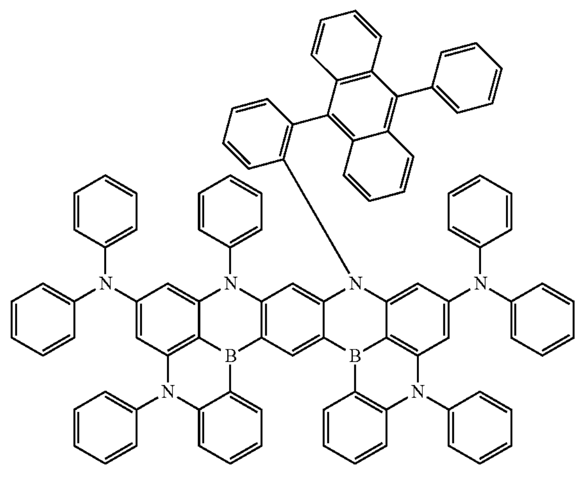

-continued
7
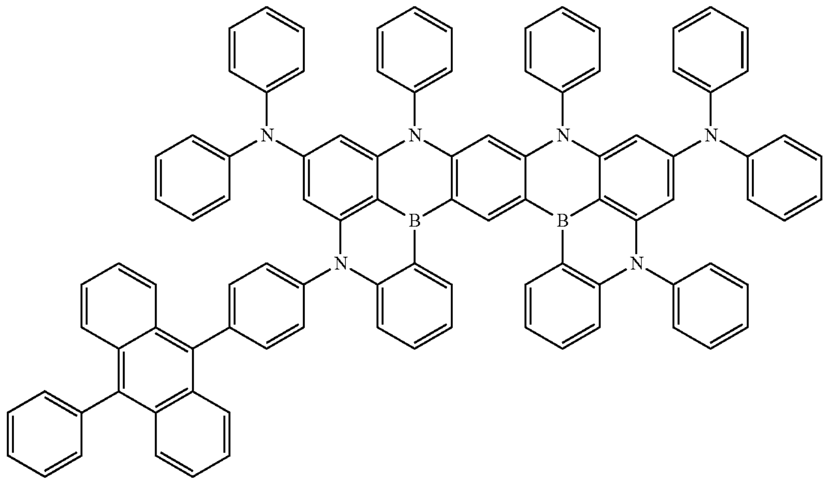
8
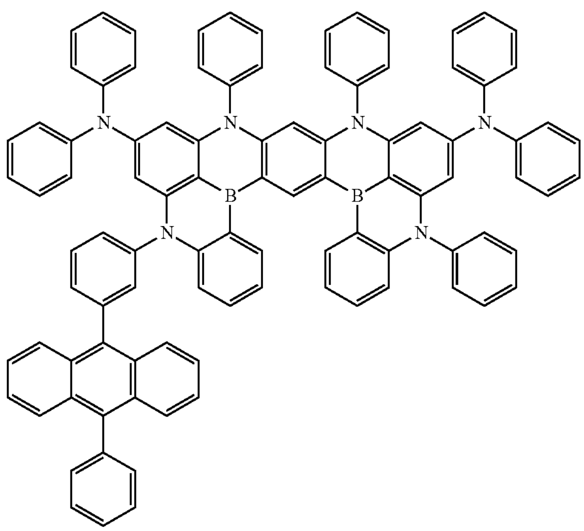
9
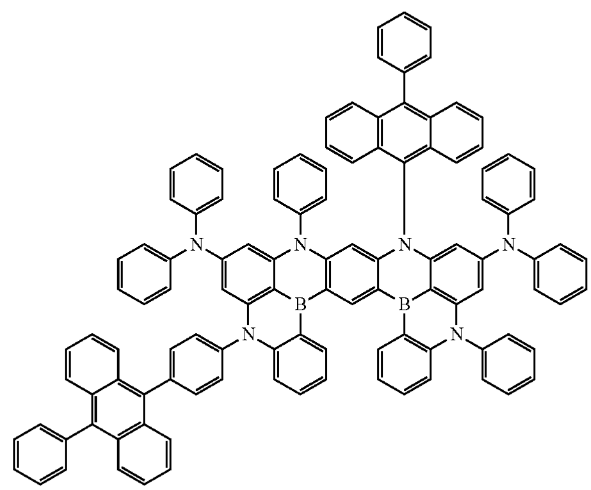
10
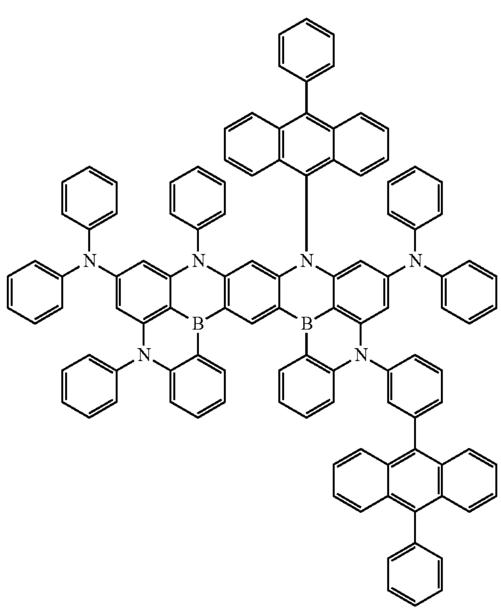
11
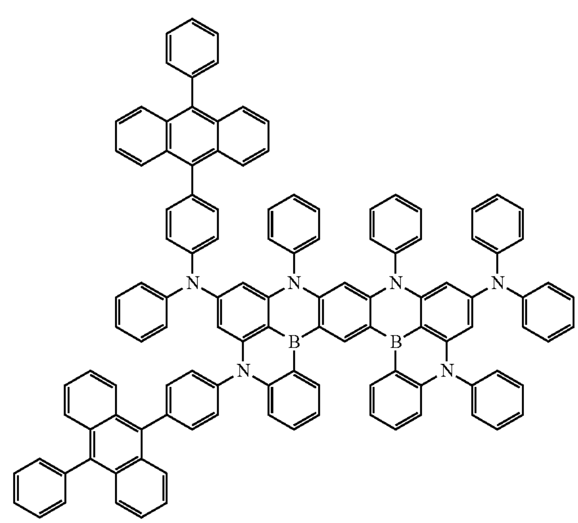

-continued
12
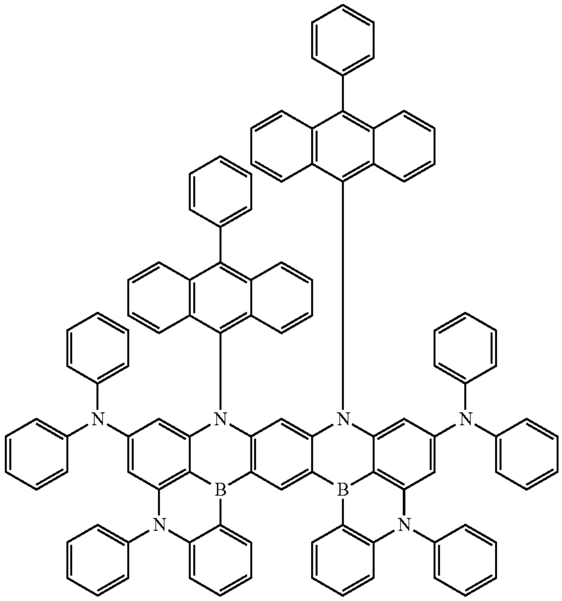
13
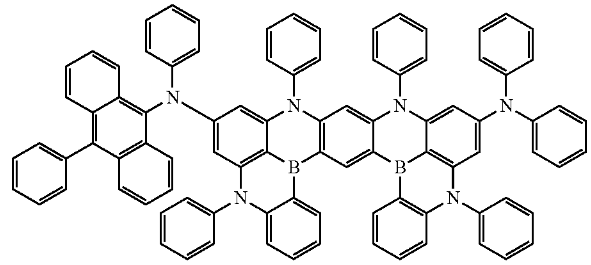
14
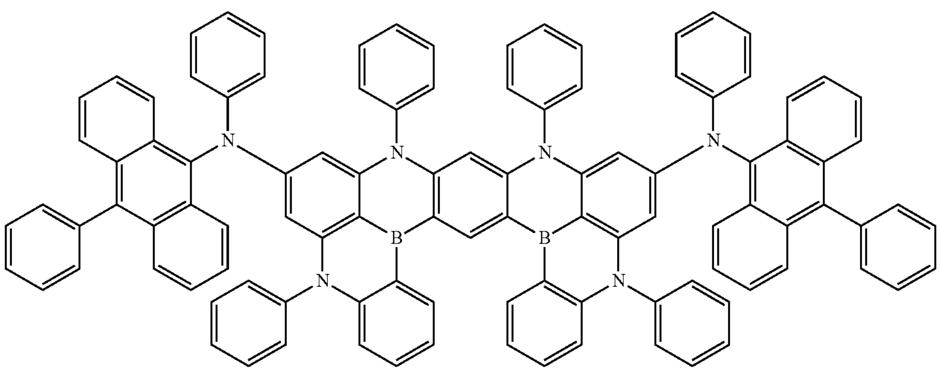
15
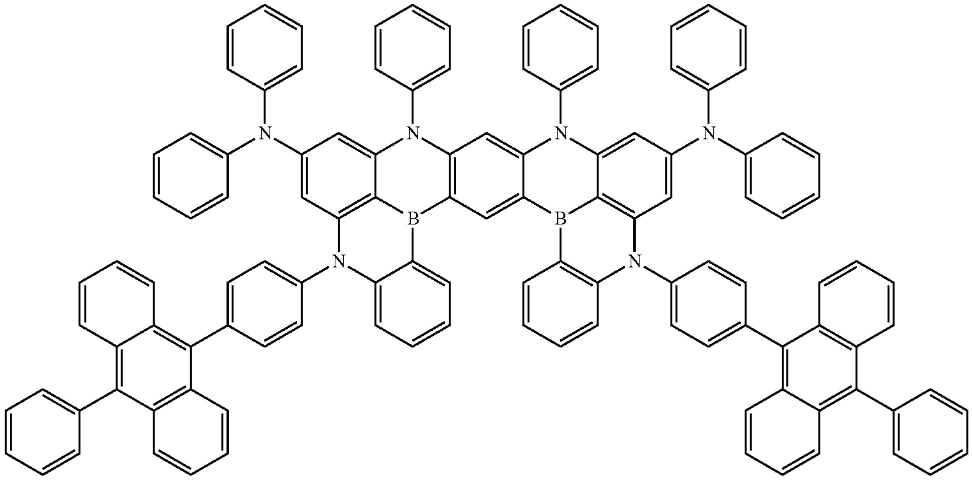

-continued
16
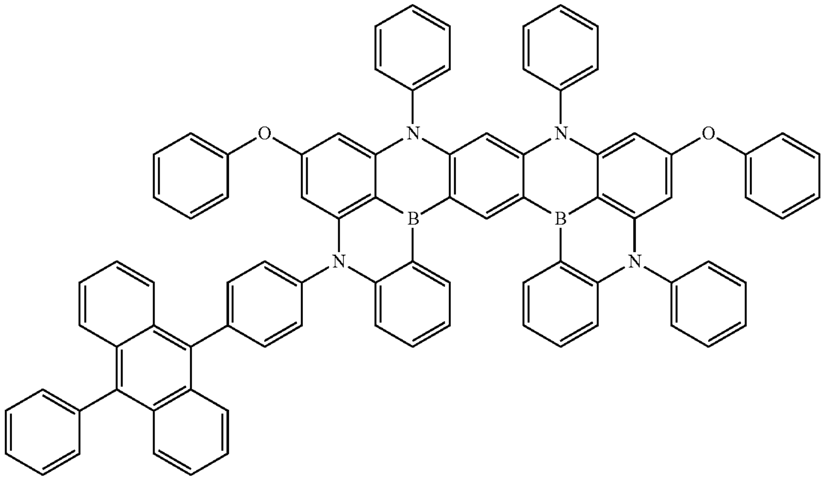
17
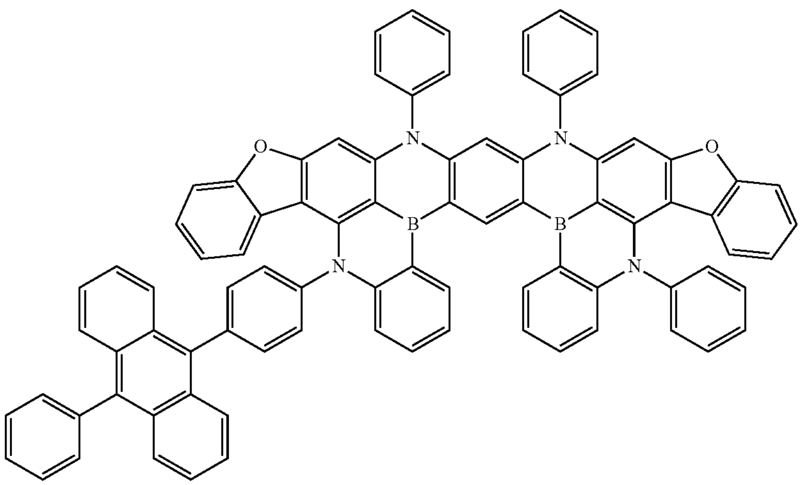
18
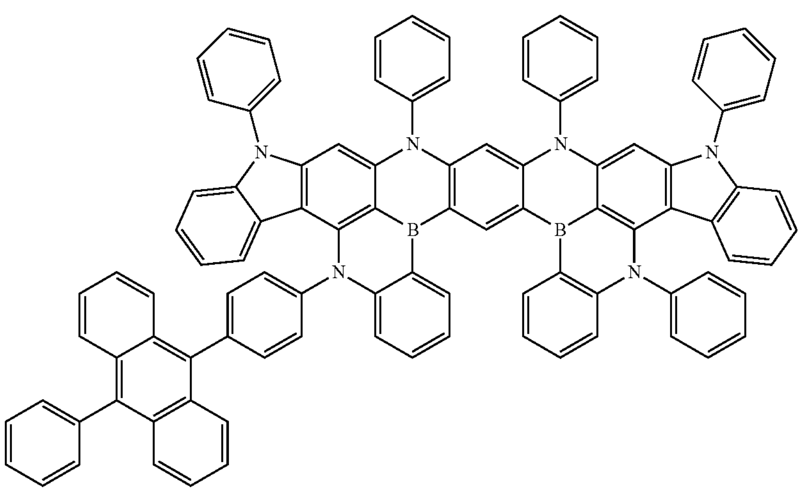

-continued
19
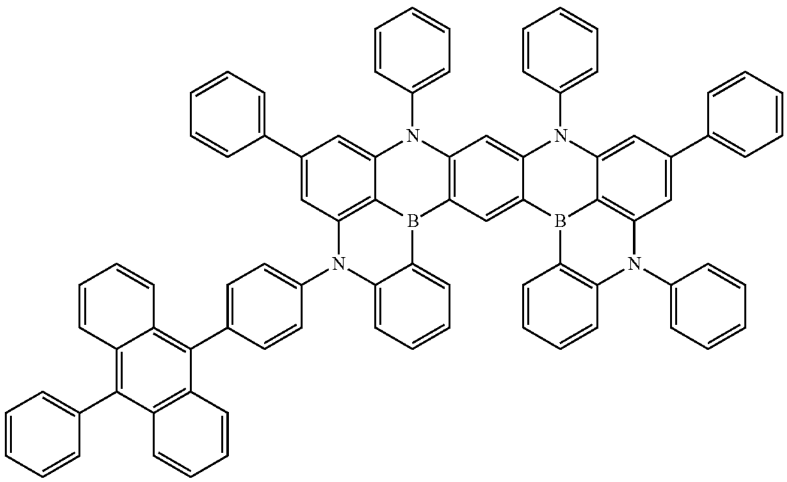
20
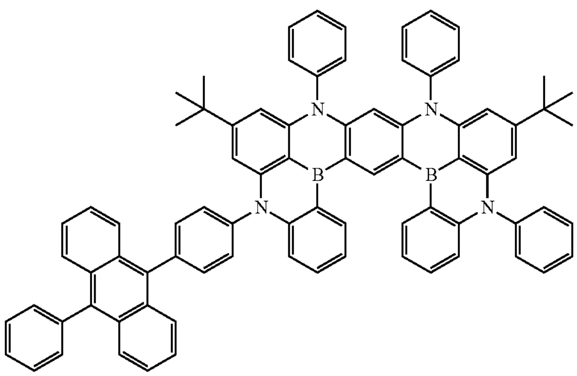
21
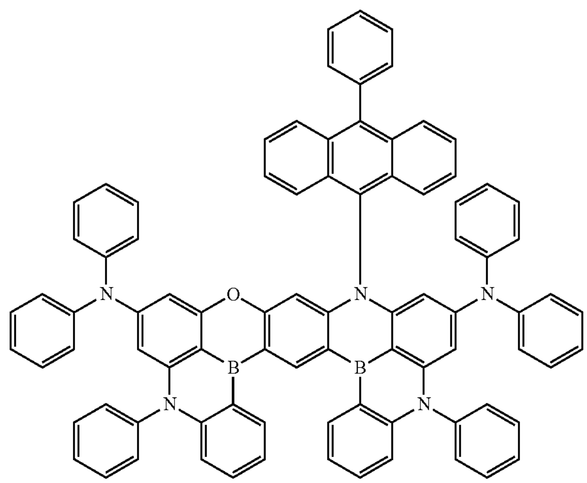
22
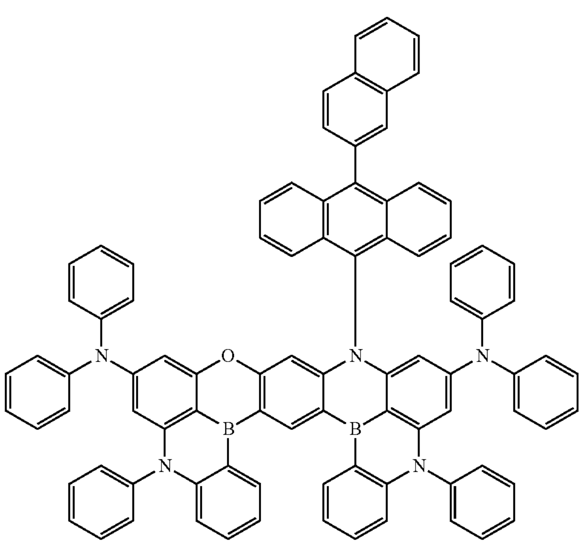
23
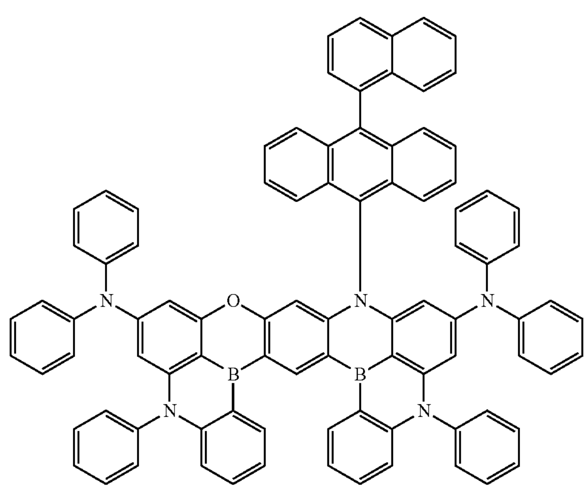

-continued
24
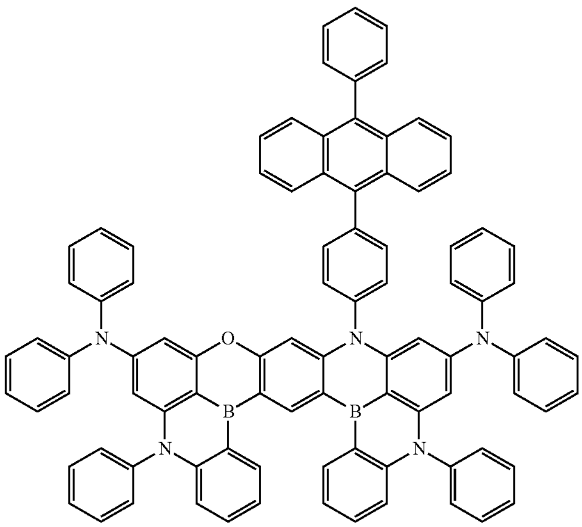
25
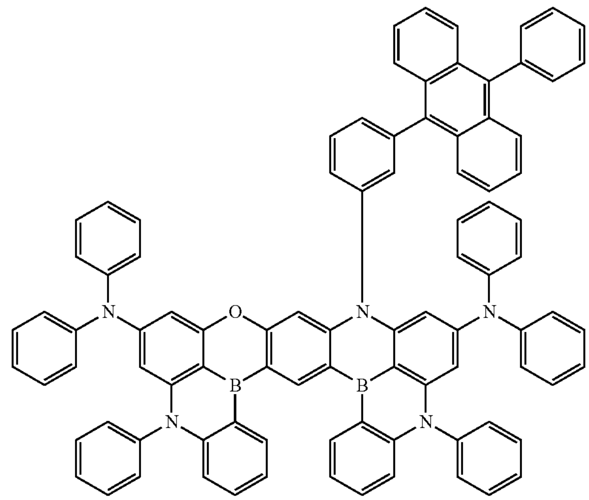
26
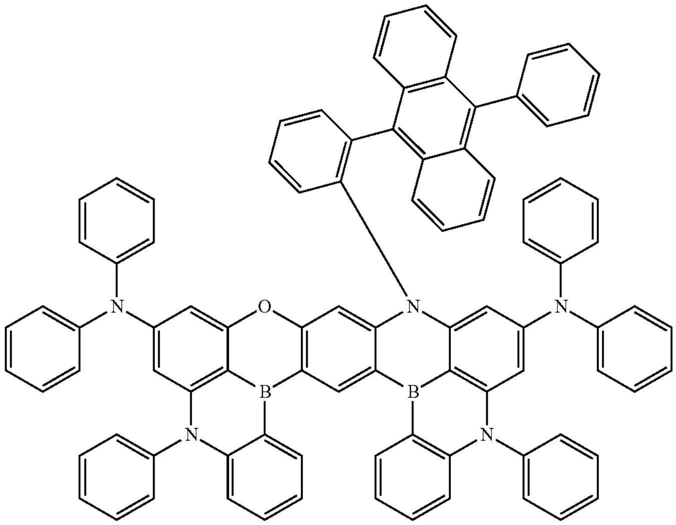
27
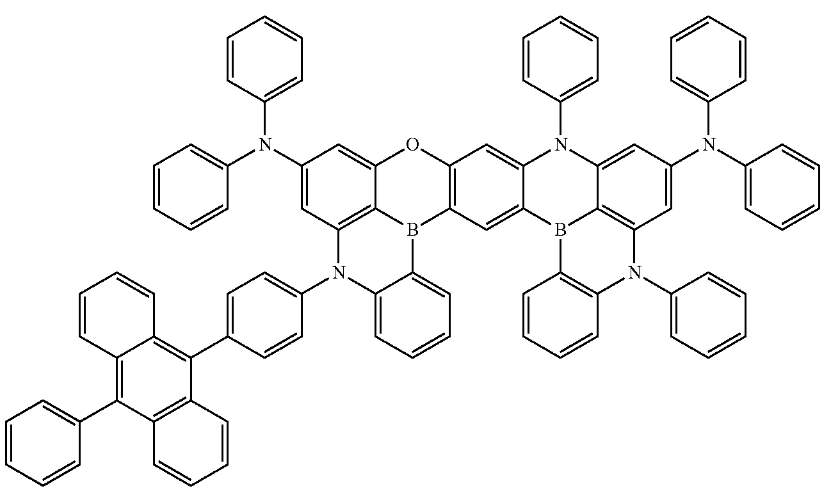

-continued
28
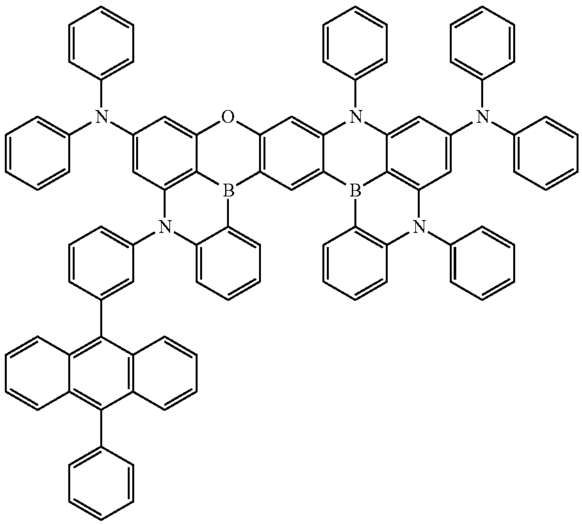
29
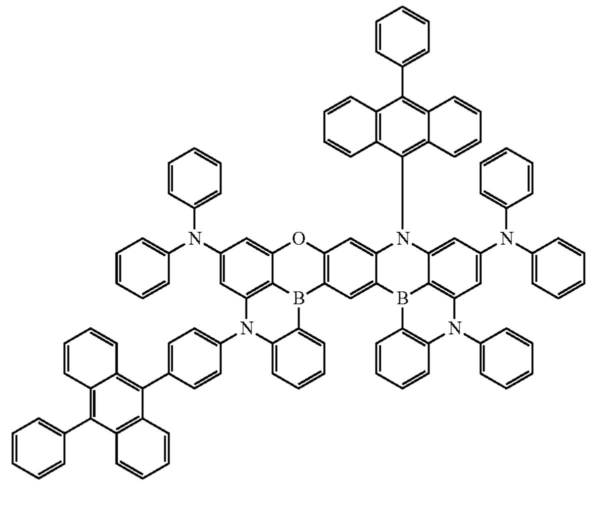
30
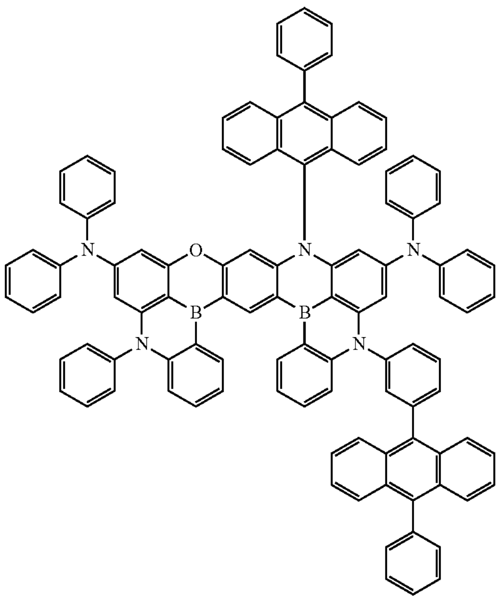
31
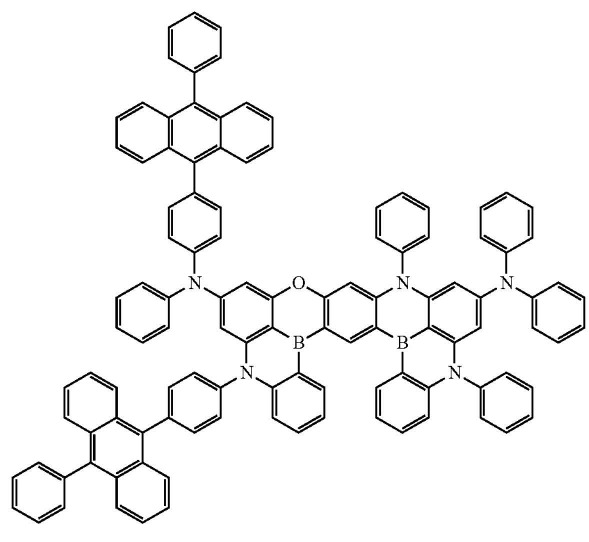
32
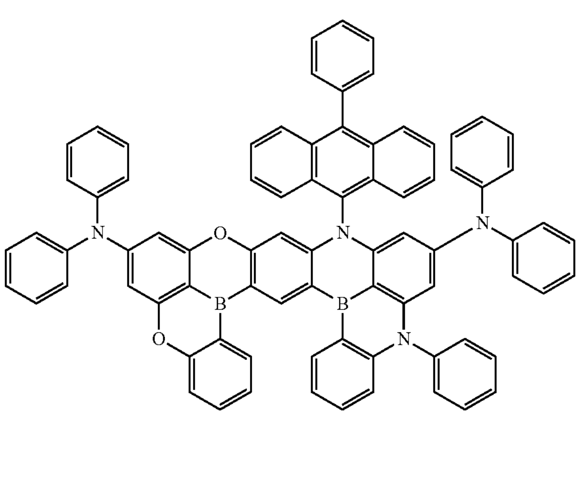
33
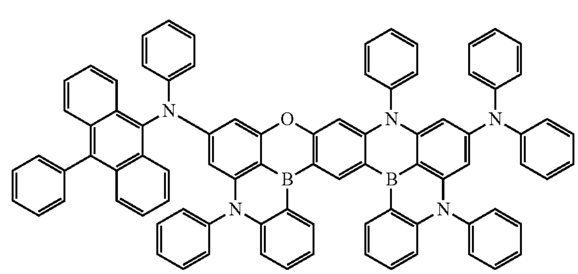

-continued
34
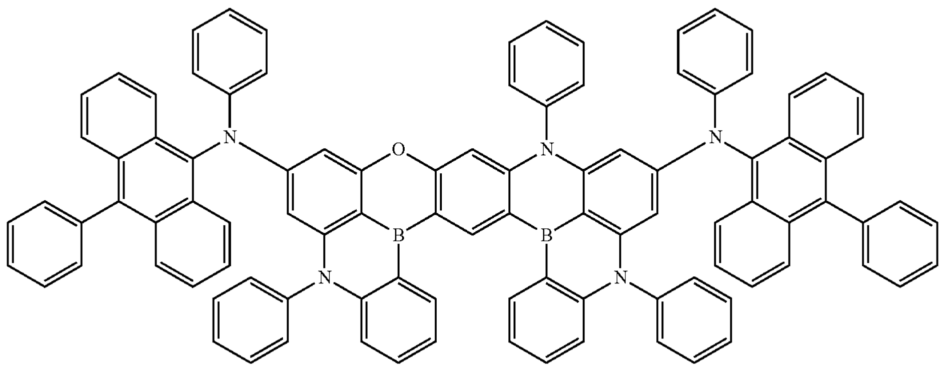
35
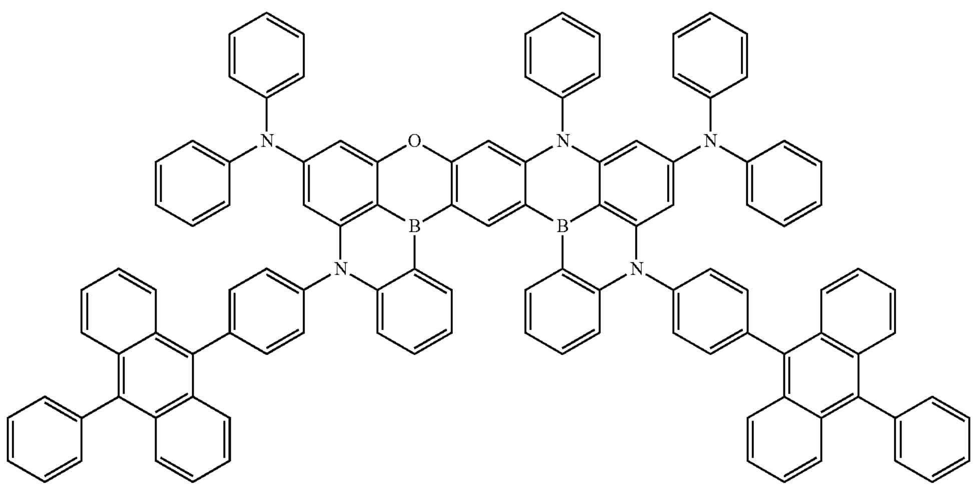
36
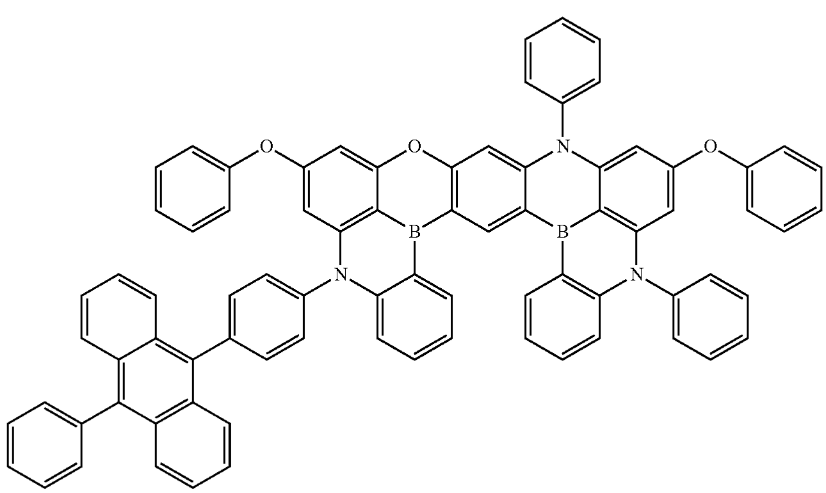

-continued
37
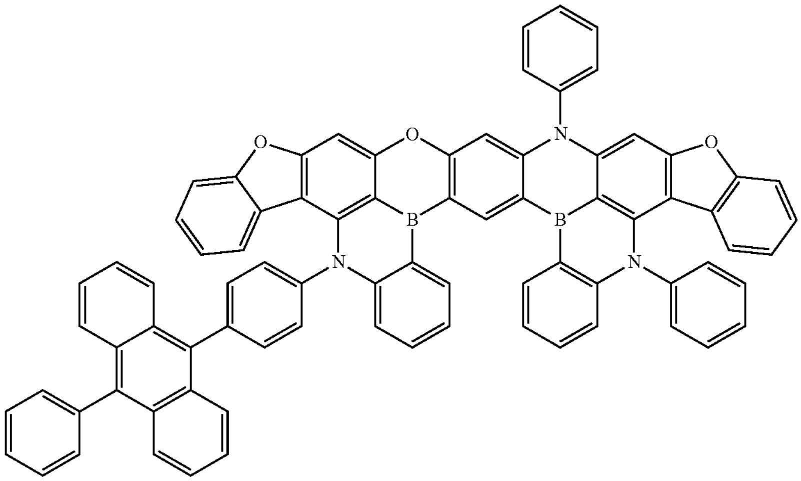
38
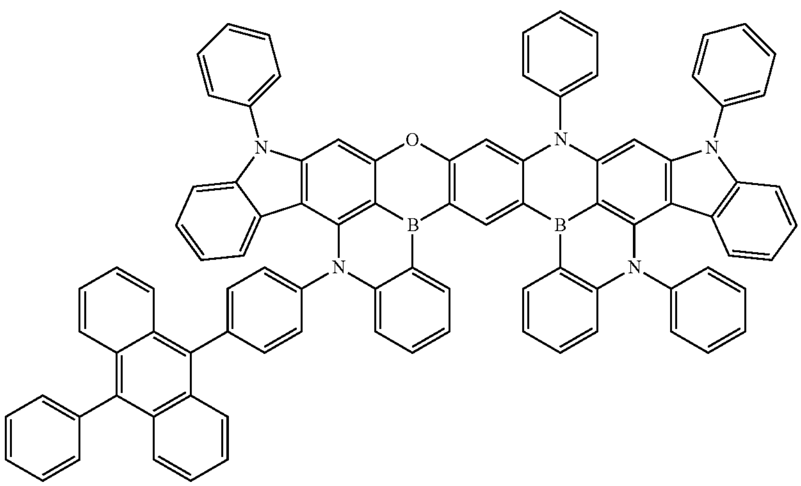
39
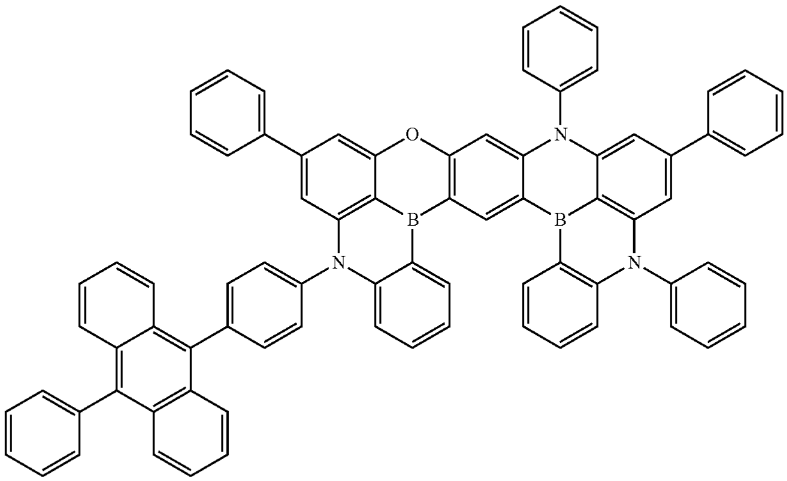

-continued
40
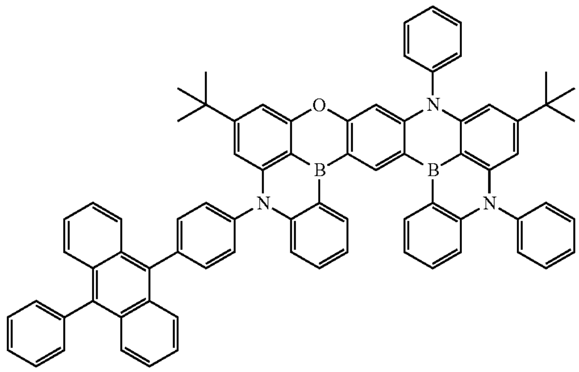
41
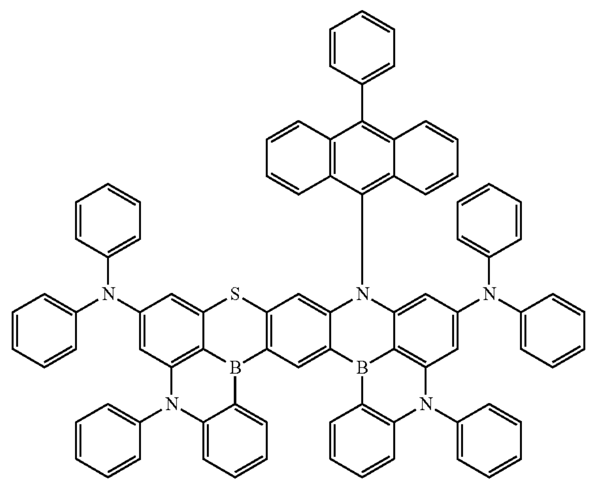
42
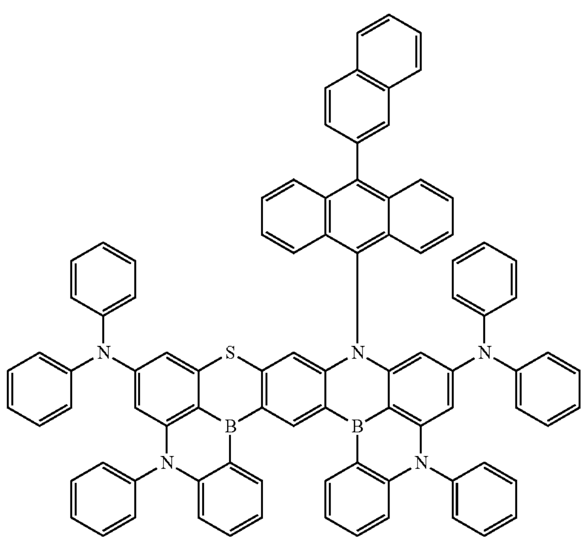
43
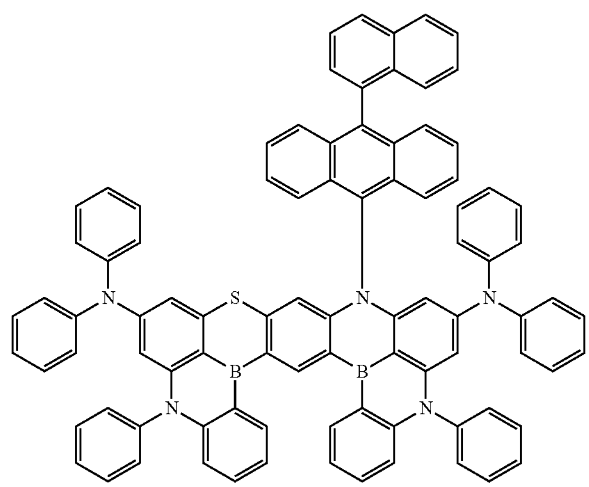
44
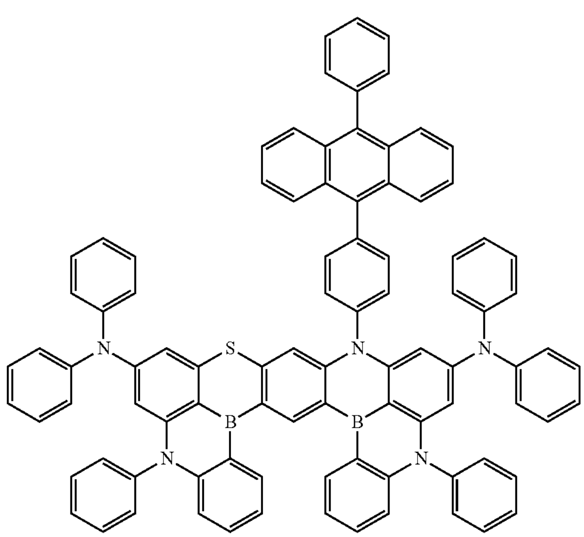
45
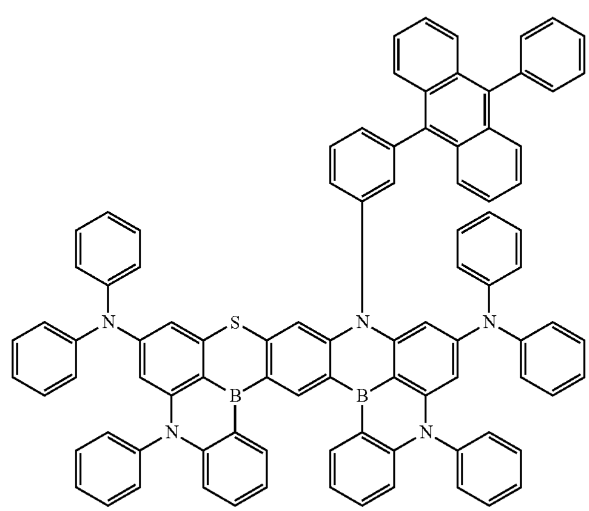

-continued
46
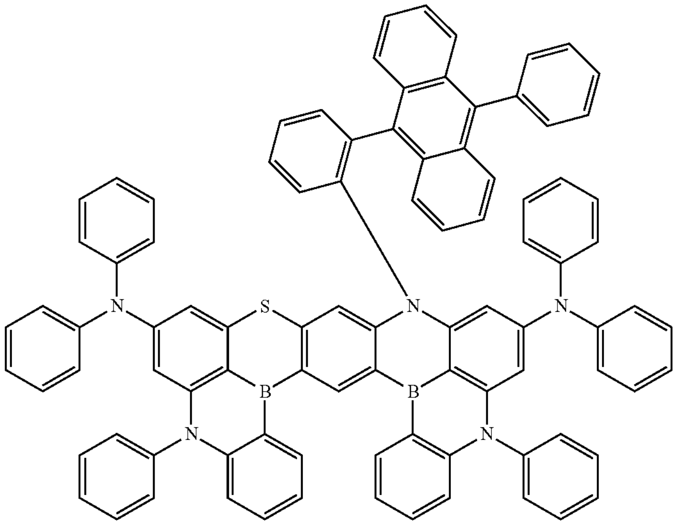
47
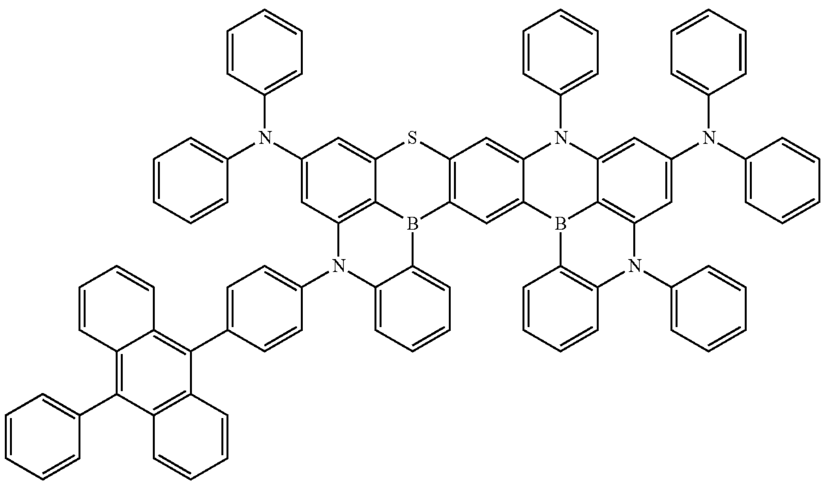
48
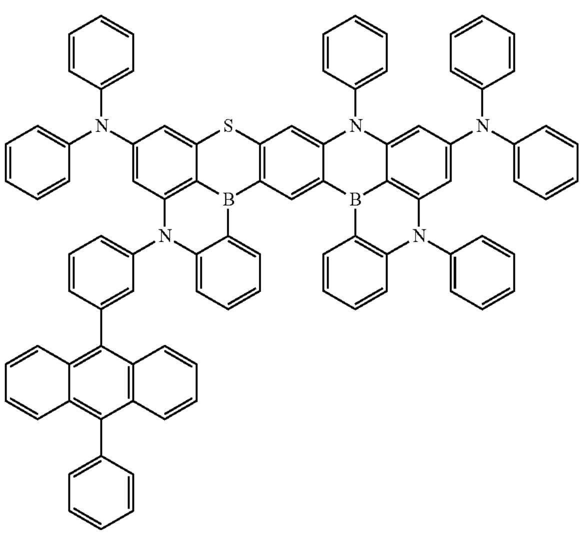
49
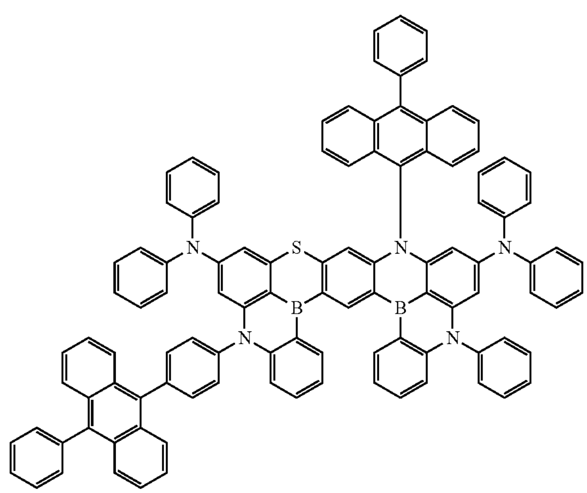

-continued
50
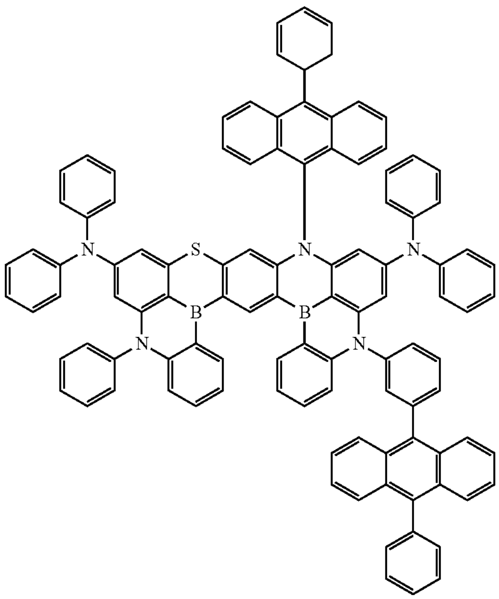
51
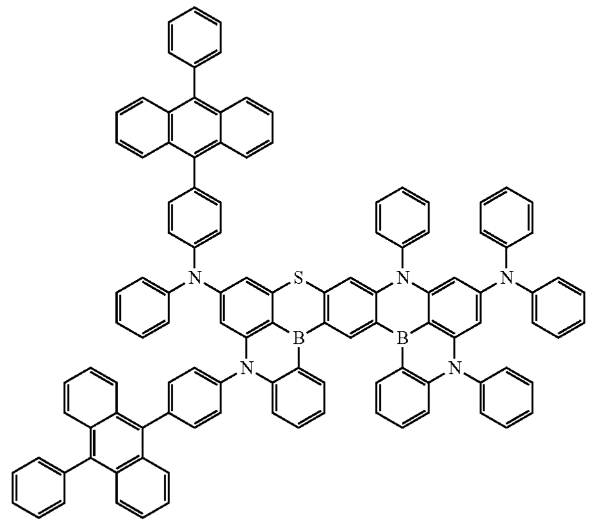
52
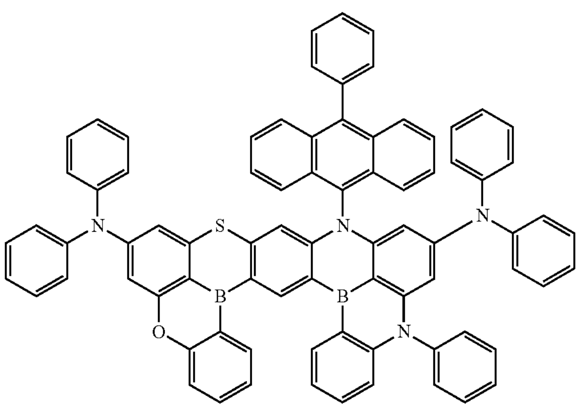
53
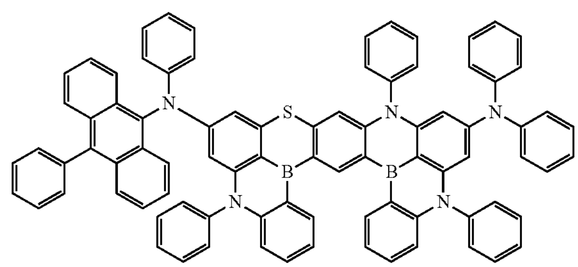
54
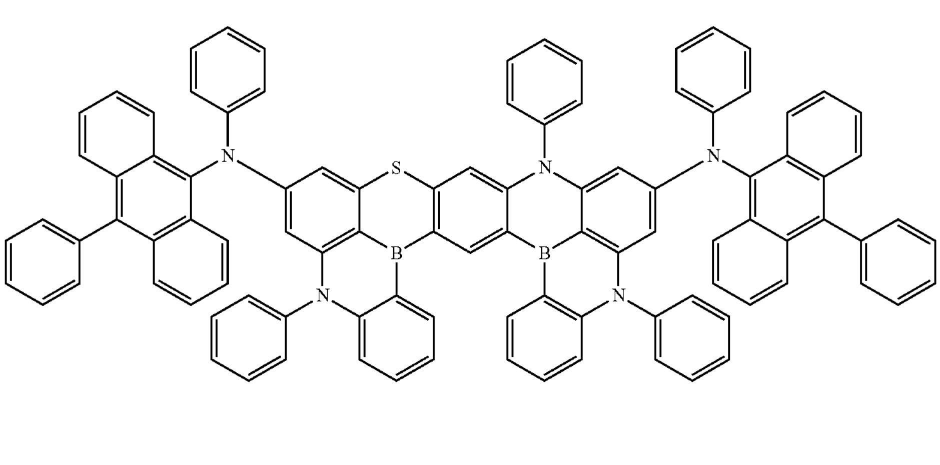

-continued
55
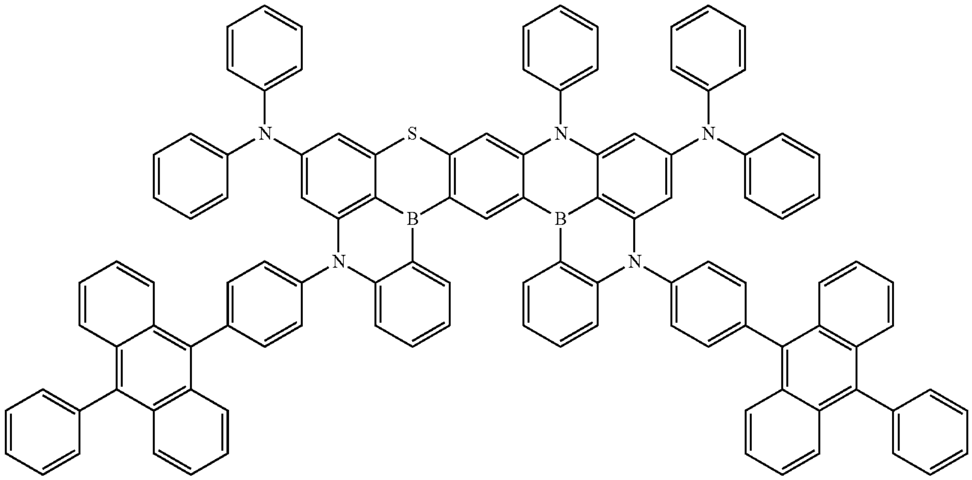
56
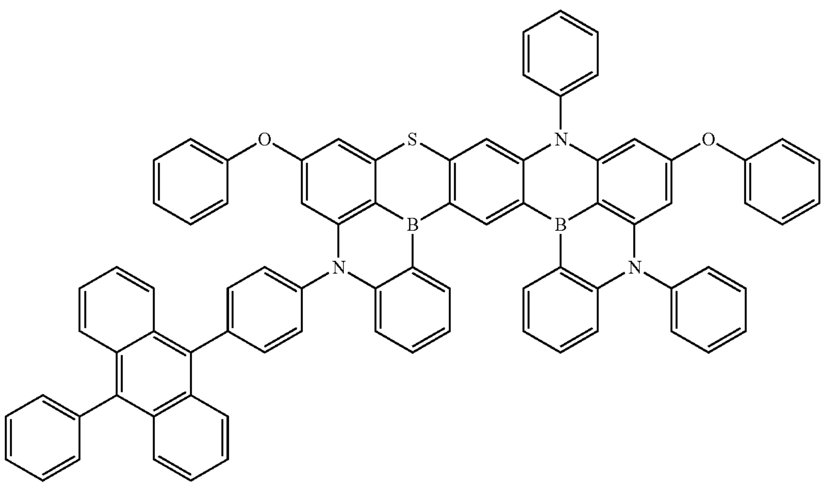
57
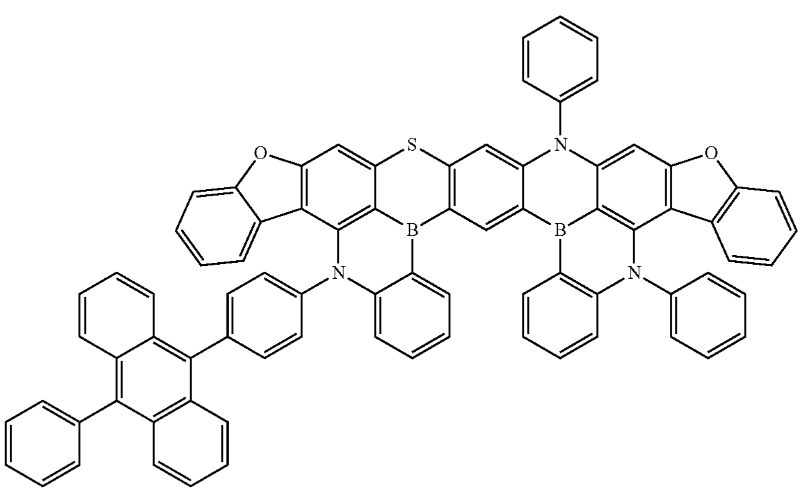

-continued
58
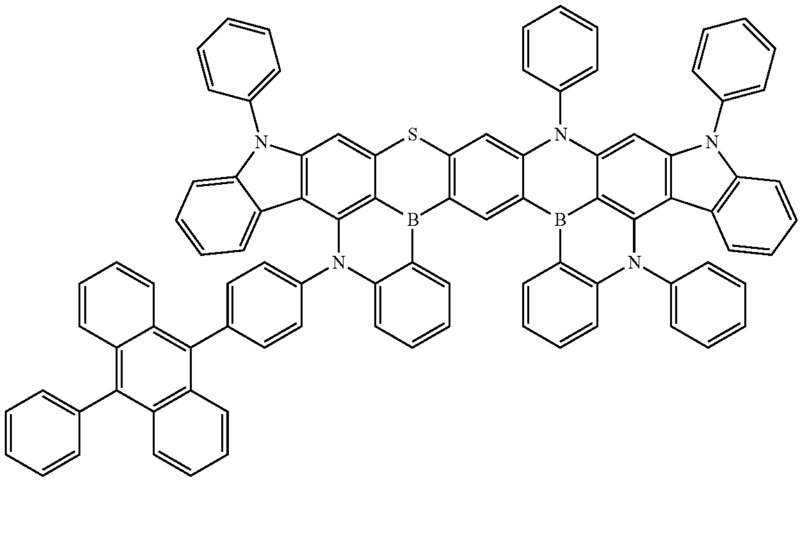
59
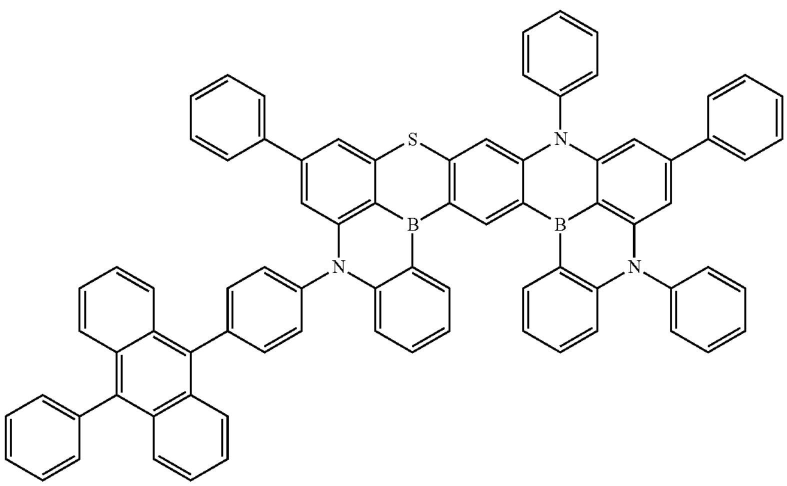
60
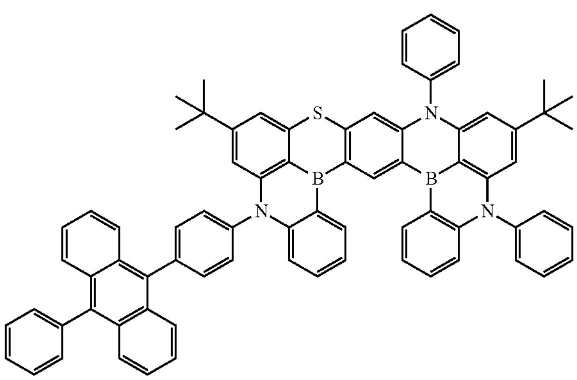
61
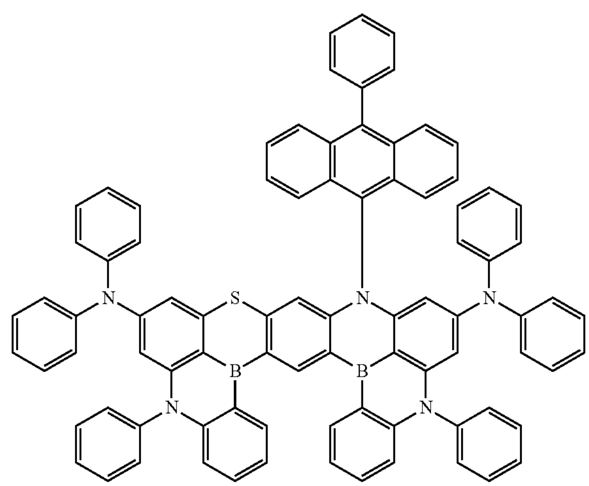

-continued
62
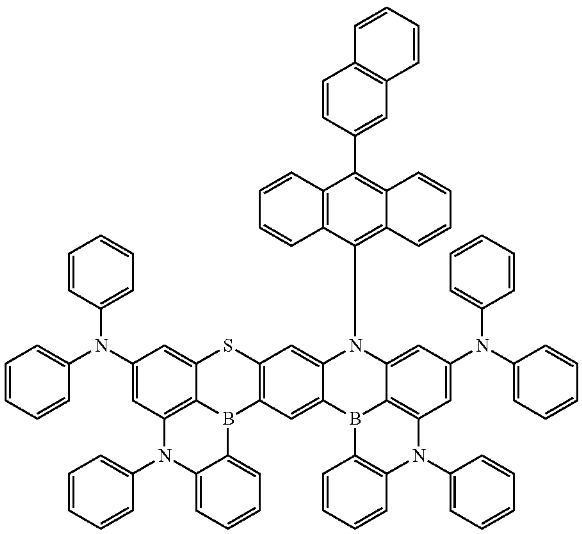
63
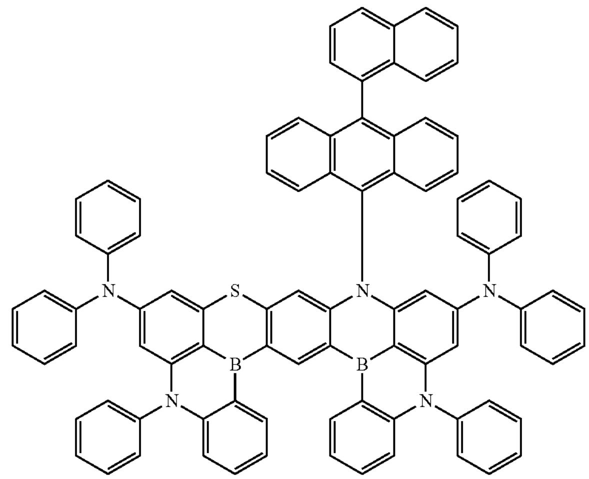
64
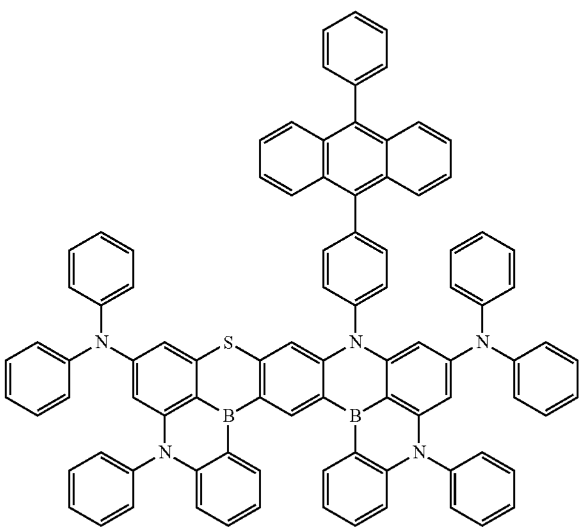
65
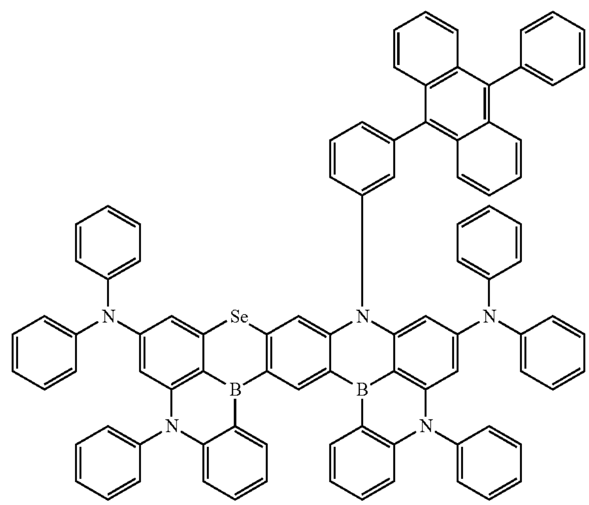
66
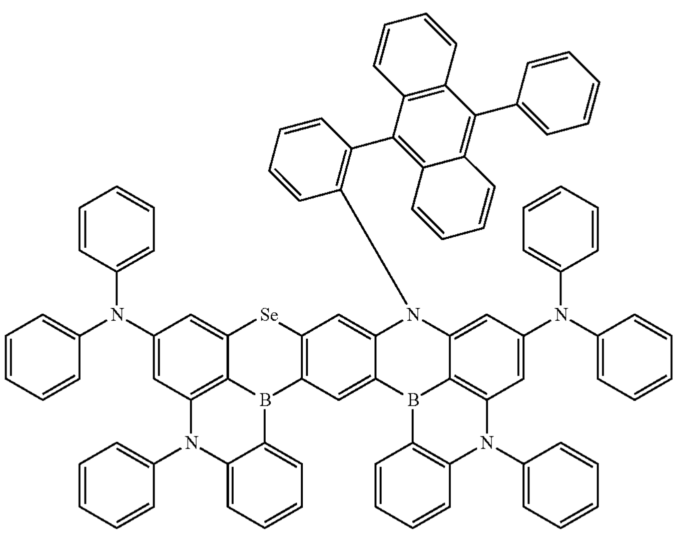

-continued
67
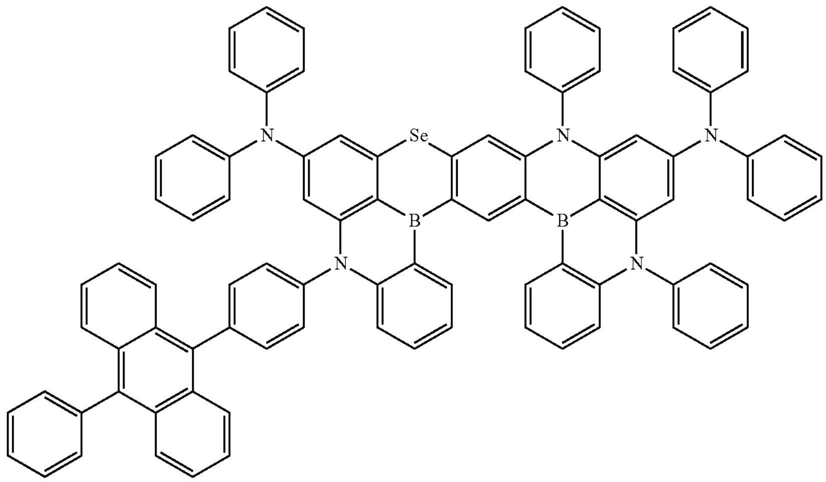
68
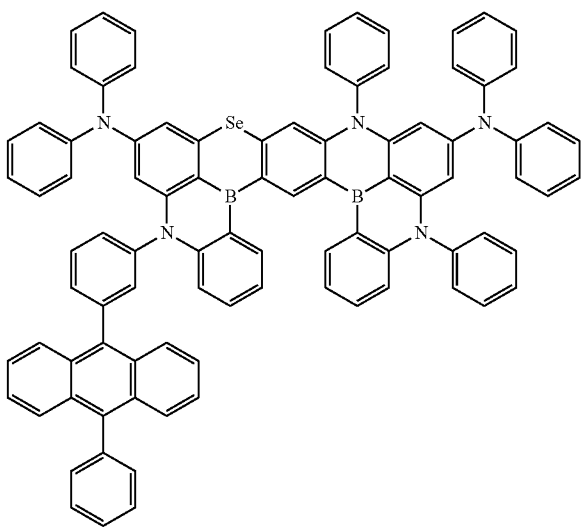
69
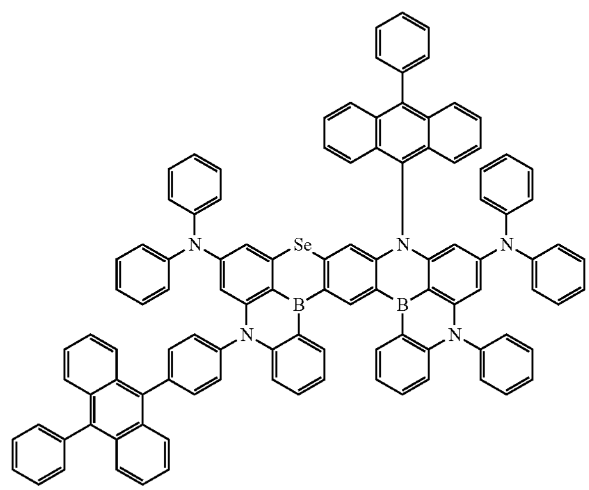
70
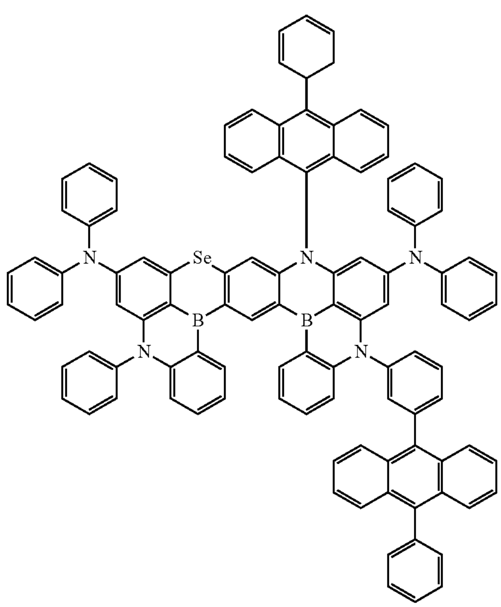
71
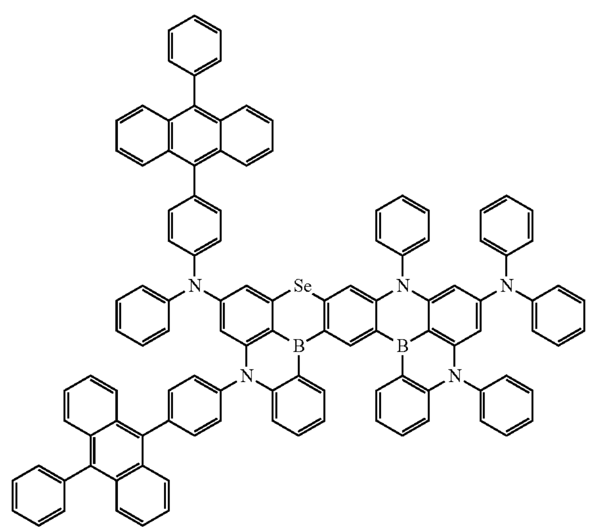

-continued
72
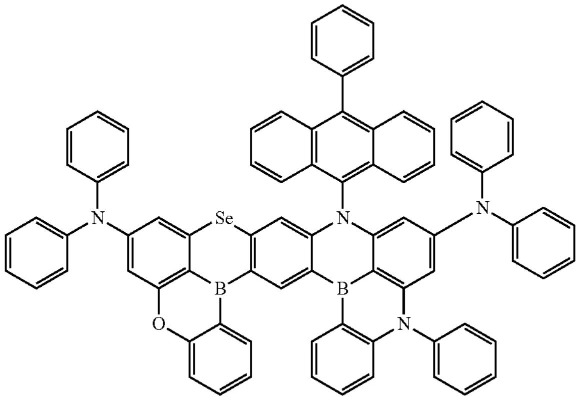
73
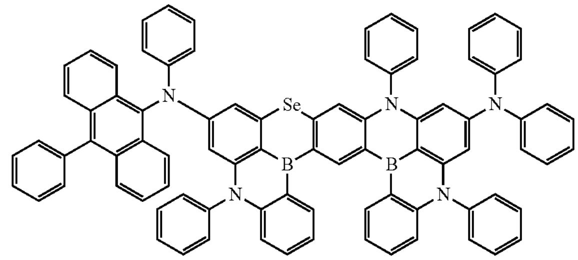
74
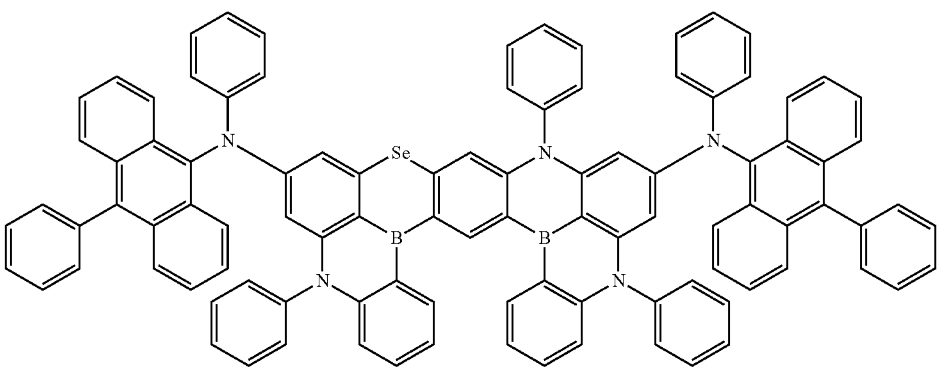
75
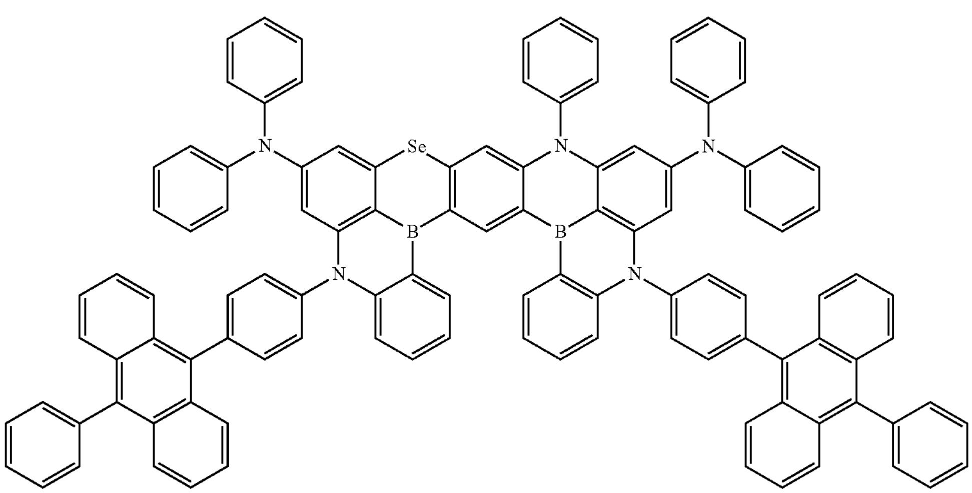

-continued
76
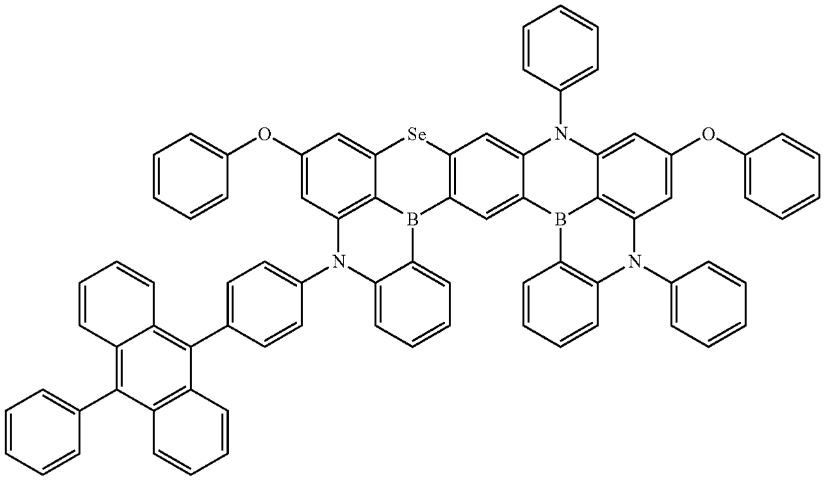
77
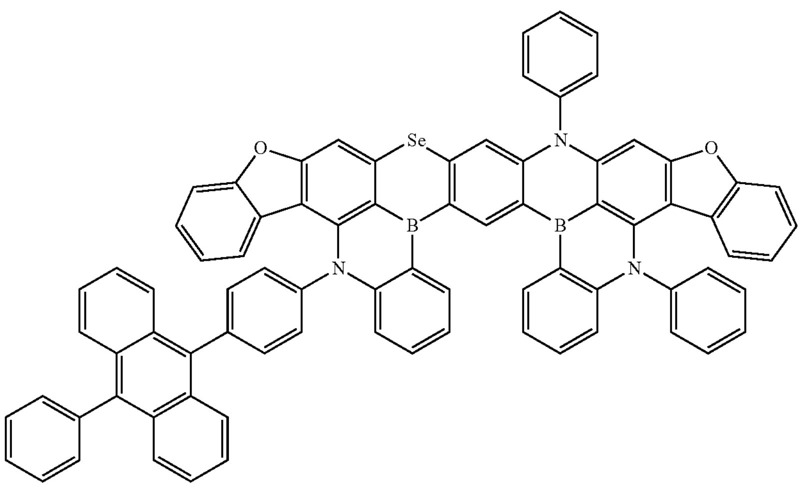
78
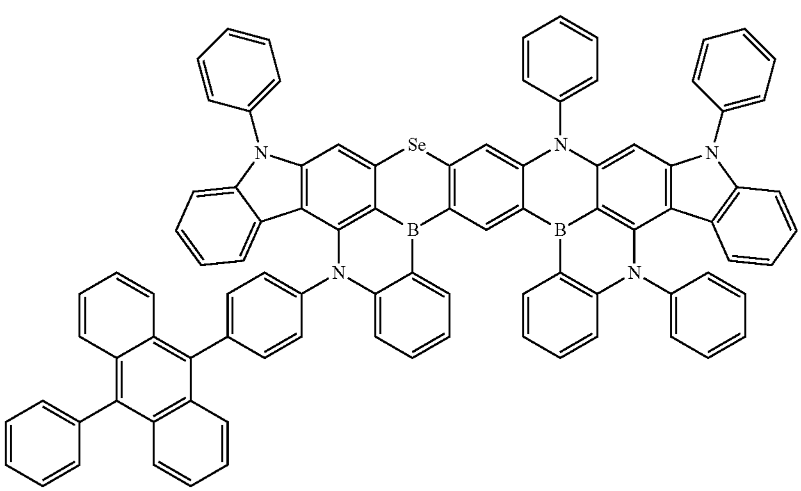

-continued
79
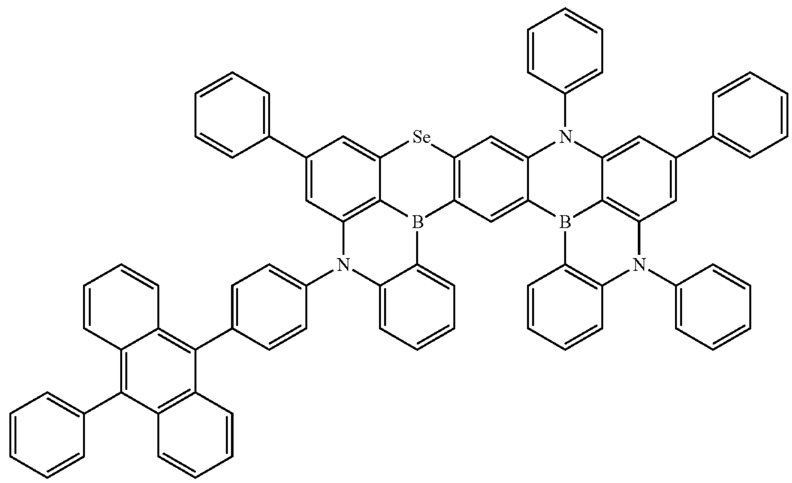
80
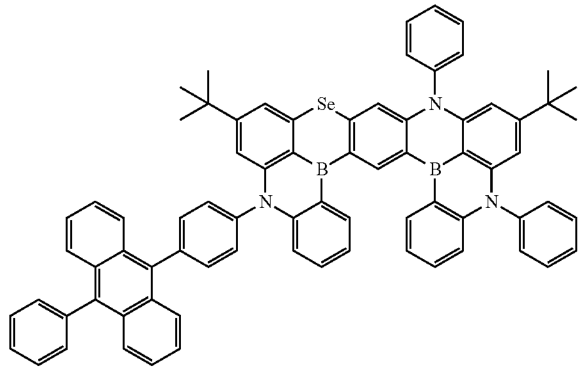
81
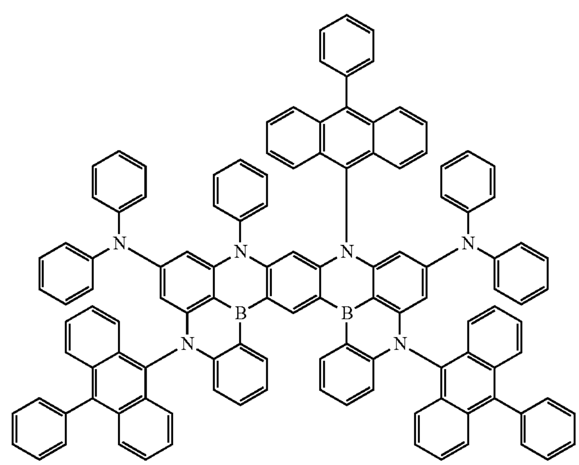
82
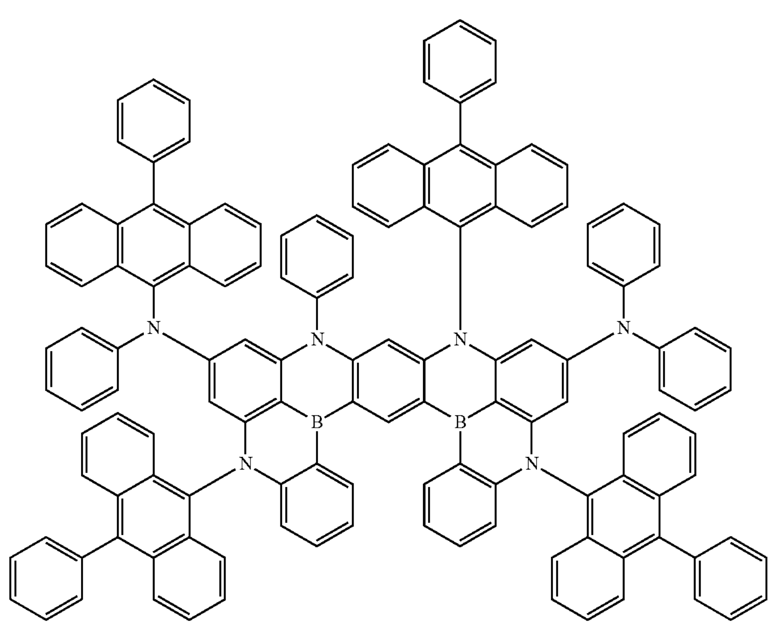

-continued
83
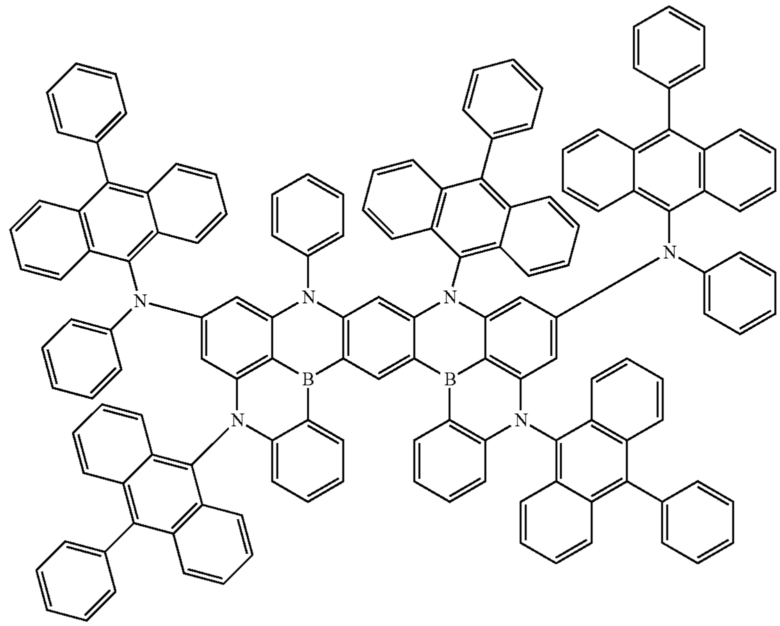
84
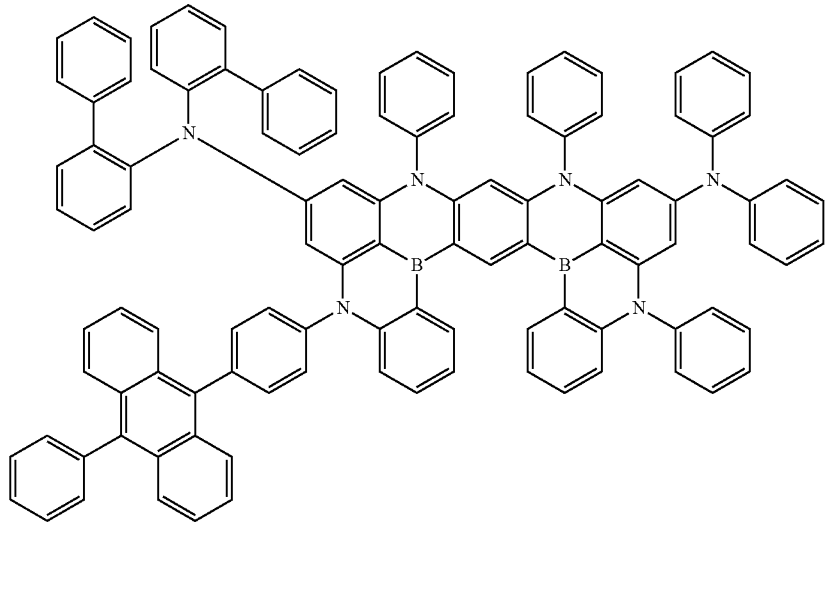

-continued
85
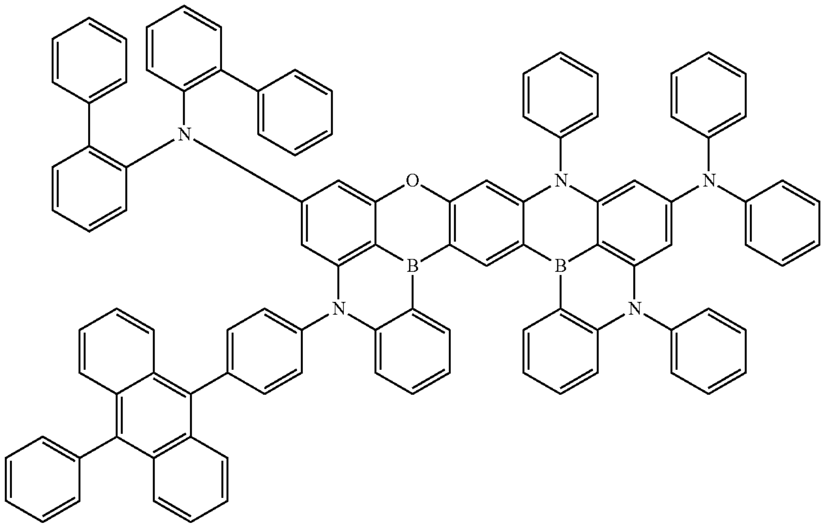
86
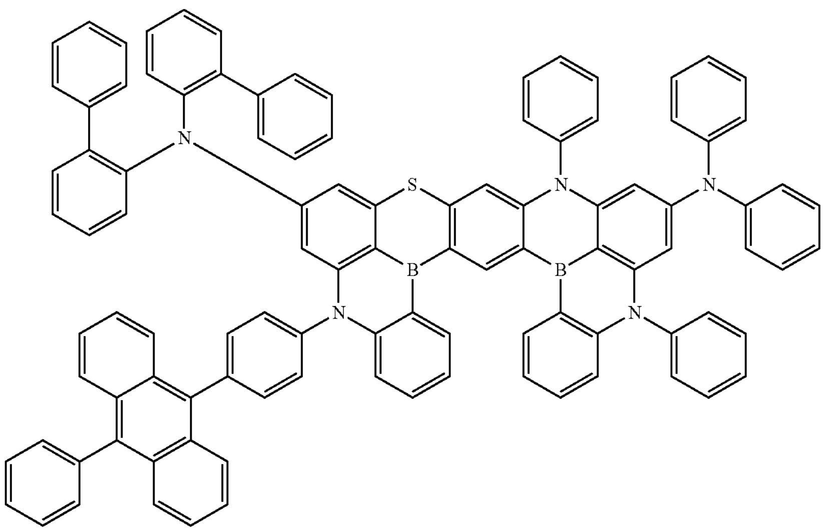
87
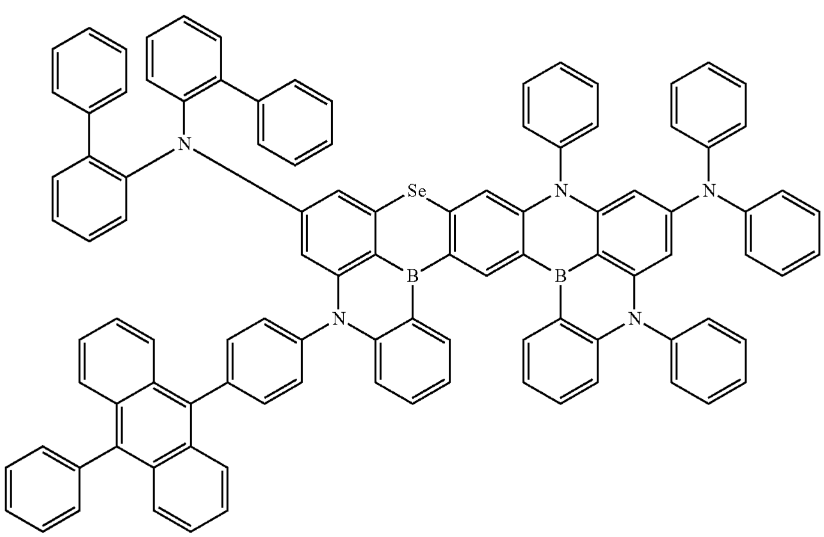

-continued
88
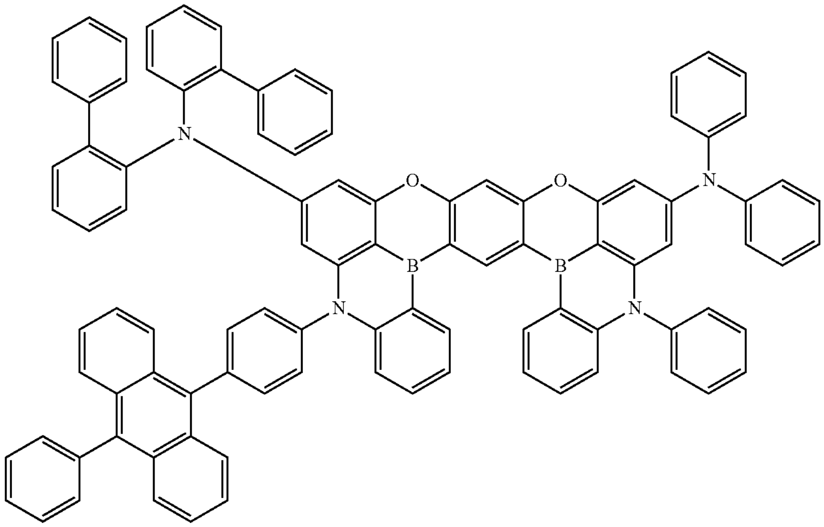
89
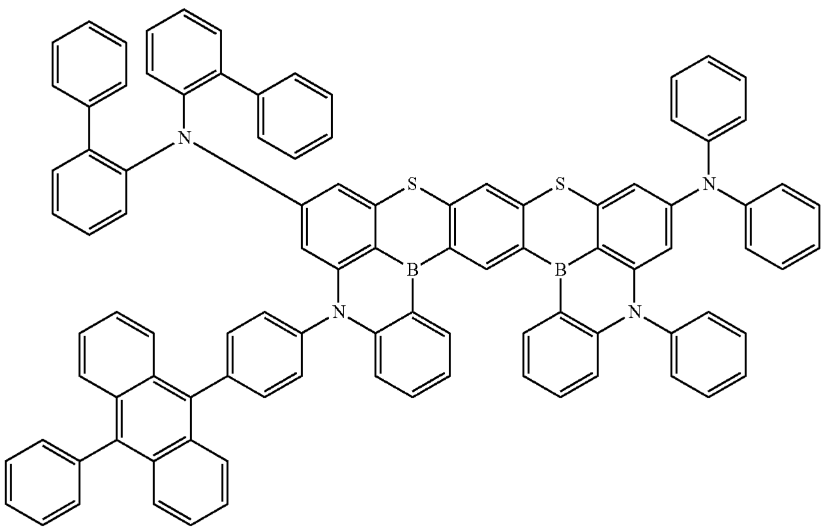
90
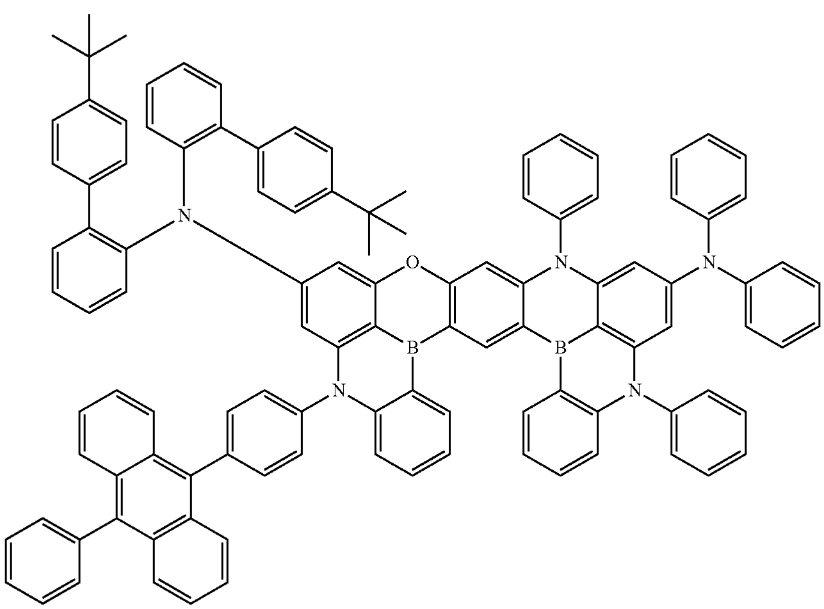

-continued
91
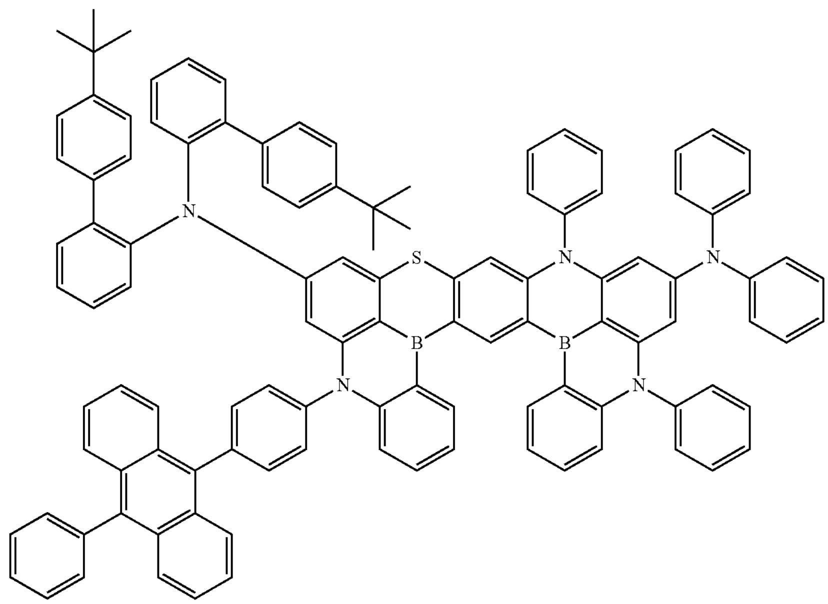
92
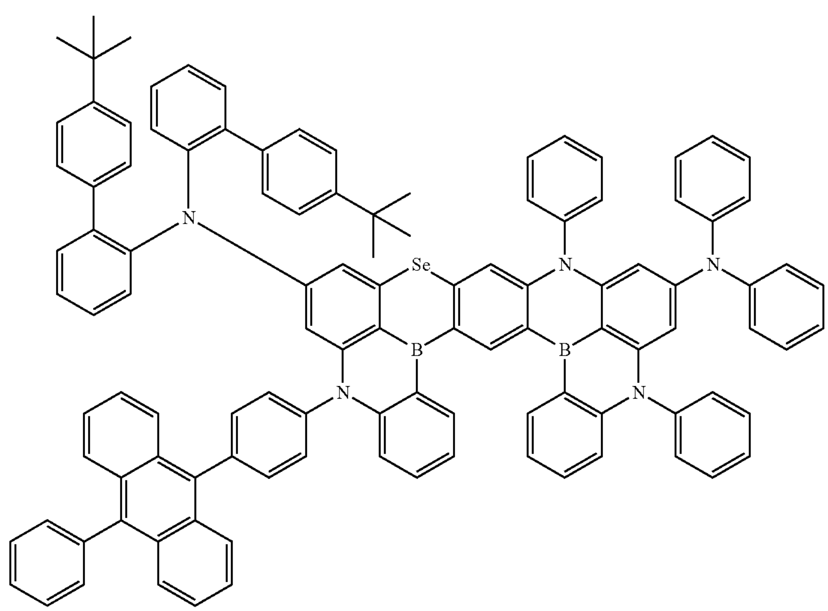

-continued
93
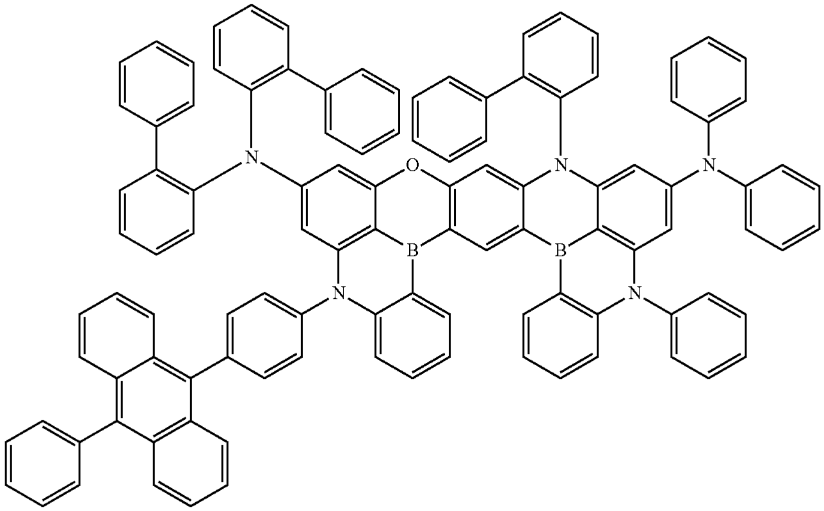
94
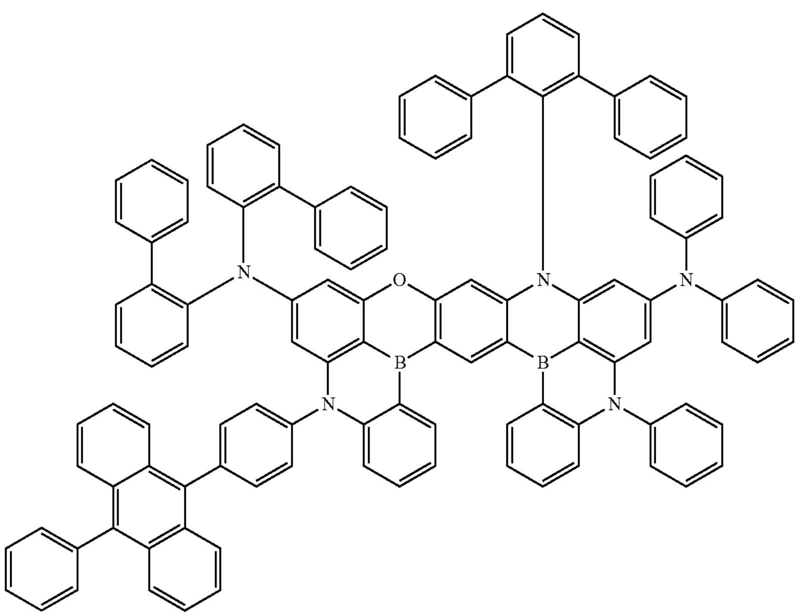

-continued
95
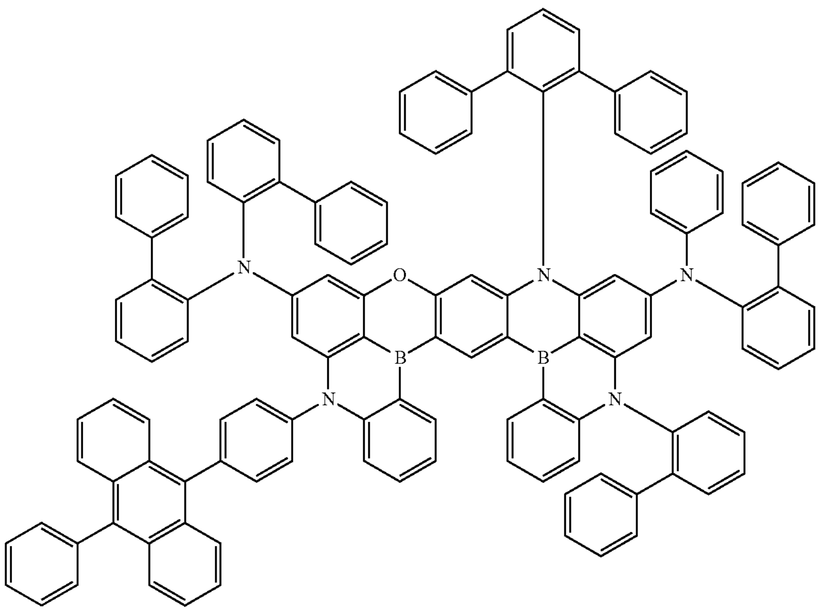
96
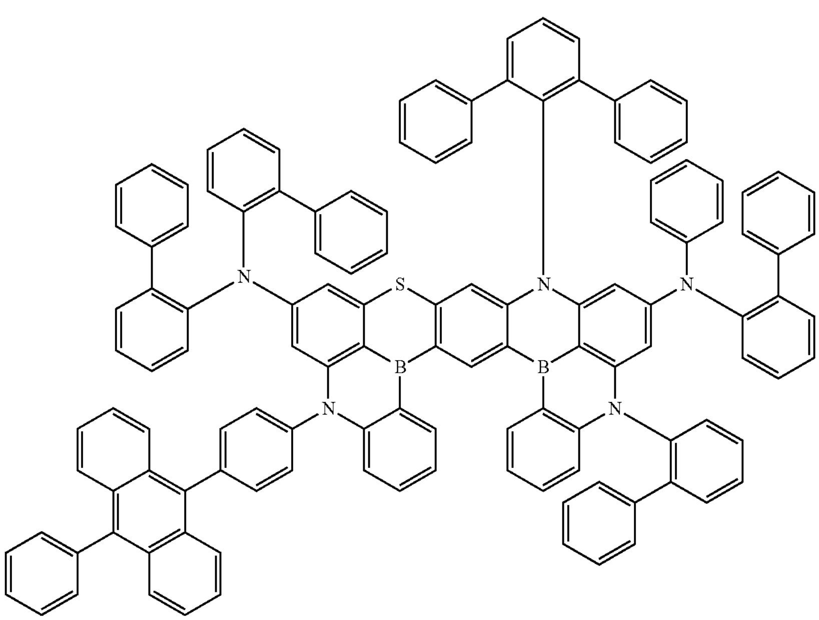

-continued
97
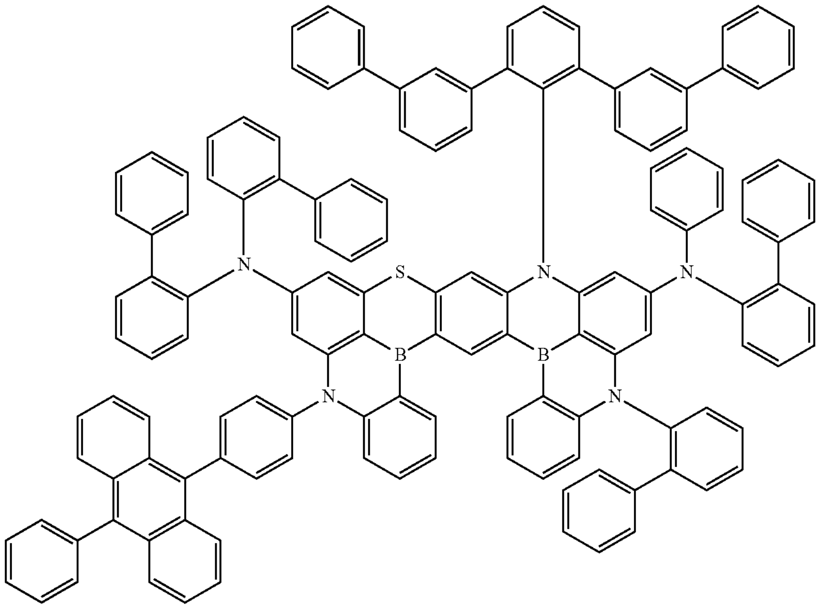
98
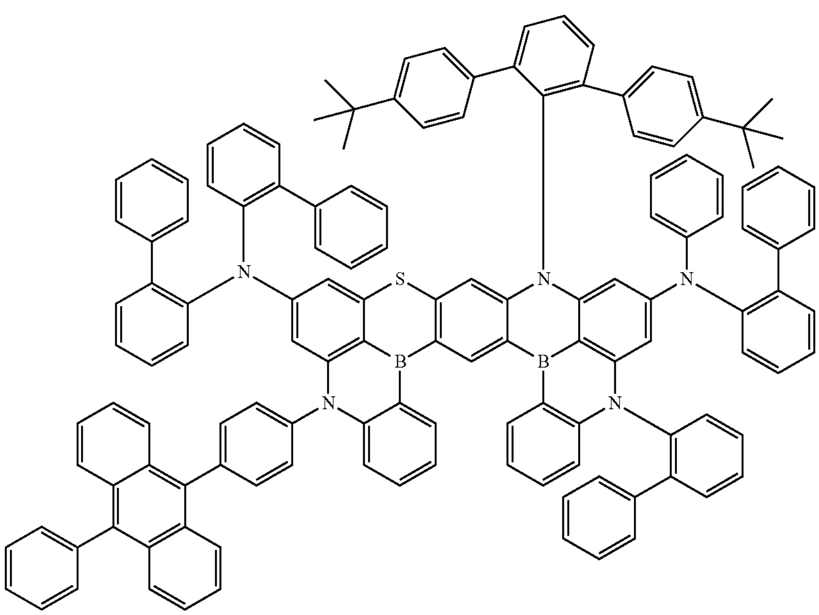

-continued
99
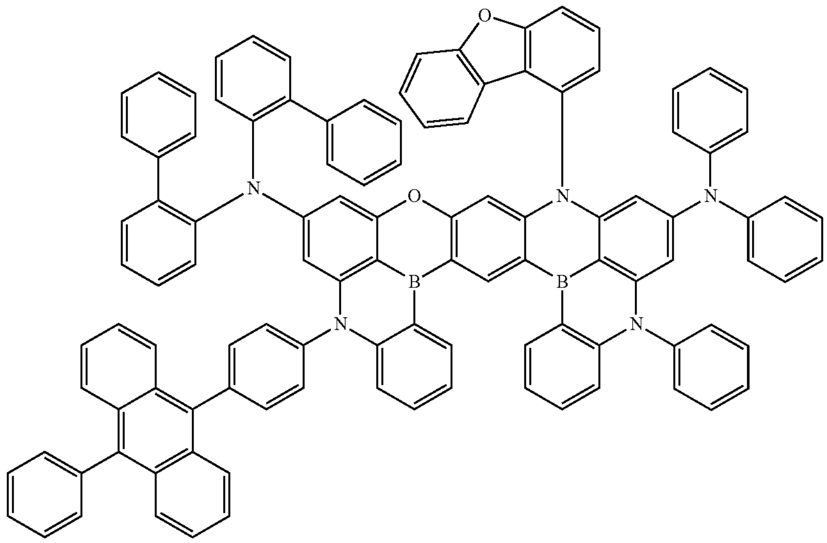
100
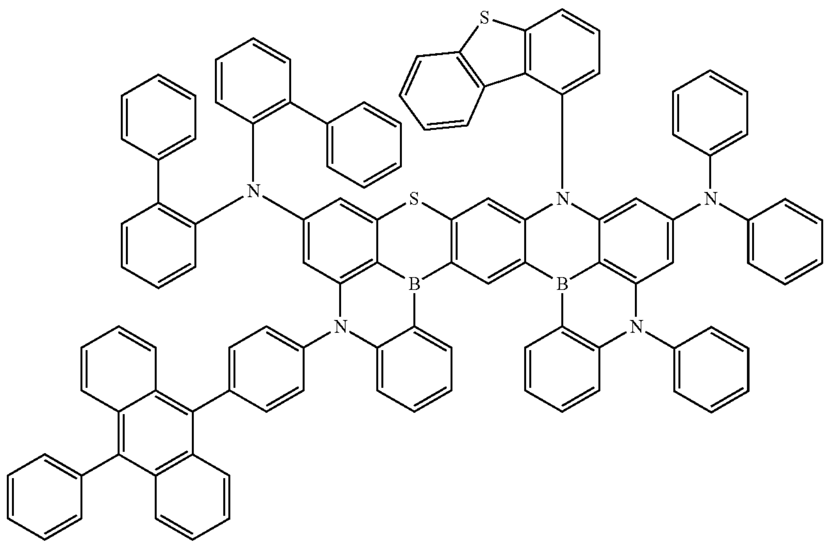
101
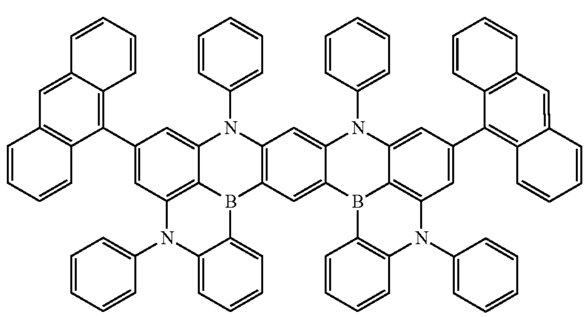
102
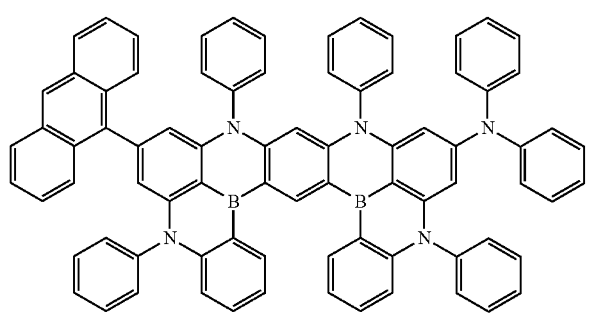

-continued
103
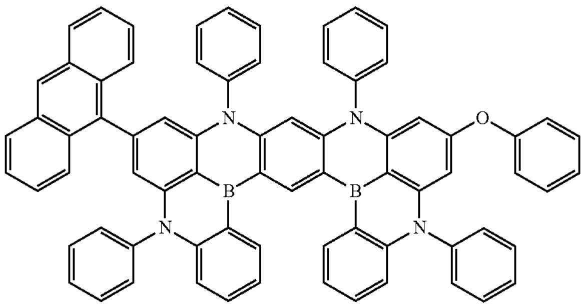
104
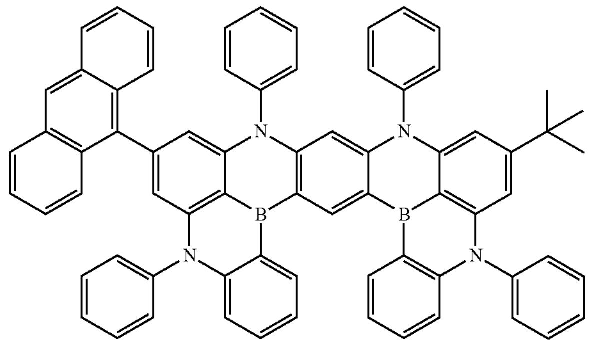
105
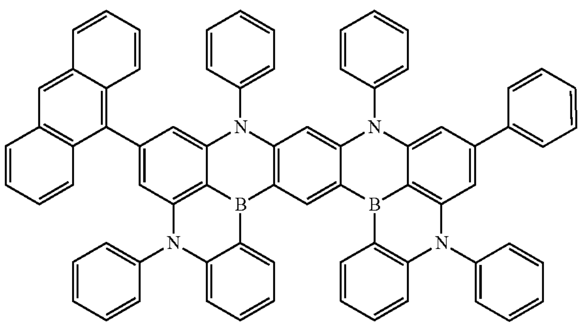
106
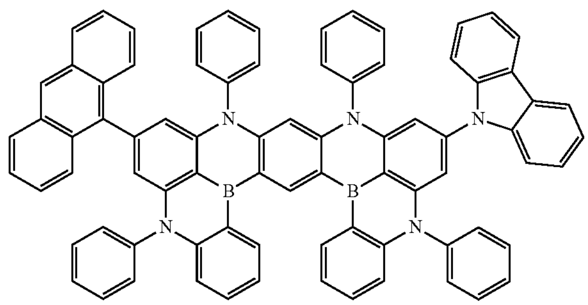
107
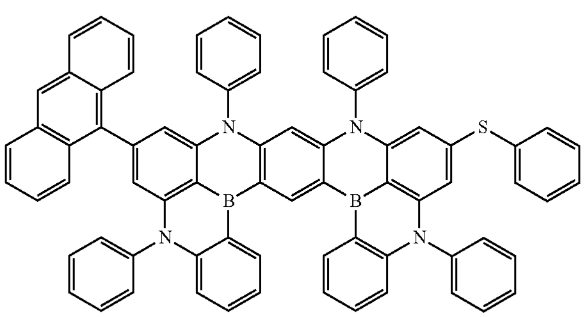
108
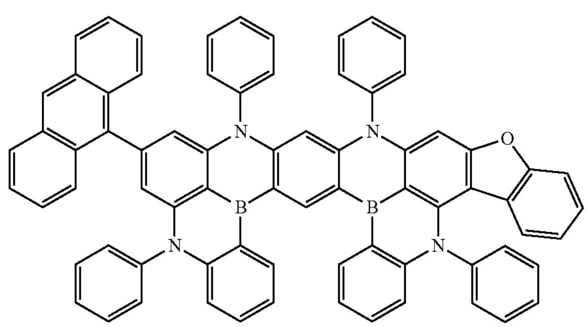
109
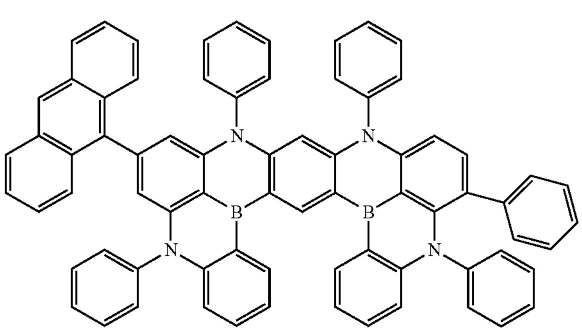
110
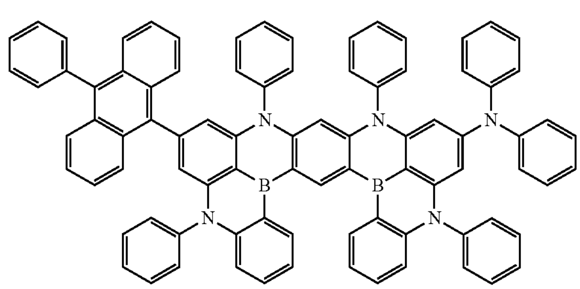

-continued
111
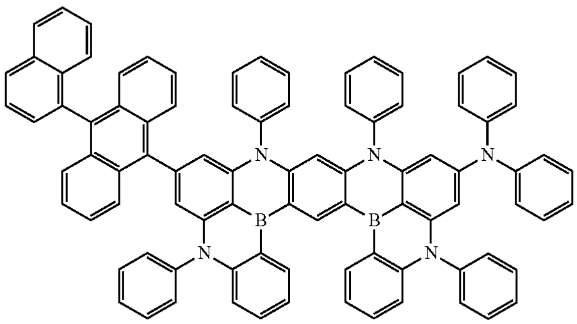
112
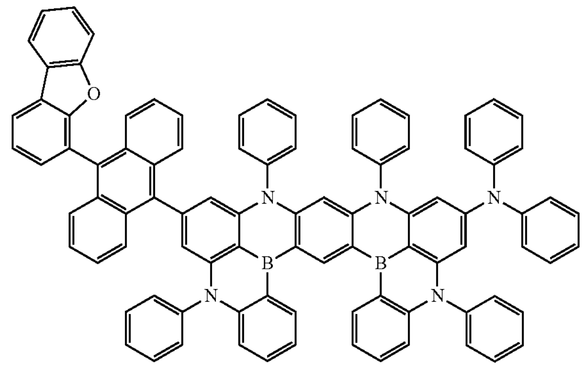
113
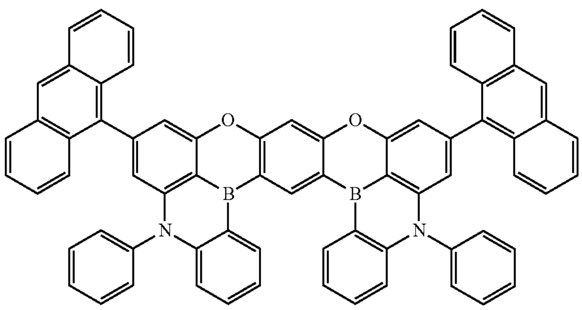
114
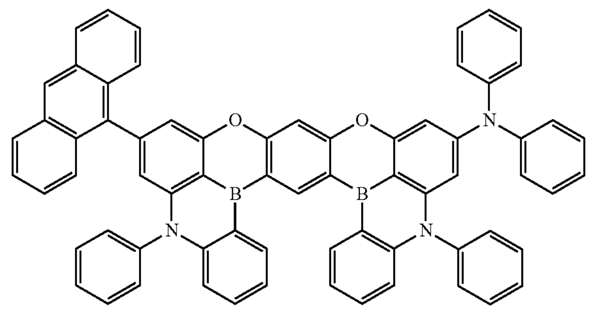
115
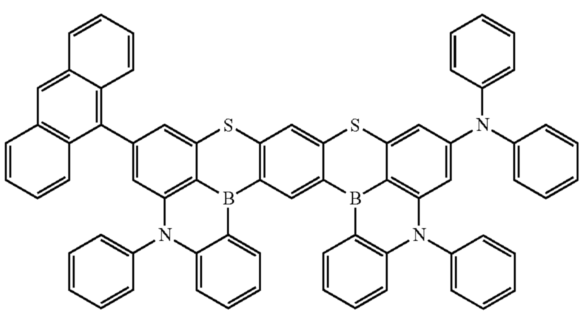
116
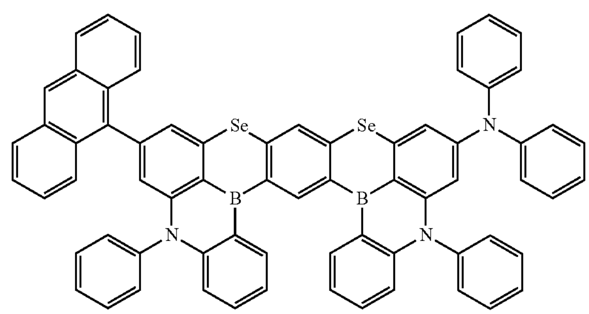
117
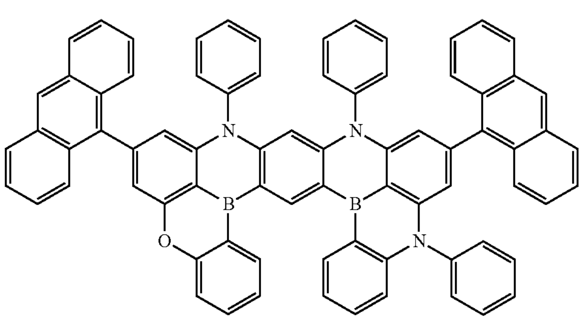
118
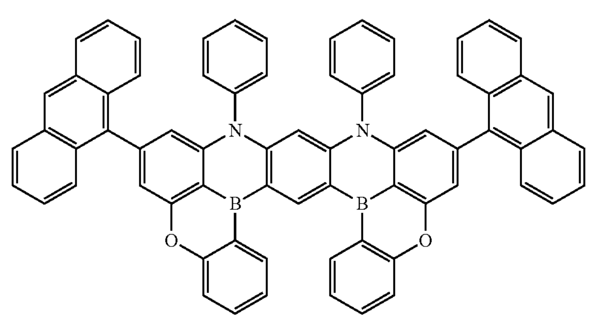

-continued
119
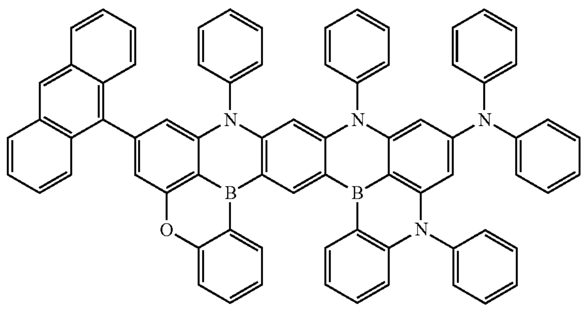
120
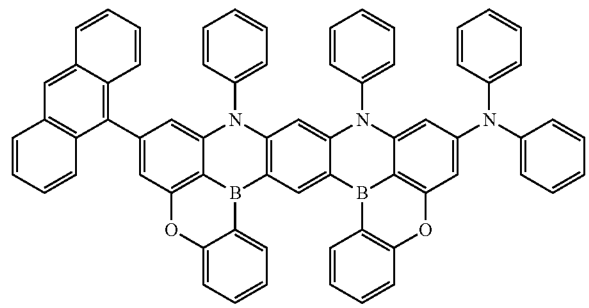
121
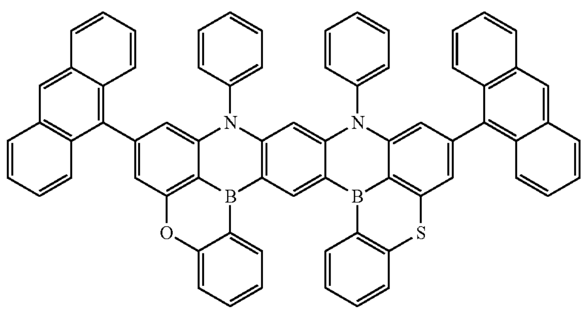
122
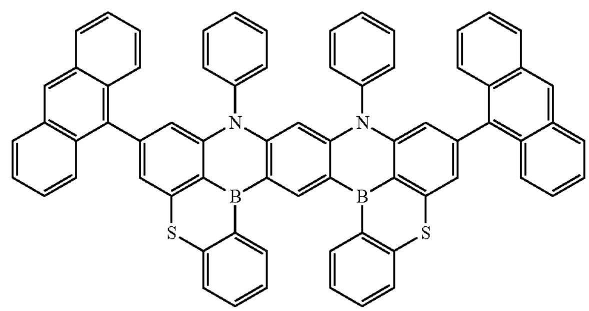
123
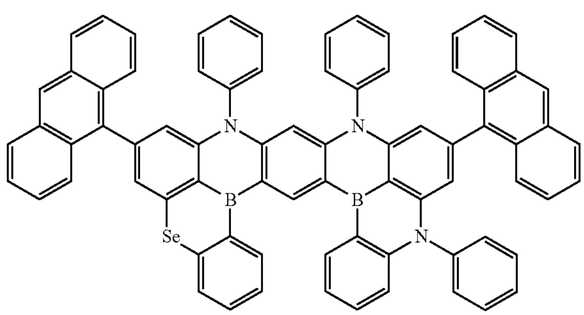
124
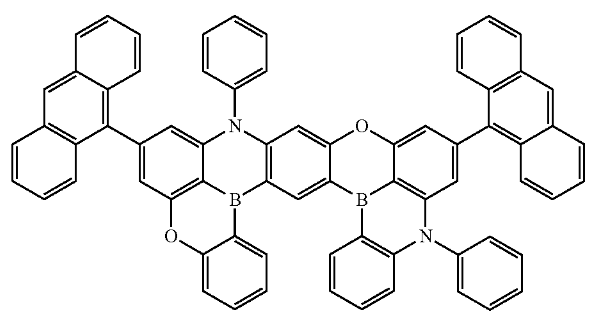
125
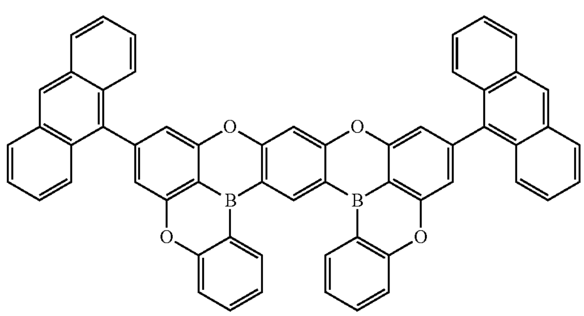
126
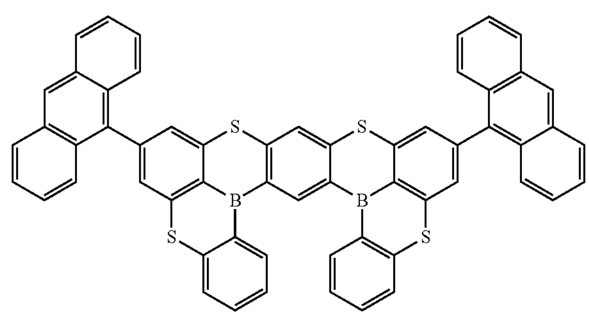
127
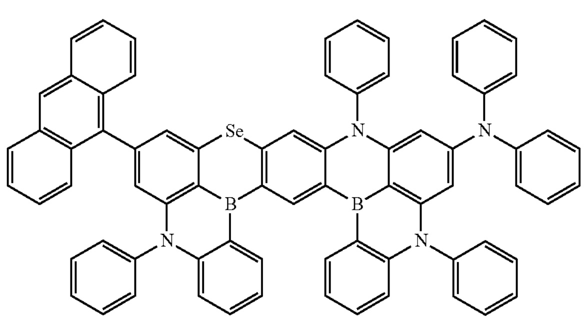
128
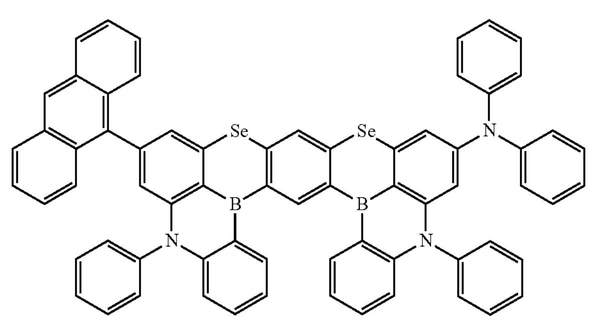

-continued
129
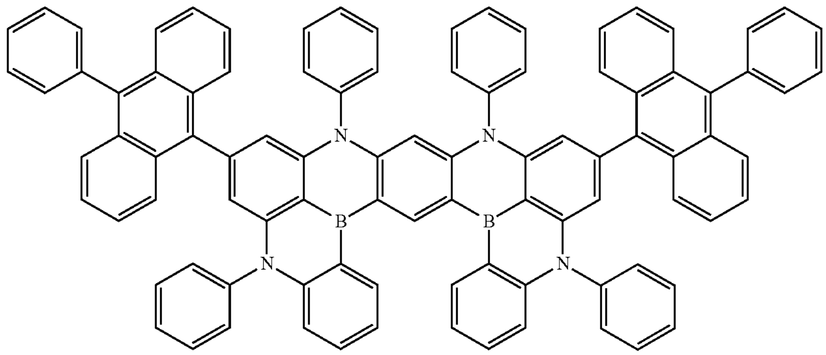
130
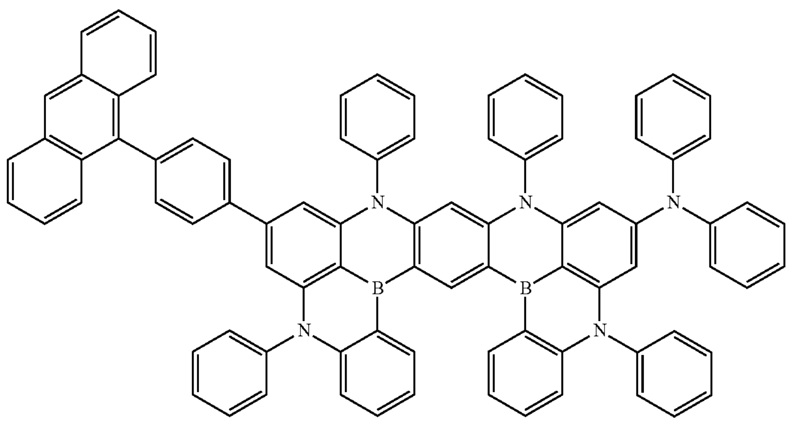
131
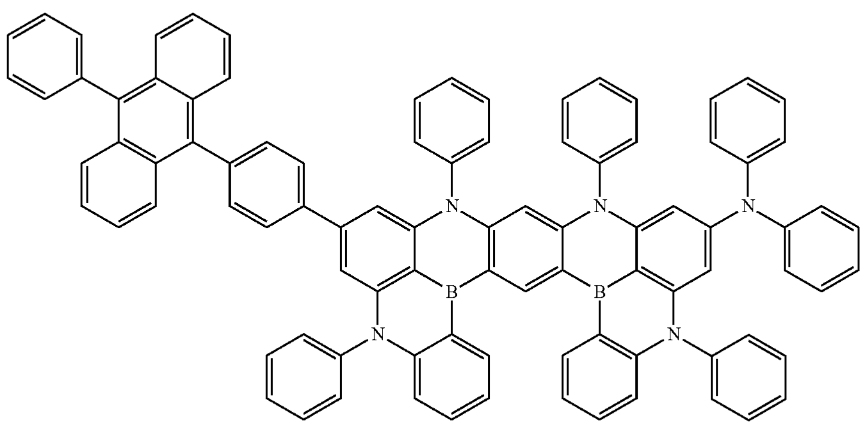
132
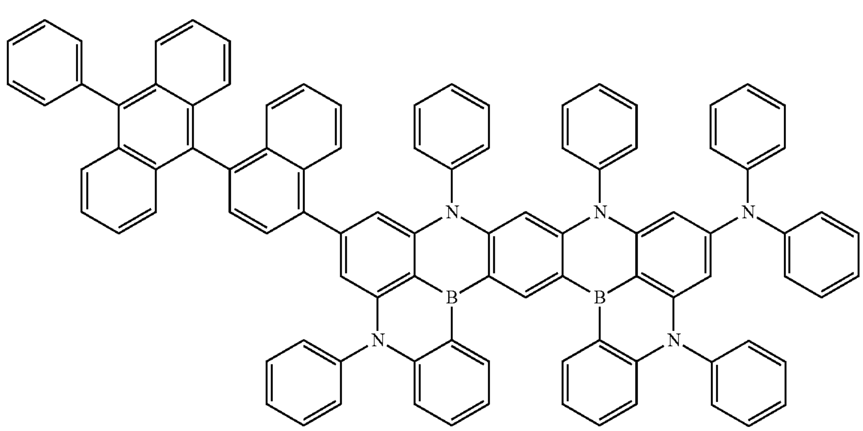

-continued
133
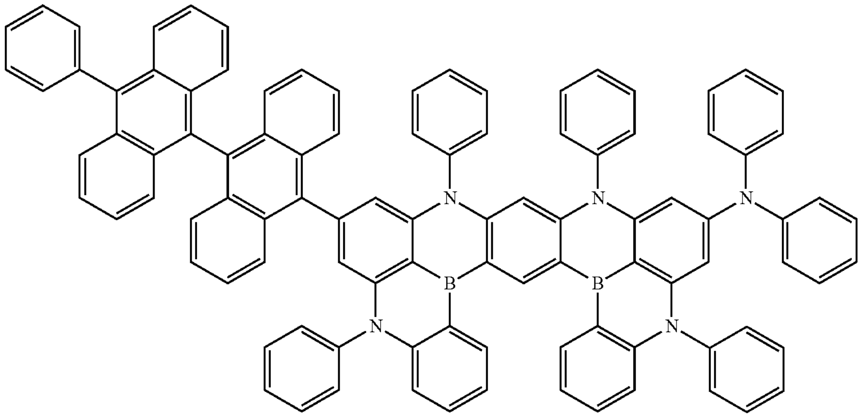
134
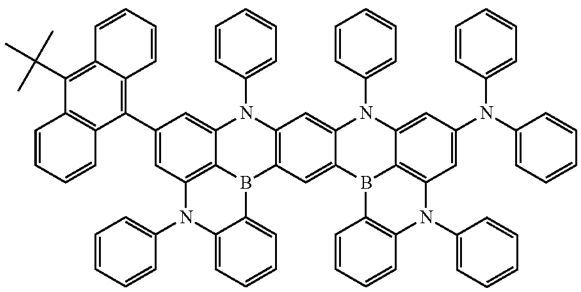
135
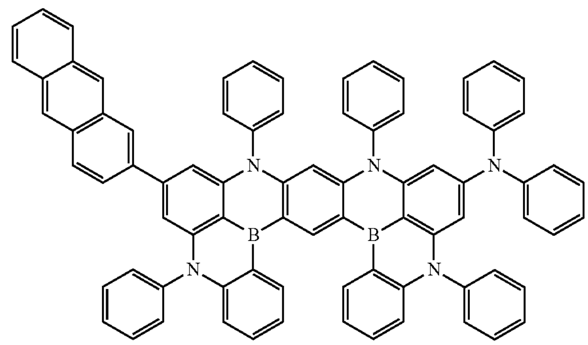
136
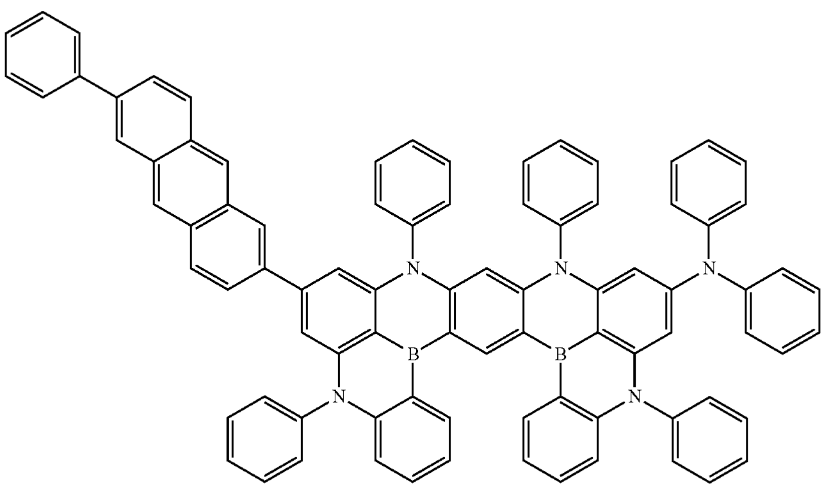
137
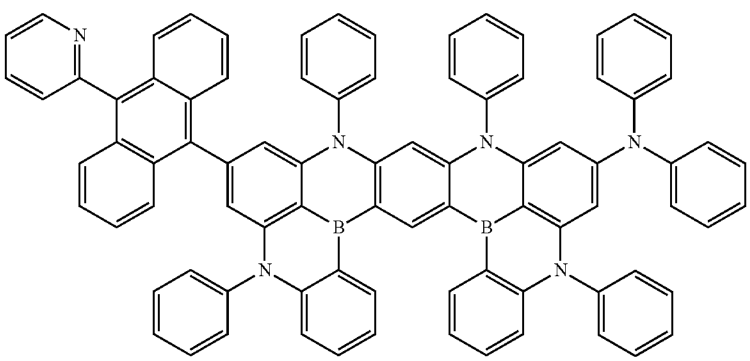

-continued

138

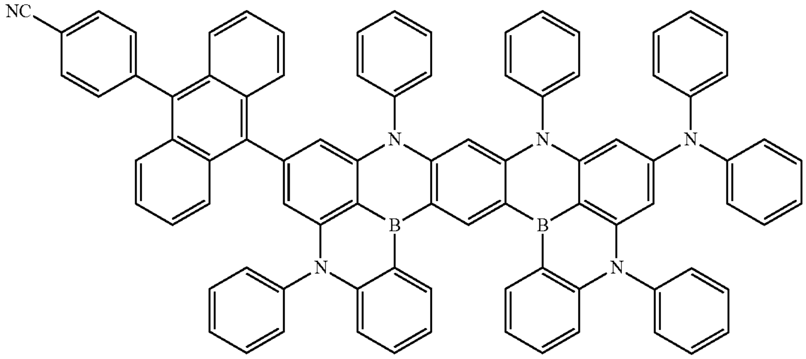

139

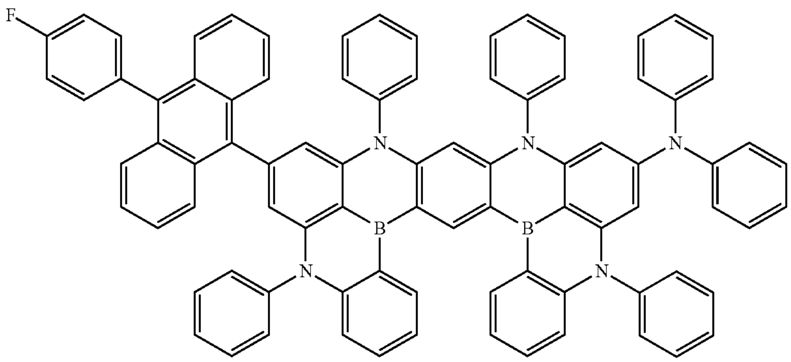

140

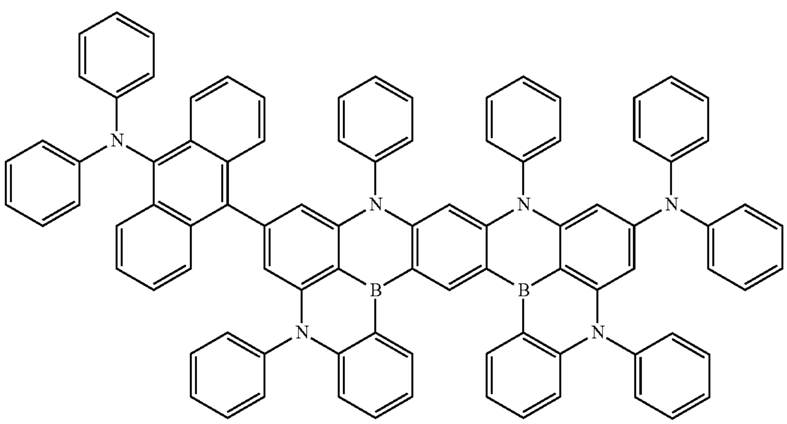

In the light emitting devices ED of embodiments illustrated in FIGS. 3 to 6, the emission layer EML may include a host and a dopant. The polycyclic compound according to an embodiment may be utilized as a dopant material. For example, the polycyclic compound according to an embodiment may be utilized as the dopant material of the emission layer which emits thermally activated delayed fluorescence.

The emission layer EML may further include emission layer materials to be described below, in addition to the polycyclic compound of an embodiment.

The emission layer EML may further include a compound represented by Formula E-1 below. The compound represented by Formula E-1 below may be utilized as a fluorescence host material.

Formula E-1

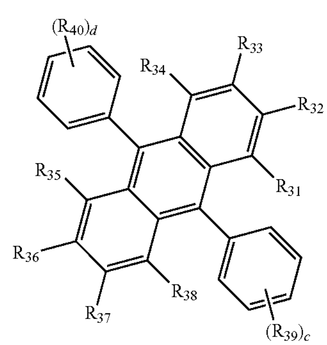

In Formula E-1, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In one or more embodiments, $R_{31}$ to $R_{40}$ may be bonded to an adjacent group to form a saturated hydrocarbon ring or an unsaturated hydrocarbon ring.

In Formula E-1, c and d may be each independently an integer of 0 to 5.

Formula E-1 may be represented by any one selected from among Compound E1 to Compound E19 below:

E1

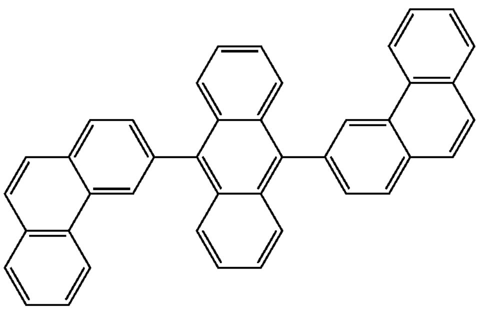

E2

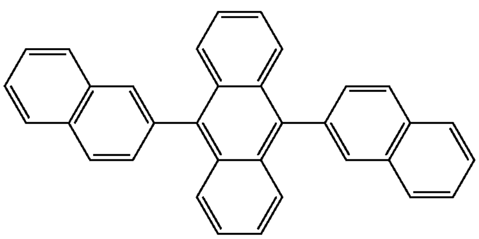

E3

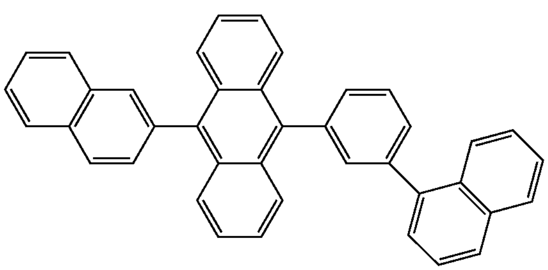

E4

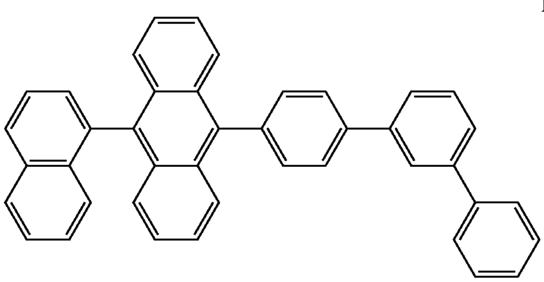

-continued

E5

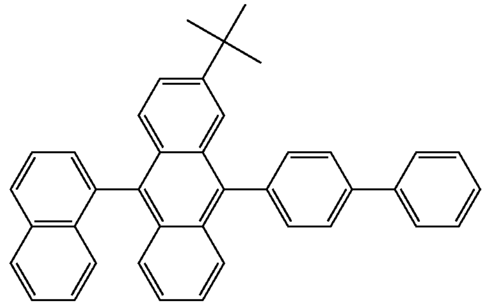

E6

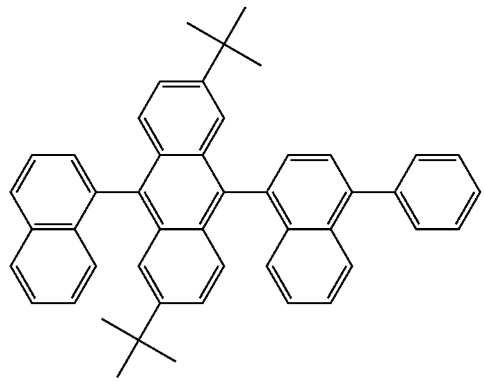

E7

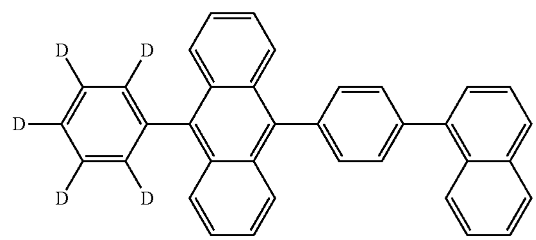

E8

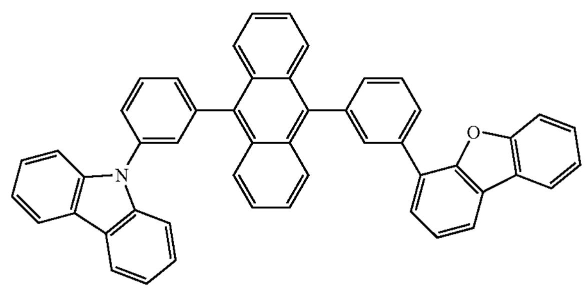

E9

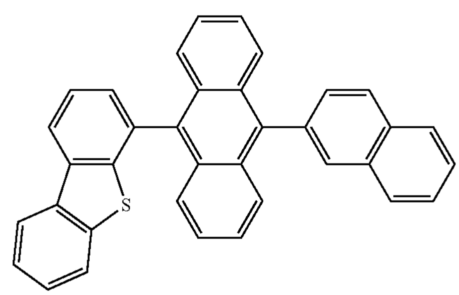

-continued
E10
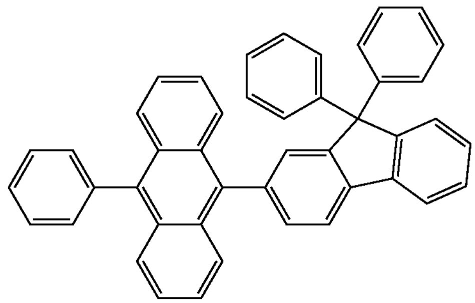
E11
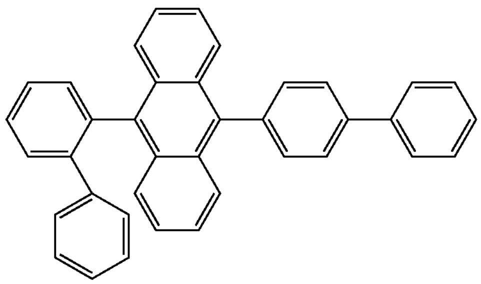
E12
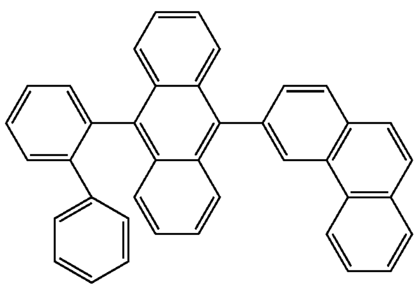
E13
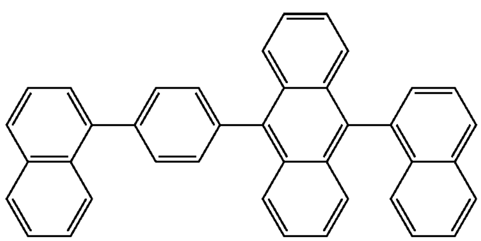
E14
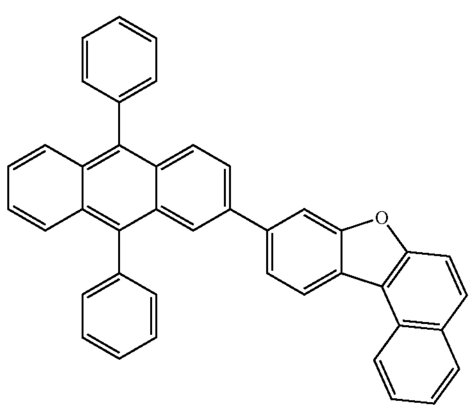
-continued
E15
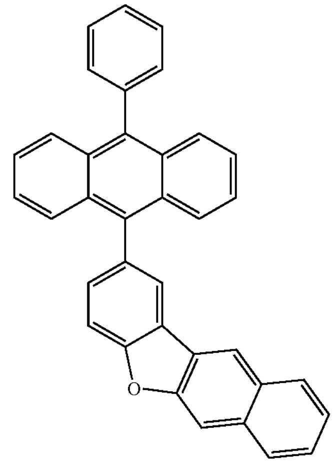
E16
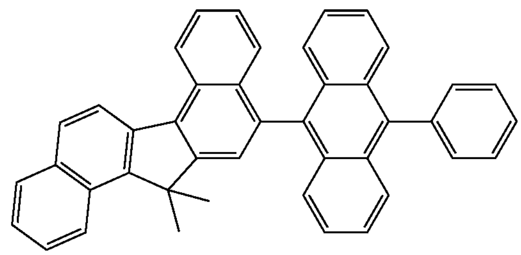
E17
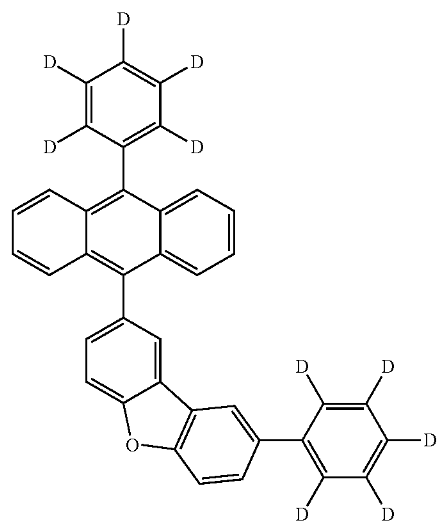
E18
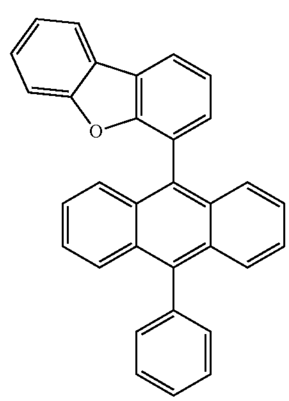

-continued

E19

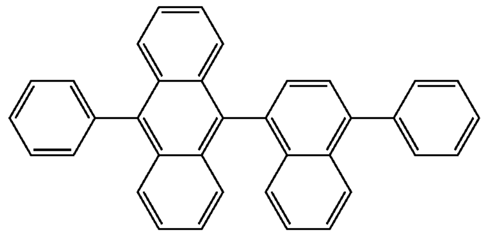

In an embodiment, the emission layer EML may further include a compound represented by Formula E-2a or Formula E-2b below. The compound represented by Formula E-2a or Formula E-2b below may be utilized as a phosphorescence host material.

Formula E-2a

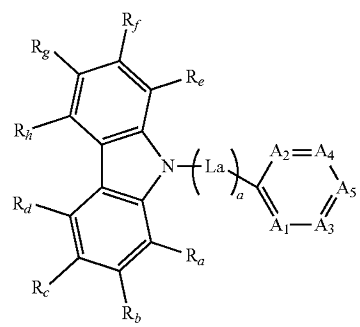

In Formula E-2a, a may be an integer of 0 to 10, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a is an integer of 2 or greater, a plurality of $L_a$'s may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_i$. $R_a$ to R may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $R_a$ to R may be bonded to an adjacent group to form a hydrocarbon ring or a heterocycle containing N, O, S, etc. as a ring-forming atom.

In one or more embodiments, in Formula E-2a, two or three groups selected from among $A_1$ to $A_5$ may be N, and the rest may be $CR_i$.

Formula E-2b $$(\text{Cbz1})-(L_b)_b-(\text{Cbz2})$$

In Formula E-2b, Cbz1 and Cbz2 may be each independently an unsubstituted carbazole group, or a carbazole group substituted with an aryl group having 6 to 30 ring-forming carbon atoms. $L_b$ is a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, b is an integer of 0 to 10, and when b is an integer of 2 or more, a plurality of $L_b$'s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from among the compounds of Compound Group E-2 below. However, the compounds listed in Compound Group E-2 below are examples, the compound represented by Formula E-2a or Formula E-2b is not limited to those represented by Compound Group E-2 below.

Compound Group E-2

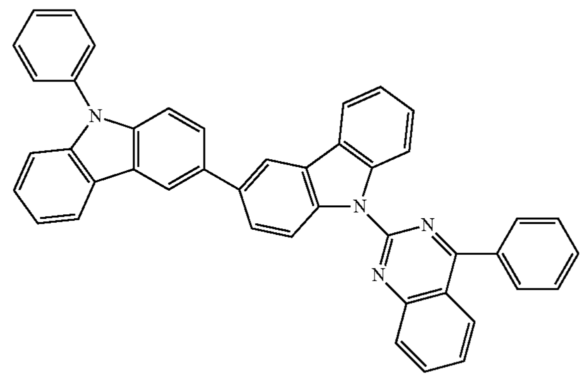

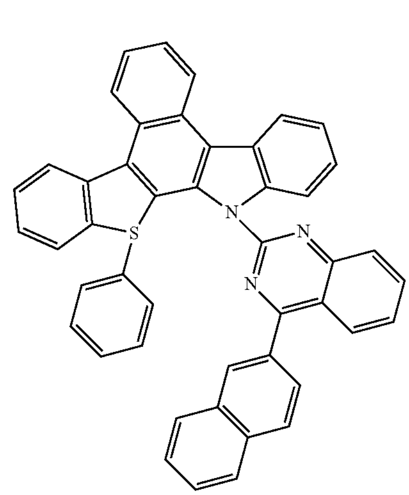

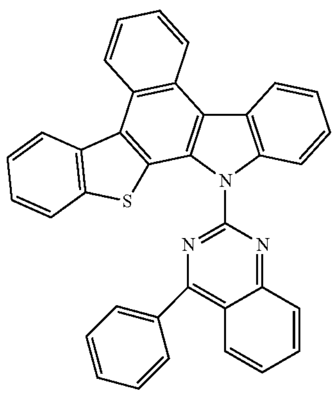
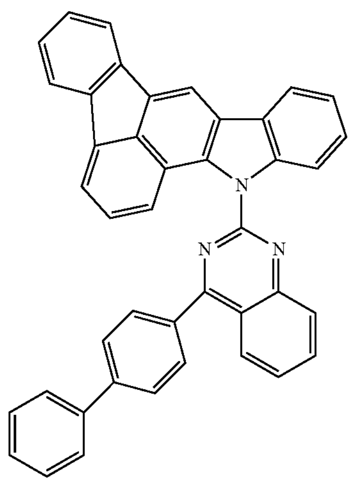
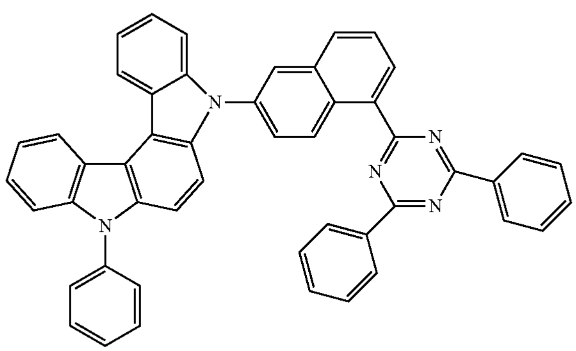
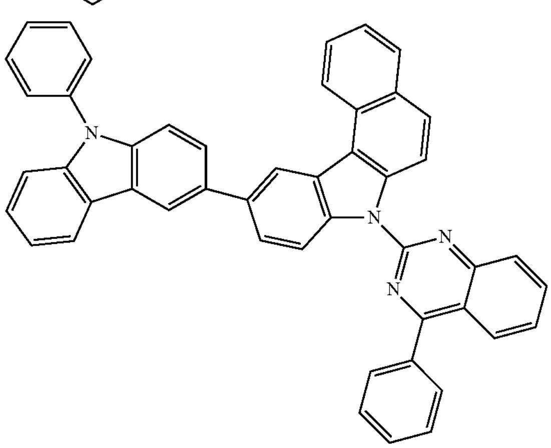
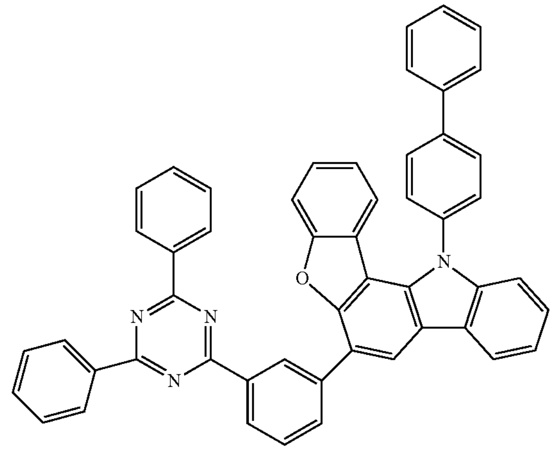
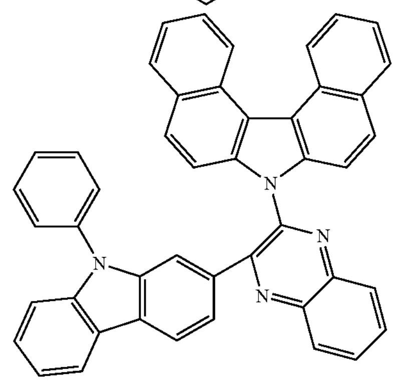
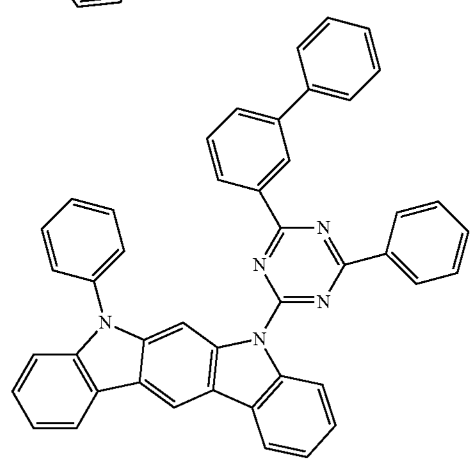
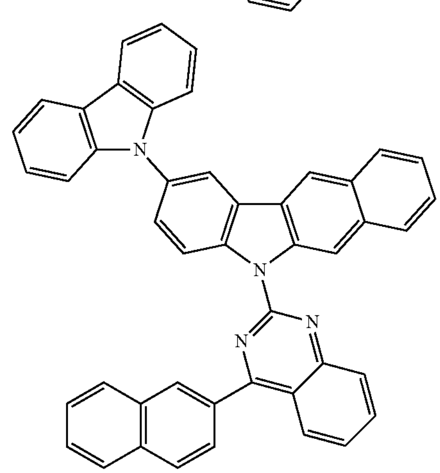

-continued
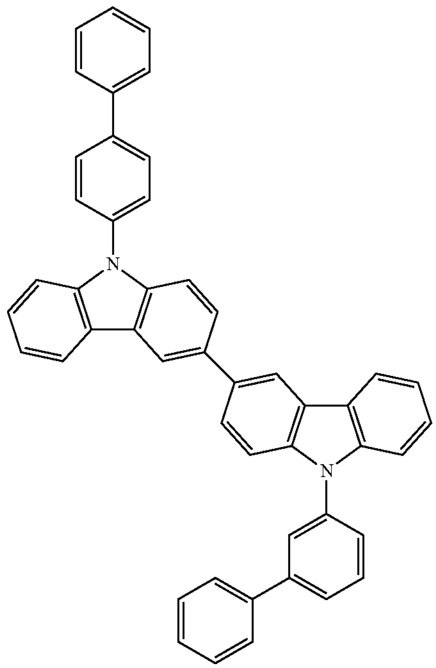
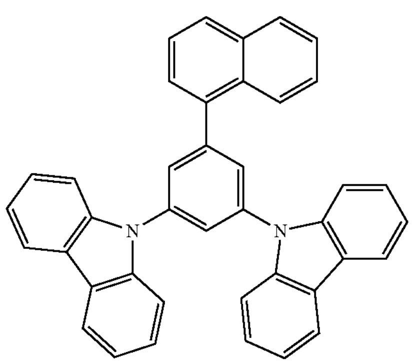
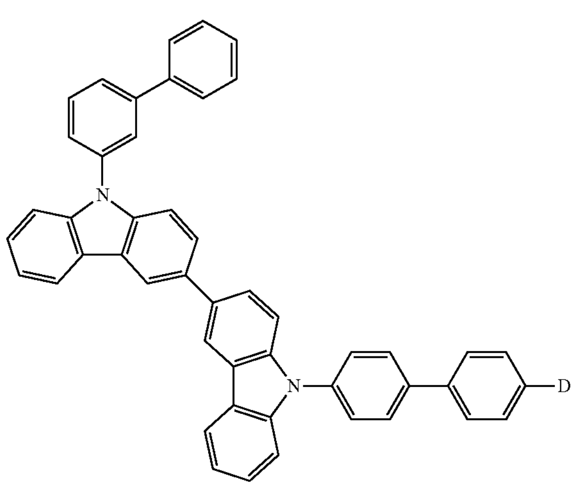
-continued
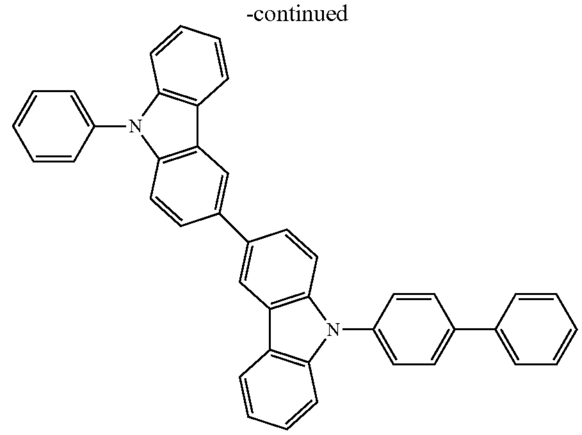
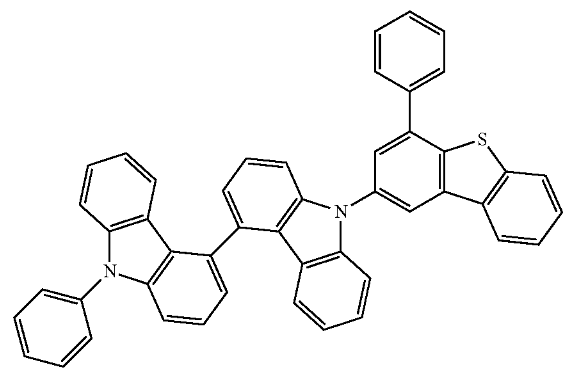
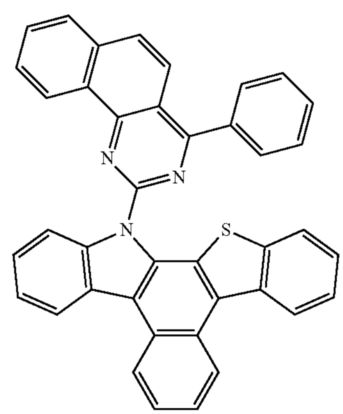
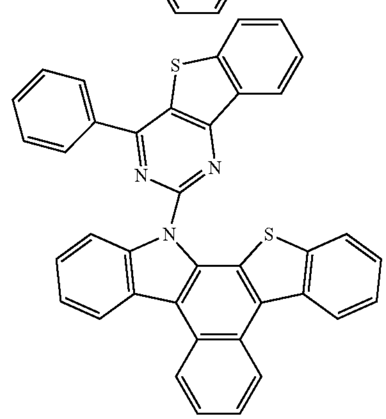

-continued

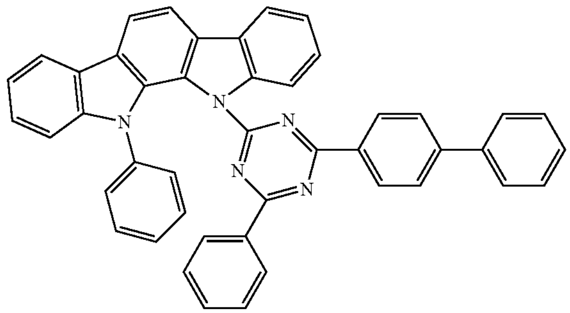

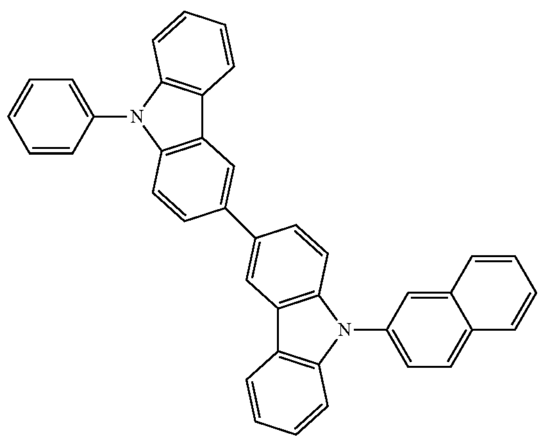

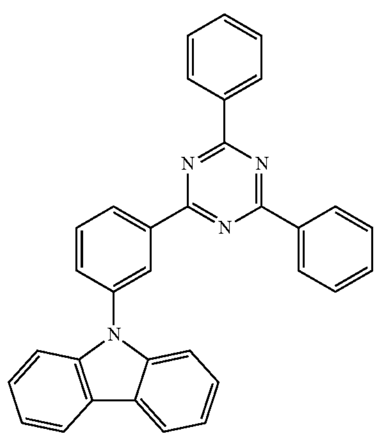

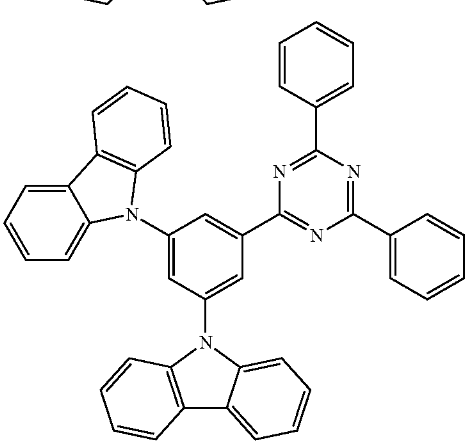

-continued

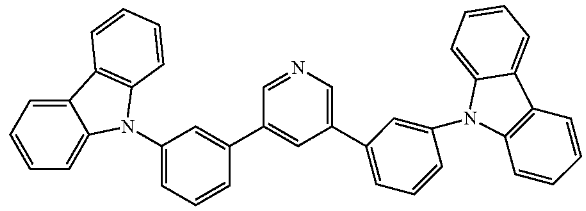

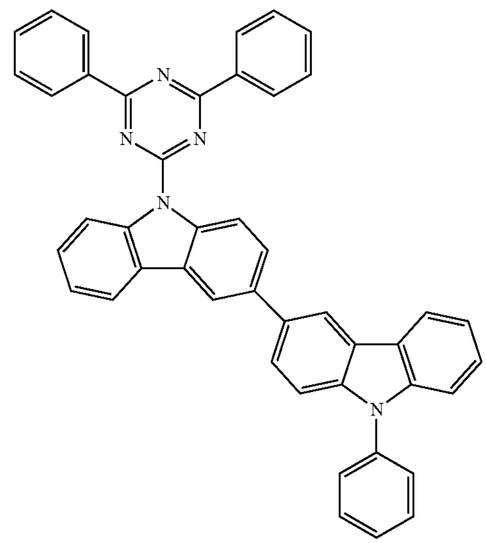

The emission layer EML may further include a generally available material in the art as a host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, the embodiment of the present disclosure is not limited thereto, and for example, tris(8-hydroxyquinolino)aluminum ($Alq_3$), 4,4'-bis(N-carbazolyl)-1,1'-biphenyl (CBP), poly(n-vinylcarbazole (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be utilized as a host material.

The emission layer EML may further include a compound represented by Formula M-a or Formula M-b below. The compound represented by Formula M-a or Formula M-b below may be utilized as a phosphorescence dopant material.

Formula M-a

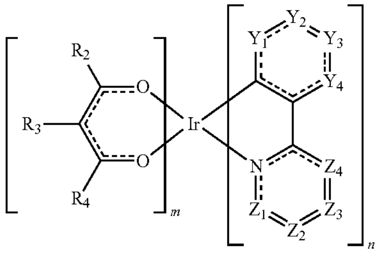

In Formula M-a above, $Y_1$ to $Y_4$ and $Z_1$ to $Z_4$ may be each independently $CR_1$ or N, $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In Formula M-a, m is 0 or 1, and n is 2 or 3. In Formula M-a, when m is 0, n is 3, and when m is 1, n is 2.

The compound represented by Formula M-a may be utilized as a red phosphorescence dopant or a green phosphorescence dopant.

The compound represented by Formula M-a may be represented by any one selected from among Compound M-a1 to Compound M-a19 below. However, Compounds M-a1 to M-a19 below are examples, and the compound represented by Formula M-a is not limited to those represented by Compounds M-a1 to M-a19 below.

M-a1

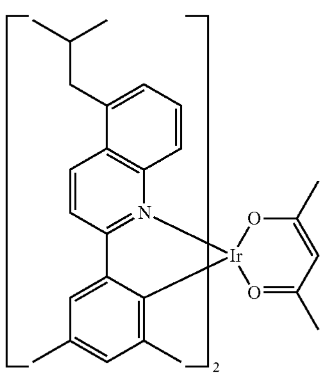

-continued

M-a2

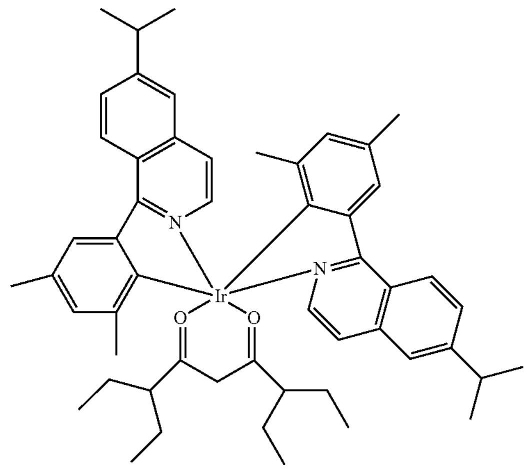

M-a3

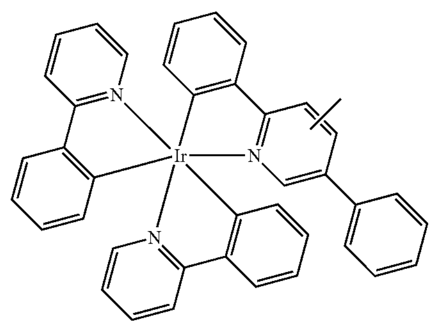

M-a4

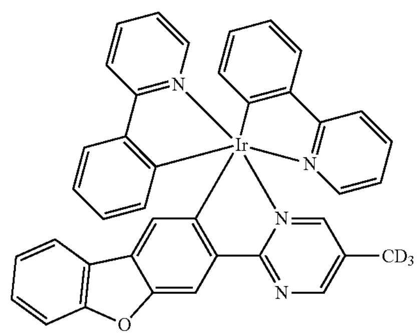

M-a5

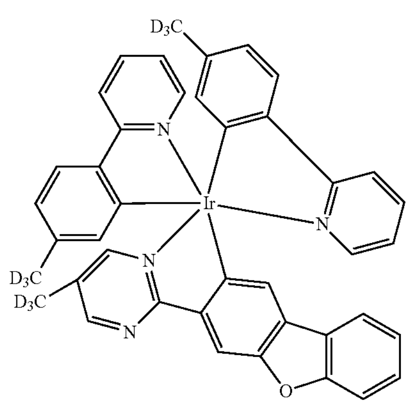

-continued
M-a6
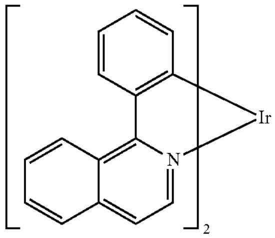
M-a7
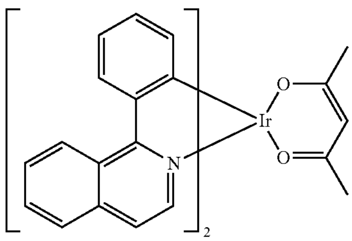
M-a8
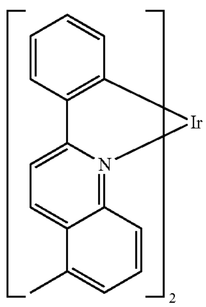
M-a9
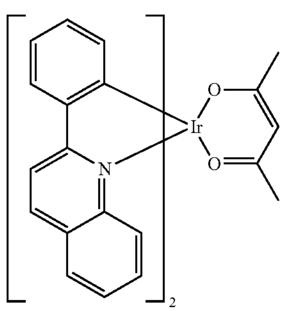
M-a10
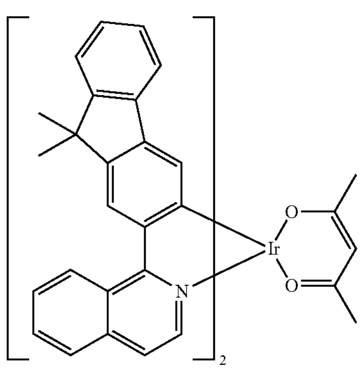
-continued
M-a11
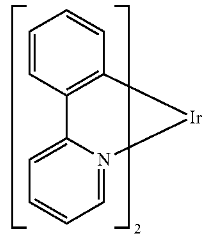
M-a12
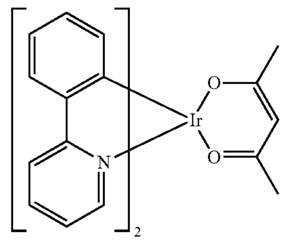
M-a13
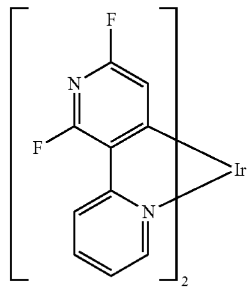
M-a14
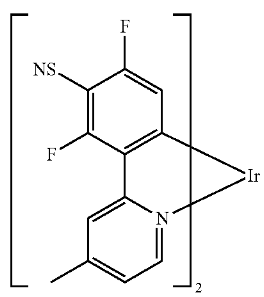
M-a15
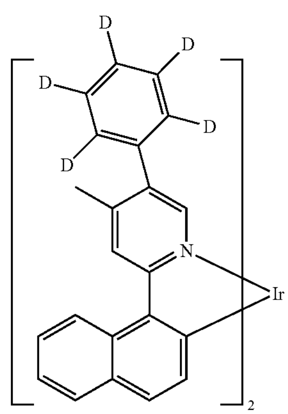

-continued

M-a16

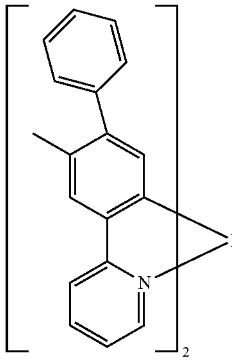

M-a17

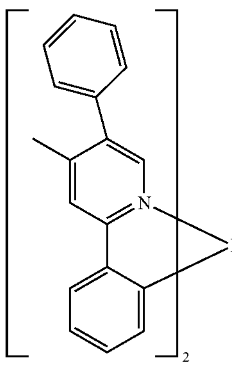

M-a18

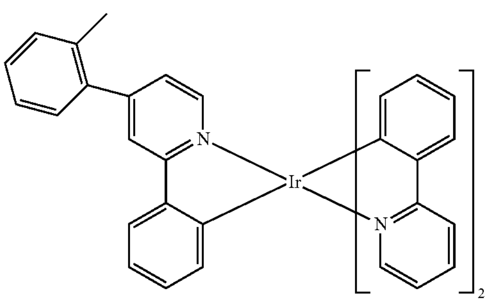

M-a19

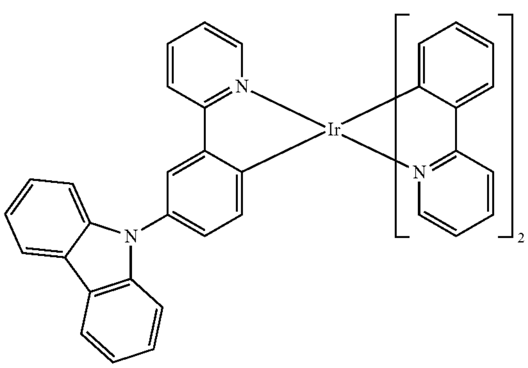

Compound M-a1 and Compound M-a2 may be utilized as a red dopant material, and Compound M-a3 to Compound M-a5 may be utilized as a green dopant material.

Formula M-b

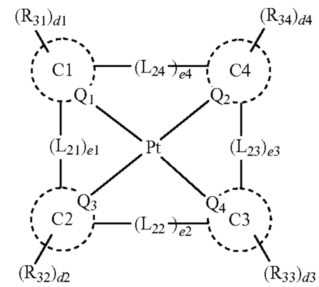

In Formula M-b, $Q_1$ to $Q_4$ are each independently C or N, and $C_1$ to $C_4$ are each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ are each independently a direct linkage,

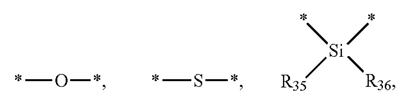

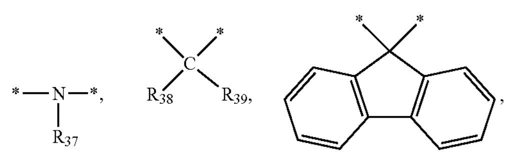

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, and dl to d4 are each independently an integer of 0 to 4.

The compound represented by Formula M-b may be utilized as a blue phosphorescence dopant or a green phosphorescence dopant.

The compound represented by Formula M-b may be represented by any one of the compounds below. However, the compounds below are examples, and the compound represented by Formula M-b is not limited to those represented by the compounds below.

-continued
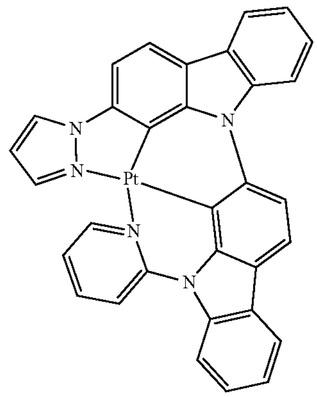
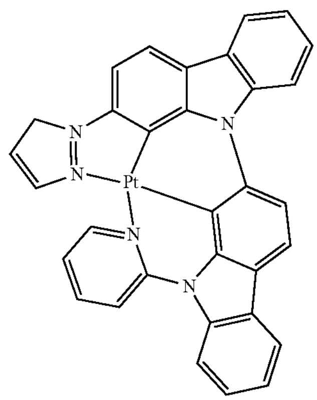
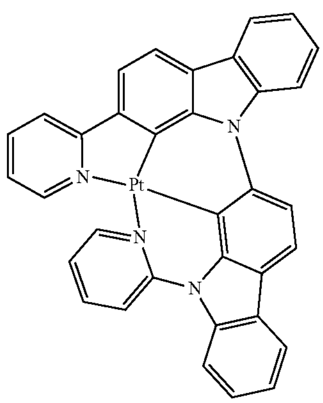
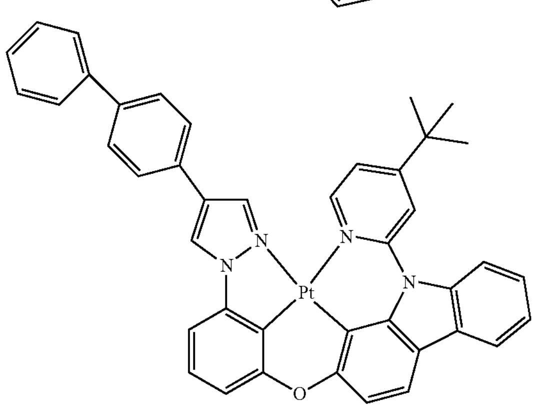
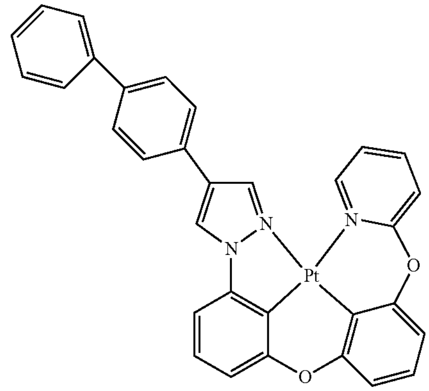
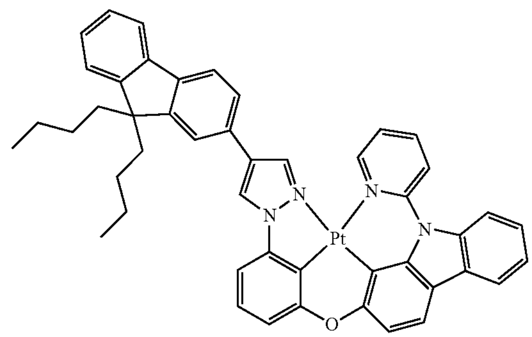
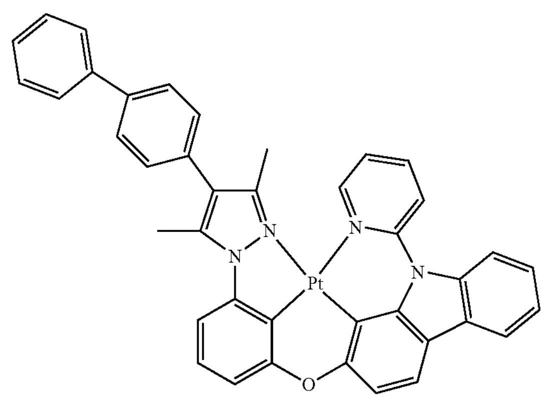
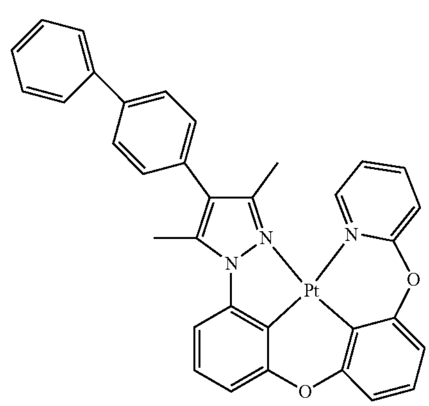

-continued

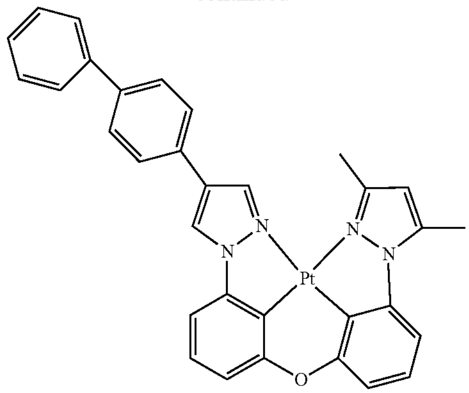

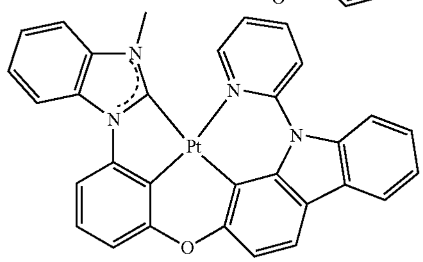

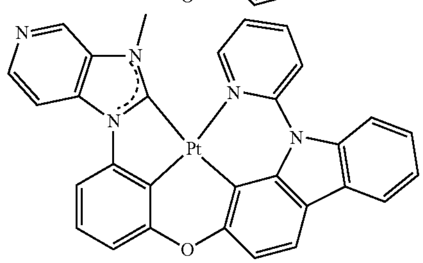

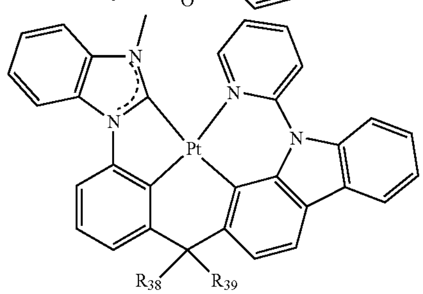

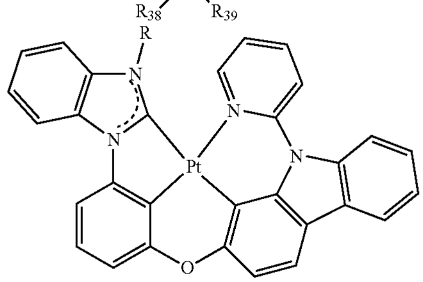

In the compounds, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include a compound represented by any one selected from among Formula F-a to Formula F-c below. The compound represented by Formula F-a or Formula F-c below may be utilized as a fluorescence dopant material.

Formula F-a

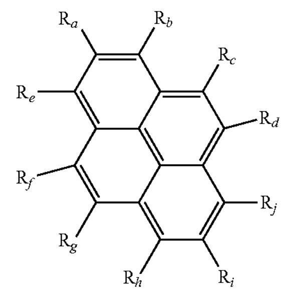

In Formula F-a, two selected from among $R_a$ to $R_j$ may each independently be substituted with $*$— $NAr_1Ar_2$ The others, which are not substituted with $*$— $NAr_1Ar_2$, selected from among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In $*$— $NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

Formula F-b

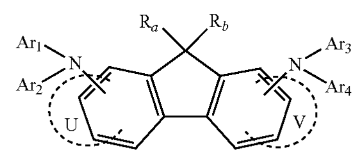

In Formula F-b, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, when the number of U or V is 1, it represents that one ring forms a condensed ring at a part described as U or V, and when the number of U or V is 0, a ring described as U or V is not present. For example, when the number of U is 0 and the number of V is 1, or when the number of U is 1 and the number of V is 0, the condensed ring having a fluorene core of Formula F-b may be a four-ring cyclic compound. In addition, when each number of U and V is 0, the condensed ring of Formula F-b may be a three-ring cyclic compound. In addition, when each number of U and V is 1, the condensed ring having a fluorene core of Formula F-b may be a five-ring cyclic compound.

Formula F-c

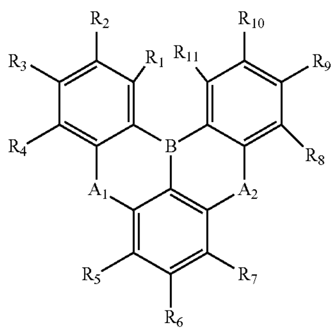

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring.

In Formula F-c, $A_1$ and $A_2$ may each independently be bonded to substituents of an adjacent ring to form a condensed ring. For example, when $A_1$ and $A_2$ are each independently $NR_m$, $A_1$ may be bonded to $R_4$ or $R_5$ to form a ring. In addition, $A_2$ may be bonded to $R_7$ or $R_8$ to form a ring.

In an embodiment, the emission layer EML may further include, as a generally available dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenz enamine (N-BDAVBi), 4,4'-bis[2-(4-(N,N-diphenylamino)phenyl)vinyl]biphenyl(DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, 1,4-bis(N,N-diphenylamino)pyrene), etc.

The emission layer EML may further include a generally available phosphorescence dopant material. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be utilized as a phosphorescence dopant. For example, iridium (III) bis(4,6-difluorophenylpyridinato-N,C2)-picolinate (Flrpic), bis(2,4-difluorophenylpyridinato)-tetrakis(1-pyrazolyl)borate iridium(III) (Fir6), and/or platinum octaethyl porphyrin (PtOEP) may be utilized as a phosphorescence dopant. However, the embodiment of the present disclosure is not limited thereto.

The emission layer EML may include a quantum dot material. The core of the quantum dot may be selected from among a Group II-VI compound, a Group III-VI compound, a Group I-III-VI compound, a Group III-V compound, a Group III-II-V compound, a Group IV-VI compound, a Group IV element, a Group IV compound, and a combination thereof.

A Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

A Group compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, and/or a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In one or more embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In tone or more embodiments, the binary compound, the ternary compound, and/or the quaternary compound may be present in particles in a uniform (e.g., substantially uniform) concentration distribution, or may be present in the same particle in a partially different concentration distribution. In addition, the quantum dot may have a core/shell structure in which one quantum dot surrounds another quantum dot. In a core/shell structure, the interface of the shell may have a concentration gradient in which the concentration of an element present in the shell becomes lower towards the core. For example, in a core/shell structure, a concentration gradient may be present in which the concentration of an element present in the shell becomes lower towards the center of the core.

In some embodiments, a quantum dot may have the above-described core-shell structure including a core containing nanocrystals and a shell surrounding the core. The shell of the quantum dot may serve as a protection layer to prevent or reduce the chemical deformation of the core so as to maintain semiconductor properties, and/or a charging layer to impart electrophoresis properties to the quantum dot. The shell may be a single layer or a multilayer. An example of the shell of the quantum dot may include a metal oxide, a non-metal oxide, a semiconductor compound, or a combination thereof.

For example, the metal oxide and/or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$, but the embodiment of the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

The quantum dot may have a full width of half maximum (FWHM) of a light emission wavelength spectrum of about 45 nm or less, about 40 nm or less, or about 30 nm or less, and color purity or color reproducibility may be improved in the above ranges. In addition, light emitted through such a quantum dot is emitted in all directions, and thus a wide viewing angle may be improved.

In addition, although the form of a quantum dot is not particularly limited as long as it is a form commonly utilized in the art, for example, a quantum dot in the form of spherical, pyramidal, multi-arm, and/or cubic nanoparticles, nanotubes, nanowires, nanofibers, nanoparticles, etc. may be utilized.

The quantum dot may control the color of emitted light according to the particle size thereof. Accordingly, the quantum dot may have various suitable light emission colors such as blue, red, and/or green.

In each light emitting device ED of embodiments illustrated in FIGS. 3 to 6, the electron transport region ETR is provided on the emission layer EML. The electron transport region ETR may include at least one of the hole blocking layer HBL, the electron transport layer ETL, or the electron injection layer EIL, but the embodiment of the present disclosure is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL or a hole blocking layer HBL/electron transport layer ETL/electron injection layer EIL are stacked in the stated order from the emission layer EML, but the embodiment of the present disclosure is not limited thereto. The electron transport region ETR may have a thickness, for example, from about 1,000 Å to about 1,500 Å.

The electron transport region ETR may be formed by utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

Formula ET-1

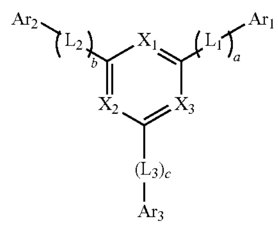

In Formula ET-1, at least one selected from among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_a$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a to c are each an integer of 2 or more, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl) phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1-biphenyl-4-olato) aluminum (BAlq), berylliumbis(benzoquinolin-10-olate ($Bebq_2$), 9,10-di(naphthalene-2-yl)anthracene (ADN), 1,3-Bis[3,5-di(pyridin-3-yl)phenyl]benzene (BmPyPhB), or a mixture thereof.

In addition, the electron transport regions ETR may include a metal halide such as LiF, NaCl, CsF, RbCl, RbI, CuI, and/or KI, a lanthanide metal such as Yb, and/or a co-deposited material of the metal halide and the lanthanide metal. For example, the electron transport region ETR may include KI:Yb, RbI:Yb, etc., as a co-deposited material. In one or more embodiments, the electron transport region ETR may be formed utilizing a metal oxide such as $Li_2O$ and/or BaO, 8-hydroxyl-lithium quinolate (Liq), etc., but the embodiment of the present disclosure is not limited thereto. The electron transport region ETR may also be formed of a mixture material of an electron transport material and an insulating organometallic salt. The organometallic salt may be a material having an energy band gap of about 4 eV or more. For example, the organometallic salt may include, for example, metal acetates, metal benzoates, metal acetoacetates, metal acetylacetonates, and/or metal stearates.

The electron transport region ETR may further include 2,9-dimethyl-4,7-diphenyl-1,10-phenanthroline (BCP), and/or 4,7-diphenyl-1,10-phenanthroline (Bphen) in addition to the above-described materials, but the embodiment of the present disclosure is not limited thereto.

The electron transport region ETR may include the above-described compounds of the hole transport region in at least one of the electron injection layer EIL, the electron transport layer ETL, or the hole blocking layer HBL.

When the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies the aforementioned ranges, satisfactory electron transport characteristics may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies the above-described ranges, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but the embodiment of the present disclosure is not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Sn, Zn, or a compound or mixture thereof (e.g., AgMg, AgYb, and/or MgAg). In one or more embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In one or more embodiments, the second electrode EL2 may be connected with an auxiliary electrode. If the second electrode EL2 is connected with the auxiliary electrode, the resistance of the second electrode EL2 may be decreased.

In one or more embodiments, a capping layer CPL may further be on the second electrode EL2 of the light emitting device ED of an embodiment. The capping layer CPL may include a multilayer or a single layer.

In an embodiment, the capping layer CPL may be an organic layer or an inorganic layer. For example, when the capping layer CPL includes an inorganic material, the inorganic material may include an alkaline metal compound such as LiF, an alkaline earth metal compound such as $MgF_2$, SiON, $SiN_x$, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol sol-9-yl)triphenylamine (TCTA), an epoxy resin, and/or acrylate (such as methacrylate). However, the embodiment of the present disclosure is not limited thereto, and the capping layer CPL may include at least one selected from among Compounds P1 to P5 below:

P1

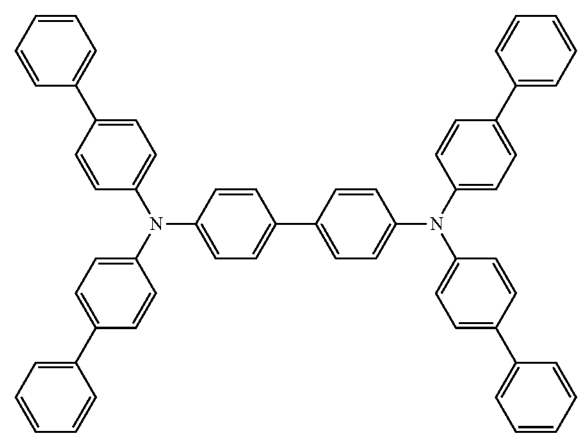

P2

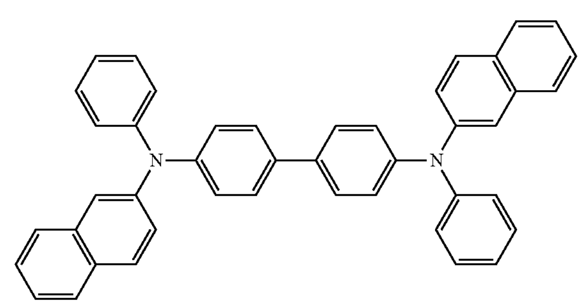

-continued

P3

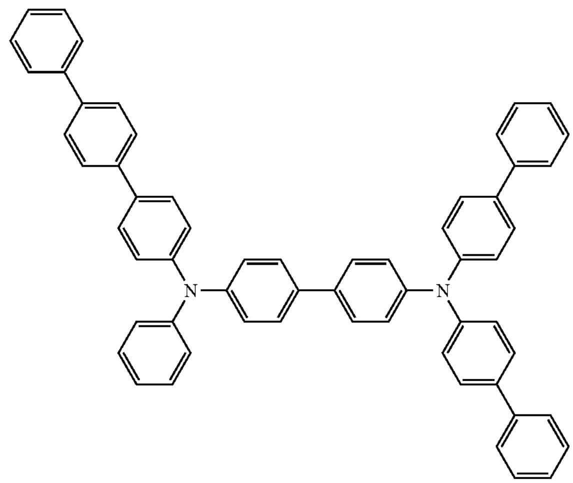

P4

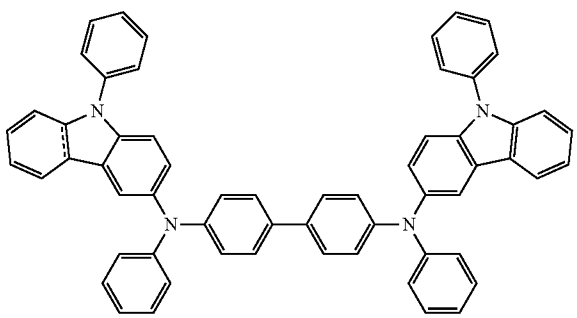

P5

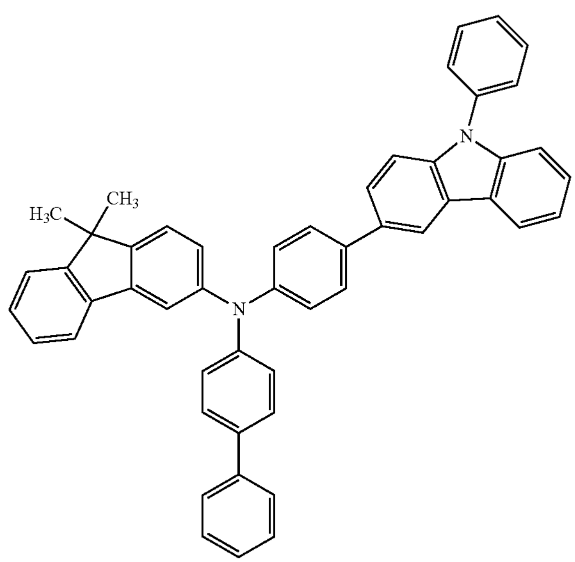

In one or more embodiments, the refractive index of the capping layer CPL may be about 1.6 or more. For example, the refractive index of the capping layer CPL may be about 1.6 or more with respect to light in a wavelength range of about 550 nm to about 660 nm.

Figure 7:
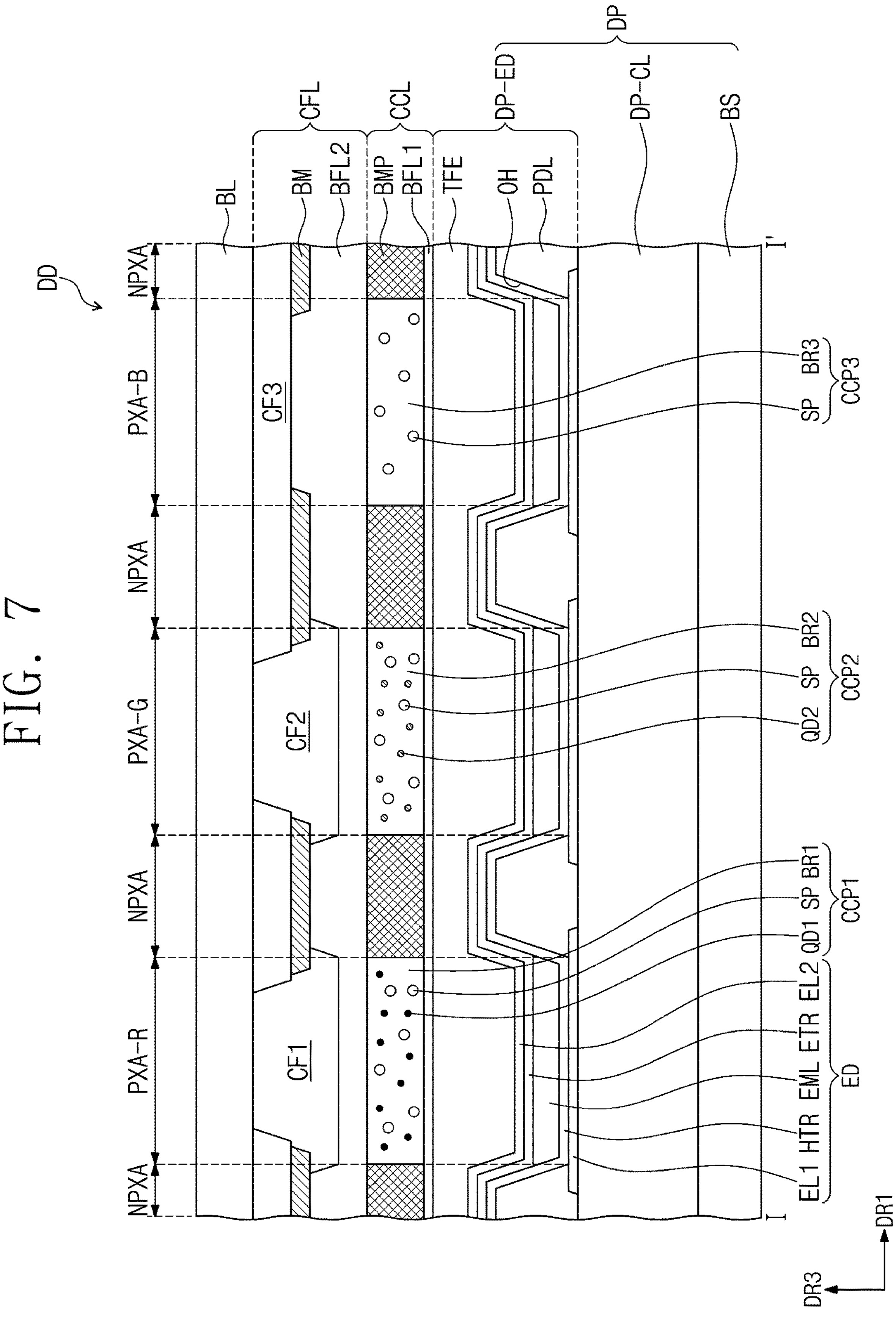
FIG. 7 is a cross-sectional view of a display apparatus according to an embodiment of the present disclosure.
Figure 8:
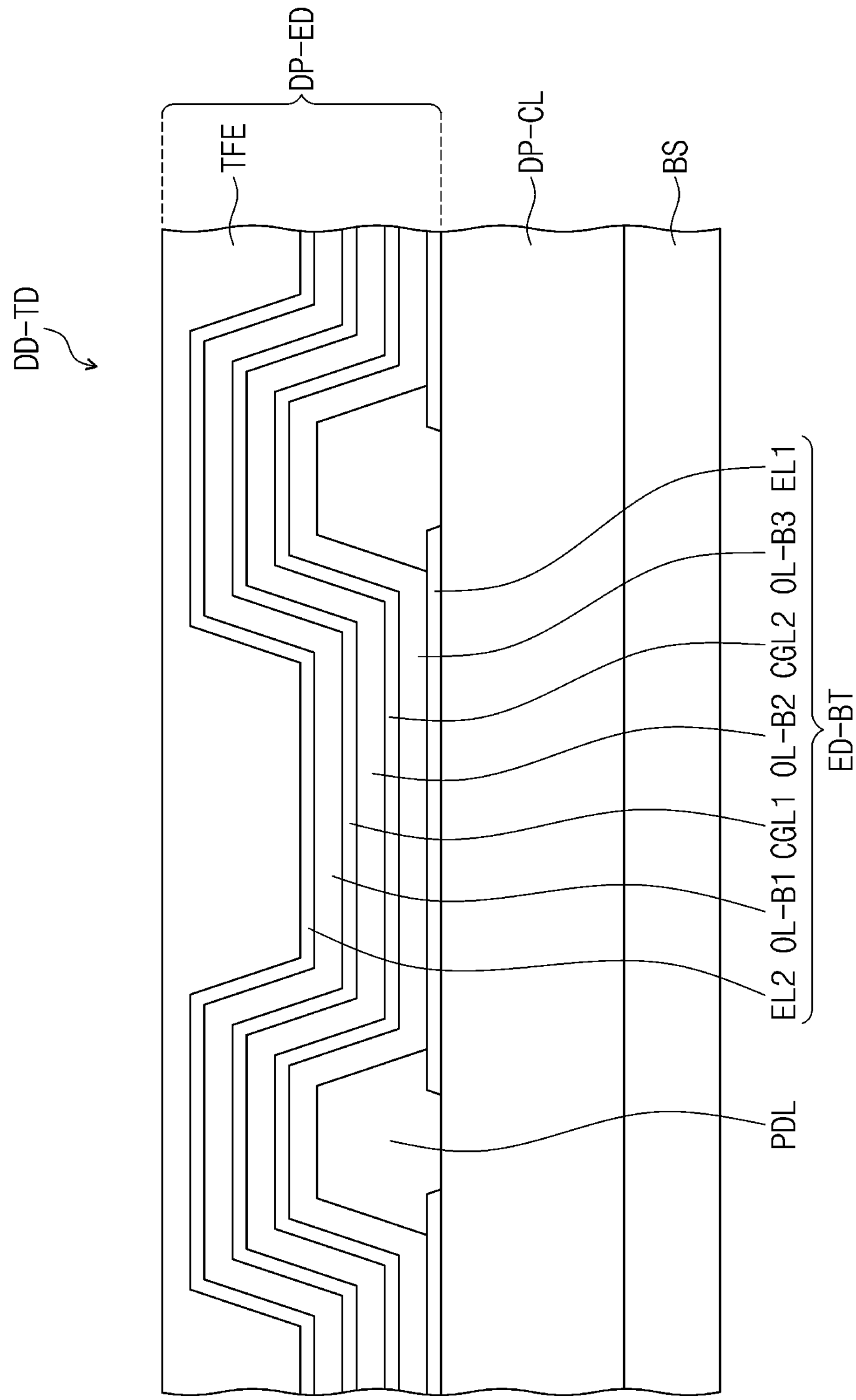
FIG. 8 is a cross-sectional view of a display apparatus according to an embodiment of the present disclosure.

FIGS. 7 and 8 each are a cross-sectional view of a display apparatus according to an embodiment. Hereinafter, in describing the display apparatus of an embodiment with reference to FIGS. 7 and 8, the duplicated features which have been described with respect to FIGS. 1 to 6 are not described again, but their differences will be mainly described.

Referring to FIG. 7, the display apparatus DD according to an embodiment may include a display panel DP including a display device layer DP-ED, a light control layer CCL on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. In one or more embodiments, the structures of the light emitting devices of FIGS. 3 to 6 as described above may be equally applied to the structure of the light emitting device ED shown in FIG. 7.

Referring to FIG. 7, the emission layer EML may be in an opening OH defined in a pixel defining film PDL. For example, the emission layer EML which is divided by the pixel defining film PDL and is provided corresponding to each light emitting regions PXA-R, PXA-G, and PXA-B may emit light in the same wavelength range. In the display apparatus DD of an embodiment, the emission layer EML may emit blue light. In one or more embodiments, the emission layer EML may be provided as a common layer in the entire light emitting regions PXA-R, PXA-G, and PXA-B.

The light control layer CCL may be on the display panel DP. The light control layer CCL may include a light conversion body. The light conversion body may be a quantum dot, a phosphor, and/or the like. The light conversion body may emit light by converting the wavelength of light provided to the light conversion body to light having a different wavelength. That is, the light control layer CCL may include a layer containing the quantum dot and/or a layer containing the phosphor.

The light control layer CCL may include a plurality of light control units CCP1, CCP2 and CCP3. The light control units CCP1, CCP2, and CCP3 may be spaced apart from one another.

Referring to FIG. 7, divided patterns BMP may be between respective ones of the light control units CCP1, CCP2 and CCP3 which are spaced apart from each other, but the embodiment of the present disclosure is not limited thereto. FIG. 7 illustrates that the divided patterns BMP do not overlap the light control units CCP1, CCP2 and CCP3, but at least a portion of the edges of the light control units CCP1, CCP2 and CCP3 may overlap the divided patterns BMP.

The light control layer CCL may include a first light control unit CCP1 containing a first quantum dot QD1 which converts a first color light provided from the light emitting device ED into a second color light, a second light control unit CCP2 containing a second quantum dot QD2 which converts the first color light into a third color light, and a third light control unit CCP3 which transmits the first color light.

In an embodiment, the first light control unit CCP1 may provide red light as the second color light, and the second light control unit CCP2 may provide green light as the third color light. The third light control unit CCP3 may provide the first color light by transmitting blue light (that is the first color light provided in the luminescence device ED). For example, the first quantum dot QD1 may be a red quantum dot, and the second quantum dot QD2 may be a green quantum dot. The same as described above may be applied with respect to the quantum dots QD1 and QD2.

In addition, the light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include any quantum dot but include the scatterer SP.

The scatterer SP may be inorganic particles. For example, the scatterer SP may include at least one of $TiO_2$, ZnO, $Al_2O_3$, $SiO_2$, or hollow silica. The scatterer SP may include any one of $TiO_2$, ZnO, $Al_2O_3$, $SiO_2$, or hollow silica, or may be a mixture of at least two materials selected from among $TiO_2$, ZnO, $Al_2O_3$, $SiO_2$, and hollow silica.

The first light control unit CCP1, the second light control unit CCP2, and the third light control unit CCP3 each may include base resins BR1, BR2, and BR3 in which the quantum dots QD1, QD2 and the scatterer SP are dispersed. In an embodiment, the first light control unit CCP1 may include the first quantum dot QD1 and the scatterer SP dispersed in a first base resin BR1, the second light control unit CCP2 may include the second quantum dot QD2 and the scatterer SP dispersed in a second base resin BR2, and the third light control unit CCP3 may include the scatterer SP dispersed in a third base resin BR3. The base resins BR1, BR2, and BR3 are media in which the quantum dots QD1 and QD2 and the scatterer SP are dispersed, and may be formed of various suitable resin compositions, which may be generally referred to as a binder.

For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be on the light control units CCP1, CCP2, and CCP3 to block or reduce exposure of the light control units CCP1, CCP2 and CCP3 to moisture/oxygen. In one or more embodiments, the barrier layer BFL1 may cover the light control units CCP1, CCP2, and CCP3. In addition, the barrier layer BFL1 may be provided between the light control units CCP1, CCP2, and CCP3 and the color filter layer CFL.

The barrier layers BFL1 and BFL2 may include at least one inorganic layer. That is, the barrier layers BFL1 and BFL2 may include an inorganic material. For example, the barrier layers BFL1 and BFL2 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, metal thin film which secures a transmittance, etc. In one or more embodiments, the barrier layers BFL1 and BFL2 may further include an organic film. The barrier layers BFL1 and BFL2 may be formed of a single layer or a plurality of layers.

In the display apparatus DD of an embodiment, the color filter layer CFL may be on the light control layer CCL. For example, the color filter layer CFL may be directly on the light control layer CCL. In this case, the barrier layer BFL2 may be omitted.

The color filter layer CFL may include a light shielding unit BM and filters CF1, CF2, and CF3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment and/or dye. The first filter CF1 may include a red pigment and/or dye, the second filter CF2 may include a green pigment and/or dye, and the third filter CF3 may include a blue pigment and/or dye. In one or more embodiments, the embodiment of the present disclosure is not limited thereto, and the third filter CF3 may not include a pigment and/or dye. The third filter CF3 may include a polymeric photosensitive resin and may not include a pigment and/or dye. The third filter CF3 may be transparent. The third filter CF3 may be formed of a transparent photosensitive resin.

Furthermore, in an embodiment, the first filter CF1 and the second filter CF2 may each be a yellow filter. The first filter CF1 and the second filter CF2 may not be separated but may be provided as one filter.

The light shielding unit BM may be a black matrix. The light shielding unit BM may include an organic light shielding material and/or an inorganic light shielding material containing a black pigment and/or dye. The light shielding unit BM may prevent or reduce light leakage, and may separate boundaries between the adjacent filters CF1, CF2, and CF3. In addition, in an embodiment, the light shielding unit BM may be formed of a blue filter.

The first to third filters CF1, CF2, and CF3 may correspond to the red light emitting region PXA-R, the green light emitting region PXA-G, and the blue light emitting region PXA-B, respectively.

A base substrate BL may be on the color filter layer CFL. The base substrate BL may be a member which provides a base surface in which the color filter layer CFL, the light control layer CCL, and/or the like are disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer (e.g., a composite material layer including an inorganic material and an organic material). In an embodiment, the base substrate BL may be omitted.

FIG. 8 is a cross-sectional view illustrating a part of a display apparatus according to an embodiment. FIG. 8 illustrates a cross-sectional view of a part corresponding to the display panel DP of FIG. 7. In the display apparatus DD-TD of an embodiment, the light emitting device ED-BT may include a plurality of light emitting structures OL-B1, OL-B2, and OL-B3. The light emitting device ED-BT may include a first electrode EL1 and a second electrode EL2 which face each other, and the plurality of light emitting structures OL-B1, OL-B2, and OL-B3 sequentially stacked in the thickness direction between the first electrode EU and the second electrode EL2. The light emitting structures OL-B1, OL-B2, and OL-B3 each may include an emission layer EML (FIG. 7) and a hole transport region HTR and an electron transport region ETR with the emission layer EML (FIG. 7) therebetween.

That is, the light emitting device ED-BT included in the display apparatus DD-TD of an embodiment may be a light emitting device having a tandem structure and including a plurality of emission layers.

In an embodiment illustrated in FIG. 8, light emitted from each of the light emitting structures OL-B1, OL-B2, and OL-B3 may all be blue light. However, the embodiment of the present disclosure is not limited thereto, and the light emitted from each of the light emitting structures OL-B1, OL-B2, and OL-B3 may be in a wavelength range different from each other. For example, the light emitting device ED-BT including the plurality of light emitting structures OL-B1, OL-B2, and OL-B3 which emit light in a wavelength range different from each other may emit white light.

A charge generation layer may be between the neighboring light emitting structures OL-B1, OL-B2, and OL-B3. For example, a charge generation layer CGL1 may be between the light emitting structure OL-B1 and the light emitting structure OL-B2, and a charge generation layer CGL2 may be between the light emitting structure OL-B2 and the light emitting structure OL-B3. The charge generation layer may include a p-type charge generation layer and/or an n-type charge generation layer.

Hereinafter, with reference to Examples and Comparative Examples, a polycyclic compound according to an embodiment of the present disclosure and a light emitting device of an embodiment of the present disclosure including the polycyclic compound of an embodiment will be described in more detail. In addition, Examples shown below are illustrated only for the understanding of the present disclosure, and the scope of the present disclosure is not limited thereto.

EXAMPLES

1. Synthesis of Polycyclic Compounds of Examples

First, a synthetic method for a polycyclic compound according to an example will be described in more detail by illustrating a synthetic method of Compounds 20, 25, 51, 79, 94, 101, 110, and 122. In addition, in the following descriptions, a compound synthesis method is provided as an example, but the synthesis method for a compound according to an embodiment of the present disclosure is not limited to Examples below.

Synthesis of Compound 20

Compound 20 according to an example may be synthesized by, for example, the steps shown in Reaction Scheme 1 below:

Reaction Scheme 1

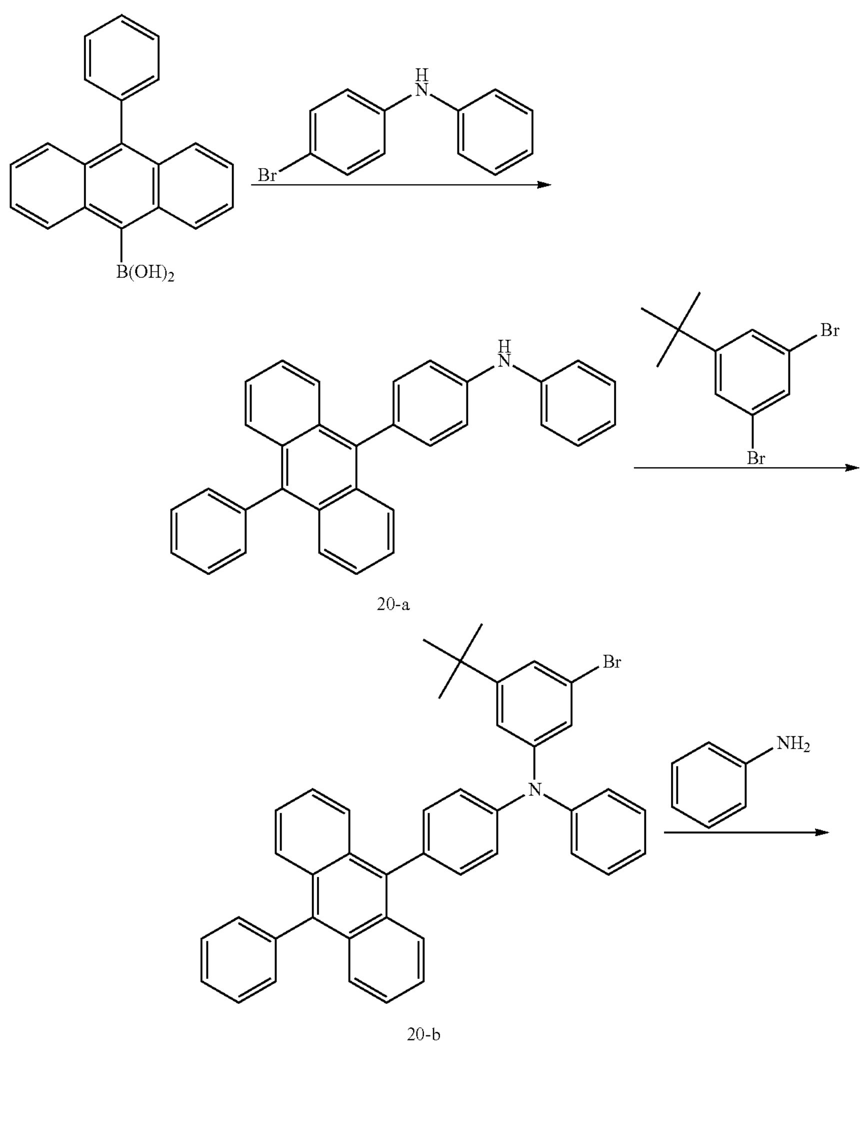

-continued
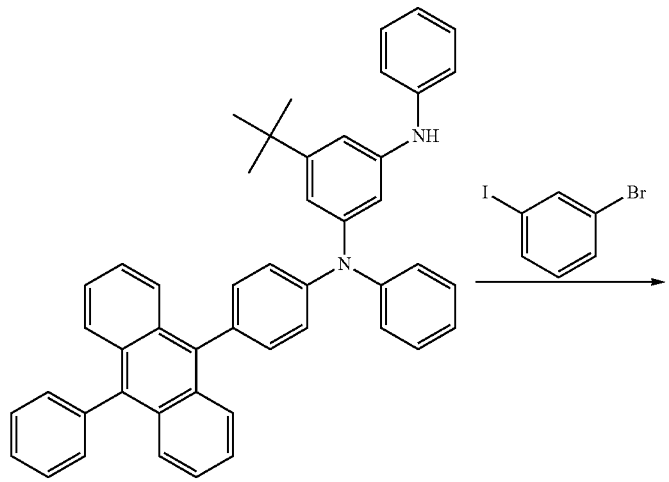
20-c
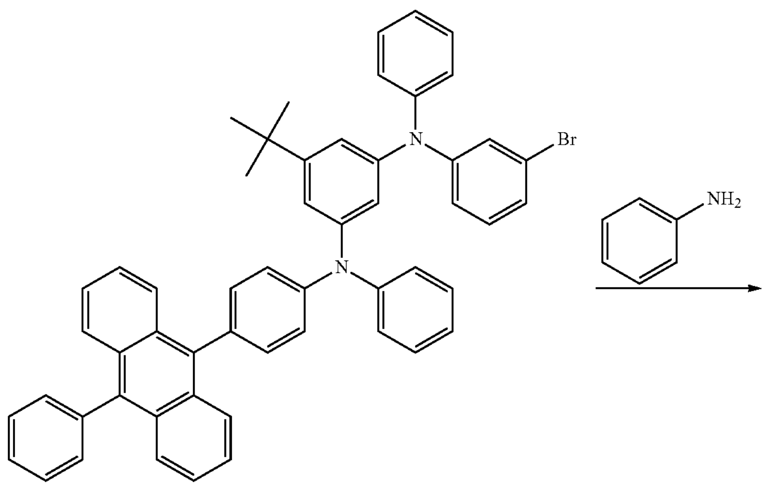
20-d
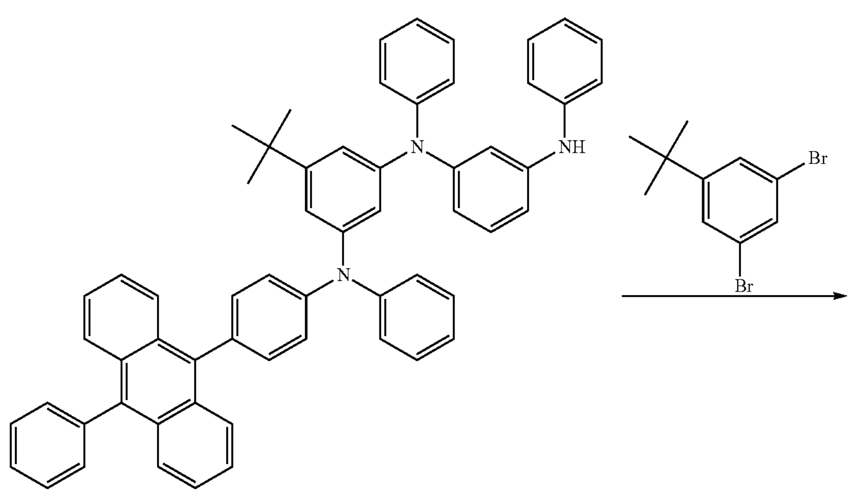
20-e

-continued
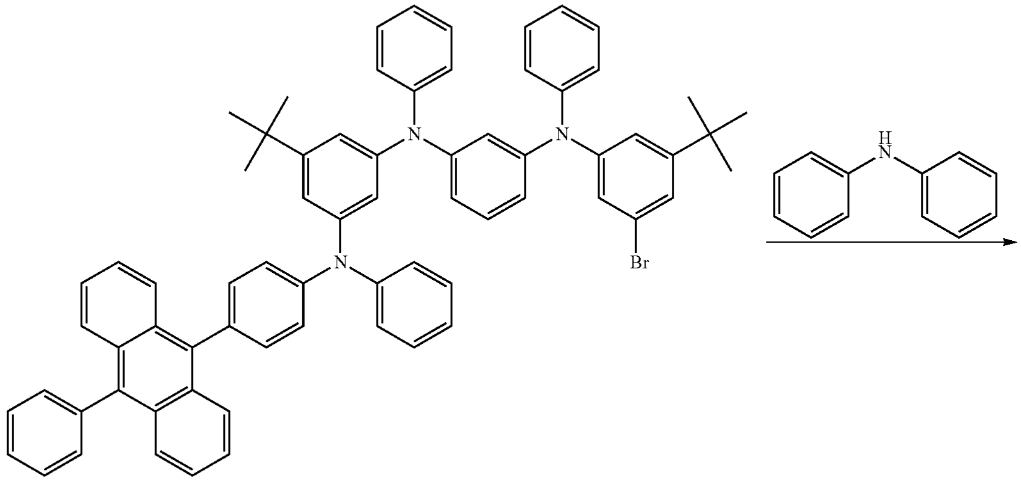
20-f
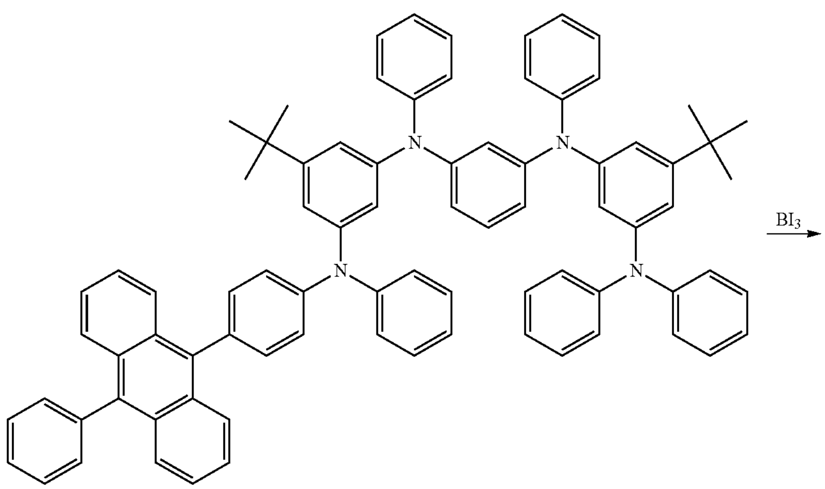
20-g
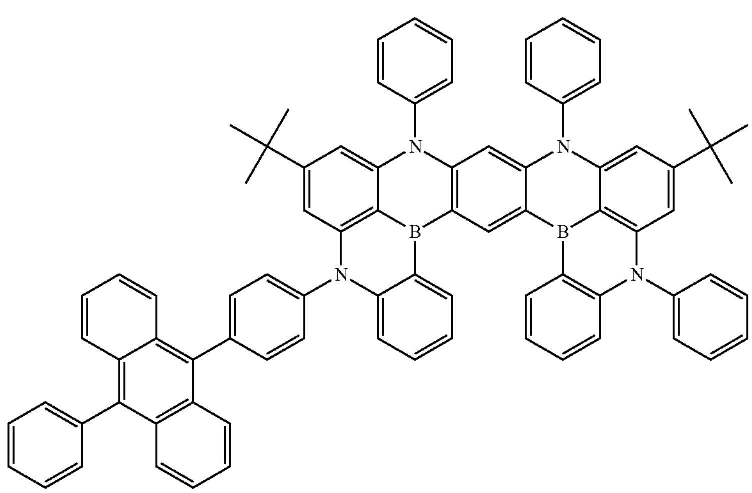
20

Compound 20-a

In an argon atmosphere, in a 2 L flask, (10-phenylanthracen-9-yl)boronic acid (50 g, 168 mmol), 4-bromo-N-phenylaniline (42 g, 168 mmol), $K_2CO_3$ (70 g, 500 mmol), and $Pd(PPh_3)_4$ (5.8 g, 5 mmol) were added and dissolved in a mixed solution of toluene (700 mL) and water (300 mL), and the reaction solution was then stirred at about 120° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 20-a (yellow solid, 52 g, yield: 74%).

ESI-LCMS: $[M+H]^+$: $C_{32}H_{23}N$. 421.1763.

$^1$H-NMR (400 MHz, $CDCl_3$): 8.21 (d, 4H), 7.65 (d, 2H), 7.55 (m, 4H), 7.37 (m, 7H), 7.02 (m, 3H).

Compound 20-b

In an argon atmosphere, in a 2 L flask, Compound 20-a (50 g, 119 mmol), 3,5-dibromo-tert-butylbenzene (35 g, 119 mmol), BINAP (7.4 g, 12 mmol), sodium tert-butoxide (34.3 g, 357 mmol), and $Pd_2dba_3$ (5.4 g, 5.95 mmol) were added and dissolved in 1 L of toluene, and the reaction solution was then stirred at about 85° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 20-b (white solid, 40 g, yield: 54%).

ESI-LCMS: [M+H]+: $C_{42}H_{34}NBr$. 631.1664.

$^1$H-NMR (400 MHz, $CDCl_3$): 8.21 (d, 4H), 7.65 (d, 2H), 7.55 (m, 4H), 7.37 (m, 8H), 7.24 (m, 3H), 7.08 (d, 2H), 7.02 (m, 2H), 1.32 (s, 9H).

Compound 20-c

In an argon atmosphere, in a 2 L flask, Compound 20-b (40 g, 63 mmol), aniline (8.8 g, 95 mmol), tris-tert-butyl phosphine (6 mL, 6.3 mmol), sodium tert-butoxide (17.7 g, 189 mmol), and $Pd_2dba_3$ (2.9 g, 3.15 mmol) were added and dissolved in 600 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 20-c (white solid, 33 g, yield: 82%).

ESI-LCMS: [M+H]+: $C_{48}H_{41}N_2$. 645.1212.

$^1$H-NMR (400 MHz, $CDCl_3$): 8.21 (d, 4H), 7.65 (d, 2H), 7.55 (m, 9H), 7.24 (m, 2H), 7.00 (m, 8H), 6.63 (s, 1H), 1.35 (s, 9H).

Compound 20-d

In an argon atmosphere, in a 1 L flask, Compound 20-c (33 g, 51 mmol), 3-iodo-bromobenzene (14.5 g, 51 mmol), tris-tert-butyl phosphine (4.6 mL, 5.0 mmol), sodium tert-butoxide (14.7 g, 153 mmol), and $Pd_2dba_3$ (2.3 g, 2.55 mmol) were added and dissolved in 400 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 20-d (white solid, 31 g, yield: 77%).

ESI-LCMS: [M+H]+: $C_{54}H_{44}N_2Br$. 799.2245.

$^1$H-NMR (400 MHz, $CDCl_3$): 8.23 (d, 4H), 7.61 (d, 2H), 7.53 (m, 4H), 7.41 (m, 7H), 7.24 (m, 6H), 7.03 (m, 10H), 6.32 (s, 1H), 1.31 (s, 9H).

Compound 20-e

In an argon atmosphere, in a 1 L flask, Compound 20-d (30 g, 37.5 mmol), aniline (5.2 g, 56 mmol), tris-tert-butyl phosphine (6 mL, 3.6 mmol), sodium tert-butoxide (10.8 g, 112.5 mmol), and $Pd_2dba_3$ (1.7 g, 1.8 mmol) were added and dissolved in 400 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 20-e (white solid, 24 g, yield: 79%).

ESI-LCMS: $[M+H]^+$: $C_{60}H_{50}N_3$. 812.3331.

$^1$H-NMR (400 MHz, $CDCl_3$): 8.24 (d, 4H), 7.61 (d, 2H), 7.53 (m, 4H), 7.37 (m, 15H), 7.08 (m, 11H), 6.84 (s, 1H), 6.76 (m, 1H), 6.55 (s, 1H), 1.31 (s, 9H).

Compound 20-f

In an argon atmosphere, in a 1 L flask, Compound 20-e (24 g, 29.5 mmol), 3,5-dibromo-tert-butylbenzene (8.6 g, 29.5 mmol), BINAP (1.9 g, 3.0 mmol), sodium tert-butoxide (9.2 g, 88.5 mmol), and $Pd_2dba_3$ (1.35 g, 1.5 mmol) were added and dissolved in 400 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 20-f (white solid, 17 g, yield: 57%).

ESI-LCMS: $[M+H]^+$: $C_{70}H_{61}N_3Br$. 1022.3982.

$^1$H-NMR (400 MHz, $CDCl_3$): 8.24 (d, 4H), 7.61 (d, 2H), 7.53 (m, 4H), 7.34 (m, 6H), 7.21 (m, 6H), 7.02 (m, 12H), 6.83 (s, 1H), 6.76 (d, 2H), 6.63 (s, 1H), 1.31 (s, 9H), 1.26 (s, 9H).

Compound 20-g

In an argon atmosphere, in a 1 L flask, Compound 20-f (17 g, 29.5 mmol), diphenylamine (2.8 g, 29.5 mmol), BINAP (1.9 g, 3.0 mmol), sodium tert-butoxide (9.2 g, 88.5 mmol), and $Pd_2dba_3$ (1.35 g, 1.4 mmol) were added and dissolved in 300 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 20-g (white solid, 22 g, yield: 69%).

ESI-LCMS: [M+H]+: $C_{82}H_{71}N_4$ 1111.4431.

$^1$H-NMR (400 MHz, $CDCl_3$): 8.24 (d, 4H), 7.61 (d, 2H), 7.53 (m, 4H), 7.34 (m, 7H), 7.22 (m, 10H), 7.09 (m, 19H), 6.83 (s, 1H), 6.76 (d, 2H), 6.63 (s, 2H), 1.31 (s, 9H), 1.26 (s, 9H).

Compound 20

In an argon atmosphere, in a 1 L flask, Compound 20-g (20 g, 18 mmol) was dissolved in 500 mL of o-dichlorobenzene and cooled to about 0° C. in an ice water bath. Boron triiodide (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was completely removed under reduced pressure to obtain a solid. The solid thus obtained was washed with MeOH, and then purified and separated by silica gel column chromatography utilizing $CH_2Cl_2$ and hexane as eluent to obtain Compound 20 (yellow solid, 2.4 g, yield: 12%).

ESI-LCMS: $[M+H]^+$: $C_{82}H_{65}B_2N_4$. 1127.5153.

$^1$H-NMR (400 MHz, $CDCl_3$): 10.03 (s, 1H), 9.63 (d, 2H), 8.24 (d, 4H), 7.61 (d, 2H), 7.47 (m, 6H), 7.34 (m, 7H), 7.22 (m, 10H), 7.03 (m, 15H), 6.83 (s, 1H), 6.76 (d, 2H), 6.63 (s, 2H), 1.31 (s, 9H), 1.26 (s, 9H).

Synthesis of Compound 25

Compound 25 according to an example may be synthesized by, for example, the steps shown in Reaction Scheme 2 below:

Reaction Scheme 2

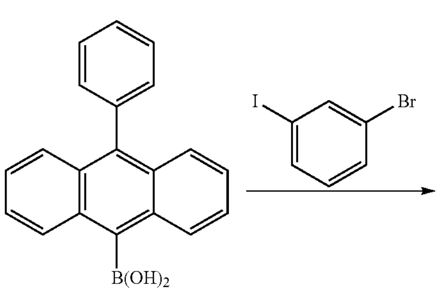

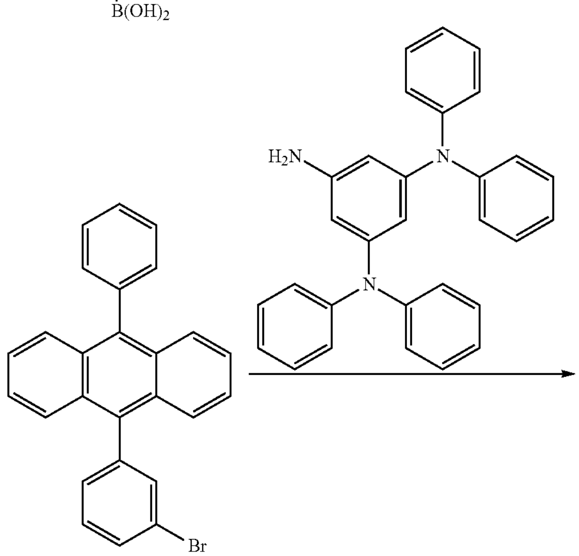

25-a

-continued

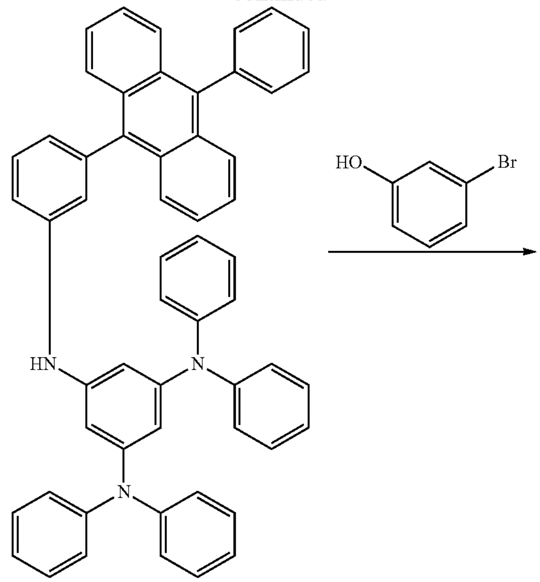

25-b

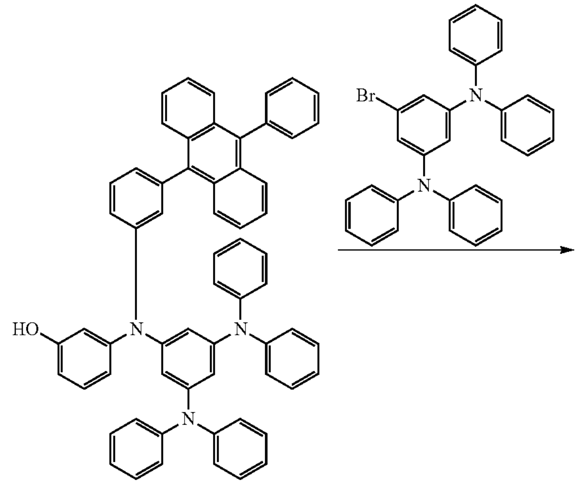

25-c

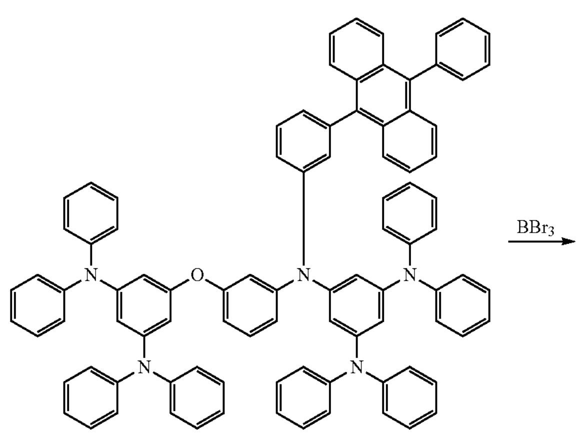

25-d

-continued

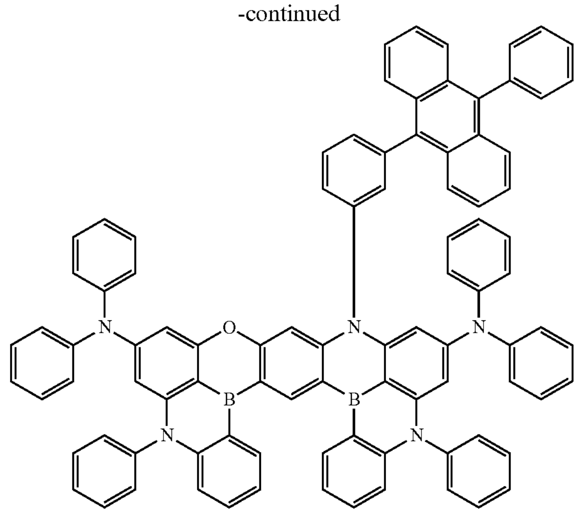

25

Compound 25-a

In an argon atmosphere, in a 2 L flask, (10-phenylanthracen-9-yl)boronic acid (50 g, 168 mmol), 3-iodo-bromobenzene (48 g, 168 mmol), $K_2CO_3$ (70 g, 500 mmol), and $Pd(PPh_3)_4$ (5.8 g, 5 mmol) were added and dissolved in a mixed solution of toluene (700 mL) and water (300 mL), and the reaction solution was then stirred at about 120° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 25-a (yellow solid, 45 g, yield: 66%).

ESI-LCMS: [M+H]+: $C_{26}H_{18}Br$. 409.0432.

$^1$H-NMR (400 MHz, $CDCl_3$): 8.21 (m, 4H), 7.65 (m, 3H), 7.55 (t, 2H), 7.41 (m, 8H).

Compound 25-b

In an argon atmosphere, in a 2 L flask, Compound 25-a (45 g, 110 mmol), $N^1$,$N^1$,$N^3$,$N^3$-tetraphenylbenzene-1,3,5-triamine (47 g, 110 mmol), tri-tert-butyl-phosphine (10 ml, 11.0 mmol), sodium tert-butoxide (32 g, 330 mmol), and $Pd_2dba_3$ (5.0 g, 5.5 mmol) were added and dissolved in 600 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 25-b (white solid, 56 g, yield: 68%).

ESI-LCMS: [M+H]+: $C_{56}H_{42}N_3$. 756.3221.

$^1$H-NMR (400 MHz, $CDCl_3$): 8.23 (m, 4H), 7.73 (d, 1H), 7.66 (d, 2H), 7.53 (t, 3H), 7.37 (m, 5H), 7.17 (m, 10H), 7.08 (m, 12H), 6.49 (s, 3H).

Compound 25-c

In an argon atmosphere, in a 2 L flask, Compound 25-b (55 g, 72 mmol), 3-bromophenol (12.6 g, 72 mmol), tri-tert-butyl-phosphine (6.6 ml, 7.2 mmol), sodium tert-butoxide (21 g, 216 mmol), and $Pd_2dba_3$ (3.3 g, 3.6 mmol) were added and dissolved in 600 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 25-c (white solid, 44.5 g, yield: 73%).

ESI-LCMS: [M+H]+: $C_{62}H_{46}N_3O$. 848.2119.

$^1$H-NMR (400 MHz, $CDCl_3$): 8.23 (m, 4H), 7.66 (d, 2H), 7.55 (t, 3H), 7.24 (m, 16H), 7.12 (m, 8H), 6.62 (m, 3H), 6.49 (s, 3H).

Compound 25-d

In an argon atmosphere, in a 1 L flask, Compound 25-c (44 g, 52 mmol), 5-bromo-$N^1$,$N^1$,$N^3$,$N^3$-tetraphenylbenzene-1,3-diamine (25.5 g, 52 mmol), CuI (9.88 g, 52 mmol), and 2-picolinic acid (6.4 g, 52 mmol) were added and dissolved in 500 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 25-d (white solid, 28 g, yield: 43%).

ESI-LCMS: [M+H]+: $C_{92}H_{68}N_5O$. 1258.0439.

$^1$H-NMR (400 MHz, $CDCl_3$): 8.22 (m, 4H), 7.66 (d, 2H), 7.55 (t, 3H), 7.37 (t, 5H), 7.24 (m, 24H), 7.12 (m, 20H), 6.86 (s, 1H), 6.80 (d, 1H), 6.49 (m, 6H), 6.62 (m, 3H), 6.49 (s, 3H).

Compound 25

In an argon atmosphere, in a 1 L flask, Compound 25-d (28 g, 22 mmol) was dissolved in 500 mL of o-dichlorobenzene and cooled to about 0° C. in an ice water bath. Boron tribromide (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was completely removed under reduced pressure to obtain a solid. The solid thus obtained was washed with MeOH, and then purified and separated by silica gel column chromatography utilizing $CH_2Cl_2$ and hexane as eluent to obtain Compound 25 (yellow solid, 2.5 g, yield: 9%).

ESI-LCMS: $[M+H]^+$: $C_{72}H_{62}B_2N_5O$. 1274.0947.

$^1$H-NMR (400 MHz, $CDCl_3$): 10.2 (s, 1H), 9.42 (d, 2H), 8.23 (d, 4H), 7.65 (d, 2H), 7.24 (m, 21H), 7.07 (m, 20H), 6.86 (s, 1H), 6.52 (m, 4H).

Synthesis of Compound 51

Compound 51 according to an example may be synthesized by, for example, the steps shown in Reaction Scheme 3 below:

Reaction Scheme 3
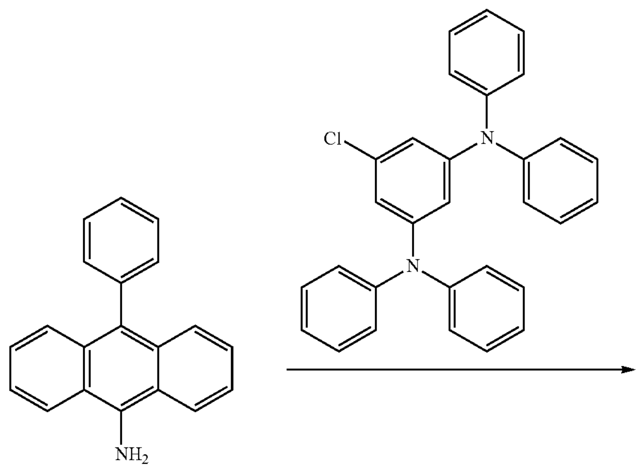
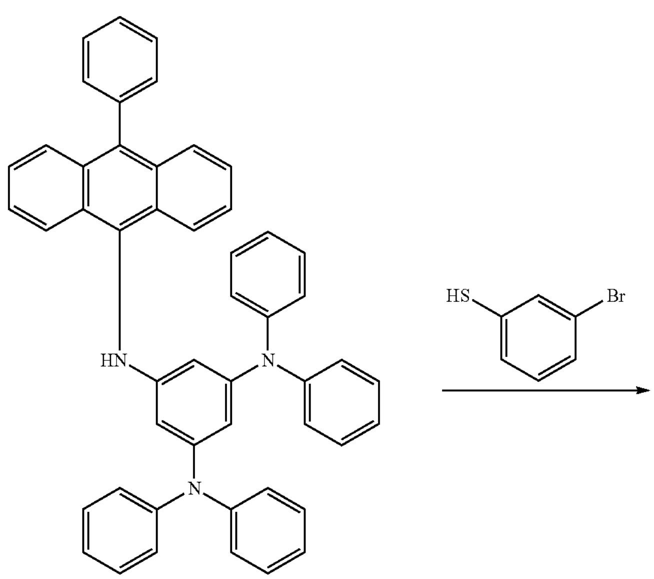
51-a

-continued
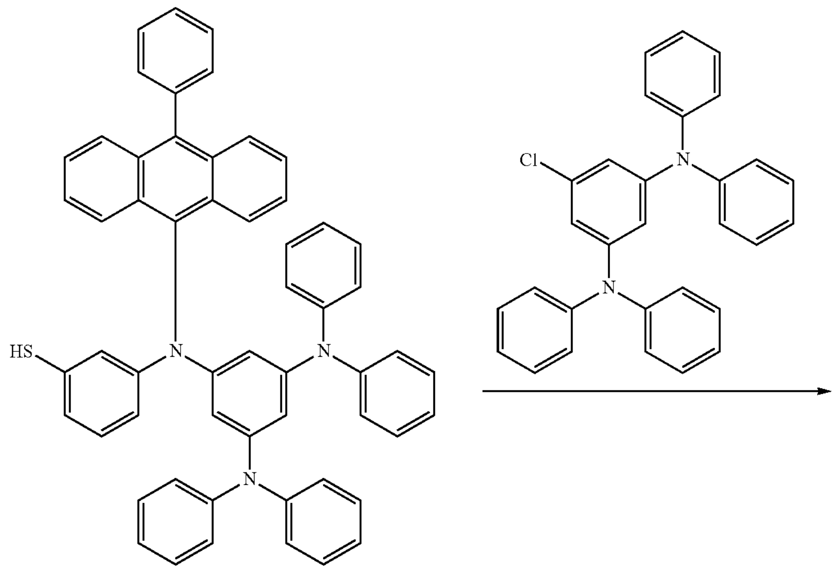
51-b
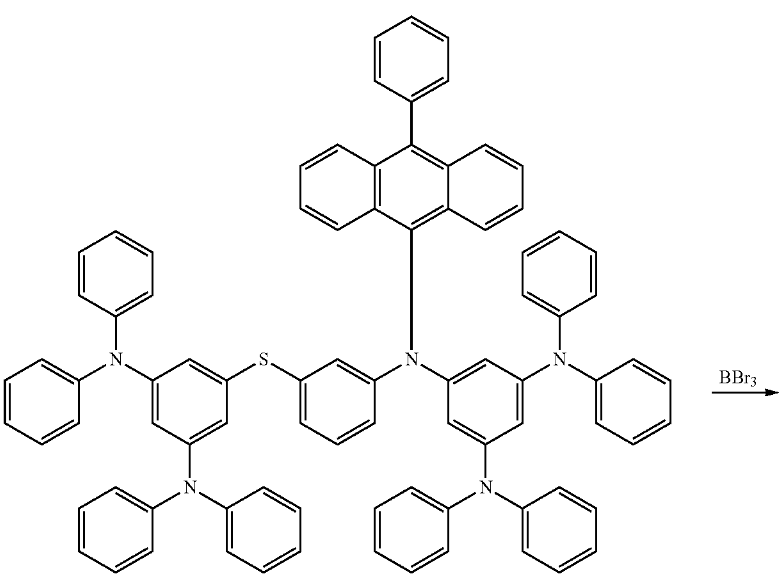
51-c

-continued

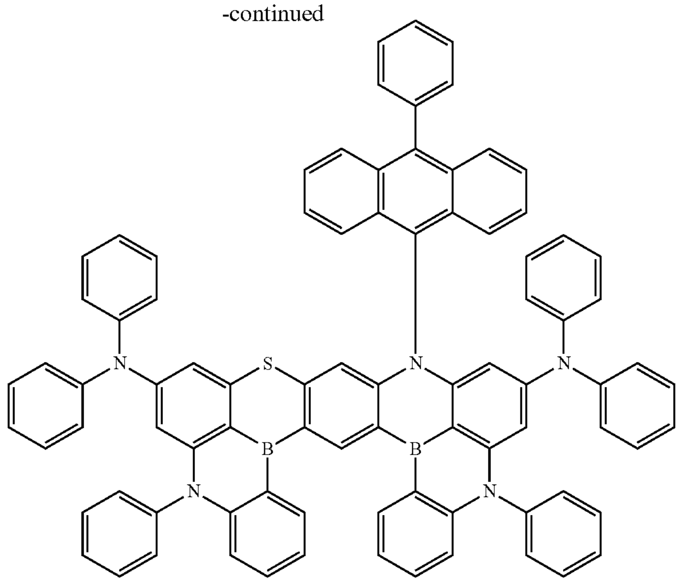

51

Compound 51-a

In an argon atmosphere, in a 2 L flask, 9-amino-10-phenylanthracene (50 g, 186 mmol), 5-chloro-$N^1$,$N^1$,$N^3$,$N^3$-tetraphenylbenzene-1,3-diamine (83 g, 186 mmol), tri-tert-butyl-phosphine (17 ml, 18.6 mmol), sodium tert-butoxide (53 g, 558 mmol), and $Pd_2dba_3$ (8.5 g, 9.3 mmol) were added and dissolved in 1 L of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 51-a (white solid, 83 g, yield: 66%).

ESI-LCMS: $[M+H]^+$: $C_{50}H_{38}N_3$. 680.0115.

$^1$H-NMR (400 MHz, $CDCl_3$): 8.19 (d, 4H), 7.65 (d, 2H), 7.55 (t, 2H), 7.42 (m, 5H), 7.24 (m, 8H), 7.00 (m, 12H), 6.49 (s, 3H).

Compound 51-b

In an argon atmosphere, in a 2 L flask, Compound 51-a (80 g, 118 mmol), 3-bromo-thiophenol (22 g, 118 mmol), tri-tert-butyl-phosphine (11 ml, 12 mmol), sodium tert-butoxide (34 g, 354 mmol), and $Pd_2dba_3$ (5.4 g, 5.9 mmol) were added and dissolved in 1 L of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 51-b (white solid, 59 g, yield: 63%).

ESI-LCMS: [M+H]+: $C_{56}H_{42}N_3S$. 788.2224.

$^1$H-NMR (400 MHz, $CDCl_3$): 8.22 (m, 4H), 7.72 (s, 1H), 7.65 (d, 2H), 7.55 (t, 2H), 7.41 (m, 5H), 7.24 (m, 9H), 7.00 (m, 12H), 6.84 (m, 2H), 6.52 (s, 3H).

Compound 51-c

In an argon atmosphere, in a 1 L flask, Compound 51-b (59 g, 75 mmol), 5-chloro-$N^1$,$N^1$,$N^3$,$N^3$-tetraphenylbenzene-1,3-diamine (33.5 g, 75 mmol), CuI (14 g, 75 mmol), and 2-picolinic acid (9.2 g, 75 mmol) were added and dissolved in 700 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 51-c (white solid, 47 g, yield: 52%).

ESI-LCMS: $[M+H]^+$: $C_{86}H_{64}N_5S$. 1198.4434.

$^1$H-NMR (400 MHz, $CDCl_3$): 8.19 (m, 4H), 7.76 (s, 1H), 7.65 (d, 2H), 7.55 (t, 2H), 7.42 (m, 7H), 7.22 (m, 17H), 7.08 (m, 25H), 6.89 (m, 1H), 6.57 (s, 1H), 6.52 (m, 3H).

Compound 51

In an argon atmosphere, in a 1 L flask, Compound 51-c (45 g, 38 mmol) was dissolved in 1 L of o-dichlorobenzene and cooled to about 0° C. in an ice water bath. Boron tribromide (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (10 mL) was slowly added dropwise to stop the reaction, and the solvent was completely removed under reduced pressure to obtain a solid. The solid thus obtained was washed with MeOH, and then purified and separated by silica gel column chromatography utilizing $CH_2Cl_2$ and hexane as eluent to obtain Compound 51 (yellow solid, 2.7 g, yield: 6%).

ESI-LCMS: $[M+H]^+$: $C_{86}H_{57}B_2N_5S$. 1214.4321.

$^1$H-NMR (400 MHz, $CDCl_3$): 10.2 (s, 1H), 9.42 (d, 2H), 8.19 (m, 4H), 7.76 (s, 1H), 7.65 (d, 2H), 7.55 (t, 2H), 7.42 (m, 7H), 7.22 (m, 15H), 7.08 (m, 24H), 6.89 (m, 1H), 6.57 (s, 1H), 6.52 (m, 3H).

Synthesis of Compound 79
Compound 79 according to an example may be synthesized by, for example, the steps shown in Reaction Scheme 4 below:
Reaction Scheme 4
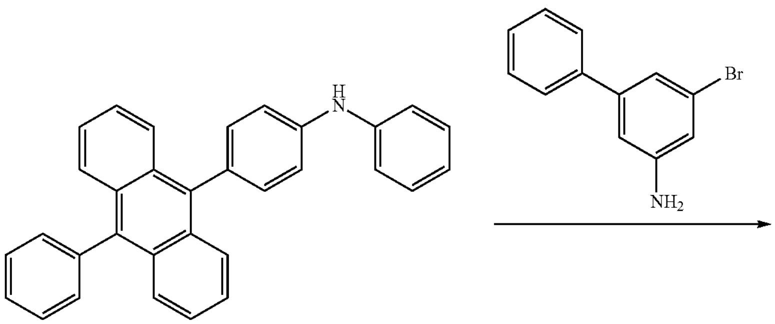
20-a
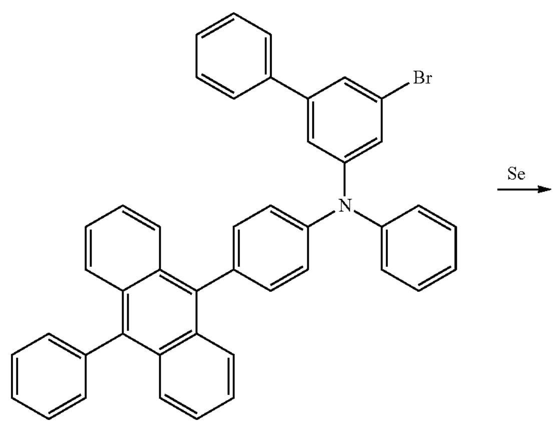
79-a
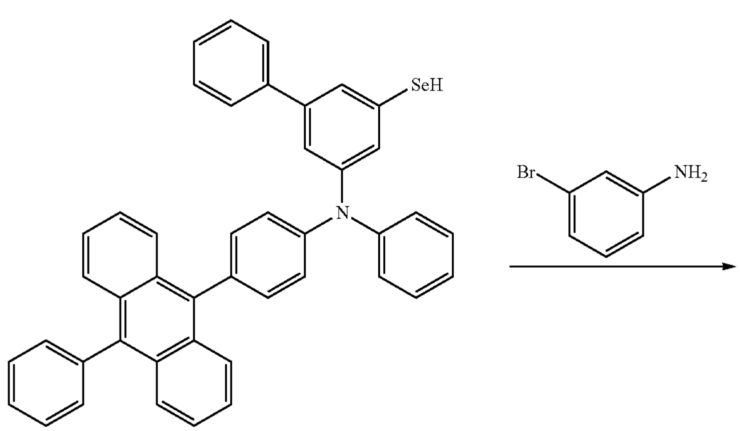
79-b -continued
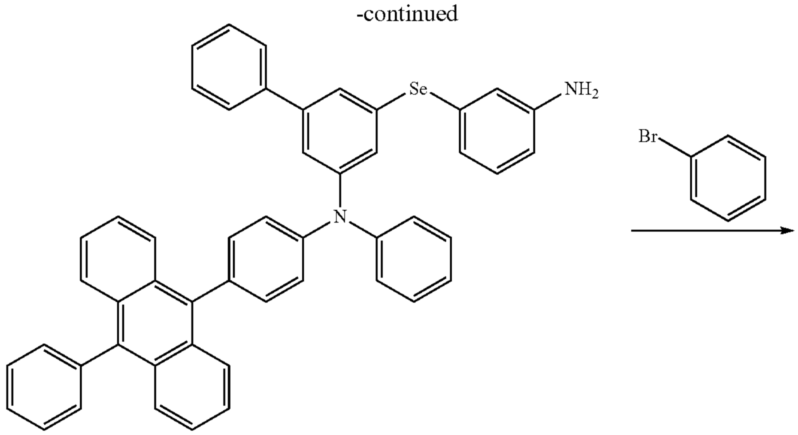
79-c
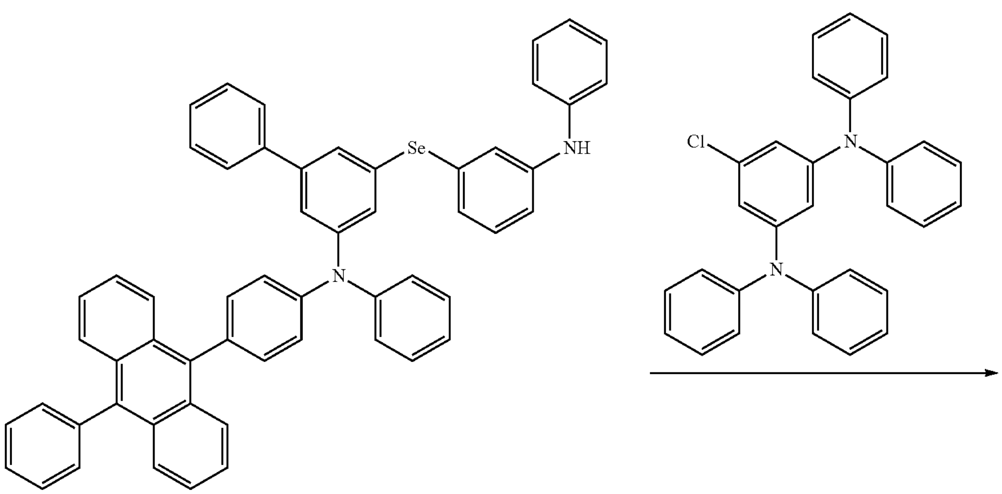
79-d
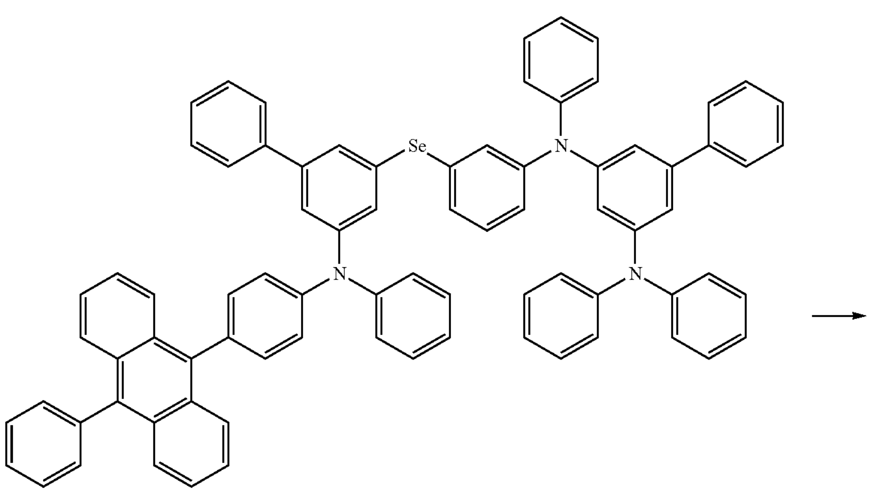
79-e -continued

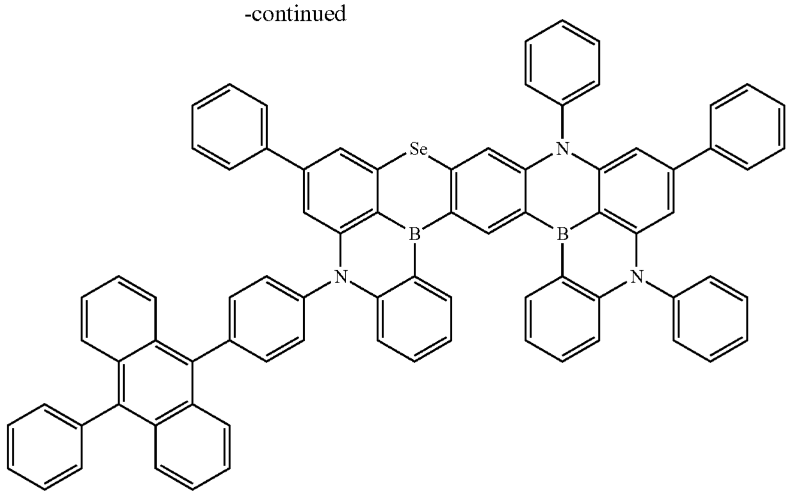

79

Compound 79-a

In an argon atmosphere, in a 2 L flask, 3,5-dibromo-biphenyl (50 g, 160 mmol), Compound 20-a (67.5 g, 160 mmol), BINAP (9.9 ml, 16 mmol), sodium tert-butoxide (46 g, 480 mmol), and $Pd_2dba_3$ (7.3 g, 8.0 mmol) were added and dissolved in 1 L of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 79-a (white solid, 64 g, yield: 61%).

ESI-LCMS: $[M+H]^+$: $C_{44}H_{31}NBr$. 652.1515.

$^1$H-NMR (400 MHz, $CDCl_3$): 8.25 (m, 4H), 7.75 (d, 2H), 7.65 (d, 2H), 7.55 (m, 6H), 7.37 (m, 9H), 7.21 (m, 3H), 7.00 (m, 4H).

Compound 79-b

In an argon atmosphere, in a 1 L flask, Mg (2.3 g, 98 mmol) was dissolved in 500 mL of anhydrous THF, and a solution in which Compound 79-a (64 g, 98 mmol) was dissolved in 300 mL of anhydrous THF was added dropwise slowly thereto at room temperature. Iodine (50 mg, cat.) was added to the reaction solution, and the reaction solution was then heated to about 80° C. The reaction solution was stirred at the same temperature for about 30 minutes, and when the color of the reaction solution changed from brown to gray, the reaction solution was cooled to room temperature, and selenium powder (15 g, 98 mmol) was added portionwise thereto. The reaction solution was heated again to about 80° C. and then stirred for about 2 hours, and after cooling, 1 M HCl was added dropwise slowly thereto until the pH of the reaction solution became neutral. The reaction solution was extracted by utilizing ethyl acetate and water to obtain organic layers. The obtained organic layers were passed through celite filter to remove undissolved solids, and then the filtrate was concentrated to obtain a solid. The solid thus obtained was purified and separated by silica gel column chromatography utilizing $CH_2Cl_2$ and hexane as eluent to obtain Compound 79-b (yellow solid, 27 g, yield: 43%).

ESI-LCMS: $[M+H]^+$: $C_{44}H_{31}NSe$. 654.0047.

$^1$H-NMR (400 MHz, $CDCl_3$): 8.25 (m, 4H), 7.75 (d, 2H), 7.65 (d, 2H), 7.55 (m, 6H), 7.37 (m, 9H), 7.21 (m, 3H), 7.00 (m, 3H).

Compound 79-c

In an argon atmosphere, in a 1 L flask, Compound 79-b (25 g, 38 mmol), 3-bromo-aniline (6.5 g, 38 mmol), CuI (7.2 g, 38 mmol), and 2-picolinic acid (4.6 g, 38 mmol) were added and dissolved in 300 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing ethyl acetate and hexane as eluent to obtain Compound 79-c (white solid, 17 g, yield: 59%).

ESI-LCMS: $[M+H]^+$: $C_{50}H_{37}N_2Se$. 745.1117.

$^1$H-NMR (400 MHz, $CDCl_3$): 8.21 (m, 4H), 7.75 (d, 2H), 7.65 (d, 2H), 7.37 (m, 15H), 7.20 (m, 5H), 7.08 (m, 3H), 6.73 (m, 2H), 6.64 (d, 1H), 5.28 (br, 2H).

Compound 79-d

In an argon atmosphere, in a 1 L flask, Compound 79-c (17 g, 23 mmol), diphenylamine (3.7 g, 23 mmol), BINAP (1.4 g, 2.3 mmol), sodium tert-butoxide (6.6 g, 69 mmol), and $Pd_2dba_3$ (1.1 g, 1.15 mmol) were added and dissolved in 200 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 79-d (white solid, 15 g, yield: 77%).

ESI-LCMS: $[M+H]^+$: $C_{56}H_{41}N_2Se$. 821.2424.

$^1$H-NMR (400 MHz, $CDCl_3$): 8.21 (m, 4H), 7.75 (d, 2H), 7.65 (d, 2H), 7.37 (m, 17H), 7.20 (m, 5H), 7.08 (m, 8H).

Compound 79-e

In an argon atmosphere, in a 1 L flask, Compound 79-d (17 g, 18 mmol), 5-chloro-$N^1$,$N^1$,$N^3$,$N^3$-tetraphenylbenzene-1,3-diamine (8.0 g, 18 mmol), tris-tert-butyl-phosphine (1.6 g, 1.8 mmol), sodium tert-butoxide (5.2 g, 54 mmol), and $Pd_2dba_3$ (0.8 g, 0.9 mmol) were added and dissolved in 200 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 79-e (white solid, 15 g, yield: 75%).

ESI-LCMS: $[M+H]^+$: $C_{80}H_{58}N_3Se$. 1140.3741.

$^1$H-NMR (400 MHz, $CDCl_3$): 8.21 (m, 4H), 7.75 (d, 2H), 7.65 (d, 2H), 7.37 (m, 29H), 7.20 (m, 18H).

Compound 79

In an argon atmosphere, in a 1 L flask, Compound 79-e (15 g, 13 mmol) was dissolved in 400 mL of o-dichlorobenzene and cooled to about 0° C. in an ice water bath. Boron tribromide (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was completely removed under reduced pressure to obtain a solid. The solid thus obtained was washed with MeOH, and then purified and separated by silica gel column chromatography utilizing $CH_2Cl_2$ and hexane as eluent to obtain Compound 79 (yellow solid, 1.8 g, yield: 12%).

ESI-LCMS: $[M+H]^+$: $C_{80}H_{52}B_2N_3Se$. 1156.3370.

$^1$H-NMR (400 MHz, $CDCl_3$): 10.2 (s, 1H), 9.42 (d, 2H), 8.21 (m, 4H), 7.75 (d, 2H), 7.65 (d, 2H), 7.37 (m, 21H), 7.20 (m, 17H).

Synthesis of Compound 94

Compound 94 according to an example may be synthesized by, for example, the steps shown in Reaction Scheme 5 below:

Reaction Scheme 5
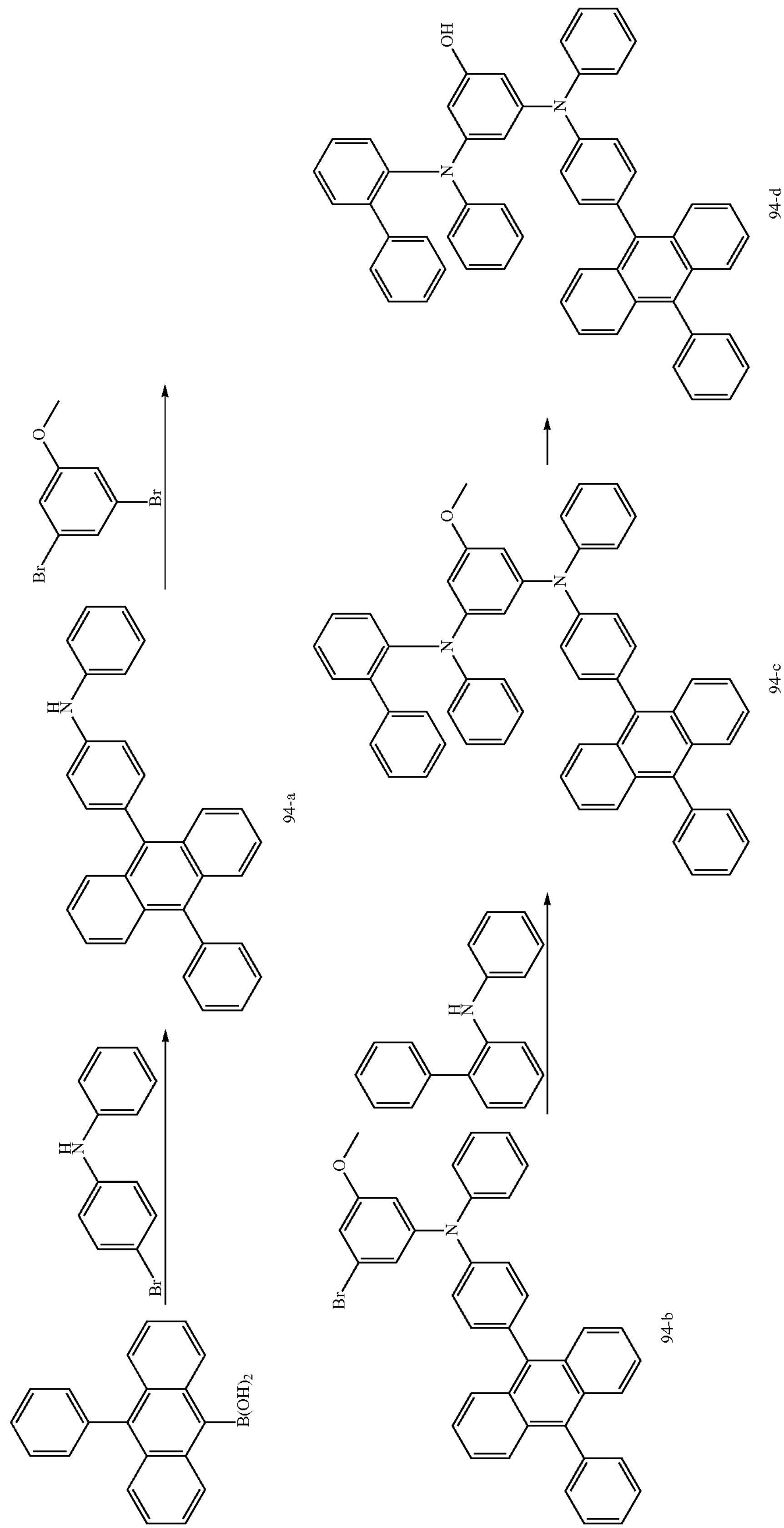

-continued
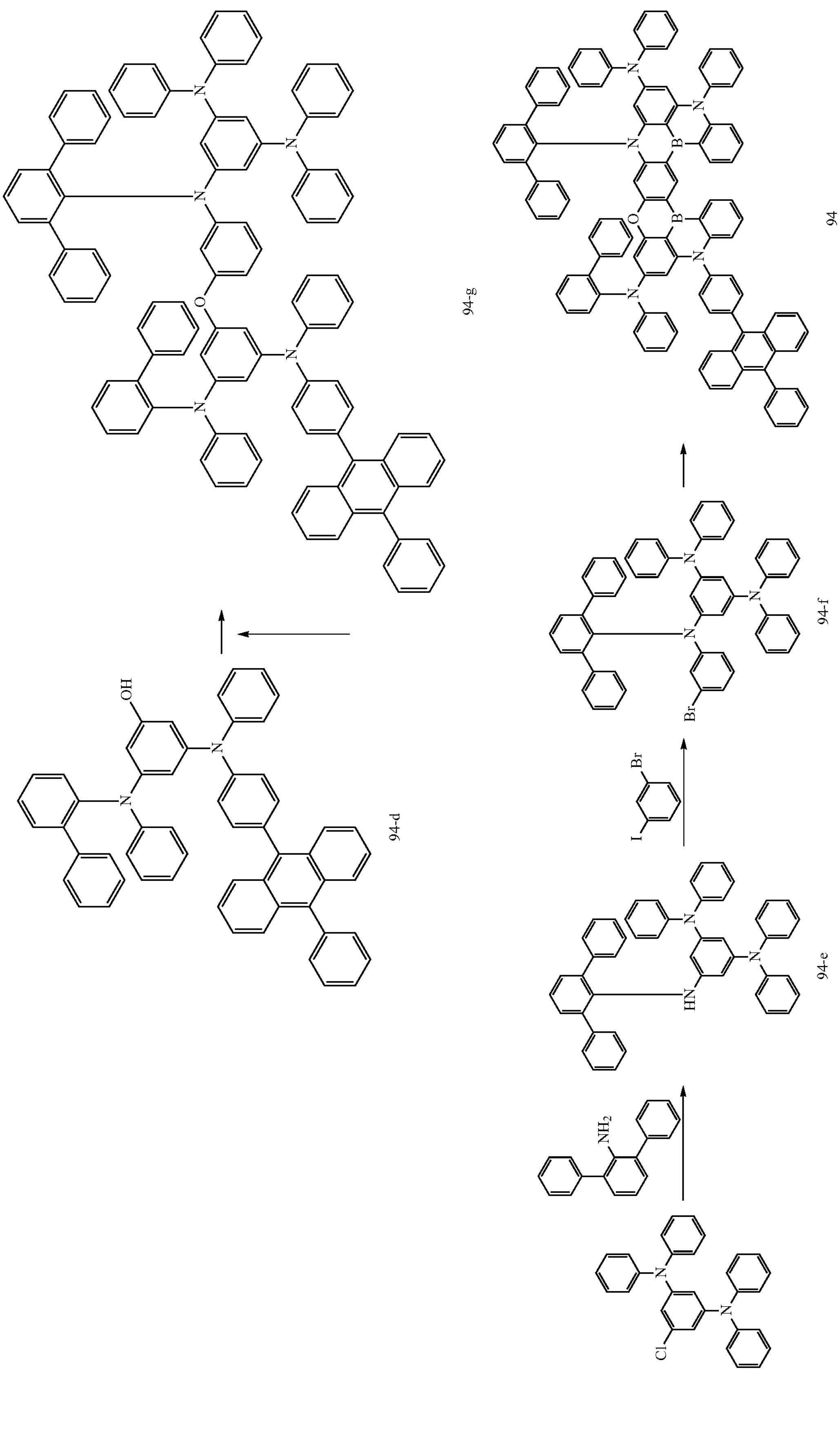

Compound 94-a

In an argon atmosphere, in a 2 L flask, (10-phenylanthracen-9-yl)boronic acid (50 g, 168 mmol), 4-bromo-N-phenylaniline (42 g, 168 mmol), $K_2CO_3$ (70 g, 500 mmol), and $Pd(PPh_3)_4$ (5.8 g, 5 mmol) were added and dissolved in a mixed solution of toluene (700 mL) and water (300 mL), and the reaction solution was then stirred at about 120° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 94-a (yellow solid, 52 g, yield: 74%).

ESI-LCMS: $[M+H]^+$: $C_{32}H_{23}N$. 421.1763.

$^1$H-NMR (400 MHz, $CDCl_3$): 8.21 (d, 4H), 7.65 (d, 2H), 7.55 (m, 4H), 7.37 (m, 7H), 7.02 (m, 3H).

Compound 94-b

In an argon atmosphere, in a 2 L flask, Compound 94-a (50 g, 119 mmol), 3,5-dibromo-methoxybenzene (32.0 g, 119 mmol), BINAP (7.5 g, 12.0 mmol), sodium tert-butoxide (34 g, 357 mmol), and $Pd_2dba_3$ (5.5 g, 6.0 mmol) were added and dissolved in 1 L of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 94-b (white solid, 48 g, yield: 66%).

ESI-LCMS: $[M+H]^+$: $C_{39}H_{29}NBrO$. 606.1237.

$^1$H-NMR (400 MHz, $CDCl_3$): 8.21 (m, 4H), 7.65 (d, 2H), 7.55 (m, 4H), 7.37 (m, 7H), 7.24 (m, 2H), 7.00 (m, 3H), 6.96 (s, 1H), 6.90 (s, 1H), 6.76 (s, 1H), 3.81 (s, 3H).

Compound 94-c

In an argon atmosphere, in a 2 L flask, Compound 94-b (48 g, 79 mmol), N-phenyl-[1,1'-biphenyl]-2-amine (19.4 g, 79 mmol), tris-tert-butyl-phosphine (7.2 mL, 8.0 mmol), sodium tert-butoxide (23 g, 237 mmol), and $Pd_2dba_3$ (3.6 g, 4.0 mmol) were added and dissolved in 600 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 94-c (white solid, 44 g, yield: 73%).

ESI-LCMS: $[M+H]^+$: $C_{57}H_{42}N_2O$. 771.3321.

$^1$H-NMR (400 MHz, $CDCl_3$): 8.23 (m, 4H), 8.10 (d, 1H), 7.65 (d, 2H), 7.55 (m, 4H), 7.37 (m, 12H), 7.24 (m, 4H), 7.00 (m, 9H), 6.48 (s, 3H), 3.81 (s, 3H).

Compound 94-d

In an argon atmosphere, in a 2 L flask, Compound 94-c (44 g, 57 mmol) was added and dissolved in 600 mL of anhydrous $CH_2Cl_2$, and the reaction solution was then cooled at about 0° C. $BBr_3$ (1.5 eq) was added dropwise slowly to the reaction solution, and the reaction solution was heated to room temperature and then stirred for about 24 hours. The reaction solution was slowly poured to water (1 L) and extracted by adding ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 94-d (dark brown solid, 26 g, yield: 61%).

ESI-LCMS: $[M+H]^+$: $C_{56}H_{41}N_2O$. 757.1267.

$^1$H-NMR (400 MHz, $CDCl_3$): 8.23 (m, 4H), 8.10 (d, 1H), 7.65 (d, 2H), 7.55 (m, 4H), 7.37 (m, 12H), 7.24 (m, 4H), 7.00 (m, 9H), 6.48 (s, 3H).

Compound 94-e

In an argon atmosphere, in a 2 L flask, 5-chloro-$N^1$,$N^1$,$N^3$,$N^3$-tetraphenylbenzene-1,3-diamine (50 g, 111 mmol), [1,1':3',1"-terphenyl]-2'-amine (27 g, 111 mmol), tris-tert-butyl-phosphine (10 mL, 11.2 mmol), sodium tert-butoxide (32 g, 333 mmol), and $Pd_2dba_3$ (5.0 g, 5.6 mmol) were added and dissolved in 1 L of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 94-e (white solid, 59 g, yield: 82%).

ESI-LCMS: $[M+H]^+$: $C_{48}H_{38}N_3$. 656.0887.

$^1$H-NMR (400 MHz, $CDCl_3$): 8.20 (d, 2H), 7.43 (m, 7H), 7.24 (m, 8H), 7.08 (m, 16H), 6.49 (s, 3H).

Compound 94-f

In an argon atmosphere, in a 1 L flask, Compound 94-e (50 g, 76 mmol), 3-iodo-bromobenzene (22 g, 76 mmol), CuI (14.4 g, 76 mmol), and $K_2CO_3$ (104 g, 760 mmol) were added and dissolved in 500 mL of o-dichlorobenzene, and the reaction solution was then stirred at about 180° C. for about 3 days. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 94-f (white solid, 30 g, yield: 49%).

ESI-LCMS: $[M+H]^+$: $C_{48}H_{38}N_3$. 810.1217.

$^1$H-NMR (400 MHz, $CDCl_3$): 8.20 (d, 2H), 7.43 (m, 7H), 7.27 (m, 10H), 7.08 (m, 18H), 6.49 (s, 3H).

Compound 94-g

In an argon atmosphere, in a 1 L flask, Compound 94-f (27 g, 33 mmol), Compound 94-d (25 g, 33 mmol), 3-iodo-bromobenzene (22 g, 33 mmol), CuI (6.3 g, 33 mmol), 2-picolinic acid (4.1 g, 33 mmol), and $K_2CO_3$ (14 g, 99 mmol) were added and dissolved in 500 mL of DMF, and the reaction solution was then stirred at about 180° C. for about 24 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 94-g (white solid, 31 g, yield: 63%).

ESI-LCMS: $[M+H]^+$: $C_{110}H_{80}N_5O$. 1486.5119.

$^1$H-NMR (400 MHz, $CDCl_3$): 8.24 (m, 6H), 8.11 (d, 1H), 7.65 (d, 1H), 7.55 (m, 4H), 7.43 (m, 19H), 7.27 (m, 17H), 7.08 (m, 20H), 6.87 (d, 1H), 6.72 (m, 1H).

Compound 94

In an argon atmosphere, in a 1 L flask, Compound 94-g (30 g, 20 mmol) was dissolved in 500 mL of o-dichlorobenzene and cooled to about 0° C. in an ice water bath. Boron tribromide (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was completely removed under reduced pressure to obtain a solid. The solid thus obtained was washed with MeOH, and then purified and separated by silica gel column chromatography utilizing $CH_2Cl_2$ and hexane as eluent to obtain Compound 94 (yellow solid, 3.3 g, yield: 11%).

ESI-LCMS: $[M+H]^+$: $C_{110}H_{173}N_5OB_2$. 1502.7812.

$^1$H-NMR (400 MHz, $CDCl_3$): 10.42 (s, 1H), 9.37 (d, 2H), 8.24 (m, 6H), 7.55 (m, 4H), 7.43 (m, 19H), 7.27 (m, 16H), 7.08 (m, 20H), 6.87 (d, 1H), 6.72 (m, 1H).

Synthesis of Compound 101

Compound 94 according to an example may be synthesized by, for example, the steps shown in Reaction Scheme 6 below:

Reaction Scheme 6

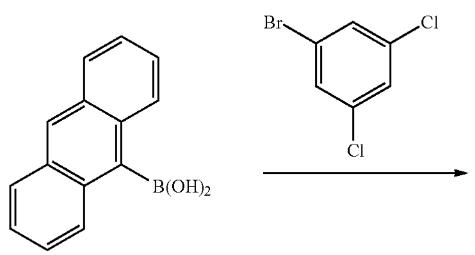

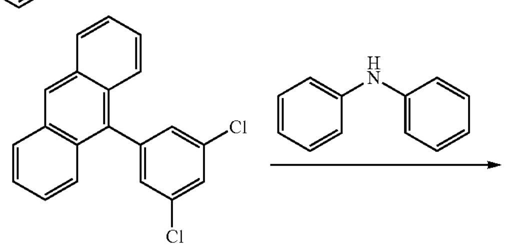

101-a

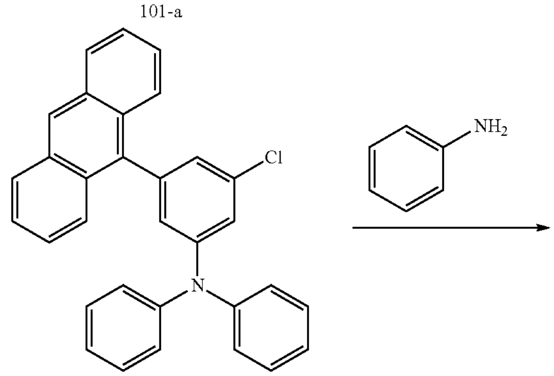

101-b

-continued

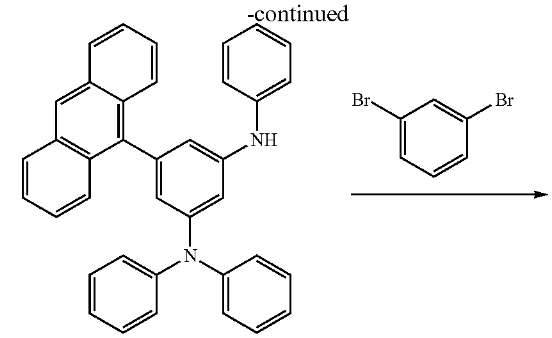

101-c

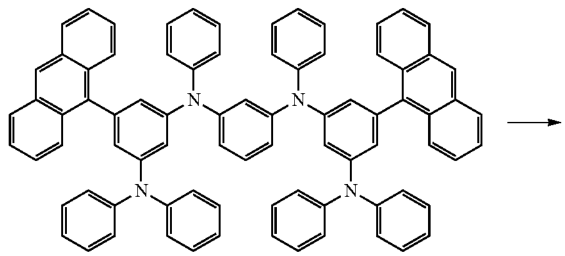

101-d

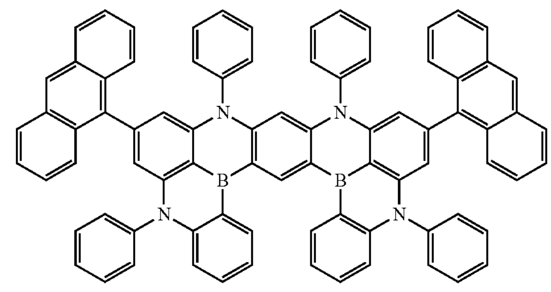

101

Compound 101-a

In an argon atmosphere, in a 2 L flask, anthracene-9-boronic acid (50 g, 225 mmol), 3,5-dichloro-bromo-benzene (50 g, 225 mmol), $K_2CO_3$ (93 g, 675 mmol), and $Pd(PPh_3)_4$ (13 g, 11 mmol) were added and dissolved in a mixed solution of toluene (700 mL), EtOH (200 mL), and water (300 mL), and the reaction solution was then stirred at about 120° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 101-a (white solid, 52 g, yield: 74%).

ESI-LCMS: $[M+H]^+$: $C_{20}H_{13}Cl_2$. 323.0099.

$^1$H-NMR (400 MHz, $CDCl_3$): 8.39 (s, 1H), 8.19 (d, 2H), 8.03 (d, 2H), 7.85 (s, 2H), 7.71 (s, 1H), 7.43 (m, 4H).

Compound 101-b

In an argon atmosphere, in a 2 L flask, Compound 101-a (50 g, 155 mmol), diphenylamine (26 g, 155 mmol), tris-tert-butyl-phosphine (14 mL, 15 mmol), sodium tert-butoxide (45 g, 465 mmol), and $Pd_2dba_3$ (7.0 g, 7.8 mmol) were added and dissolved in 1 L of o-xylene, and the reaction solution was then stirred at about 140° C. for about 6 hours.

After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 101-b (white solid, 40 g, yield: 56%).

ESI-LCMS: $[M+H]^+$: $C_{32}H_{23}NCl$. 456.1515.

$^1$H-NMR (400 MHz, $CDCl_3$): 8.29 (s, 1H), 8.09 (d, 2H), 8.03 (d, 2H), 7.63 (s, 1H), 7.50 (s, 1H), 7.43 (m, 4H), 7.24 (m, 4H), 7.03 (m, 7H).

Compound 101-c

In an argon atmosphere, in a 2 L flask, Compound 101-b (40 g, 88 mmol), aniline (10.6 g, 114 mmol), tris-tert-butyl-phosphine (8 mL, 8.8 mmol), sodium tert-butoxide (25 g, 264 mmol), and $Pd_2dba_3$ (4.0 g, 4.4 mmol) were added and dissolved in 600 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 101-c (white solid, 26 g, yield: 59%).

ESI-LCMS: $[M+H]^+$: $C_{38}H_{28}N_2$. 513.2121.

$^1$H-NMR (400 MHz, $CDCl_3$): 8.39 (br, 1H), 8.12 (d, 2H), 8.03 (d, 2H), 7.42 (m, 2H), 7.24 (m, 4H), 7.08 (m, 4H), 6.93 (s, 3H).

Compound 101-d

In an argon atmosphere, in a 1 L flask, Compound 101-c (26 g, 50 mmol), 1,3-dibromobenzene (5.9 g, 25 mmol), tris-tert-butyl-phosphine (2.2 mL, 2.6 mmol), sodium tert-butoxide (7.2 g, 75 mmol), and $Pd_2dba_3$ (1.1 g, 1.3 mmol) were added and dissolved in 6 mL of o-xylene, and the reaction solution was then stirred at about 100° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 101-d (white solid, 18 g, yield: 66%).

ESI-LCMS: $[M+H]^+$: $C_{82}H_{59}N_4$. 1099.4327.

$^1$H-NMR (400 MHz, $CDCl_3$): 8.39 (s, 2H), 8.19 (d, 4H), 8.03 (d, 4H), 7.42 (m, 8H), 7.24 (m, 13H), 7.08 (m, 15H), 6.93 (s, 6H), 6.83 (s, 1H), 6.64 (d, 2H).

Compound 101

In an argon atmosphere, in a 1 L flask, Compound 101-d (18 g, 16 mmol) was dissolved in 400 mL of o-dichlorobenzene and cooled to about 0° C. in an ice water bath. Boron tribromide (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was completely removed under reduced pressure to obtain a solid. The solid thus obtained was washed with MeOH, and then purified and separated by silica gel column chromatography utilizing $CH_2Cl_2$ and hexane as eluent to obtain Compound 101 (yellow solid, 1.6 g, yield: 9%).

ESI-LCMS: $[M+H]^+$: $C_{82}H_{53}N_4B_2$. 1115.5623.

$^1$H-NMR (400 MHz, $CDCl_3$): 10.42 (s, 1H), 9.37 (d, 2H), 8.39 (s, 2H), 8.19 (d, 4H), 8.03 (d, 4H), 7.42 (m, 8H), 7.24 (m, 13H), 7.08 (m, 15H), 7.01 (s, 4H), 6.83 (s, 1H).

Synthesis of Compound 110

Compound 110 according to an example may be synthesized by, for example, the steps shown in Reaction Scheme 7 below:

Reaction Scheme 7

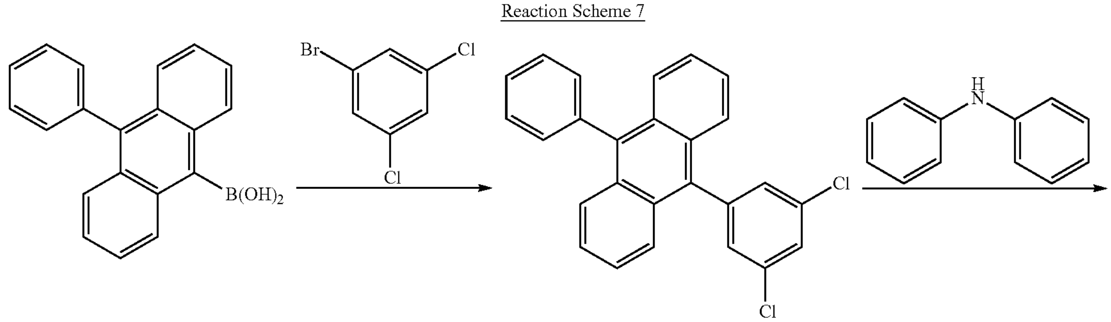

110-a

-continued
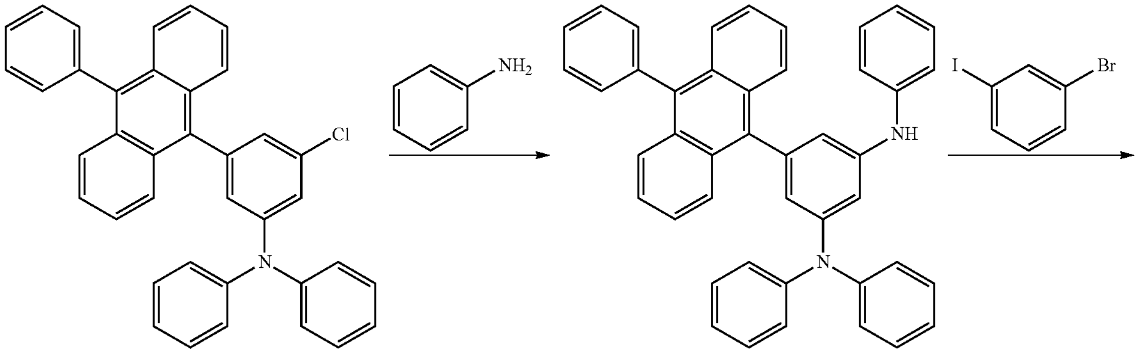
110-b 110-c
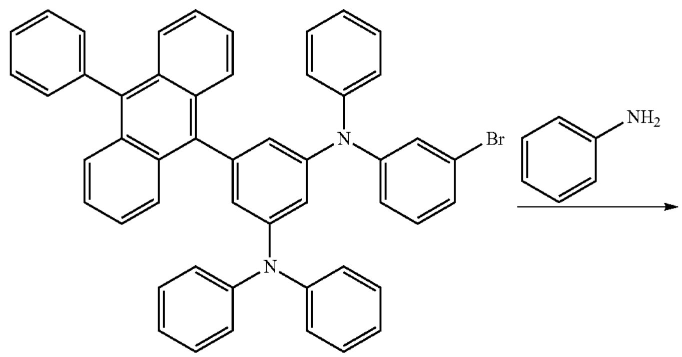
110-d
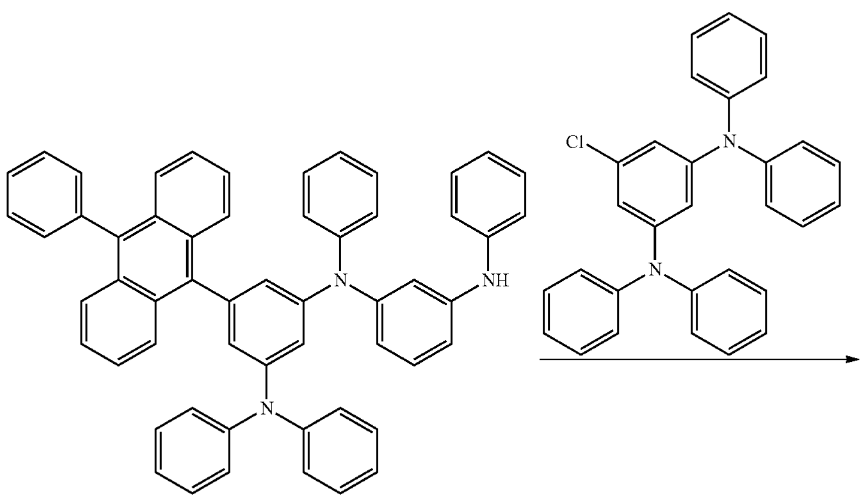
110-e
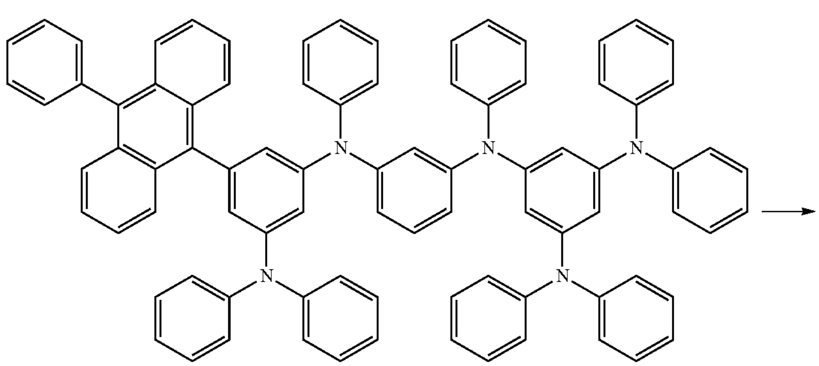
110-f -continued

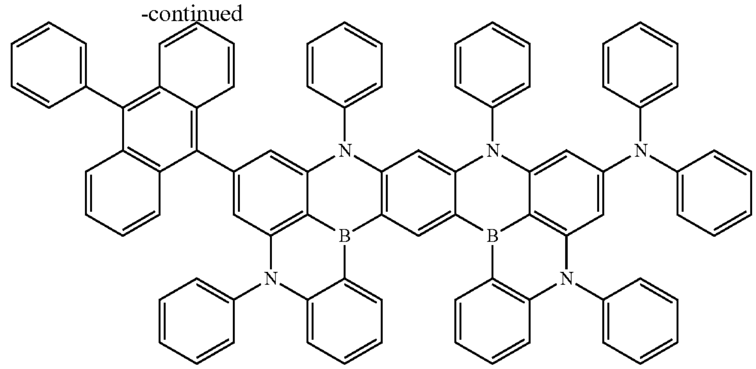

110

Compound 110-a

In an argon atmosphere, in a 2 L flask, 9-phenyl-anthracene-10-boronic acid (50 g, 168 mmol), 3,5-dichloro-bromobenzene (38 g, 168 mmol), $K_2CO_3$ (70 g, 504 mmol), and $Pd(PPh_3)_4$ (9.7 g, 8.4 mmol) were added and dissolved in a mixed solution of toluene (700 mL), EtOH (200 mL), and water (300 mL), and the reaction solution was then stirred at about 120° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 110-a (white solid, 48 g, yield: 72%).

ESI-LCMS: $[M+H]^+$: $C_{26}H_{17}Cl_2$. 399.0973.

$^1$H-NMR (400 MHz, $CDCl_3$): 8.21 (m, 4H), 7.85 (s, 2H), 7.71 (s, 1H), 7.65 (d, 2H), 7.55 (m, 2H), 7.37 (m, 4H).

Compound 110-b

In an argon atmosphere, in a 2 L flask, Compound 110-a (48 g, 120 mmol), diphenylamine (20 g, 120 mmol), BINAP (7.5 g, 12 mmol), sodium tert-butoxide (35 g, 360 mmol), and $Pd_2dba_3$ (5.5 g, 6.0 mmol) were added and dissolved in 1 L of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 110-b (white solid, 42 g, yield: 67%).

ESI-LCMS: $[M+H]^+$: $C_{38}H_{26}Cl_2N$. 532.1258.

$^1$H-NMR (400 MHz, $CDCl_3$): 8.21 (m, 4H), 7.35 (m, 3H), 7.55 (m, 3H), 7.41 (m, 5H), 7.24 (m, 4H), 7.00 (m, 7H).

Compound 110-c

In an argon atmosphere, in a 2 L flask, Compound 110-b (42 g, 79 mmol), aniline (9.6 g, 102 mmol), tris-tert-butyl-phosphine (7.2 mL, 7.8 mmol), sodium tert-butoxide (23 g, 237 mmol), and $Pd_2dba_3$ (3.6 g, 3.9 mmol) were added and dissolved in 600 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 110-c (white solid, 36 g, yield: 76%).

ESI-LCMS: $[M+H]^+$: $C_{44}H_{33}N_2$. 589.2612.

$^1$H-NMR (400 MHz, $CDCl_3$): 8.21 (m, 4H), 7.65 (d, 2H), 7.55 (t, 2H), 7.37 (m, 6H), 7.24 (m, 4H), 7.08 (m, 9H), 6.94 (m, 3H).

Compound 110-d

In an argon atmosphere, in a 2 L flask, Compound 110-c (36 g, 61 mmol), 3-iodo-bromobenzene (17 g, 61 mmol), tris-tert-butyl-phosphine (5.6 mL, 6.1 mmol), sodium tert-butoxide (17.5 g, 183 mmol), and $Pd_2dba_3$ (2.8 g, 3.1 mmol) were added and dissolved in 400 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 110-d (white solid, 36 g, yield: 76%).

ESI-LCMS: $[M+H]^+$: $C_{50}H_{36}N_2Br$. 743.2017.

$^1$H-NMR (400 MHz, $CDCl_3$): 8.21 (m, 4H), 7.65 (d, 2H), 7.55 (t, 2H), 7.37 (m, 6H), 7.24 (m, 8H), 7.03 (m, 11H), 6.94 (m, 3H).

Compound 110-e

In an argon atmosphere, in a 2 L flask, Compound 110-d (36 g, 49 mmol), aniline (6.1 g, 65 mmol), tris-tert-butyl-phosphine (4.4 mL, 5.0 mmol), sodium tert-butoxide (14 g, 147 mmol), and $Pd_2dba_3$ (2.2 g, 2.5 mmol) were added and dissolved in 400 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 110-e (white solid, 28 g, yield: 78%).

ESI-LCMS: $[M+H]^+$: $C_{56}H_{42}N_3$. 756.3030.

$^1$H-NMR (400 MHz, $CDCl_3$): 8.21 (m, 4H), 7.65 (d, 2H), 7.55 (t, 2H), 7.40 (m, 7H), 7.24 (m, 8H), 7.03 (m, 12H), 6.83 (s, 1H), 6.71 (m, 2H).

Compound 110-f

In an argon atmosphere, in a 2 L flask, Compound 110-e (36 g, 37 mmol), 5-chloro-$N^1$,$N^1$,$N^3$,$N^3$-tetraphenylbenzene-1,3-diamine (17 g, 37 mmol), tris-tert-butyl-phosphine (3.4 mL, 3.8 mmol), sodium tert-butoxide (10.6 g, 111 mmol), and $Pd_2dba_3$ (1.7 g, 1.9 mmol) were added and dissolved in 400 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 110-f (white solid, 23 g, yield: 54%).

ESI-LCMS: $[M+H]^+$: $C_{86}H_{63}N_5$. 1166.5017.

$^1$H-NMR (400 MHz, $CDCl_3$): 8.32 (m, 4H), 7.65 (d, 2H), 7.55 (t, 2H), 7.38 (m, 5H), 7.26 (m, 17H), 7.08 (m, 24H), 6.93 (s, 3H), 6.83 (s, 1H), 6.74 (d, 2H), 6.49 (m, 3H).

Compound 110

In an argon atmosphere, in a 1 L flask, Compound 110-f (23 g, 20 mmol) was dissolved in 400 mL of o-dichlorobenzene and cooled to about 0° C. in an ice water bath. Boron tribromide (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was completely removed under reduced pressure to obtain a solid. The solid thus obtained was washed with MeOH, and then purified and separated by silica gel column chromatography utilizing $CH_2Cl_2$ and hexane as eluent to obtain Compound 110 (yellow solid, 1.8 g, yield: 8%).

ESI-LCMS: $[M+H]^+$: $C_{86}H_{57}N_5B_2$. 1182.4327.

$^1$H-NMR (400 MHz, $CDCl_3$): 10.44 (s, 1H), 9.26 (d, 2H), 8.32 (m, 4H), 7.65 (d, 2H), 7.55 (t, 2H), 7.38 (m, 5H), 7.26 (m, 15H), 7.08 (m, 20H), 6.93 (s, 2H), 6.83 (s, 1H), 6.74 (d, 2H), 6.49 (m, 2H).

Synthesis of Compound 122

Compound 122 according to an example may be synthesized by, for example, the steps shown in Reaction Scheme 8 below:

Reaction Scheme 8

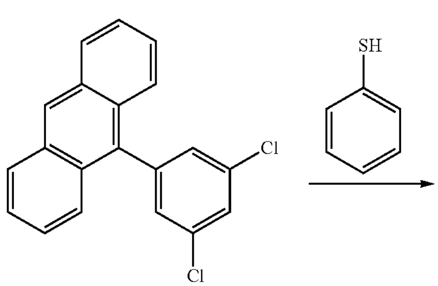

101-a

-continued

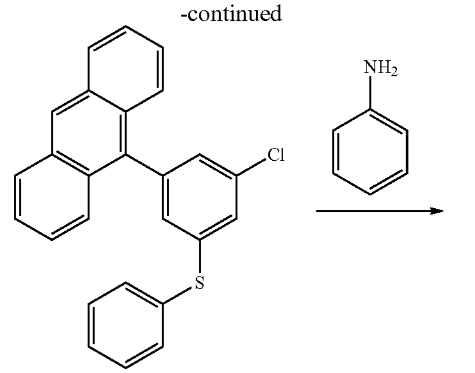

122-a

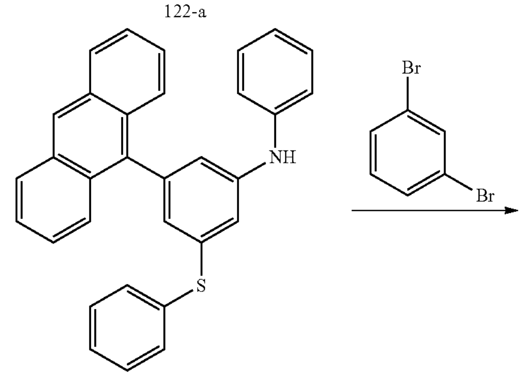

122-b

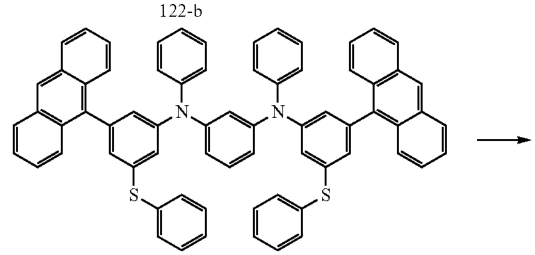

122-c

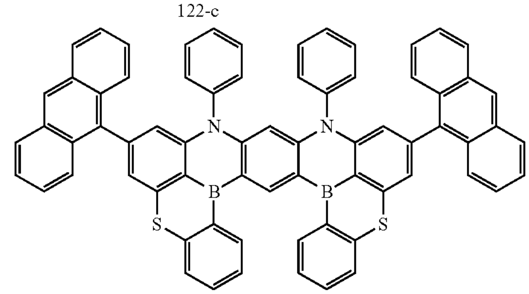

122

Compound 122-a

In an argon atmosphere, in a 2 L flask, Compound 101-a (50 g, 155 mmol), thiophene (17 g, 155 mmol), and $Cs_2CO_3$ (150 g, 465 mmol) were added and at in 1 L of NMP, and the reaction solution was then stirred at about 180° C. for about 24 hours. After cooling, the reaction solution was slowly poured into water (1 L), and the resulting solid was filtered. The solid was dissolved again in ethyl acetate (300 mL) and then washed with water several times and extracted to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 122-a (white solid, 35 g, yield: 58%).

ESI-LCMS: $[M+H]^+$: $C_{26}H_{18}ClS$. 397.0712.

$^1$H-NMR (400 MHz, $CDCl_3$): 8.39 (s, 1H), 8.19 (d, 2H), 8.03 (m, 2H), 7.71 (m, 2H), 7.43 (m, 10H).

Compound 122-b

In an argon atmosphere, in a 2 L flask, Compound 122-a (35 g, 88 mmol), aniline (10.7 g, 114 mmol), tris-tert-butyl-phosphine (8.0 mL, 8.8 mmol), sodium tert-butoxide (25.3 g, 264 mmol), and $Pd_2dba_3$ (4.0 g, 4.4 mmol) were added and dissolved in 600 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 122-b (white solid, 24 g, yield: 61%).

ESI-LCMS: $[M+H]^+$: $C_{32}H_{24}SN$. 454.1612.

$^1$H-NMR (400 MHz, $CDCl_3$): 8.39 (s, 1H), 8.19 (d, 2H), 8.03 (m, 2H), 7.86 (s, 1H), 7.44 (m, 11H), 7.20 (s, 1H), 7.03 (m, 4H).

Compound 122-c

In an argon atmosphere, in a 2 L flask, Compound 122-b (24 g, 53 mmol), 1,3-dibromobenzene (6.3 g, 26 mmol), tris-tert-butyl-phosphine (4.8 mL, 5.4 mmol), sodium tert-butoxide (15 g, 159 mmol), and $Pd_2dba_3$ (2.4 g, 2.7 mmol) were added and dissolved in 400 mL of toluene, and the reaction solution was then stirred at about 100° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 122-c (white solid, 43 g, yield: 63%).

ESI-LCMS: $[M+H]^+$: $C_{70}H_{49}S_2N_2$. 981.3227.

$^1$H-NMR (400 MHz, $CDCl_3$): 8.41 (s, 2H), 8.21 (d, 4H), 8.10 (m, 4H), 7.88 (s, 2H), 7.42 (m, 28H), 7.24 (m, 7H), 7.03 (m, 8H), 6.83 (s, 1H), 6.68 (d, 2H).

Compound 122

In an argon atmosphere, in a 1 L flask, Compound 122-c (40 g, 40 mmol) was dissolved in 1 L of o-dichlorobenzene and cooled to about 0° C. in an ice water bath. Boron tribromide (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was completely removed under reduced pressure to obtain a solid. The solid thus obtained was washed with MeOH, and then purified and separated by silica gel column chromatography utilizing $CH_2Cl_2$ and hexane as eluent to obtain Compound 122 (yellow solid, 2.0 g, yield: 5%).

ESI-LCMS: $[M+H]^+$: $C_{70}H_{43}N_5B_2S_2$. 997.9090.

$^1$H-NMR (400 MHz, $CDCl_3$): 10.44 (s, 1H), 9.26 (d, 2H), 8.32 (m, 4H), 7.65 (d, 2H), 7.55 (d, 2H), 7.42 (m, 8H), 7.24 (m, 8H), 7.02 (m, 10H), 6.83 (s, 1H).

2. Manufacture and Evaluation of Light Emitting Device

Manufacture of Light Emitting Device

A 300 Å-thick ITO layer was patterned on a glass substrate, and NPD was then deposited in vacuum on the upper portion (e.g., upper surface) of the ITO to form a 300 Å-thick hole injection layer. HT6 was deposited in vacuum on the upper portion (e.g., upper surface) of the hole injection layer to form a 200 Å-thick hole transport layer. CzSi as a hole transport layer compound was deposited in vacuum on the upper portion (e.g., upper surface) of the hole transport layer to form a 100 Å-thick emission-auxiliary layer. After the emission-auxiliary layer was formed, mCP and an Example Compound or a Comparative Example Compound were co-deposited at a weight ratio of 99:1 to form a 200 Å-thick emission layer. TSP01 was deposited on the upper portion (e.g., upper surface) of the emission layer to form a 200 Å-thick electron transport layer, and TPBi was then deposited on the upper portion (e.g., upper surface) of the electron transport layer to form a 300 Å-thick buffer layer. LiF was deposited on the upper portion (e.g., upper surface) of the electron transport layer to form a 10 Å-thick electron transport layer, and Al was deposited in vacuum to form a 3000 Å-thick LiF/Al electrode. HT28 was deposited in vacuum on the upper portion (e.g., upper surface) of the electrode to form a 700 Å-thick capping layer, thereby manufacturing a light emitting device. In the Examples, the hole injection layer, the hole transport layer, the emission-auxiliary layer, the electron transport layer, the buffer layer, the electron injection layer, and the electrode were formed by utilizing a vacuum deposition apparatus.

The compounds utilized in the manufacture of the light emitting devices are shown below.

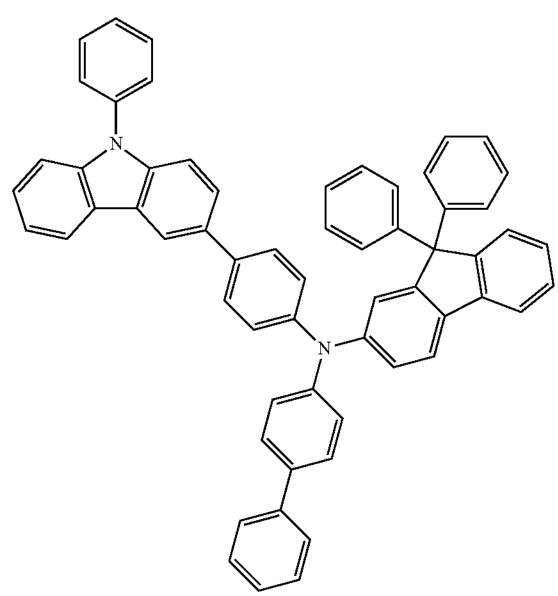

HT6

-continued

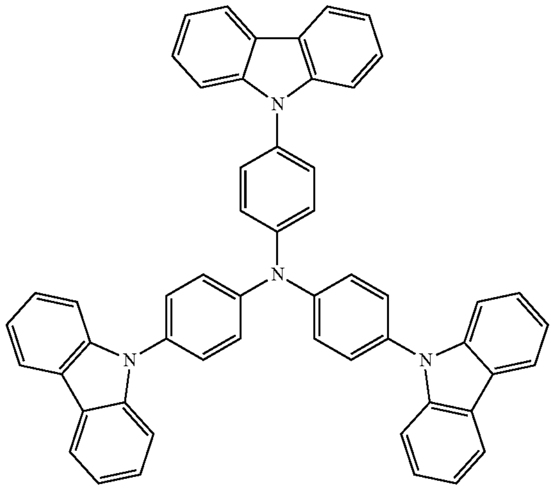

TCTA

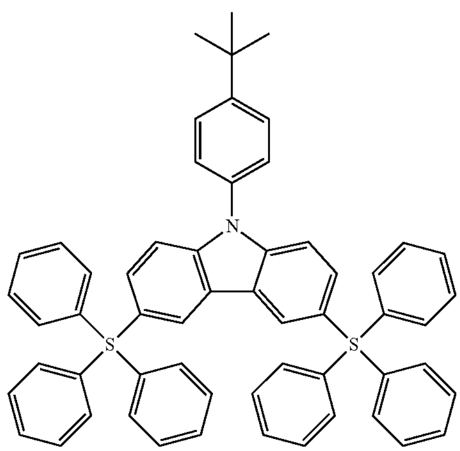

CzSi

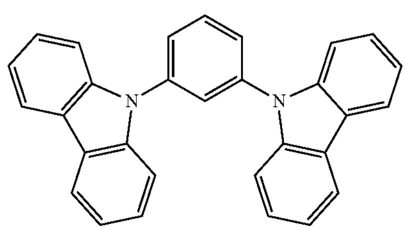

mCP

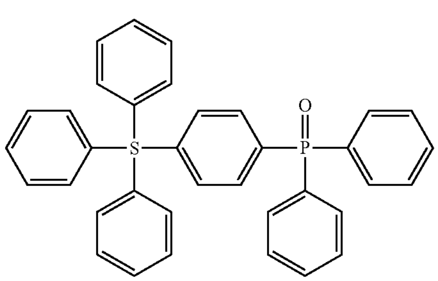

TSPQ1

-continued

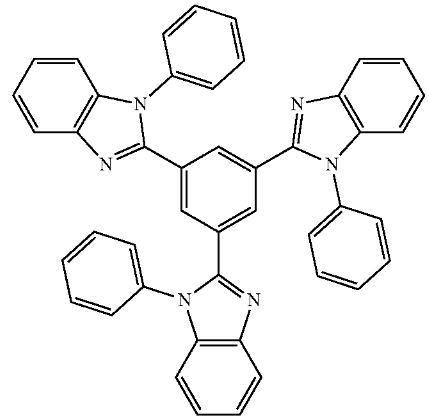

TPBi

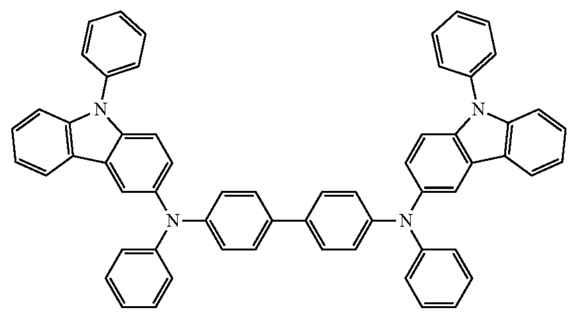

HT26

Evaluation of Light Emitting Device Characteristics

Examples 1 to 8 and Comparative Examples 1 and 2 each contained a host material in the emission layer, and characteristics thereof were evaluated. To evaluate the characteristics of each of the manufactured light emitting devices of Examples 1 to 8 and Comparative Examples 1 and 2, each including a compound according to embodiments of the present disclosure or Compound X-1 or Compound X-1 as its host material, driving voltage and efficiency (cd/A) at a current density of 10 mA/$cm^2$ were measured, and the relative device service life ratio ($T_{95}$) was calculated as a relative numerical value in comparison with Comparative Example 1, with the device service life represented by the time it took for the luminance to deteriorate from an initial luminance (100%) to 95% luminance when the device was continuously operated at a current density of 10 mA/$cm^2$ Compound X-1 that is included in Comparative Example 1 and Compound X-2 that is included in Comparative Example 2 are shown below.

To evaluate the luminous efficiencies of the light emitting devices of Examples 1 to 8 and Comparative Examples 1 and 2, the luminous efficiencies were measured by utilizing an external quantum efficiency measurement apparatus, C9920-12 manufactured by Hamamatsu Photonics, co., Japan. The device service life LT50 shows the time taken to reduce the luminance to about 50% of an initial luminance.

Compound X-1

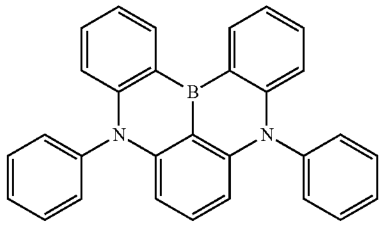

Compound X-2

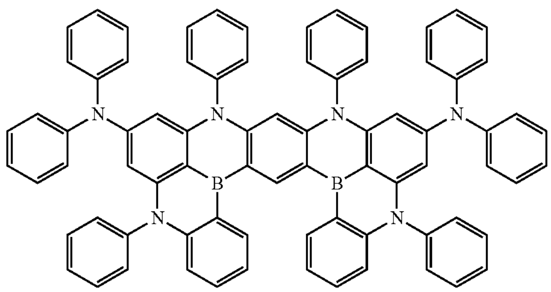

TABLE 1

| Device Manufacturing examples | Emission layer materials | Driving voltage (V) | Luminous efficiency (cd/A) | Relative device service life ratio ($T_{95}$) |
|---|---|---|---|---|
| Example 1 | Example Compound 20 | 4.2 | 20.7 | 5.26 |
| Example 2 | Example Compound 25 | 4.3 | 18.4 | 4.78 |
| Example 3 | Example Compound 51 | 4.6 | 22.6 | 4.13 |
| Example 4 | Example Compound 79 | 4.5 | 24.1 | 3.4 |
| Example 5 | Example Compound 94 | 4.7 | 21.5 | 3.9 |
| Example 6 | Example Compound 101 | 4.3 | 17.8 | 4.8 |
| Example 7 | Example Compound 110 | 4.5 | 19.8 | 4.34 |
| Example 8 | Example Compound 122 | 4.5 | 22.8 | 4.3 |
| Comparative Example 1 | Comparative Example Compound X-1 | 5.2 | 15.7 | 1.00 |
| Comparative Example 2 | Comparative Example Compound X-2 | 4.8 | 20.8 | 2.61 |

When comparing Examples 1 to 8 with Comparative Examples 1 and 2, Examples 1 to 8 each exhibited high efficiency characteristics. The reason for this is considered that the compounds included in Examples 1 to 8 each have a lowest triplet excitation energy ($T_1$) less than about 1.8 eV. When the anthracene is included as a substituent as in Examples 1 to 8, the compounds may have a lowest triplet excitation energy of about 1.8 eV or less. The anthracene has a long conjugation structure, and thus has a lowest triplet excitation energy of about 1.7 eV, and the compounds including the anthracene as a substituent have a low lowest triplet excitation energy due to the anthracene.

As the life time in a triplet energy of a high energy level gets longer, the excitons break a weak bond in the molecule, or deteriorate and decompose organic materials in the emission layers by mechanisms such as triplet-triplet annihilation (TTA) and/or triplet-polaron quenching (TPQ) to reduce service lives of the light emitting devices. Examples 1 to 8 each contain a compound with a low lowest triplet excitation energy, and thus are stabilized by the rapid internal conversion of the exciton from a high triplet energy to a lowest triplet excitation energy. Therefore, it is believed that in Examples 1 to 8, the deterioration and decomposition of the organic materials in the emission layers are reduced due to the excitons in high energy states, thereby increasing service lives of the light emitting devices.

Thus, Examples 1 to 8 show the results of improving the service lives of the light emitting devices compared to Comparative Examples 1 and 2. That is, by utilizing the polycyclic compound at which at least one anthracenyl group is substituted, the service life of the light emitting device of an example may be improved.

The light emitting device of an example includes the polycyclic compound having a low lowest triplet excitation energy by including at least one anthracenyl group, and thereby the service life thereof may be improved.

The light emitting device of an embodiment may include the polycyclic compound of an embodiment in an emission layer, thereby exhibiting long service life characteristics.

Although the present disclosure has been described with reference to example embodiments of the present disclosure, it will be understood that the present disclosure should not be limited to these embodiments but various suitable changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:

1. A light emitting device comprising:

a first electrode;

a second electrode on the first electrode; and an emission layer between the first electrode and the second electrode and comprising a polycyclic compound represented by Formula 1, wherein the first electrode and the second electrode each independently comprise any one selected from among Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, or an oxide thereof:

Formula 1

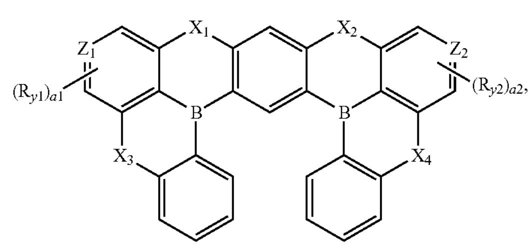

and wherein, in Formula 1, $X_1$ to $X_4$ are each independently O, S, Se, or $NR_1$, $Z_1$ and $Z_2$ are each independently $CR_2$, a1 and a2 are each independently an integer of 0 to 2, $R_{y1}$ and $R_{y2}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkenyl group having 2 to 20 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, $R_1$ and $R_2$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkenyl group having 2 to 20 carbon atoms, a substituted or unsubstituted oxy group, a substituted or unsubstituted aryl group having 6 to 30 ring-forming carbon atoms, a substituted or unsubstituted heteroaryl group having 2 to 30 ring-forming carbon atoms, a substituted or unsubstituted thio group, or a moiety represented by Formula A, and/or are bonded to an adjacent group to form a ring, at least one selected from among $X_1$ to $X_4$, $Z_1$ and $Z_2$ comprises the moiety represented by Formula A:

Formula A

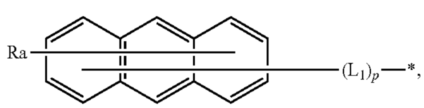

and wherein, in Formula A,

Ra is a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, $L_1$ is a substituted or unsubstituted arylene group having 6 to 30 ring-forming carbon atoms, a substituted or unsubstituted heteroarylene group having 2 to 30 ring-forming carbon atoms, or a substituted or unsubstituted divalent amine group, and p is 0 or 1.

2. The light emitting device of claim 1, wherein the moiety represented by Formula A is represented by any one selected from among Formula A-1 to Formula A-4:

Formula A-1

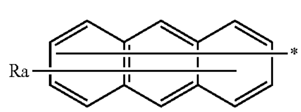

-continued

Formula A-2

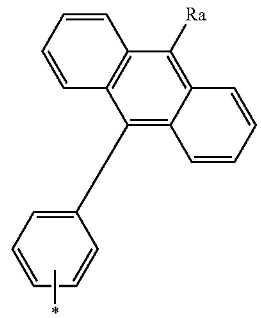

Formula A-3

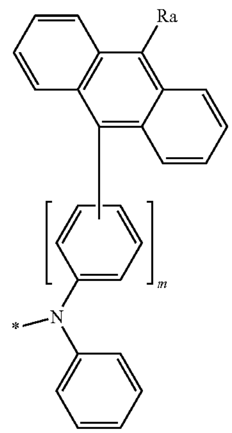

Formula A-4

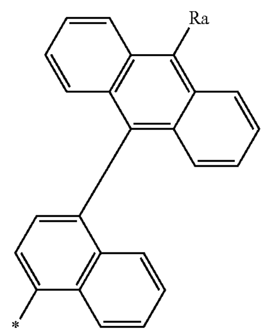

and wherein, in Formula A-3, m is 0 or 1, and wherein, in Formula A-1 to Formula A-4, Ra is the same as defined in connection with Formula A.

3. The light emitting device of claim 2, wherein the moiety represented by Formula A-1 is represented by Formula AA-1 or Formula AA-2:

Formula AA-1

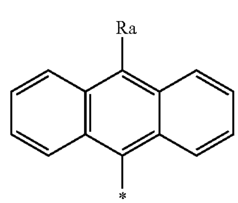

-continued

Formula AA-2

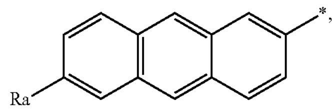

and wherein, in Formula AA-1 and Formula AA-2, Ra is the same as defined in connection with Formula 1.

4. The light emitting device of claim 2, wherein the moiety represented by Formula A-2 is represented by any one selected from among Formula B-1 to Formula B-3:

Formula B-1

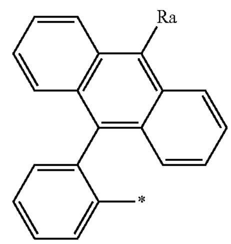

Formula B-2

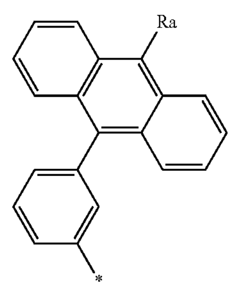

Formula B-3

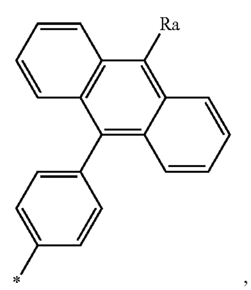

and wherein, in Formula B-1 to Formula B-3, Ra is the same as defined in connection with Formula A.

5. The light emitting device of claim 2, wherein the moiety represented by Formula A-3 is represented by Formula C-1 or Formula C-2:

Formula C-1

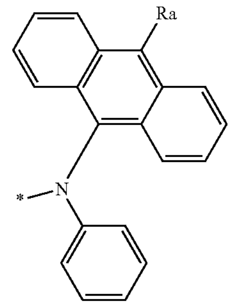

Formula C-2

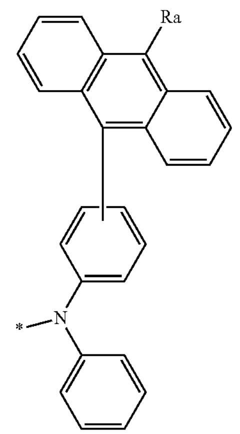

and wherein, in Formula C-1 and Formula C-2, Ra is the same as defined in connection with Formula A.

6. The light emitting device of claim 1, wherein Ra is an unsubstituted phenyl group or an unsubstituted naphthyl group.

7. The light emitting device of claim 1, wherein a lowest triplet excitation energy of the polycyclic compound is about 1.8 eV or less.

8. The light emitting device of claim 1, wherein the emission layer comprises a dopant and a host, and the dopant comprises the polycyclic compound represented by Formula 1.

9. The light emitting device of claim 1, further comprising a capping layer on the second electrode, wherein the capping layer has a refractive index of about 1.6 or more.

10. The light emitting device of claim 1, wherein the polycyclic compound represented by Formula 1 is to emit thermally activated delayed fluorescence.

11. The light emitting device of claim 1, wherein the emission layer is to emit blue light.

12. The light emitting device of claim 1, wherein the emission layer comprises at least one compound represented by Compound Group 1:

Compound Group 1
1
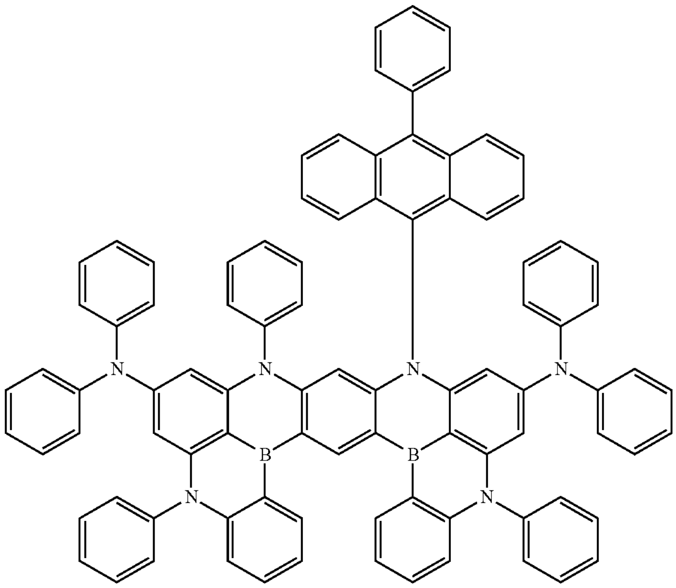
2
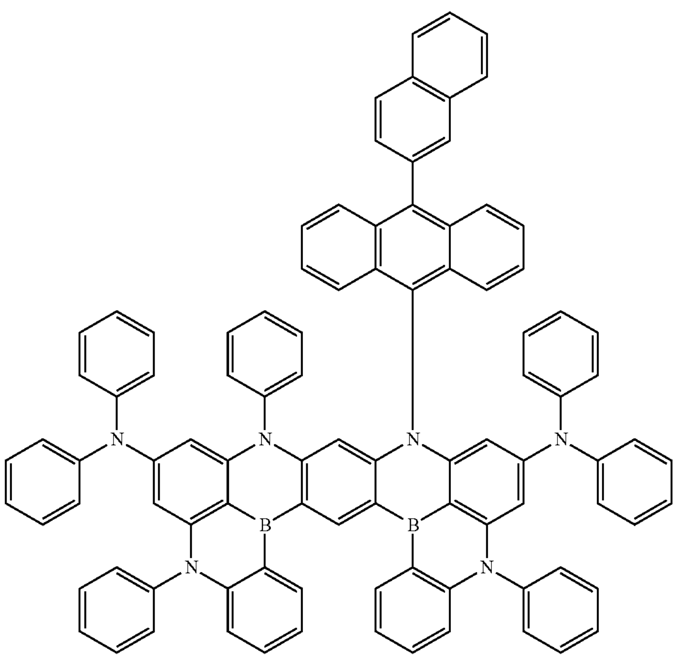

-continued
3
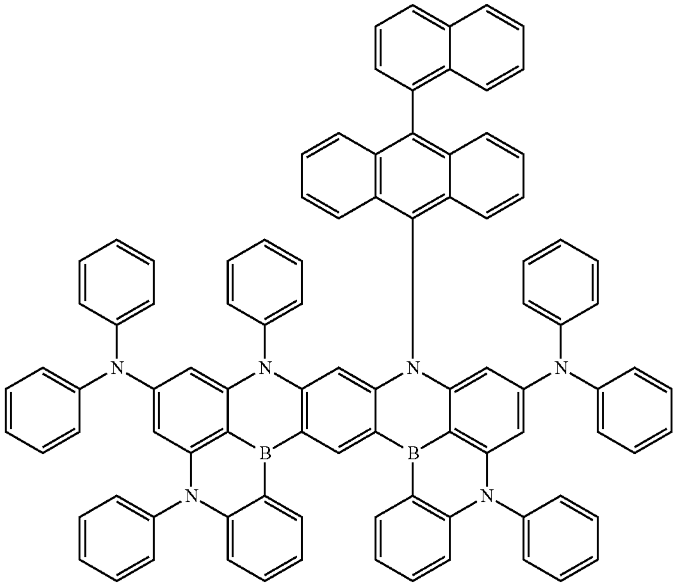
4
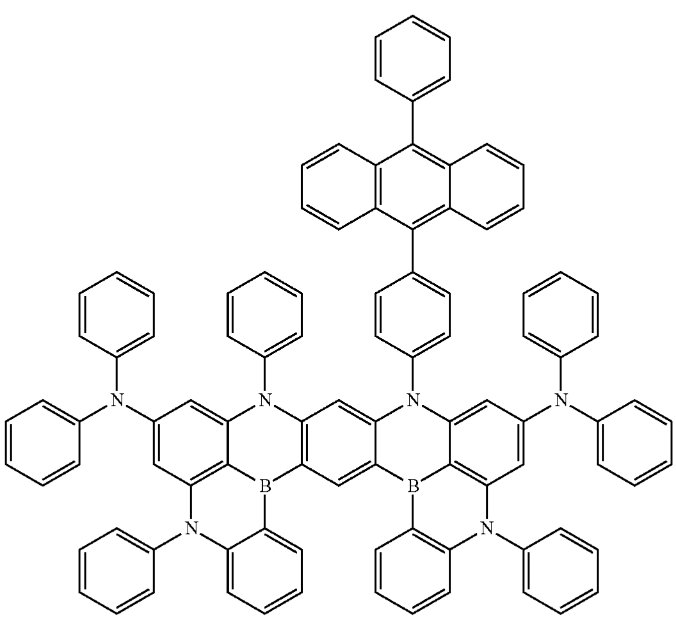

-continued
5
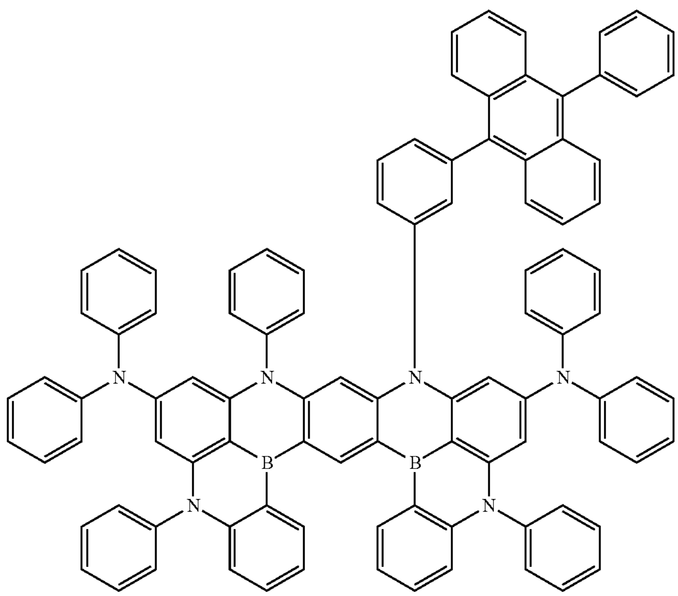
6
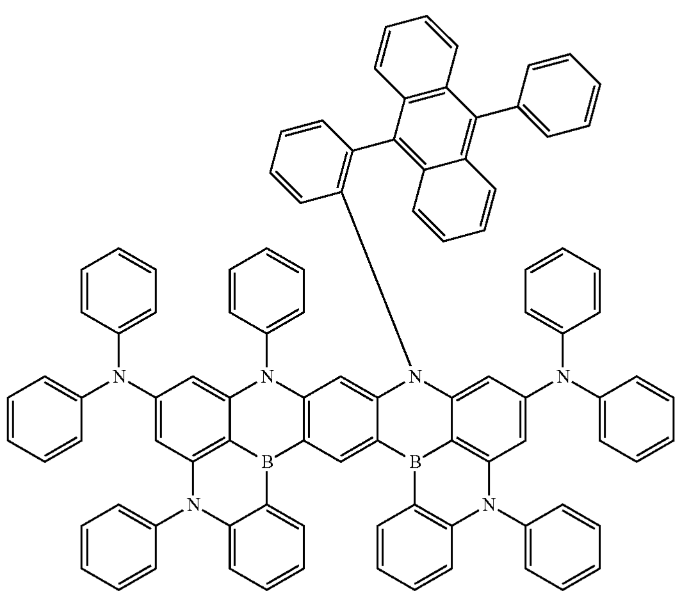
7
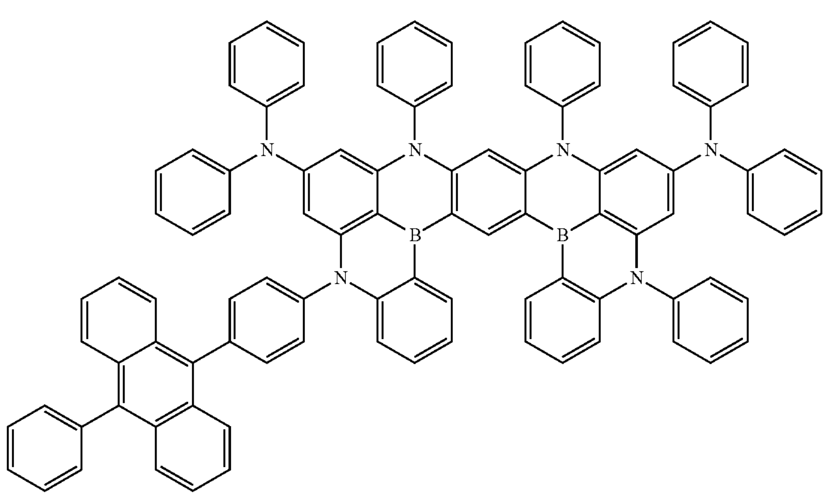

-continued
8
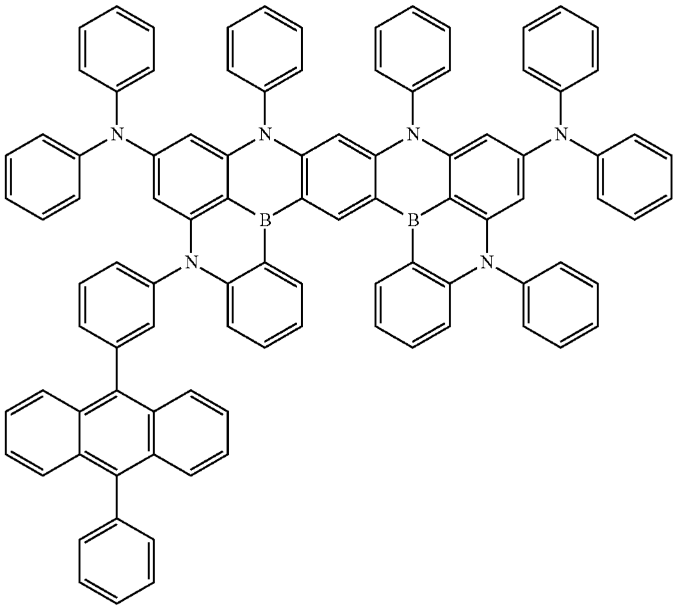
9
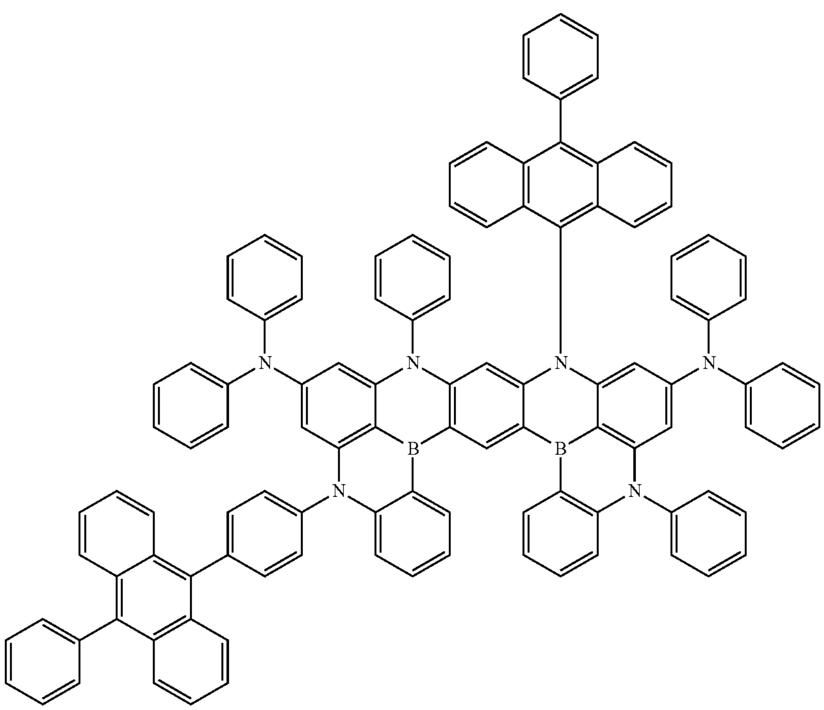

-continued
10
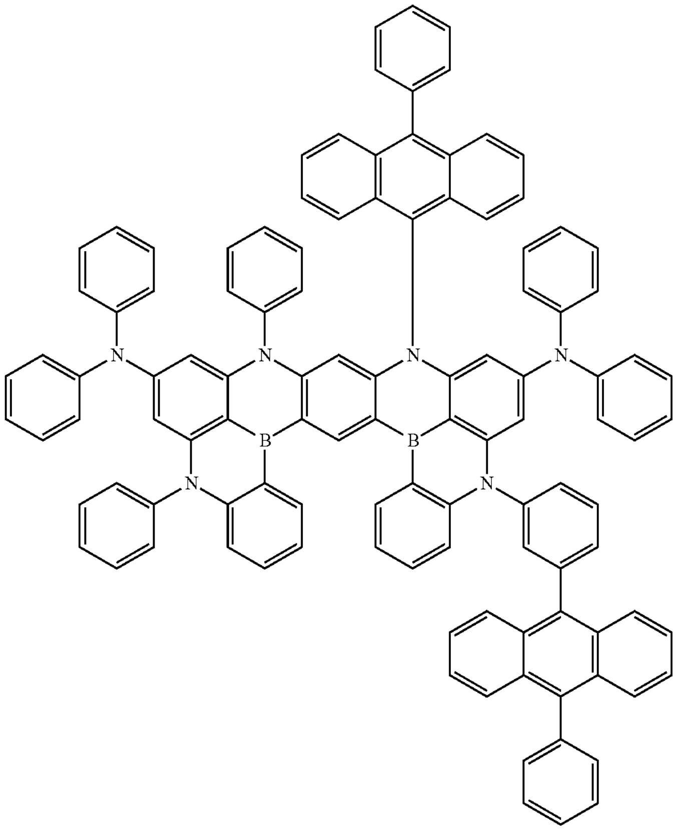
11
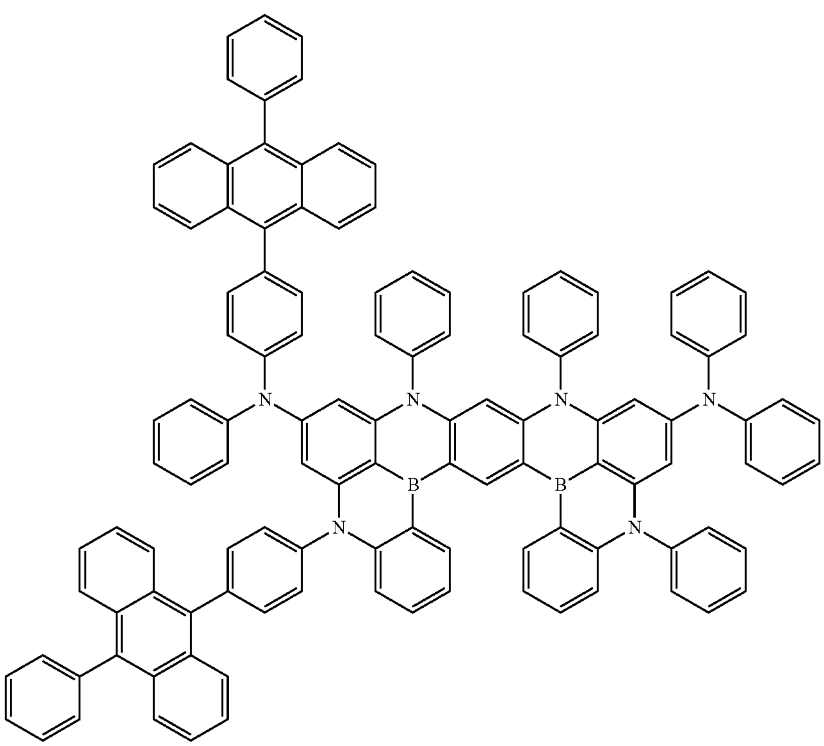

-continued
12
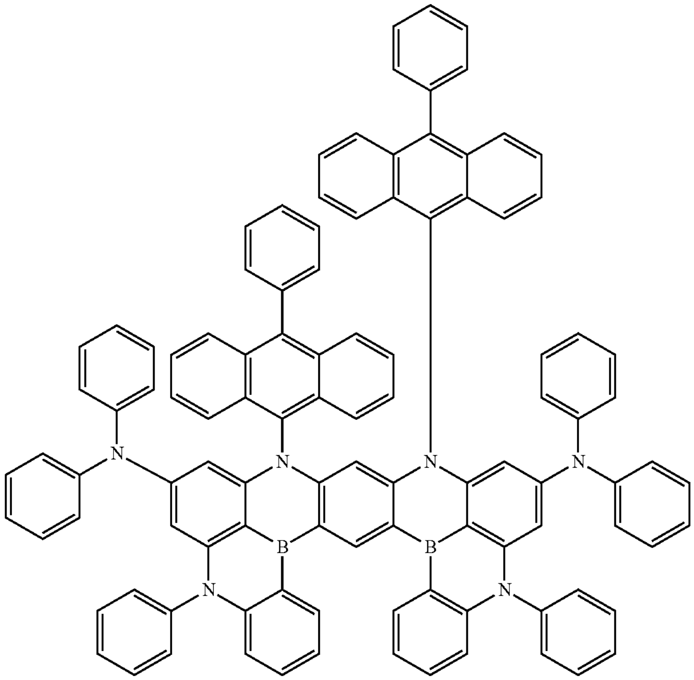
13
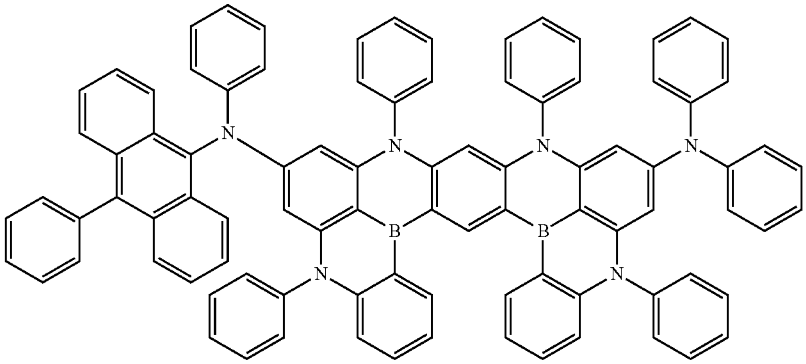
14
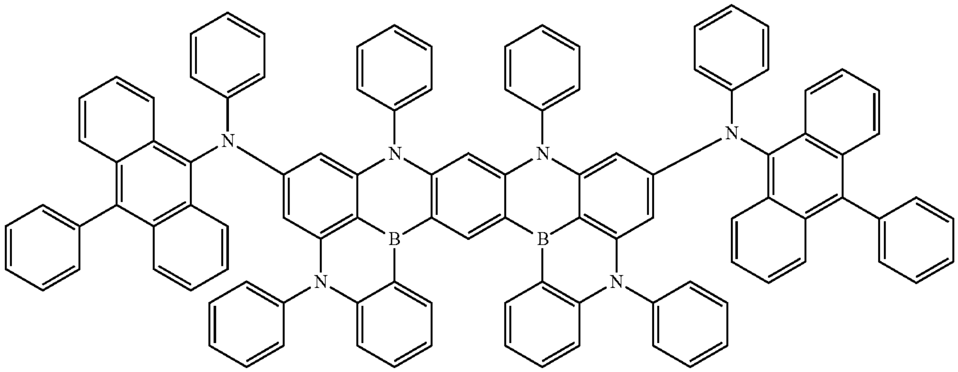

-continued
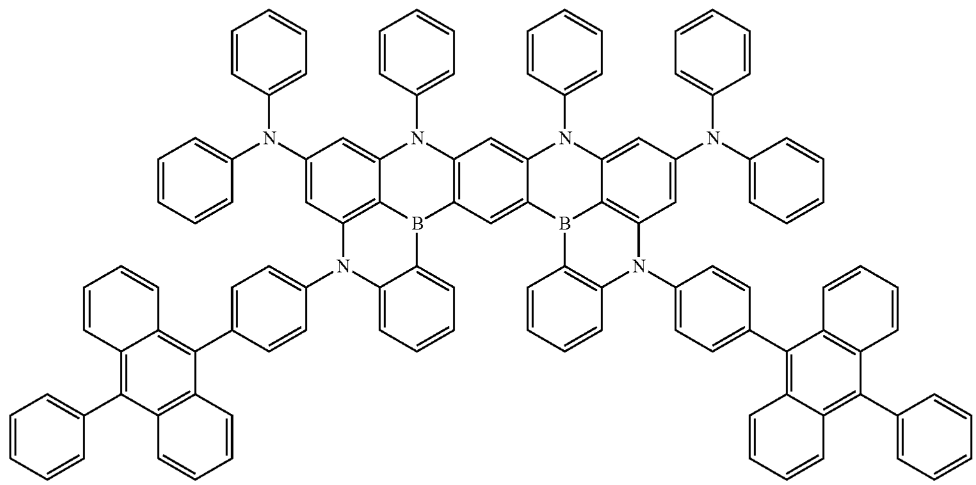
15
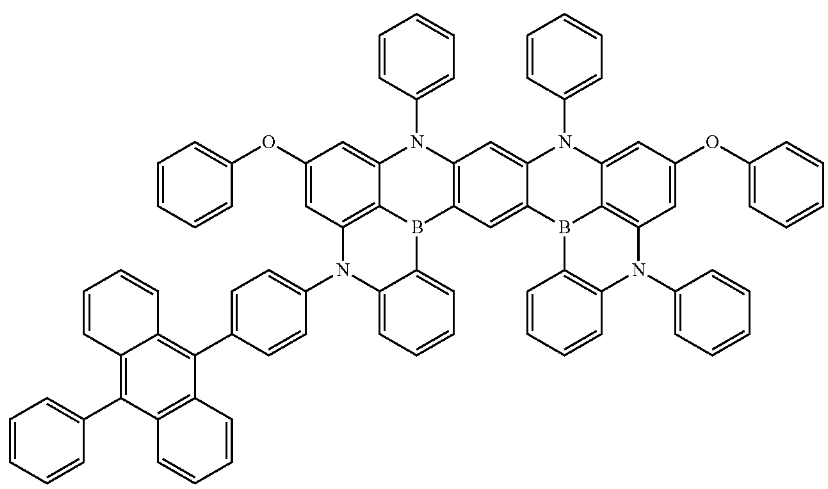
16
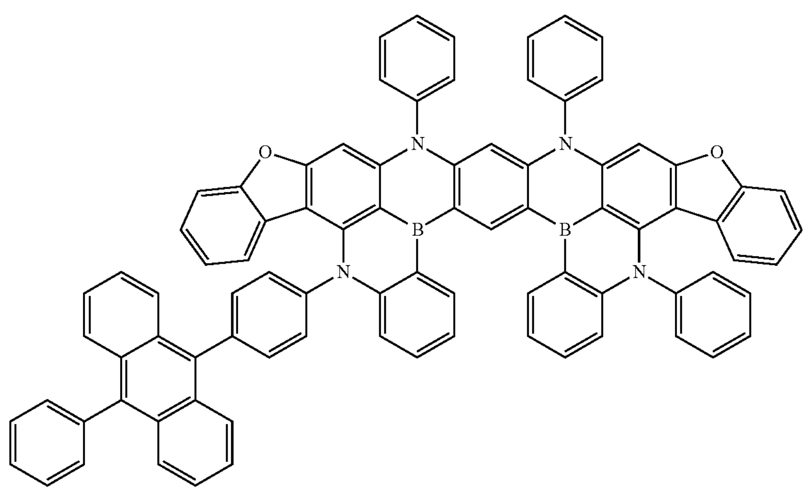
17

-continued
18
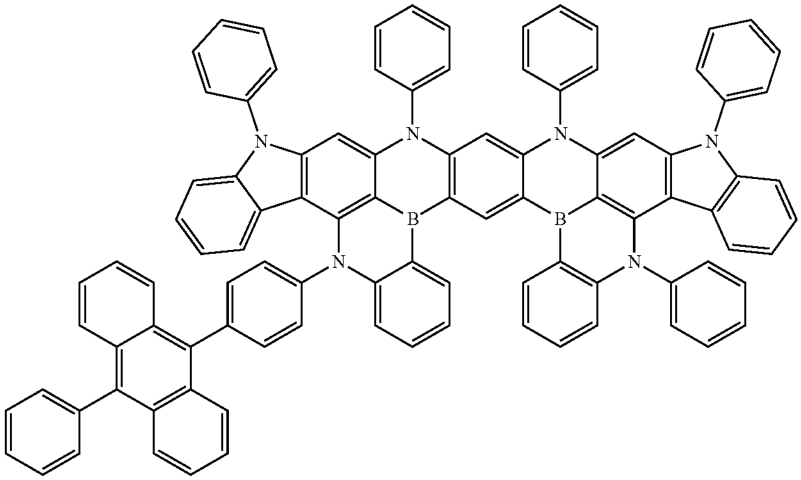
19
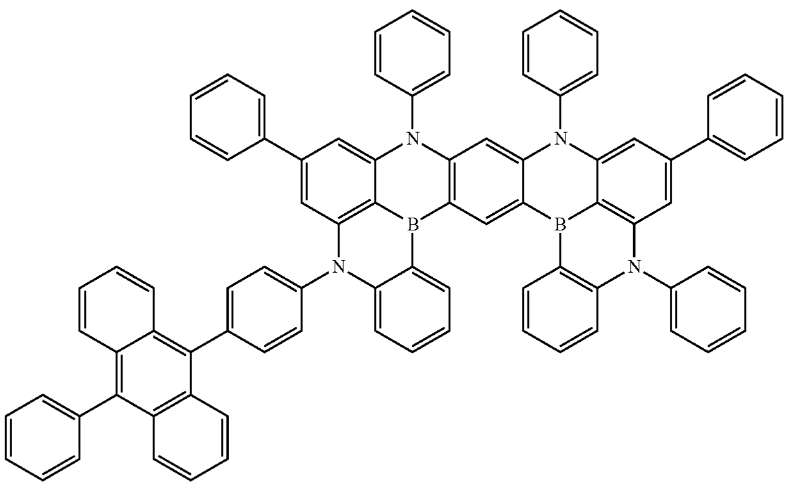
20
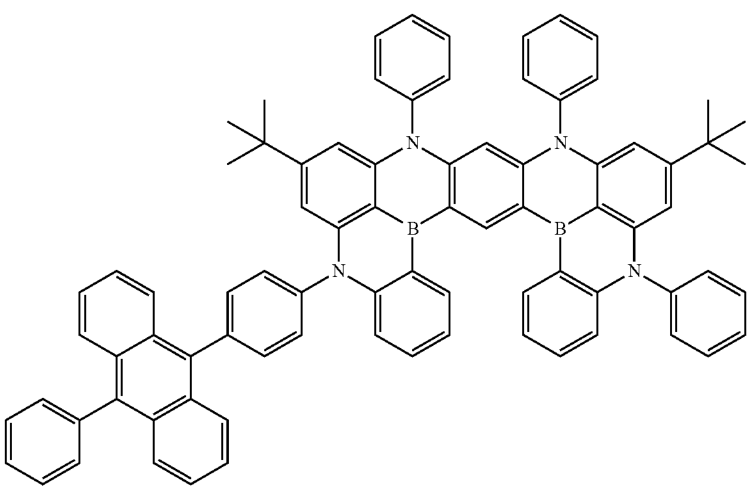

-continued
21
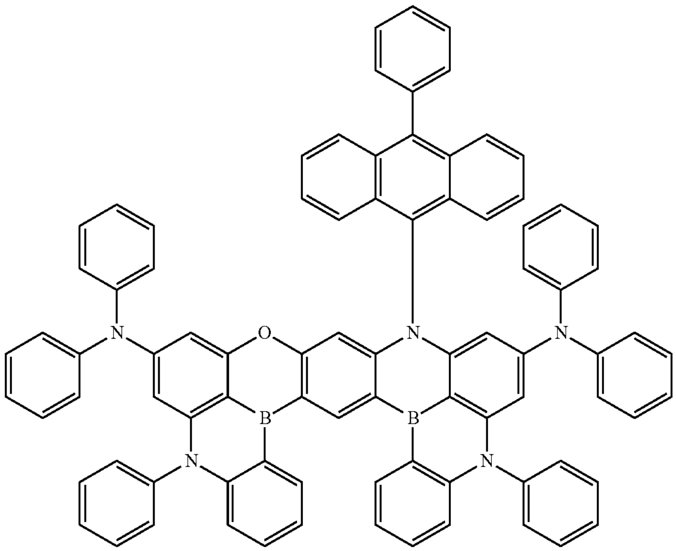
22
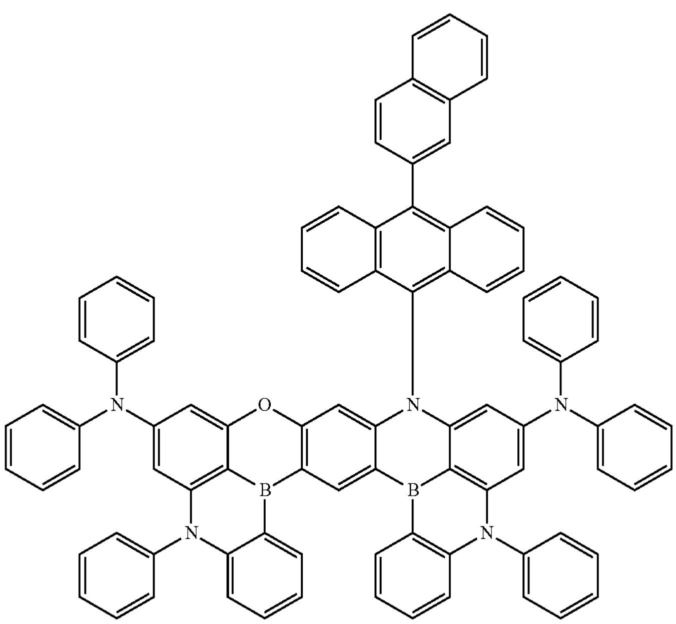

-continued
23
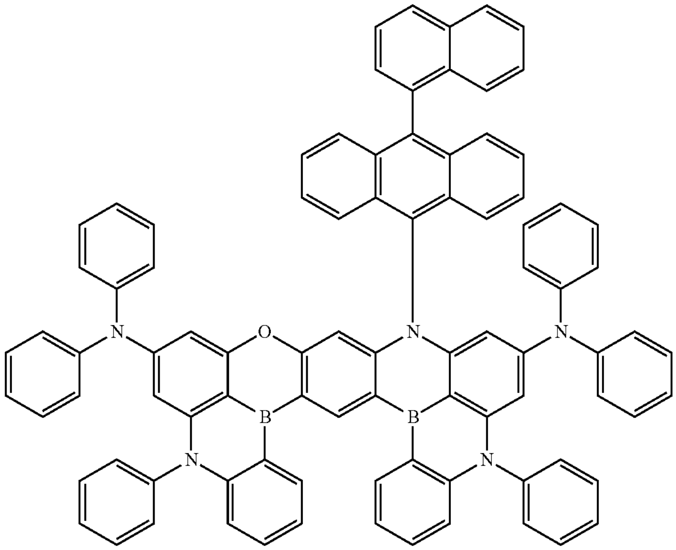
24
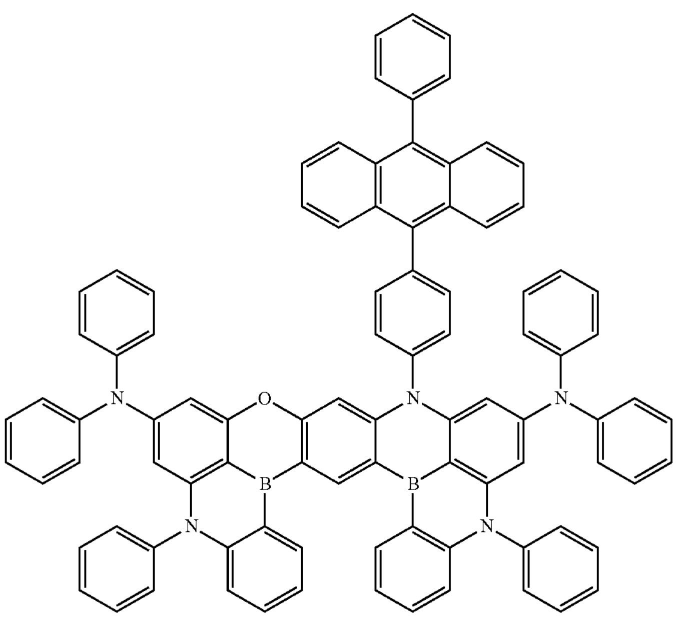

-continued
25
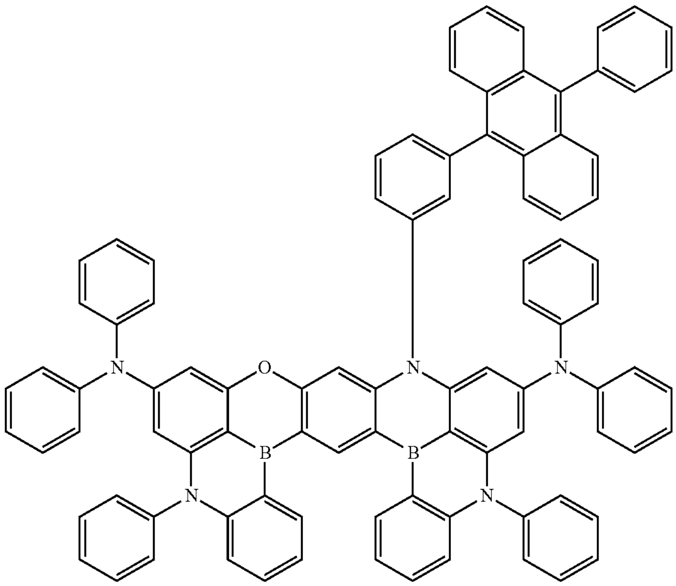
26
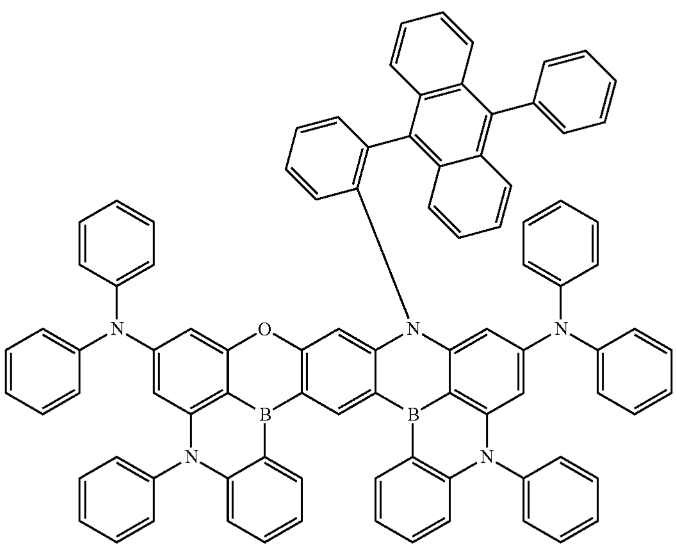
27
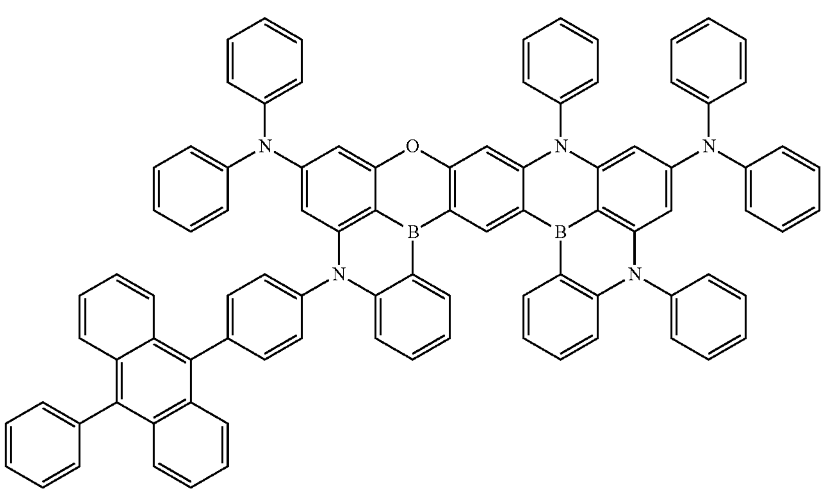

-continued
28
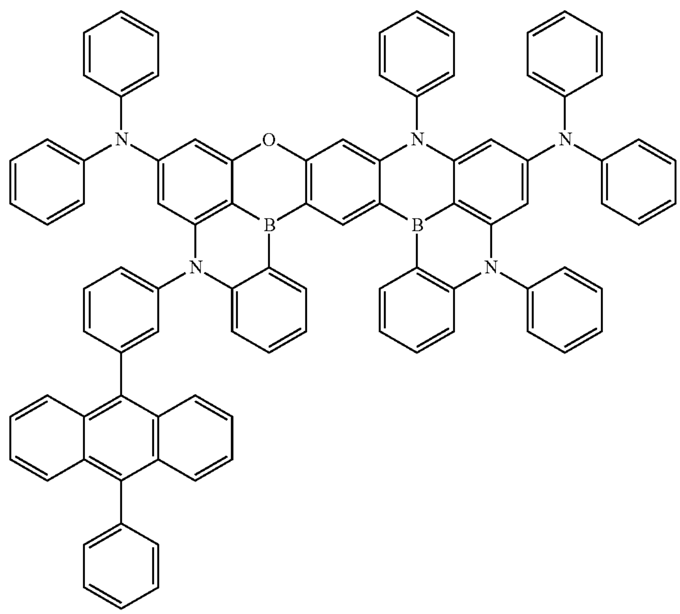
29
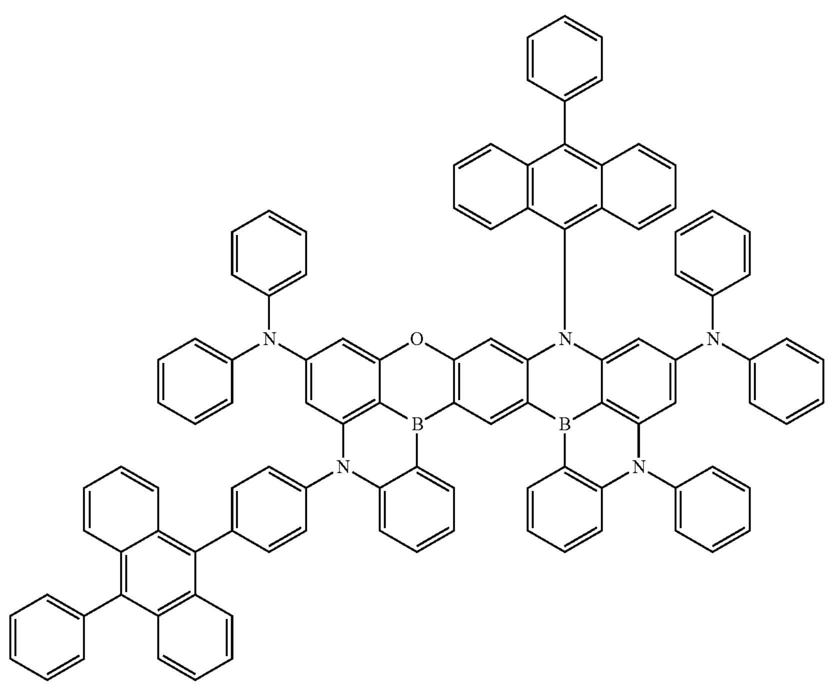

-continued
30
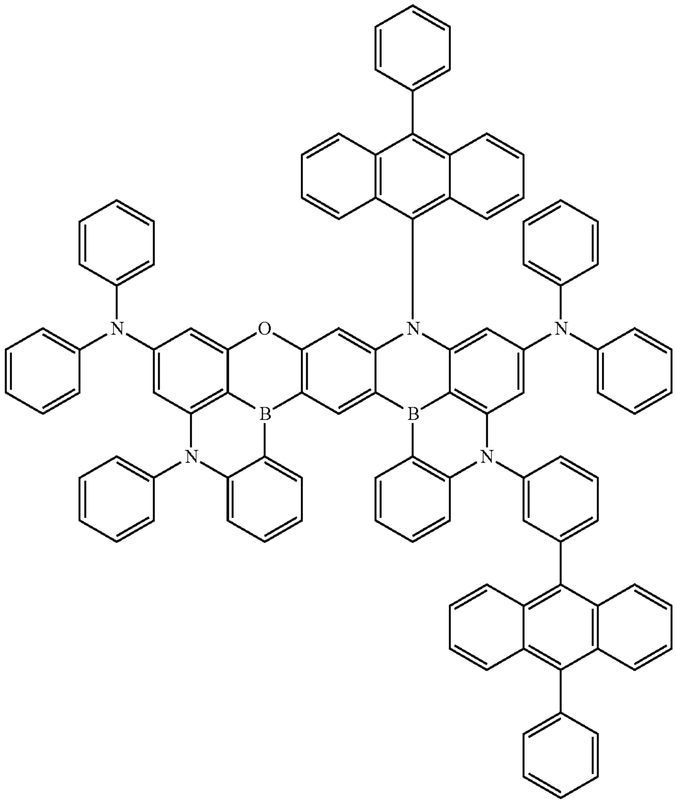
31
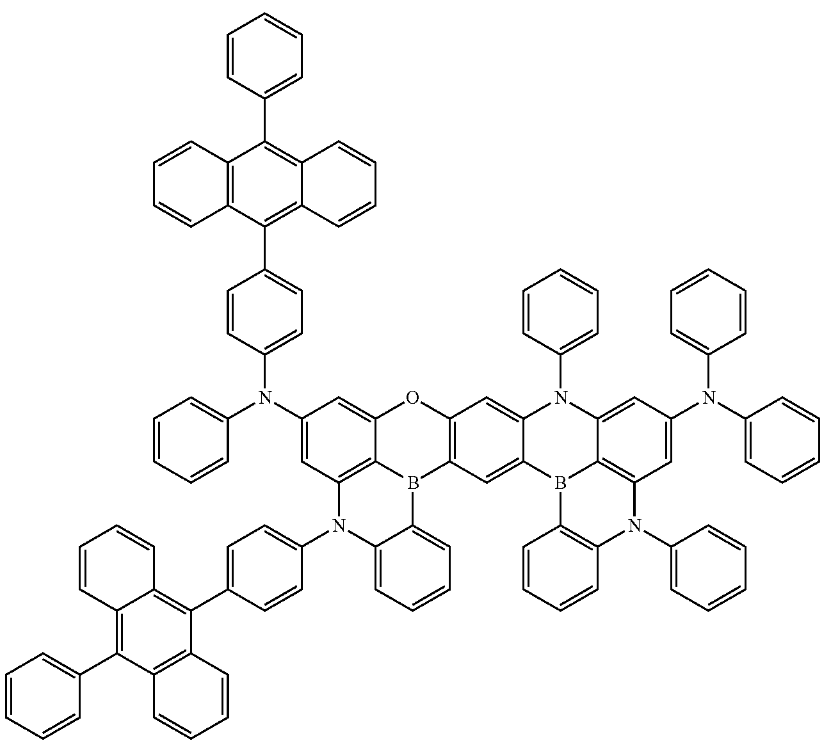

-continued
32
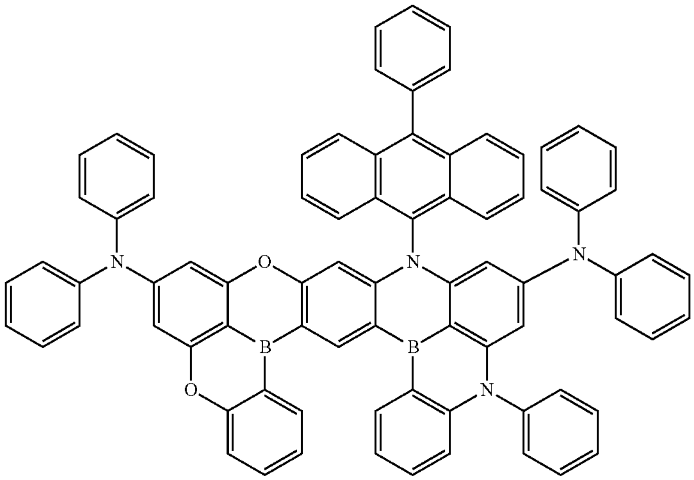
33
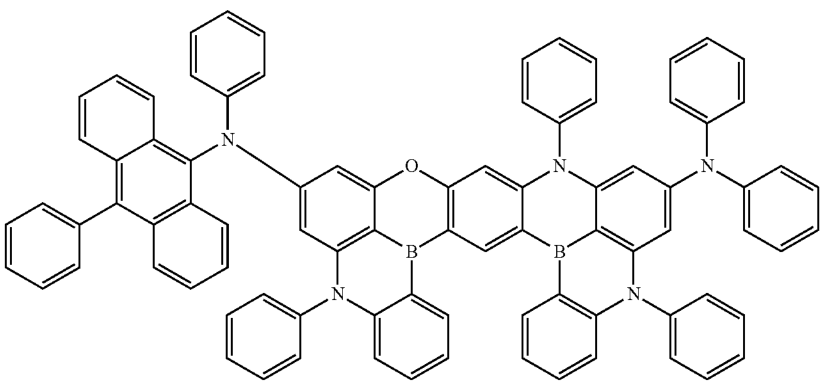
34
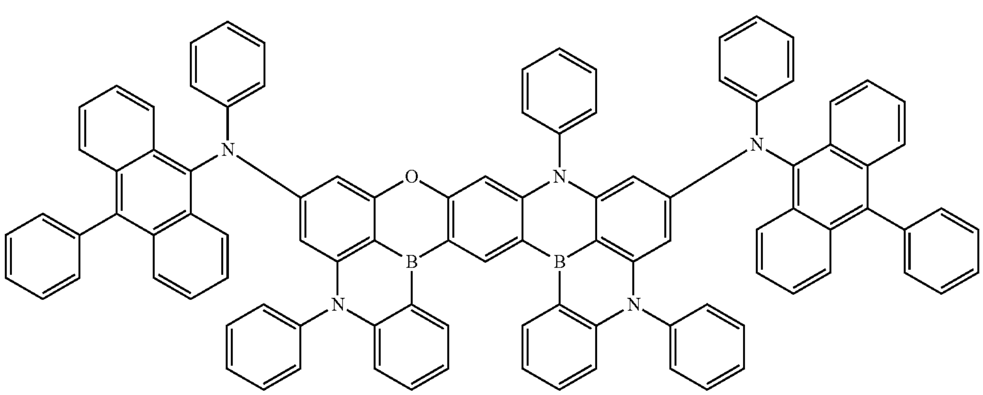

-continued
35
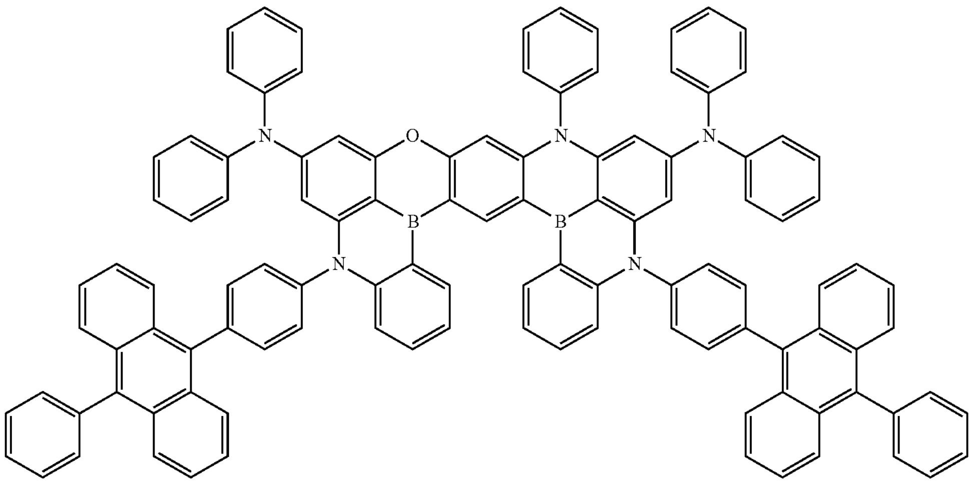
36
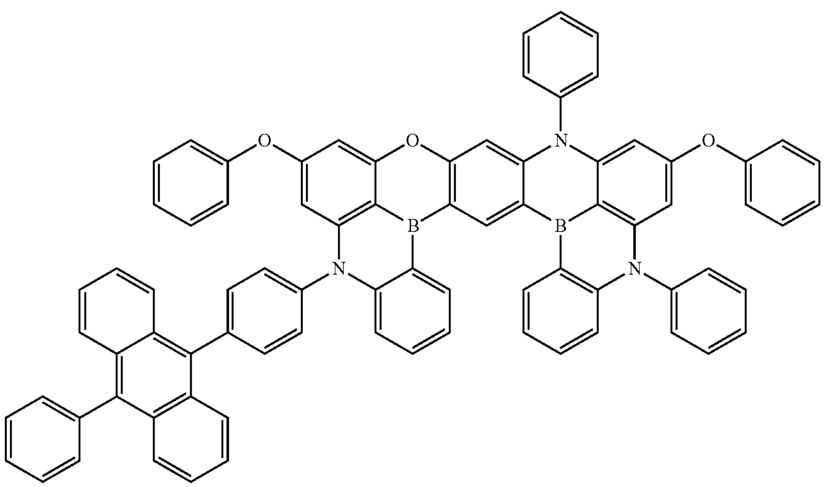
37
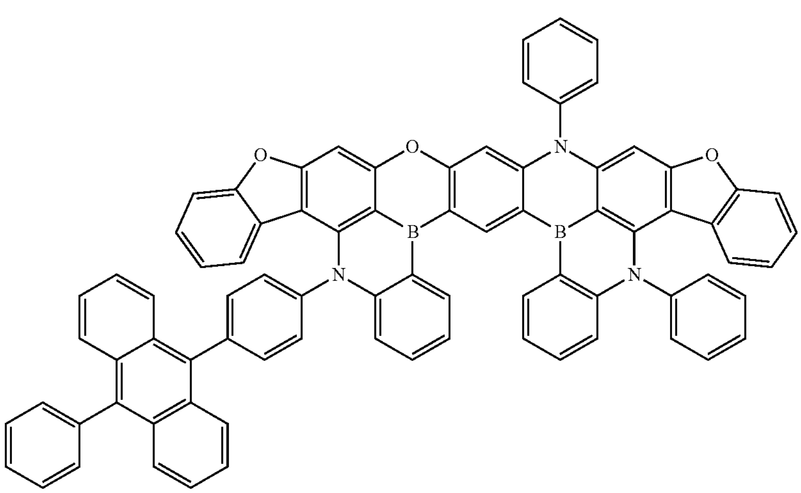

-continued
38
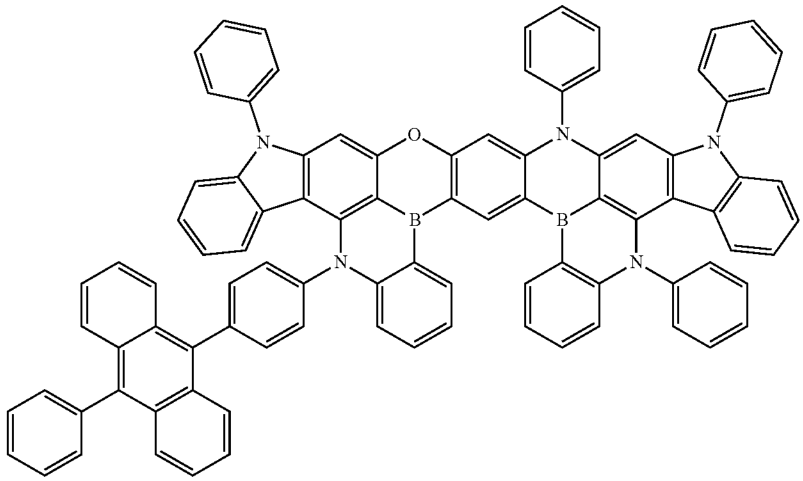
39
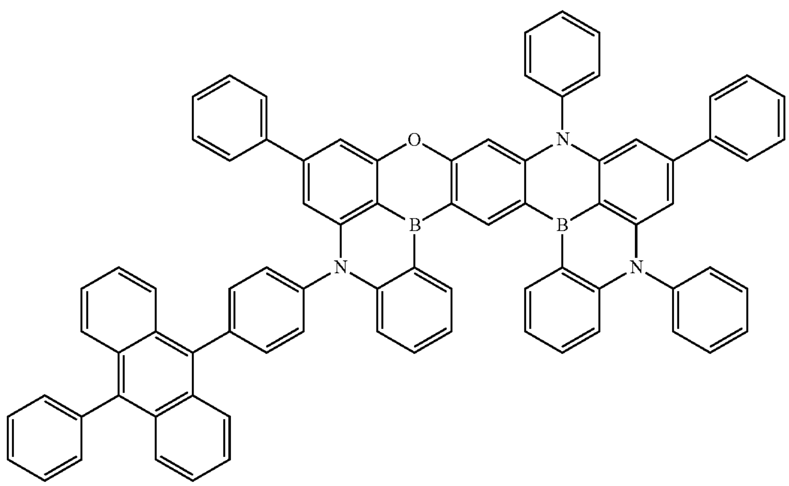
40
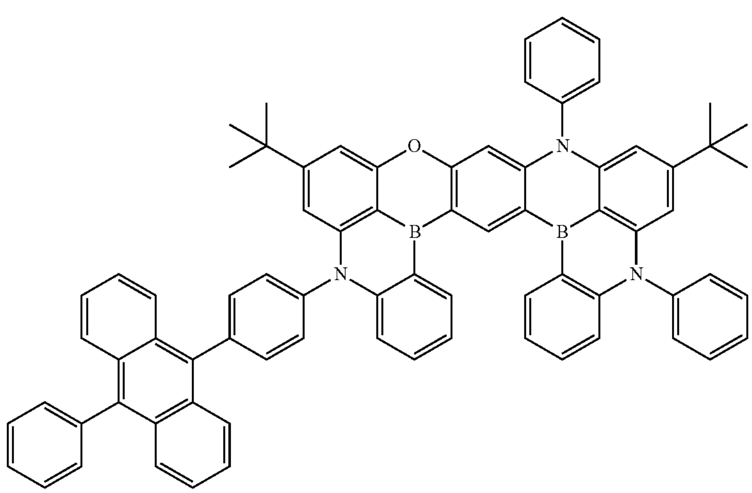

-continued
41
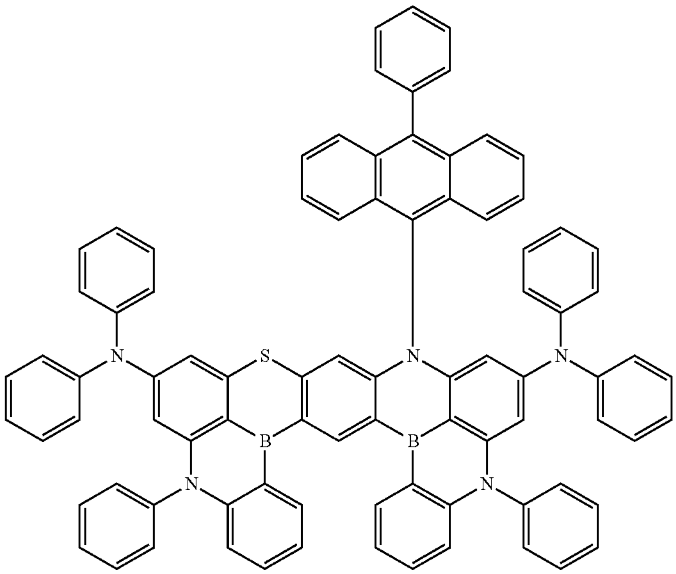
42
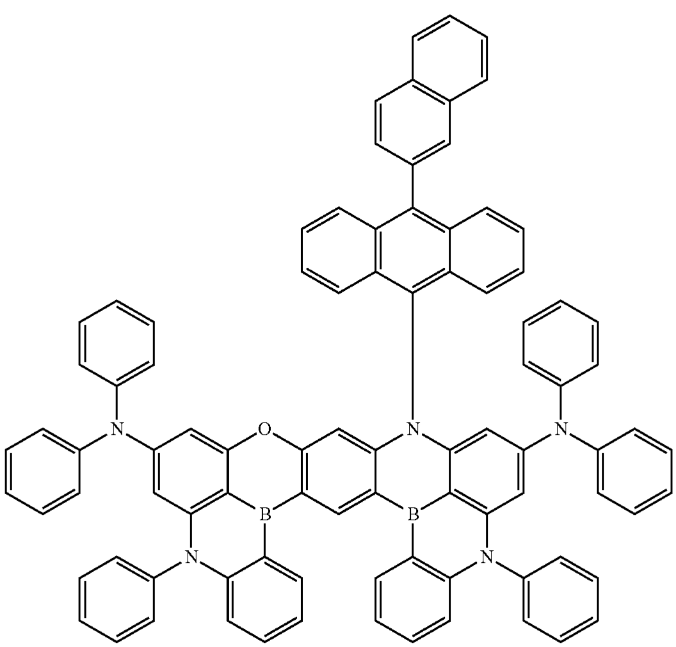

-continued
43
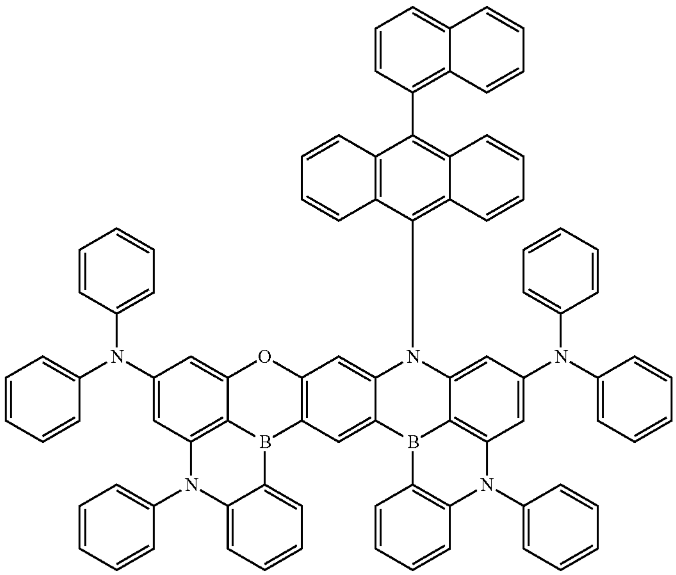
44
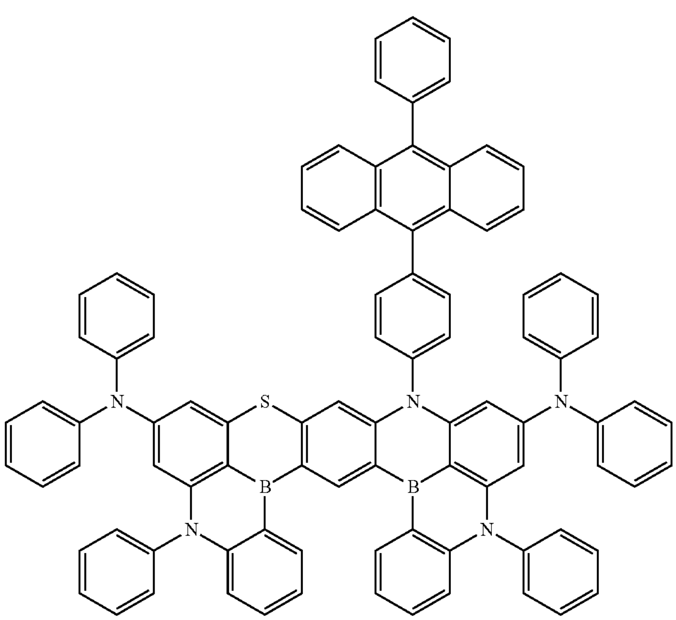

-continued
45
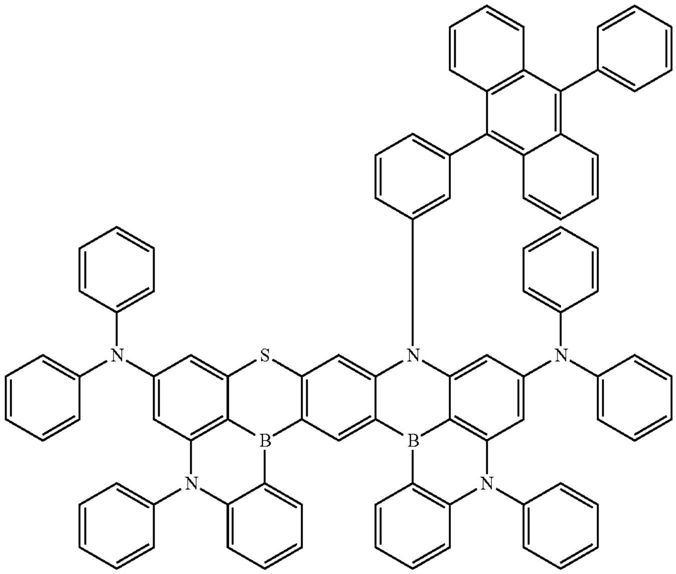
46
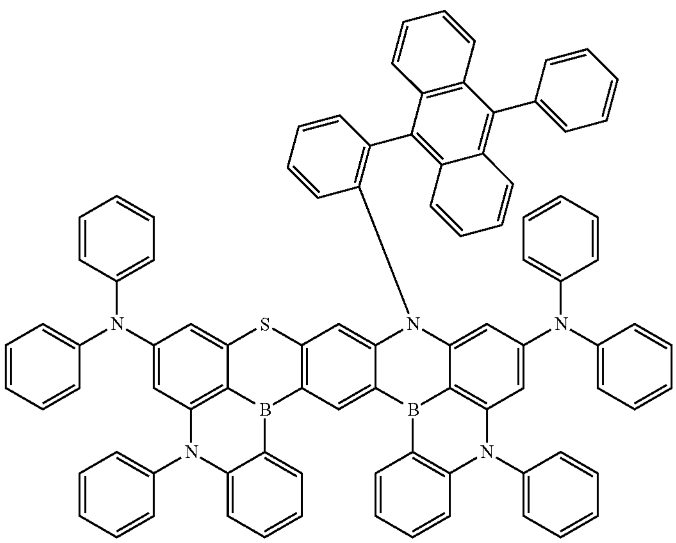
47
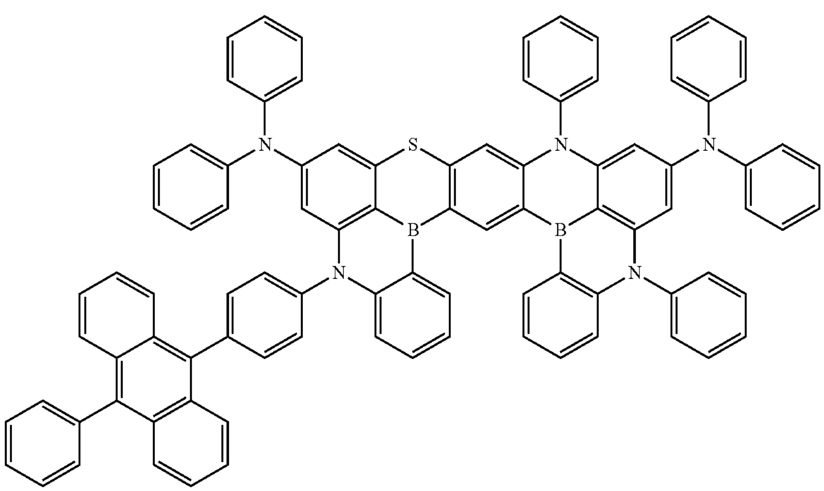

-continued
48
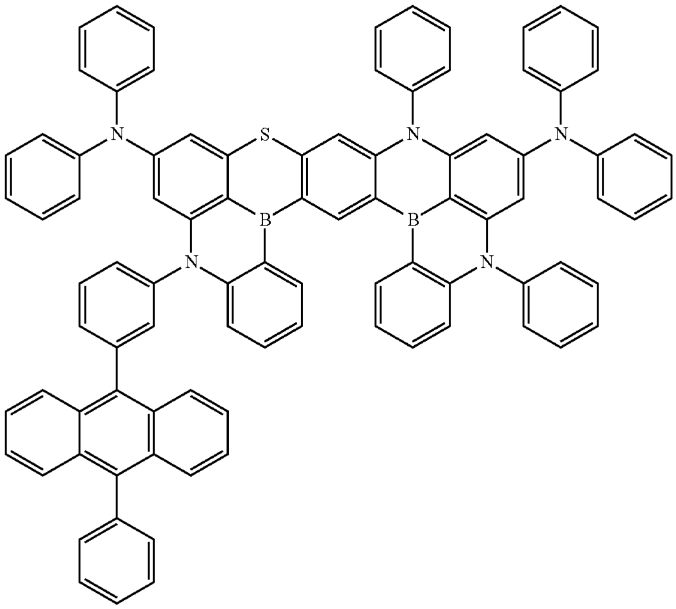
49
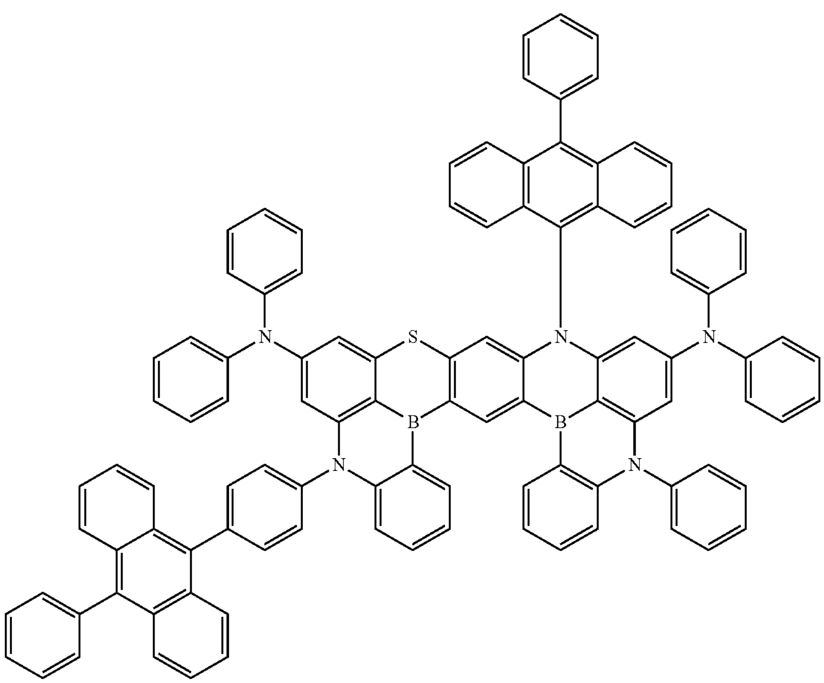

-continued
50
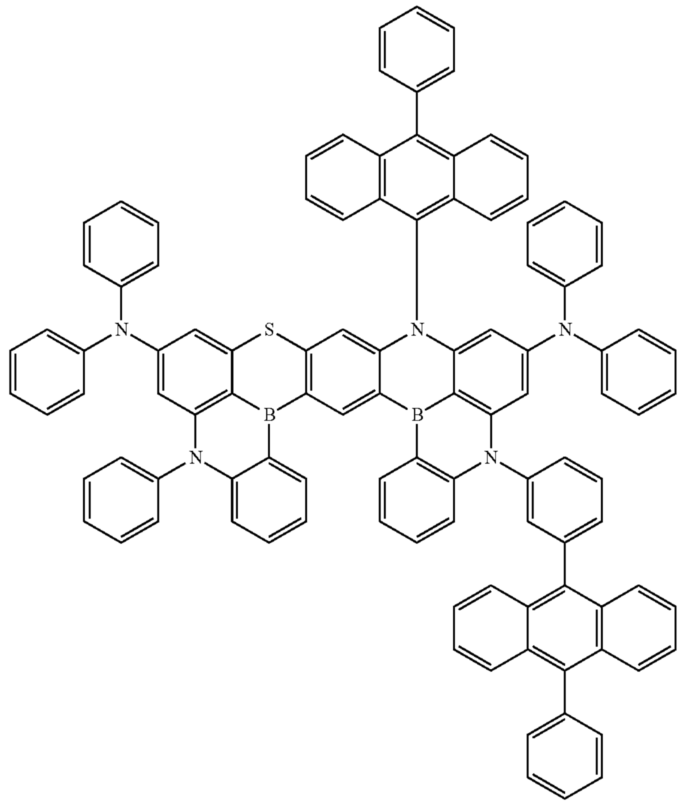
51
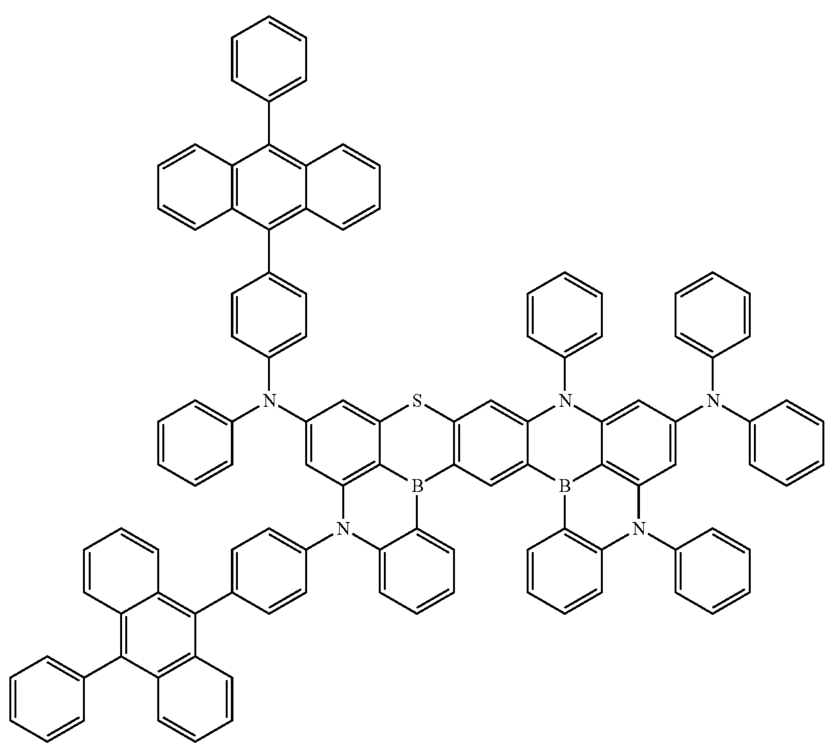

-continued
52
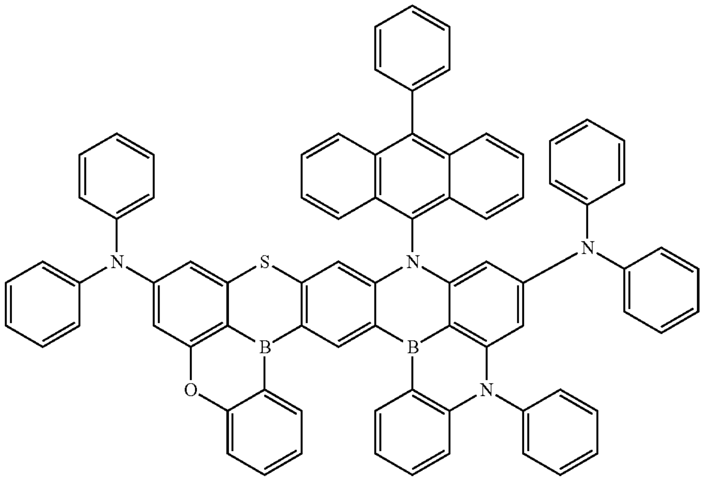
53
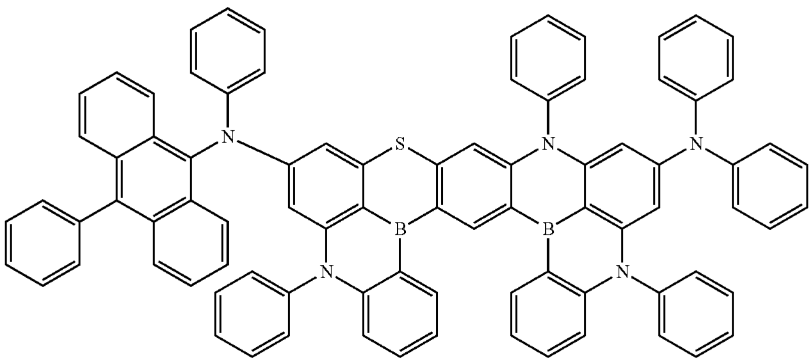
54
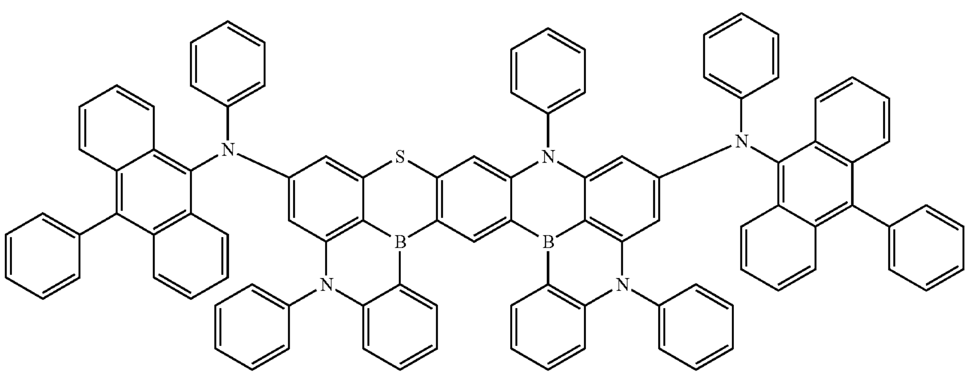

-continued
55
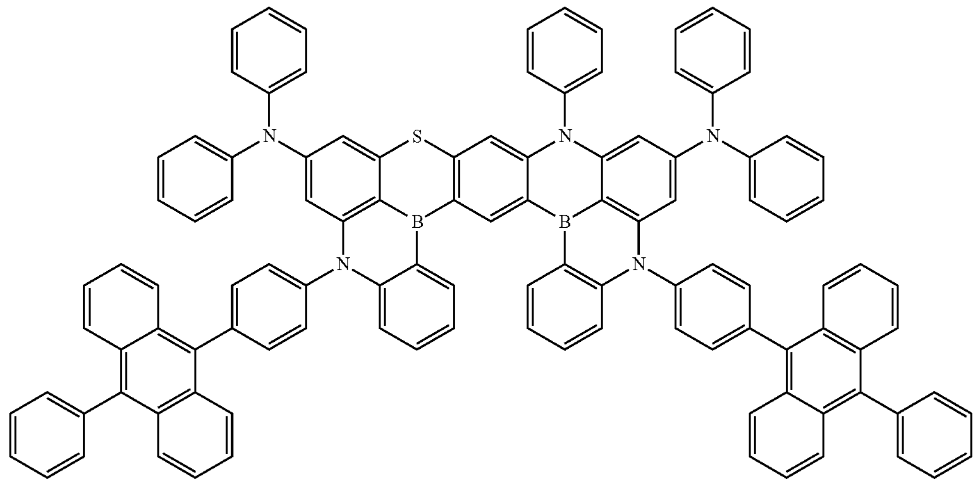
56
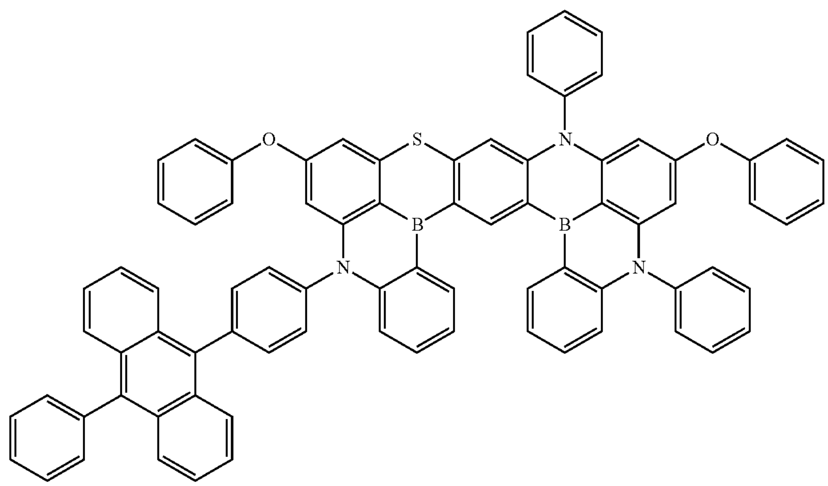
57
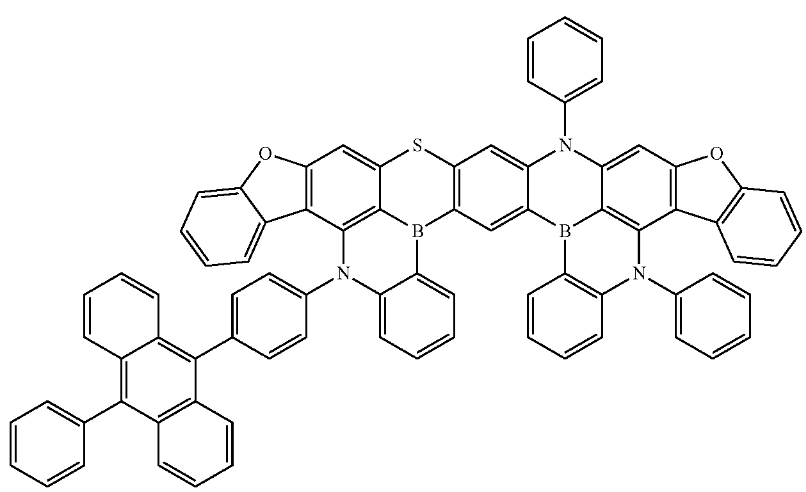

-continued
58
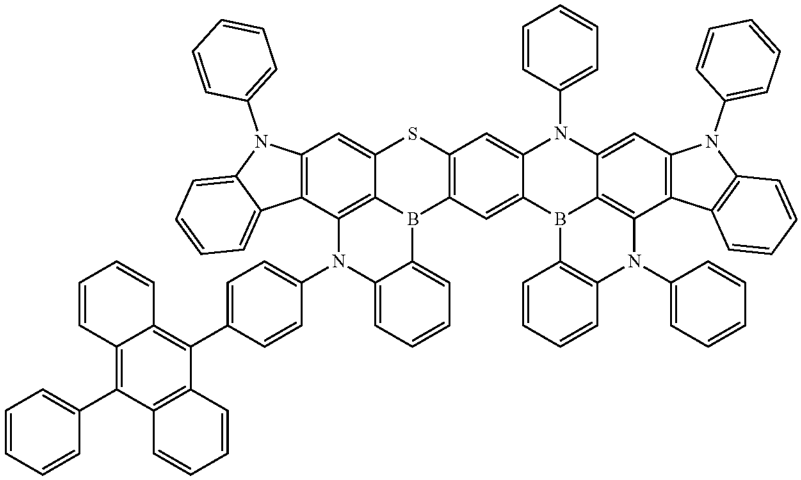
59
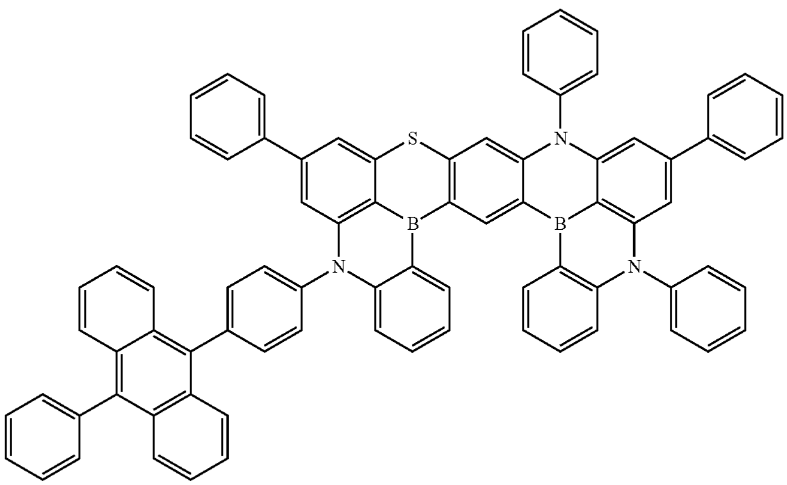
60
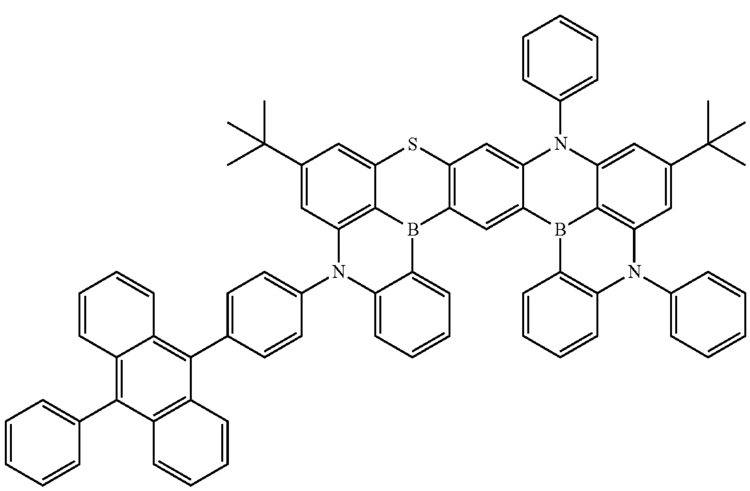

-continued
61
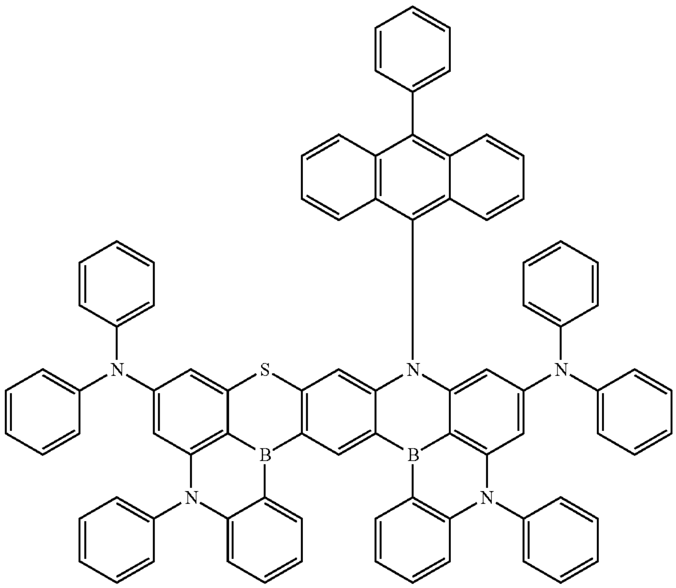
62
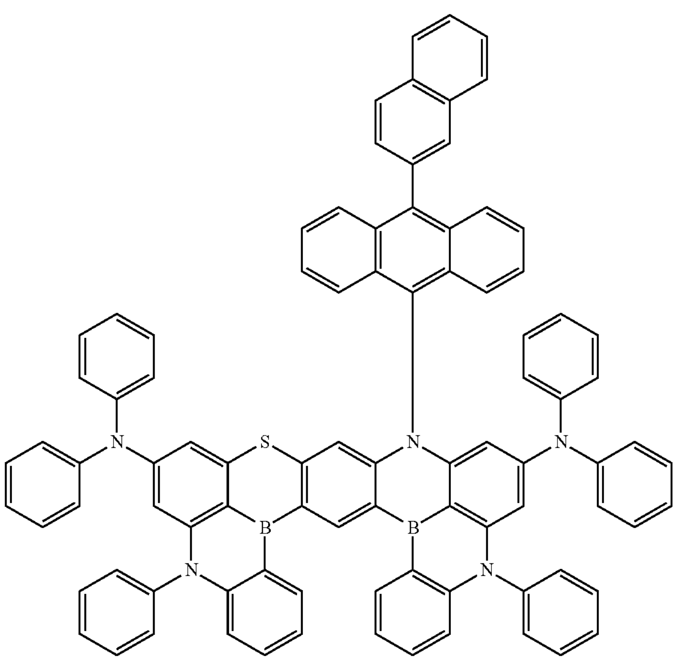

-continued
63
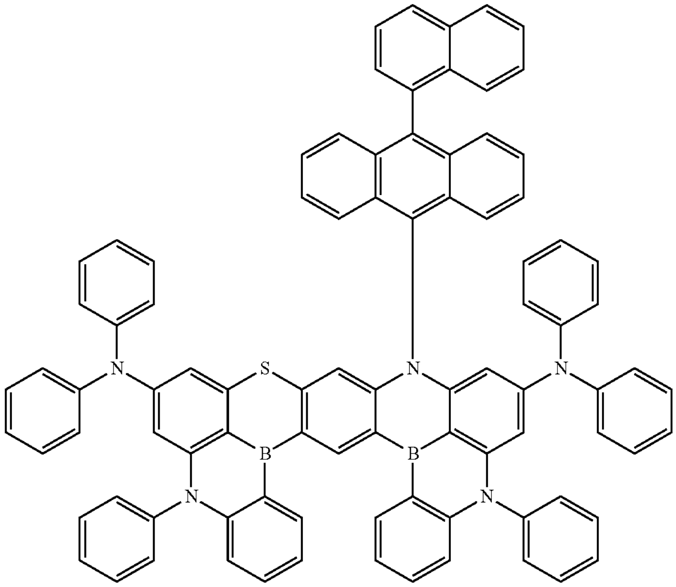
64
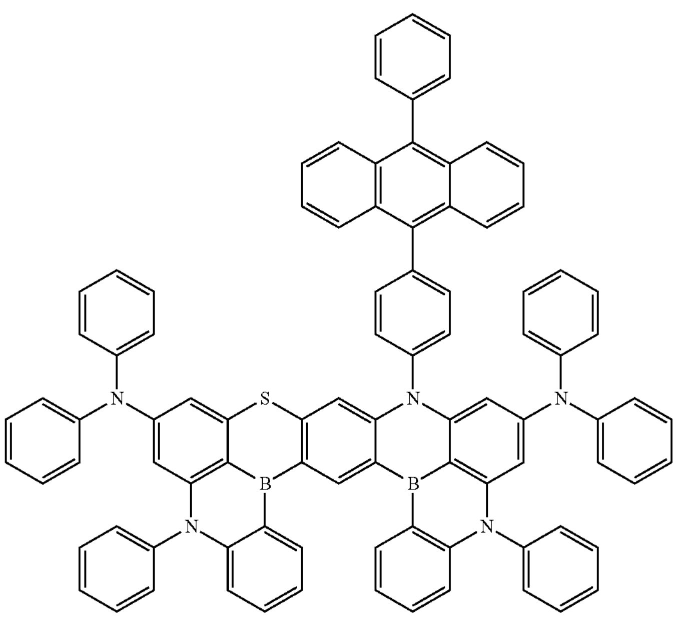

-continued
65
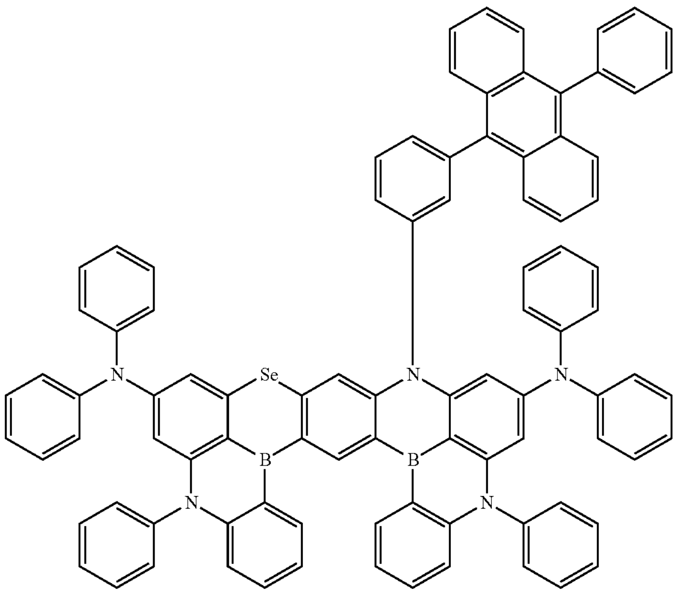
66
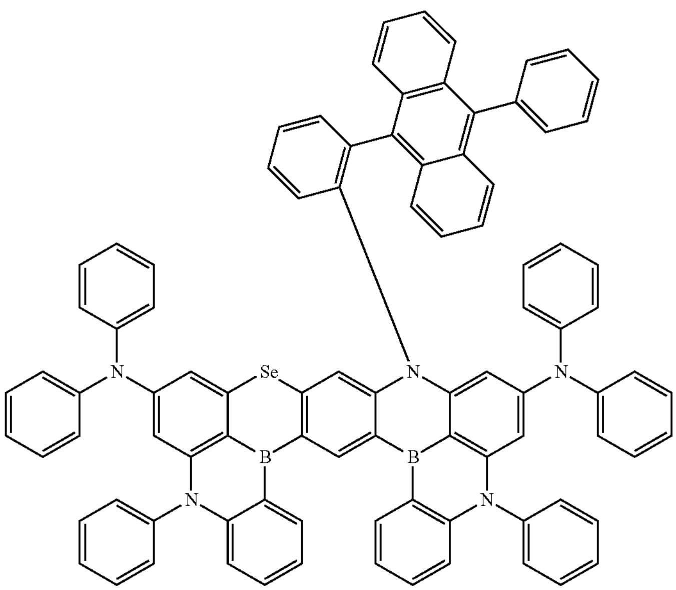
67
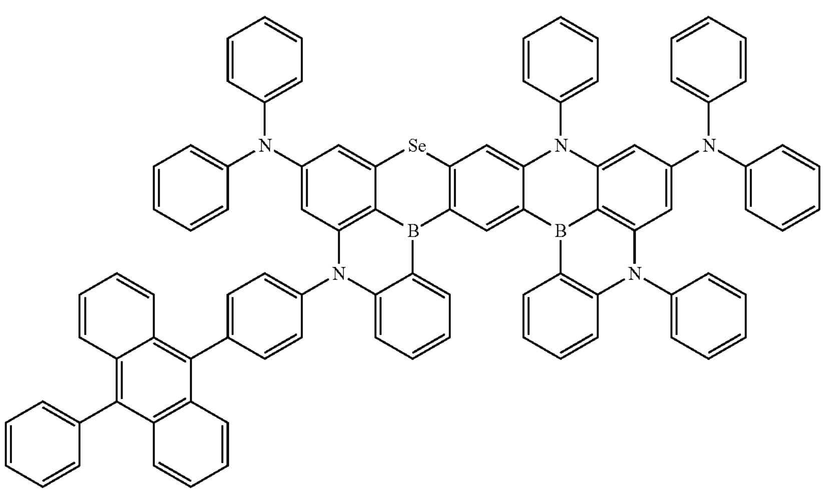

-continued
68
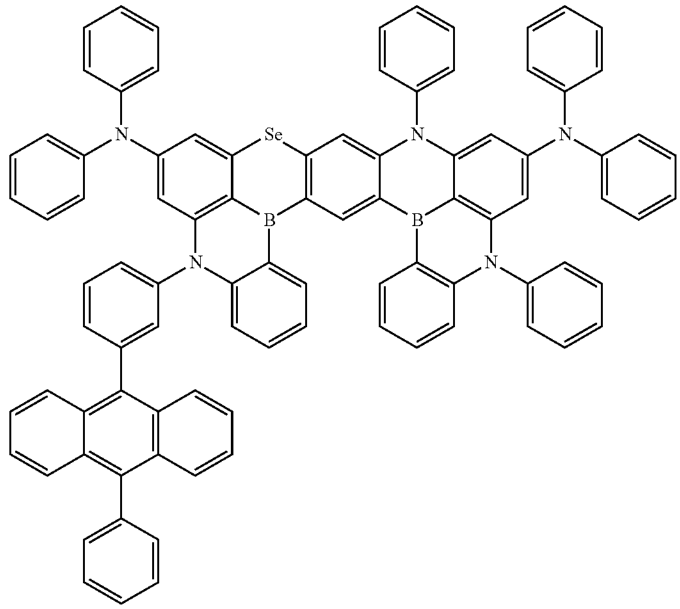
69
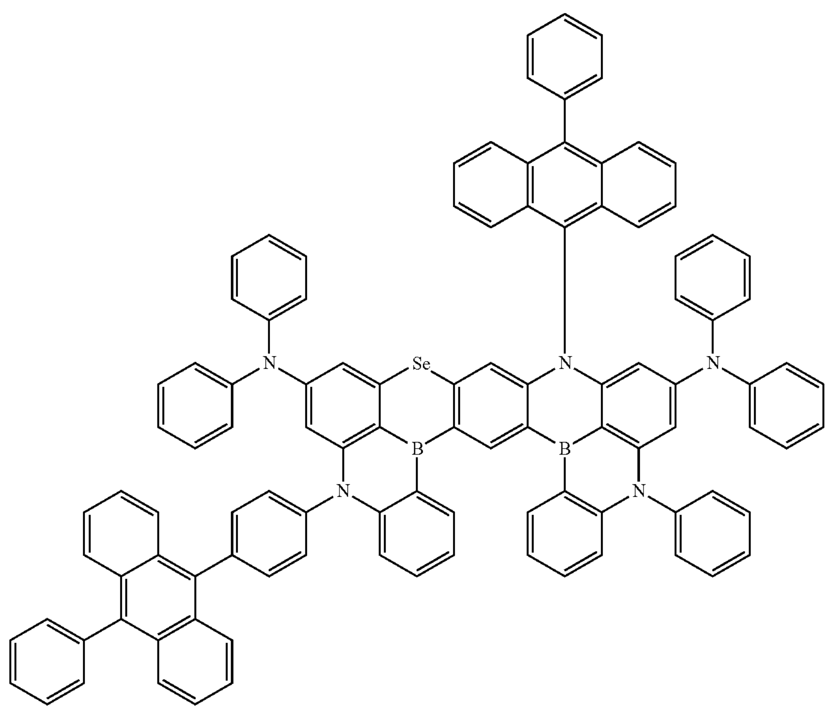

-continued
70
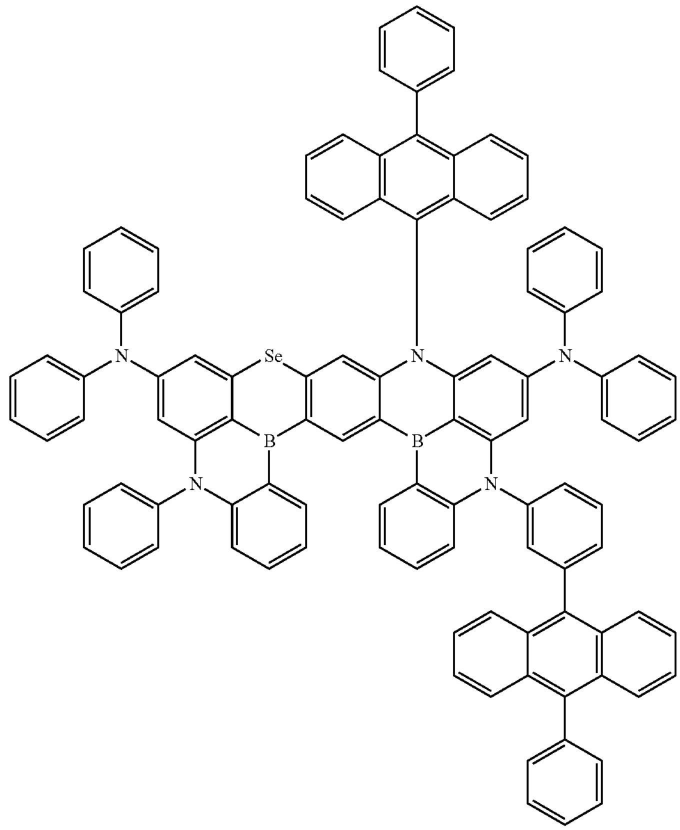
71
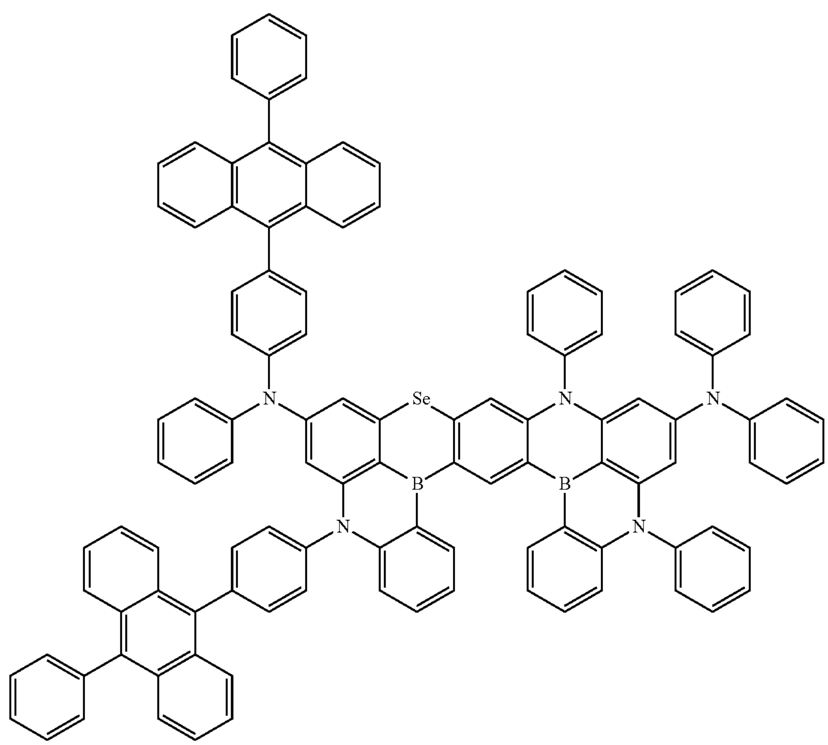

-continued
72
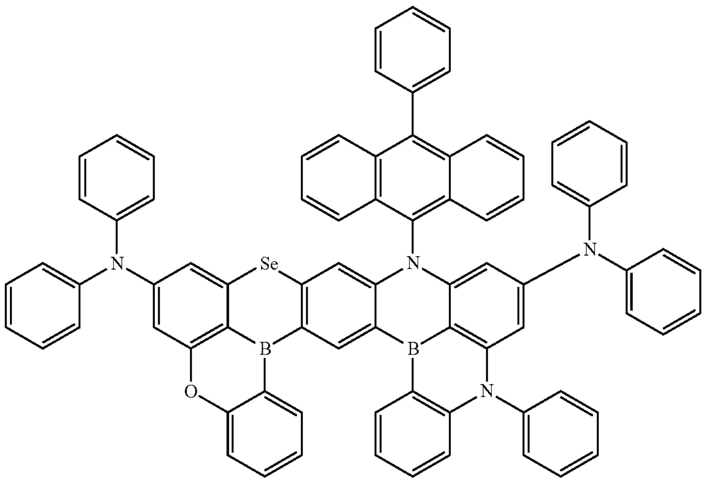
73
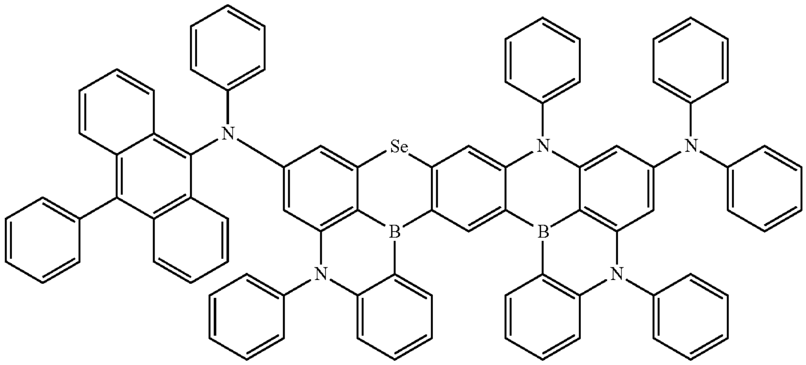
74
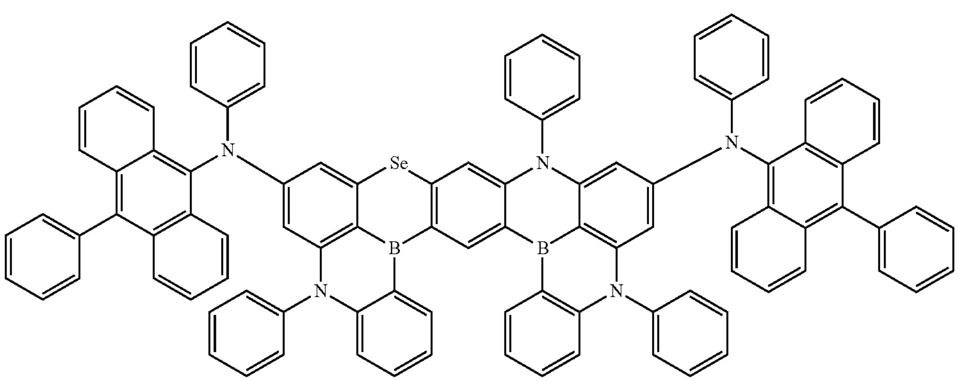

-continued
75
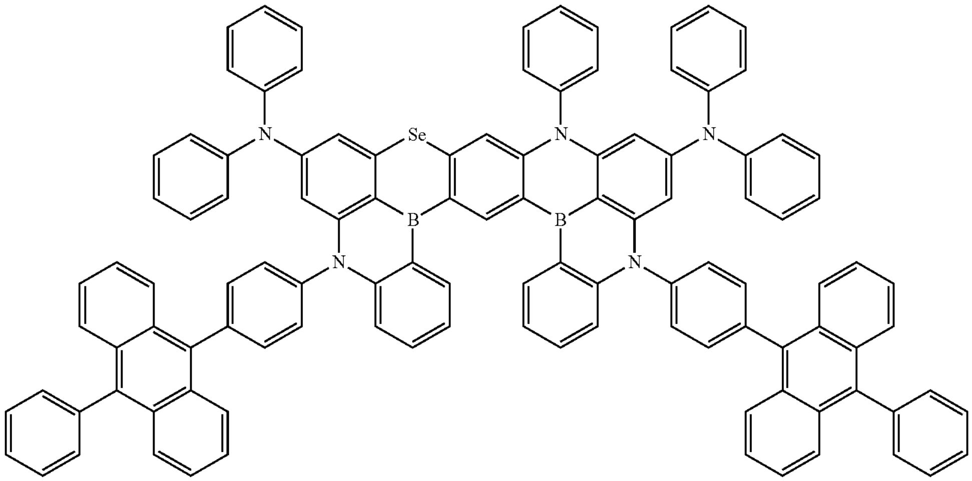
76
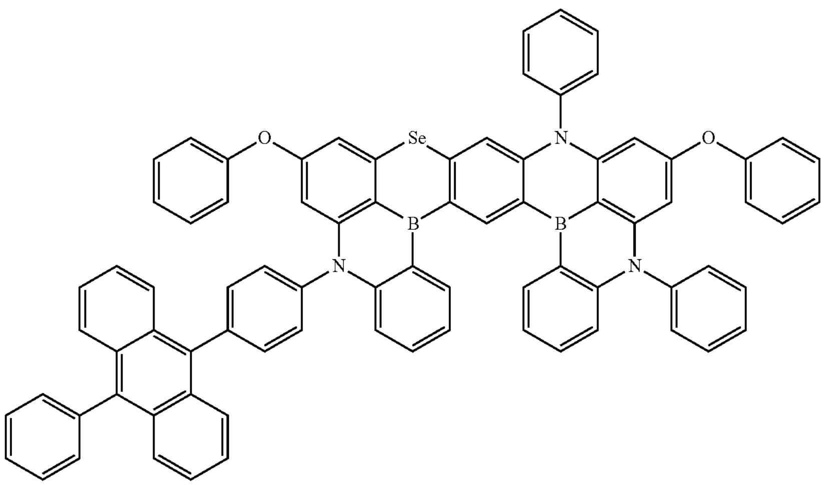
77
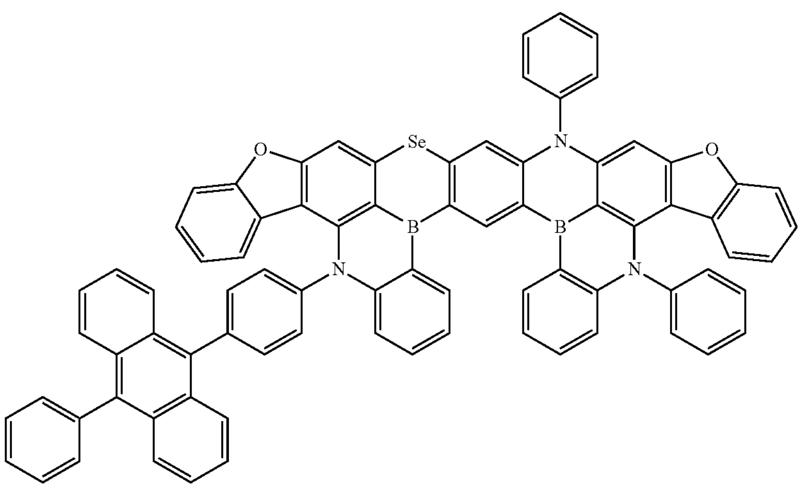

-continued
78
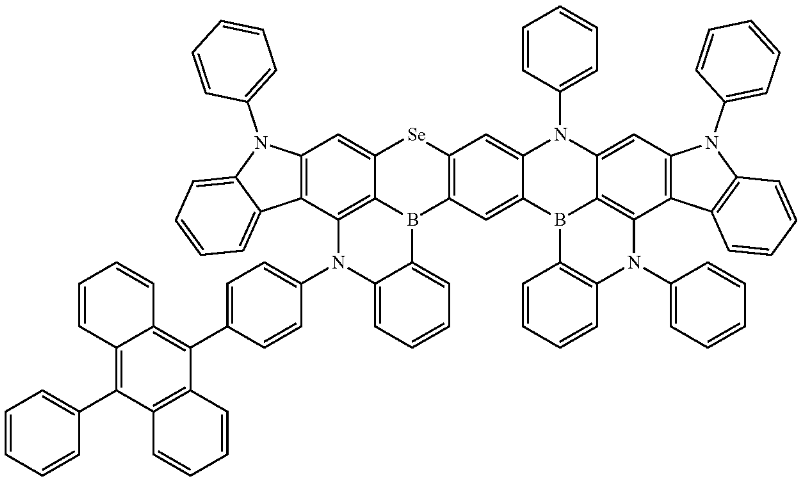
79
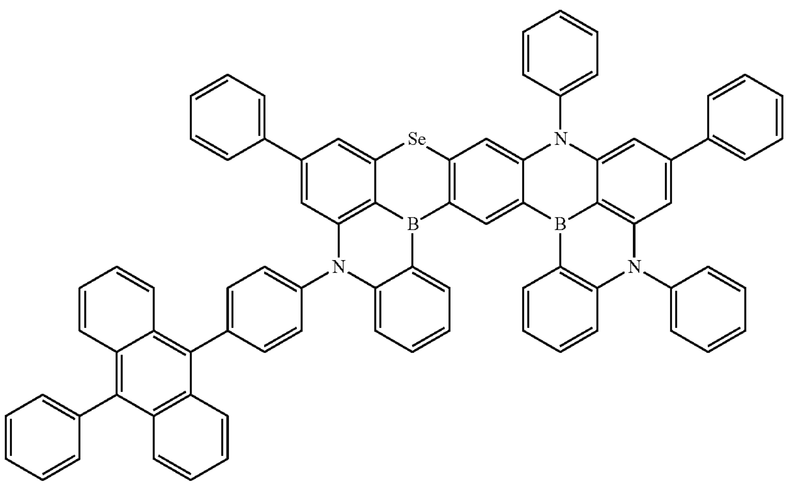
80
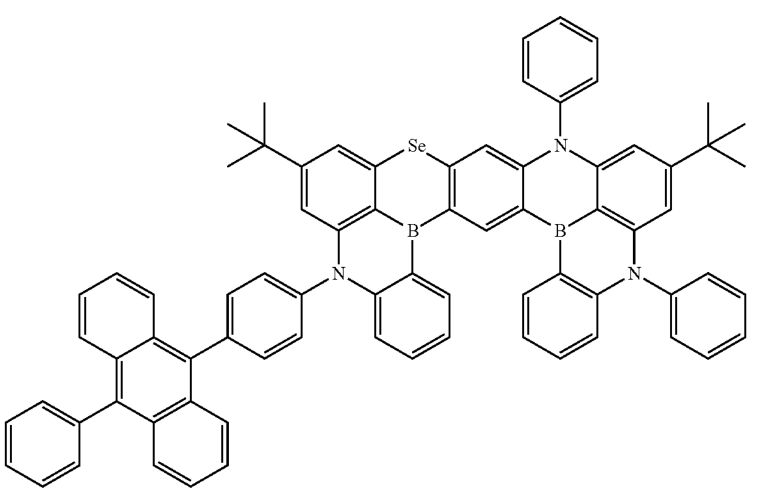

-continued
81
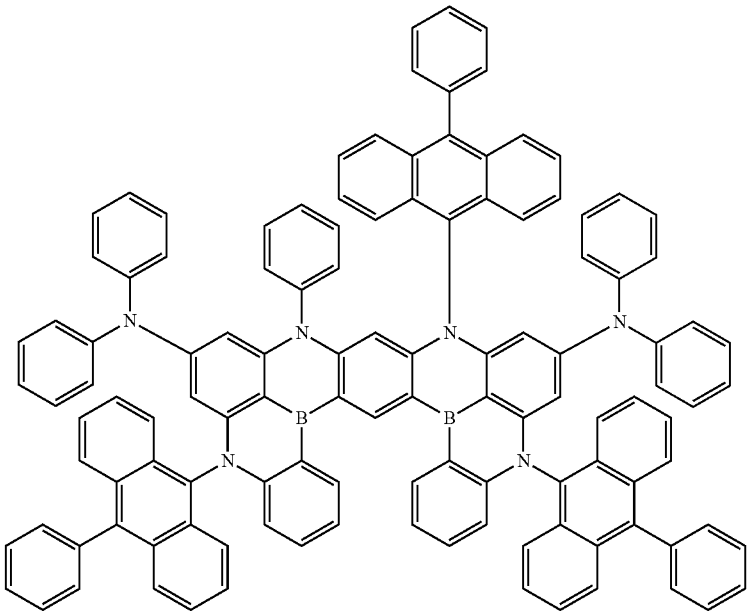
82
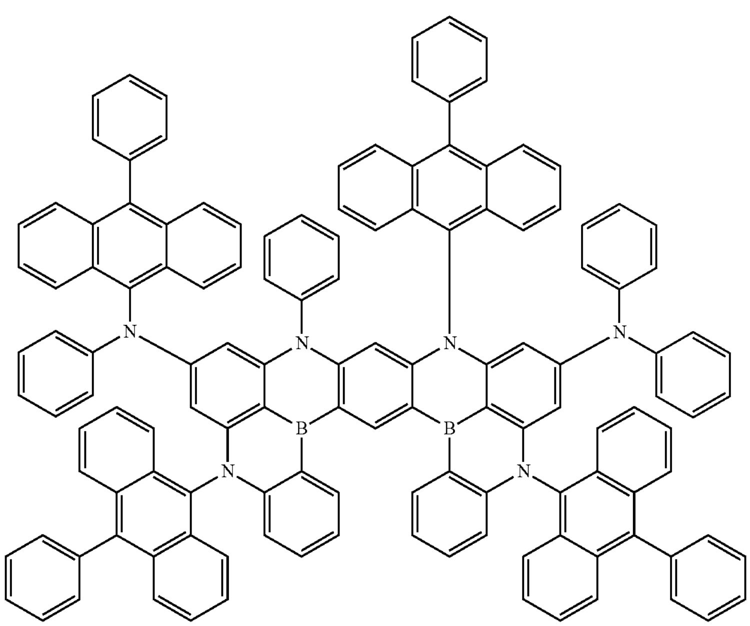

-continued
83
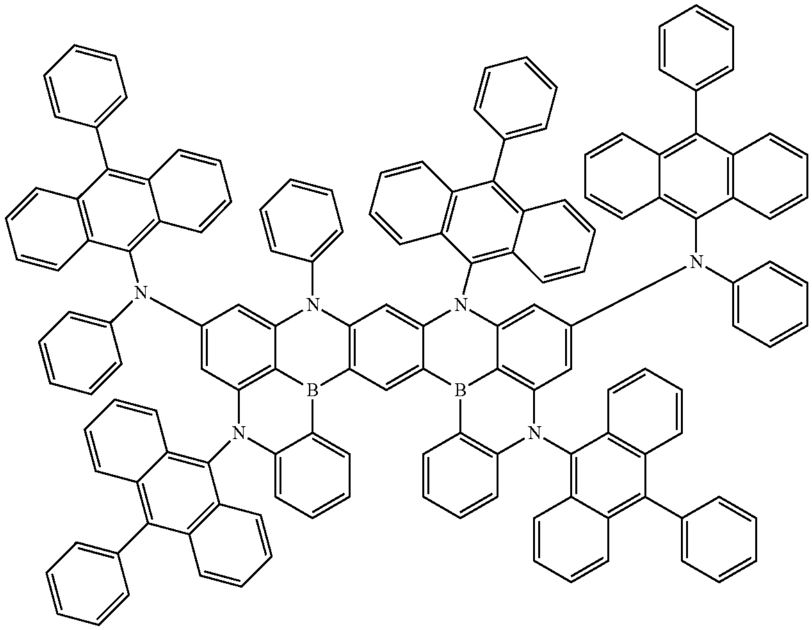
84
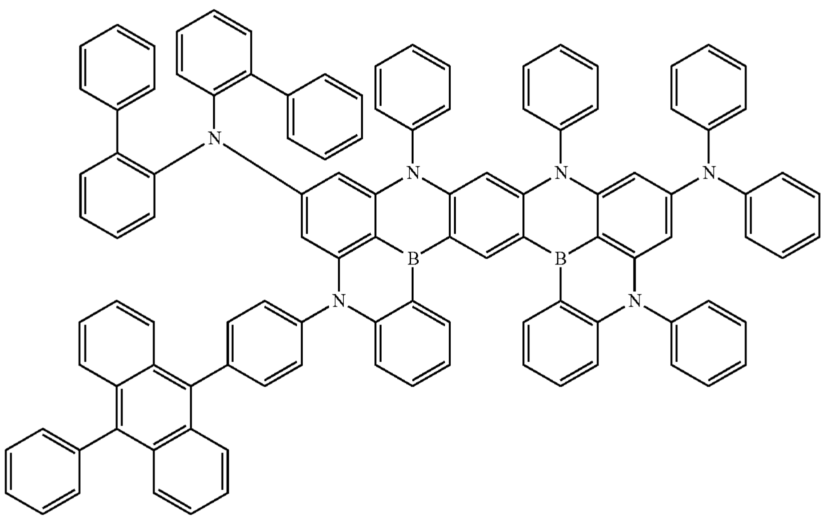
85
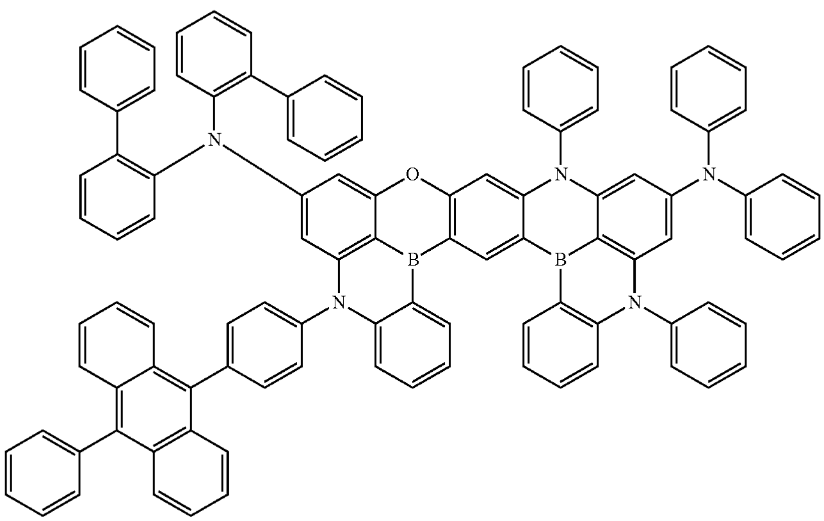

-continued
86
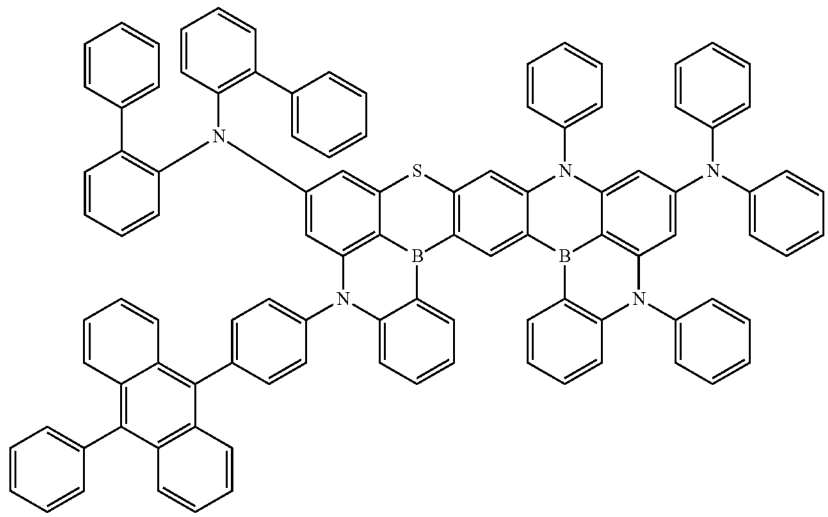
87
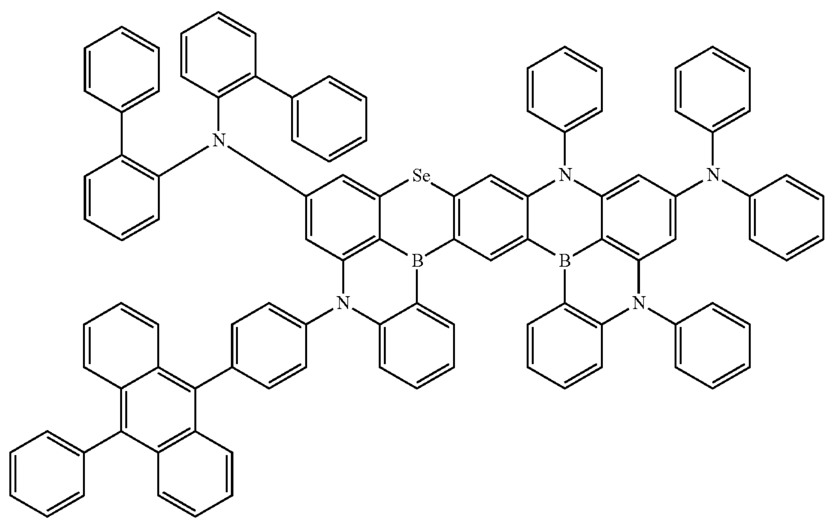
88
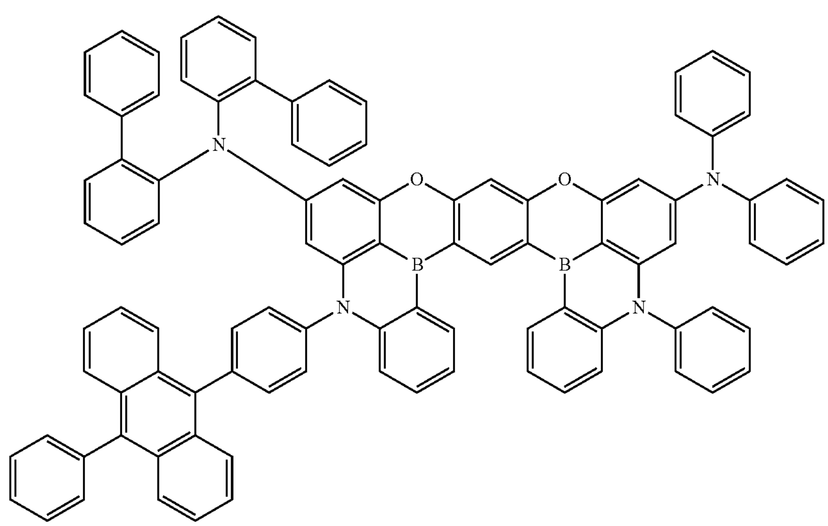

-continued
89
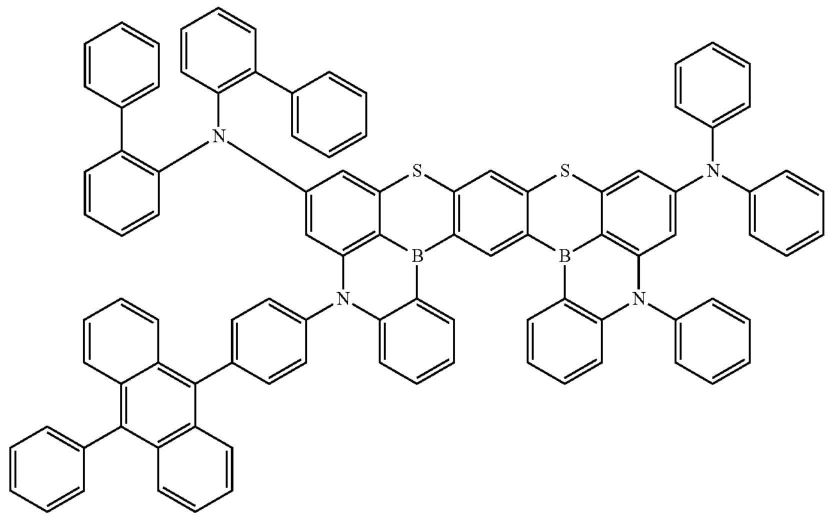
90
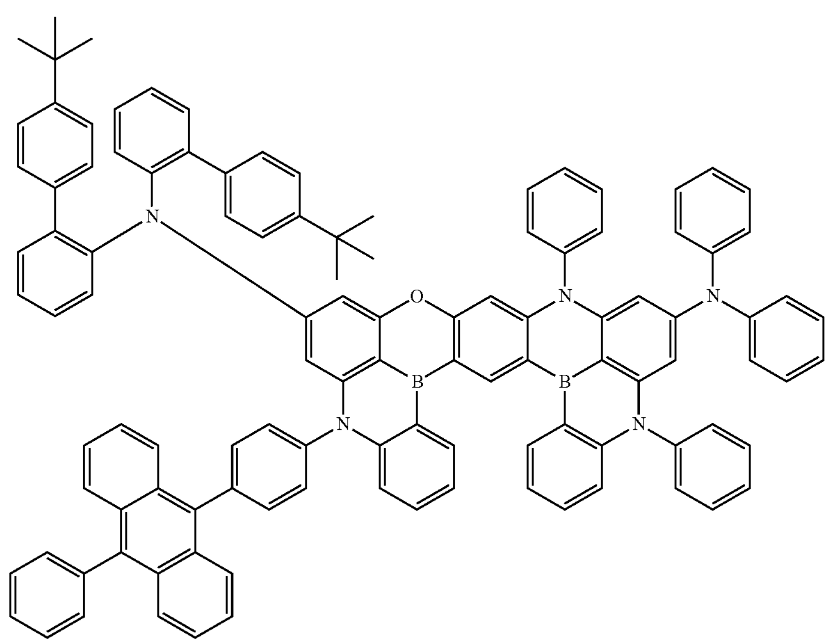

-continued
91
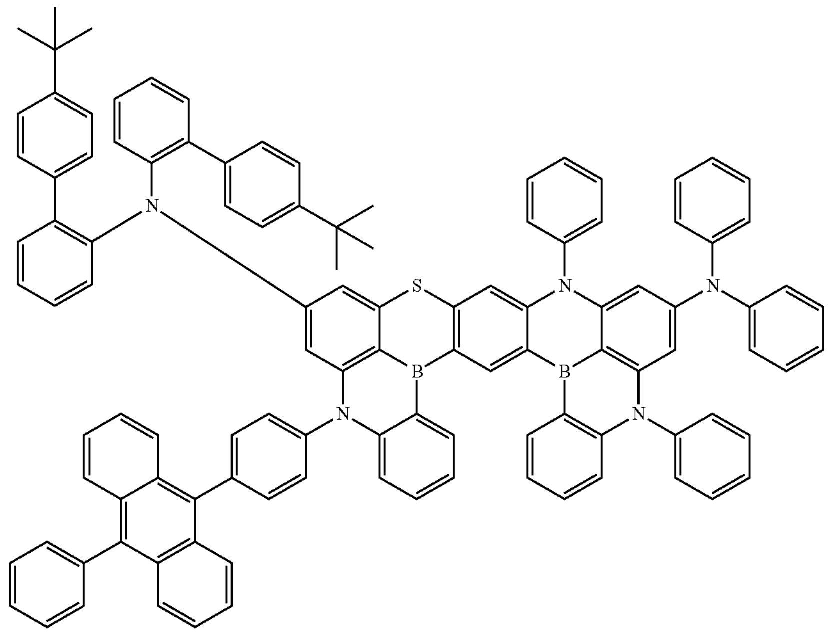
92
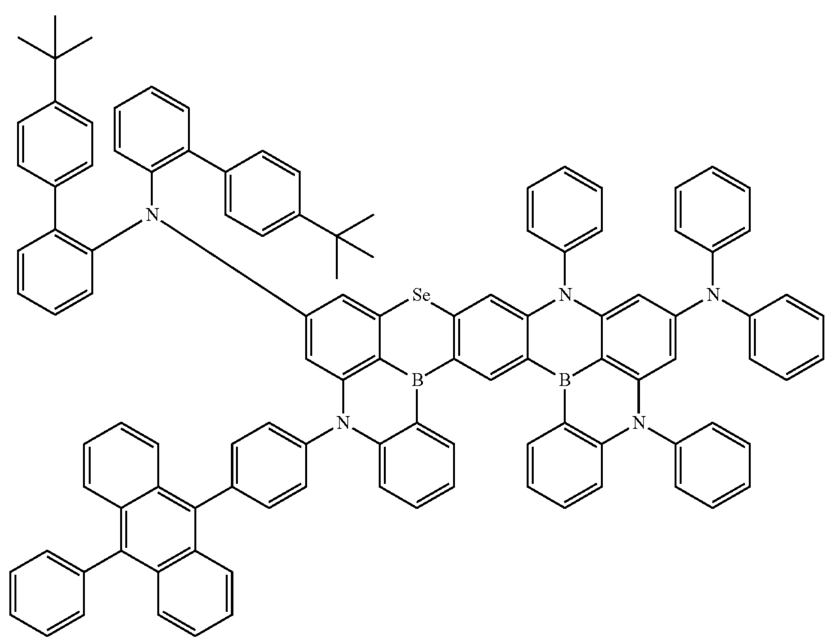

-continued
93
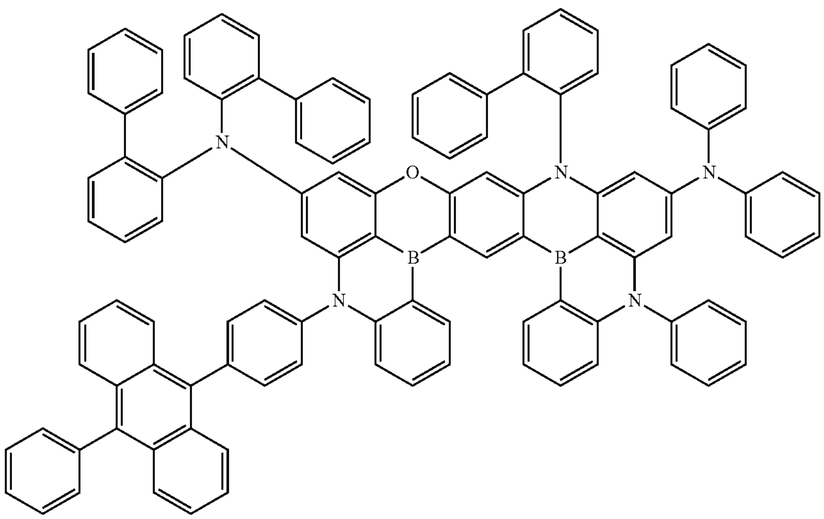
94
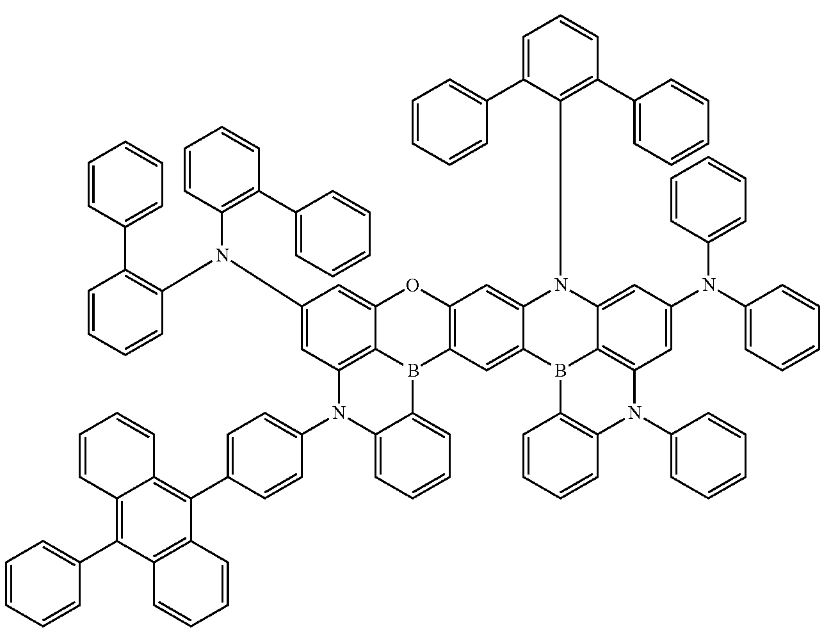

-continued
95
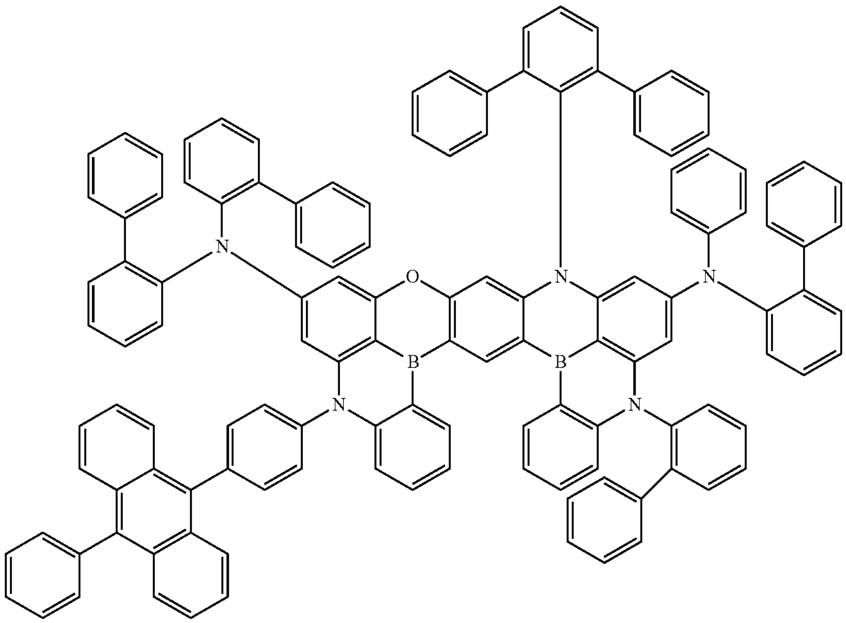
96
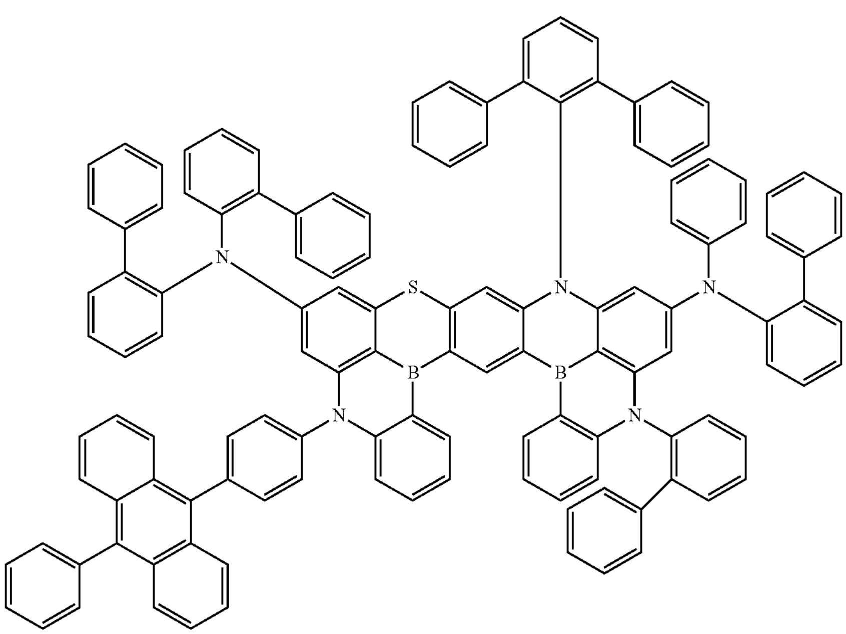

-continued
97
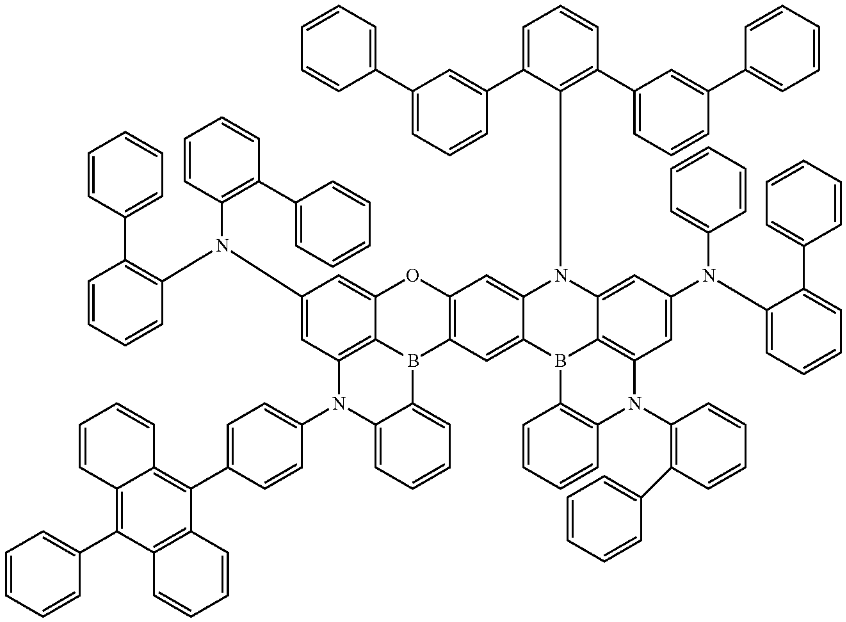
98
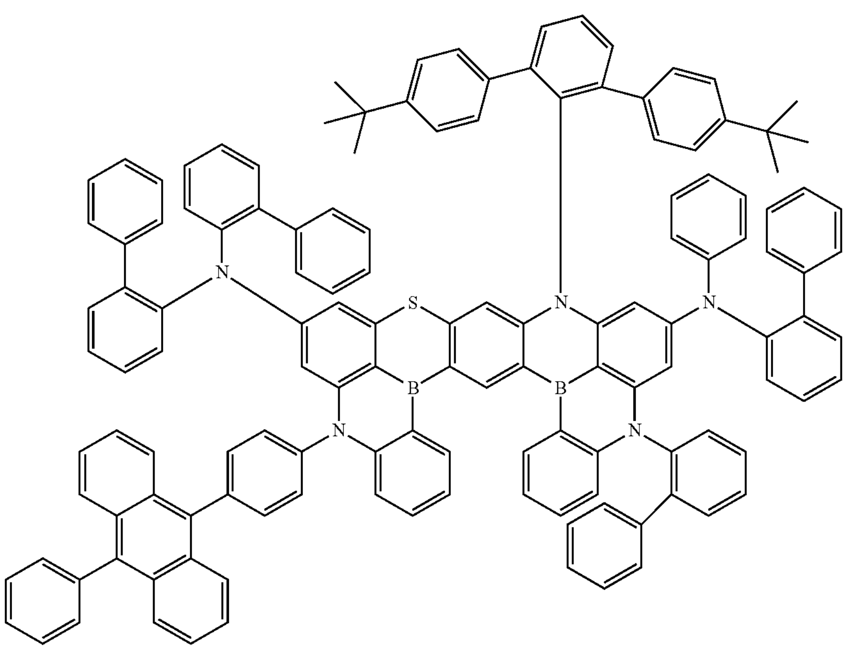

-continued
99
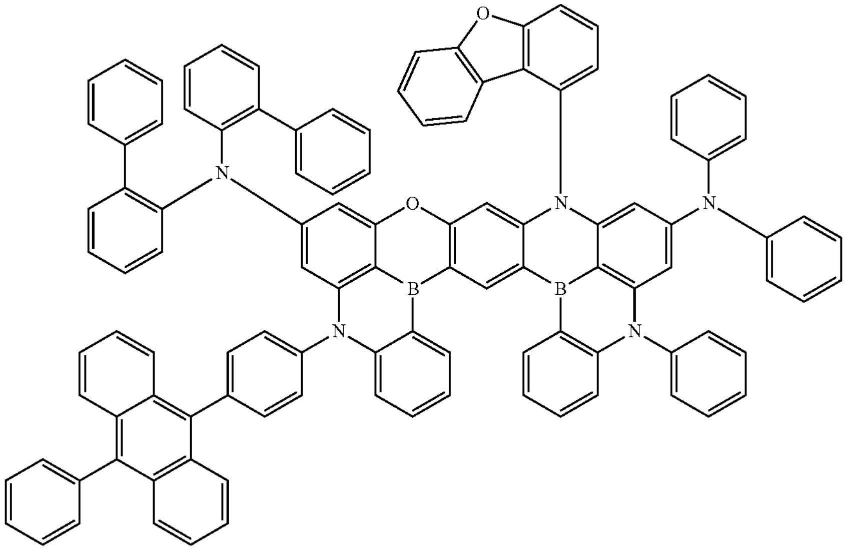
100
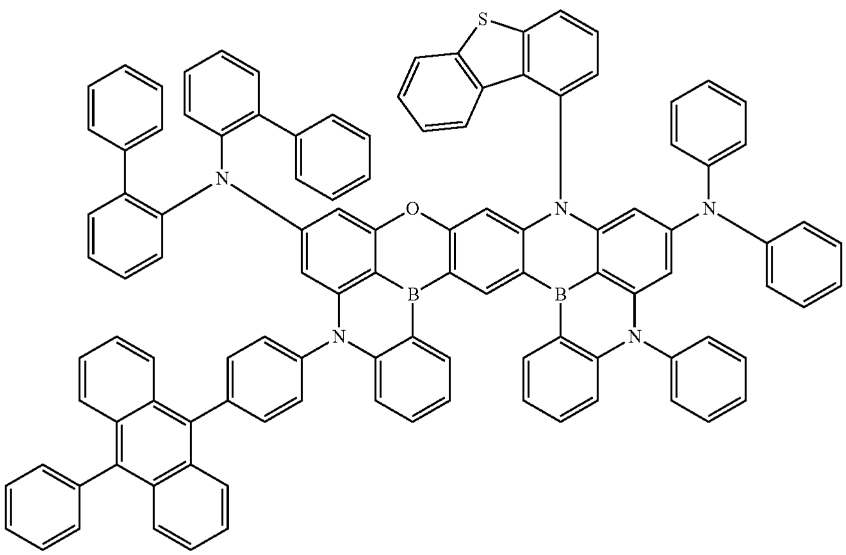
101
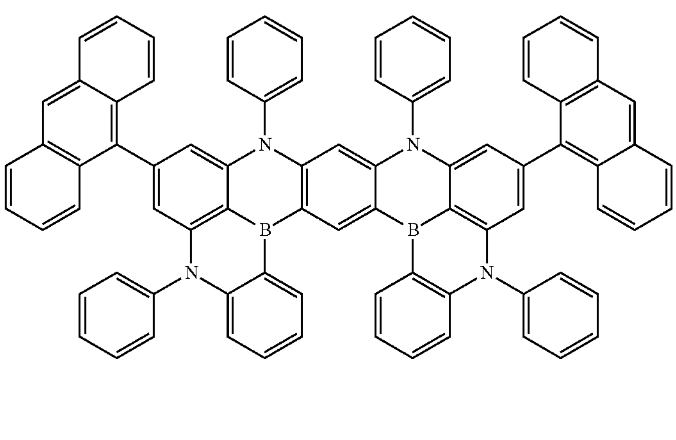

-continued
102
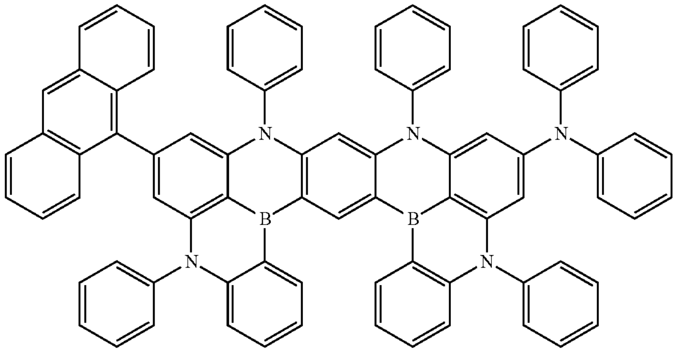
103
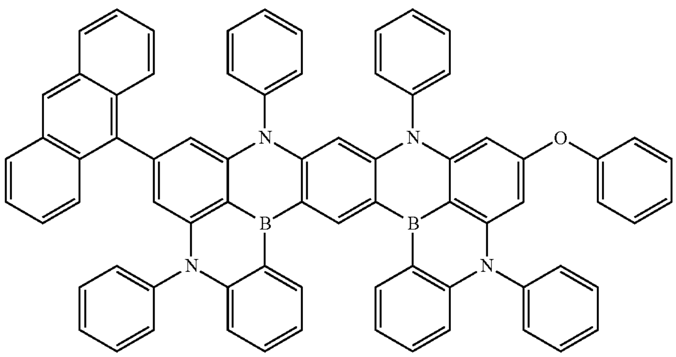
104
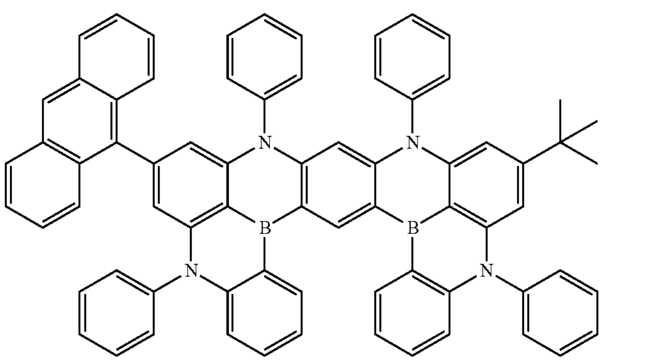
105
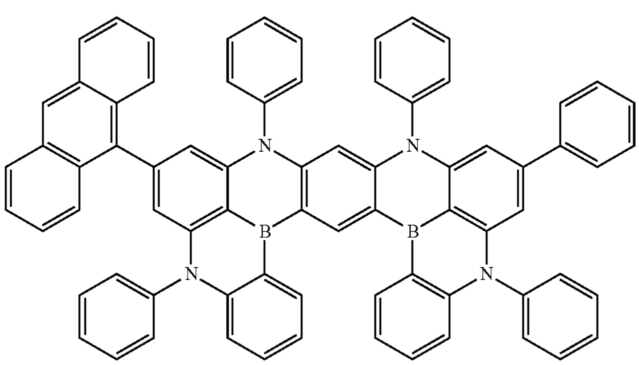

-continued
106
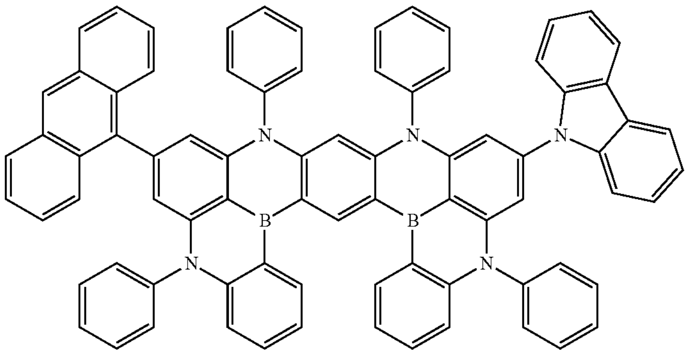
107
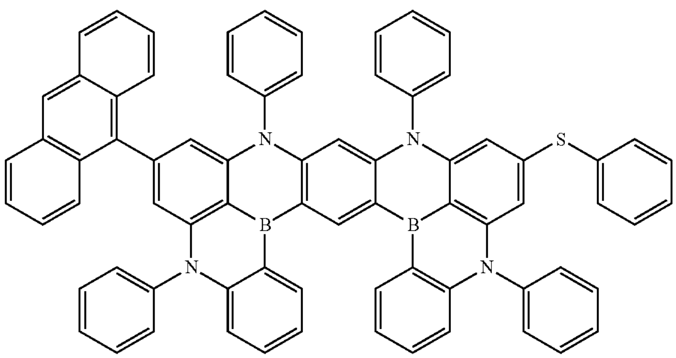
108
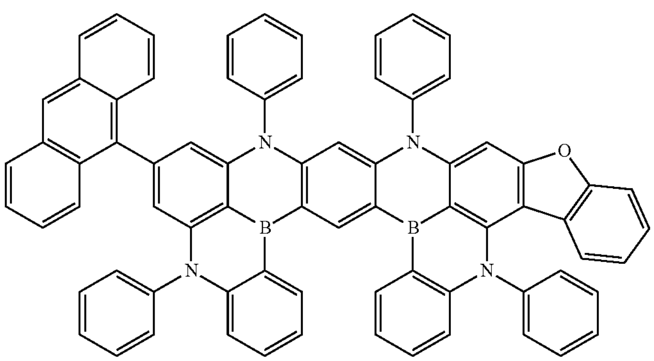
109
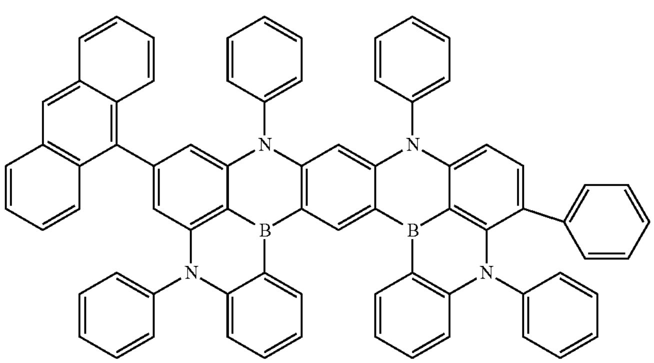

-continued
110
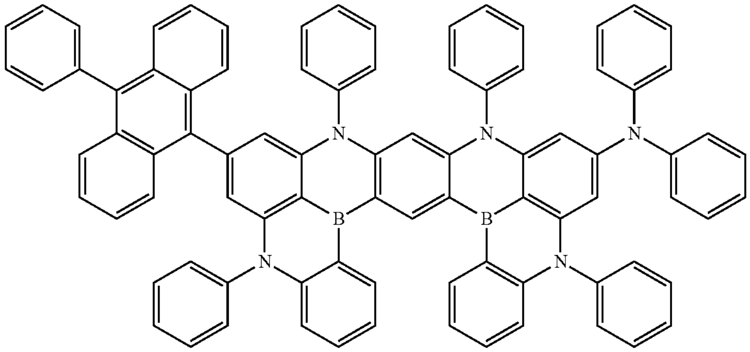
111
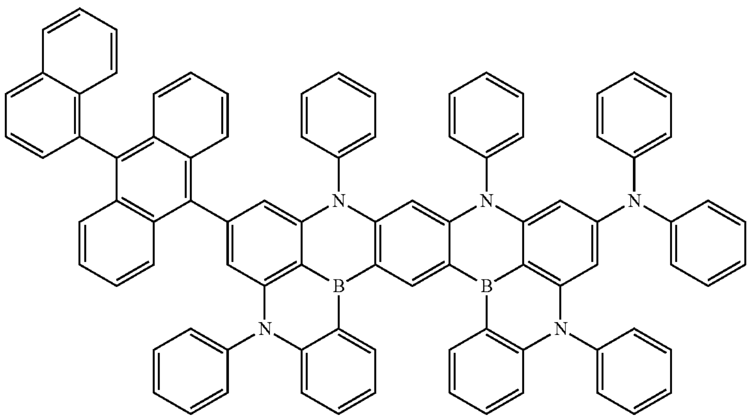
112
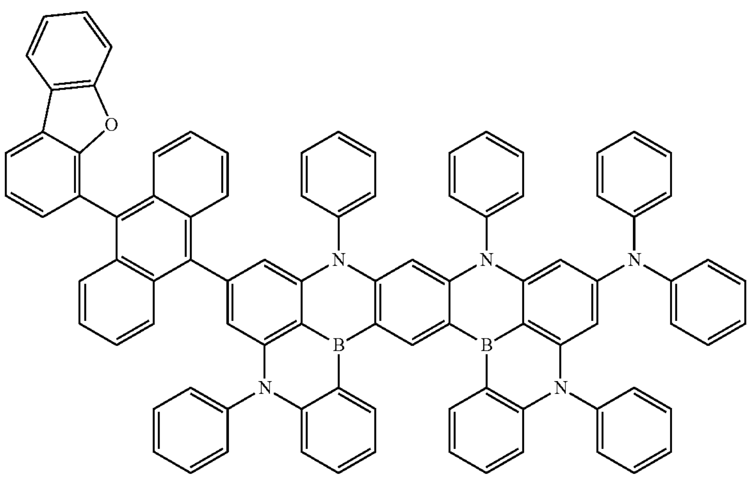
113
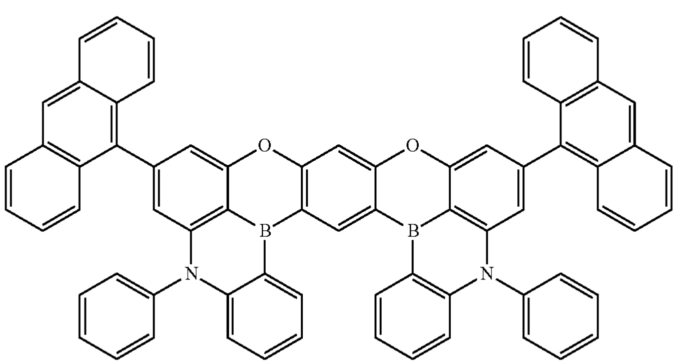

-continued
114
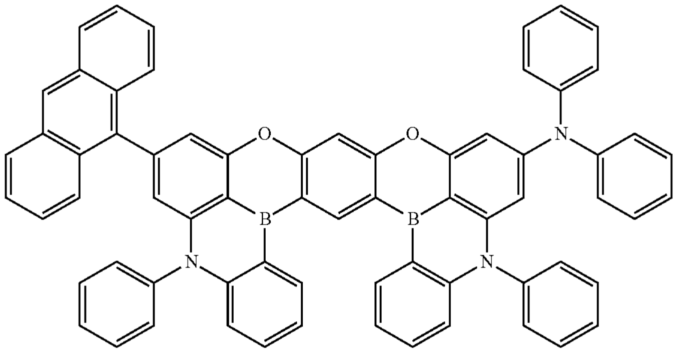
115
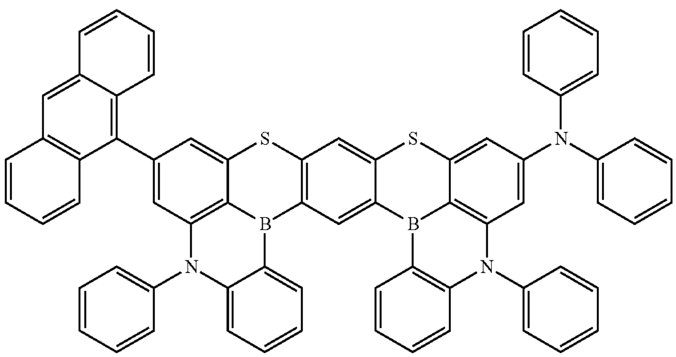
116
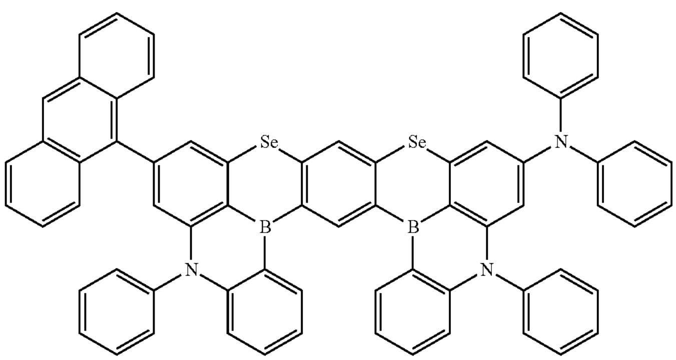
117
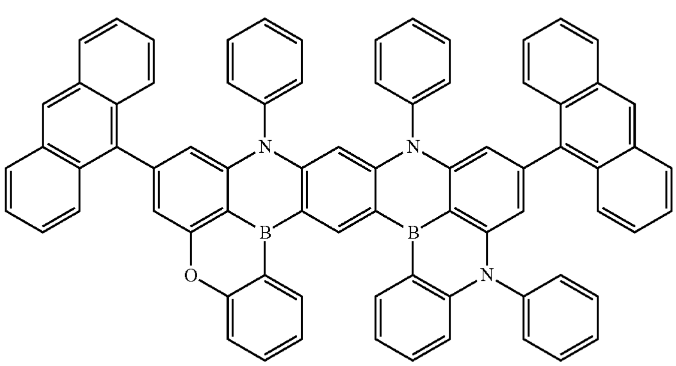

-continued
118
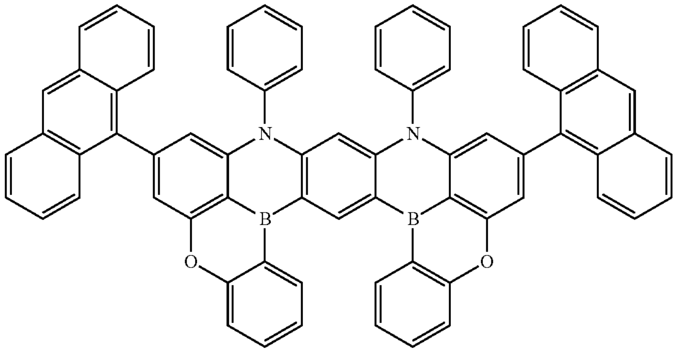
119
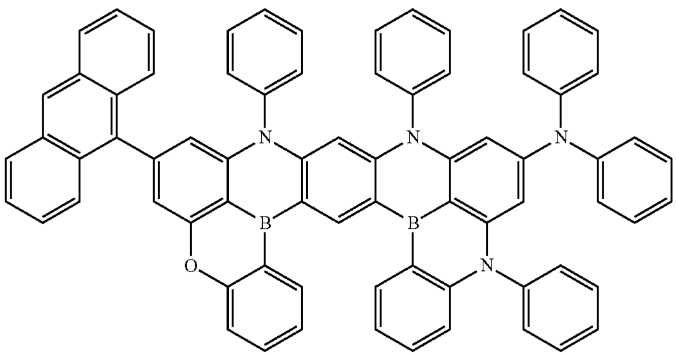
120
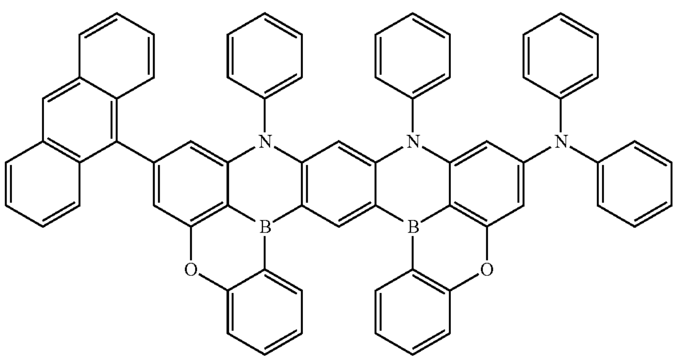
121
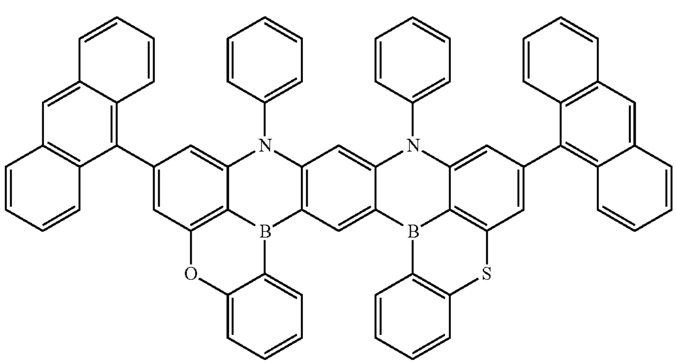

-continued
122
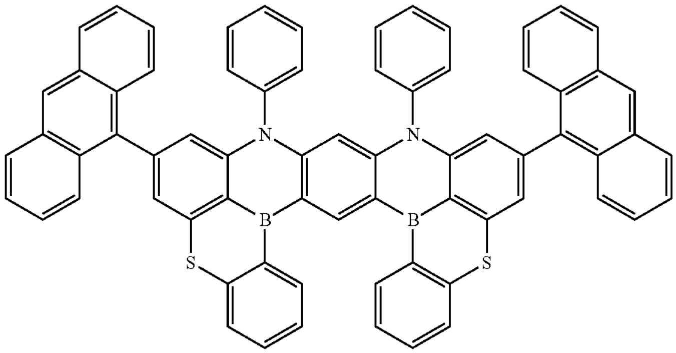
123
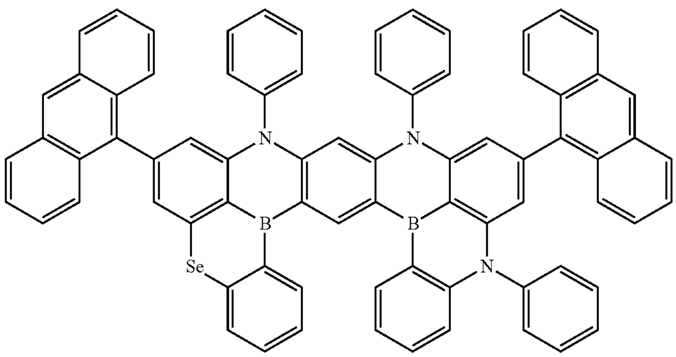
124
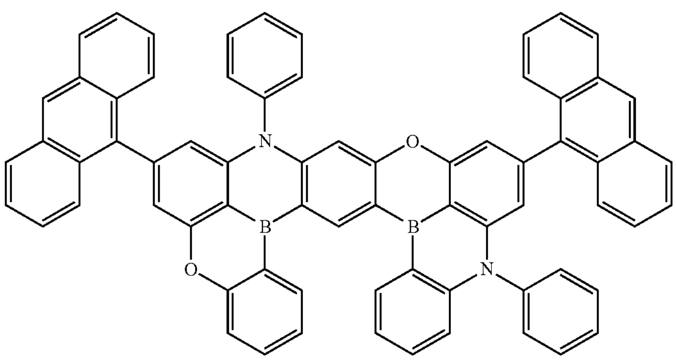
125
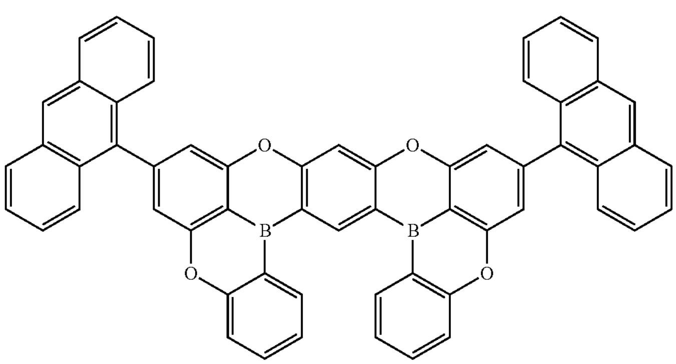

-continued
126
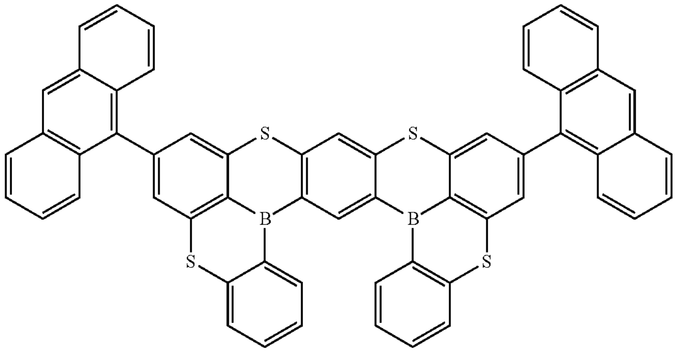
127
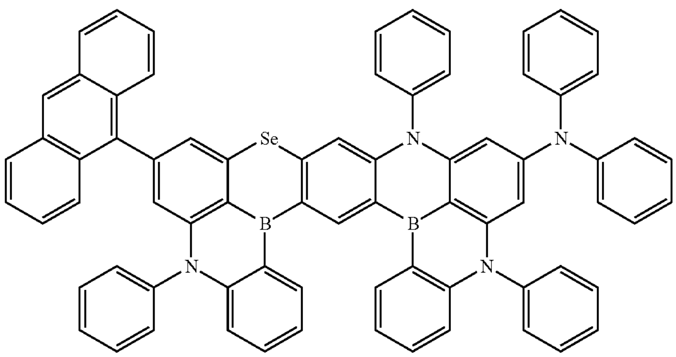
128
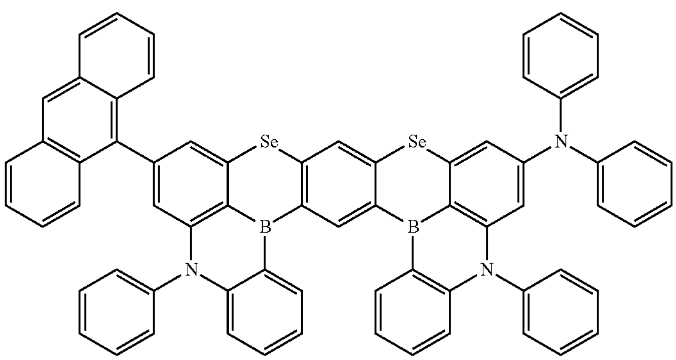
129
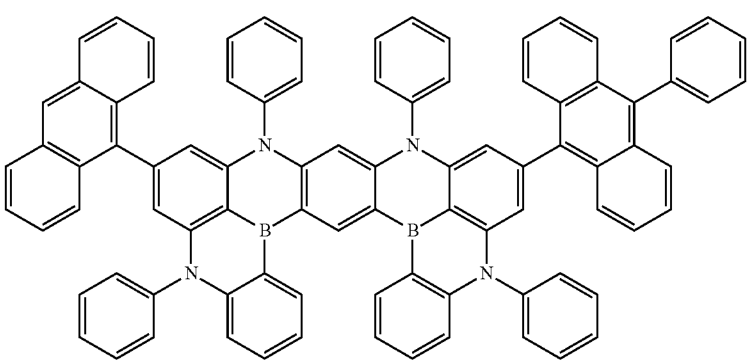

-continued
130
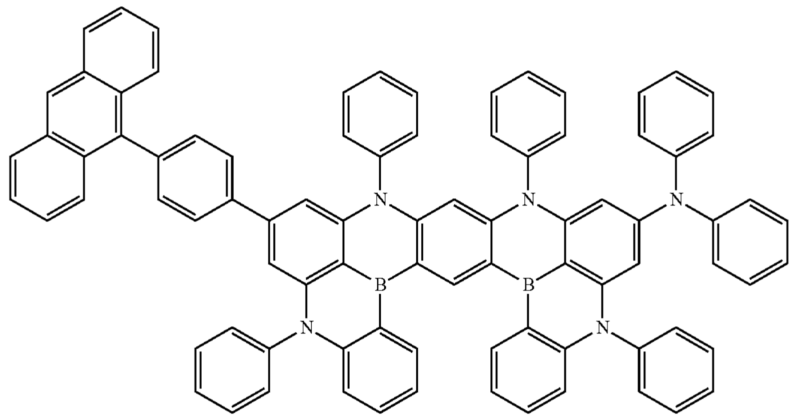
131
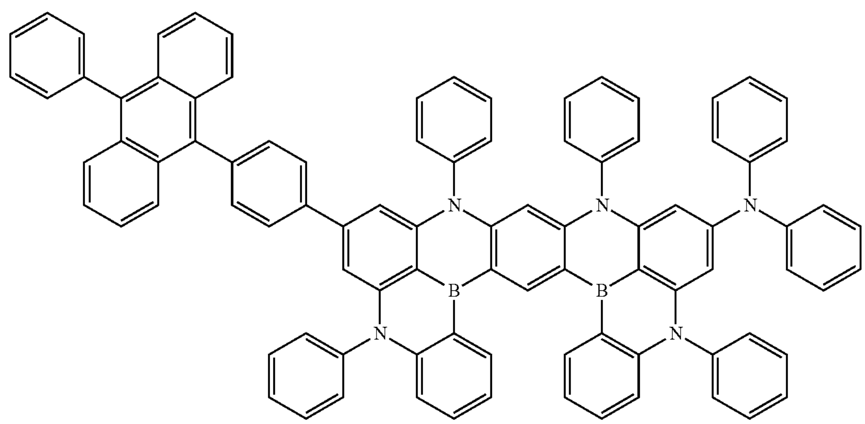
132
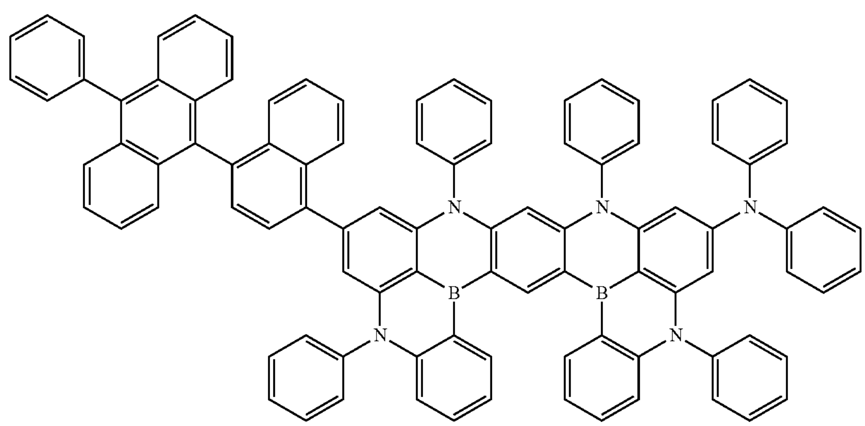

-continued
133
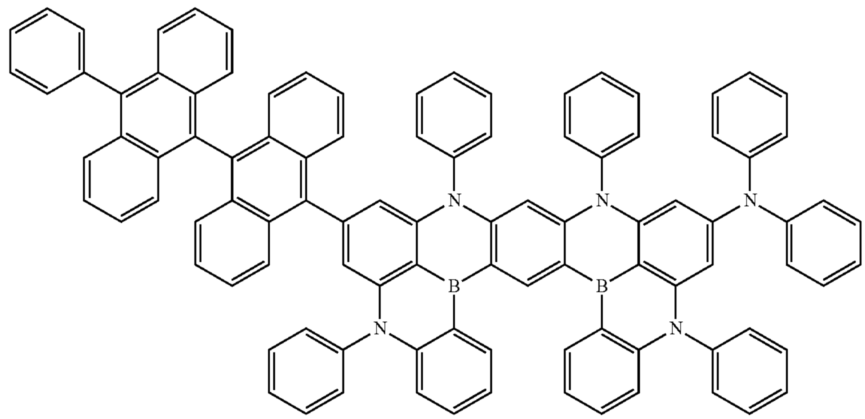
134
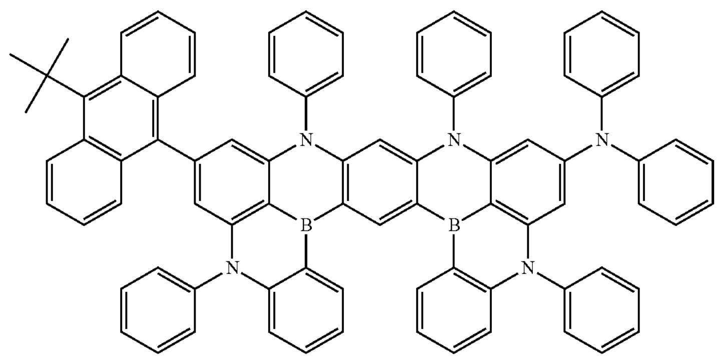
135
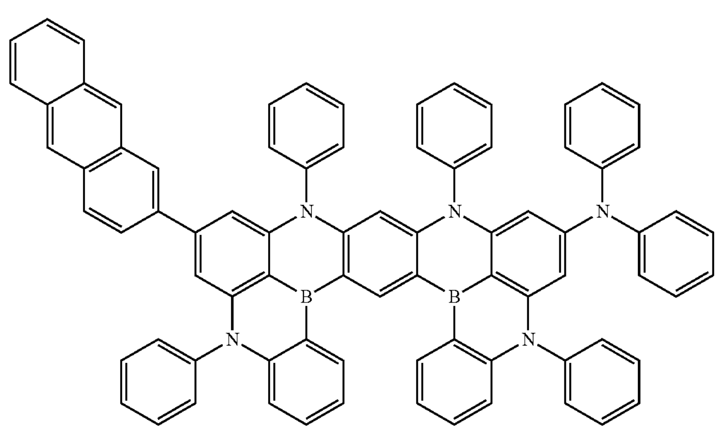

-continued
136
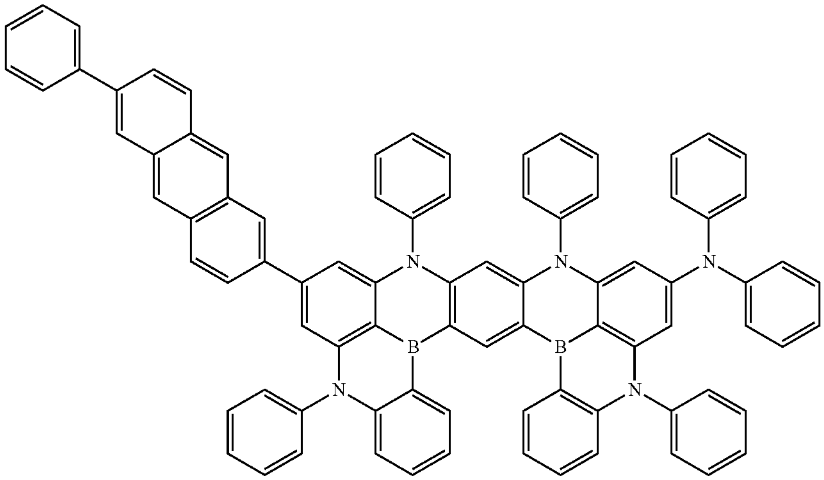
137
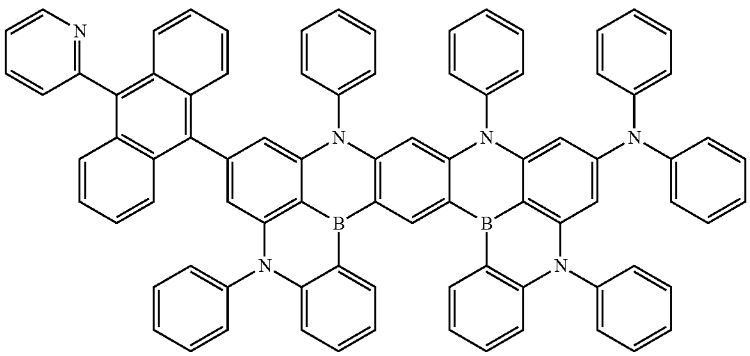
138
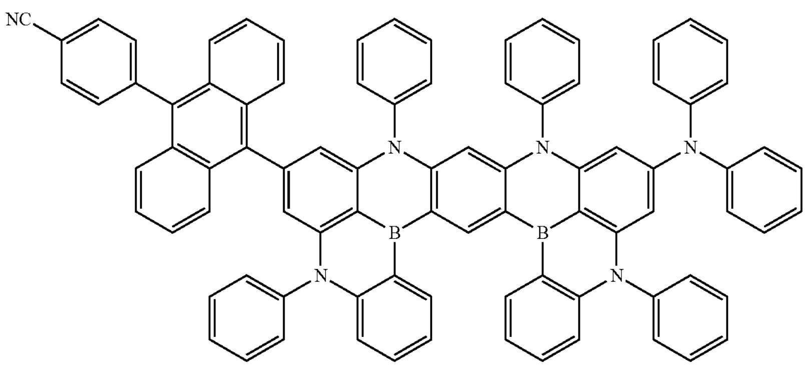
139
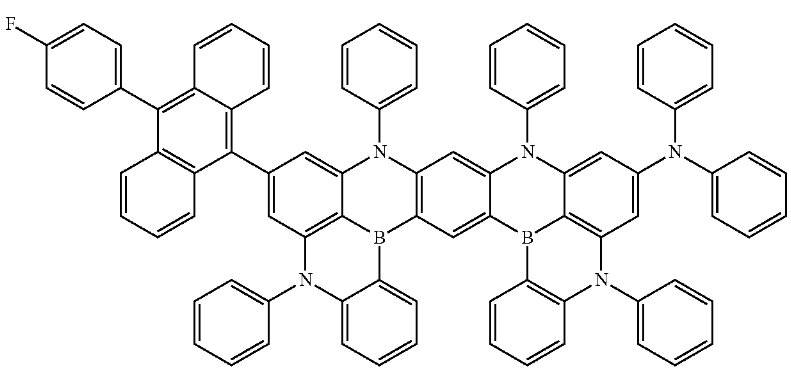

-continued

140

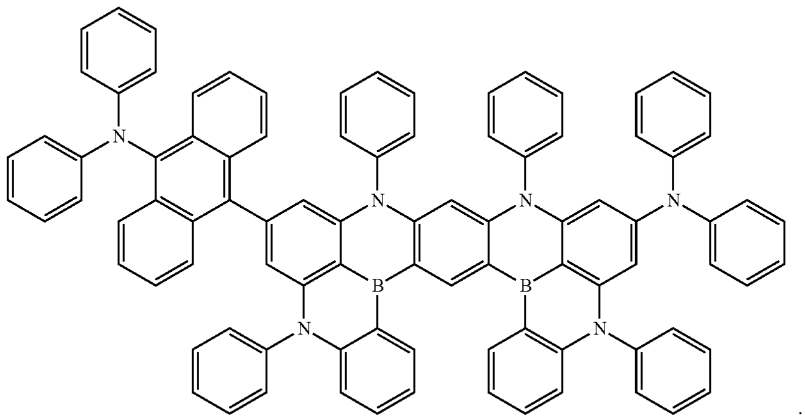

13. A light emitting device comprising:

a first electrode;

a second electrode on the first electrode; and an emission layer between the first electrode and the second electrode and comprising a polycyclic compound represented by Formula 2, wherein the first electrode and the second electrode each independently comprise any one selected from among Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, or an oxide thereof:

Formula 2

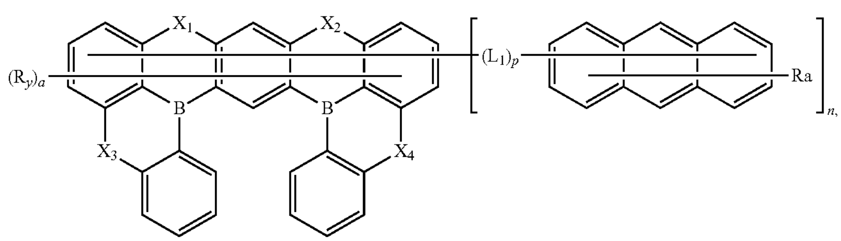

and wherein, in Formula 2, $X_1$ to $X_4$ are each independently O, S, Se, or $NR_1$, $R_1$ is

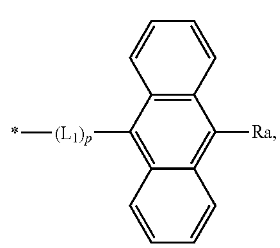

a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, n is an integer of 0 to 8, when in $NR_1$, $R_1$ is not

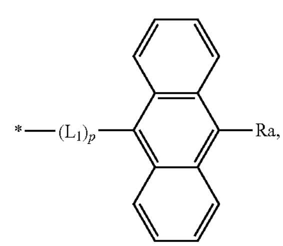

n is an integer of 1 to 8, when n is 0, at least one selected from among $X_1$ to $X_4$ is $NR_1$ in which $R_1$ is

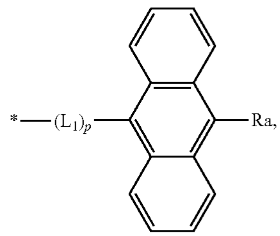

a is an integer of 0 to 8-n, p is 0 or 1, $L_1$ is a substituted or unsubstituted arylene group having 6 to 30 ring-forming carbon atoms, a substituted or unsubstituted heteroarylene group having 2 to 30 ring-forming carbon atoms, or a substituted or unsubstituted divalent amine group, and $R_y$ and $R_a$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkenyl group having 2 to 20 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring.

14. The light emitting device of claim 13, wherein the compound represented by Formula 2 is represented by any one selected from among Formula 3 to Formula 5:

Formula 3

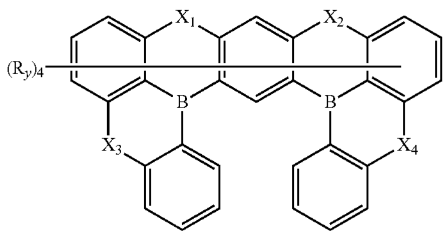

Formula 4

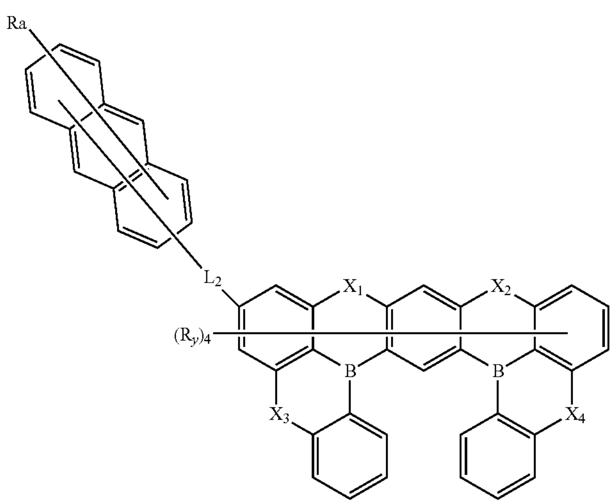

-continued

Formula 5

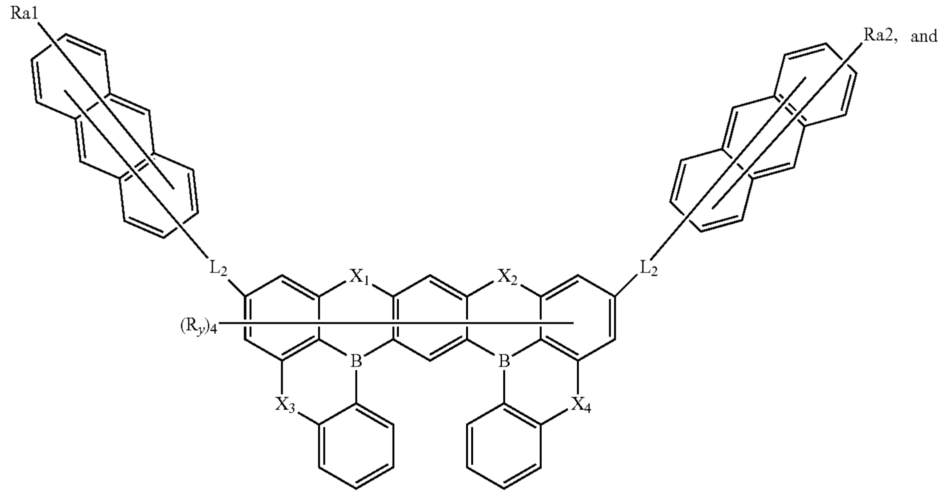

wherein, In Formula 4 and Formula 5, $L_2$ and $L_3$ may be each independently a substituted or unsubstituted arylene group having 6 to 30 ring-forming carbon atoms, a substituted or unsubstituted heteroarylene group having 2 to 30 ring-forming carbon atoms, or a substituted or unsubstituted divalent amine group, in formula 5 Ra1 and Ra2 may be each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, in Formulae 3 to 5, a, $R_y$, and $X_1$ to $X_4$ are the same as defined in connection with Formula 2, and in Formula 4 Ra is the same as defined in connection with Formula 2.

15. The light emitting device of claim 14, wherein, in Formula 2,

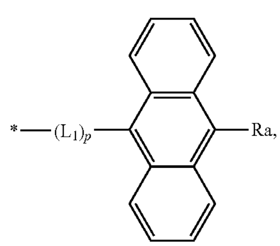

is represented by any one selected from among Formula 6 to Formula 9:

Formula 6

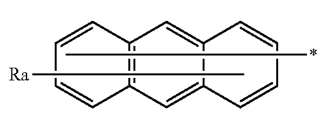

-continued

Formula 7

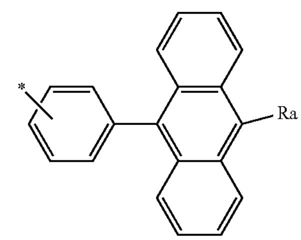

Formula 8

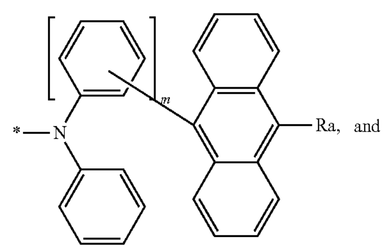

Formula 9

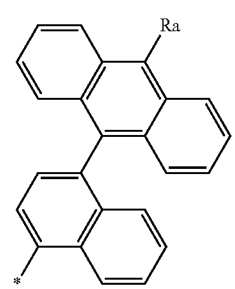

wherein, in Formula 8, m is 0 or 1, and in Formulae 6 to 9, $R_a$ is the same as defined in connection with Formula 2.

16. The light emitting device of claim 15, wherein the moiety represented by Formula 6 is represented by Formula 6-1 or Formula 6-2:

Formula 6-1

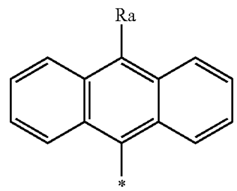

Formula 6-2

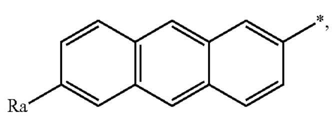

and wherein, in Formula 6-1 and Formula 6-2, Ra is the same as defined in connection with Formula 1.

17. The light emitting device of claim 15, wherein the moiety represented by Formula 7 is represented by any one selected from among Formula 7-1 to Formula 7-3:

Formula 7-1

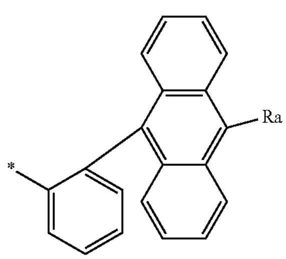

Formula 7-2

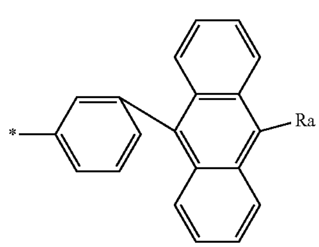

-continued

Formula 7-3

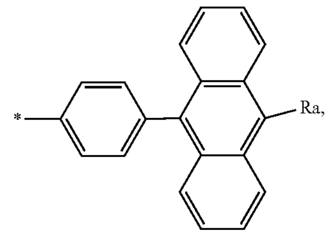

and wherein, in Formula 7-1 to Formula 7-3, $R_a$ is the same as defined in connection with Formula 2.

18. The light emitting device of claim 15, wherein the moiety represented by Formula 8 is represented by Formula 8-1 or Formula 8-2:

Formula 8-1

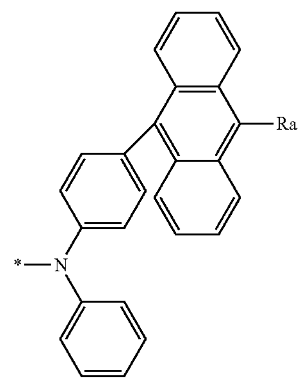

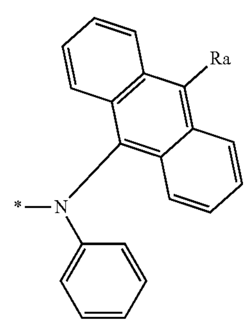

and wherein, in Formula 8-1 and Formula 8-2, $R_a$ is the same as defined in connection with Formula 2.

19. The light emitting device of claim 13, wherein, in Formula 2, Ra is an unsubstituted phenyl group or an unsubstituted naphthyl group.

20. The light emitting device of claim 13, wherein a lowest triplet excitation energy of the polycyclic compound is about 1.8 eV or less.

21. The light emitting device of claim 13, wherein the emission layer comprises at least one compound represented by Compound Group 1:

Compound Group 1
1
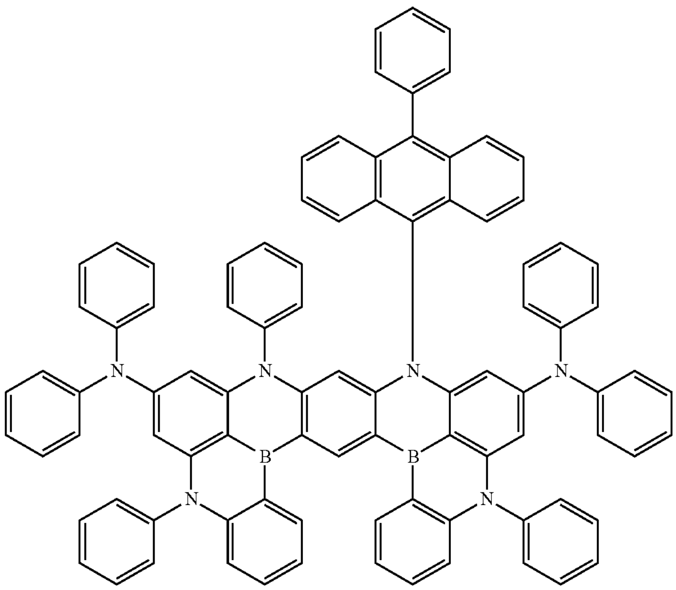
2
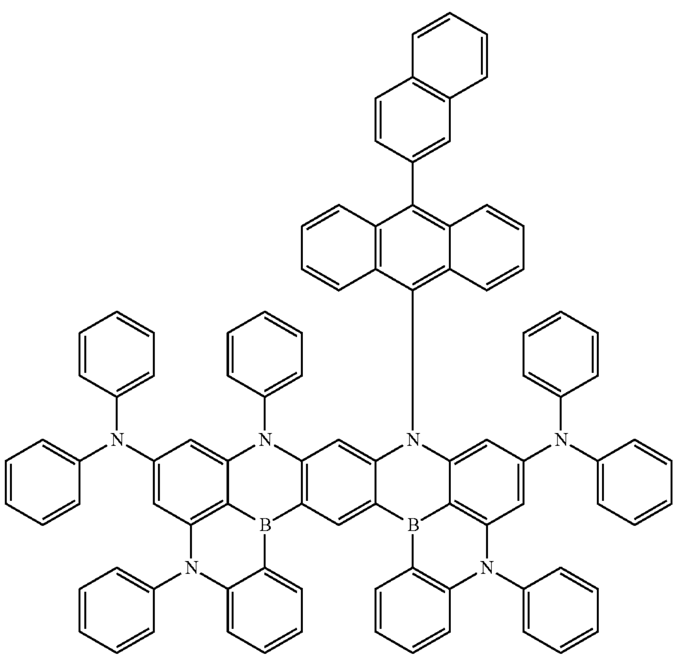

-continued
3
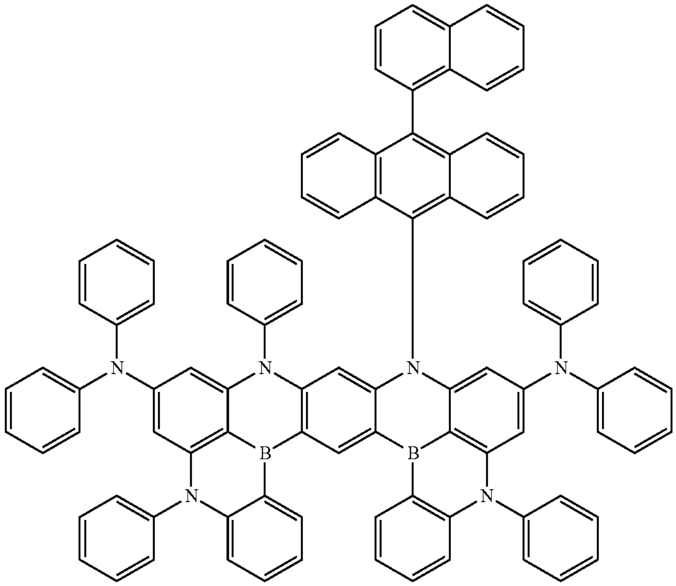
4
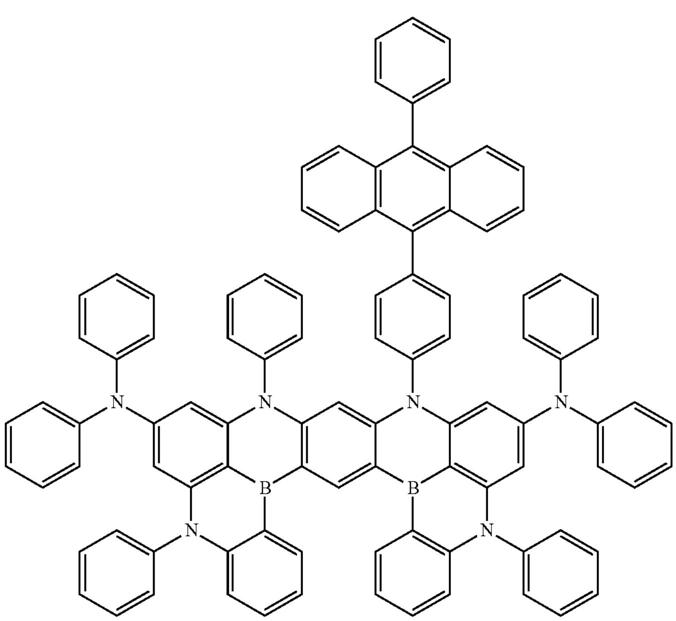

-continued
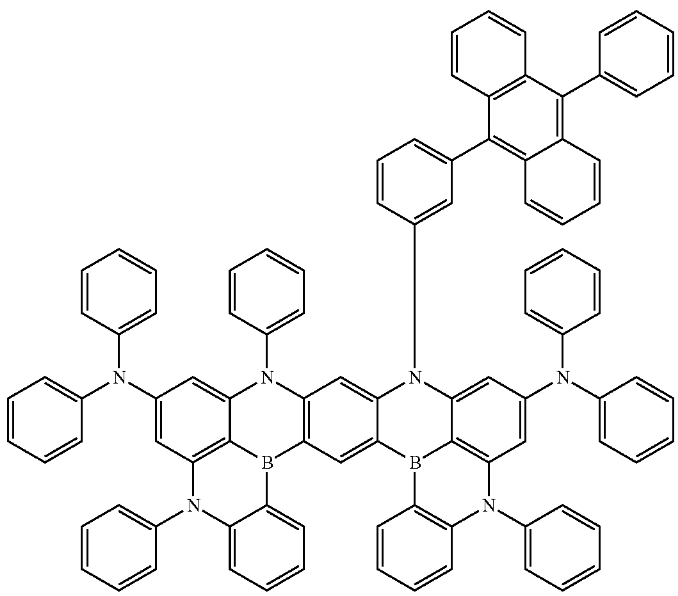
5
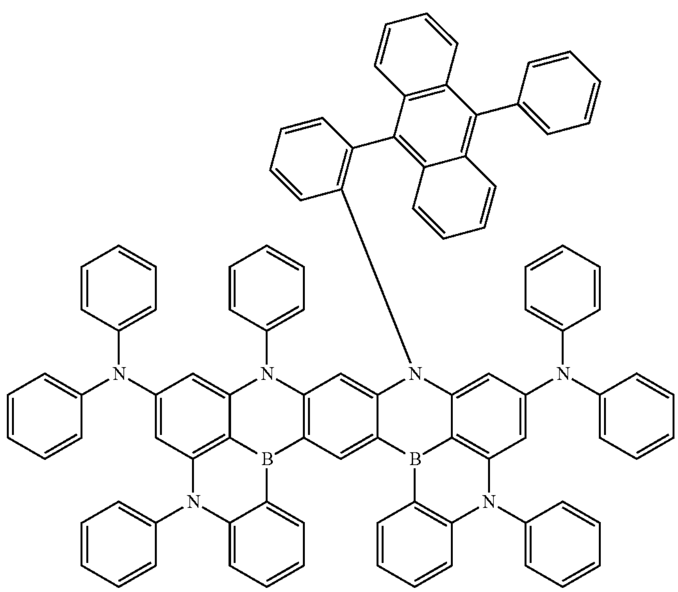
6
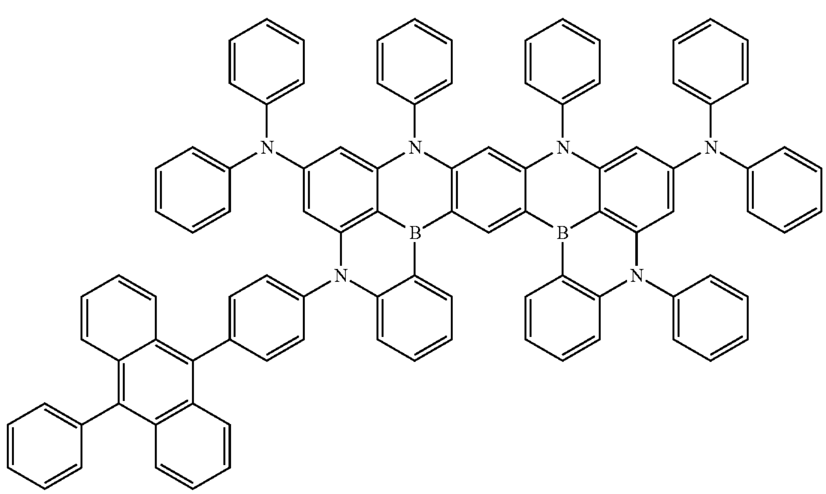
7

-continued
8
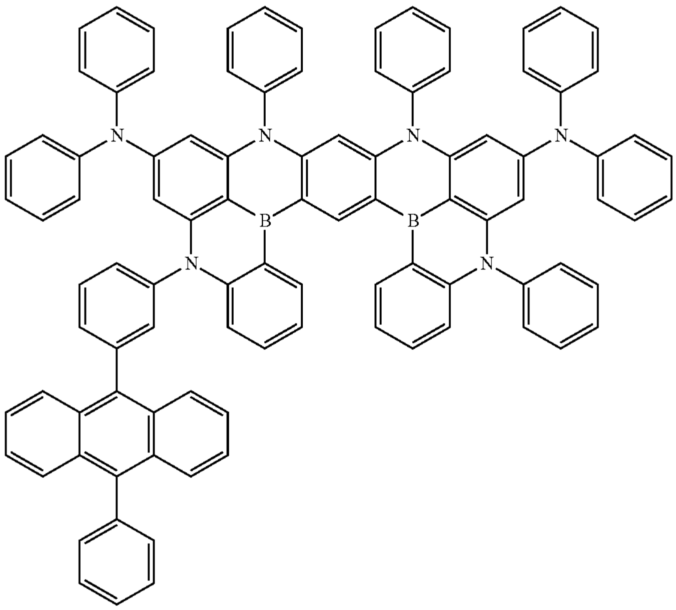
9
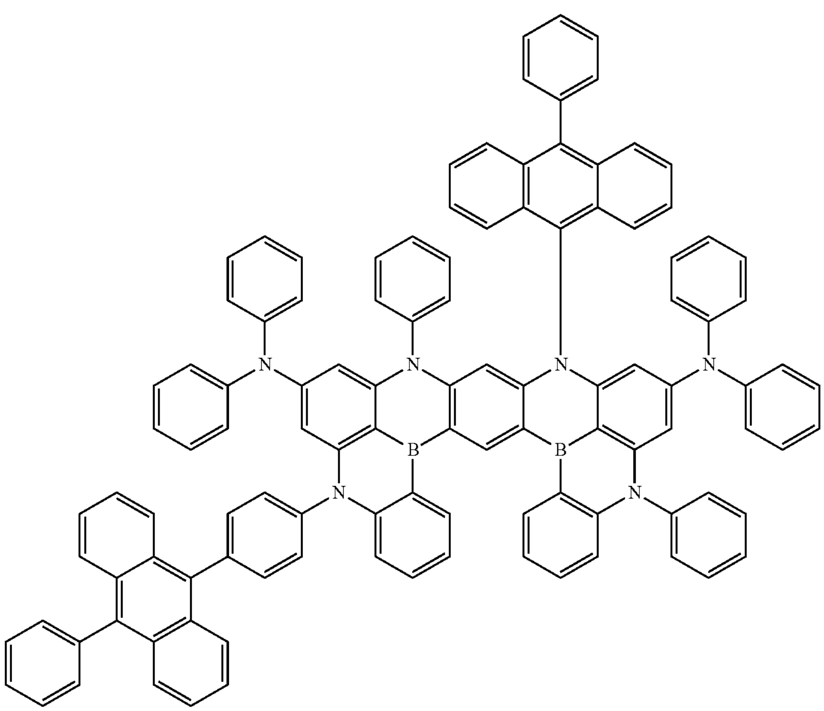

-continued
10
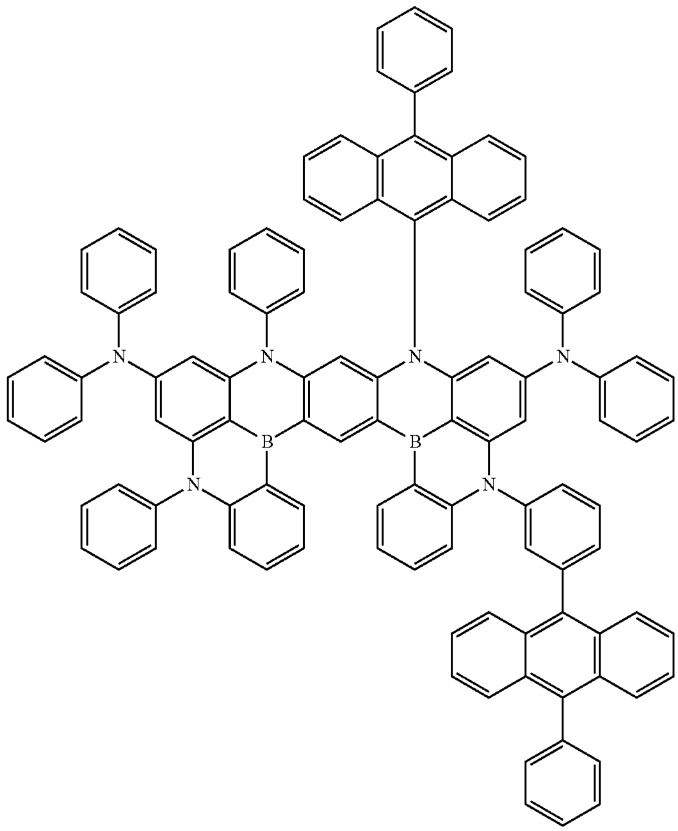
11
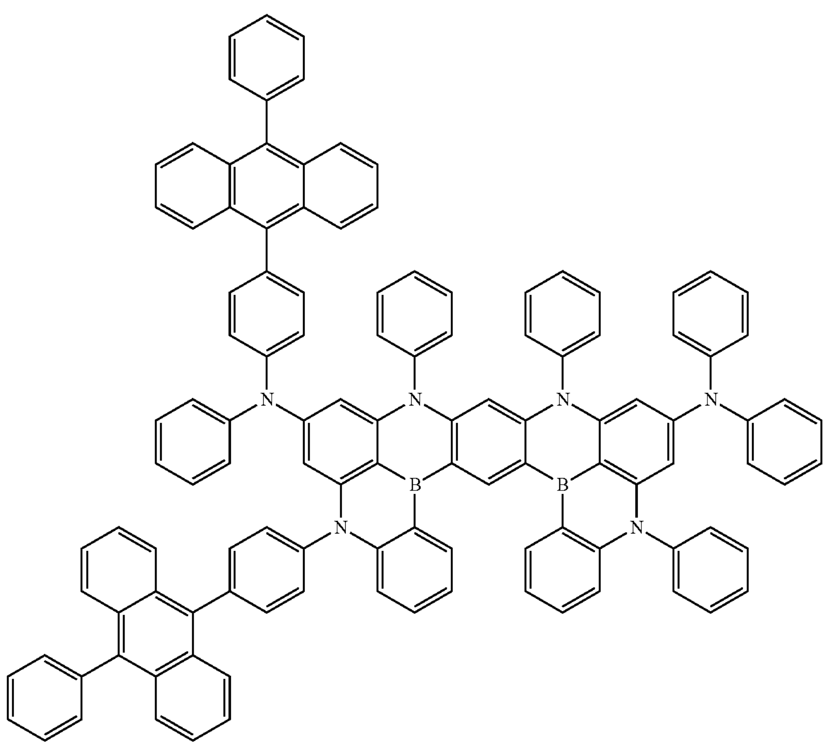

-continued
12
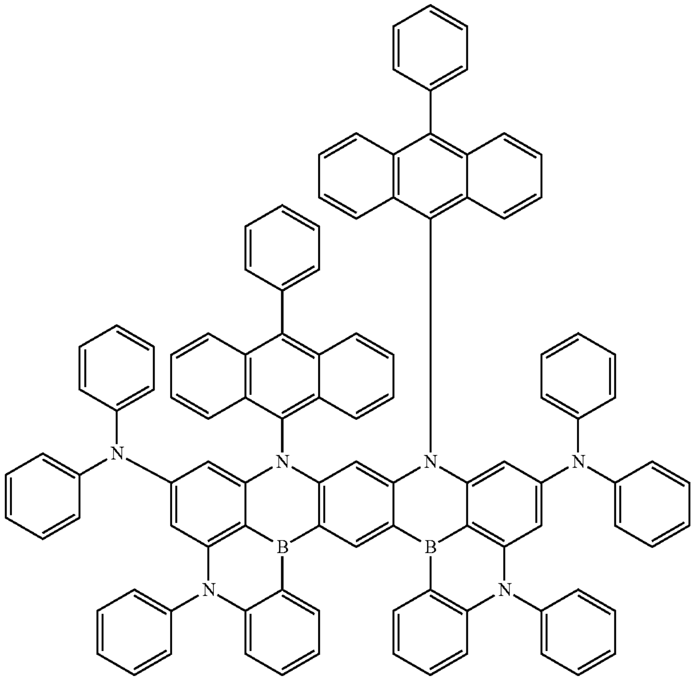
13
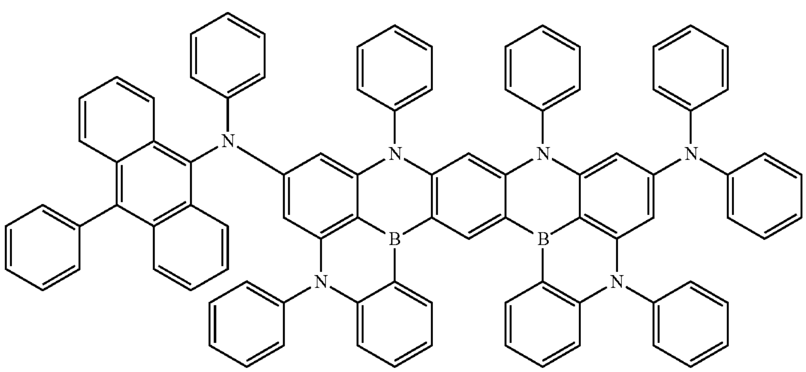
14
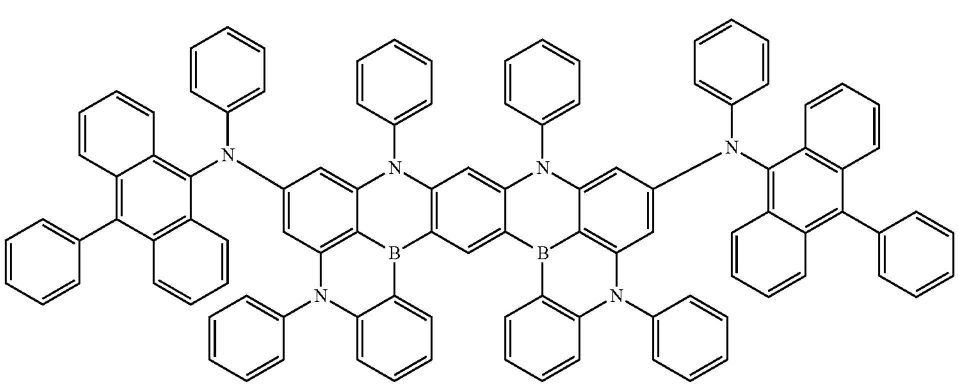

-continued
15
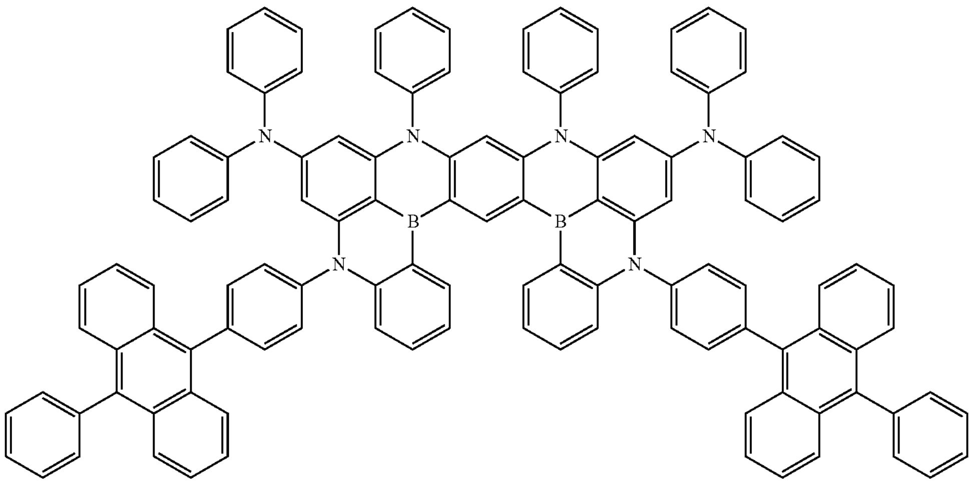
16
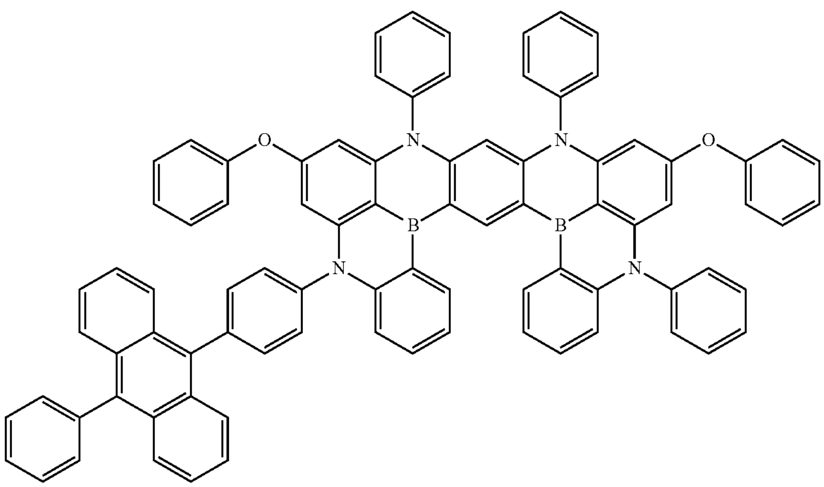
17
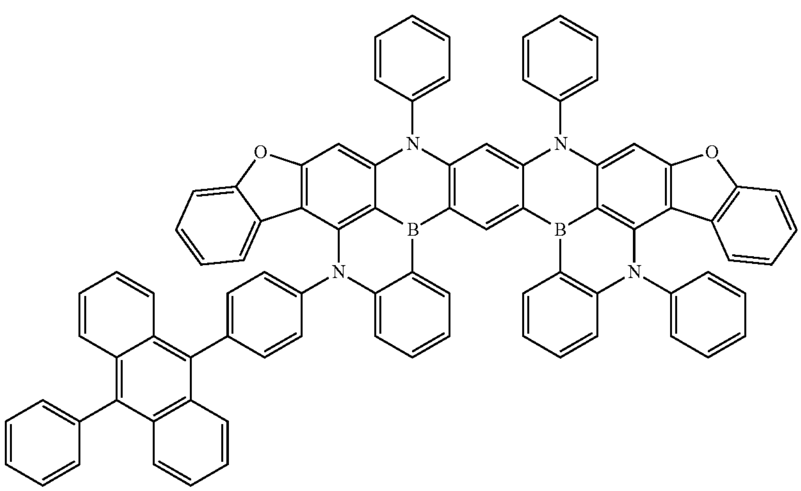

-continued
18
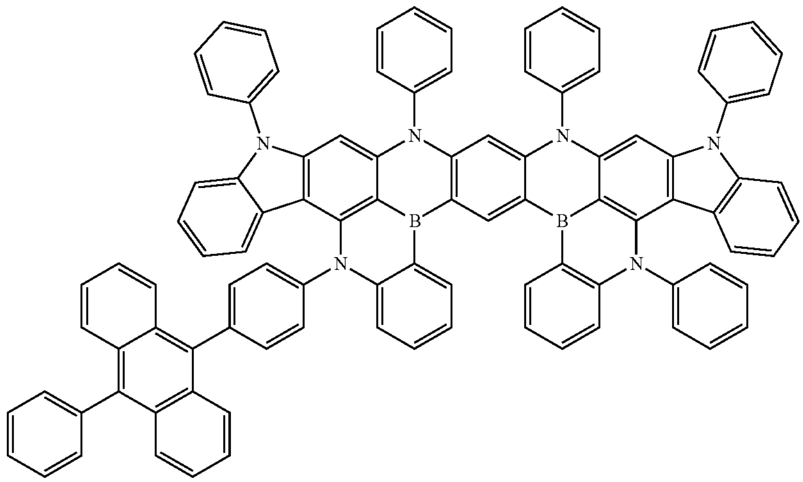
19
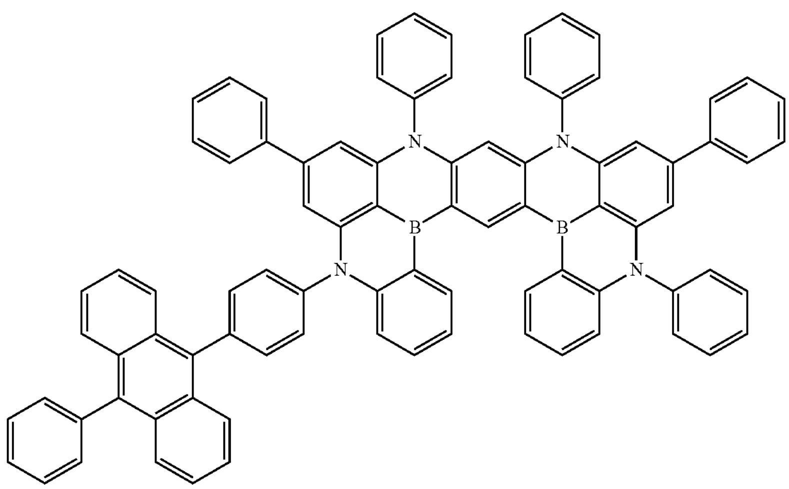
20
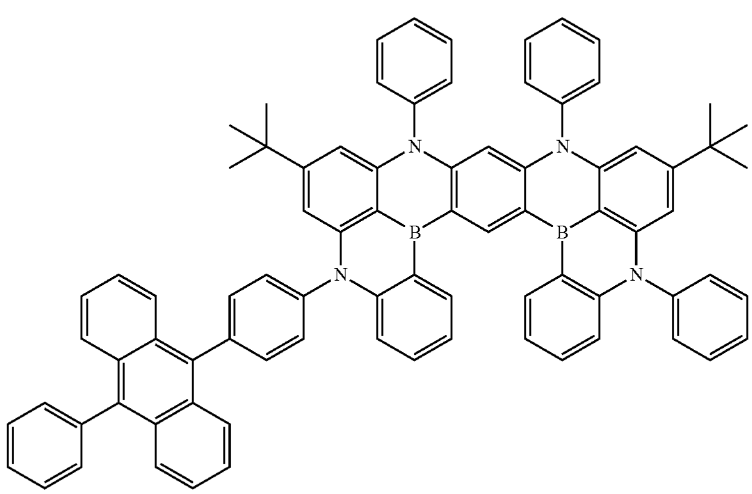

-continued
21
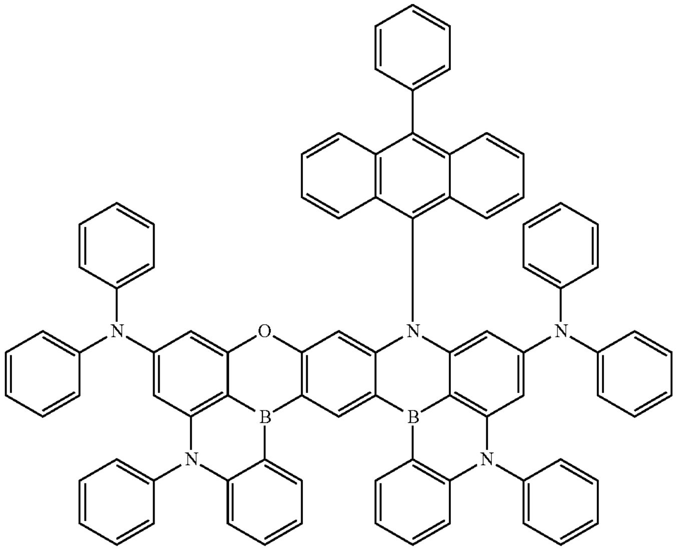
22
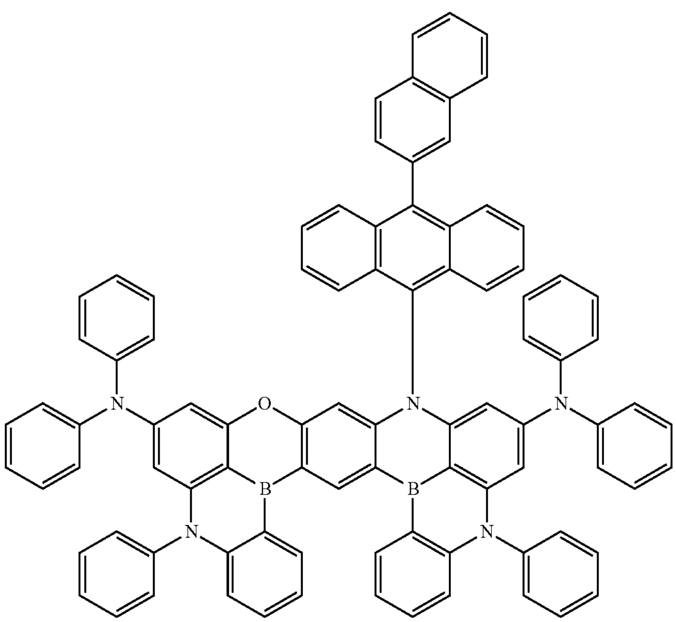

-continued
23
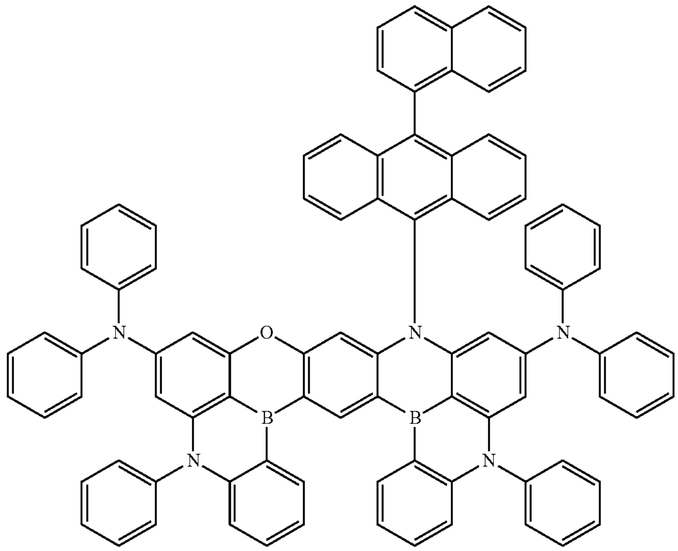
24
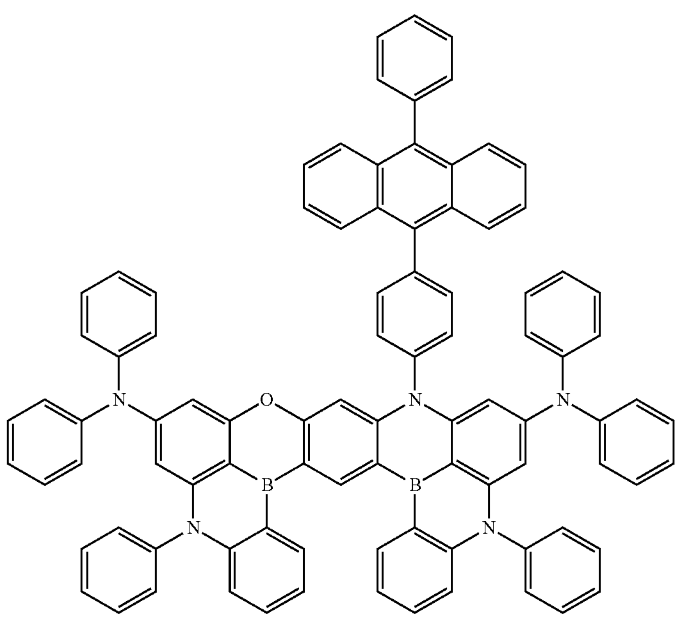

-continued
25
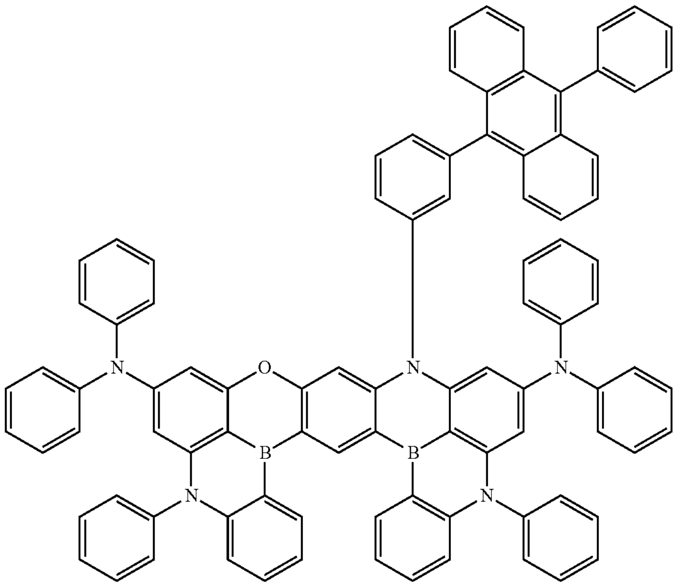
26
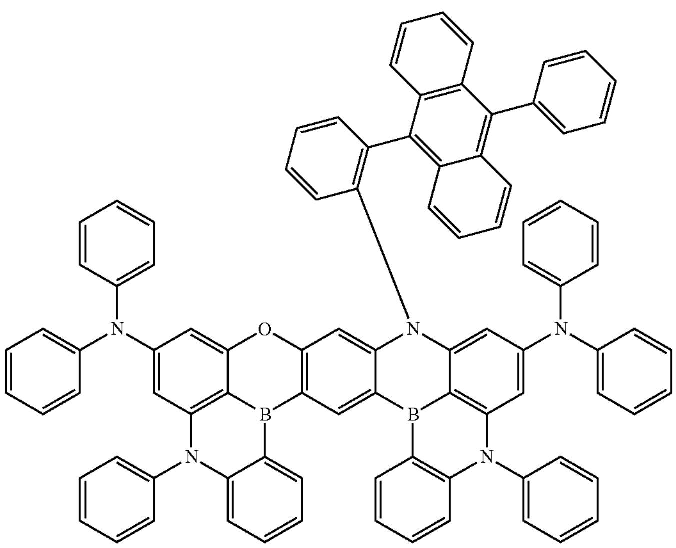
27
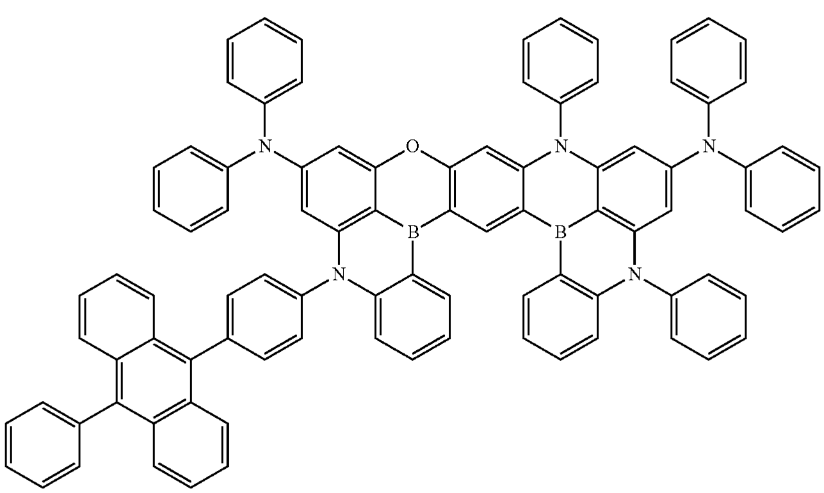

-continued
28
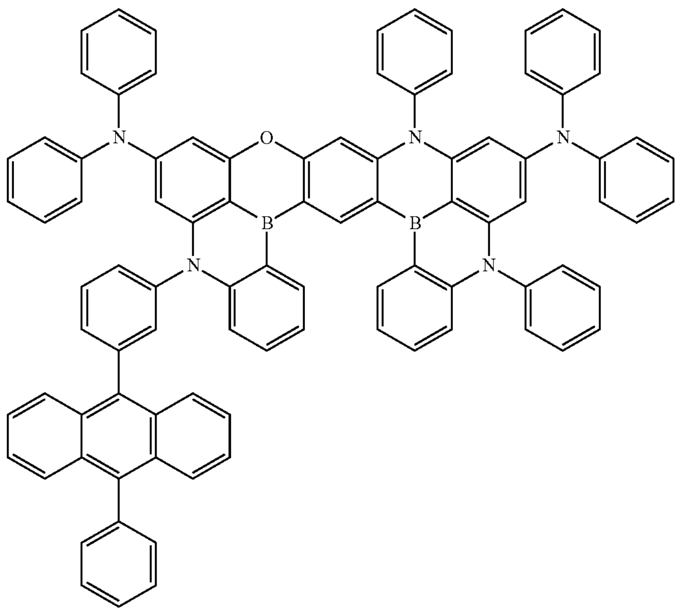
29
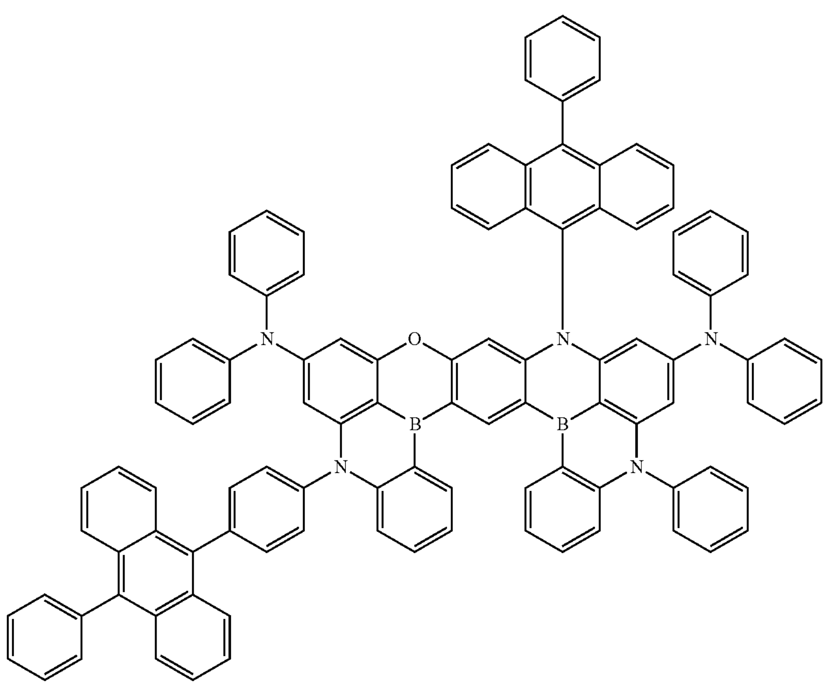

-continued
30
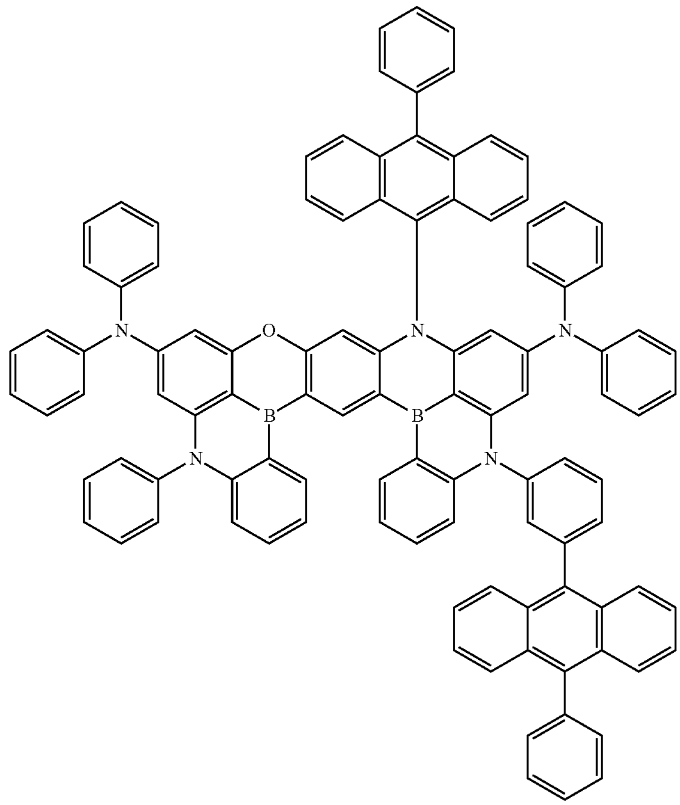
31
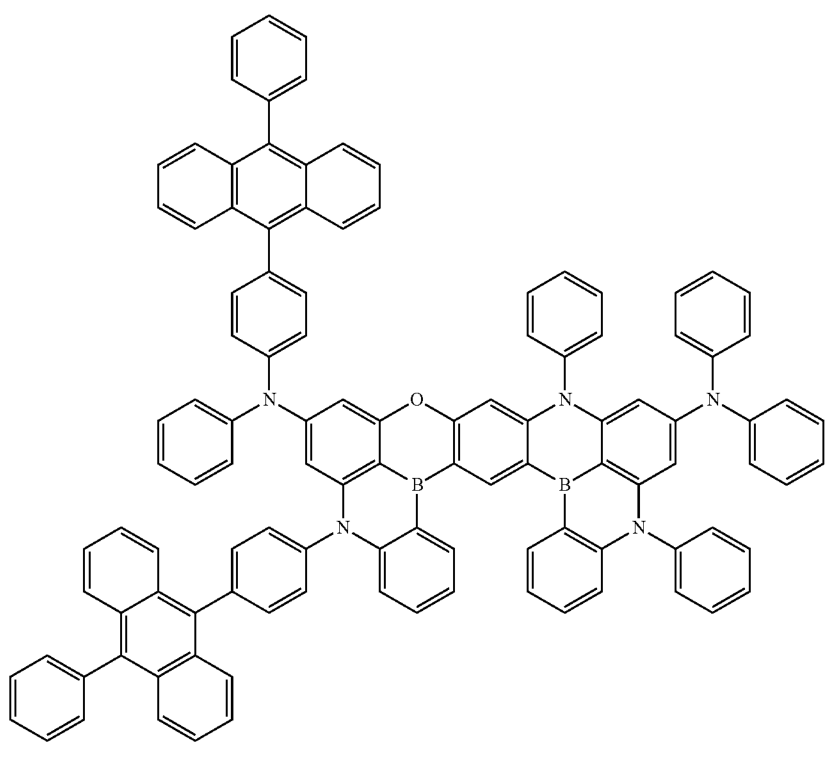

-continued
32
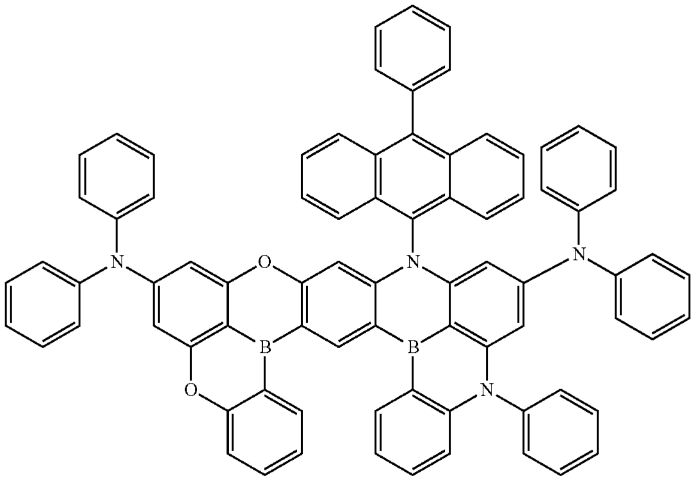
33
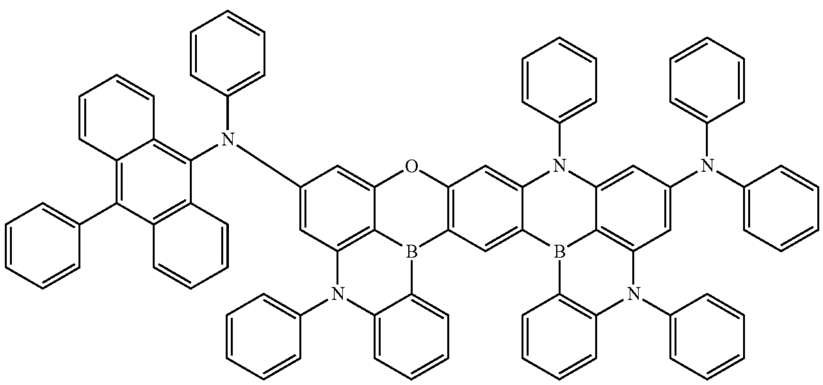
34
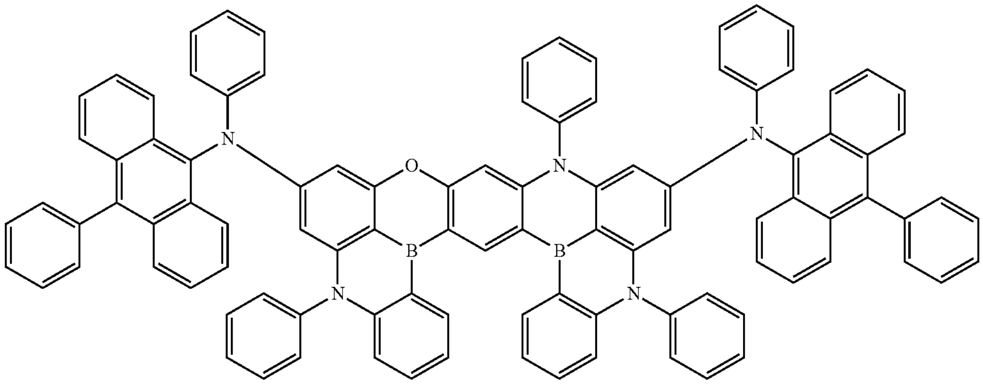

-continued
35
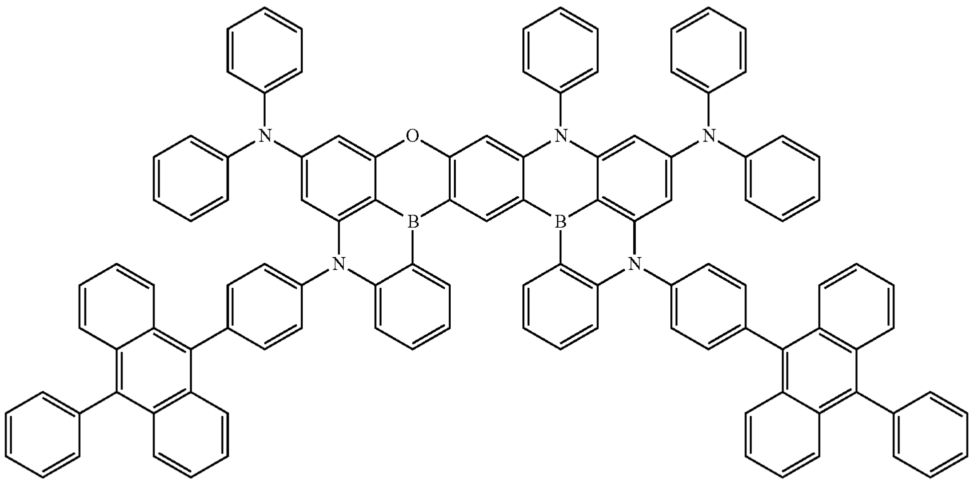
36
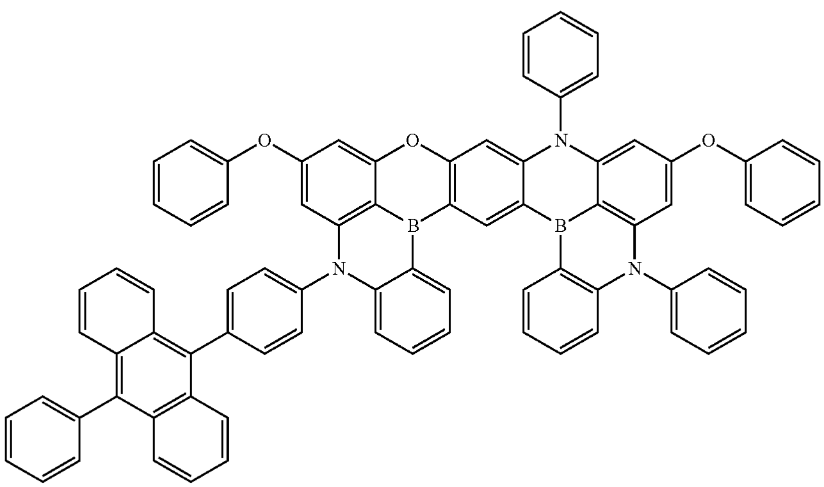
37
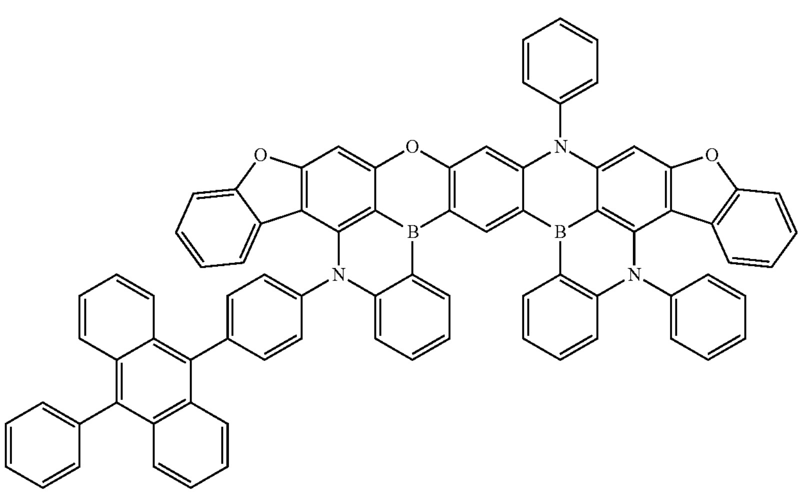

-continued
38
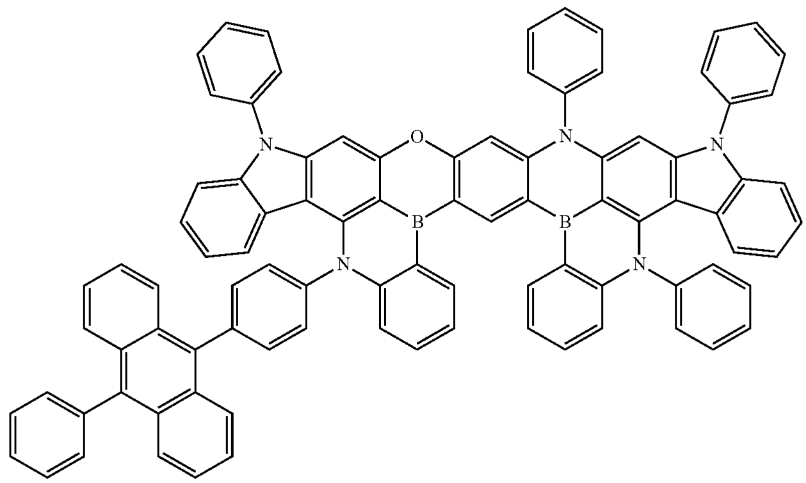
39
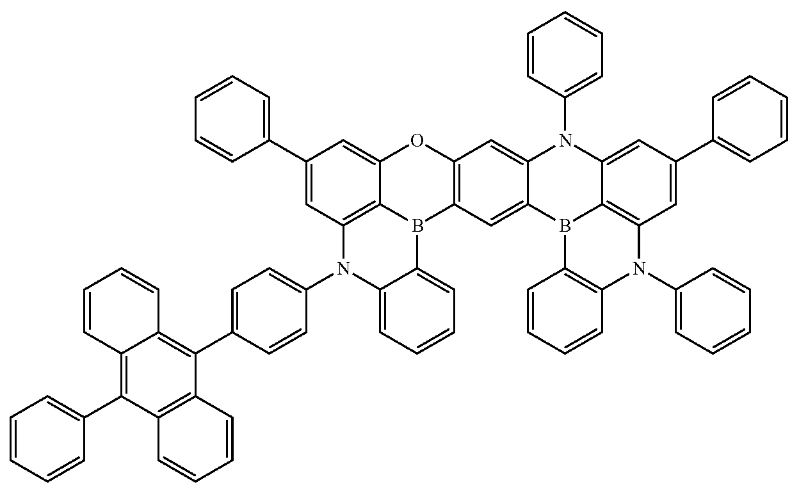
40
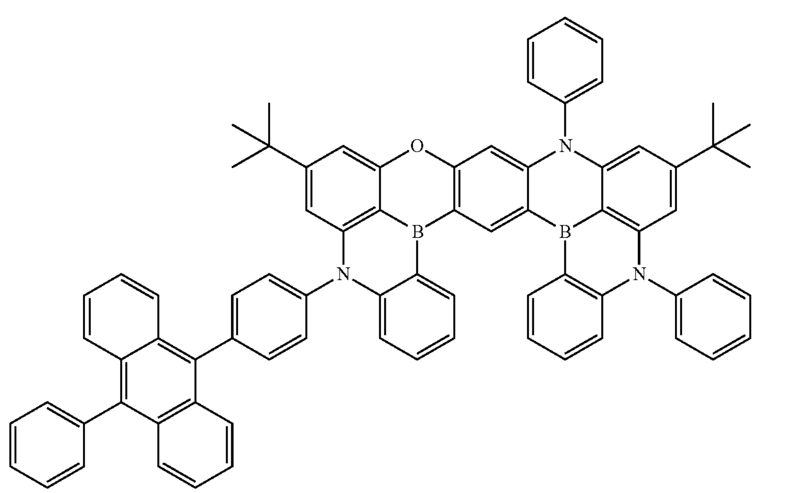

-continued
41
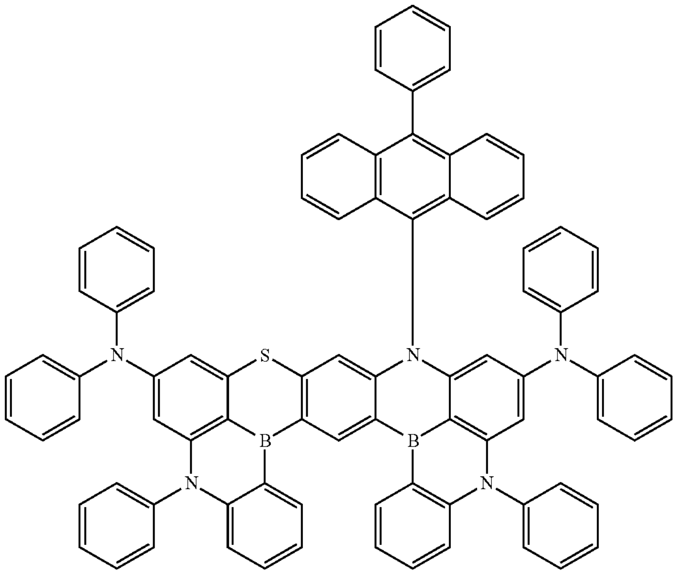
42
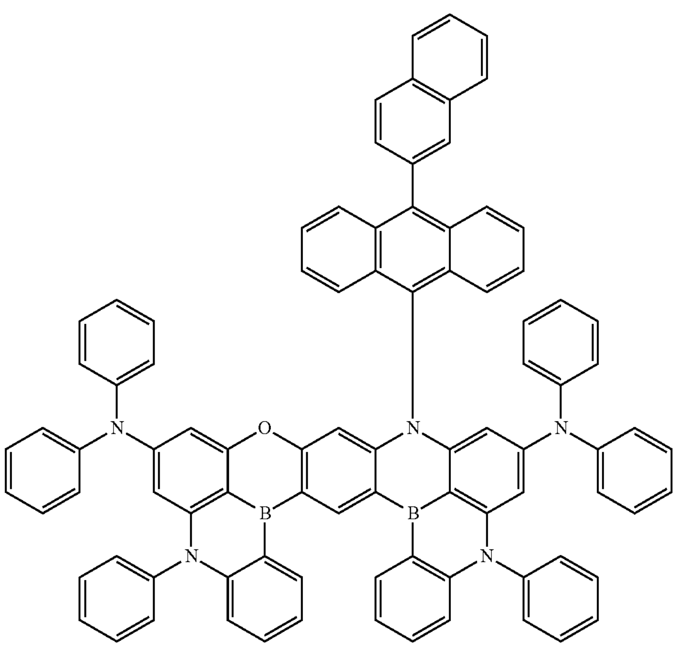

-continued
43
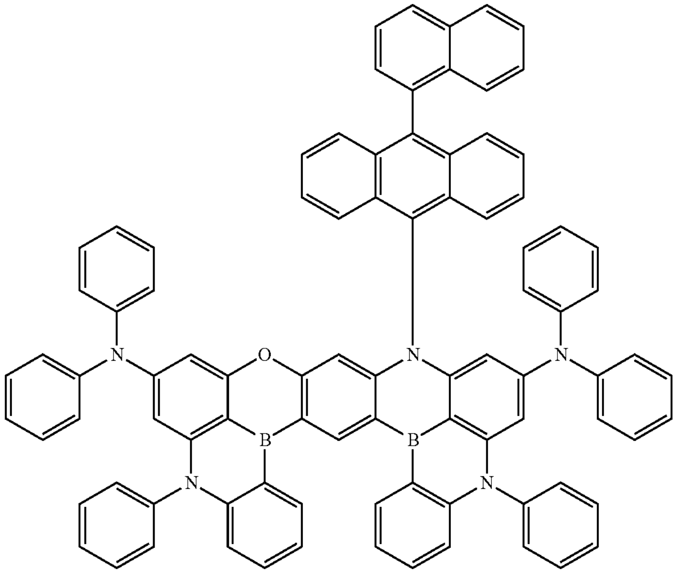
44
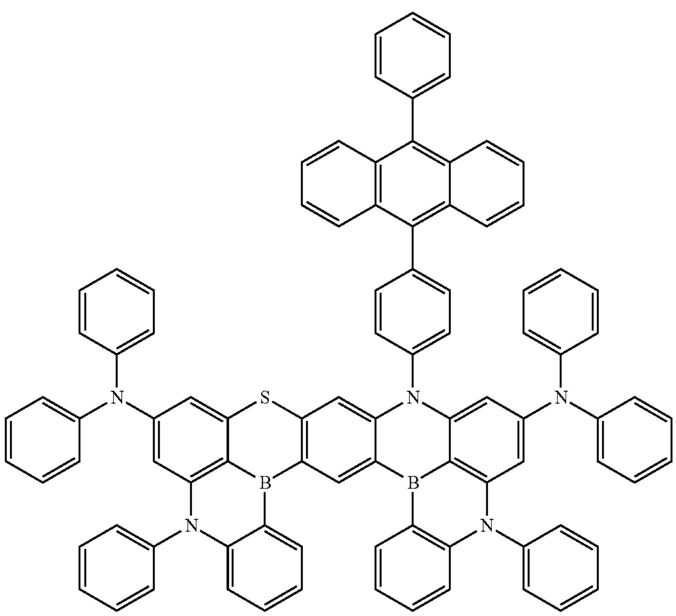

-continued
45
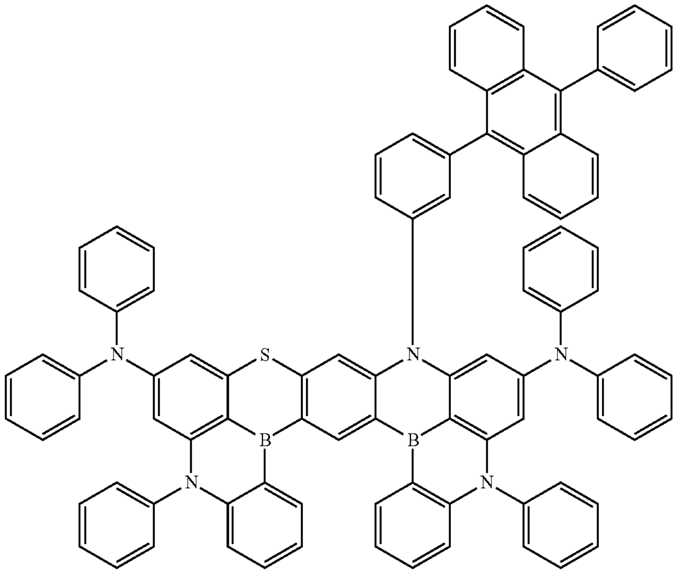
46
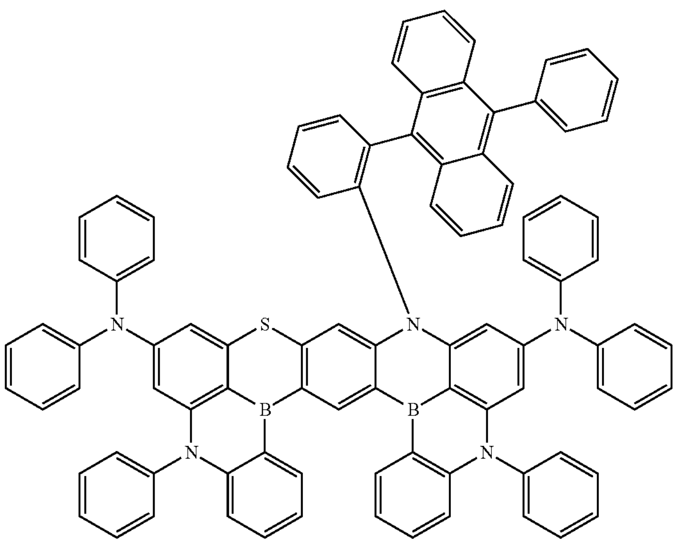
47
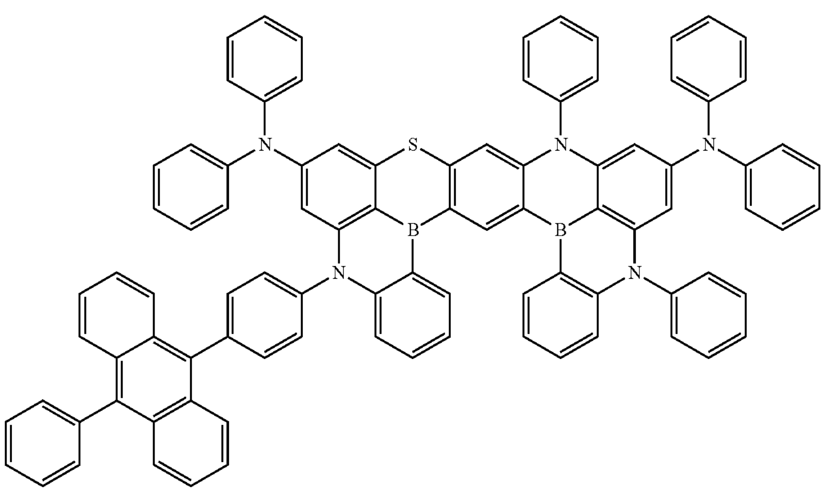

-continued
48
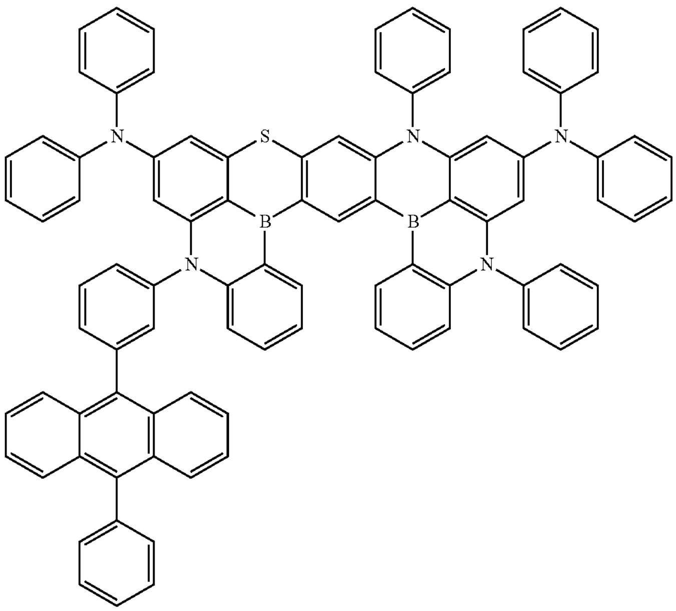
49
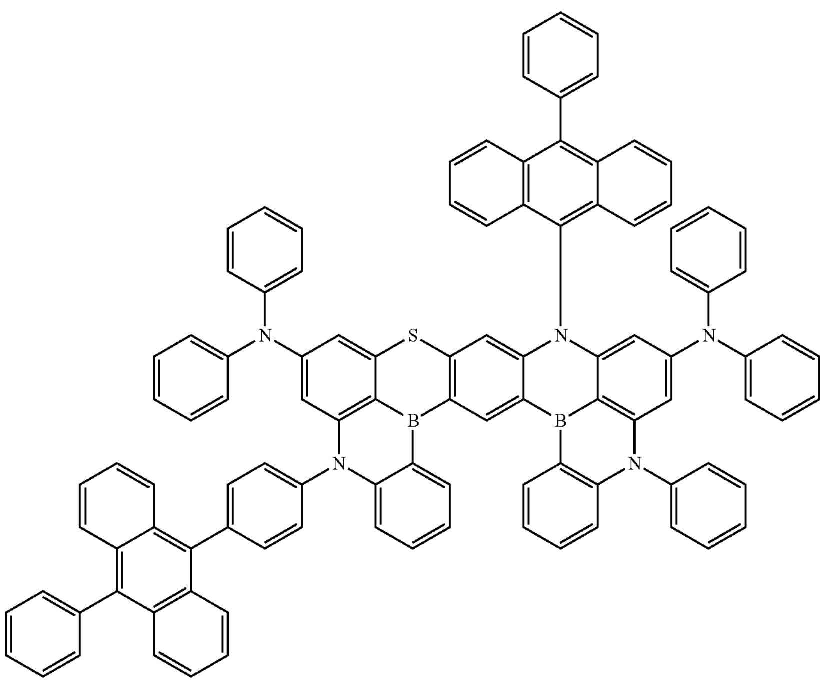

-continued
50
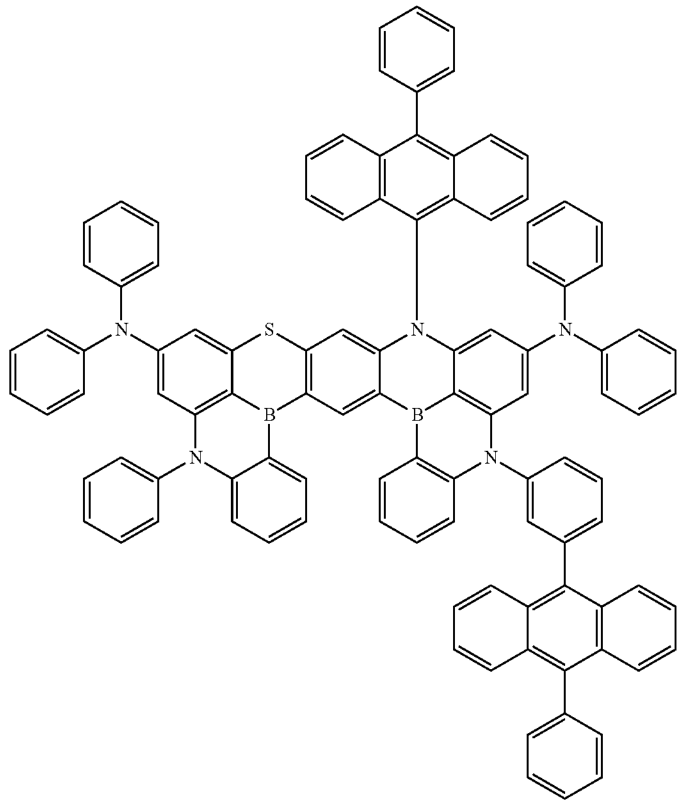
51
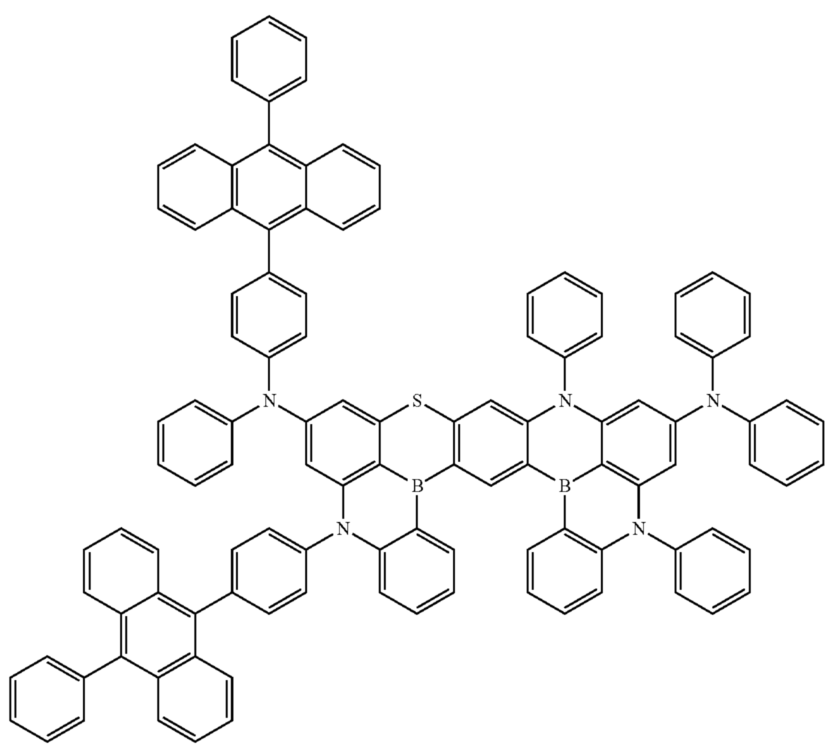

-continued
52
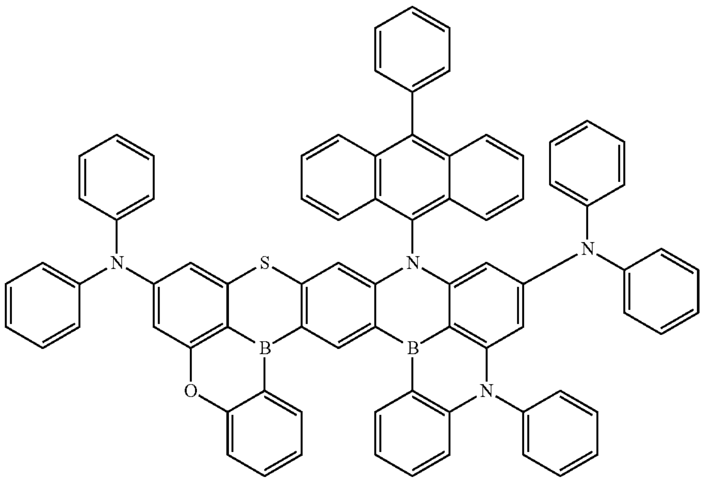
53
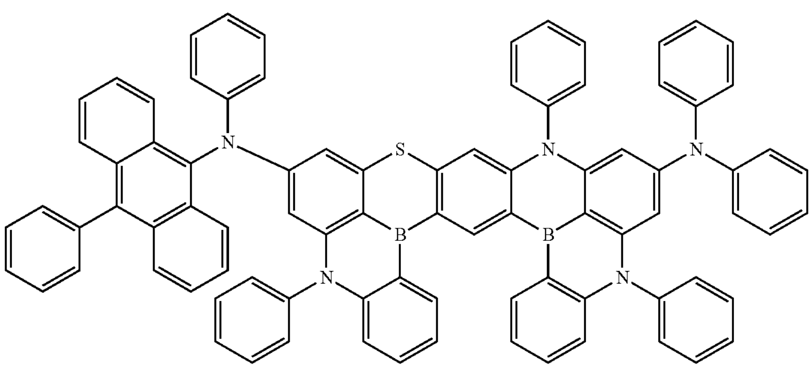
54
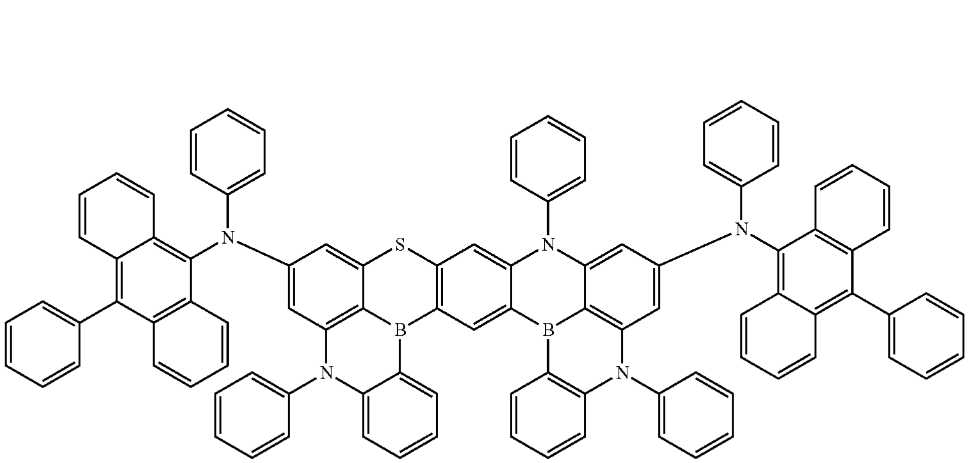

-continued
55
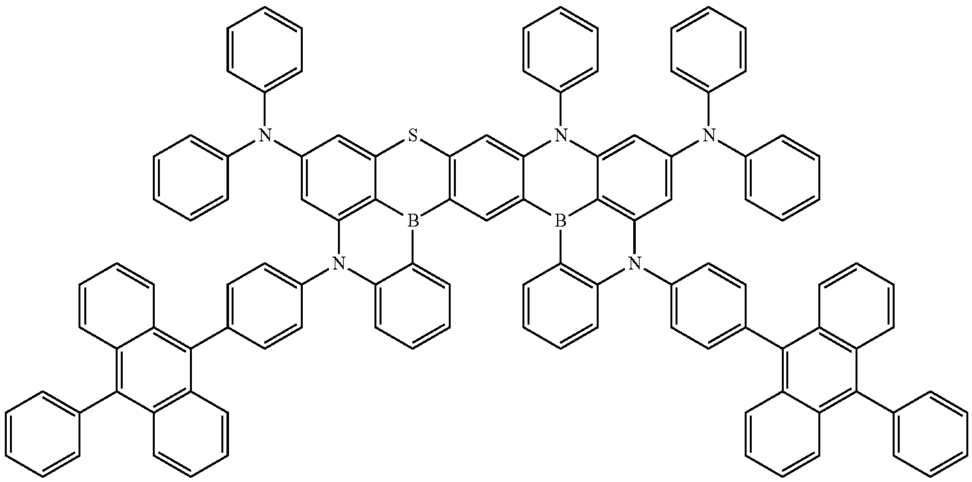
56
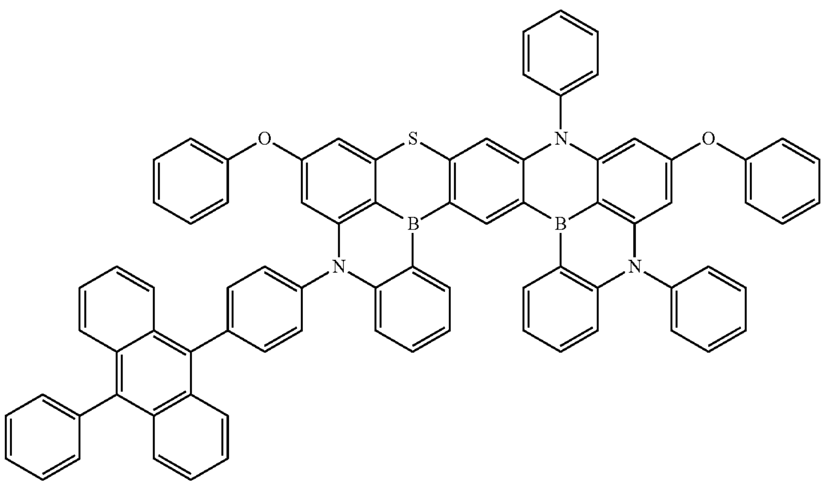
57
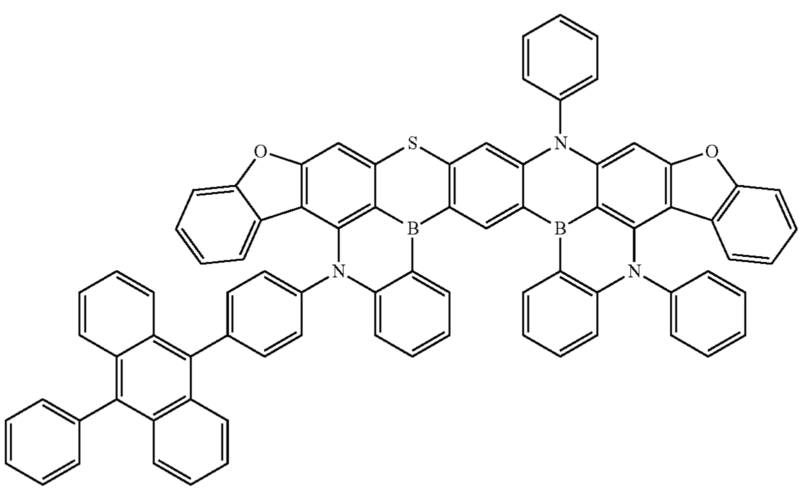

-continued
58
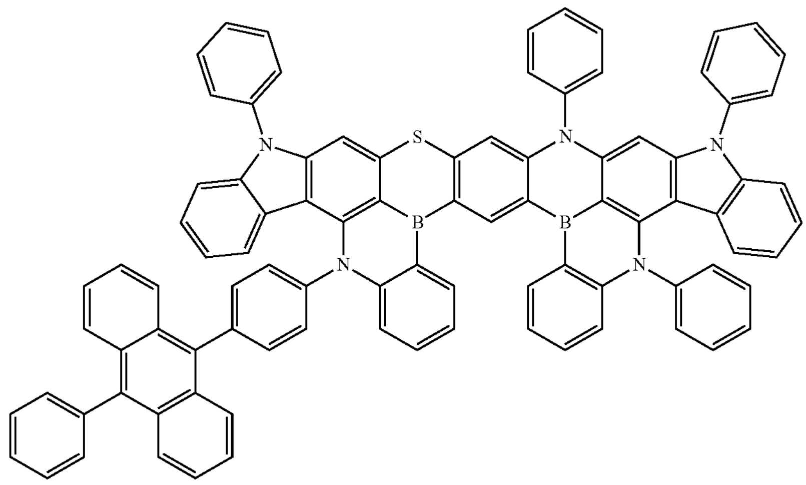
59
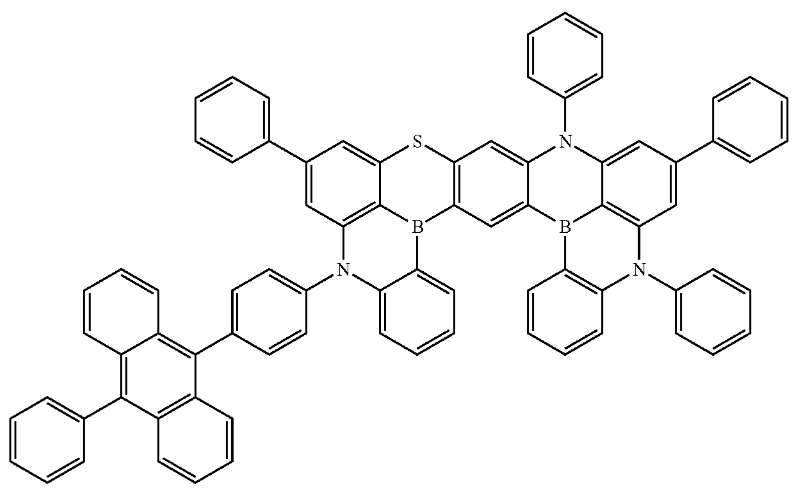
60
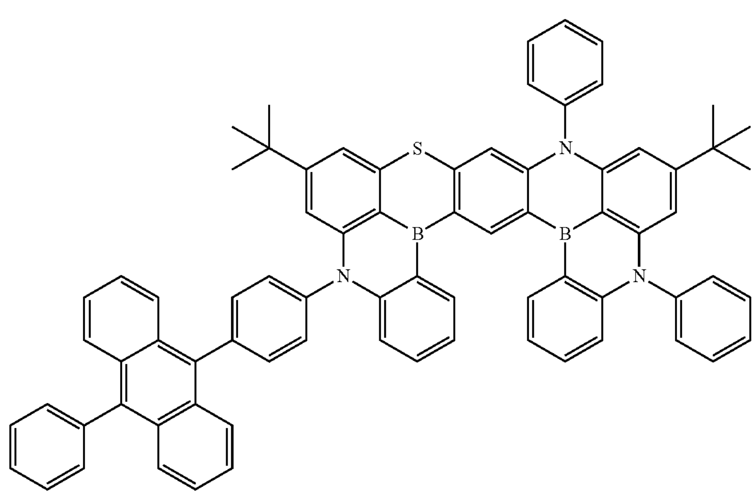

-continued
61
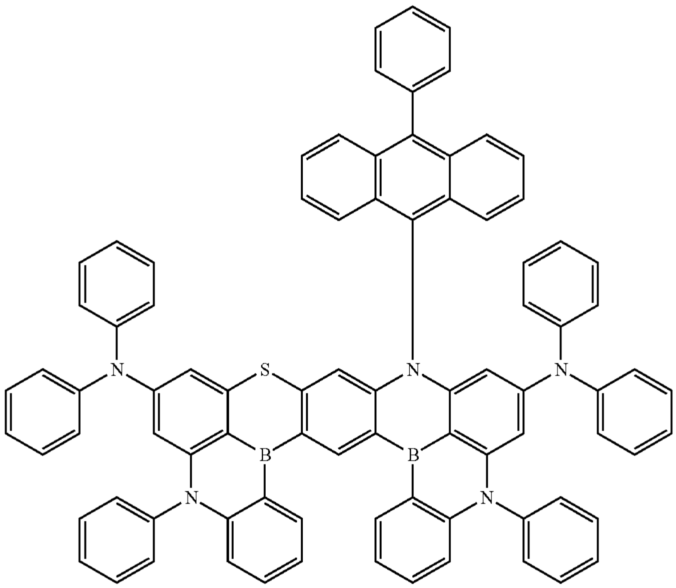
62
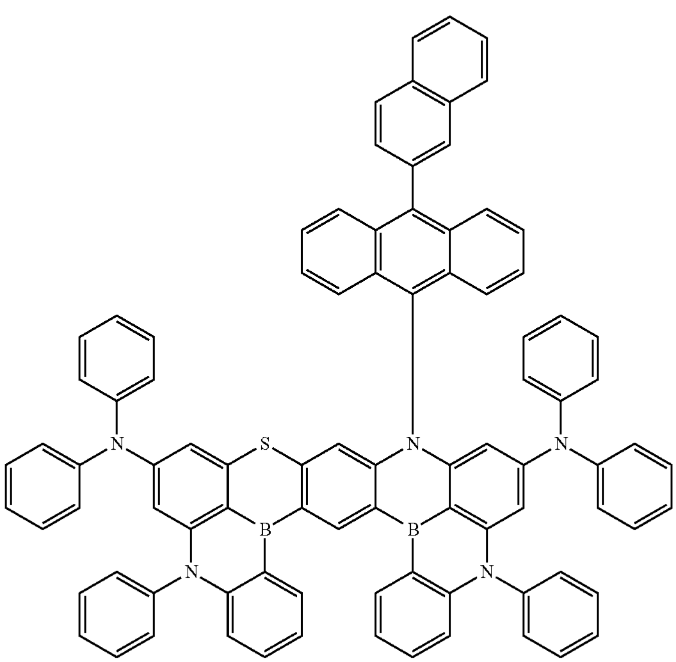

-continued
63
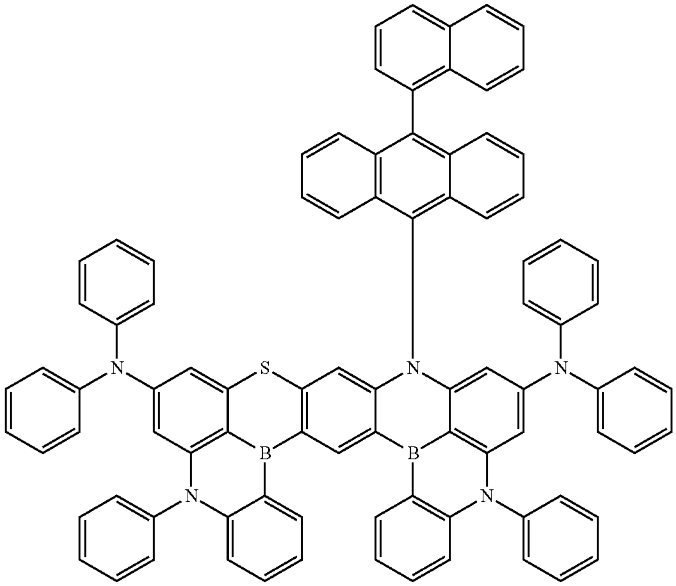
64
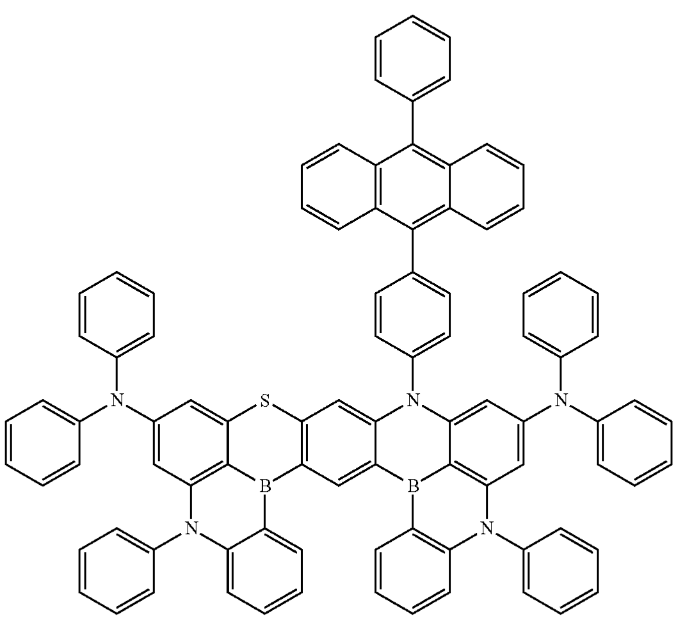

-continued
65
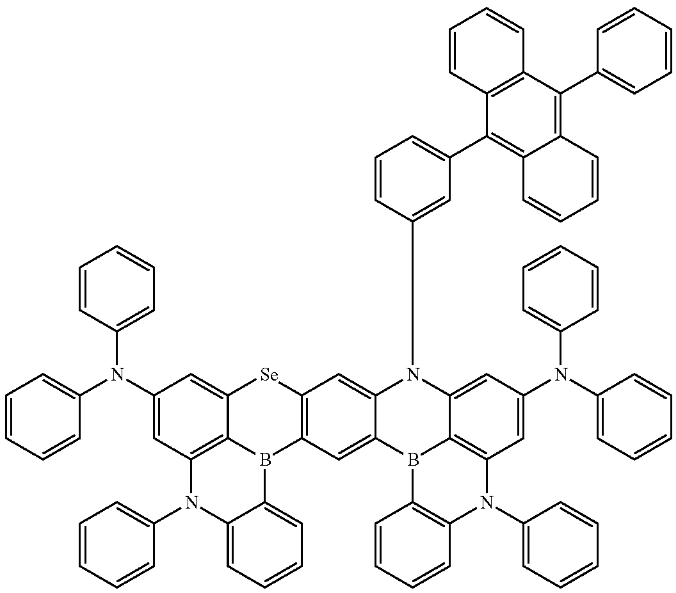
66
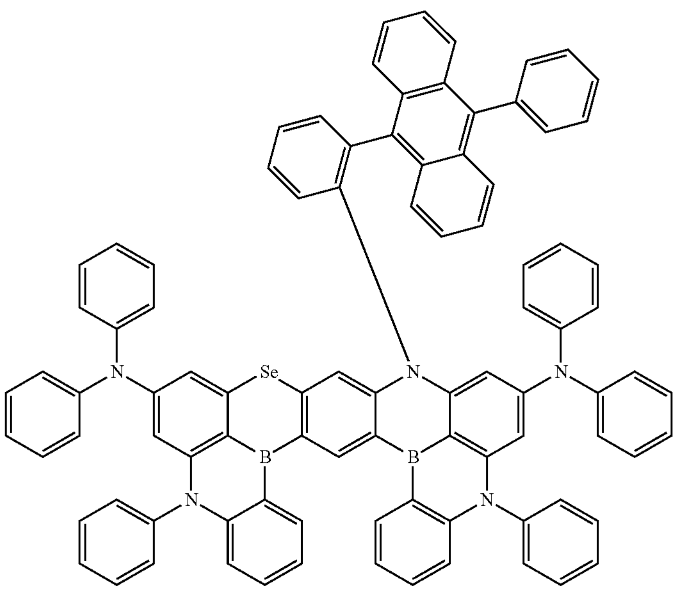
67
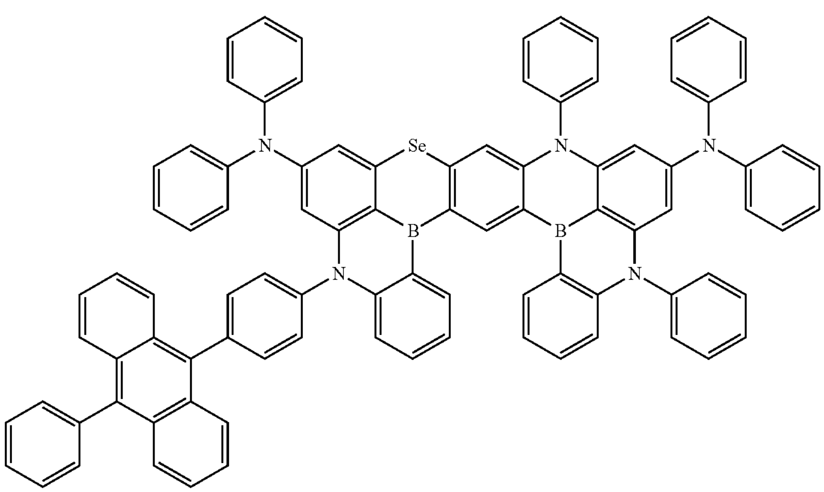

-continued
68
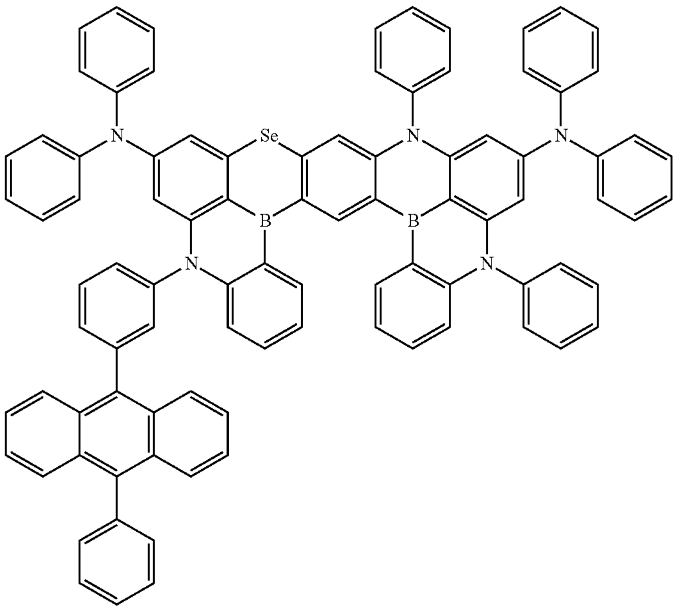
69
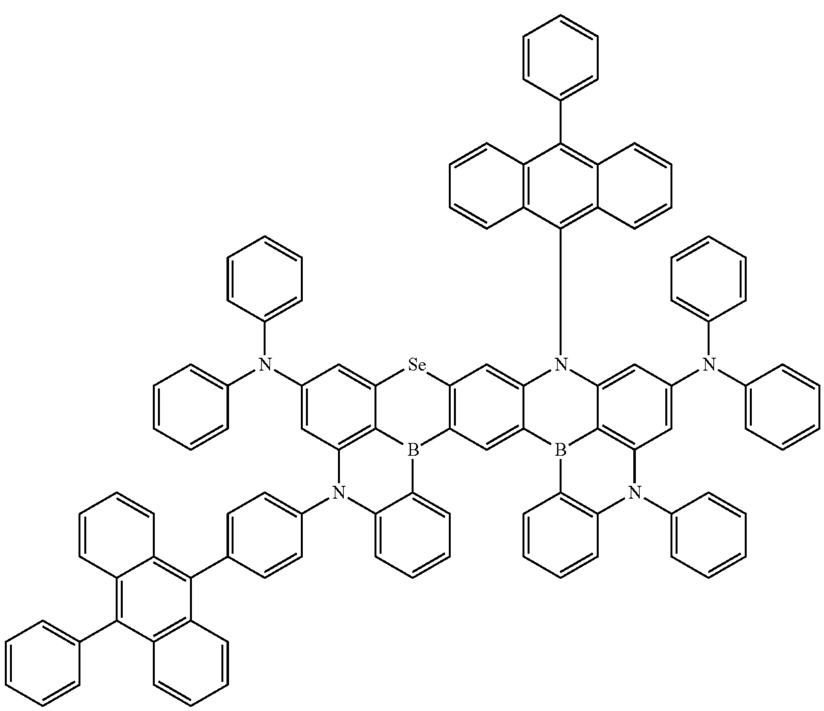

-continued
70
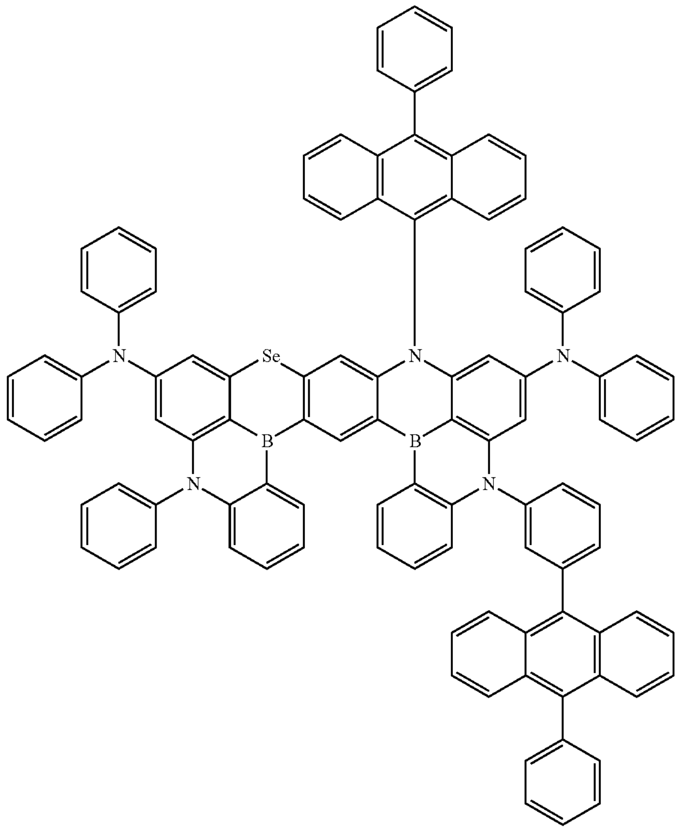
71
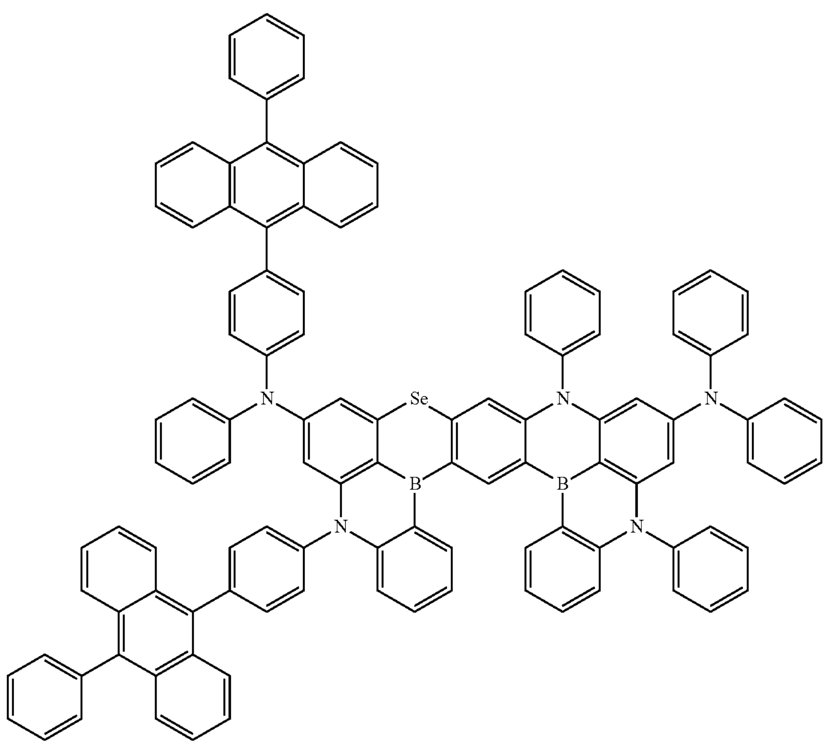

-continued
72
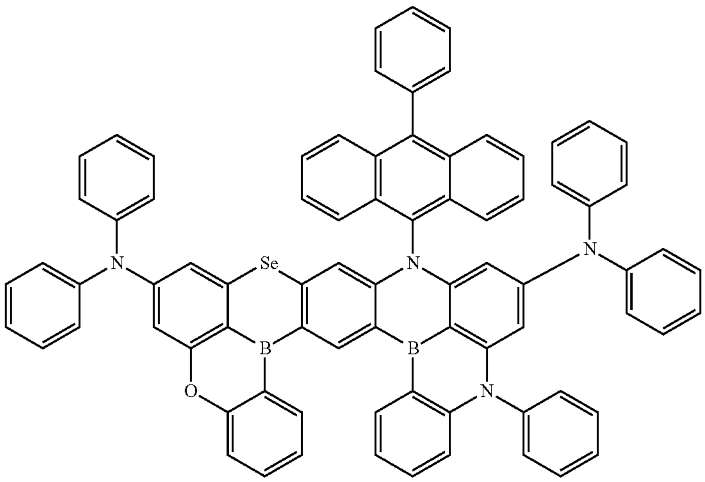
73
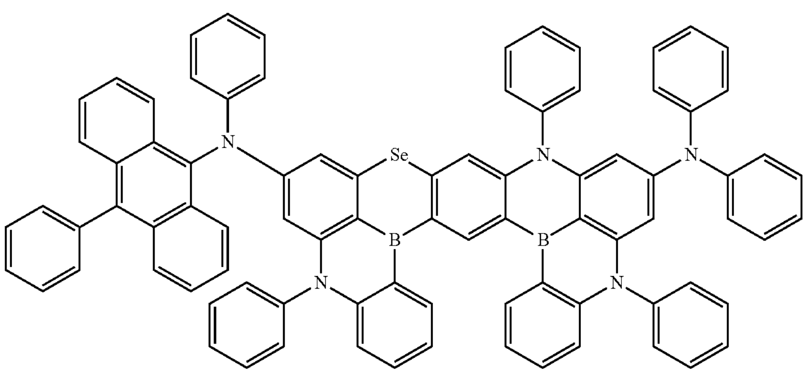
74
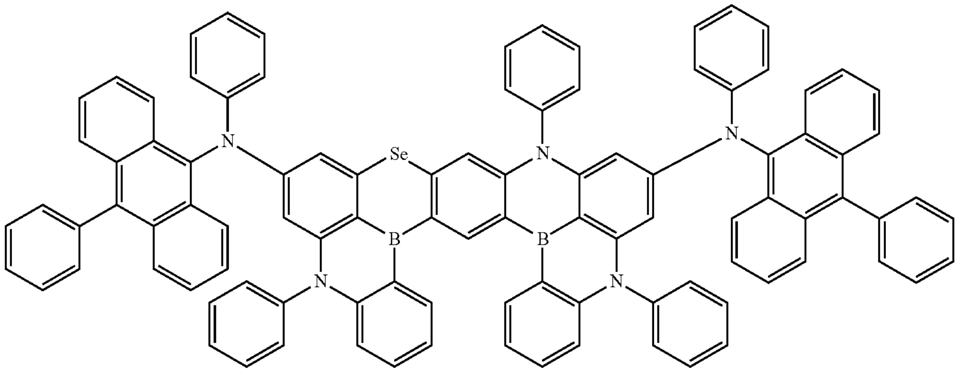

-continued
75
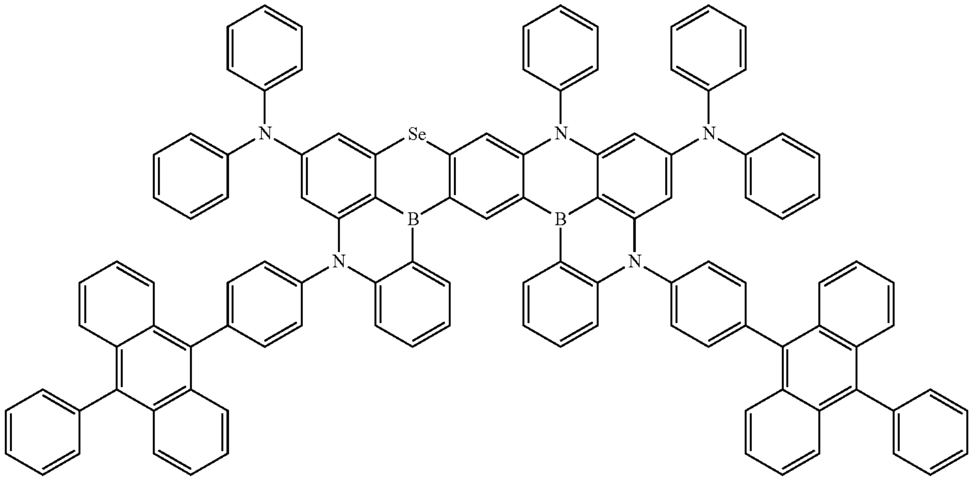
76
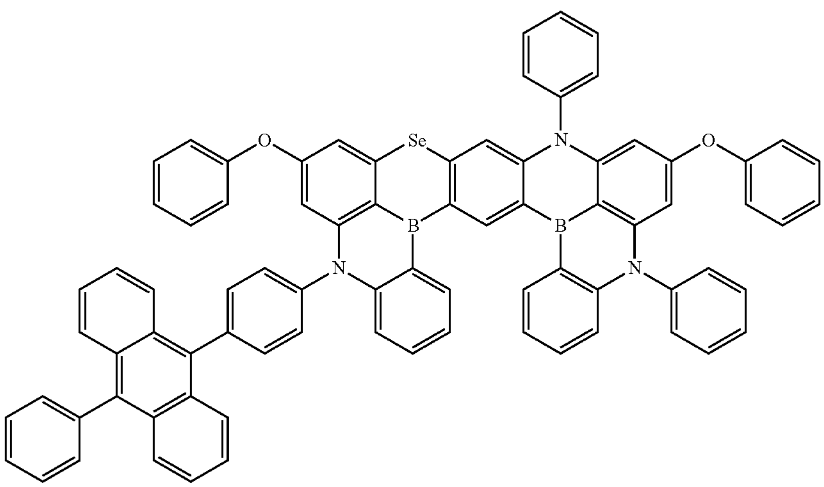
77
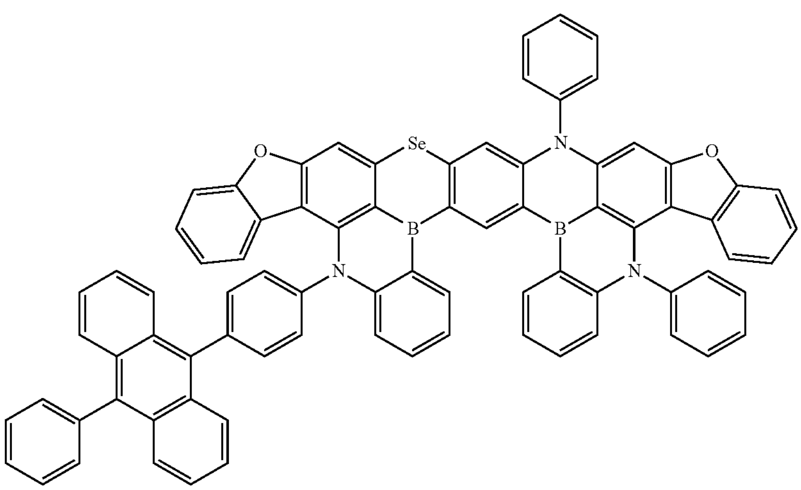

-continued
78
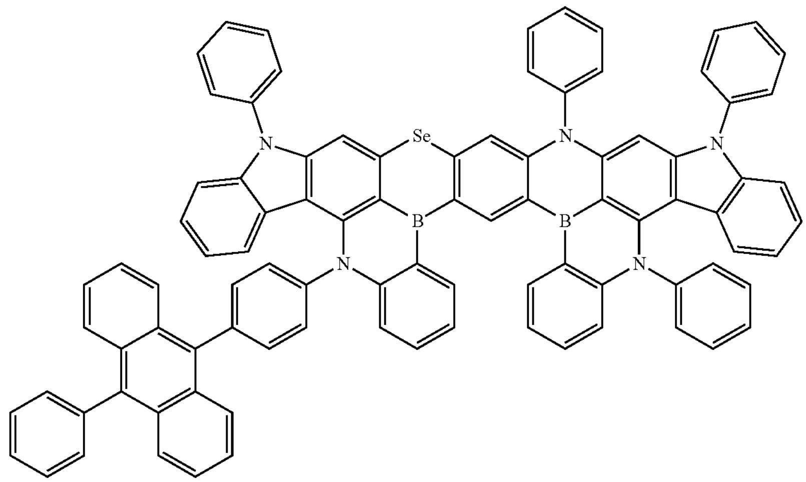
79
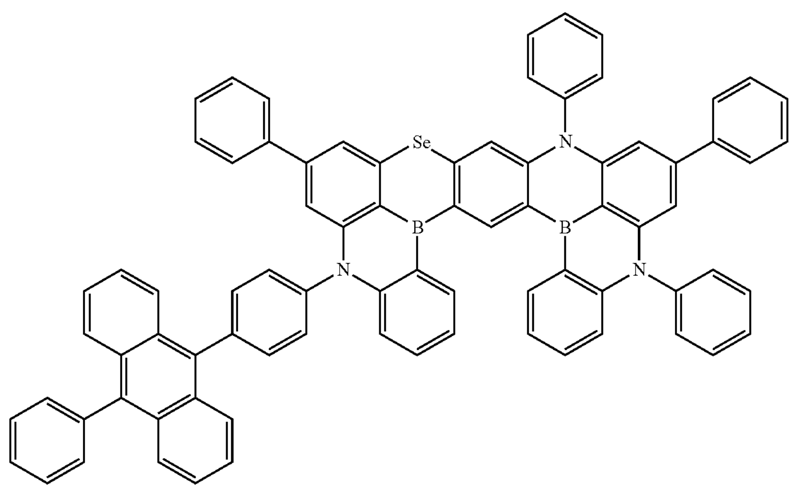
80
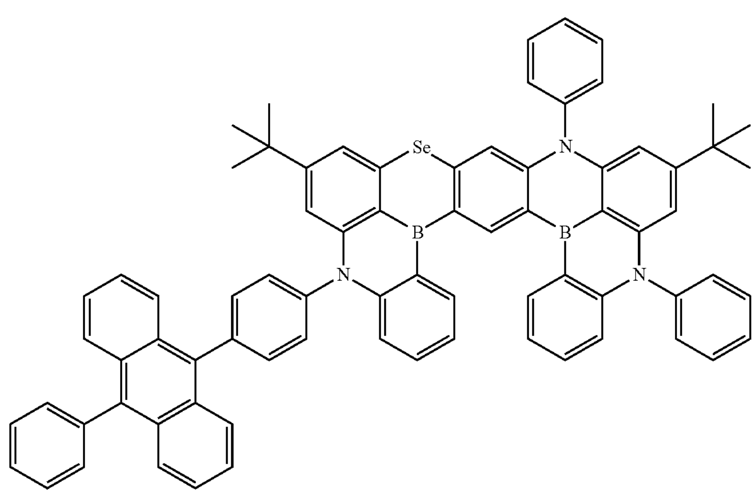

-continued
81
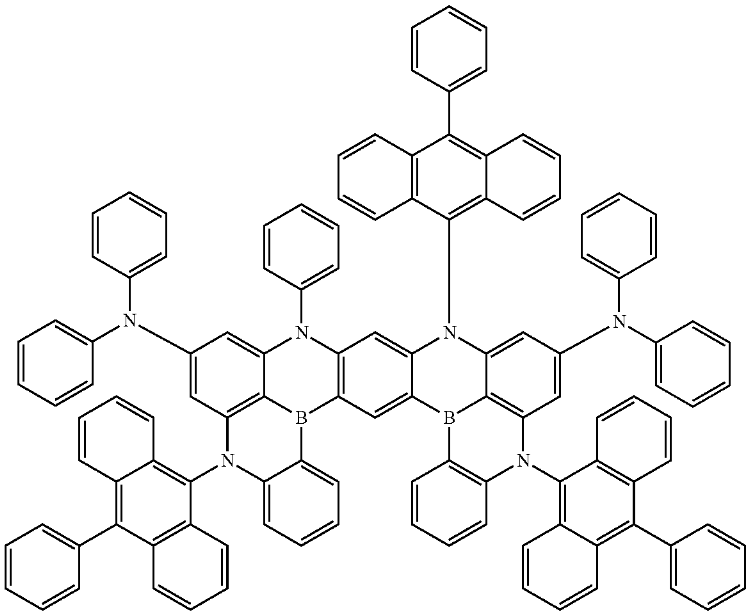
82
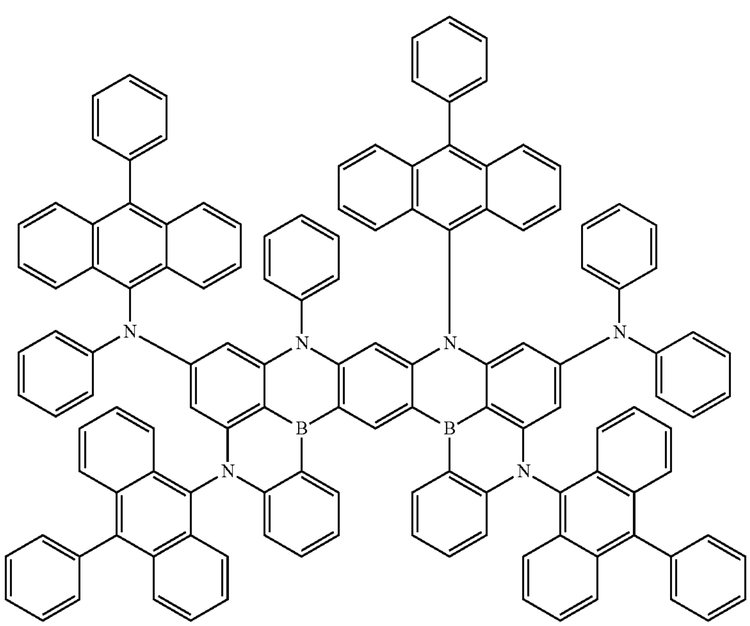

-continued
83
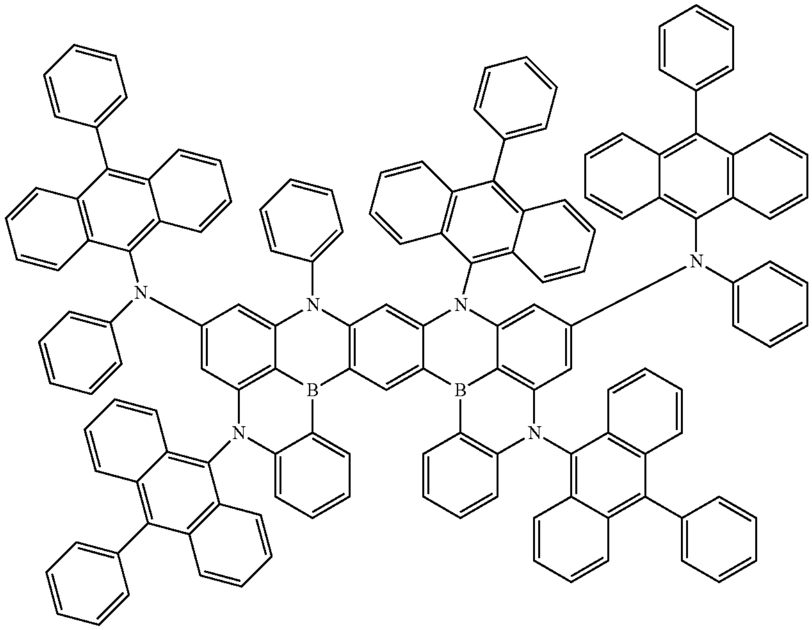
84
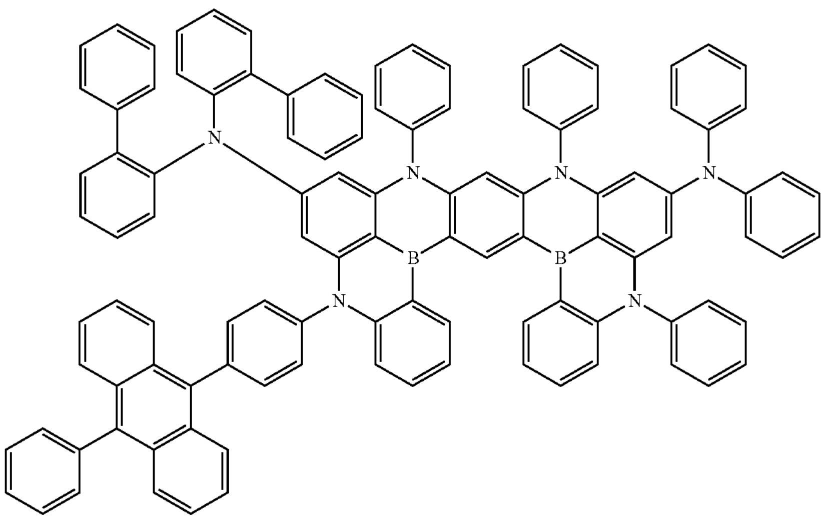
85
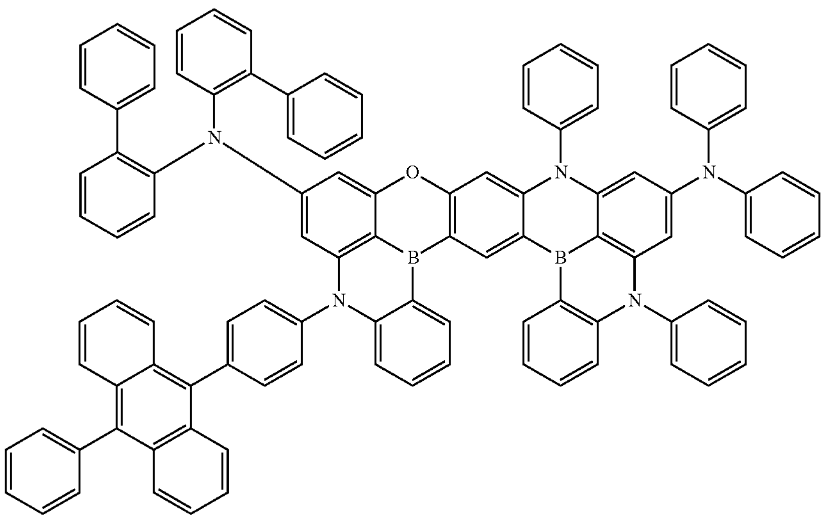

-continued
86
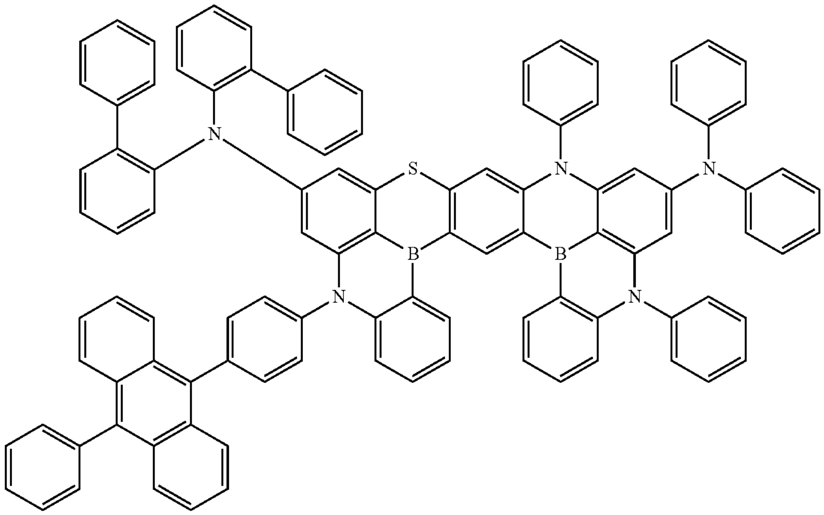
87
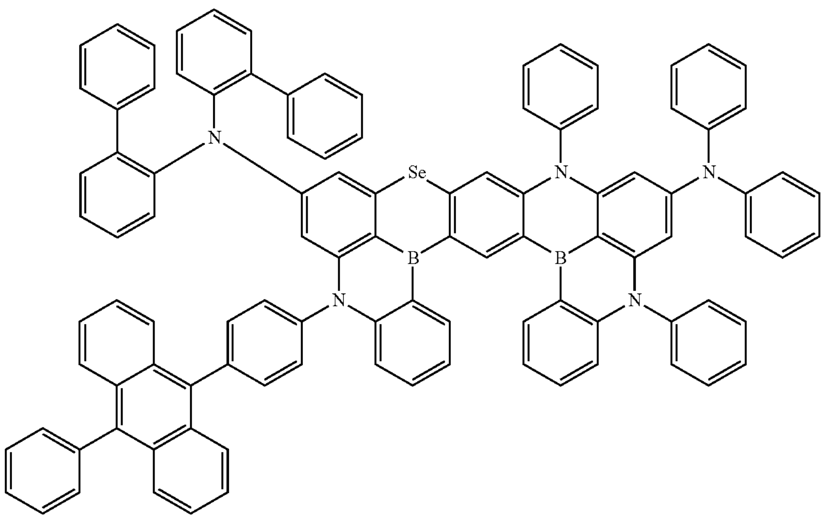
88
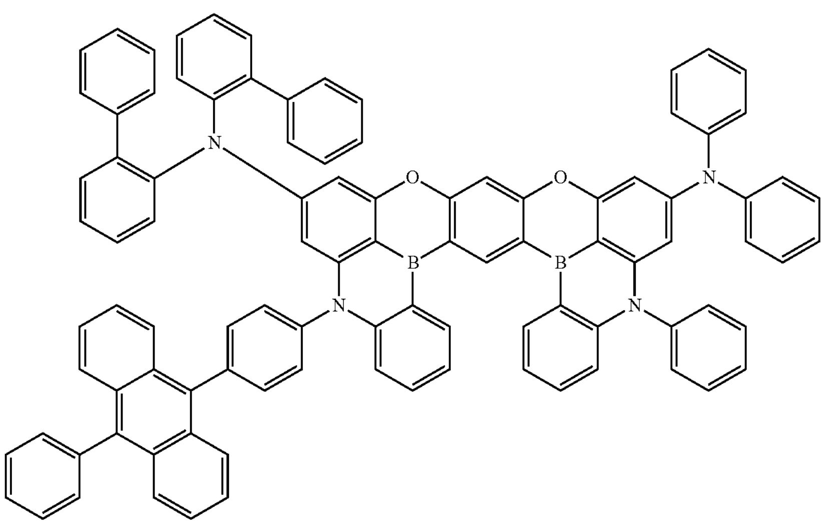

-continued
89
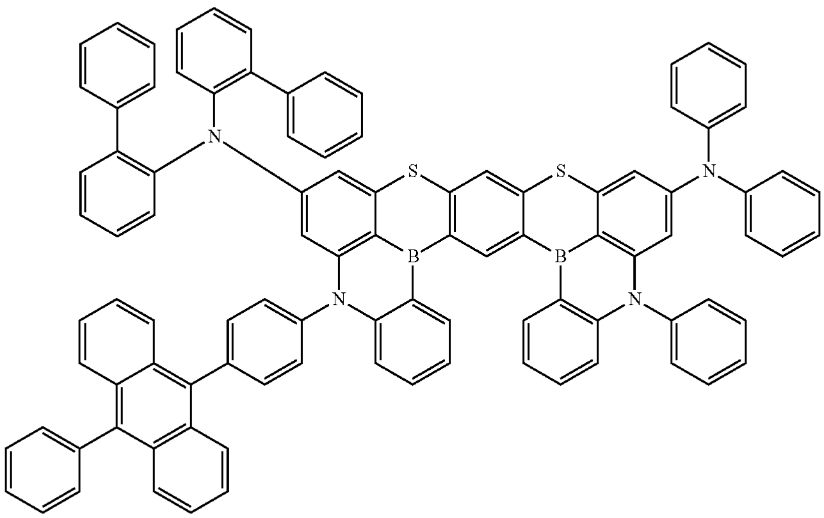
90
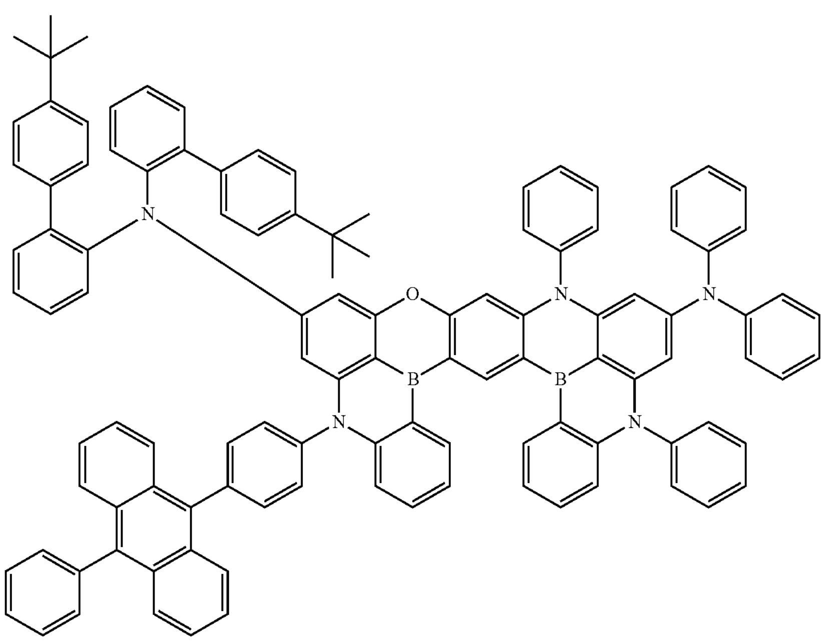

-continued
91
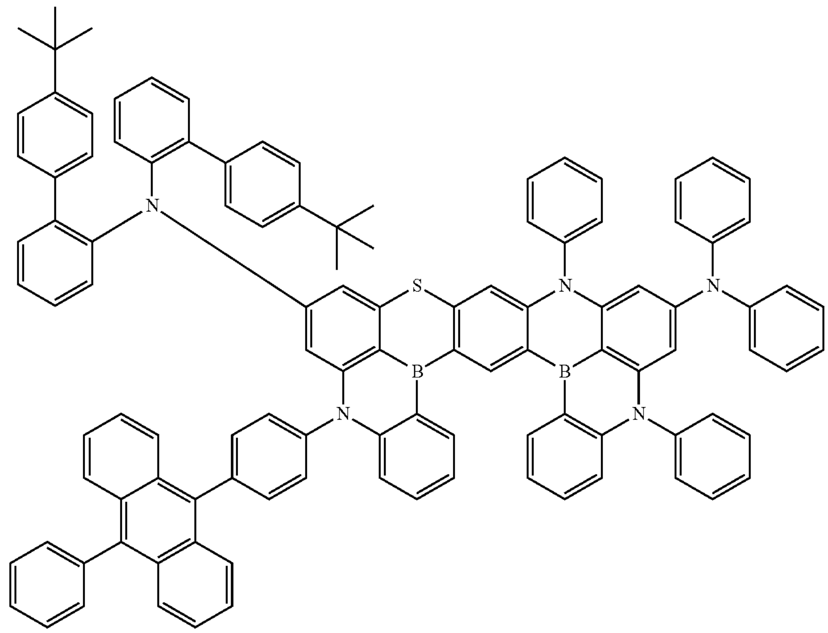
92
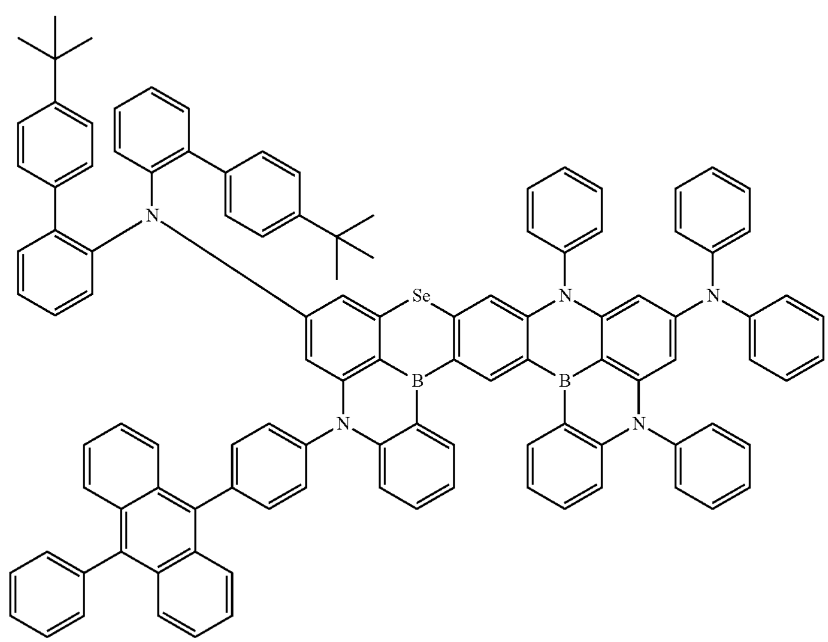

-continued
93
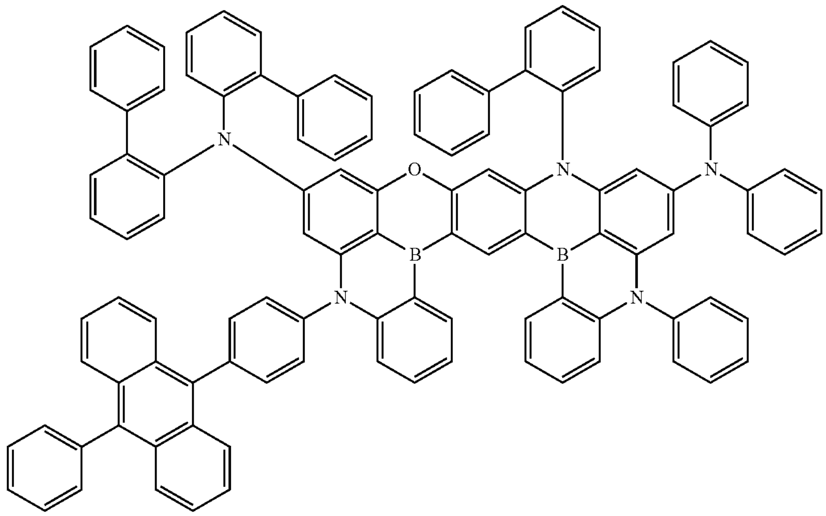
94
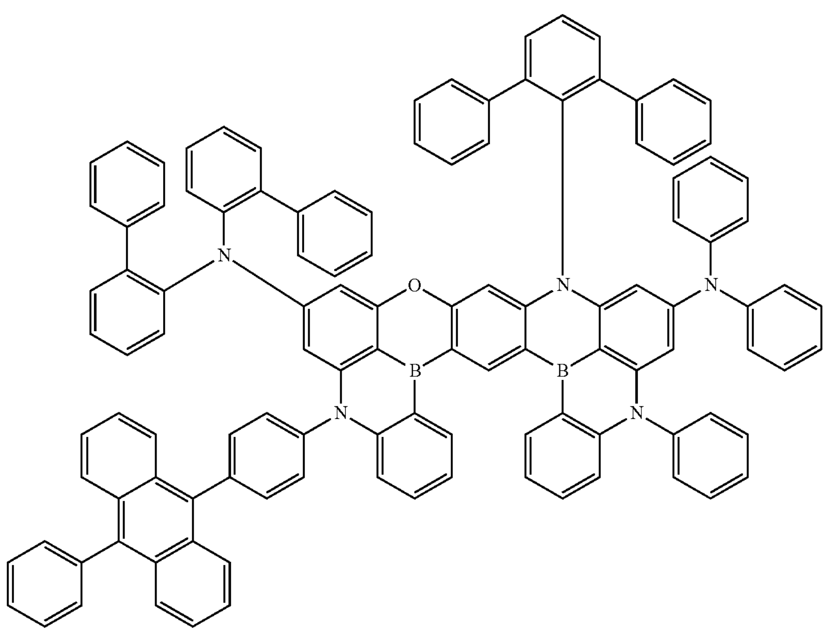

-continued
95
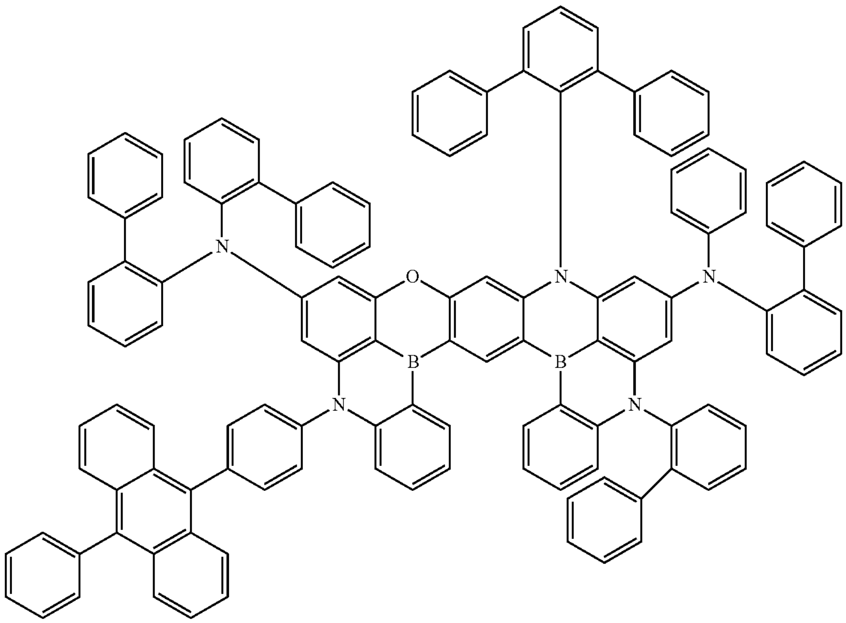
96
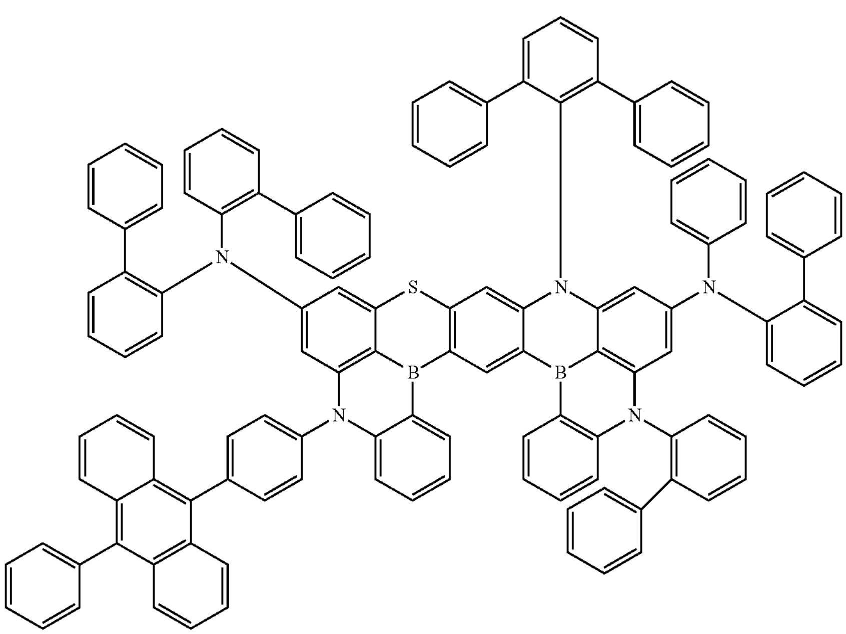

-continued
97
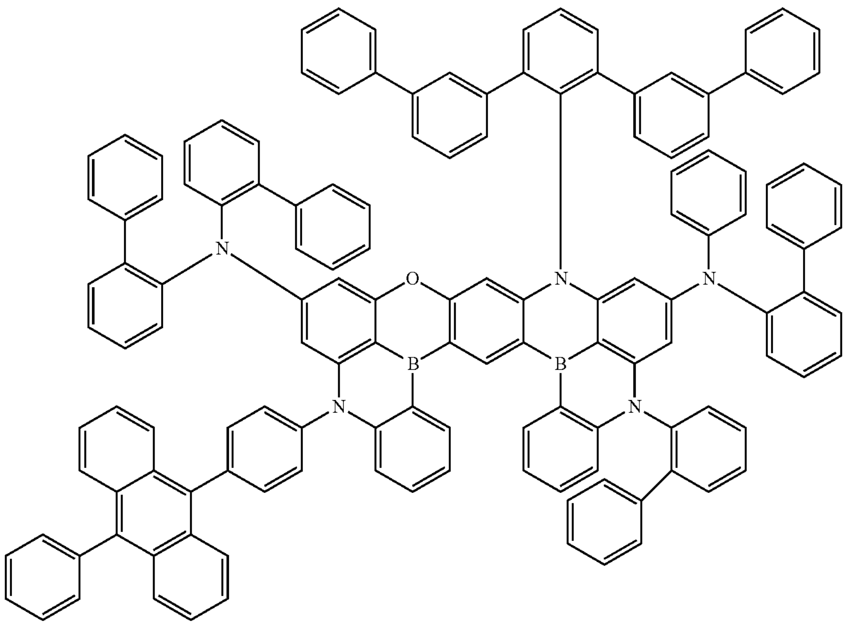
98
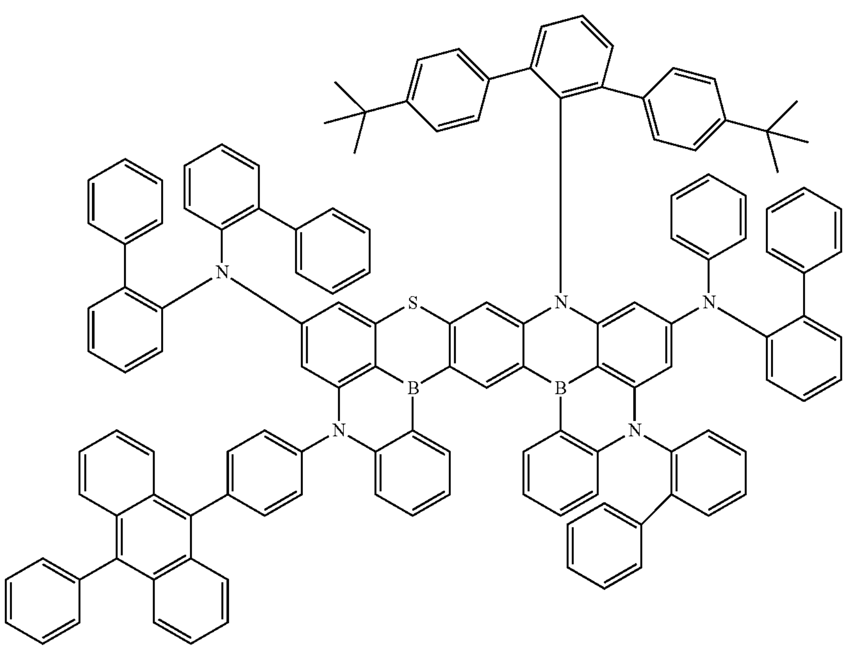

-continued
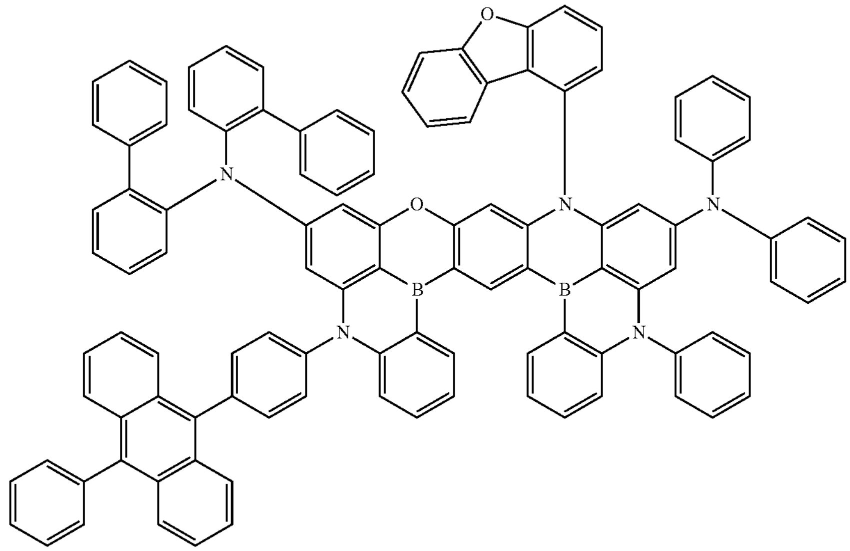
99
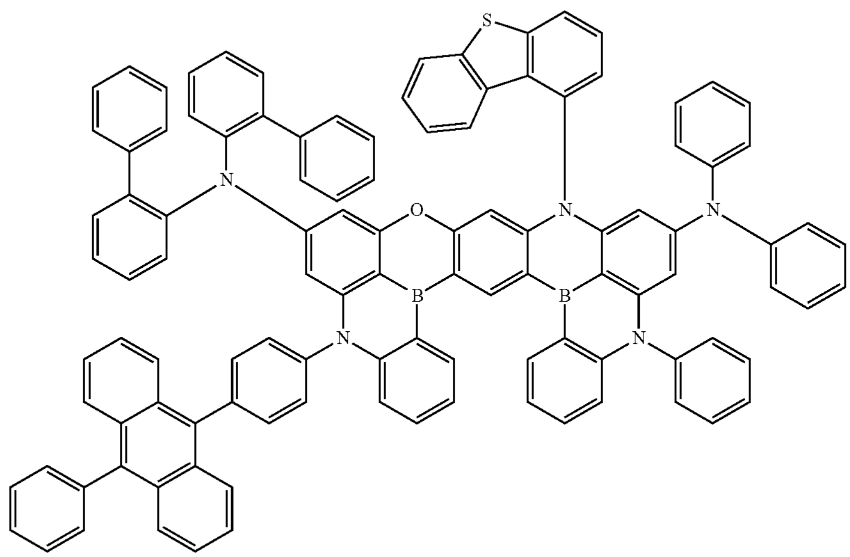
100
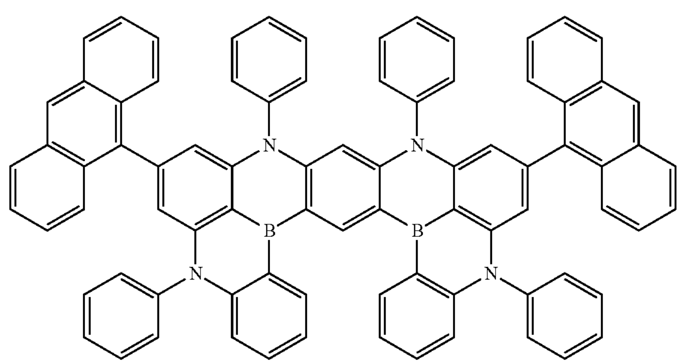
101

-continued
102
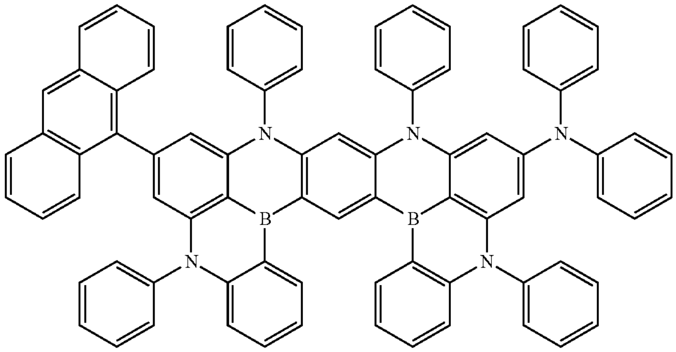
103
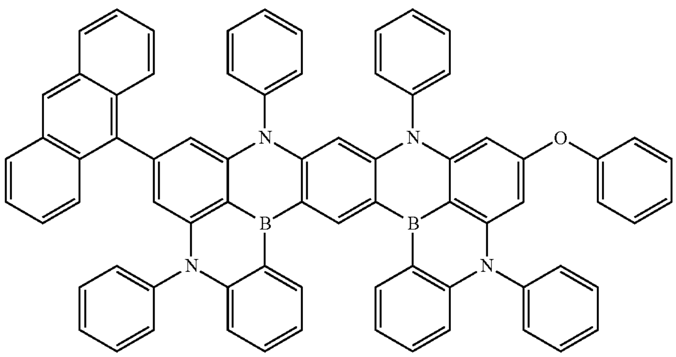
104
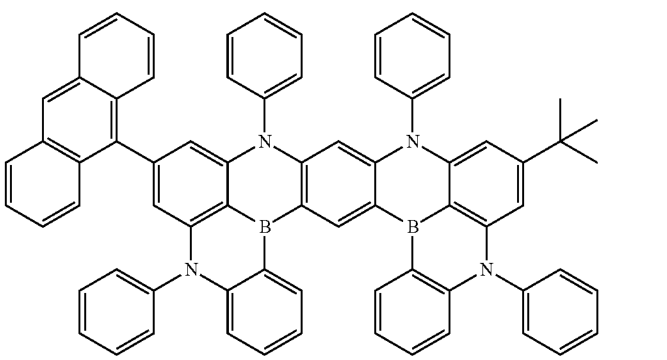
105
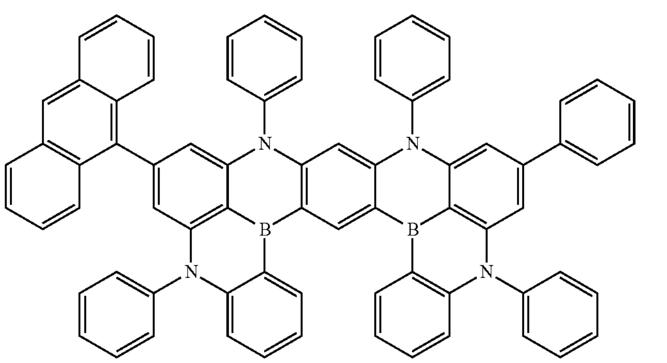

-continued
106
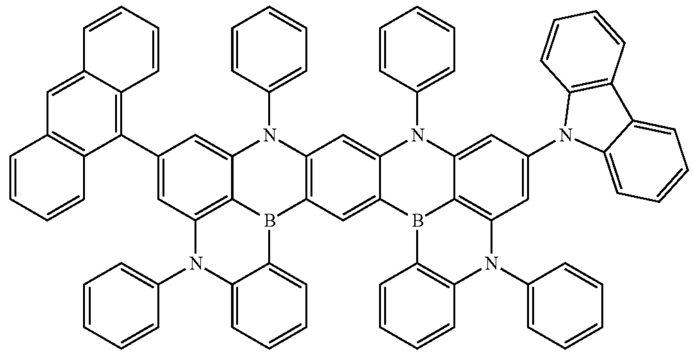
107
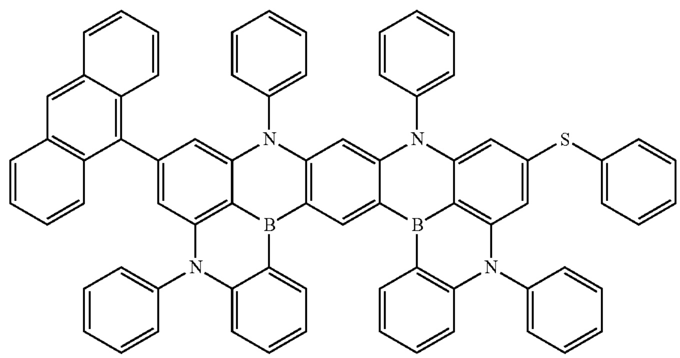
108
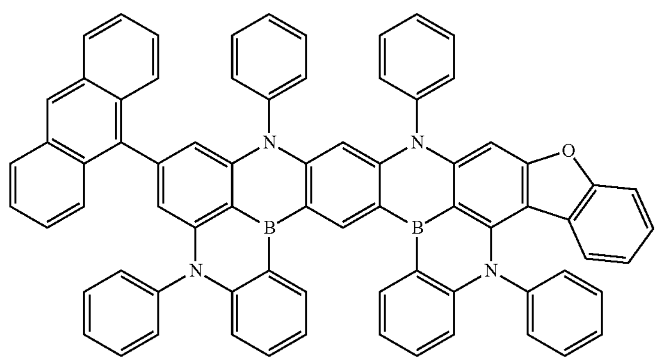
109
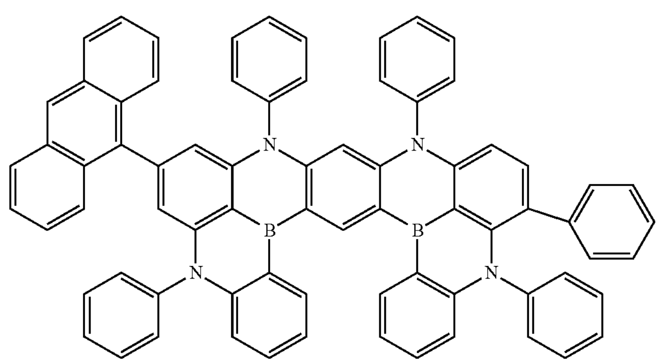

-continued
110
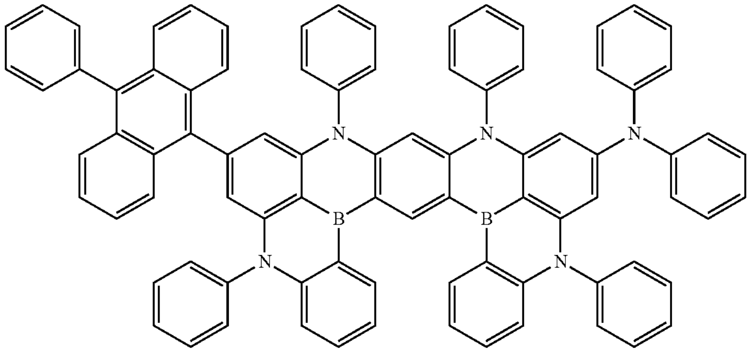
111
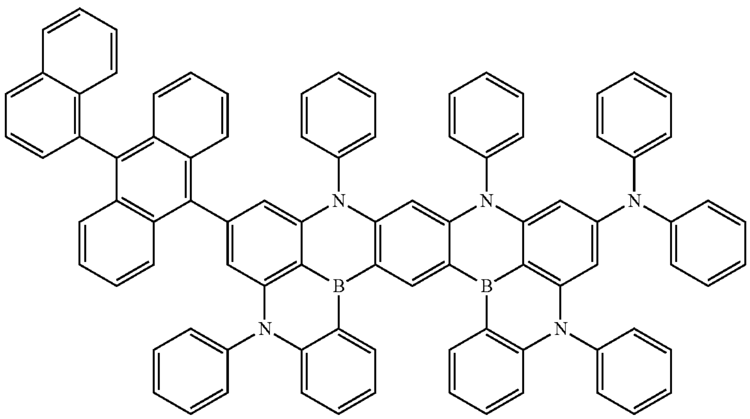
112
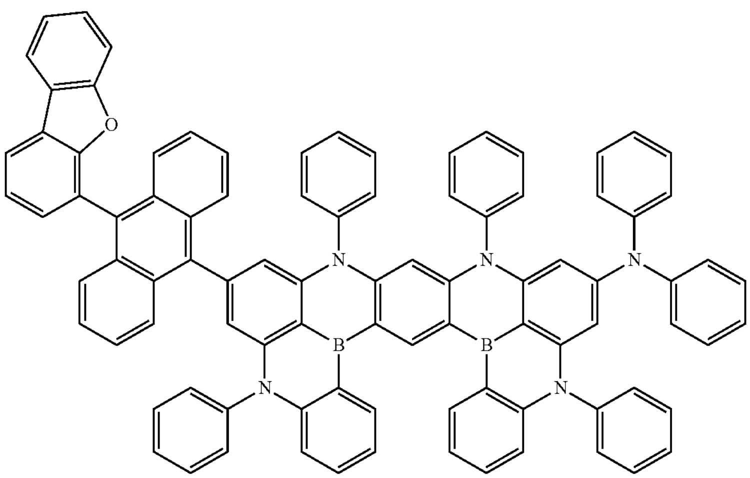
113
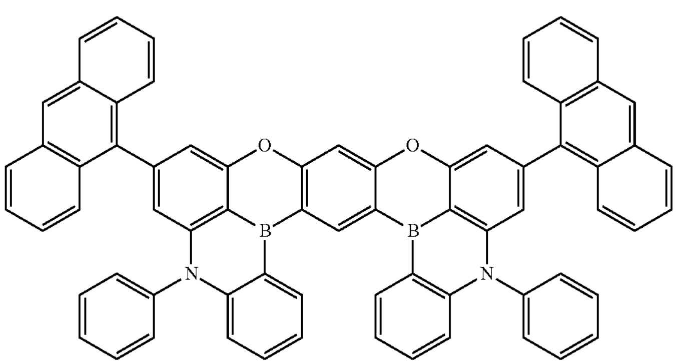

-continued
114
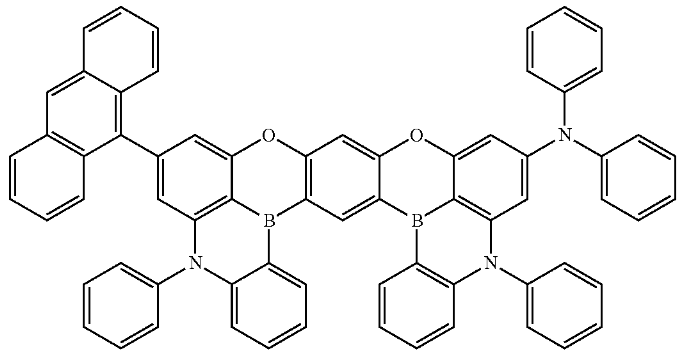
115
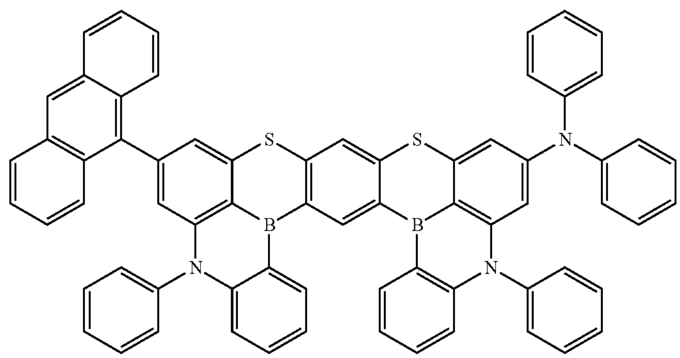
116
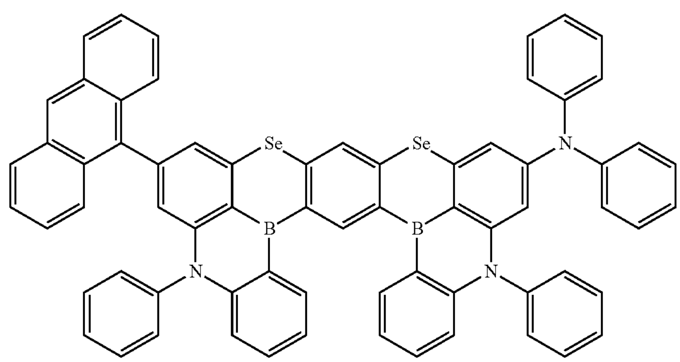
117
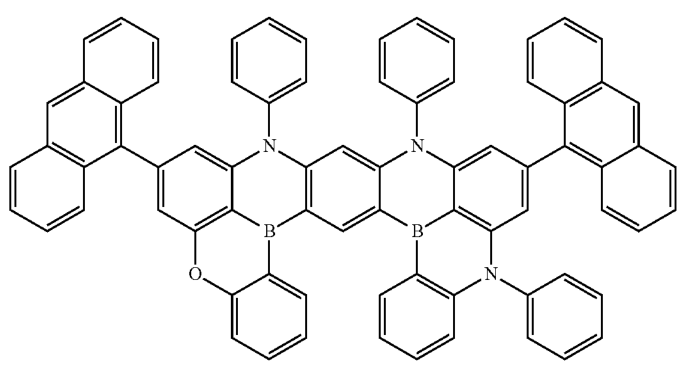

-continued
118
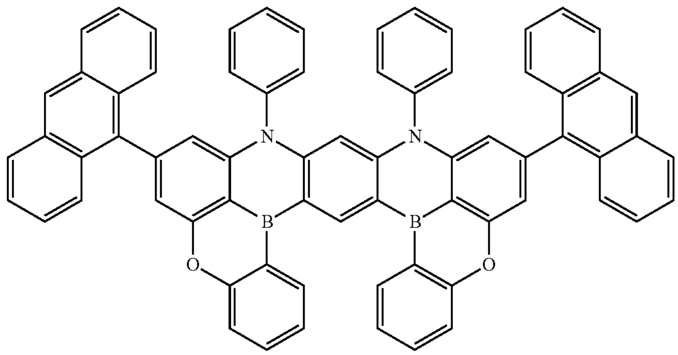
119
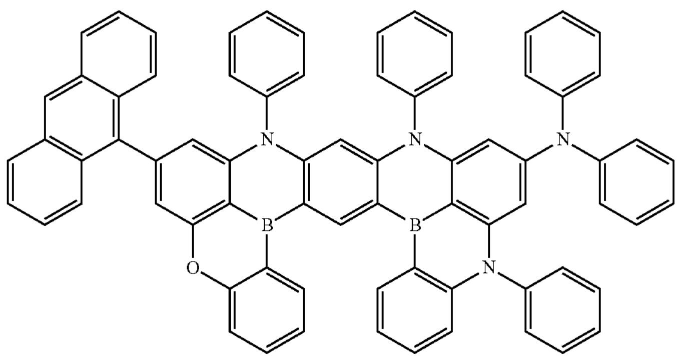
120
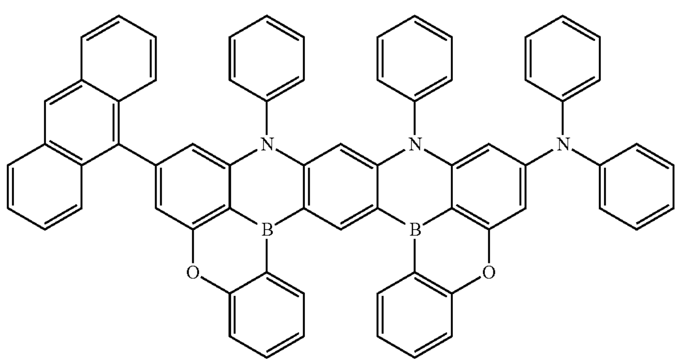
121
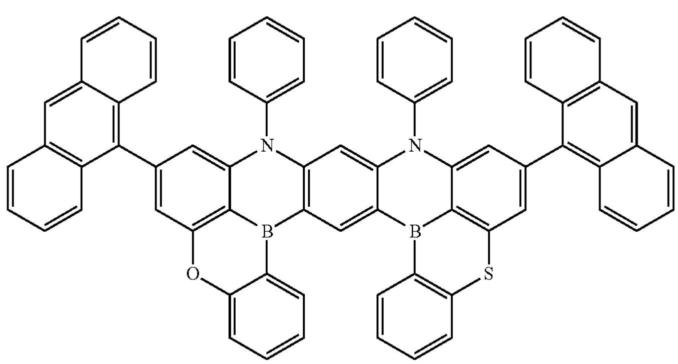

-continued
122
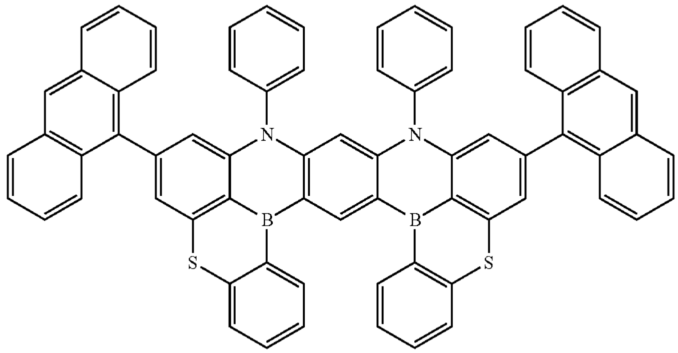
123
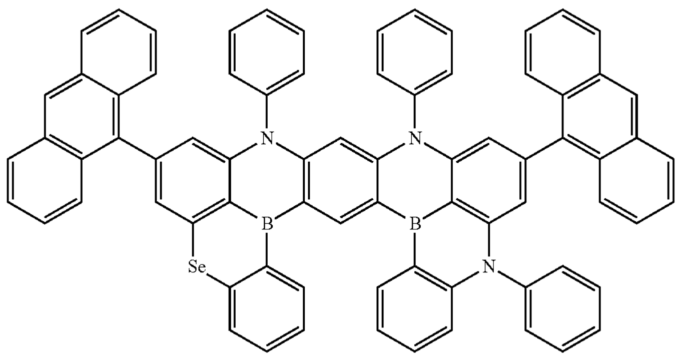
124
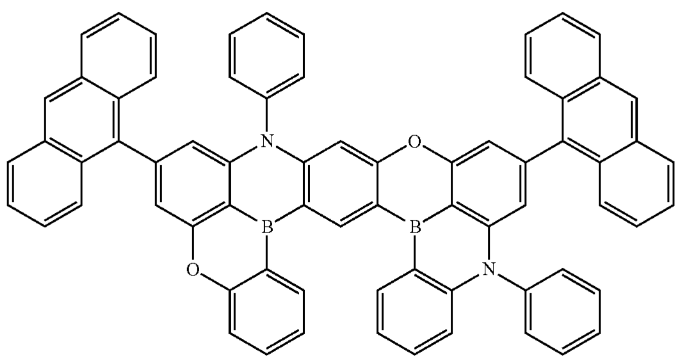
125
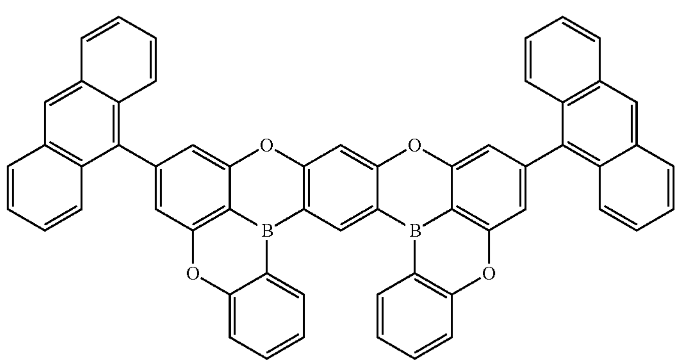

-continued
126
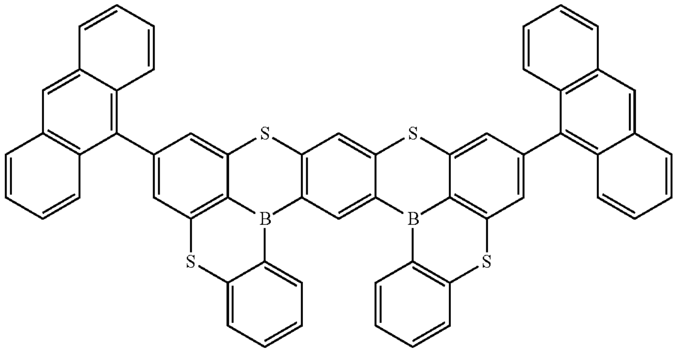
127
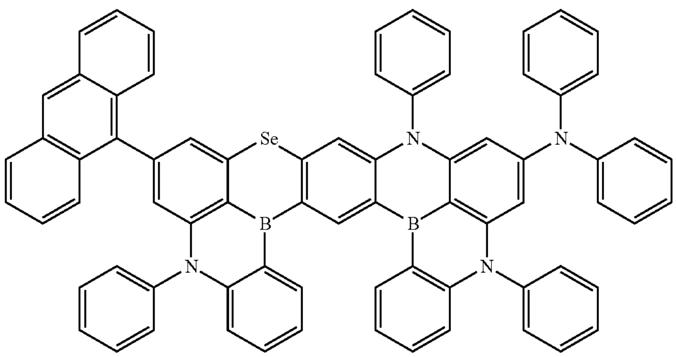
128
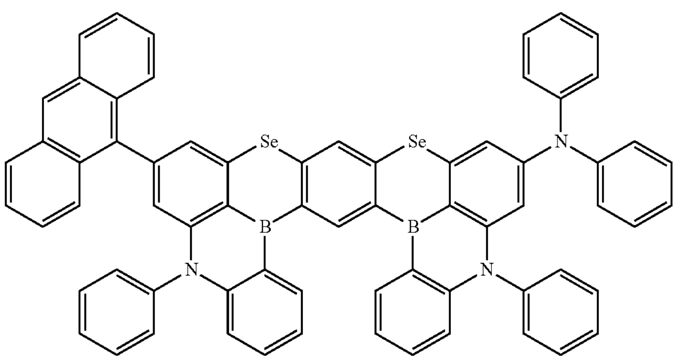
129
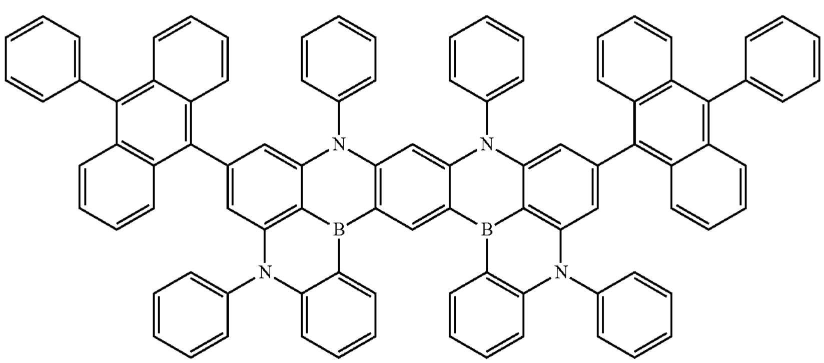

-continued
130
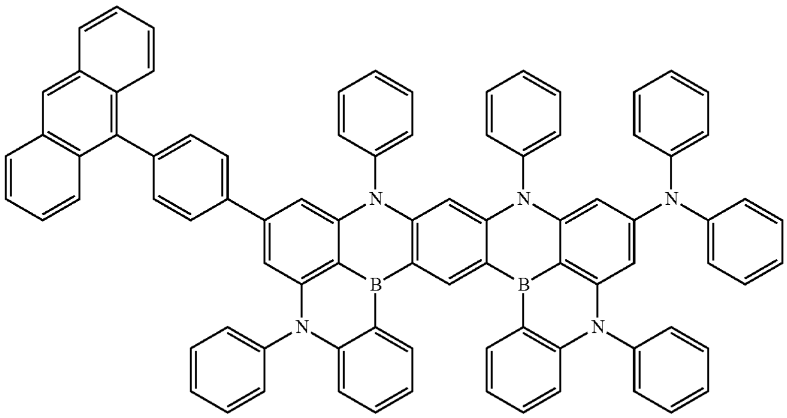
131
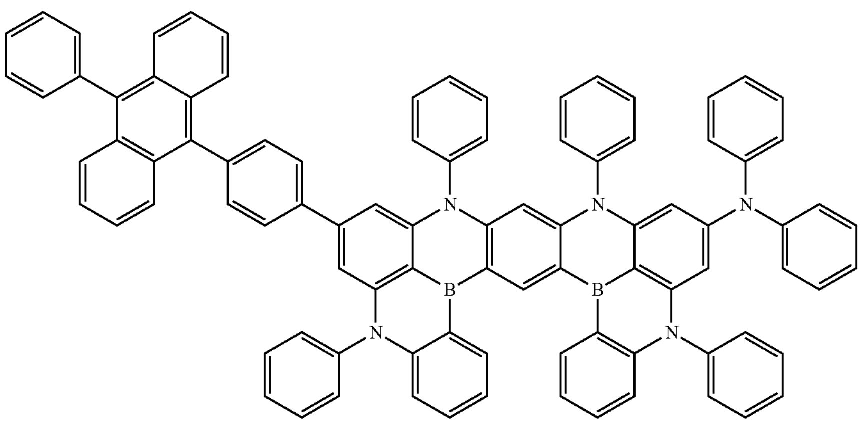
132
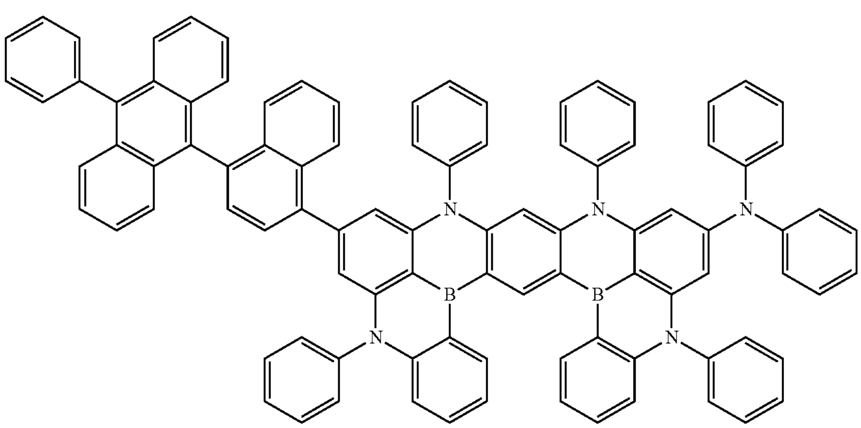

-continued
133
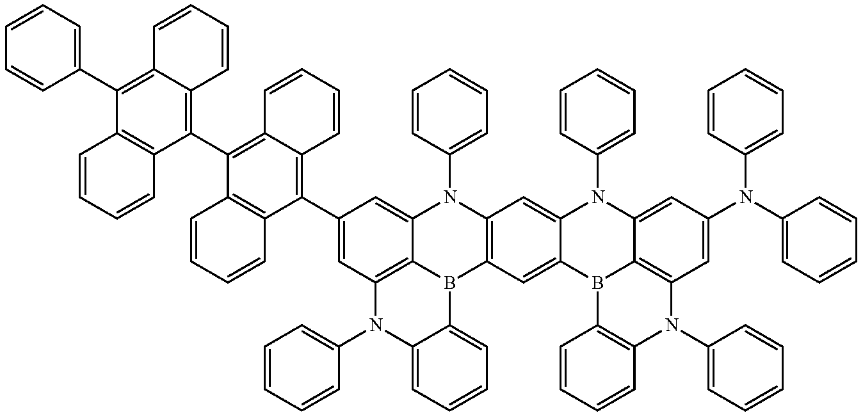
134
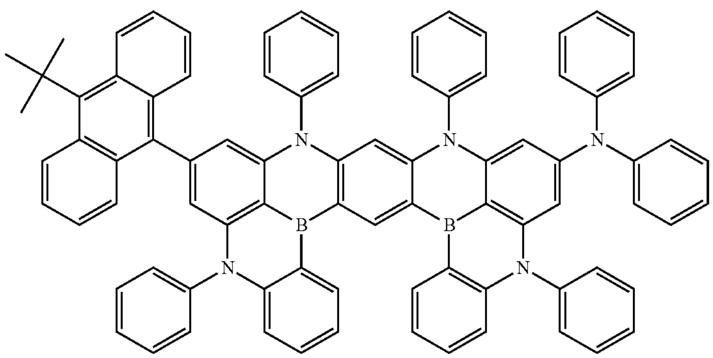
135
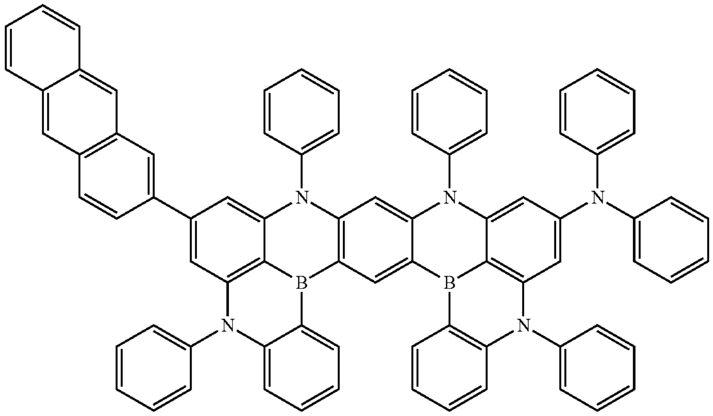

-continued
136
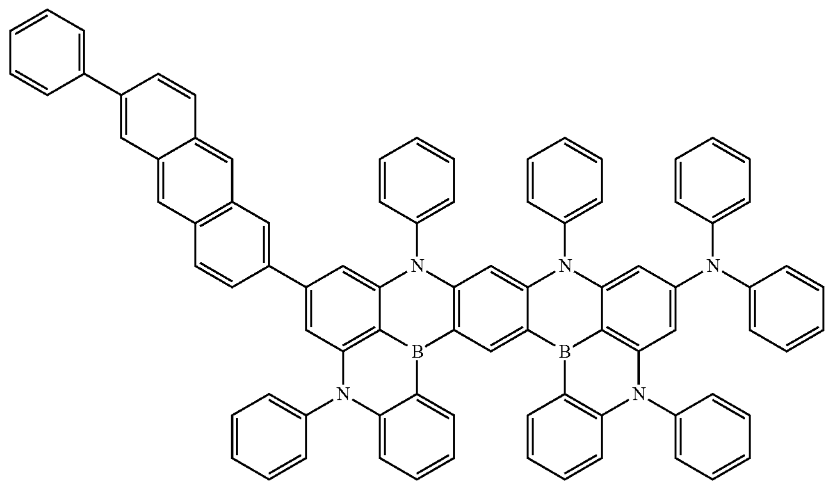
137
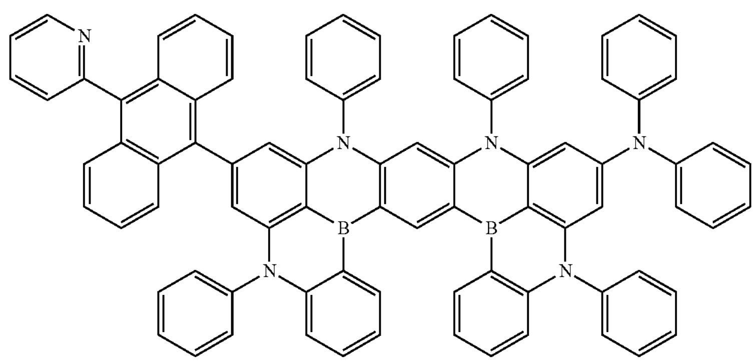
138
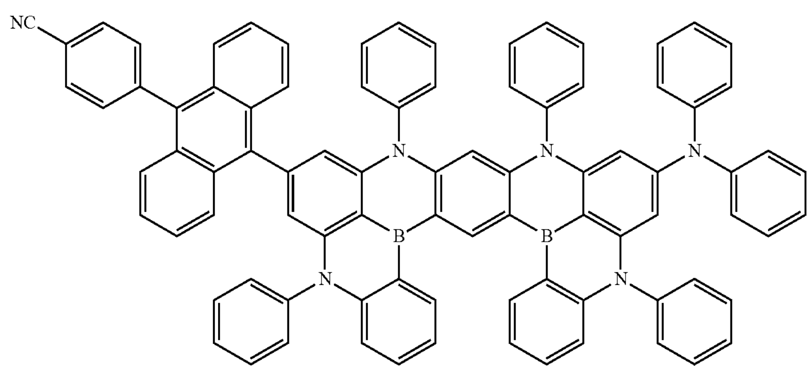
139
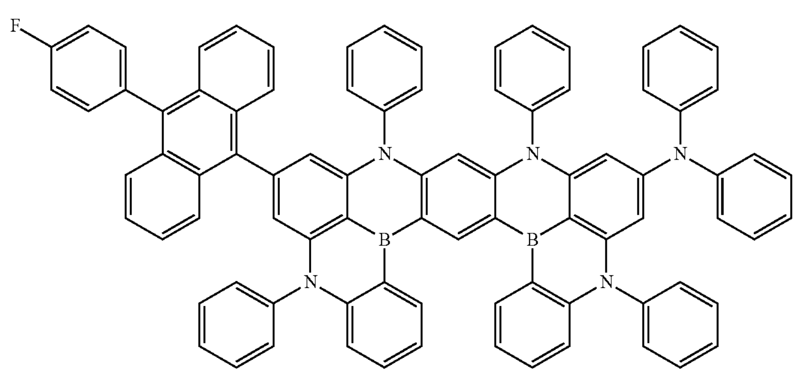

-continued
140
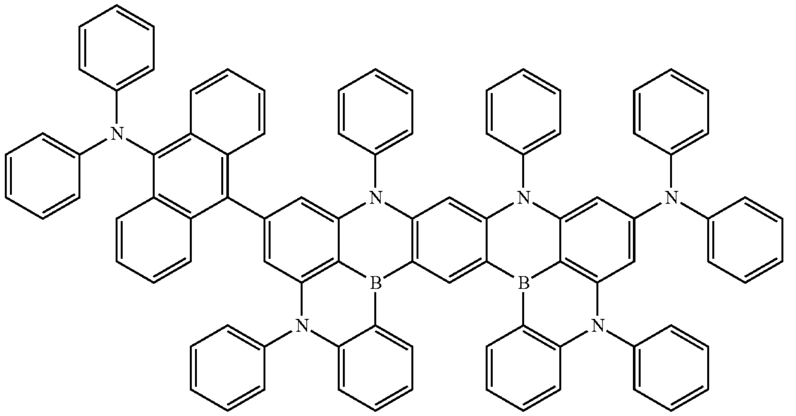
* * * * *